US010020459B2

(12) United States Patent
Ito et al.

(10) Patent No.: US 10,020,459 B2
(45) Date of Patent: Jul. 10, 2018

(54) ORGANIC LIGHT-EMITTING DEVICE

(71) Applicant: SAMSUNG DISPLAY CO., LTD., Yongin, Gyeonggi-Do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 14/567,986

(22) Filed: Dec. 11, 2014

(65) Prior Publication Data

US 2015/0325801 A1 Nov. 12, 2015

(30) Foreign Application Priority Data

May 2, 2014 (KR) ........................ 10-2014-0053618

(51) Int. Cl.

| | |
|---|---|
| ***C09K 11/06*** | (2006.01) |
| ***H01L 51/50*** | (2006.01) |
| ***H01L 51/00*** | (2006.01) |
| ***H05B 33/14*** | (2006.01) |
| ***H05B 33/18*** | (2006.01) |

(52) U.S. Cl.

CPC .......... *H01L 51/5072* (2013.01); *C09K 11/06* (2013.01); *H01L 51/0054* (2013.01); *H01L 51/0058* (2013.01); *H01L 51/0067* (2013.01); *H01L 51/0071* (2013.01); *H01L 51/0072* (2013.01); *H01L 51/0074* (2013.01); *H01L 51/5004* (2013.01); *H01L 51/5016* (2013.01); *H01L 51/5056* (2013.01); *H05B 33/14* (2013.01); *H05B 33/18* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1044* (2013.01); *C09K 2211/1059* (2013.01); *C09K 2211/1088* (2013.01); *C09K 2211/1092* (2013.01)

(58) Field of Classification Search

CPC .................................................. H01L 51/5072

See application file for complete search history.

(56) References Cited

U.S. PATENT DOCUMENTS

| | | | |
|---|---|---|---|
| 2007/0054151 | A1 | 3/2007 | Iwakuma et al. |
| 2011/0260138 | A1 | 10/2011 | Xia et al. |
| 2011/0266526 | A1 | 11/2011 | Ma et al. |
| 2012/0126222 | A1 | 5/2012 | Ogiwara et al. |
| 2012/0153268 | A1 | 6/2012 | Kawamura et al. |
| 2013/0001523 | A1 | 1/2013 | Chun et al. |

FOREIGN PATENT DOCUMENTS

| | | | |
|---|---|---|---|
| KR | 10-2013-0010056 | A | 1/2013 |
| KR | 10-2013-0067274 | A | 6/2013 |
| KR | 10-2013-0095620 | A | 8/2013 |
| KR | 10-2013-0100236 | A | 9/2013 |
| WO | WO 2007/029403 | A1 | 3/2007 |
| WO | WO 2011/086941 | A1 | 7/2011 |
| WO | WO 2012/176818 | A1 | 12/2012 |

*Primary Examiner* — Paul V Ward

(74) *Attorney, Agent, or Firm* — Lewis Roca Rothgerber Christie LLP

(57) ABSTRACT

An organic light-emitting device includes: a first electrode, a second electrode facing the first electrode, and an organic layer between the first electrode and the second electrode, the organic layer including: an emission layer, an electron transport region between the second electrode and the emission layer, and a mixed layer between the emission layer and the electron transport region, the mixed layer including a first material and a second material, the first material and the second material being selected from a pyrrolidine-based compound and a $C_{10}$-$C_{30}$ polycyclicaromatic hydrocarbon-based compound, and a triplet energy $Eg_{T1}$ of at least one selected from the first material and the second material being 2.2 eV or greater.

15 Claims, 1 Drawing Sheet

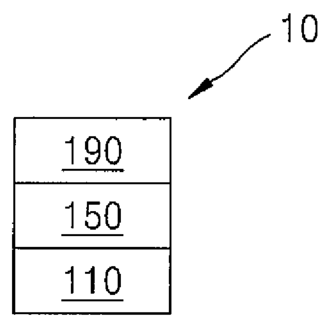
10
190
150
110

ORGANIC LIGHT-EMITTING DEVICE

CROSS-REFERENCE TO RELATED APPLICATION

This application claims priority to and the benefit of Korean Patent Application No. 10-2014-0053618, filed on May 2, 2014, in the Korean Intellectual Property Office, the entire content of which is incorporated herein by reference.

BACKGROUND

1. Field

One or more aspects of embodiments of the present invention are directed toward organic light-emitting devices.

2. Description of the Related Art

Organic light-emitting devices (OLEDs) are self-emitting devices that have advantages, such as wide viewing angles, excellent contrast, quick response, high brightness, and excellent driving voltage characteristics, and can provide multicolored images.

The OLED has a structure including a first electrode disposed on a substrate, and a hole transport region, an emission layer, an electron transport region, and a second electrode sequentially placed on (e.g., formed on) the first electrode. Holes injected from the first electrode are transported to the emission layer through the hole transport region, and electrons injected from the second electrode are transported to the emission layer through the electron transport region. Carriers, such as the holes and electrons, recombine in the emission layer to generate excitons. When the excitons drop (or relax) from an excited state to a ground state, light is emitted.

SUMMARY

One or more aspects of embodiments of the present invention are directed toward an organic light-emitting device.

Additional aspects will be set forth in part in the description which follows and, in part, will be apparent from the description, or may be learned by practice of the embodiments disclosed herein.

According to one or more embodiments of the present invention, an organic light-emitting device includes a first electrode, a second electrode facing the first electrode, and an organic layer between the first electrode and the second electrode, the organic layer including an emission layer; an electron transport region between the second electrode and the emission layer; and a mixed layer between the emission layer and the electron transport region, the mixed layer including a first material and a second material; the first material and the second material being selected from a pyrrolidine-based compound and a $C_{10}$-$C_{30}$ polycyclicaromatic hydrocarbon-based compound; and a triplet energy $Eg_{T1}$ of at least one selected from the first material and the second material being 2.2 eV or greater.

BRIEF DESCRIPTION OF THE DRAWINGS

These and/or other aspects will become apparent and more readily appreciated from the following description of the embodiments, taken in conjunction with the accompanying drawing, which is a schematic cross-sectional view of a structure of an organic light-emitting device according to an embodiment of the present invention.

DETAILED DESCRIPTION

Reference will now be made to certain embodiments, an example embodiment of which is illustrated in the accompanying drawing. As those skilled in the art would recognize, the present invention may be embodied in many different forms and should not be construed as being limited to the descriptions set forth herein. Accordingly, the embodiments are described below, by referring to the accompanying drawing, merely to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

Like reference numerals in the drawings denote like elements, and thus their repeated description will be omitted.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "formed on" another layer, region, or component, it can be directly or indirectly on or formed on the other layer, region, or component. That is, for example, intervening layers, regions, or components may or may not be present.

Sizes of components in the drawings may be exaggerated for convenience of explanation. In other words, since sizes and thicknesses of components in the drawings may be arbitrarily illustrated for convenience of explanation, the following embodiments are not limited thereto.

As used herein, the expression "organic layer" refers to a single layer and/or multiple layers disposed between a first electrode and a second electrode of an organic light-emitting device.

As used herein, the expression "pyrrolidine-based compound" refers to all organic compounds including at least one pyrrolidine moiety. The pyrrolidine moiety may be substituted with at least one substituent.

As used herein, the expression "$C_{10}$-$C_{30}$ polycyclic aromatic hydrocarbon-based compound" refers to all organic compounds including at least one polycyclic aromatic moiety. The polycyclic aromatic moiety may be substituted with at least one substituent.

As used herein, the expression "electron transporting compound" refers to all compounds having an electron mobility of about $1.0\times10^{-7}$ $cm^2/(V\cdot s)$ to about $1.0\times10^{-3}$ $cm^2/(V\cdot s)$. The electron transport compound may have an electron mobility of about $1.0\times10^{-5}$ $cm^2/(V\cdot s)$ or greater.

As used herein, the expression "hole transporting compound" refers to all compounds having a hole mobility of about $1.0\times10^{-7}$ $cm^2/(V\cdot s)$ to about $1.0\times10^{-3}$ $cm^2/(V\cdot s)$. The hole transport compound may have a hole mobility of about $1.0\times10^{-5}$ $cm^2/(V\cdot s)$ or greater.

Although a method of measuring hole mobility is not limited, a time of flight method may be used (utilized). The time of flight method includes measuring time properties (transient response time) of transient current that occurs due to irradiating light having a wavelength within the absorption wavelength region of an organic layer of an electrode/ organic layer/electrode structure and calculating hole mobility from the following formula:

$$\text{Hole mobility}=(\text{thickness of the organic layer})^2/(\text{transient response time}\cdot\text{applied voltage})$$

An organic light-emitting device includes a first electrode, a second electrode facing the first electrode, and an organic layer between the first electrode and the second electrode. The organic layer includes an emission layer; an electron transport region between the second electrode and the emission layer; and a mixed layer between the emission layer and the electron transport region, the mixed layer including a first material and a second material. The first material and the second material are selected from a pyrrolidine-based compound and a $C_{10}$-$C_{30}$ polycyclicaromatic hydrocarbon-based compound, and a triplet energy $Eg_{T1}$ of at least one selected from the first material and the second material is 2.2 eV or greater.

The first material and the second material have different electron transporting capabilities and hole transporting capabilities. Among the first material and the second material, a material having a relatively greater hole transporting capability may play a role in blocking movement of electrons from the second electrode to the emission layer. A material having a relatively greater electron transporting capability among the first material and the second material may play a role in moving electrons from the second electrode to the emission layer, such that current may flow between the first electrode and the second electrode.

In the organic light-emitting device, some electrons moving from the second electrode to the emission layer may be blocked, such that a number of holes moving from the first electrode to the emission layer and a number of electrons moving from the second electrode to the emission layer may achieve balance. Accordingly, the organic light-emitting device may decrease the number of (surplus) electrons and/or holes that fail (e.g., do not combine) to form excitons in the emission layer, and thus, the organic light-emitting device may have a long lifespan.

A triplet energy of at least one material selected from the first material and the second material may be higher than a triplet energy of a host of the emission layer and thus, a triplet exciton state (e.g., an exciton in a triplet state) in the emission layer may be trapped in the emission layer. When at least one material selected from the first material and the second material has a triplet energy ($Eg_{T1}$) of 2.2 eV or greater, the triplet exciton state (e.g., the exciton in a triplet state) in the emission layer may be trapped inside the emission layer more effectively.

A triplet energy of the first material and/or the second material may be 4.0 eV or lower, but the triplet energies are not limited thereto. A triplet energy of the first material and/or the second material may be 3.5 eV or lower, but the triplet energies are not limited thereto.

For example, any one of the first material and the second material may be selected from an electron transport compound and a hole transport compound, but the first material and the second material are not limited thereto. The first material may be an electron transport compound. The second material may be an electron transport compound. The first material may be a hole transport compound. The second material may be a hole transport compound.

In another embodiment, the first material and the second material may be selected from the electron transport compound and the hole transport compound, but the first material and the second material are not limited thereto. The first material may be a hole transport compound, and the second material may be an electron transport, compound. The first material may be an electron transport compound, and the second material may be a hole transport compound.

For example, the electron transport region may include an electron transport layer, and the emission layer and the electron transport layer may be adjacent to each other, but they are not limited thereto.

For example, the pyrrolidine-based compound may be selected from, but is not limited to, a pyrrolidine-based compound represented by any of Formulae 1 and 2:

Formula 1

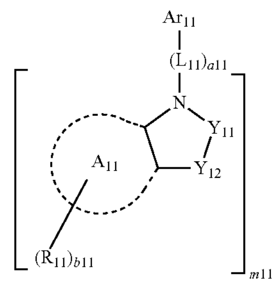

Formula 2

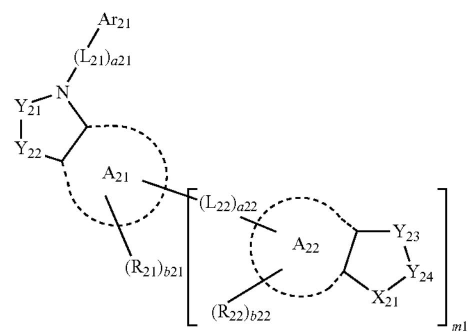

Formula 9-1

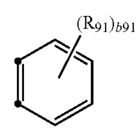

Formula 9-2

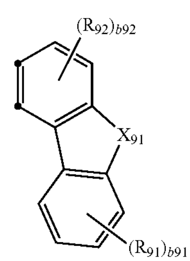

Formula 9-3

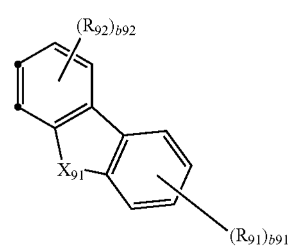

-continued

Formula 9-4

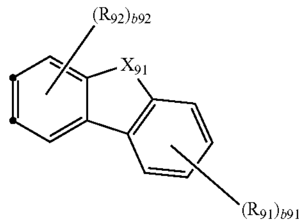

Formula 9-5

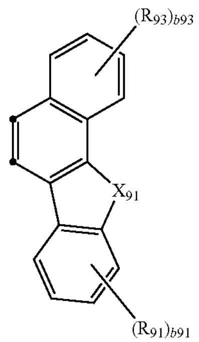

Formula 9-6

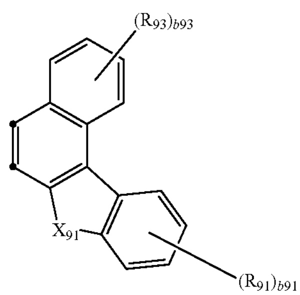

In Formulae 1, 2, and 9-1 to 9-6, $X_{21}$ and $X_{91}$ may be each independently selected from an oxygen atom, a sulfur atom, $N(Q_1)$, $C(Q_1)(Q_2)$, and $Si(Q_1)(Q_2)$;

two adjacent groups among $Y_{11}$, $Y_{12}$, and $Y_{21}$ to $Y_{24}$ may correspond to carbon atoms located at * in Formulae 9-1 to 9-6;

$A_{11}$, $A_{21}$, and $A_{22}$ may be each independently selected from benzene, naphthalene, dibenzofuran, dibenzothiophene, carbazole, fluorene, benzofuran, benzothiophene, indole, and indene;

$L_{11}$, $L_{21}$ and $L_{22}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic heterocondensed polycyclic group;

a11, a21 and a22 may be each independently selected from 0, 1, 2, and 3;

$Ar_{11}$, $Ar_{21}$, $R_{11}$, $R_{21}$, $R_{22}$, and $R_{91}$ to $R_{93}$ may be each independently selected from a hydrogen, a deuterium, F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic heterocondensed polycyclic group;

b11, b21, b22, b91, and b93 may be each independently selected from 1, 2, 3, and 4;

b92 may be selected from 1 and 2;

m11 and m21 may be each independently selected from 1, 2, and 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic heterocondensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic heterocondensed polycyclic group may be selected from:

a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, $—N(Q_{11})(Q_{12})$, $—Si(Q_{13})(Q_{14})(Q_{15})$, and $—B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_1$, $Q_2$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic heterocondensed polycyclic group.

For example, the $C_{10}$-$C_{30}$ polycyclic aromatic hydrocarbon-based compound may be represented by Formula 3, but is not limited thereto:

Formula 3

$$A_3 \text{—}[(L_3)_{a3}\text{—}Ar_3]_{m3}$$

In Formula 3, $A_3$ is selected from a substituted or unsubstituted anthracene, a substituted or unsubstituted pyrene, a substituted or unsubstituted triphenylene, a substituted or unsubstituted phenanthrene, and a substituted or unsubstituted fluoranthene;

$L_3$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic heterocondensed polycyclic group;

a3 is an integer selected from 0, 1, 2, and 3;

$Ar_3$ is selected from a substituted or unsubstituted $C_6$-$C_{60}$ an aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic heterocondensed polycyclic group;

m3 is an integer selected from 1, 2, 3, 4, 5, and 6;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic heterocondensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted a monovalent non-aromatic condensed polycyclic group, and the substituted monovalent non-aromatic heterocondensed polycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_5$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$);

where $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

For example, in Formulae 1 and 2, $A_{11}$, $A_{21}$ and $A_{22}$ may be each independently selected from benzene and naphthalene, but $A_{11}$, $A_{21}$ and $A_{22}$ are not limited thereto.

For example, in Formulae 1 and 2, $L_{11}$, $L_{21}$, and $L_{22}$ may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an Indolylene group, an indazolylene group, a purinylene group, a quinolinylene group, an isoquinollnylene group, a benzoquinolinylene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothlazolylene group, an isobenzothiazolylene group, a benzoxazolylene group, an isobenzoxazolylene group, a triazolylene group, a tetrazolylene group, an oxadiazolylene group, a trtazinylene group, a dibenzofuranylene group, a dlbenzothlophenylene group, a benzocarbazolylene group, and a dibenzocarbazolyfene group; and a phenylene group, a pentalenylene group, an indenylene group, a naphthylene group, an azulenylene group, a heptalenylene group, an Indacenylene group, an acenaphthylene group, a fluorenylene group, a spiro-fluorenylene group, a benzofluorenylene group, a dibenzofluorenylene group, a phenalenylene group, a phenanthrenylene group, an anthracenyene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an Isothiazolylene group, an oxazolylene group, an isoxazolylene group, a pyridinylene group, a pyrazinylene group, a pyrimidinyene group, a pyridazinylene group, an isoindolylene group, an Indolylene group, an Indazolylene group, a purinylene group, a quinolinylene group, an isoquinolinytene group, a benzoquinolinyfene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but $L_{11}$, $L_{21}$, and $L_{22}$ are not limited thereto.

In another embodiment, in Formulae 1 and 2, $L_{11}$, $L_{21}$, and $L_{22}$ may be each independently selected from a phenylene group, a naphthylene group, a fluorenylene group, a pyridinylene group, a pyrazinylene group, a pyrimidinylene group, a quinolinylene group, an isoquinolinylene group, a benzoquinolinylene group, a phthalazinylene group, a quinoxalinylene group, a quinazolinylene group, a benzoquinazolinylene group, a carbazolylene group, a phenanthridinylene group, a benzofuranylene group, a benzothiophenylene group, a benzothiazolylene group, an isobenzothiazolylene group, a benzoxazolylene group, an isobenzoxazolylene group, a triazinylene group, a dibenzofuranylene group, and a dibenzothiophenylene group; and a phenylene group, a naphthylene group, a fluorenylene group, a pyridinylene group, a pyrazinylene group, a pyrimidinylene group, a quinolinylene group, an isoquinolinylene group, a benzoquinolinylene group, a phthalazinylene group, a quinoxalinylene group, a quinazolinylene group, a benzoquinazolinylene group, a carbazolylene group, a phenanthridinylene group, a benzofuranylene group, a benzothiophenylene group, a benzothiazolylene group, an isobenzothiazolylene group, a benzoxazolylene group, an isobenzoxazolylene group, a triazinylene group, a dibenzofuranylene group, and a dibenzothiophenylene group, each substituted with at least one selected from a deuterium, —F, —Cl, —Br, —I, a methyl group, an ethyl group, an n-propyl group, an isopropyl group, an n-butyl group, an iso-butyl group, a sec-butyl group, a tert-butyl group, a methoxy group, an ethoxy group, n-a propoxy group, a phenyl group, a naphthyl group, a fluorenyl group, a pyridinyl group, a pyrazinyl group, and a pyrimidinyl group, but $L_{11}$, $L_{21}$, and $L_{22}$ are not limited thereto.

For example, in Formulae 1 and 2, a11, a21, and a22 may be each independently selected from 0 and 1, but a11, a21, and a22 are not limited thereto.

For example, in Formulae 1 and 2, $Ar_{11}$, $Ar_{21}$, $Q_1$, and $Q_2$ may be each independently selected from a methyl group, an ethyl group, an n-propyl group, an isopropyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a methyl group, an ethyl group, an n-propyl group, an isopropyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —$N(Q_{31})(Q_{32})$, and —$Si(Q_{33})(Q_{34})(Q_{35})$;

where $Q_{31}$ to $Q_{35}$ may be each independently selected from a $C_1$-$C_{60}$ alkyl group, a $C_6$-$C_{60}$ aryl group, and a $C_1$-$C_{60}$ heteroaryl group, but $Ar_{11}$, $Ar_{21}$, $Q_1$, and $Q_2$ are not limited thereto.

In another embodiment, in Formulae 1 and 2, $Ar_{11}$, $Ar_{21}$, $Q_1$ and $Q_2$ may be each independently selected from a methyl group, an ethyl group, an n-propyl group, an isopropyl group, an n-butyl group, an iso-butyl group, a sec-butyl group, a tert-butyl group, a phenyl group, a naphthyl group, a fluorenyl group, a benzofluorenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an Imidazolyl group, a pyrazolyl group, a thlazolyl group, an oxazolyl group, a pyridinyl group, a pyrazinyl group, a pyrimidinyl group, an Indolyl group, a quinolinyl group, an isoquinolinyl group, a carbazolyl group, a benzoquinolinyl group, a quinoxalinyl group, a quinazolinyl group, a benzoquinazolinyl group, a phenanthridinyl group, an acridinyl group, a phenanthrolinyl group, a phenazinyl group, a benzimldazolyl group, a benzofuranyl group, a benzothlophenyl group, a benzoxazolyl group, a triazolyl group, a tetrazolyl group, a triazinyl group, a dibenzofuranyl group, and a dibenzothlophenyl group; and a methyl group, an ethyl group, an n-propyl group, an isopropyl group, an n-butyl group, an iso-butyl group, a sec-butyl group, a tert-butyl group, a phenyl group, a naphthyl group, a fluorenyl group, a benzofluorenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imdazolyl group, a pyrazolyl group, a thiazolyl group, an oxazolyl group, a pyridinyl group, a pyrazinyl group, a pyrimidinyl group, an Indolyl group, a qulnolinyl group, an isoquinolinyl group, a carbazolyl group, a benzoquinolinyl group, a quinoxalinyl group, a quinazolinyl group, a benzoquinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, a triazinyl group, a dibenzofuranyl group, and a dlbenzothiophenyl group, each substituted with at least one selected from a deuterium, —F, —Cl, —Br, —I, $C_1$-$C_{20}$ alkyl group, a $C_1$-$C_{20}$ alkoxy group, a phenyl group, a naphthyl group, a fluorenyl group, a pyridinyl group, a pyrazinyl group, a pyrimidinyl group, a quinolinyl group, an isoquinolinyl group, a carbazolyl group, —N($Q_{31}$)($Q_{32}$), and —Si($Q_{33}$)($Q_{34}$)($Q_{35}$); and where $Q_{31}$ to $Q_{35}$ may be each independently selected from a methyl group, an ethyl group, an n-propyl group, a tert-butyl group, a phenyl group, a naphthyl group, and a pyridinyl group, but $Ar_{11}$, $Ar_{21}$, $Q_1$, and $Q_2$ are not limited thereto.

For example, in Formulae 1 and 2, $R_{11}$, $R_{21}$, $R_{22}$, and $R_{91}$ to $R_{93}$ may be each independently selected from a hydrogen, a deuterium, F, —Cl, —Br, —I, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group, but $R_{11}$, $R_{21}$, $R_{22}$, and $R_{91}$ to $R_{93}$ are not limited thereto.

In another embodiment, in Formulae 1 and 2, $R_{11}$, $R_{21}$, $R_{22}$ and $R_{91}$ to $R_{93}$ may be each independently selected from a hydrogen, a deuterium, F, —Cl, —Br, —I, a methyl group, an ethyl group, an n-propyl group, an isopropyl group, an n-butyl group, an iso-butyl group, a sec-butyl group, a tert-butyl group, a phenyl group, a naphthyl group, a pyridyl group, a pyrimidyl group, a pyrazinyl group, a fluorenyl group, and a carbazole group, but $R_{11}$, $R_{21}$, $R_{22}$, and $R_{91}$ to $R_{93}$ are not limited thereto.

For example, in Formulae 1 and 2, m11 and m21 may be each independently selected from 1 and 2, but m11 and m21 are not limited thereto.

For example, in Formula 3, $A_3$ may be selected from anthracene, triphenylene, and fluoranthene, but $A_3$ is not limited thereto.

For example, in Formula 3, $A_3$ may be triphenylene, but $A_3$ is not limited thereto.

For example, in Formula 3, $L_3$ is selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindoiylene group, an indolylene group, an indazolyiene group, a purinylene group, a quinolinylene group, an isoquinolinylene group, a benzoquinolinylene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzoxazolyiene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a Spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but $L_3$ is not limited thereto.

For example, in Formula 3, $L_3$ may be selected from:

a phenylene group, a naphthylene group, a fluorenylene group, a pyridinylene group, a pyrazinylene group, a pyrimidinylene group, a quinolinylene group, an isoquinolinylene group, a benzoquinolinylene group, a phthalazinylene group, a quinoxalinylene group, a quinazolinylene group, a benzoquinazolinylene group, a carbazolylene group, a phenanthridinylene group, a benzofuranylene group, a benzothiophenylene group, a benzothiazolylene group, an isobenzothiazolylene group, a benzoxazolylene group, an isobenzoxazolylene group, a triazinylene group, a dibenzofuranylene group, and a dibenzothiophenylene group; and a phenylene group, a naphthylene group, a fluorenylene group, a pyridinylene group, a pyrazinylene group, a pyrimidinylene group, a quinolinylene group, an isoquinolinylene group, a benzoquinolinylene group, a phthalazinylene group, a quinoxalinylene group, a quinazolinylene group, a benzoquinazolinylene group, a carbazolylene group, a phenanthridinylene group, a benzofuranylene group, a benzothiophenylene group, a benzothiazolylene group, an isobenzothiazolylene group, a benzoxazolylene group, an isobenzoxazolylene group, a triazinylene group, a dibenzofuranylene group, and a dibenzothiophenylene group, each substituted with at least one selected from a deuterium, —F, —Cl, —Br, —I, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, a phenyl group, a naphthyl group, a fluorenyl group, a pyridinyl group, a pyrazinyl group, and a pyrimidinyl group, but $L_3$ is not limited thereto.

For example, in Formula 3, a3 may be an integer selected from 0 and 1, but a3 is not limited thereto.

For example, in Formula 3, $Ar_3$ may be selected from:

an ethyl group, an n-propyl group, an iso-propyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a methyl group, an ethyl group, an n-propyl group, an iso-propyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —N($Q_{31}$)($Q_{32}$), and —Si($Q_{33}$)($Q_{34}$)($Q_{35}$), where $Q_{31}$ to $Q_{35}$ may be each independently selected from a $C_1$-$C_{60}$ alkyl group, a $C_6$-$C_{60}$ aryl group, and a $C_1$-$C_{60}$ heteroaryl group, but $Ar_3$ is not limited thereto.

For example, in Formula 3, $Ar_3$ is selected from:

a methyl group, an ethyl group, an n-propyl group, an iso-propyl group, an n-butyl group, an iso-butyl group, a sec-butyl group, a tert-butyl group, a phenyl group, a naphthyl group, a fluorenyl group, a benzofluorenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a quinoxalinyl group, a quinazolinyl group, a benzoquinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, a triazinyl group, a dibenzofuranyl group, and a dibenzothiophenyl group; and a methyl group, an ethyl group, an n-propyl group, an iso-propyl group, an n-butyl group, an iso-butyl group, a sec-butyl group, a tert-butyl group, a phenyl group, a naphthyl group, a fluorenyl group, a benzofluorenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a quinoxalinyl group, a quinazolinyl group, a benzoquinazolinyl group, a phenanthridinyl group, an acridinyl group, a phenanthrolinyl group, a phenazinyl group, a benzimidazolyl group, a benzofuranyl group, a benzothiophenyl group, a benzoxazolyl group, a triazolyl group, a tetrazolyl group, a triazinyl group, a dibenzofuranyl group, and a dibenzothiophenyl group, each substituted with at least one selected from a deuterium, —F, —Cl, —Br, —I, a $C_1$-$C_{20}$ alkyl group, a $C_1$-$C_{20}$ alkoxy group, a phenyl group, a naphthyl group, a fluorenyl group, a pyridinyl group, a pyrazinyl group, a pyrimidinyl group, a quinolinyl group, an isoquinolinyl group, a carbazolyl group, —N($Q_{31}$)($Q_{32}$), and —Si($Q_{33}$)($Q_{34}$)($Q_{35}$), where $Q_{31}$ to $Q_{35}$ may be each independently selected from a methyl group, an ethyl group, an n-propyl group, a tert-butyl group, a phenyl group, a naphthyl group, and a pyridinyl group, but $Ar_3$ is not limited thereto.

For example, in Formula 3, m3 may be an integer selected from 1, 2, and 3, but m3 is not limited thereto.

For example, in Formula 3, m3 may be 1, but m3 is not limited thereto.

In one embodiment, the pyrrolidine-based compound may be represented by one selected from Formulae 1-1 to 1-11, but the pyrrolidine-based compound is not limited thereto:

Formula 1-1

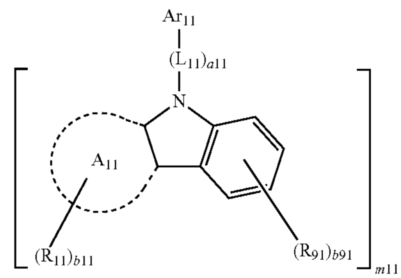

Formula 1-2

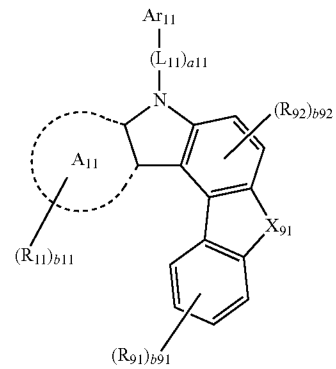

Formula 1-3

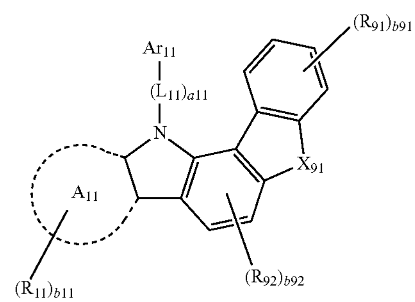

Formula 1-4

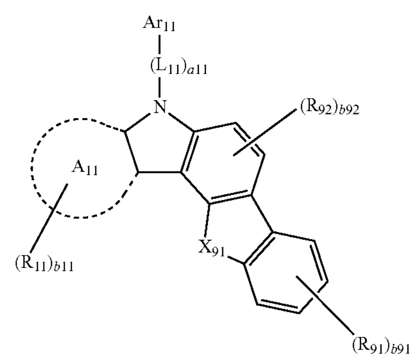

-continued

Formula 1-5

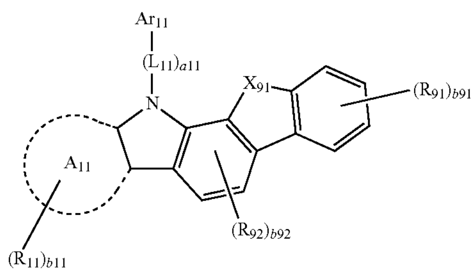

Formula 1-6

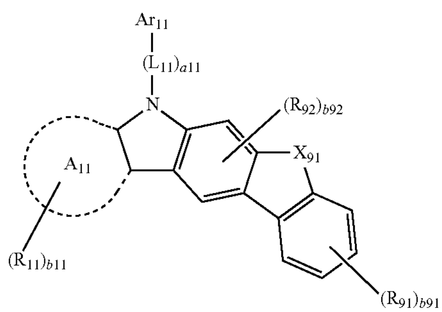

Formula 1-7

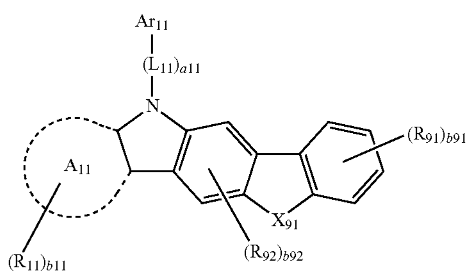

Formula 1-8

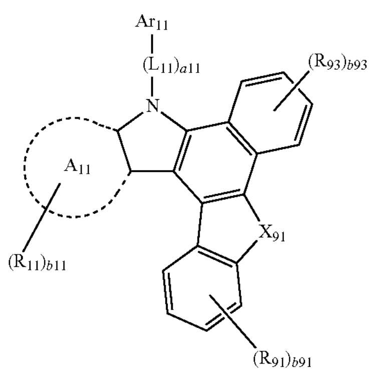

Formula 1-9

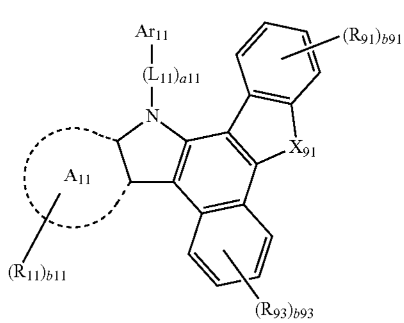

-continued

Formula 1-10

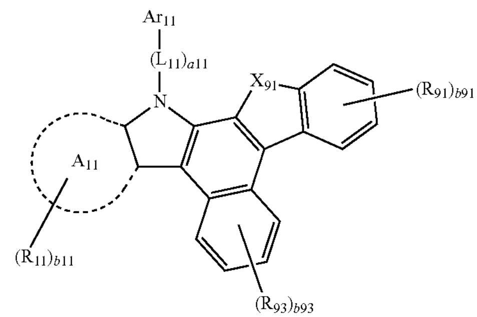

Formula 1-11

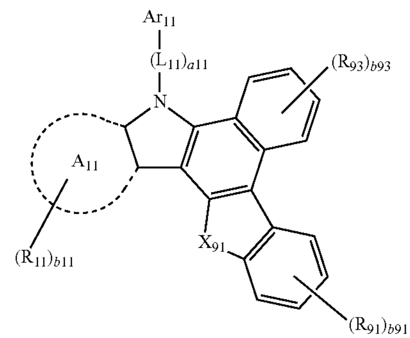

In Formulae 1-1 to 1-11, $A_{11}$, $X_{91}$, $Ar_{11}$, $L_{11}$, a11, $R_{11}$, $R_{91}$ to $R_{93}$, b11, and b91 to b93 are the same as those described with respect to Formulae 1 and 9-1 to 9-6.

In another embodiment, the pyrrolidine-based compound may be represented by one selected from Formulae 1-1 to 1-11, but the pyrrolidine-based compound is not limited thereto:

Formula 1-1

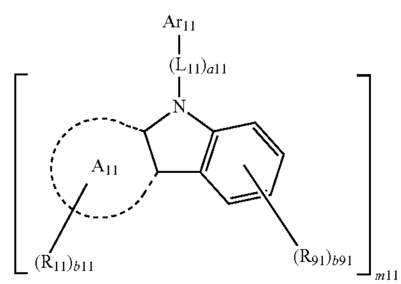

Formula 1-2

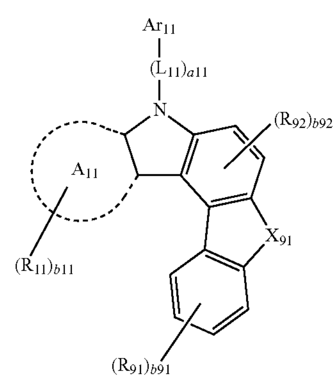

-continued

Formula 1-3

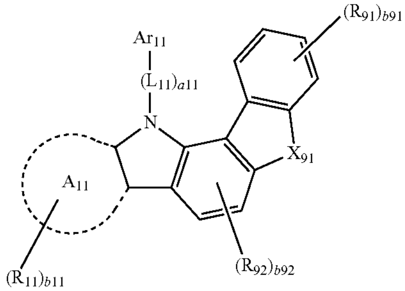

Formula 1-4

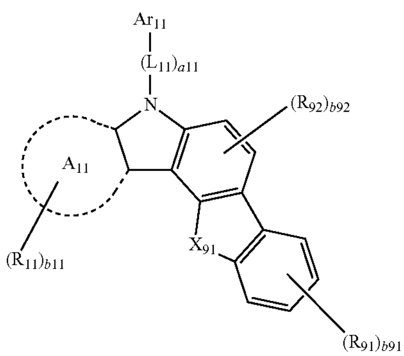

Formula 1-5

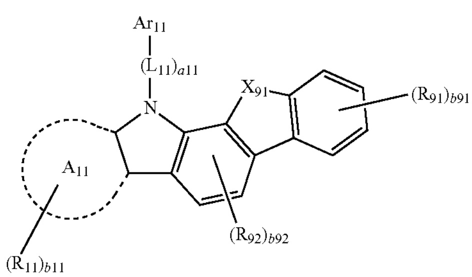

Formula 1-6

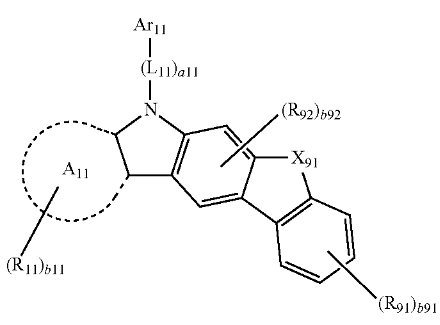

Formula 1-7

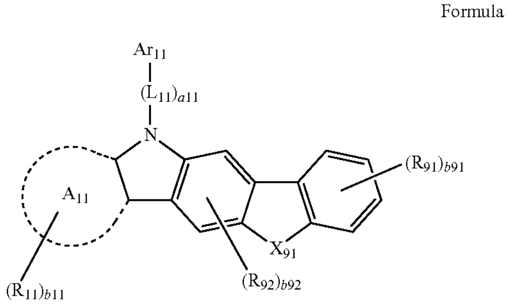

-continued

Formula 1-8

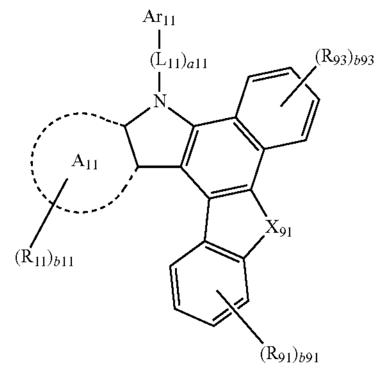

Formula 1-9

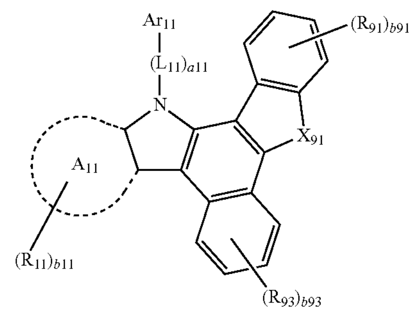

Formula 1-10

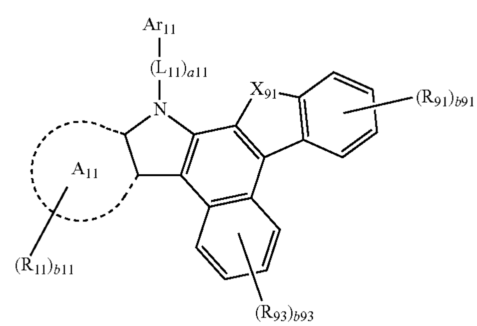

Formula 1-11

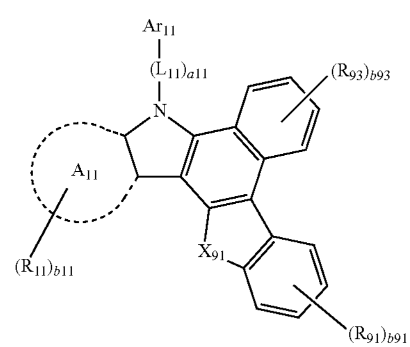

In Formulae 1-1 to 1-11, $A_{11}$ may be selected from benzene and naphthylene;

$X_{91}$, $Ar_{11}$, $L_{11}$, a11, $R_{11}$, $R_{91}$ to $R_{93}$, b11, b91 to b93, and m11 are the same as those described with respect to Formulae 1 and 9-1 to 9-6.

In another embodiment, the pyrrolidine-based compound may be represented by one selected from Formulae 2-1 to 2-7, but the pyrrolidine-based compound is not limited thereto:

Formula 2-1
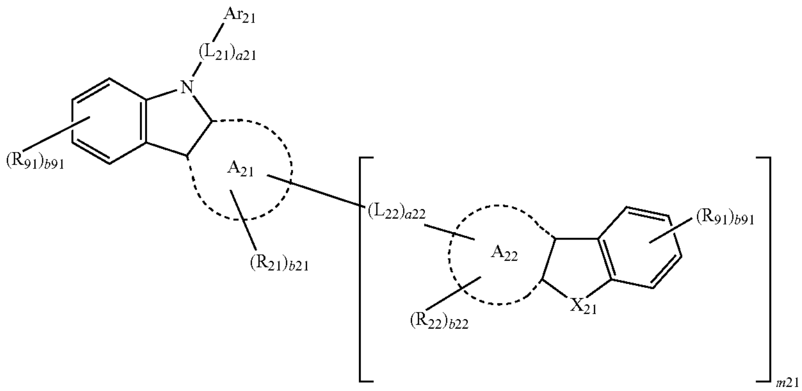
Formula 2-2
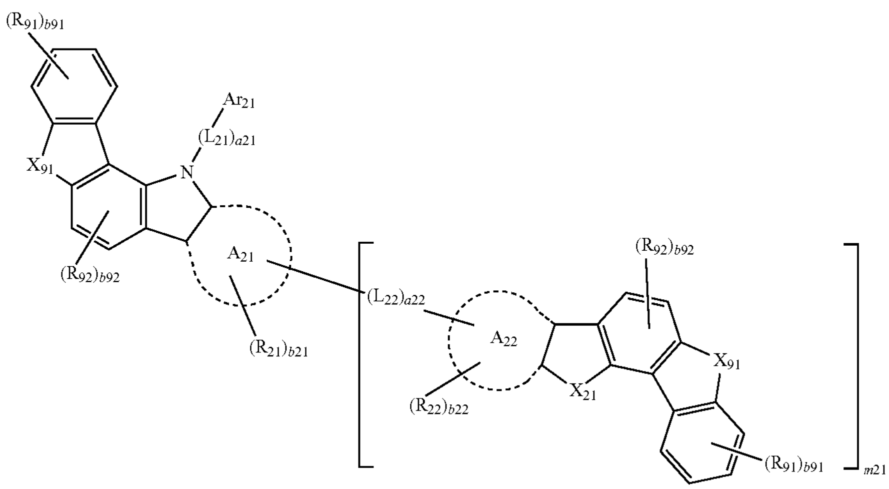
Formula 2-3
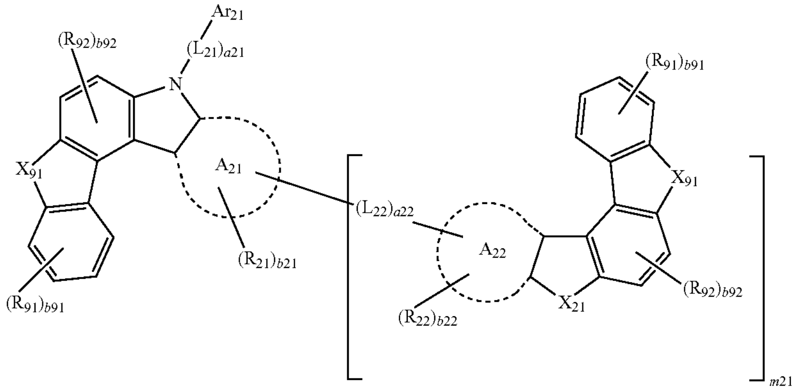

-continued
Formula 2-4
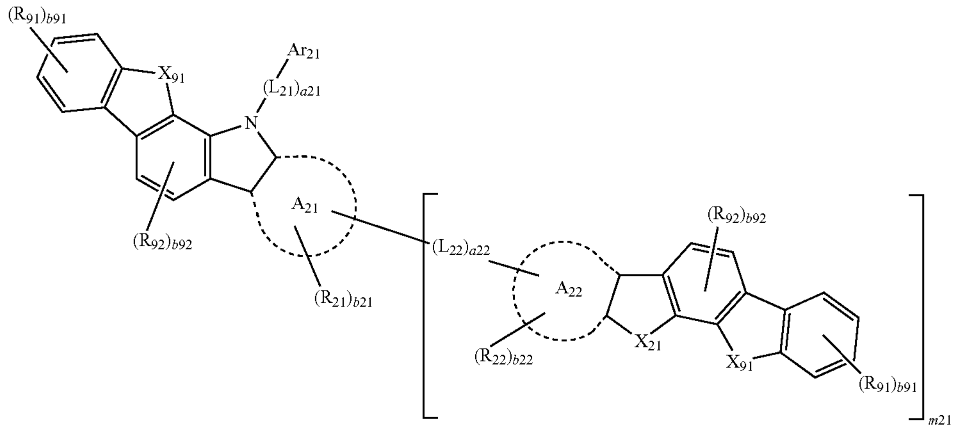
Formula 2-5
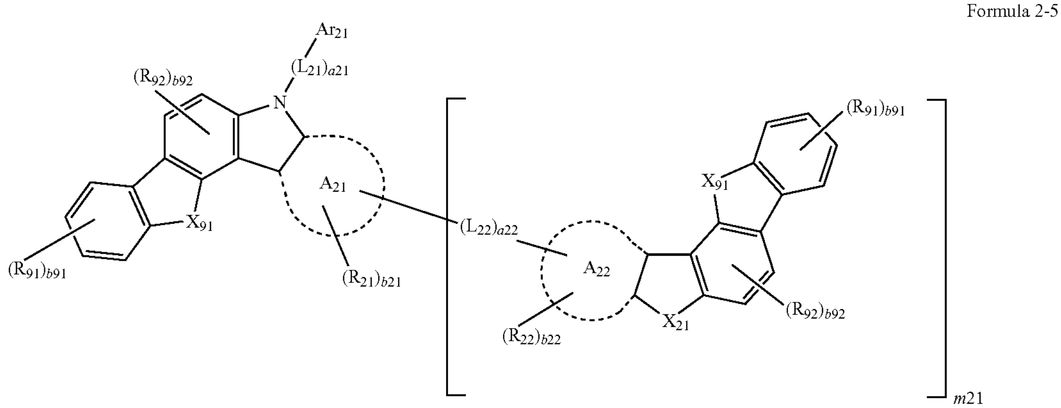
Formula 2-6
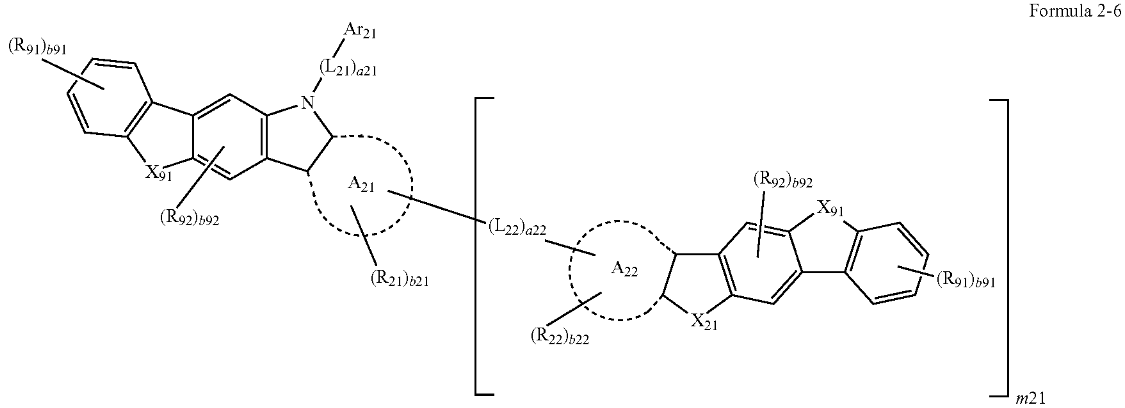
Formula 2-7
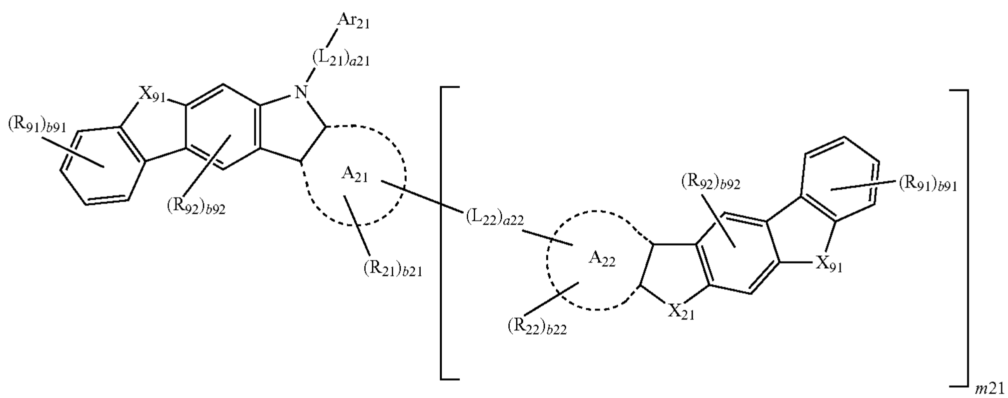

In Formulae 2-1 to 2-7,
$X_{21}$, $X_{91}$, $A_{21}$, $A_{22}$, $Ar_{21}$, $L_{21}$, $L_{22}$, a21, a22, $R_{21}$, $R_{22}$, $R_{91}$, $R_{92}$, b21, b22, b91, b92, and m21 are the same as those described with respect to Formulae 2 and 9-1 to 9-6.
In another embodiment, the pyrrolidine-based compound may be represented by one selected from Formulae 2-1A to 2-7A, but the pyrrolidine-based compound is not limited thereto:
Formula 2-1A
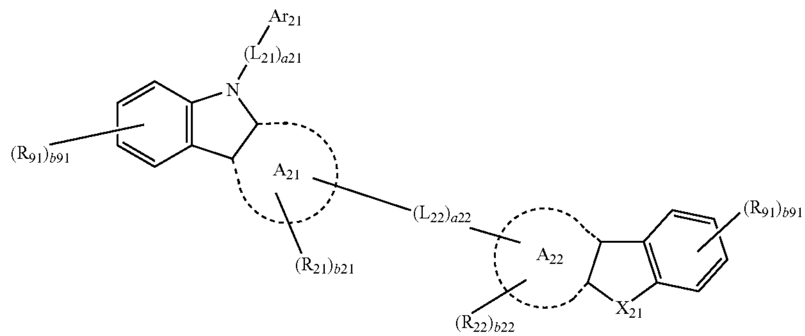
Formula 2-2A
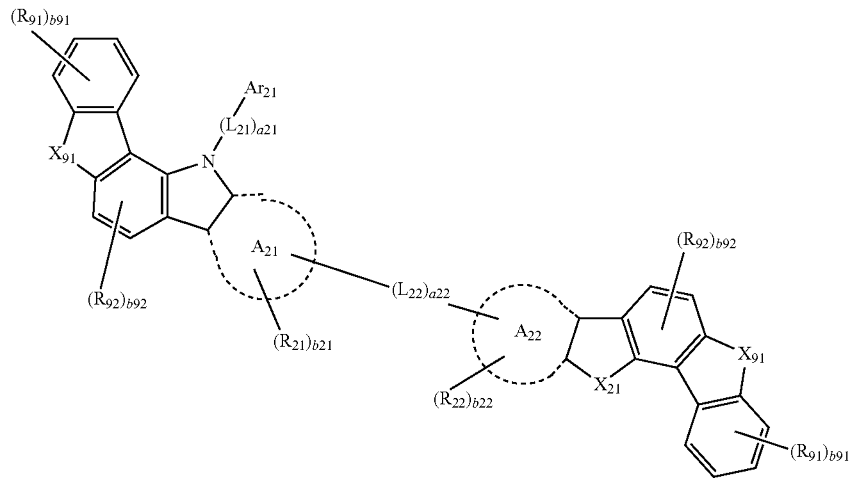
Formula 2-3A
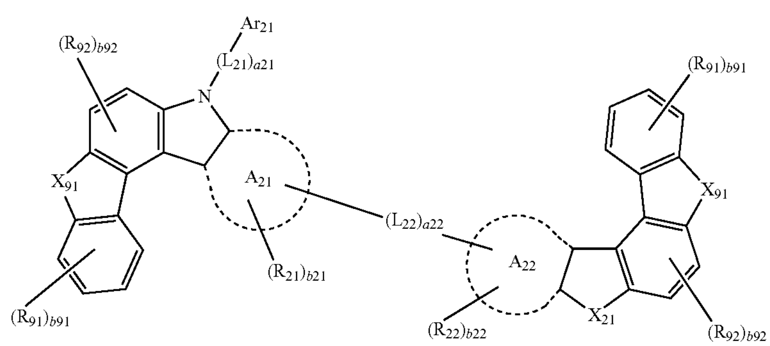
Formula 2-4A
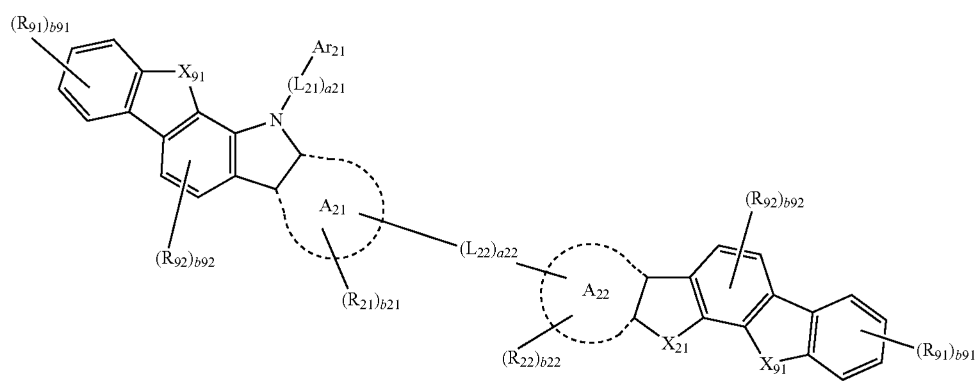

-continued

Formula 2-5A

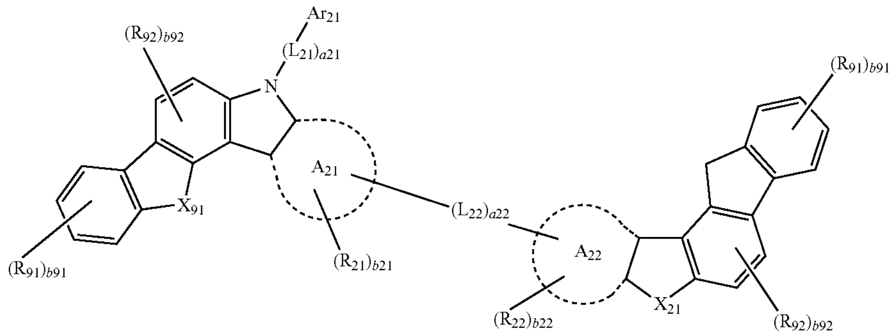

Formula 2-6A

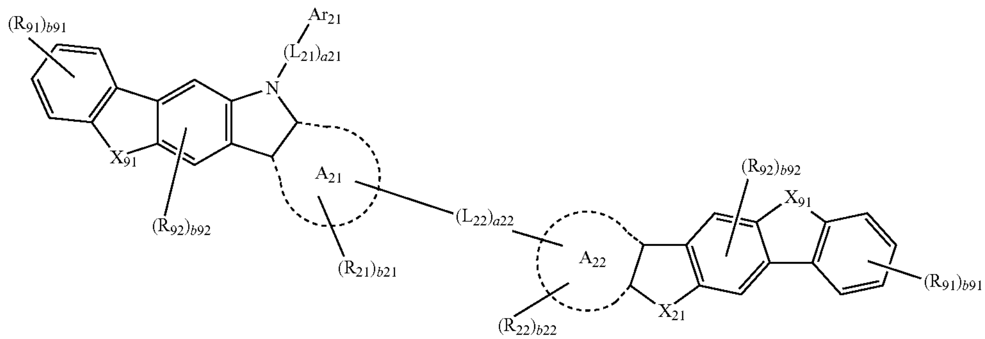

Formula 2-7A

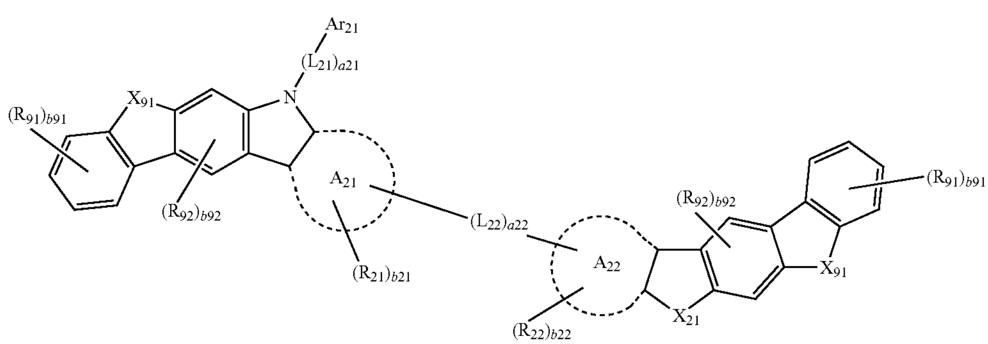

In Formulae 2-1A to 2-7A, $X_{21}$, $X_{91}$, $A_{21}$, $A_{22}$, $Ar_{21}$, $L_{21}$, $L_{22}$, a21, a22, $R_{21}$, $R_{22}$, $R_{91}$, $R_{92}$, b21, b22, b91, and b92 are the same as those described with respect to Formulae 2 and 9-1 to 9-6.

In one embodiment, the $C_{10}$-$C_{30}$ polycyclic aromatic hydrocarbon-based compound may be represented by Formula 3-1, but the $C_{10}$-$C_{30}$ polycyclic aromatic hydrocarbon-based compound is not limited thereto:

Formula 3-1

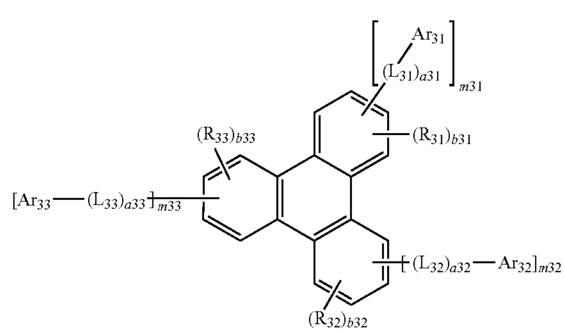

In Formula 3-1, $L_{31}$ to $L_{33}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic heterocondensed polycyclic group;

a31 to a33 are each independently an integer selected from 0, 1, 2, and 3;

$Ar_{31}$ to $Ar_{33}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic heterocondensed polycyclic group;

$R_{31}$ to $R_{33}$ are each independently selected from a hydrogen, a deuterium, F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic heterocondensed polycyclic group;

b31 is selected from an integer selected from 0, 1, 2, and 3;

b32 and b33 are each independently an integer selected from 0, 1, 2, 3, and 4;

m31 is an integer selected from 1, 2, 3, and 4;

m32 and m33 are each independently an integer selected from 0, 1, 2, 3, and 4;

at least one substituent of the substituted $C_3$-$C_{10}$ cycloalkylene group, substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic heterocondensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic heterocondensed polycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, $—N(Q_{11})(Q_{12})$, $—Si(Q_{13})(Q_{14})(Q_{15})$, and $—B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, $—N(Q_{21})(Q_{22})$, $—Si(Q_{23})(Q_{24})(Q_{25})$, and $—B(Q_{26})(Q_{27})$; and $—N(Q_{31})(Q_{32})$, $—Si(Q_{33})(Q_{34})(Q_{35})$, and $—B(Q_{36})(Q_{37})$;

where $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic heterocondensed polycyclic group.

For example, in Formula 3-1, $L_{31}$ to $L_{33}$ may be each independently the same as $L_3$ as described with respect to Formula 3.

For example, in Formula 3-1, a31 to a33 may be each independently the same as a3 as described with respect to Formula 3.

For example, in Formula 3-1, $Ar_{31}$ to $Ar_{33}$ may be each independently the same as $Ar_a$ as described with respect to Formula 3.

For example, in Formula 3-1, m31 may be 1; and m32 and m33 may be 0, but m31, m32, and m33 are not limited thereto.

For example, in Formula 3-1, $R_{31}$ to $R_{33}$ may be each independently selected from a hydrogen, a deuterium, F, —Cl, —Br, —I, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic heterocondensed polycyclic group, but $R_{31}$ to $R_{33}$ are not limited thereto.

For example, in Formula 3-1, $R_{31}$ to $R_{33}$ may be each independently, a hydrogen, a deuterium, F, —Cl, —Br, —I, a methyl group, an ethyl group, an n-propyl group, an iso-propyl group, an n-butyl group, an iso-butyl group, a sec-butyl group, a tert-butyl group, a phenyl group, a naphthyl group, a pyridyl group, a pyrimidyl group, a pyrazinyl group, a fluorenyl group, and a carbazolyl group, but $R_{31}$ to $R_{33}$ are not limited thereto.

In another embodiment, the $C_{10}$-$C_{30}$ polycyclic aromatic hydrocarbon-based compound may be represented by Formula 3-1A, but the $C_{10}$-$C_{30}$ polycyclic aromatic hydrocarbon-based compound is not limited thereto:

Formula 3-1A

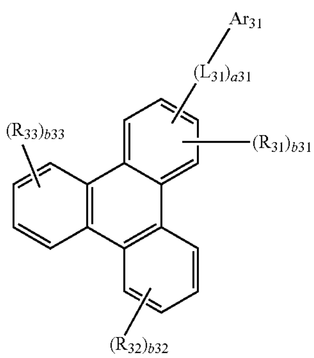

In Formula 3-1A, $L_{31}$, a31, $Ar_{31}$, $R_{31}$ to $R_{33}$, and b31 to b33 are the same as those described with respect to Formula 3-1.

In another embodiment, the $C_{10}$-$C_{30}$ polycyclic aromatic hydrocarbon-based compound may be represented by Formula 3-1B, but the $C_{10}$-$C_{30}$ polycyclic aromatic hydrocarbon-based compound is not limited thereto:

Formula 3-1B

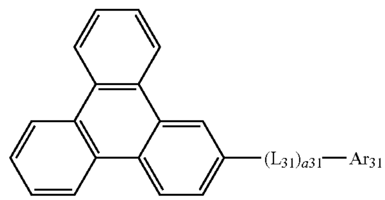

In Formula 3-1B, $L_{31}$, a31, and $Ar_{31}$ are the same as those described with respect to Formula 3-1.

In some embodiments, the first material and the second material may be selected from the following compounds, but the first material and the second material are not limited thereto:

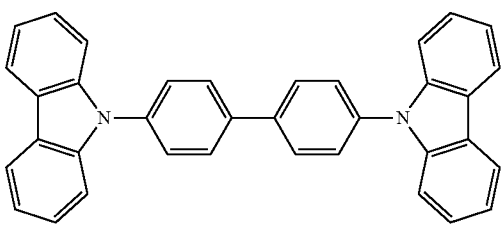

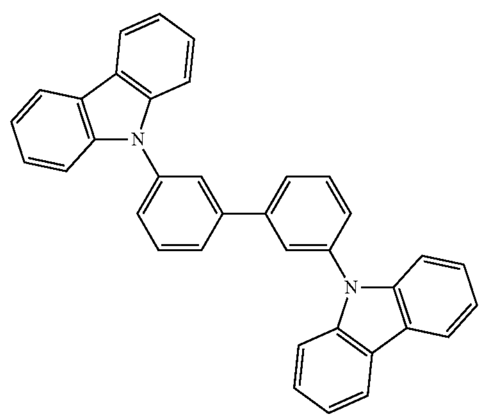

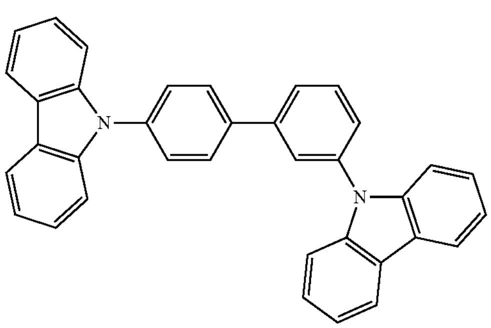

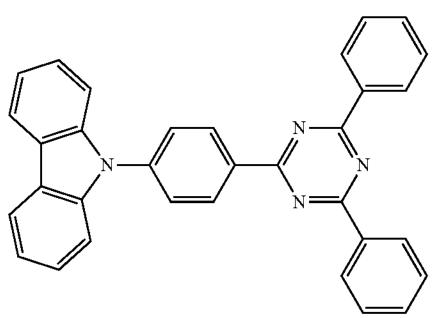

-continued
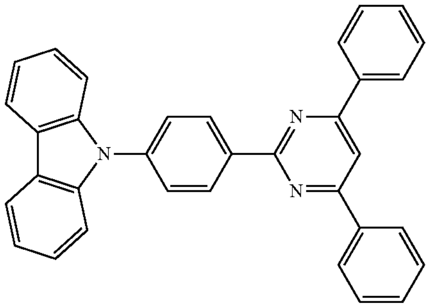
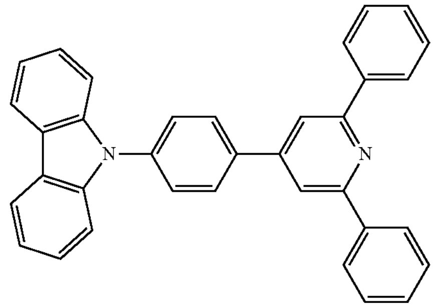
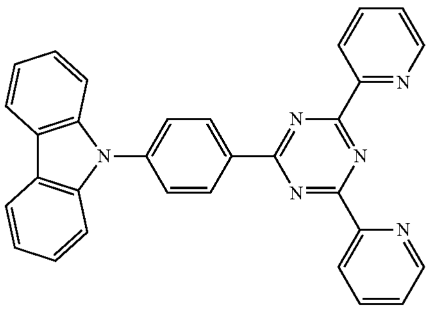
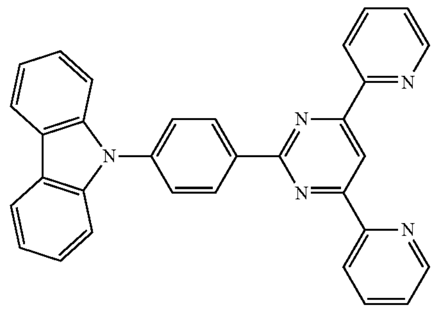
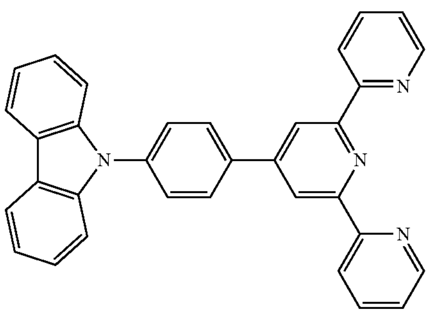
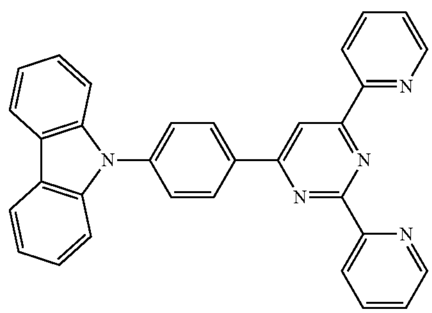
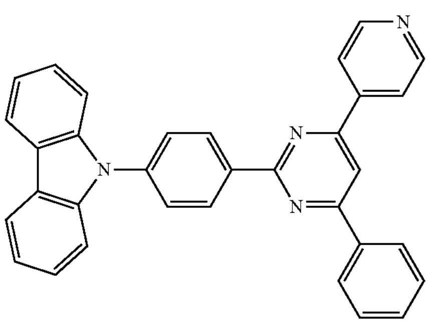
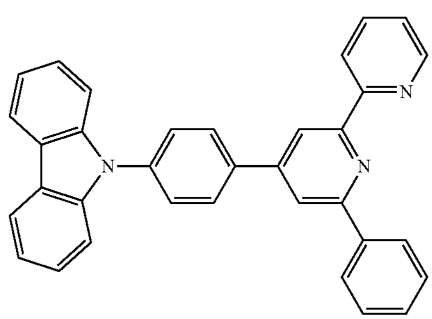
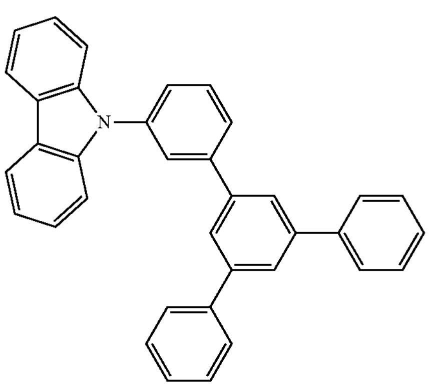
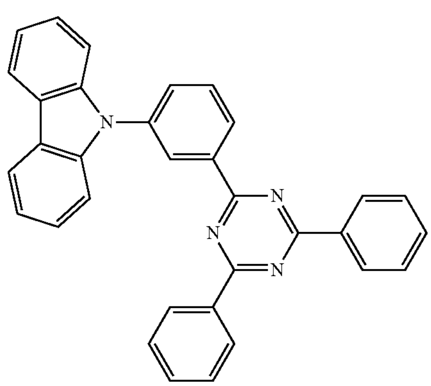

-continued
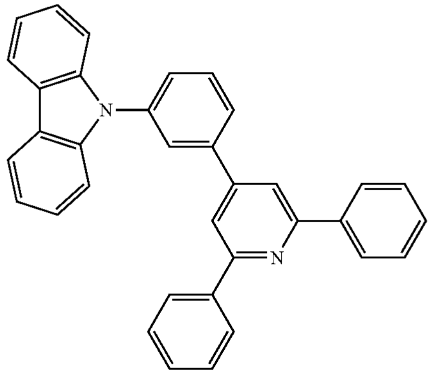
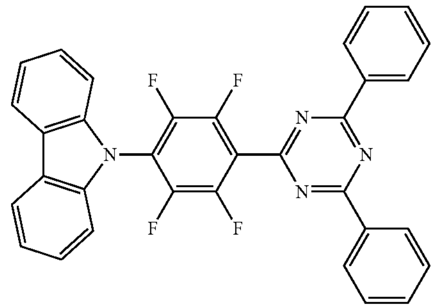
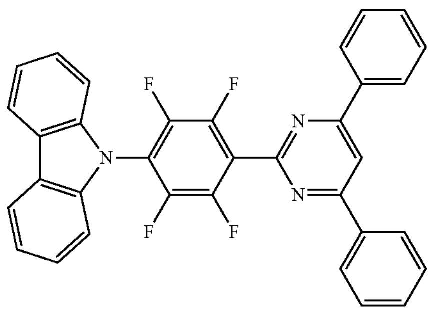
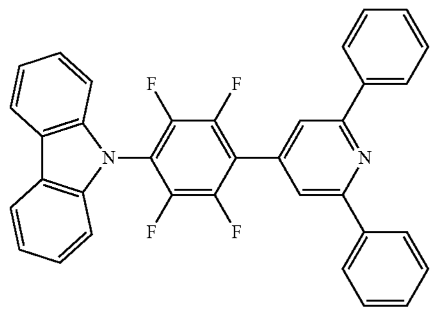
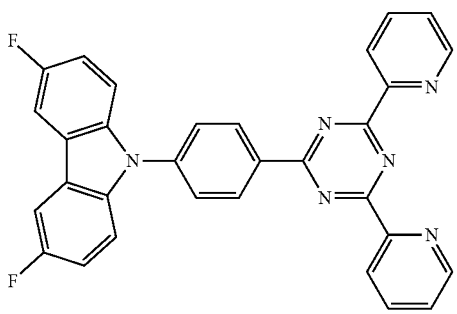
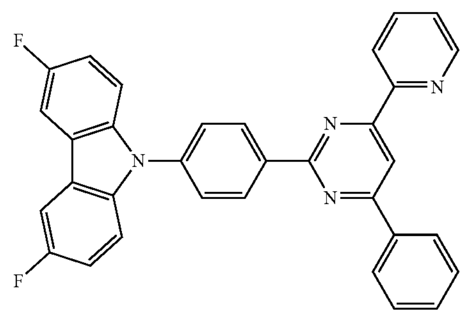
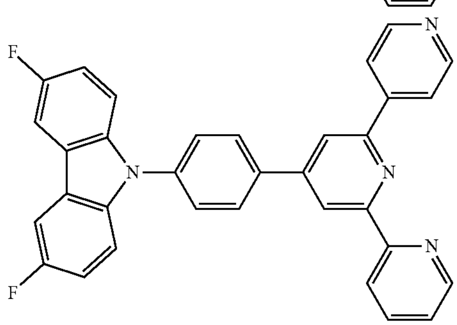
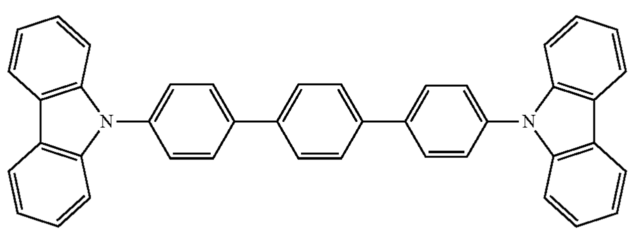
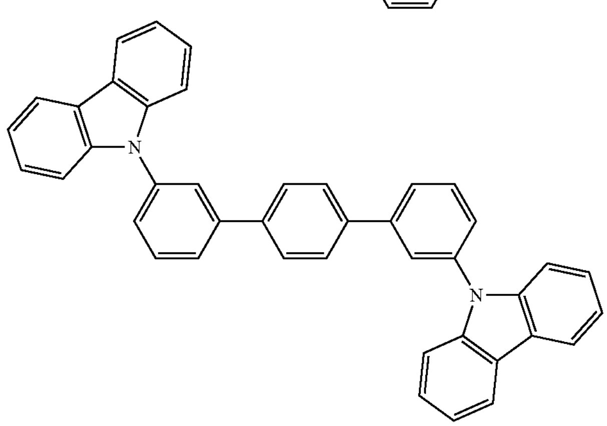

-continued
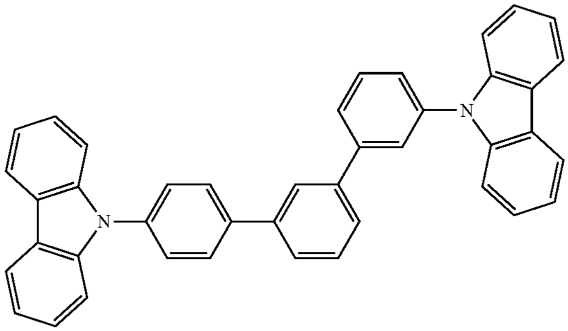
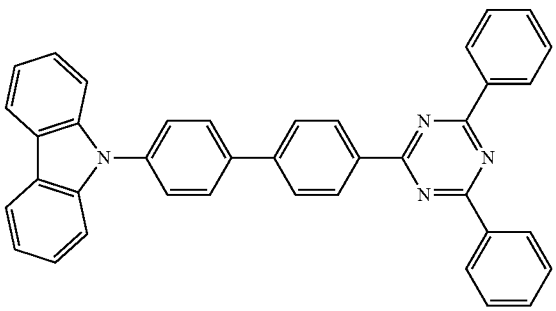
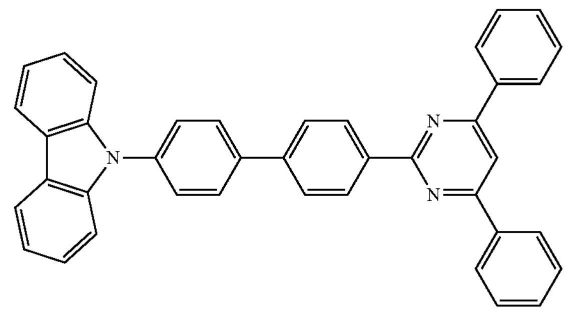
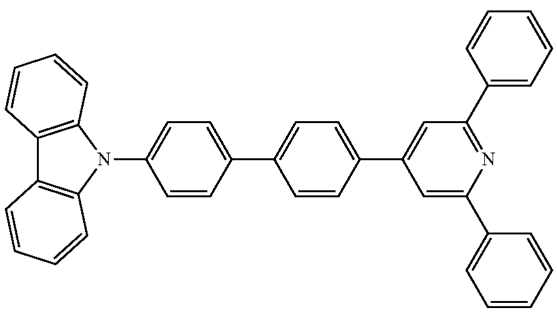
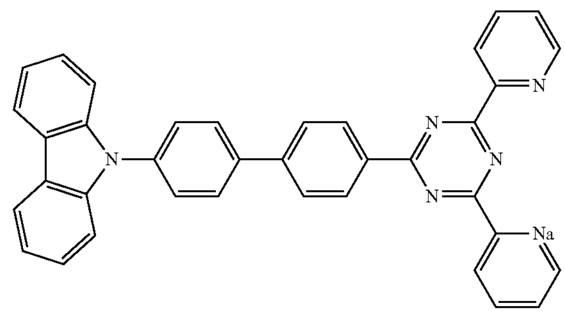
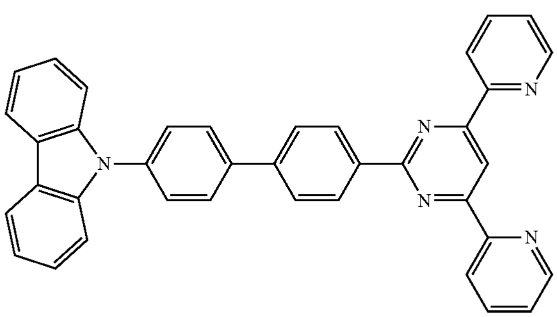
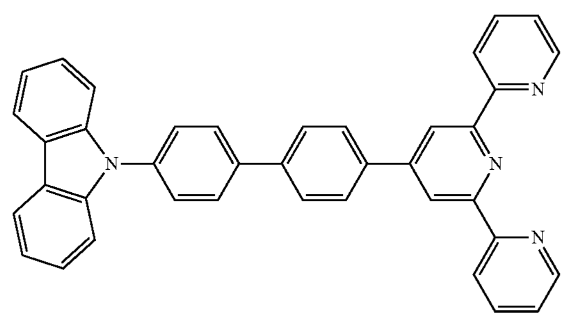
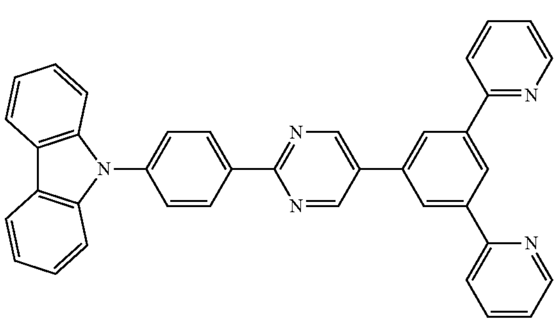
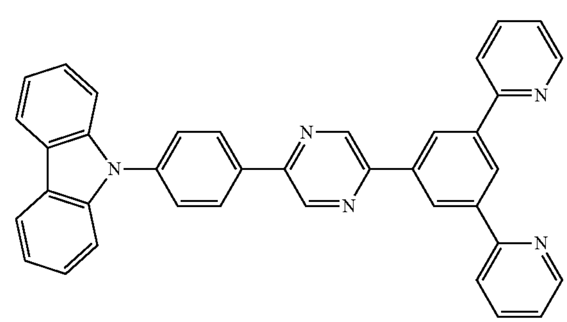

-continued
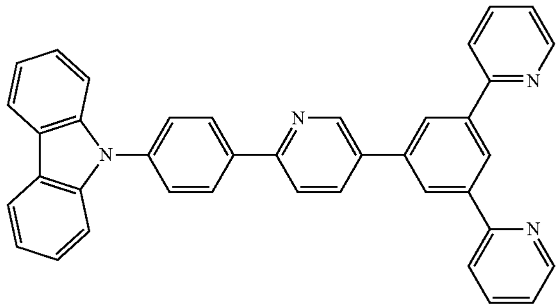
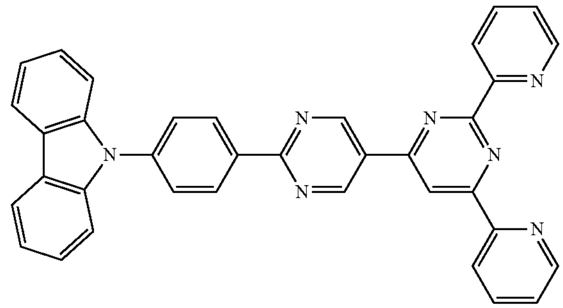
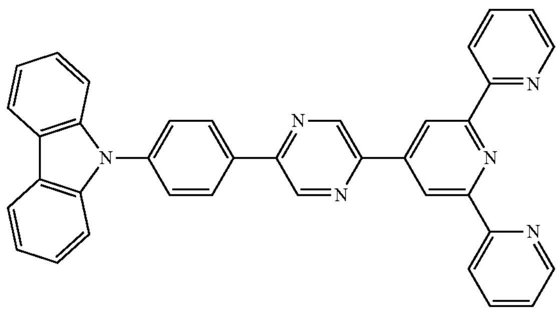
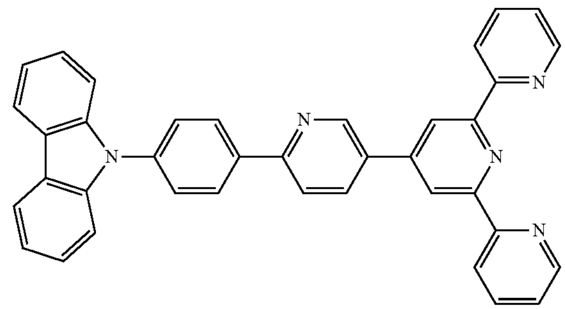
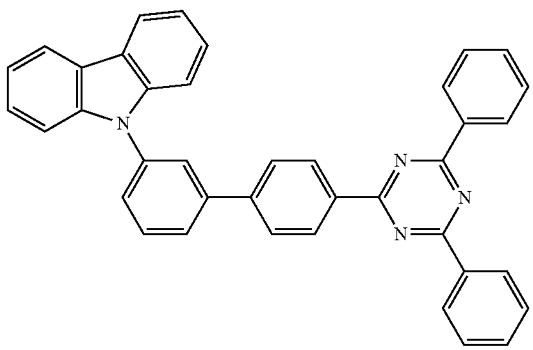
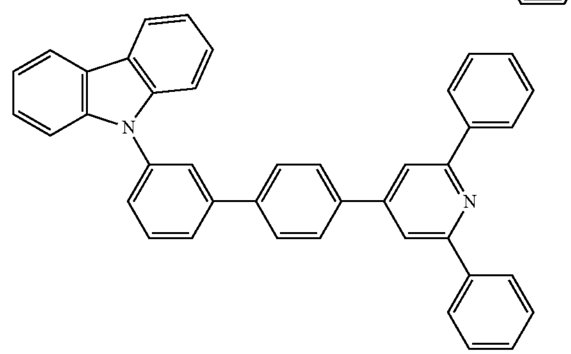
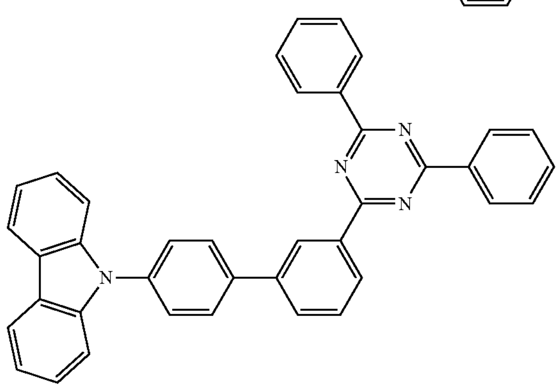
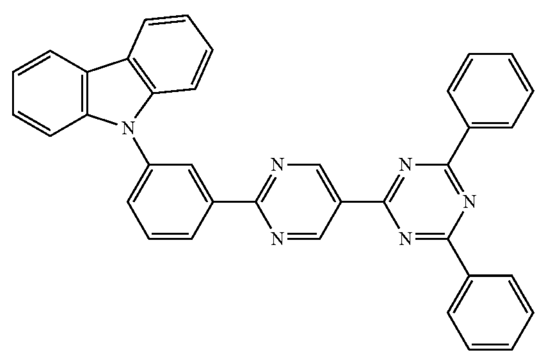
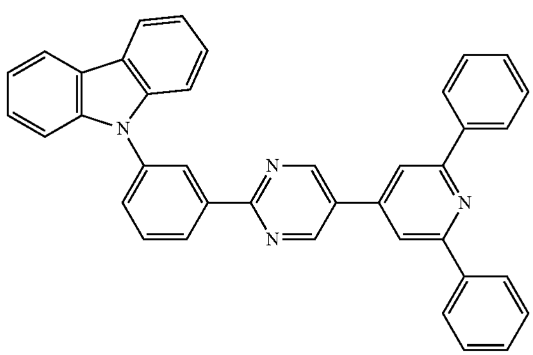
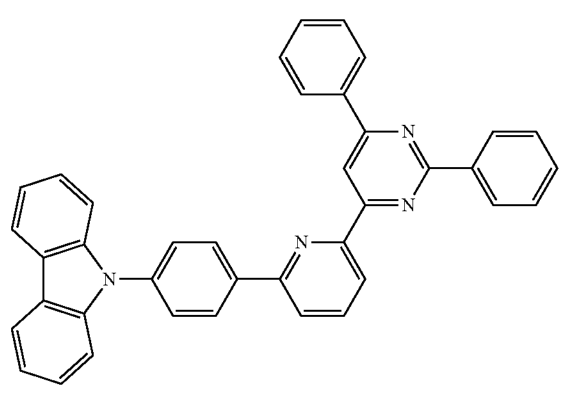

-continued
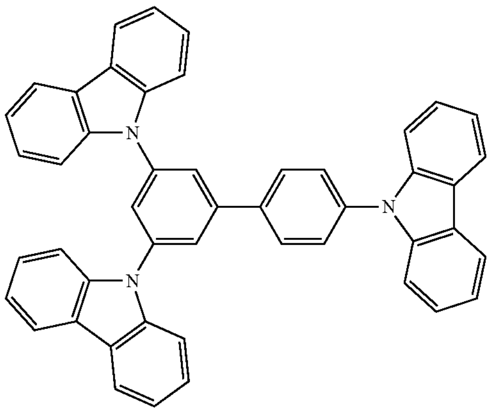
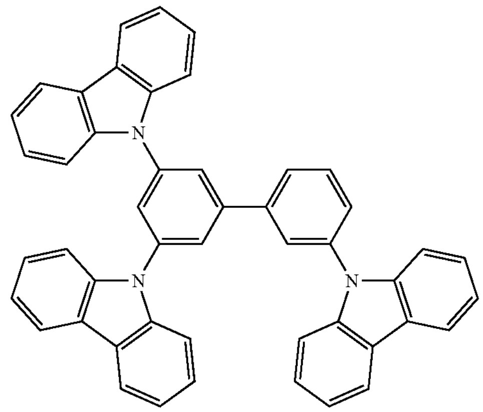
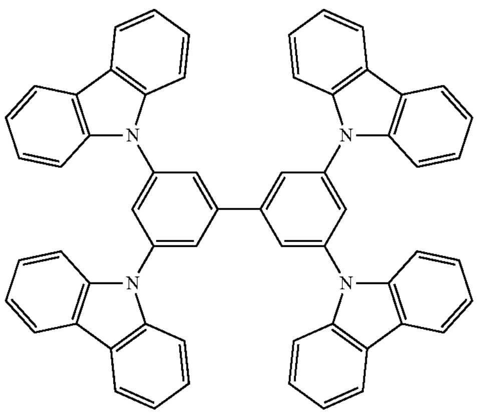
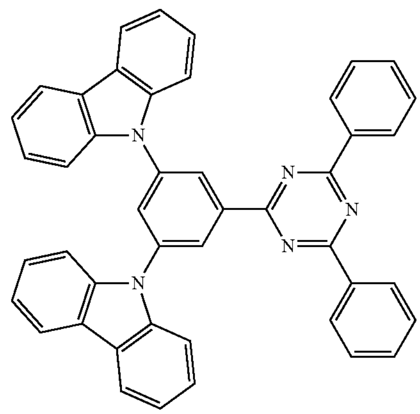
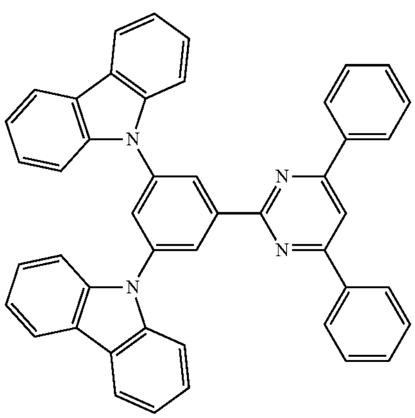
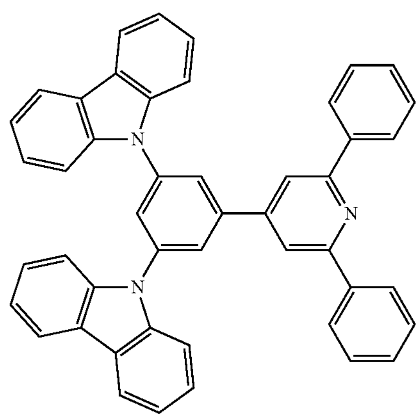
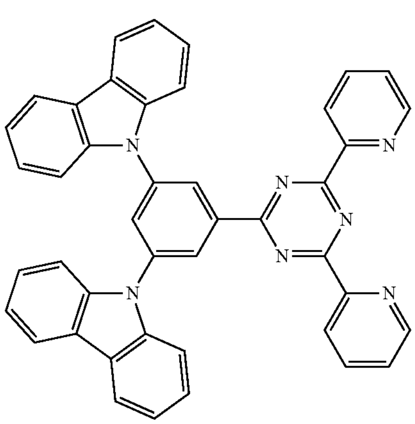
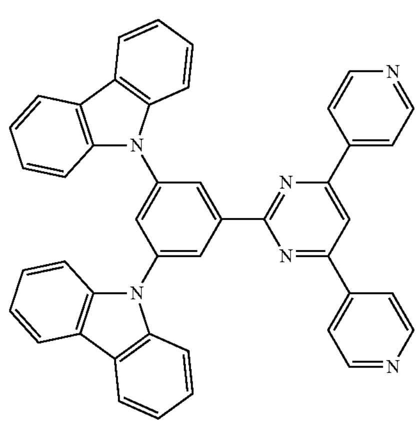

-continued
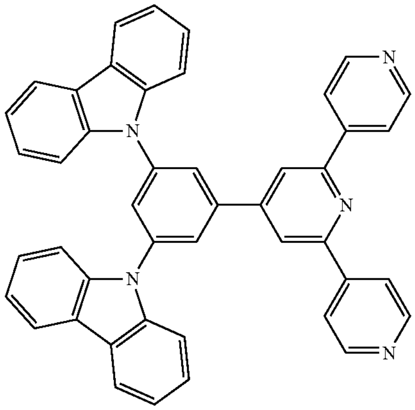
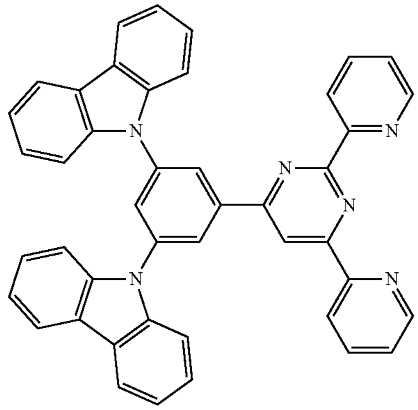
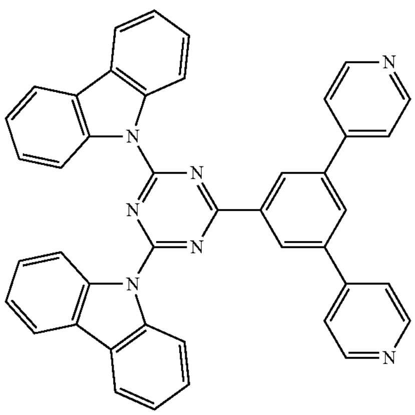
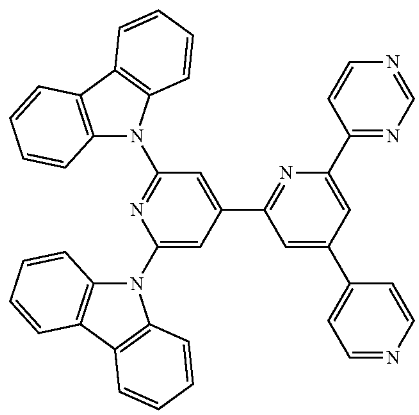
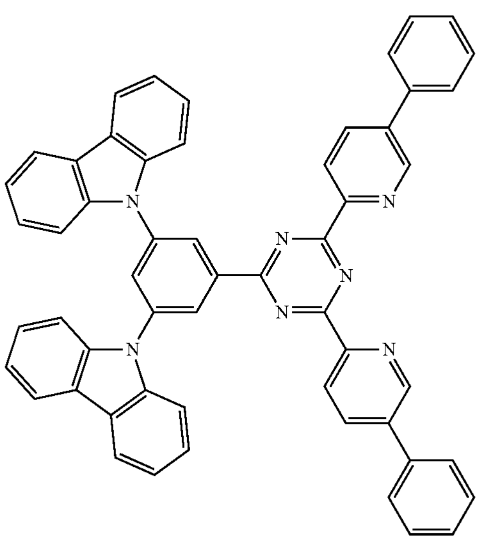
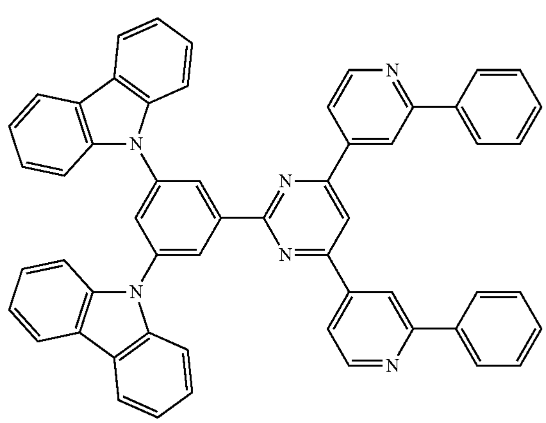

-continued
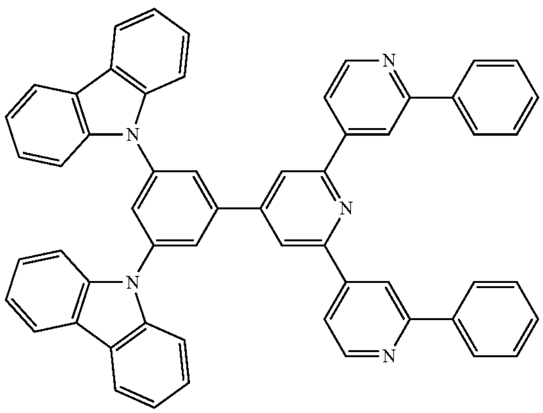
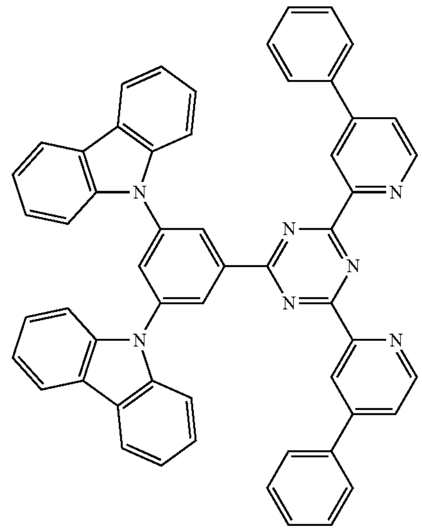
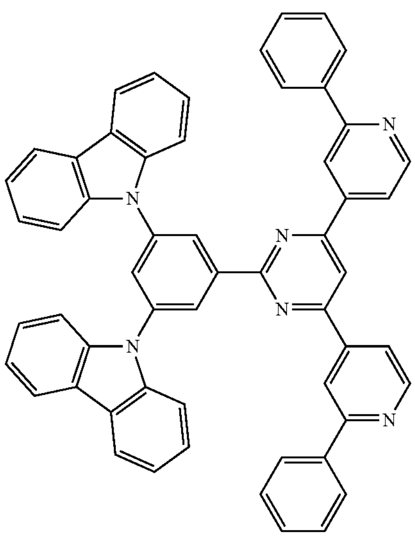
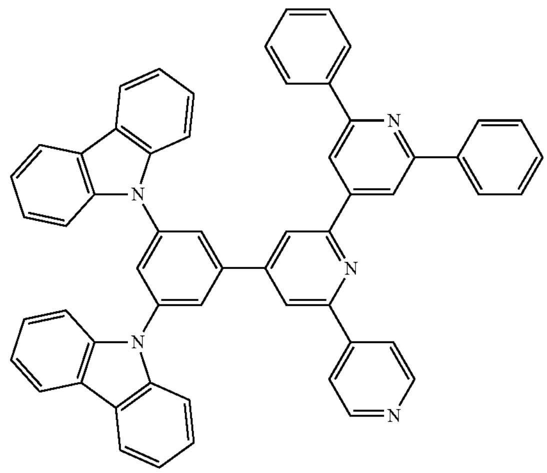
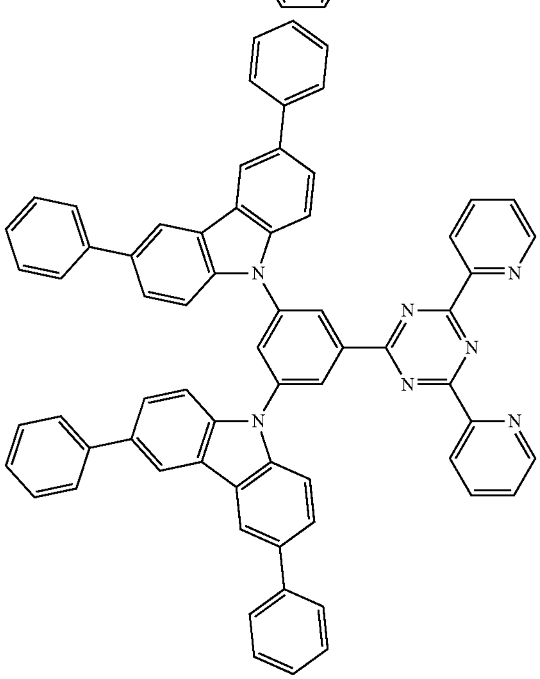
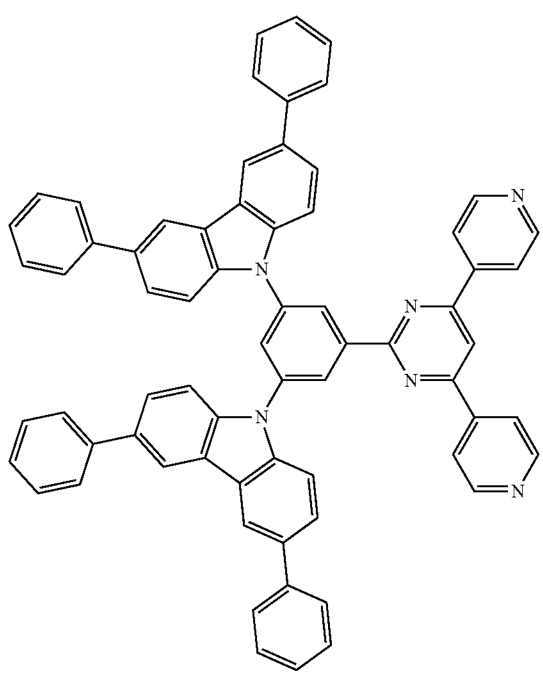

-continued
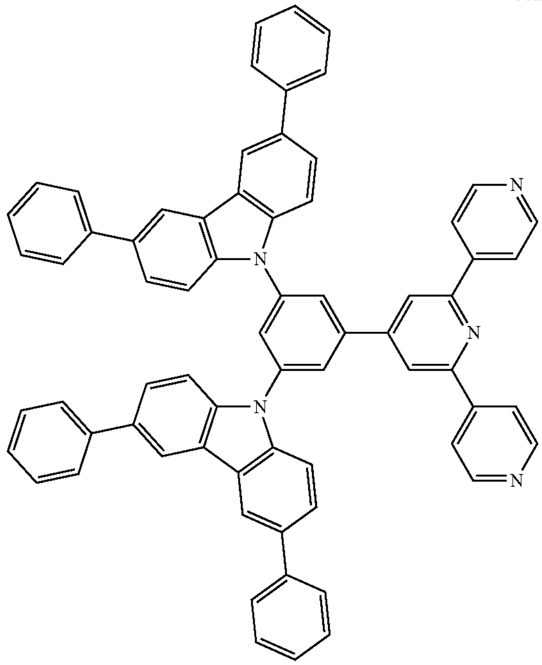
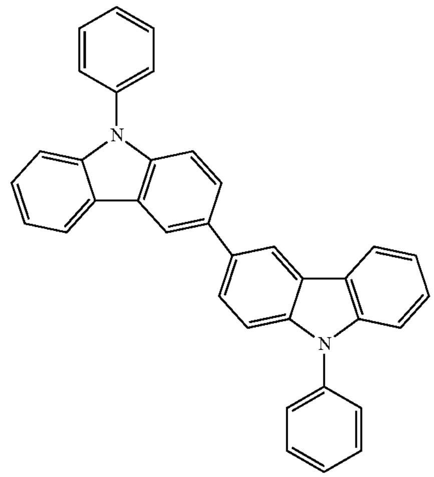
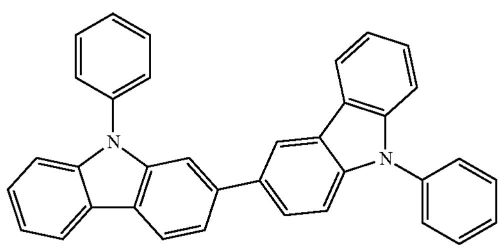
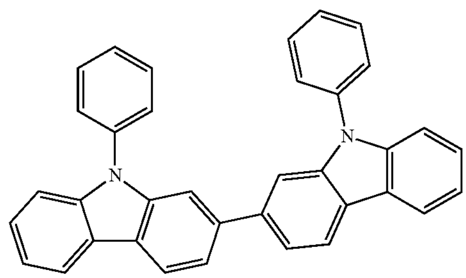
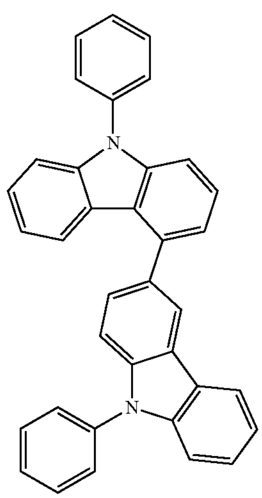
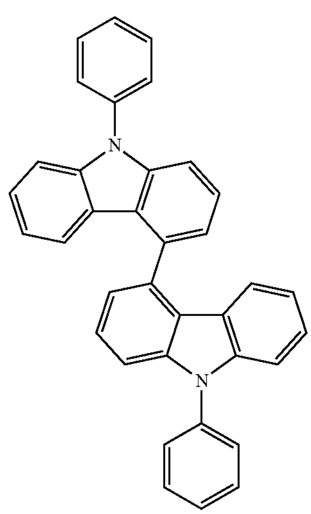
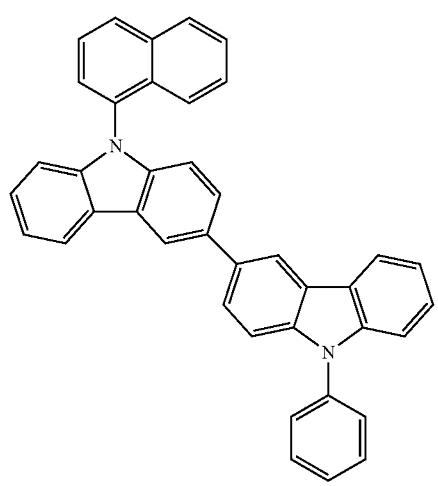

-continued
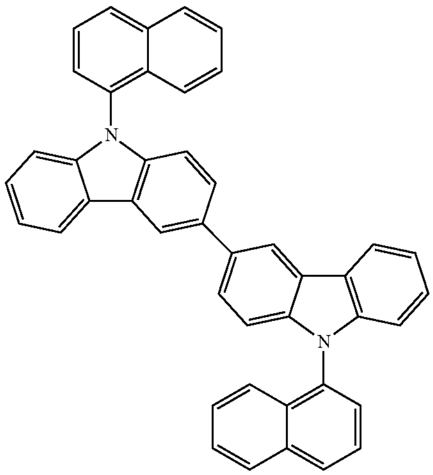
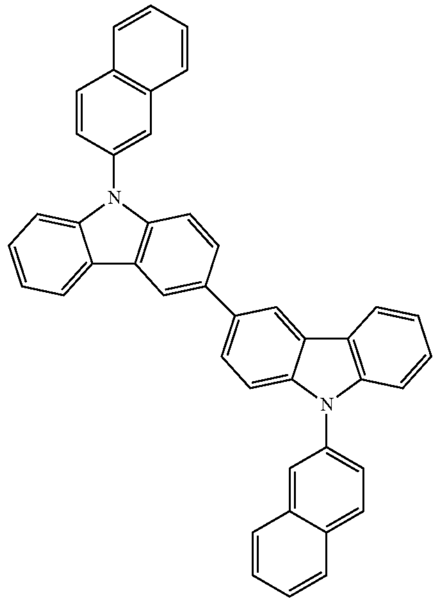
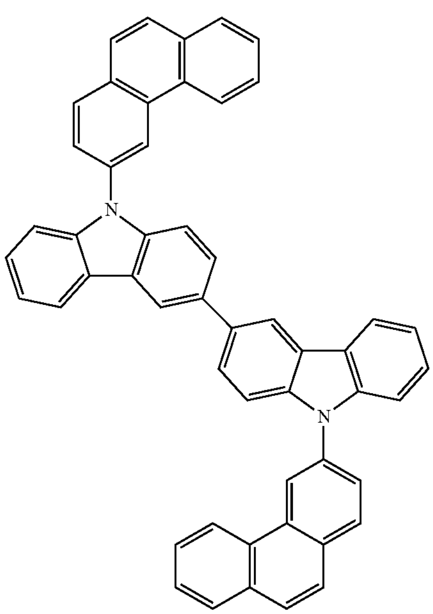
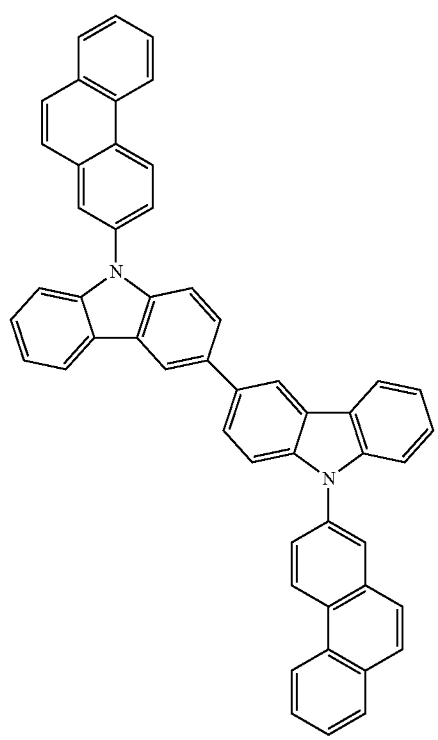

-continued
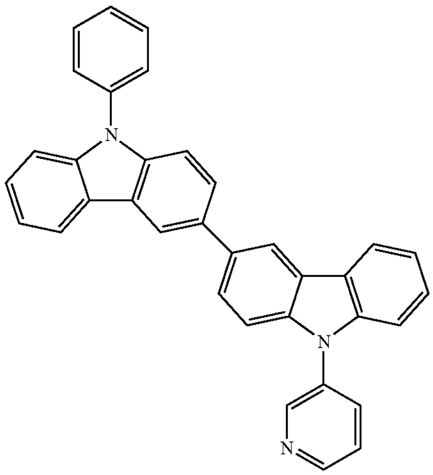
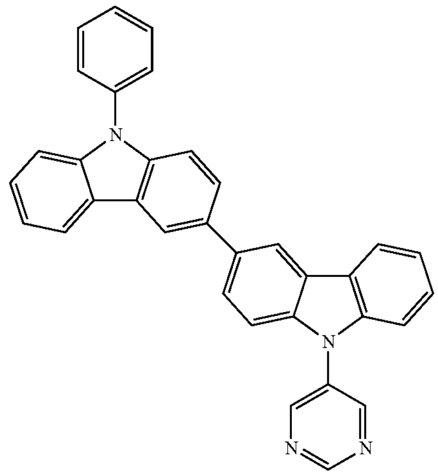
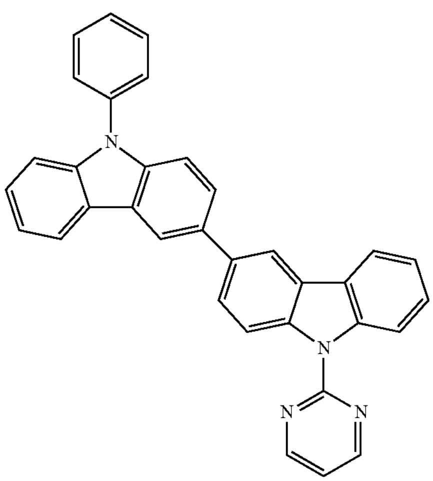
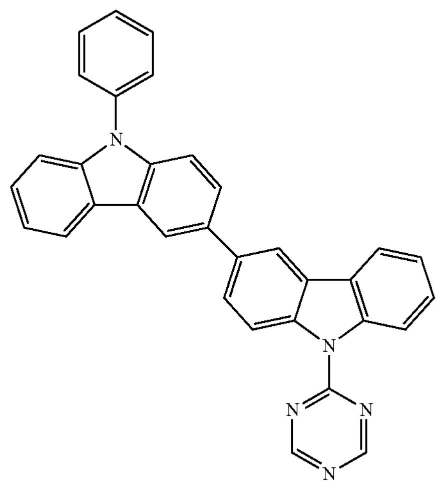
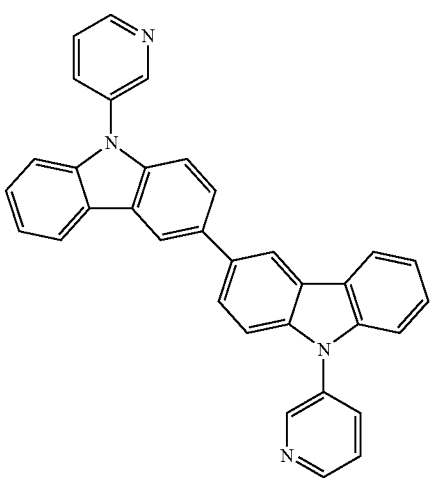
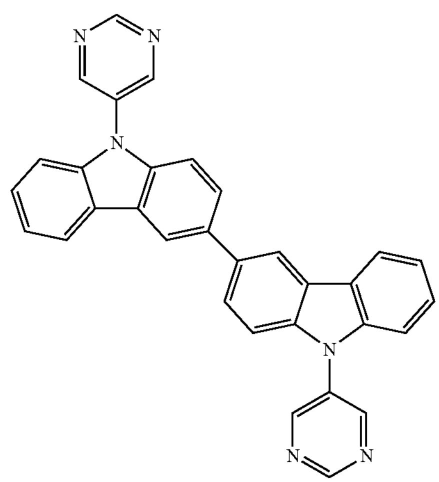

-continued
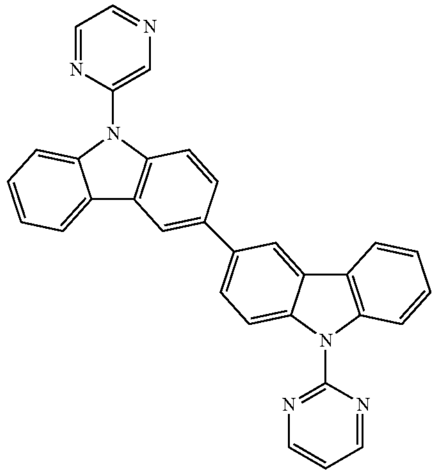
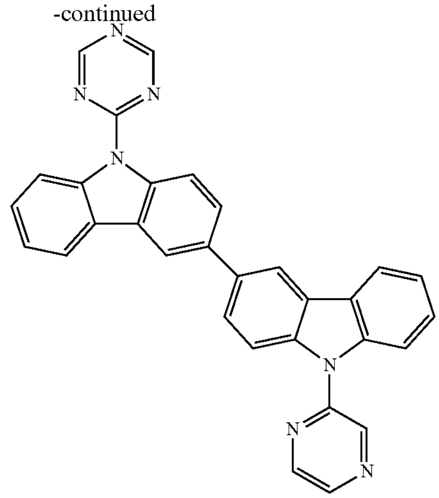
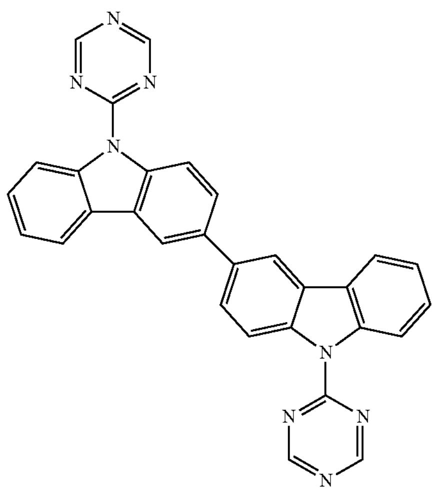
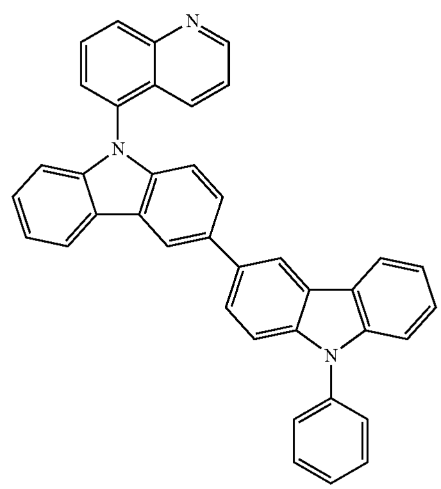
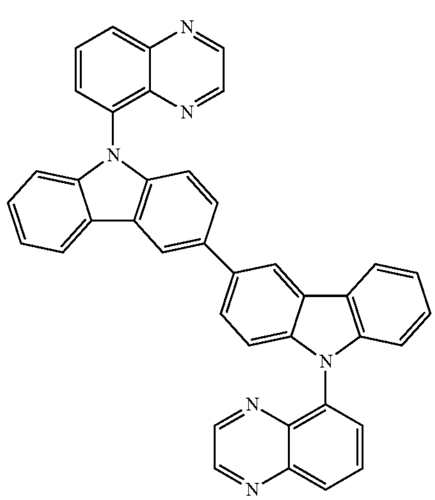
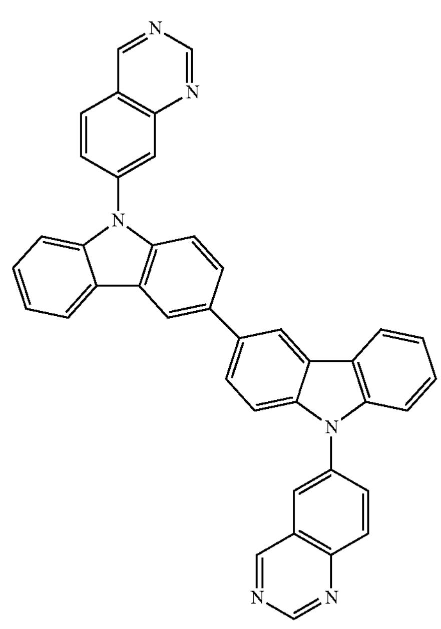

-continued
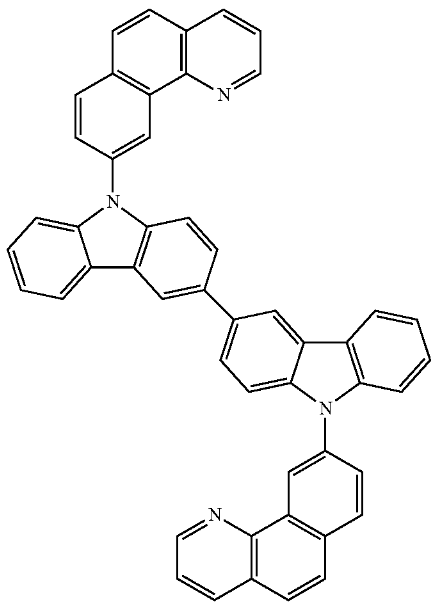
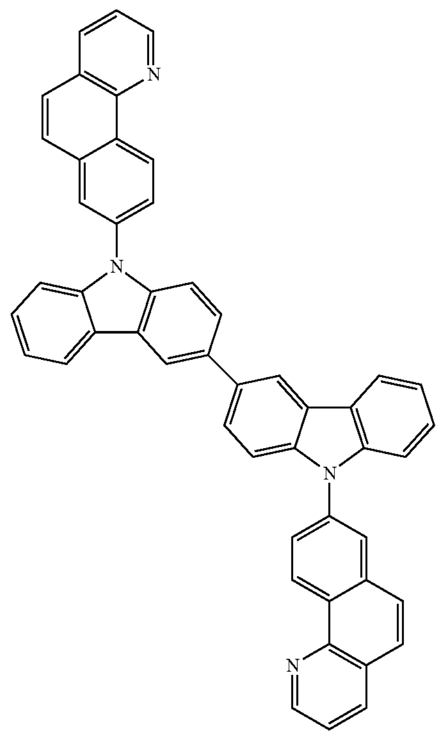
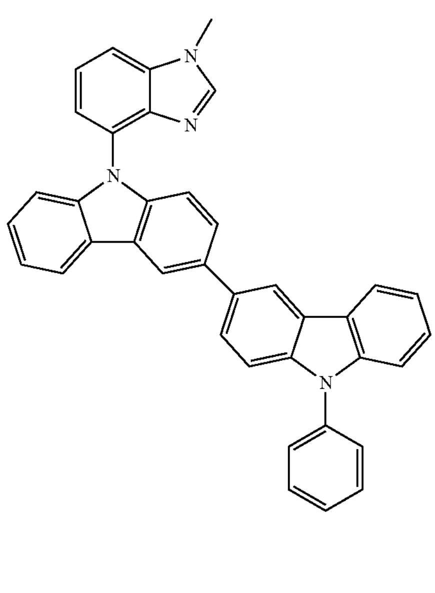
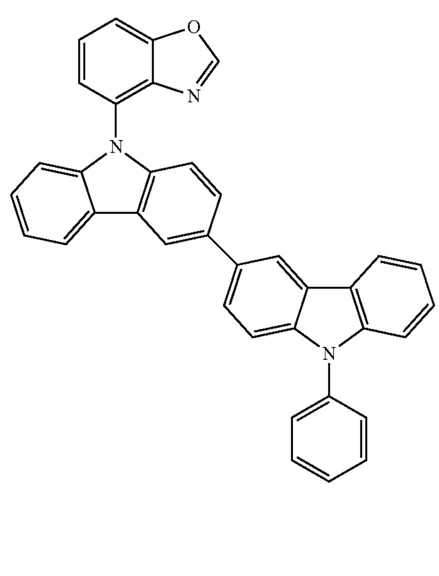

-continued
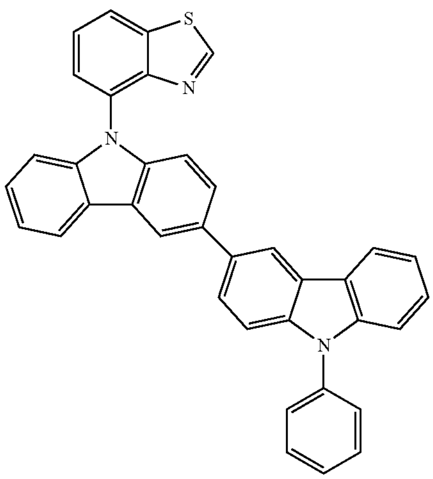
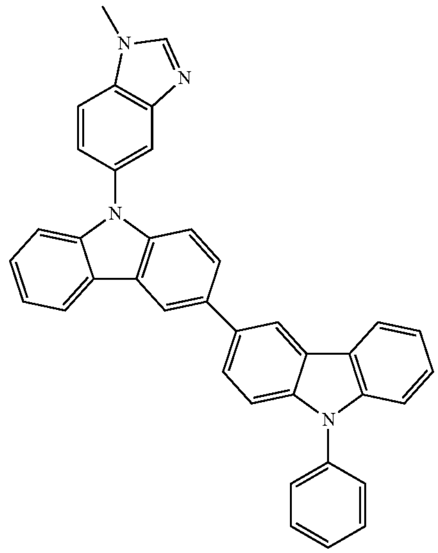
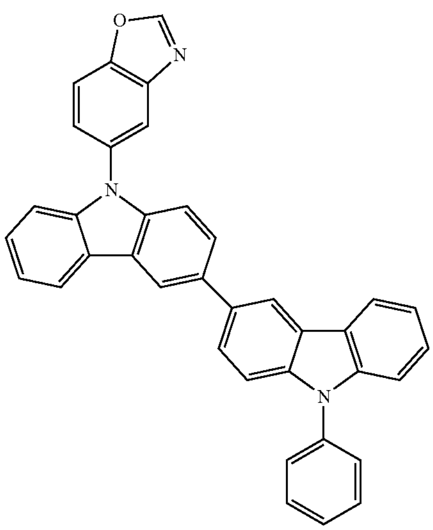
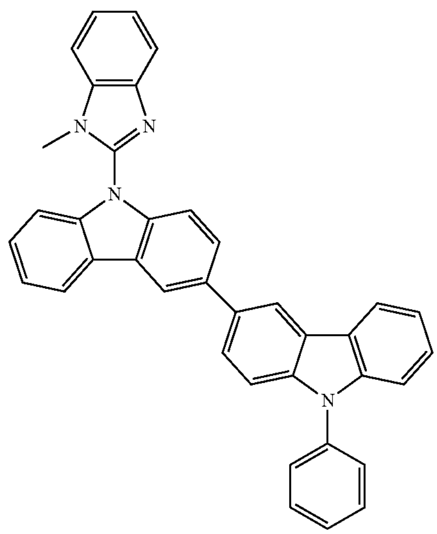
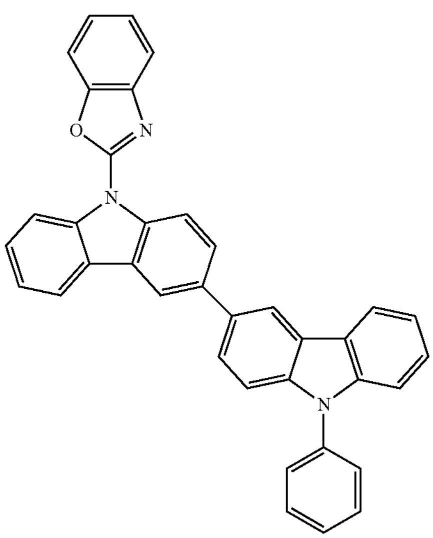
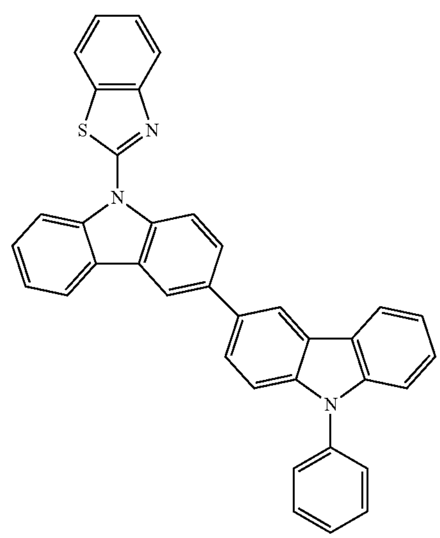

-continued
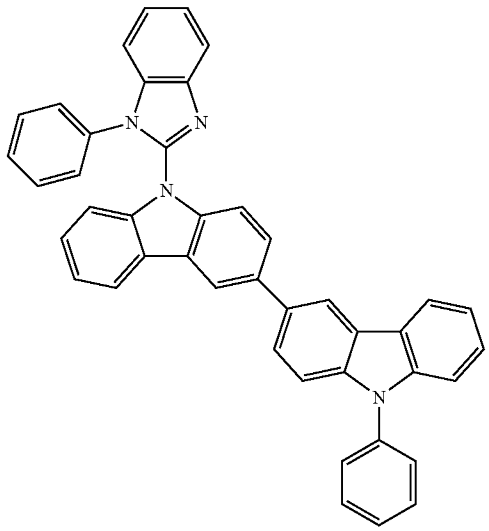
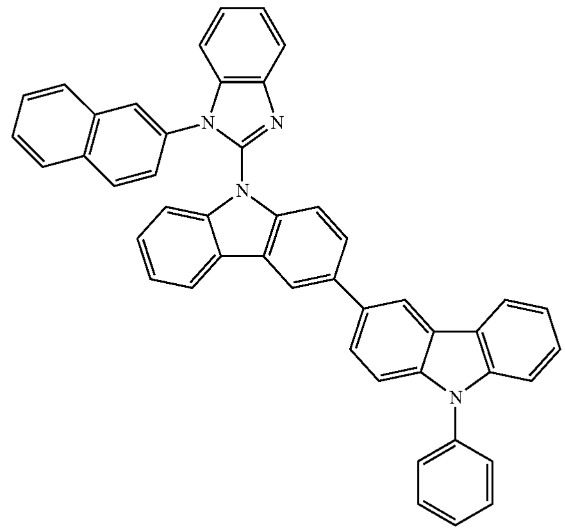
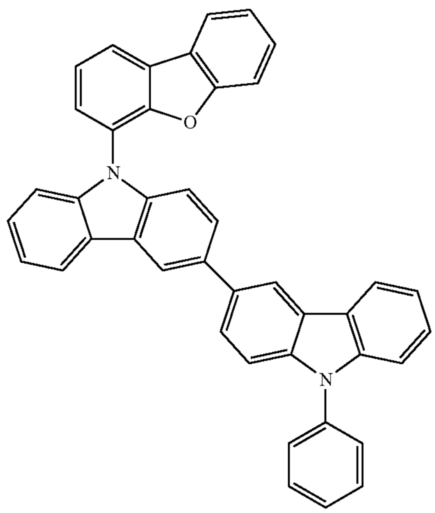
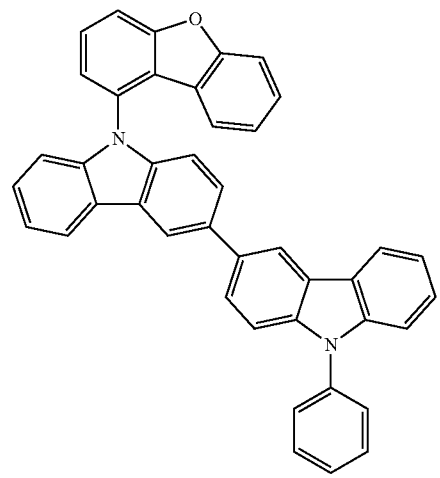
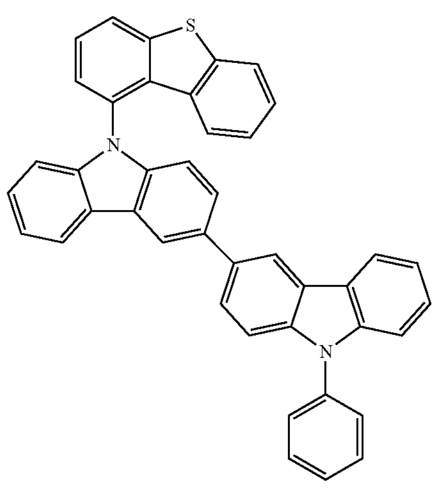
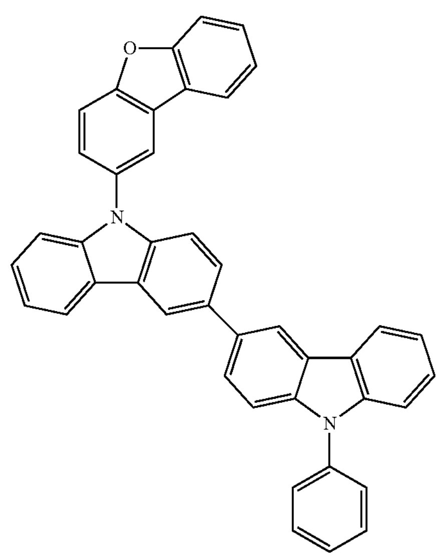

-continued
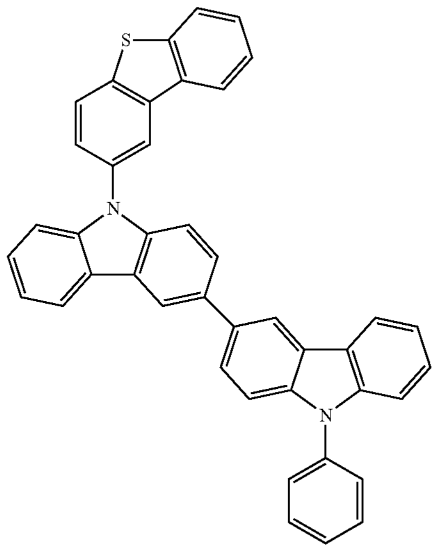
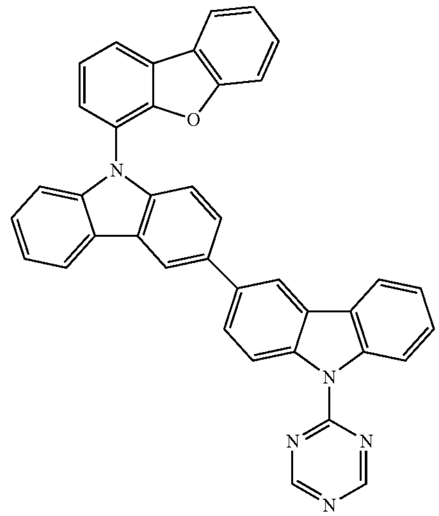
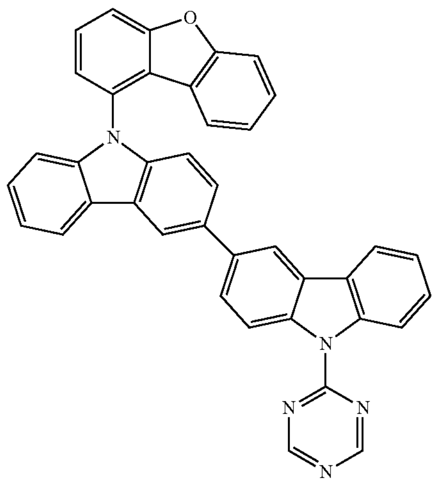
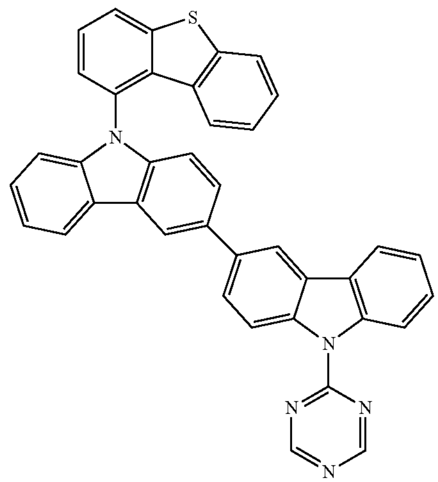
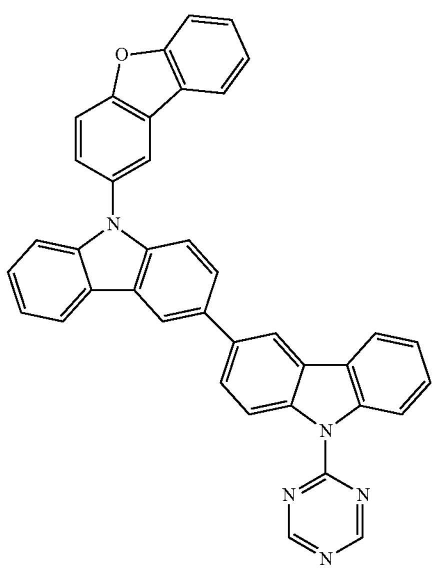
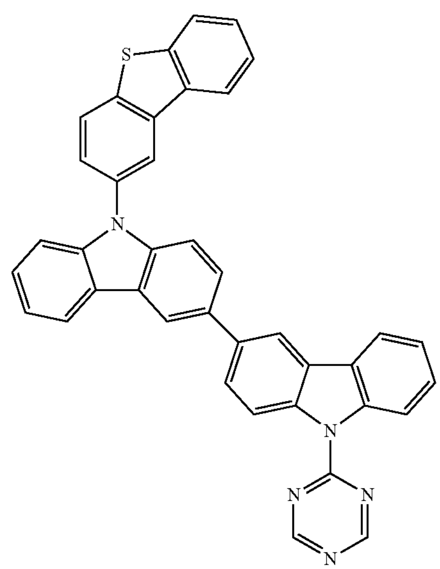

-continued
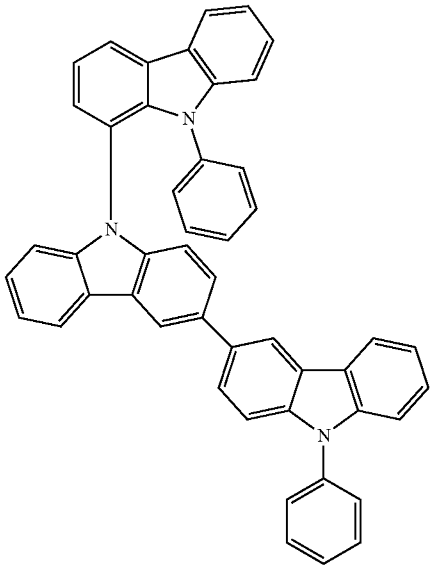
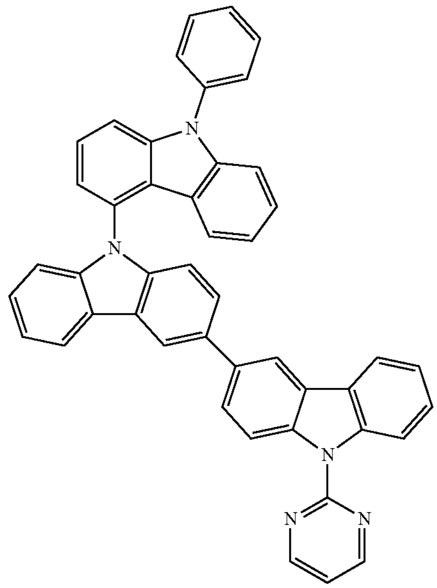
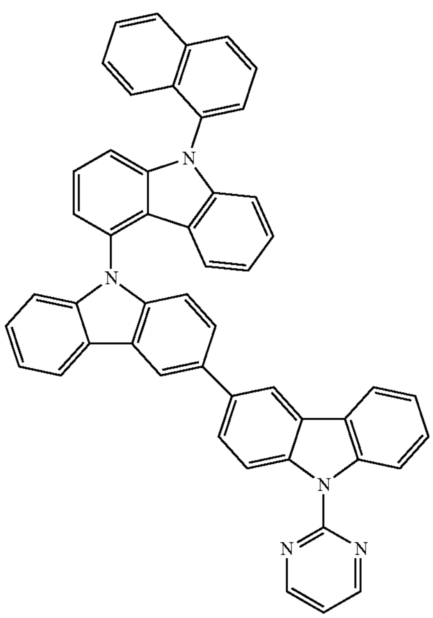
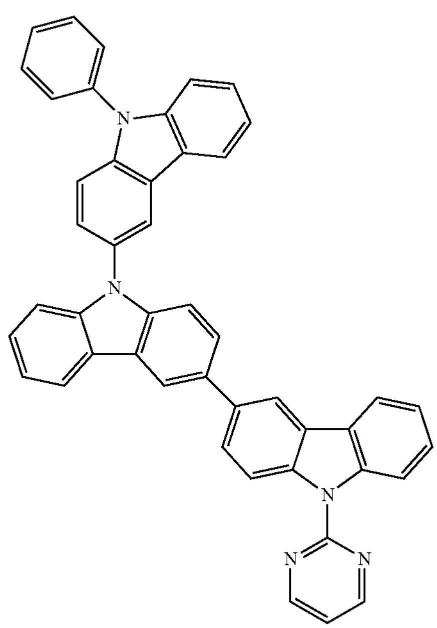

-continued
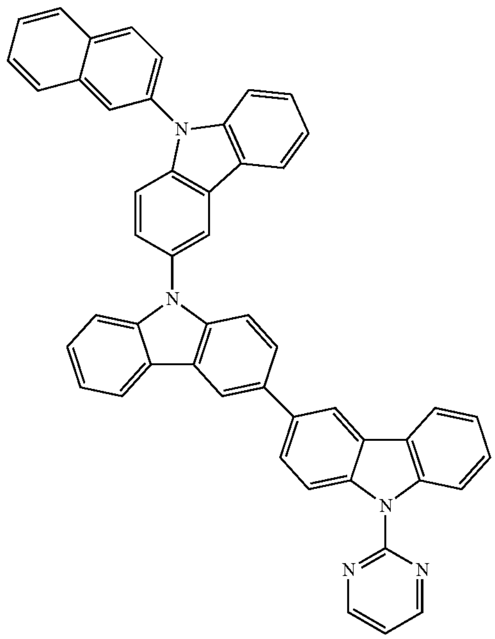
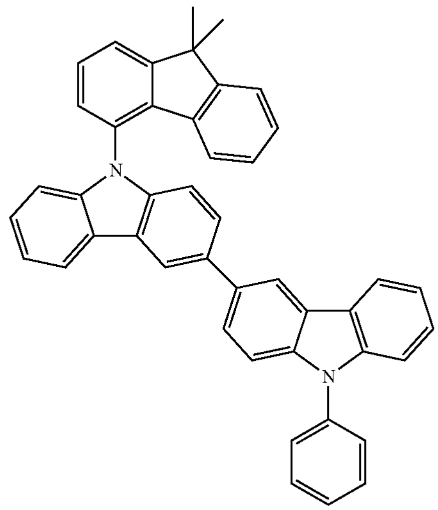
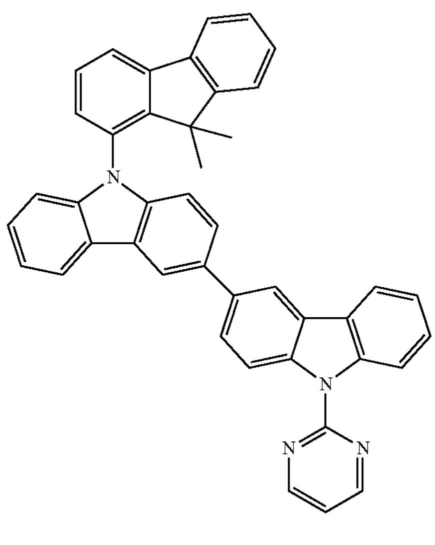
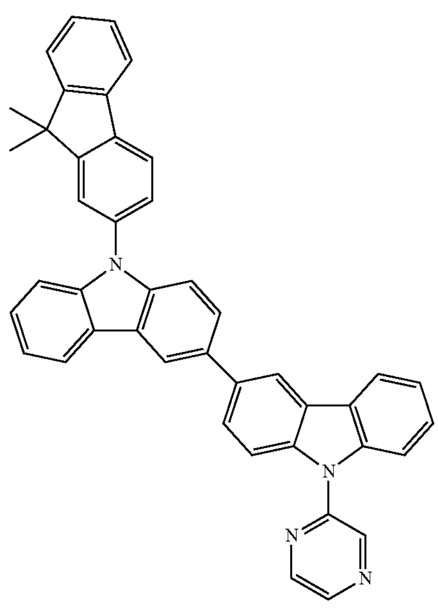

-continued
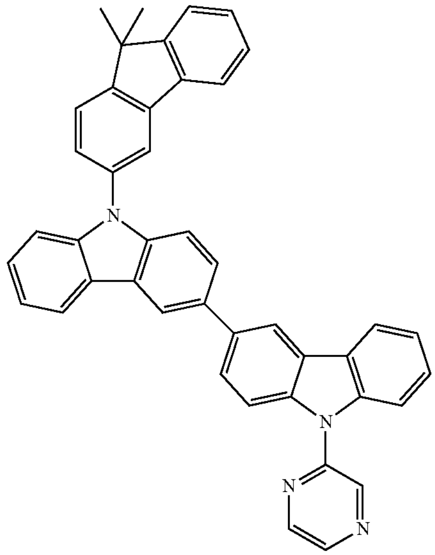
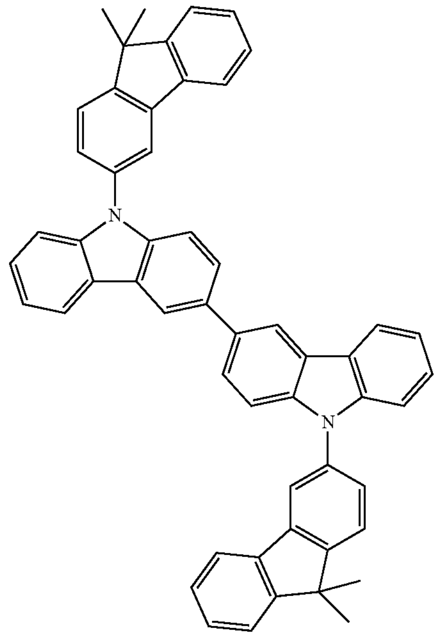
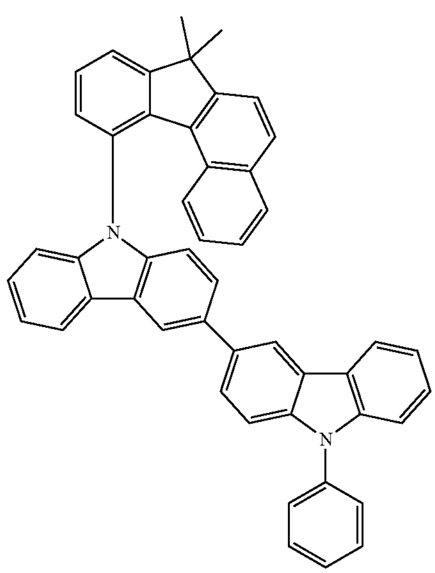
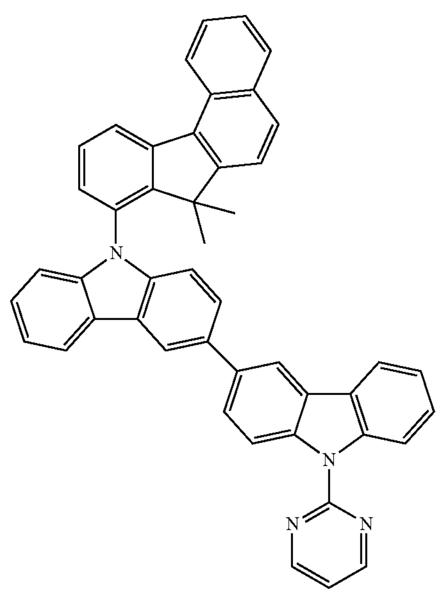

-continued
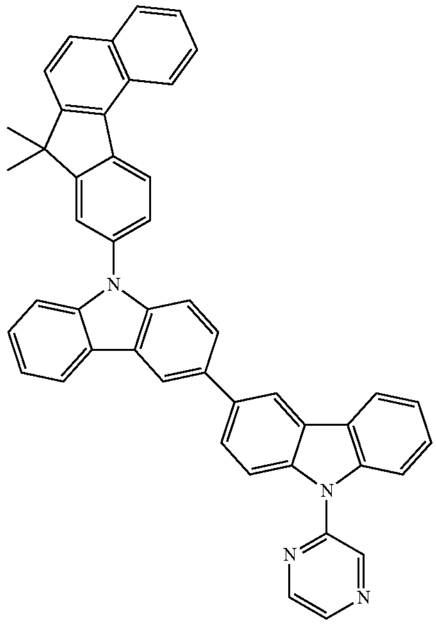
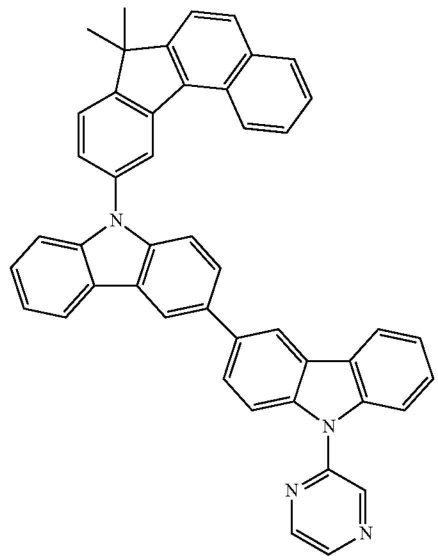
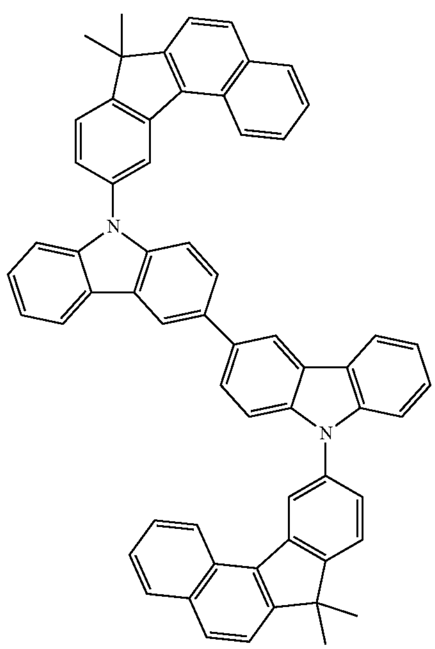
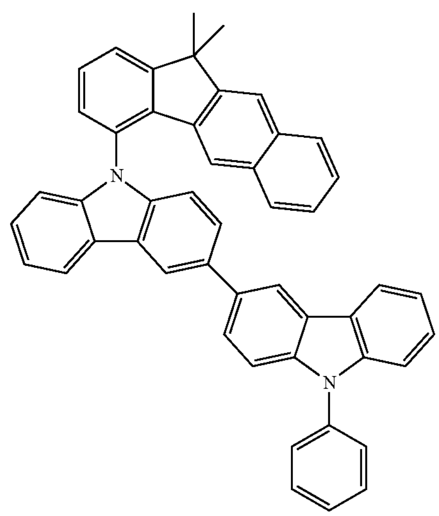

-continued
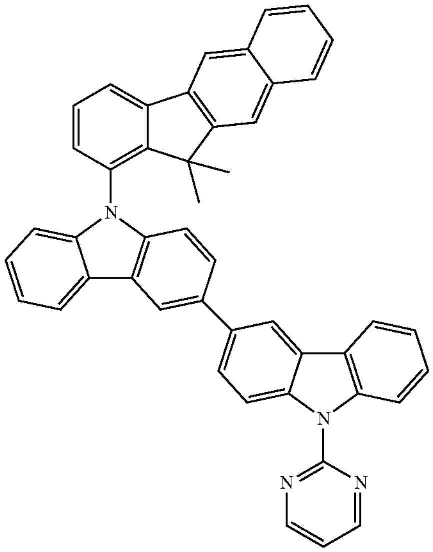
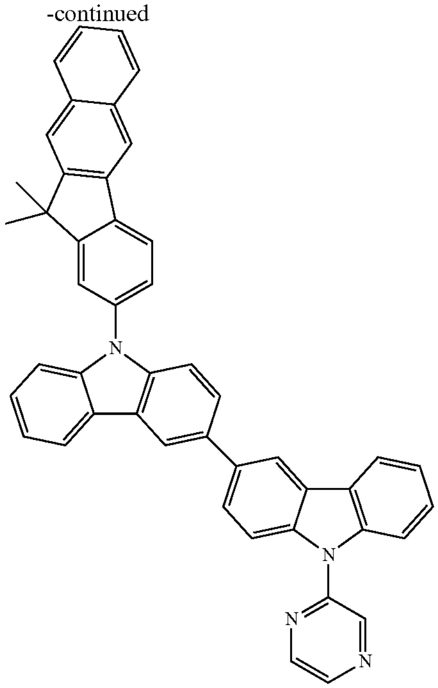
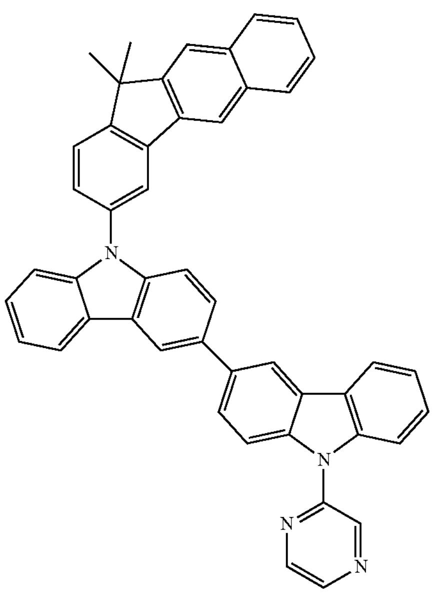
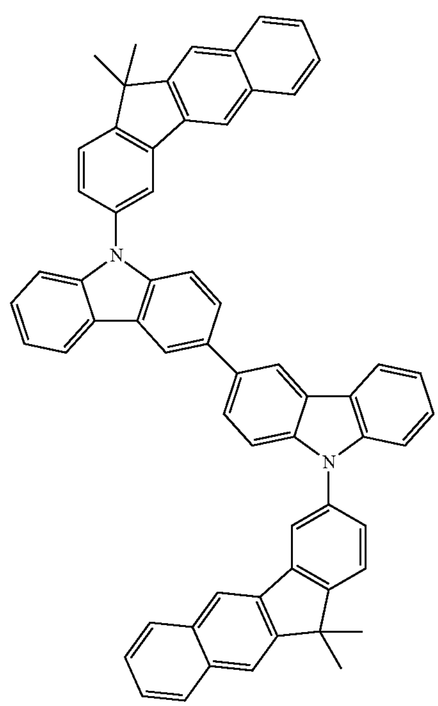

-continued
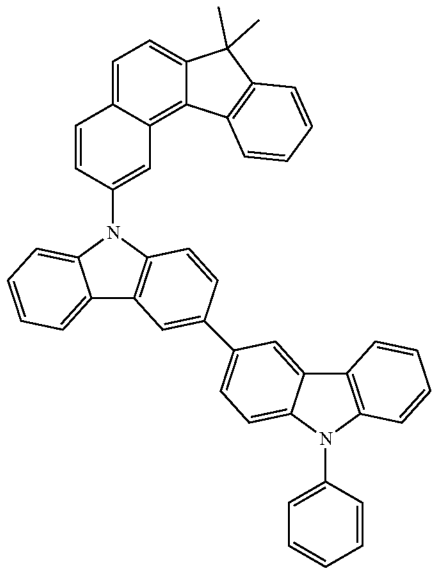
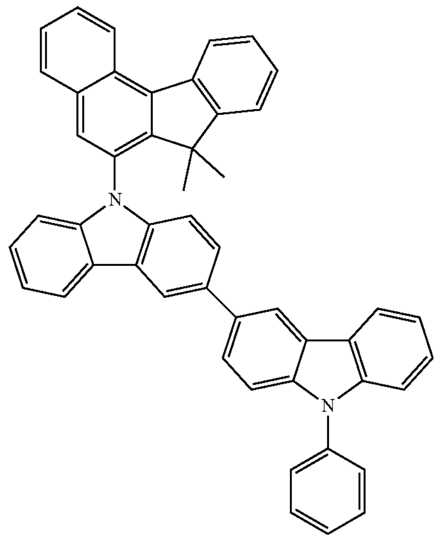
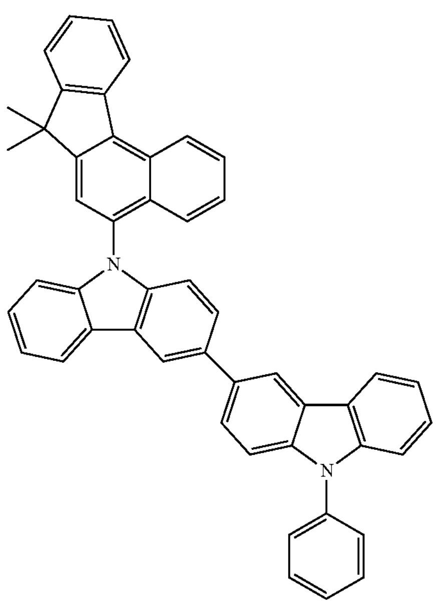
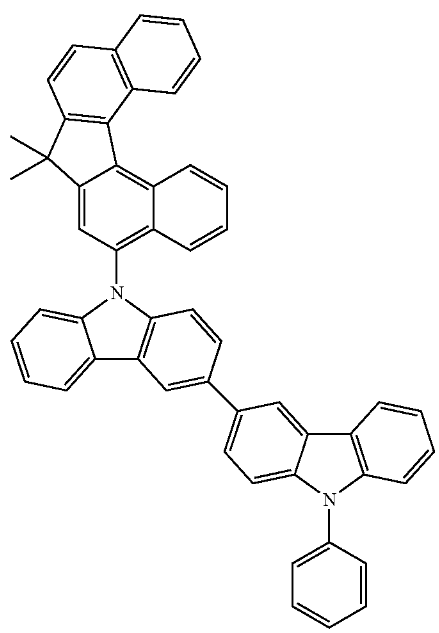

-continued
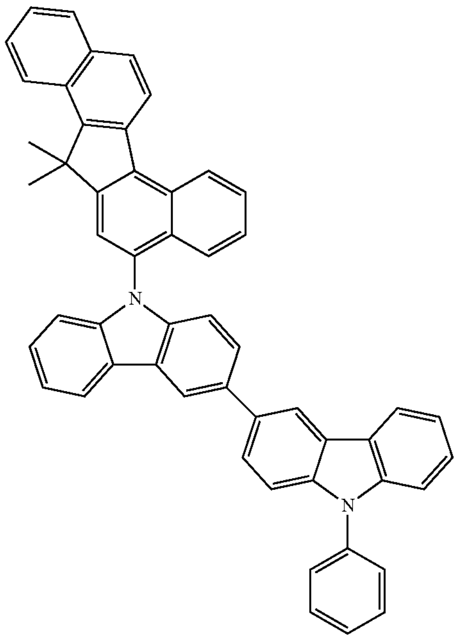
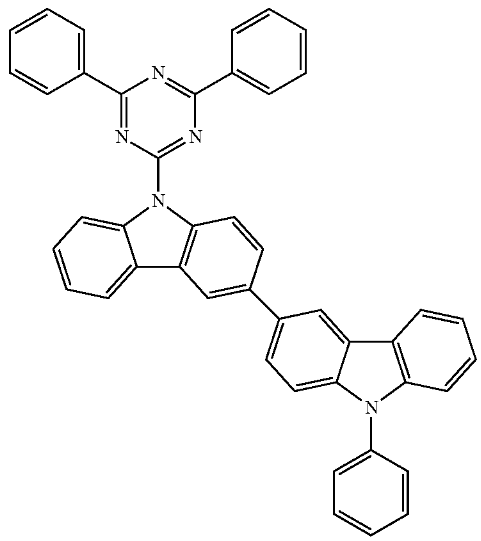
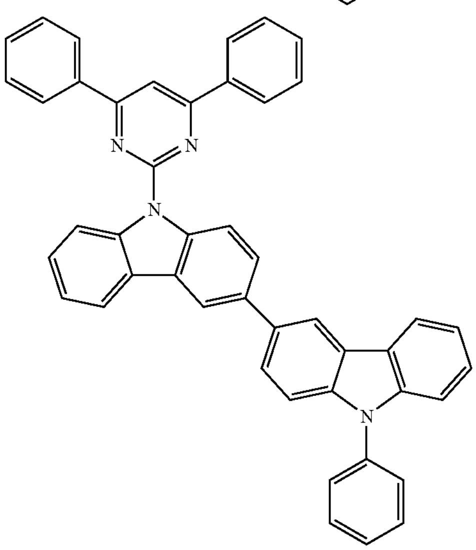
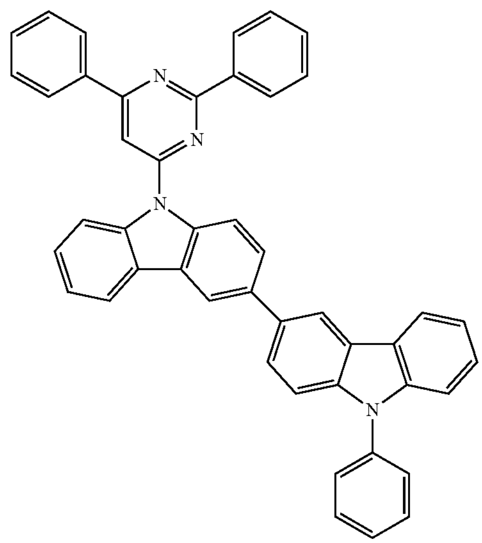
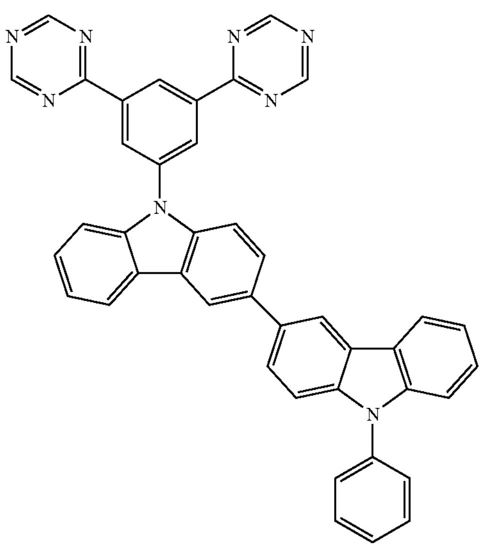
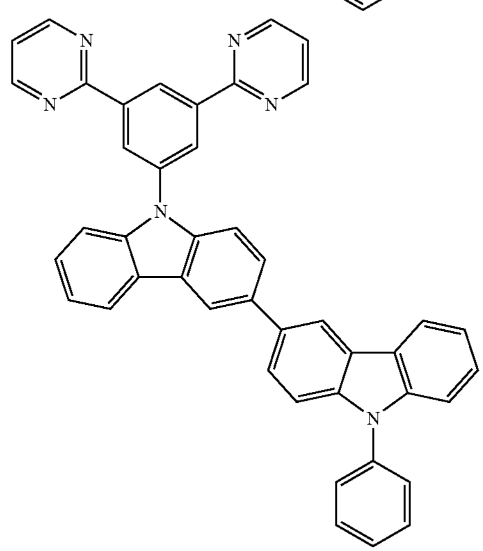

-continued
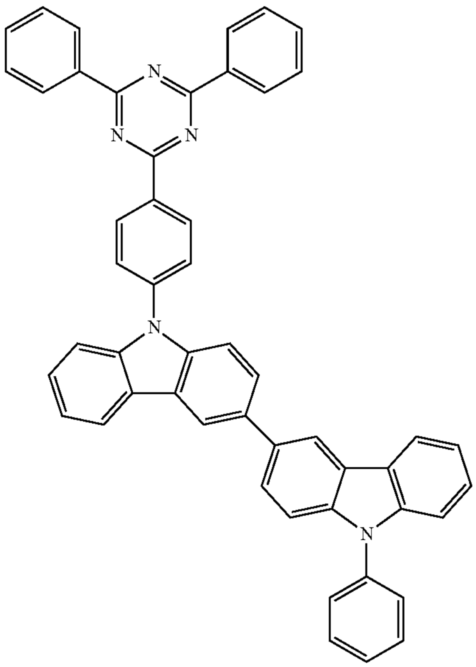
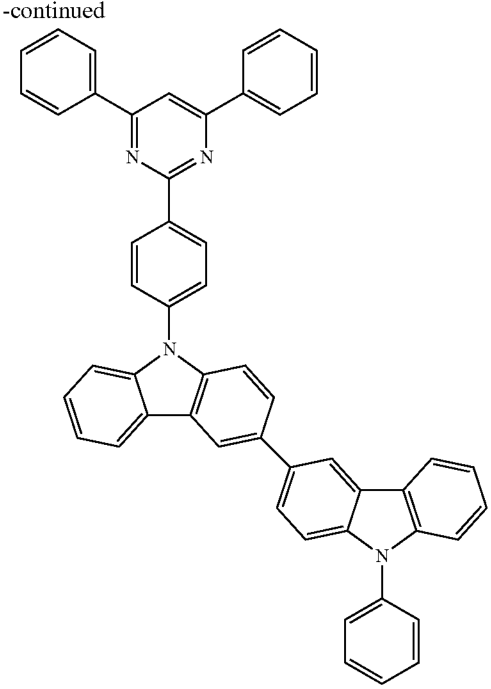
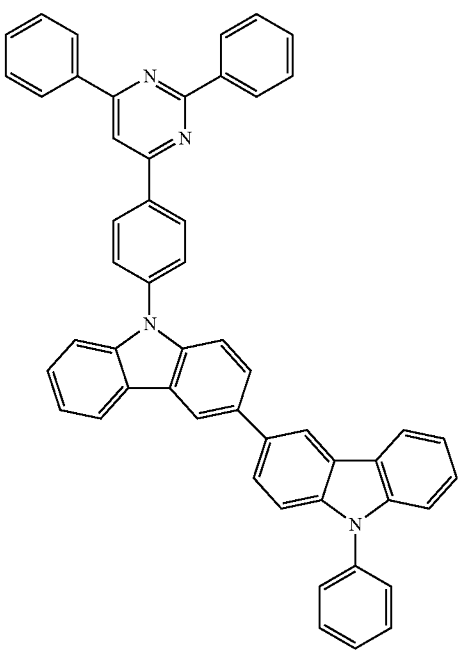
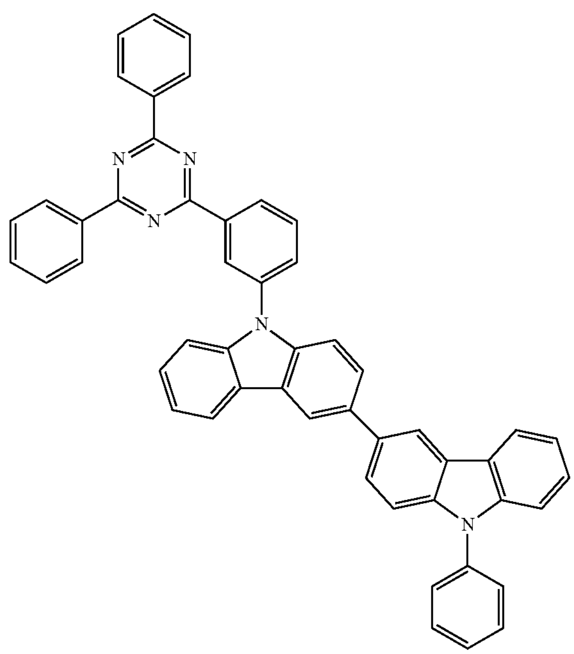

-continued
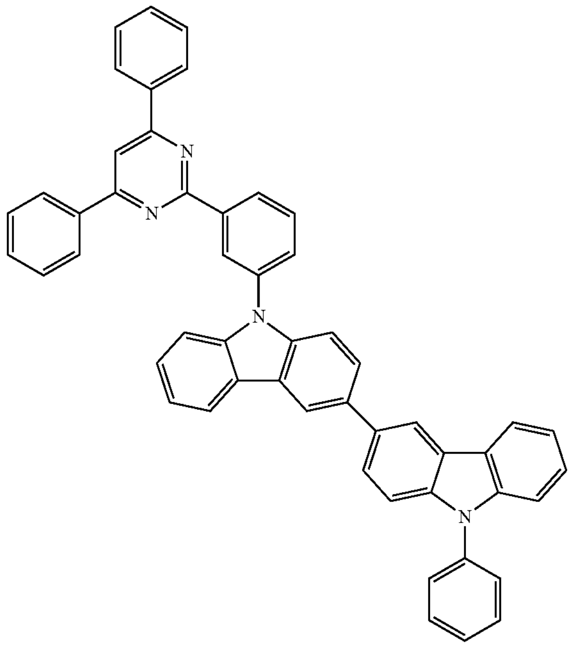
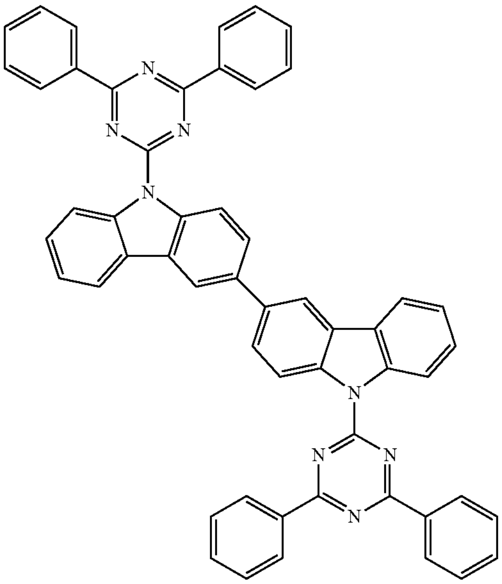
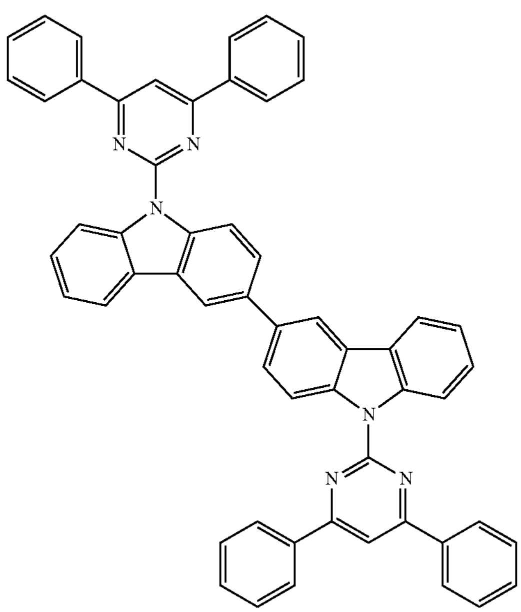
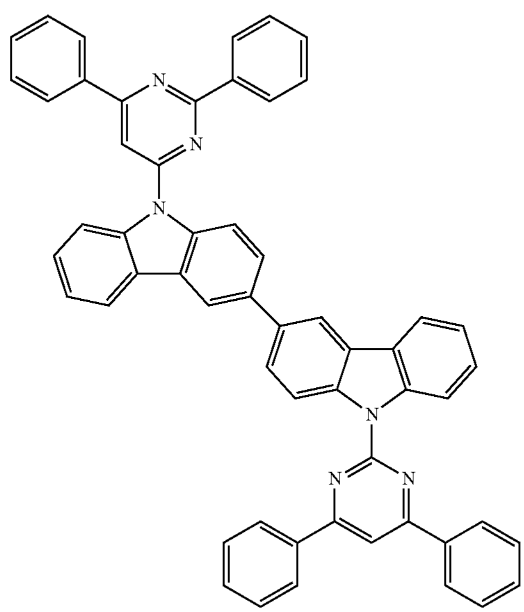

-continued
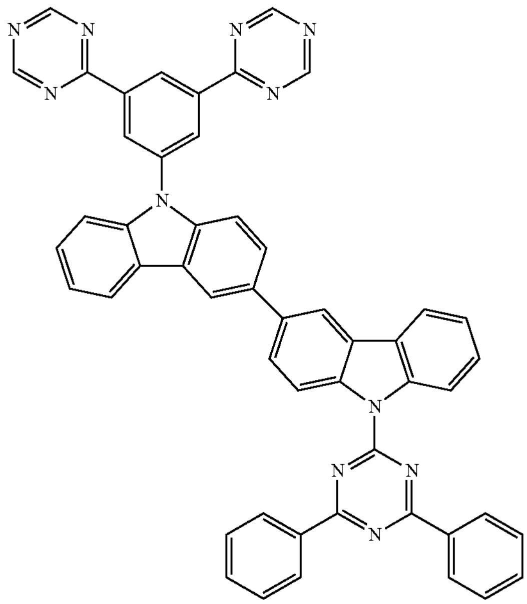
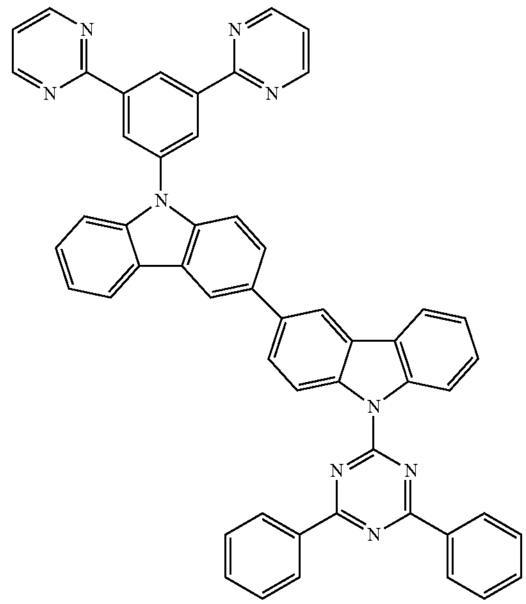
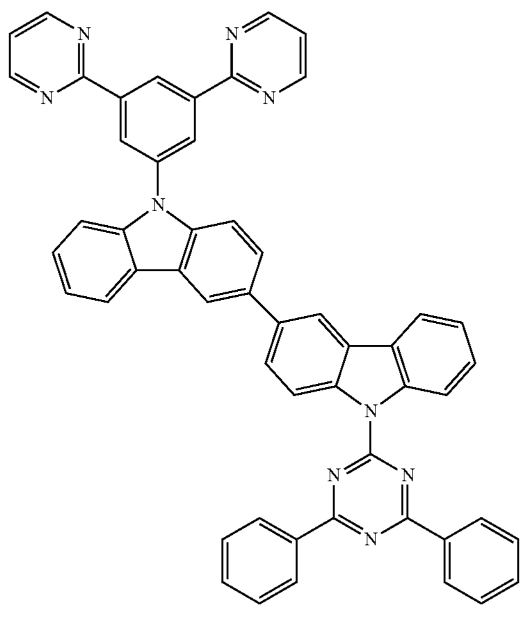
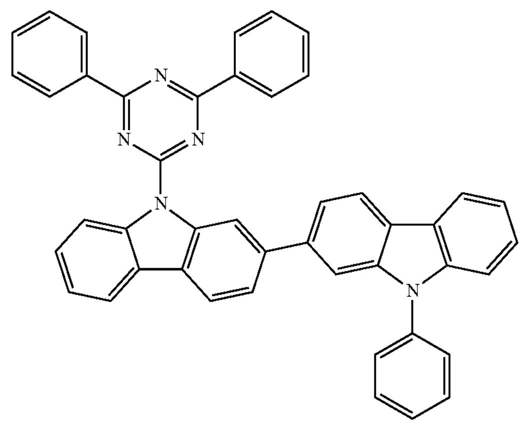
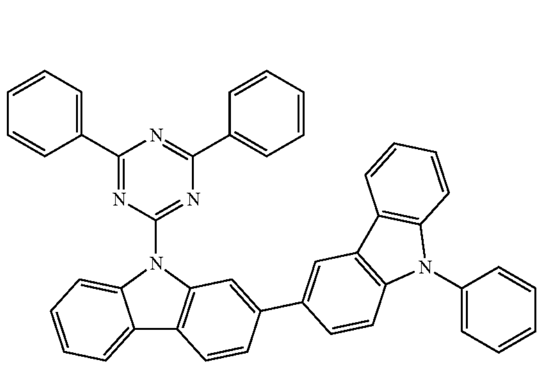
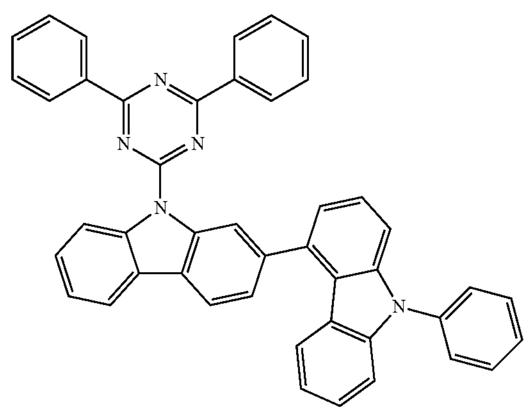

-continued
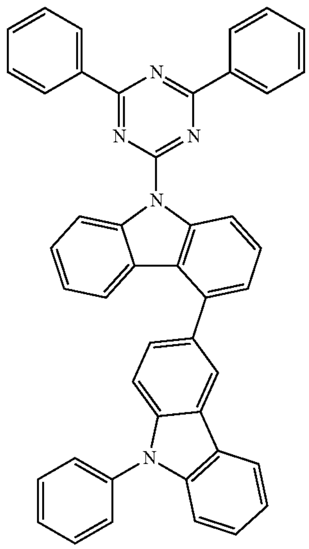
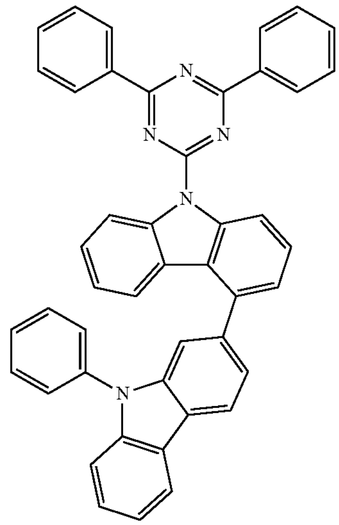
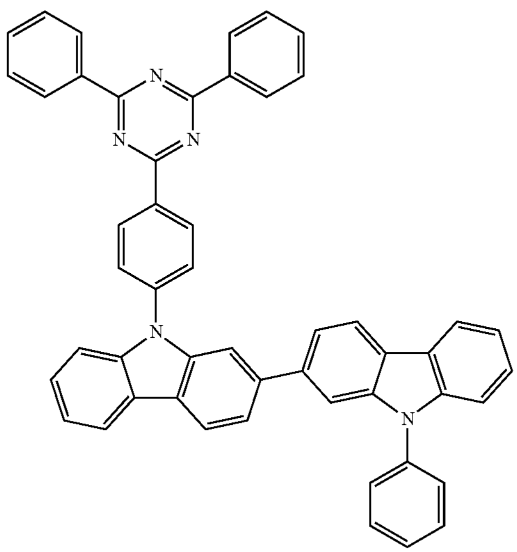
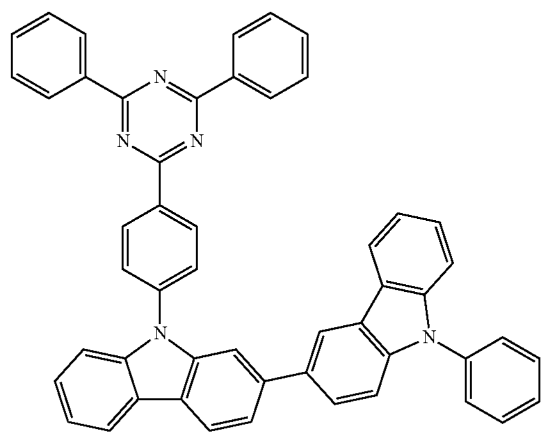
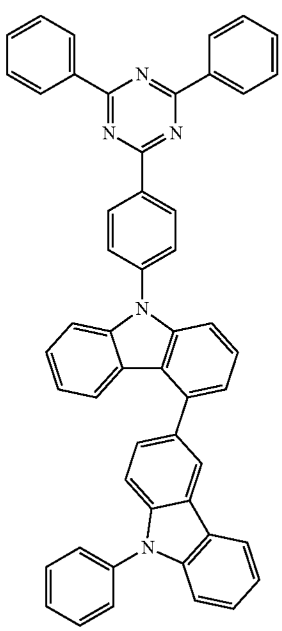
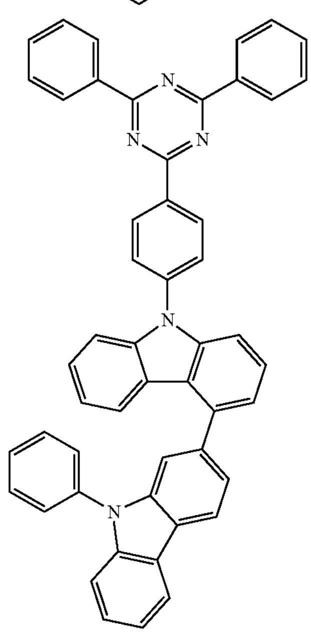
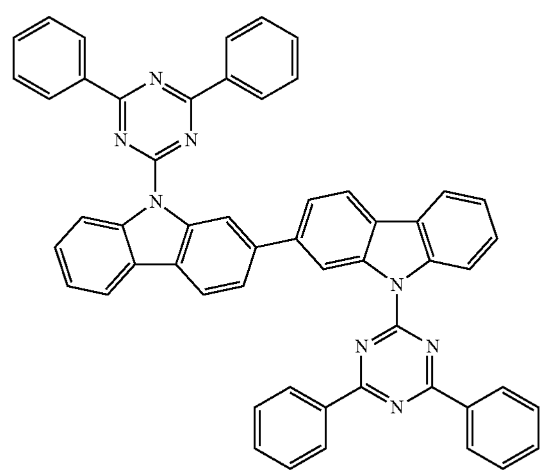

-continued
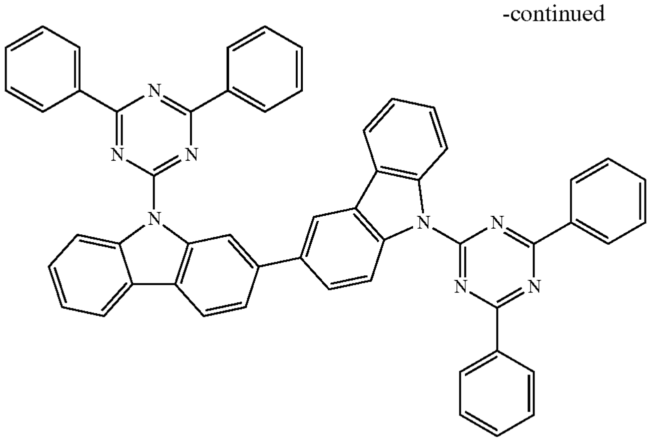
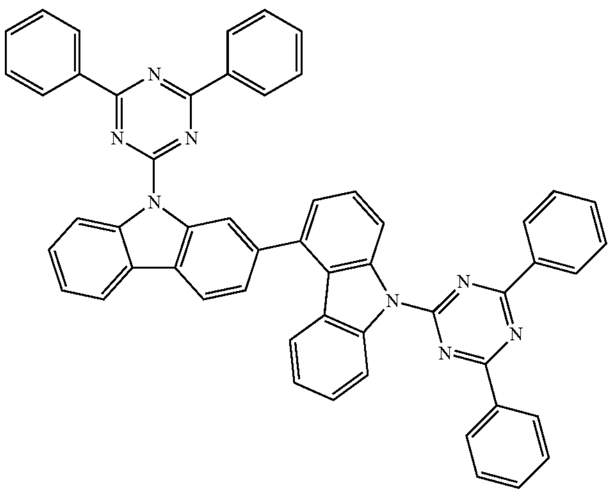
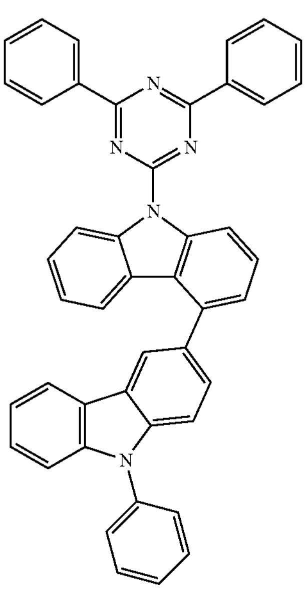
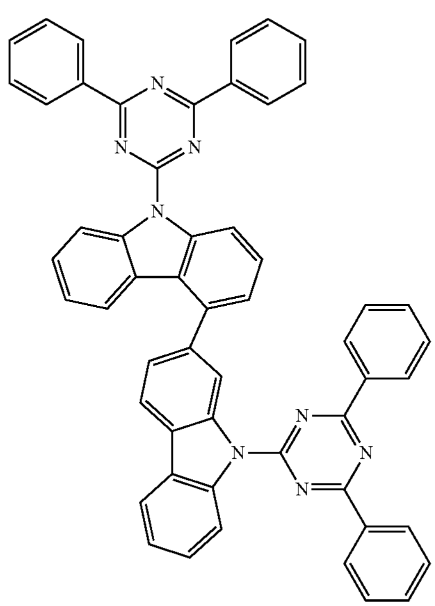

-continued
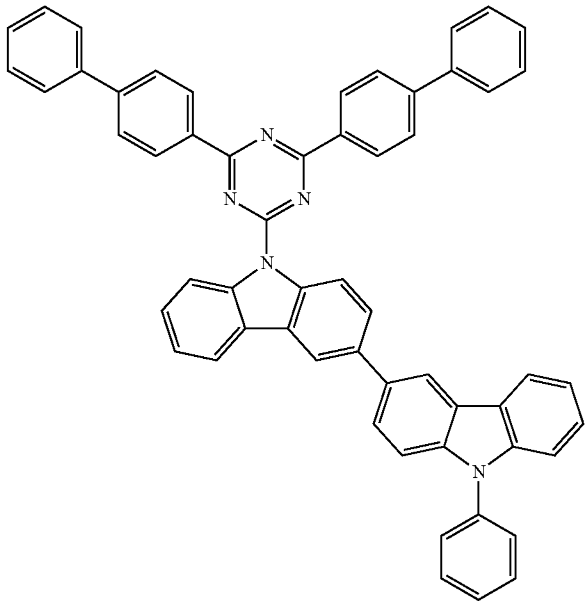
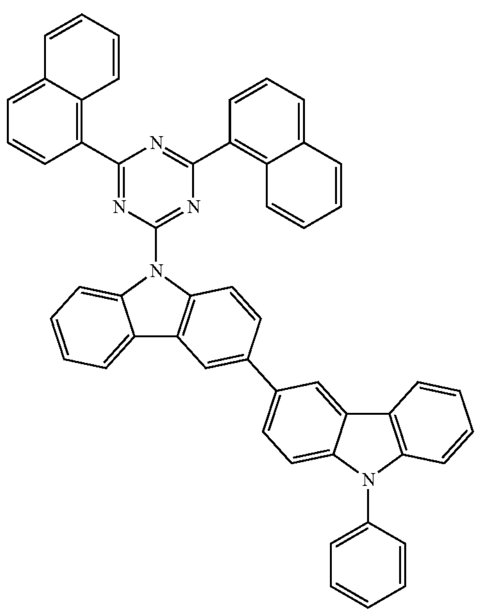
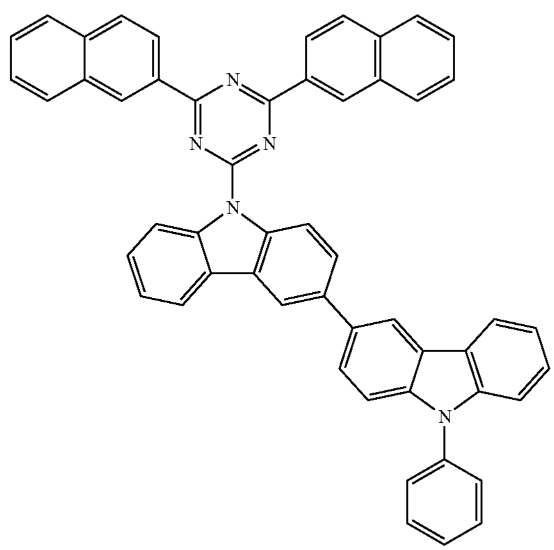

-continued
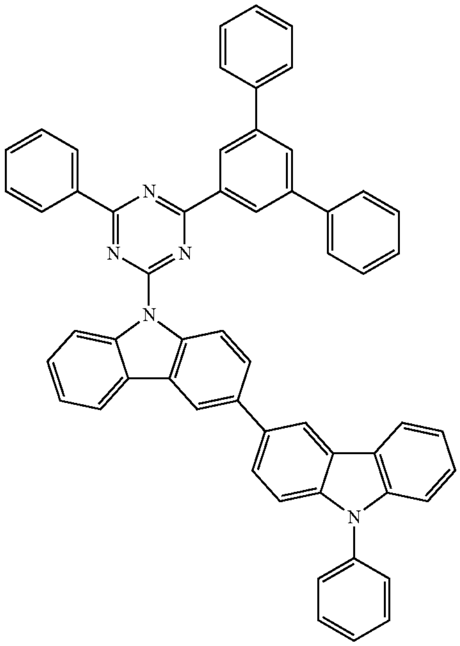
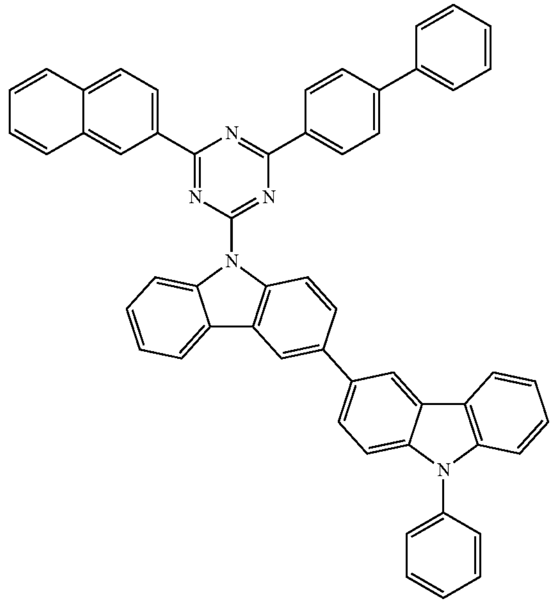
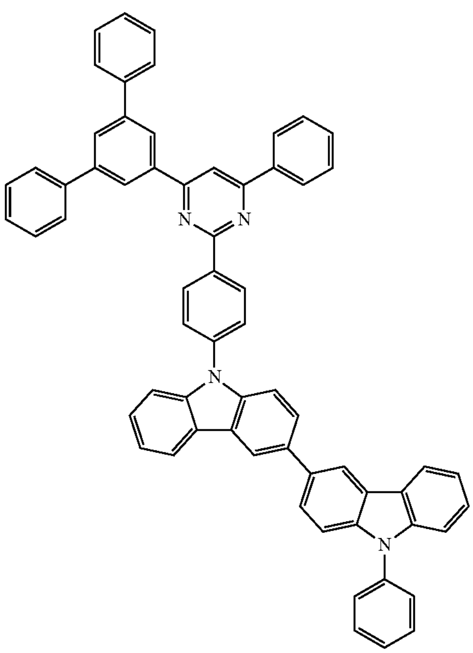
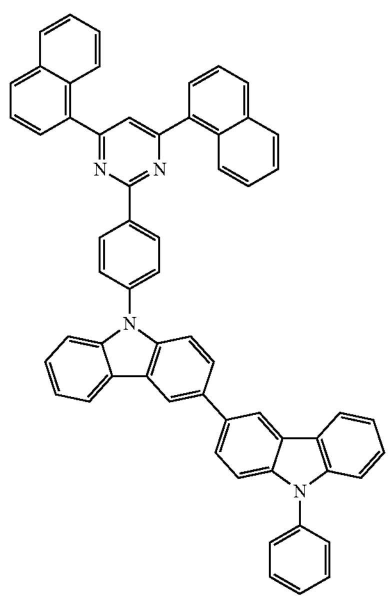

-continued
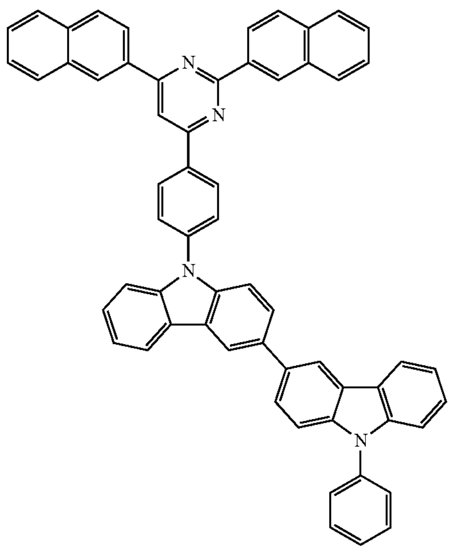
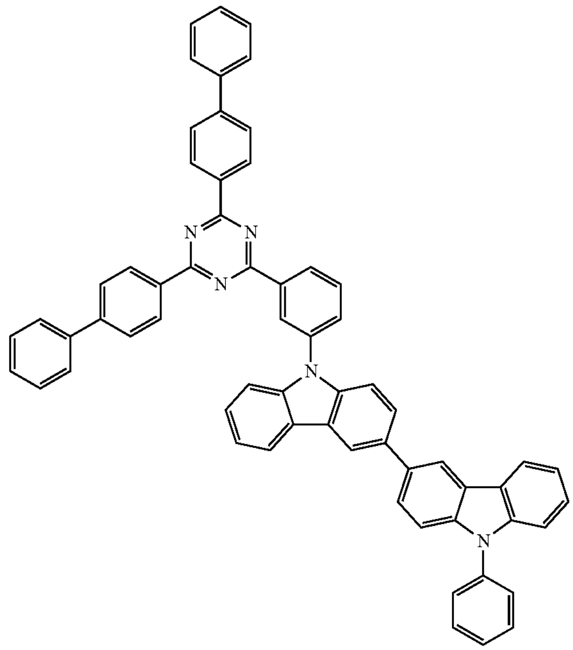
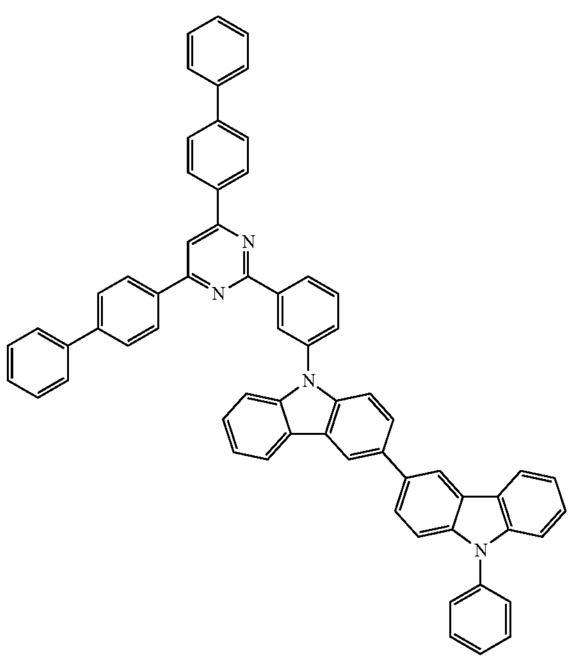
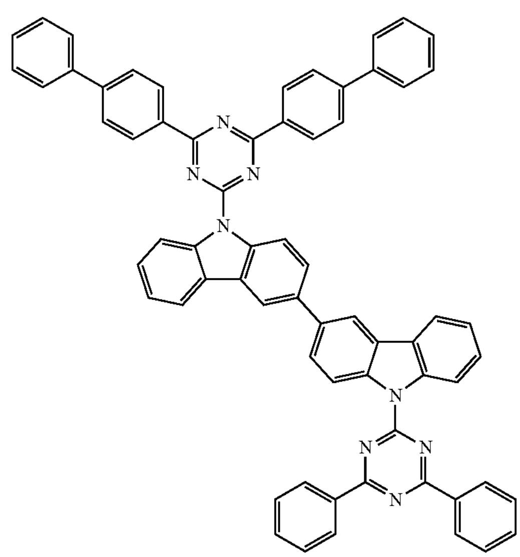

-continued
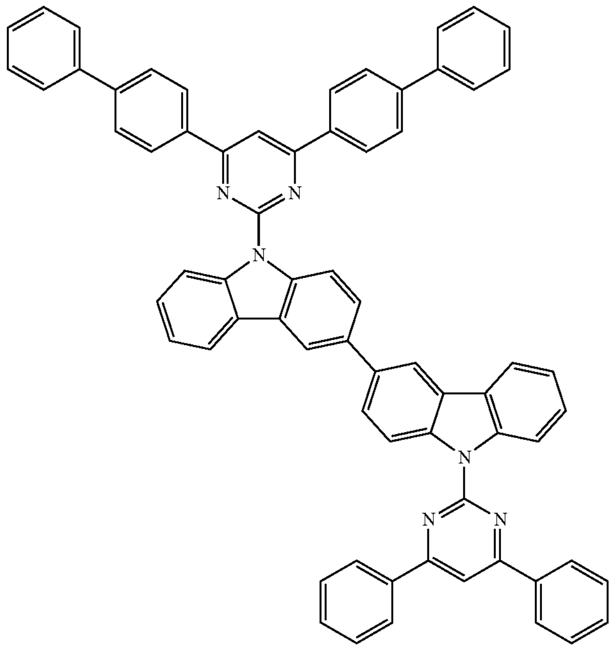
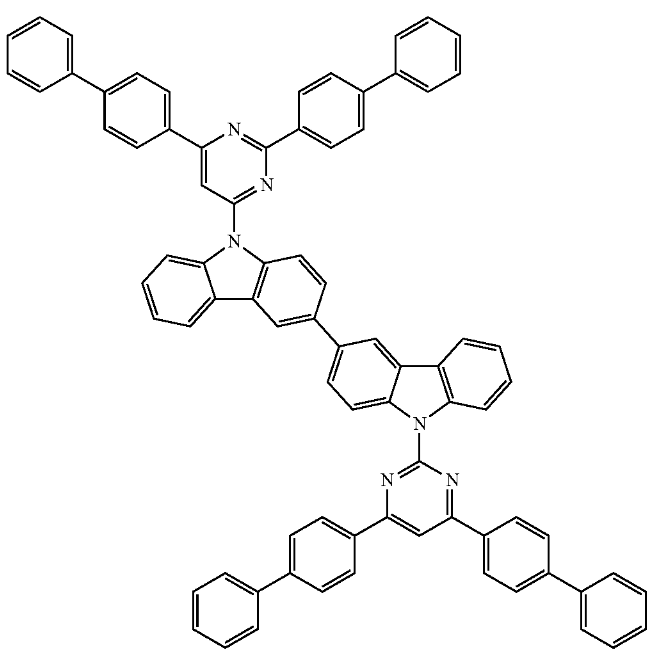

-continued
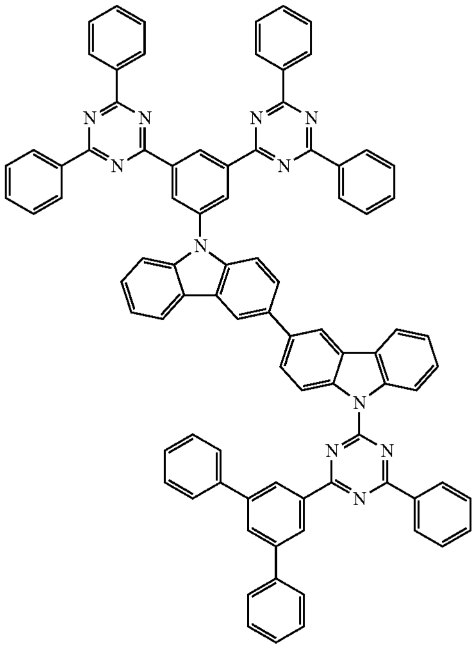
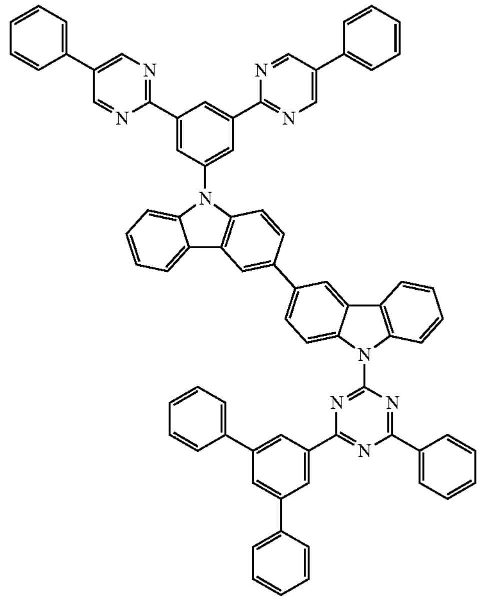
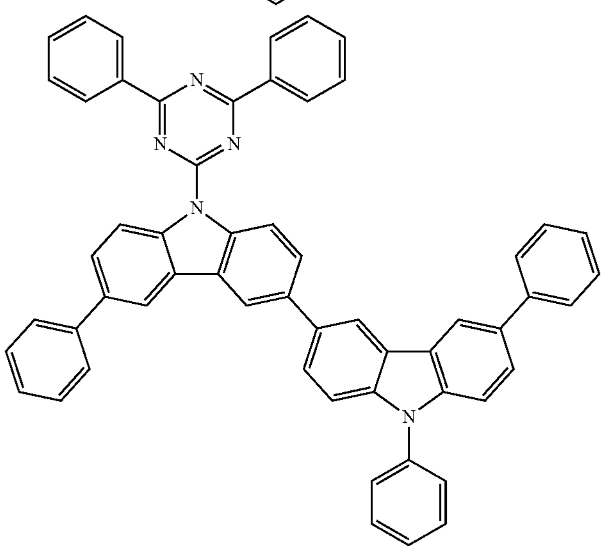
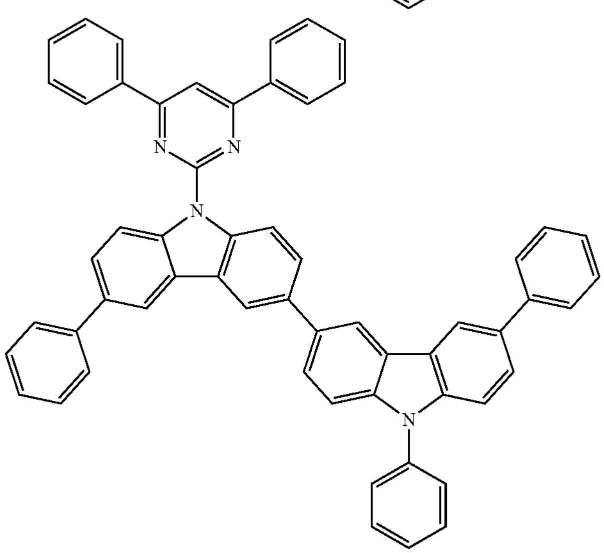

-continued
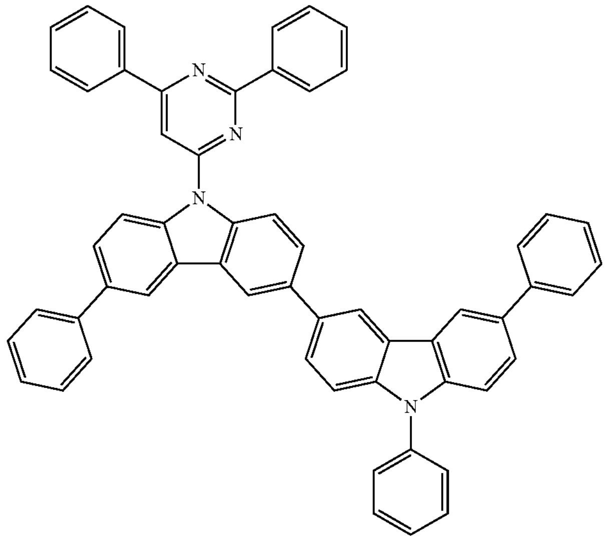
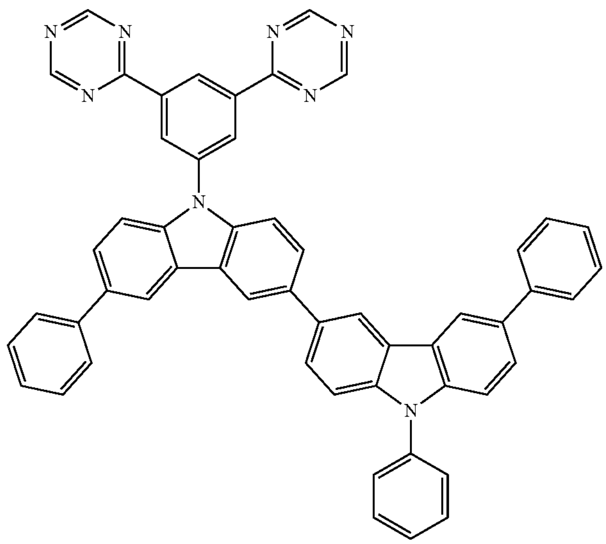
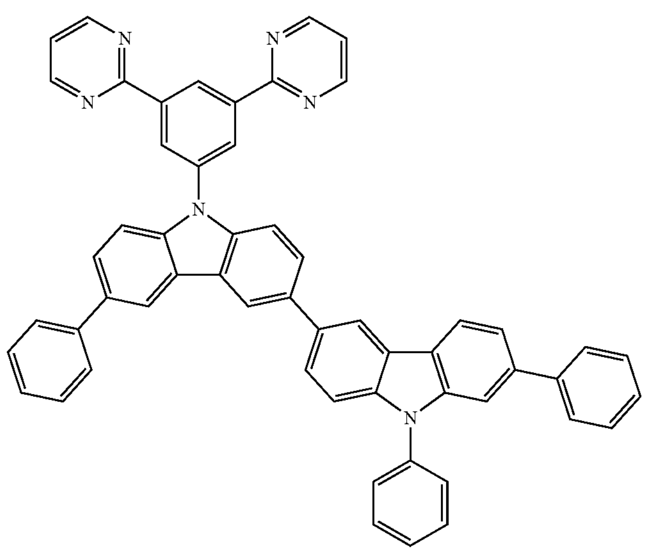

-continued
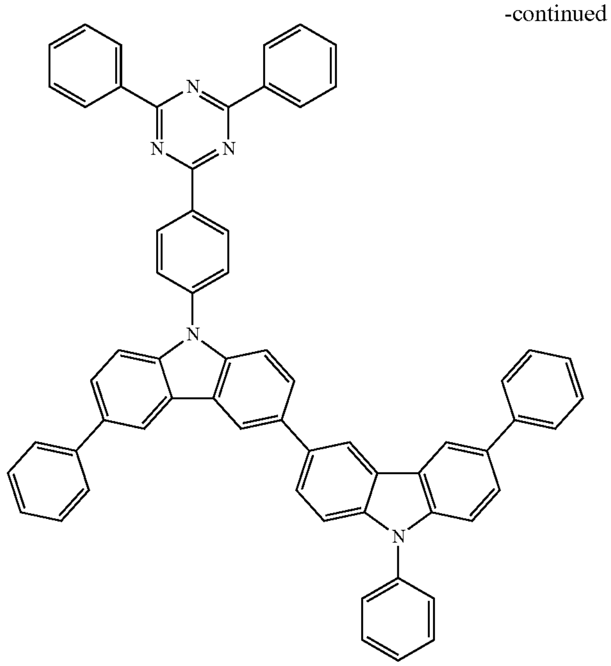
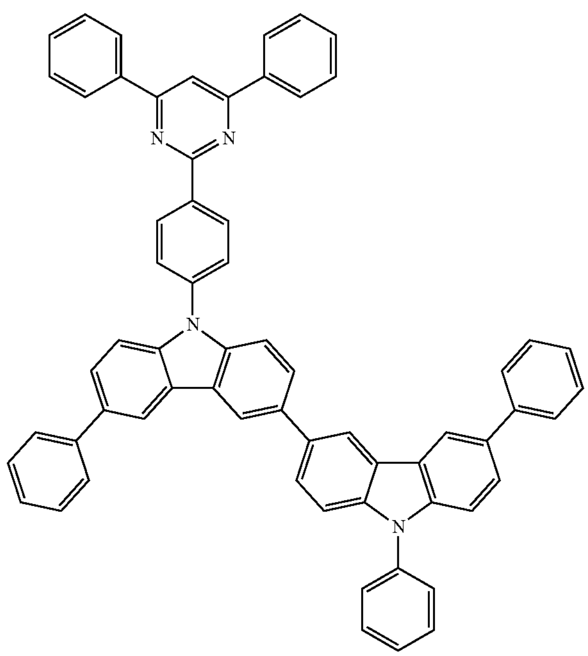

-continued
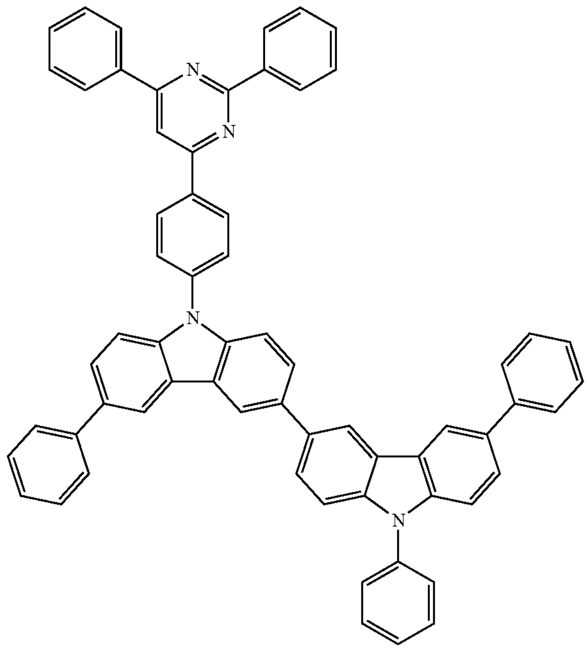
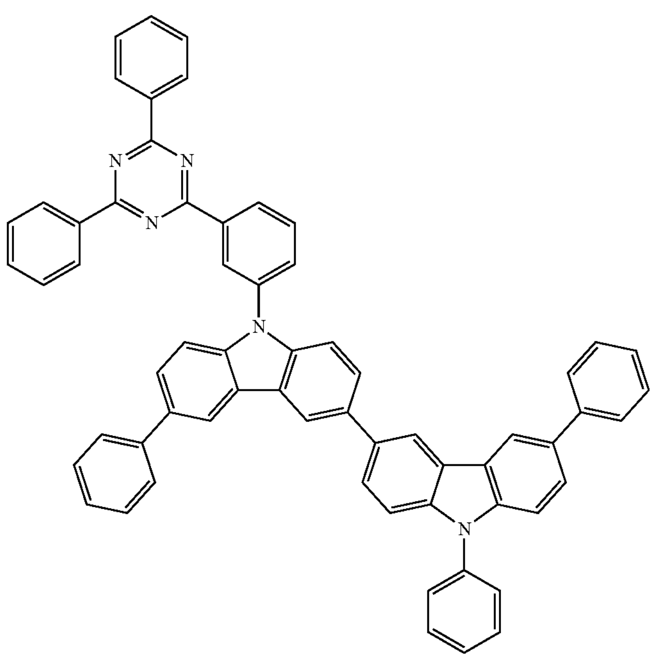

-continued
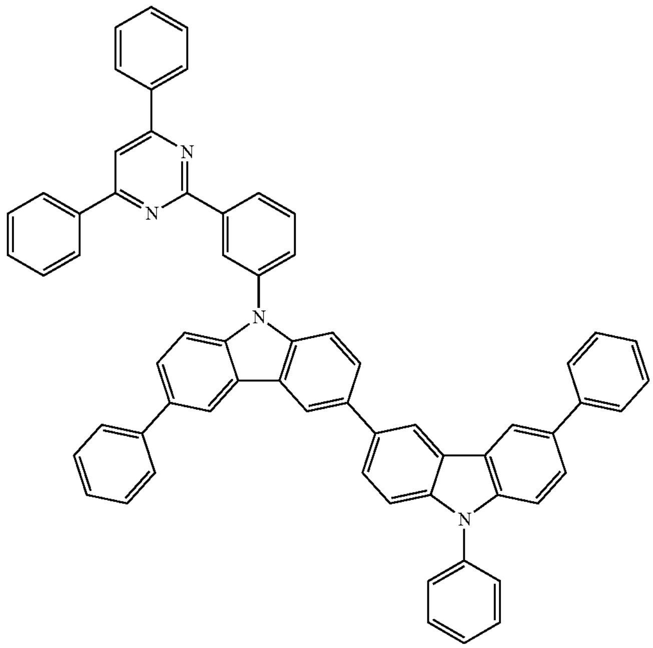
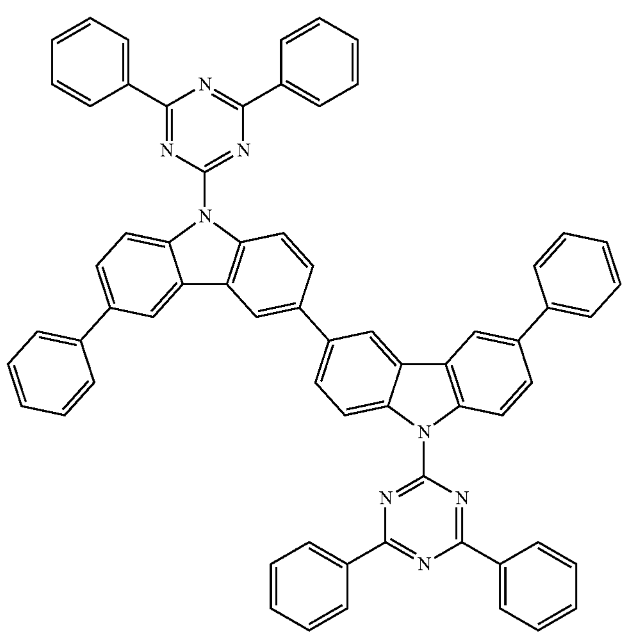

-continued
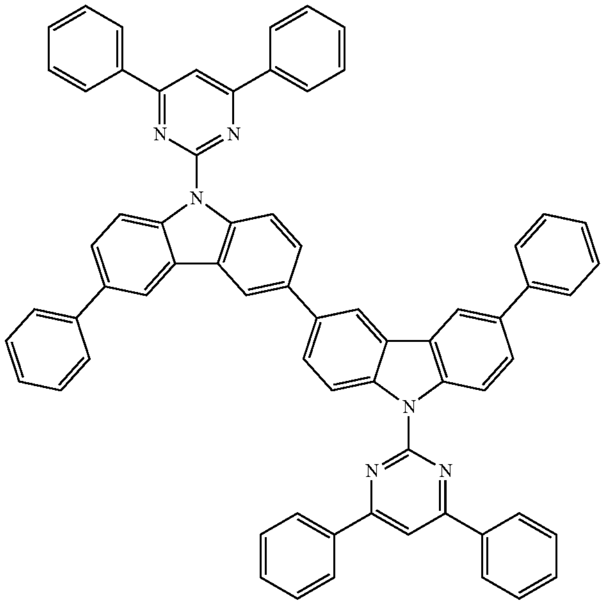
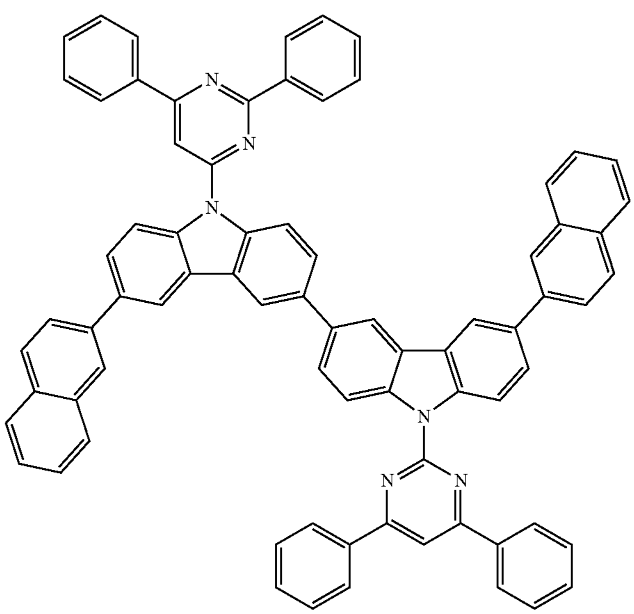

-continued
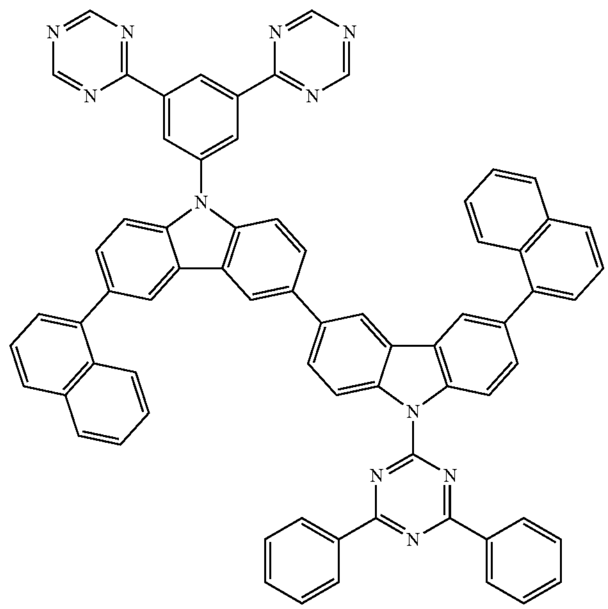
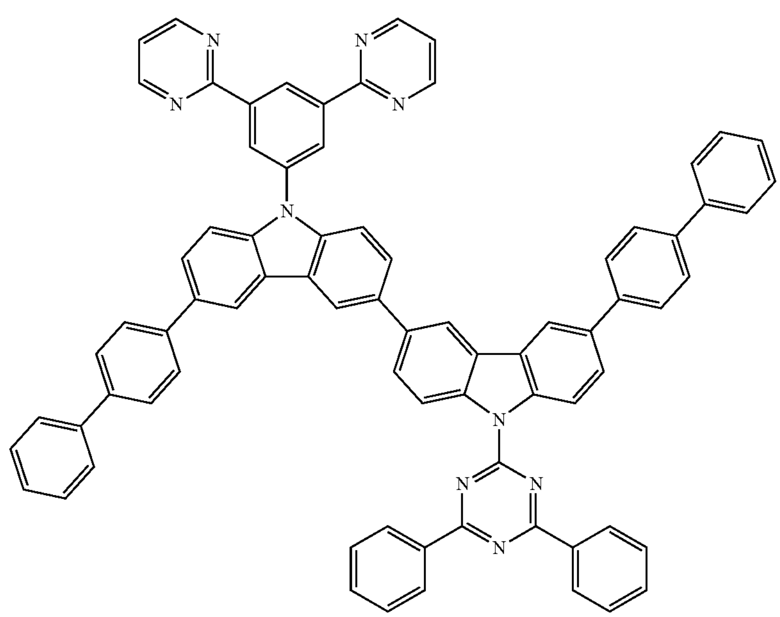

-continued
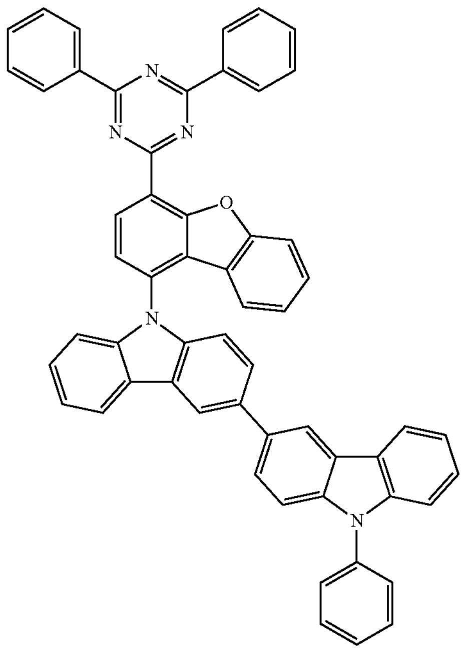
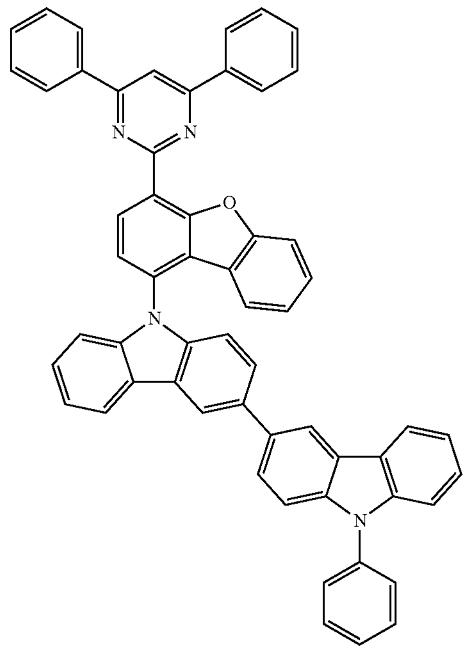
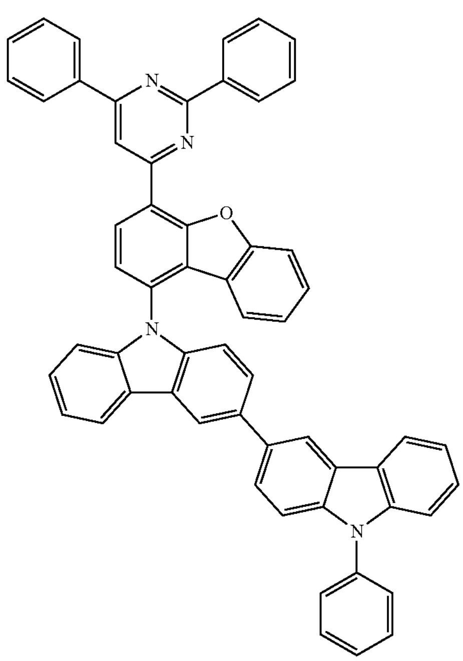
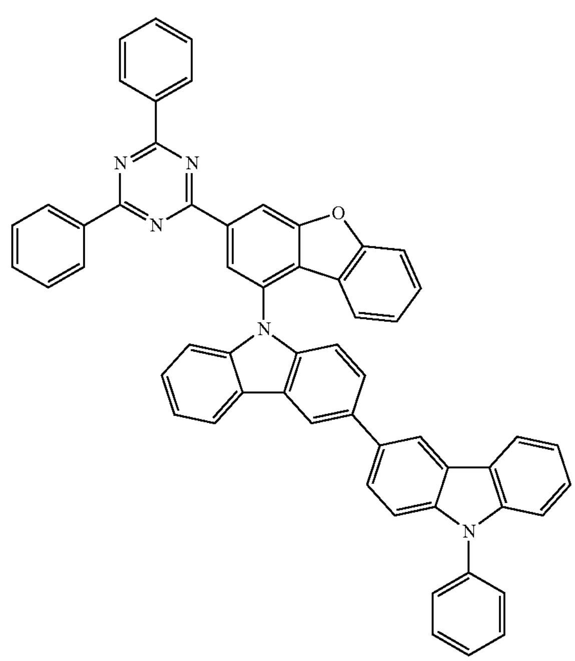

-continued
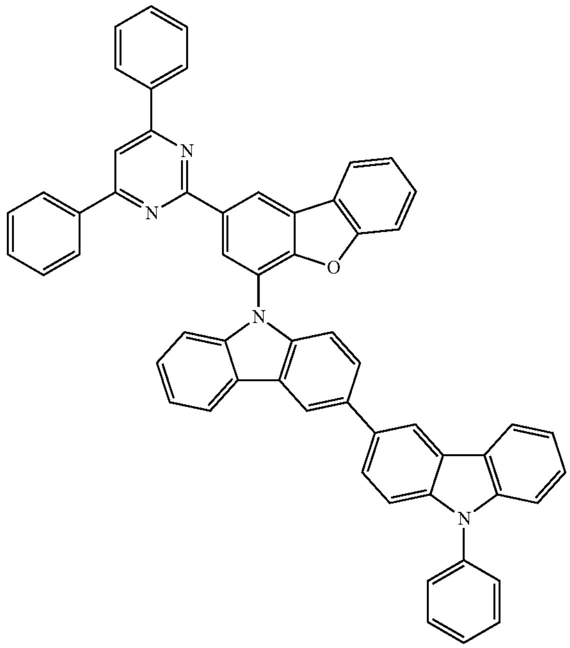
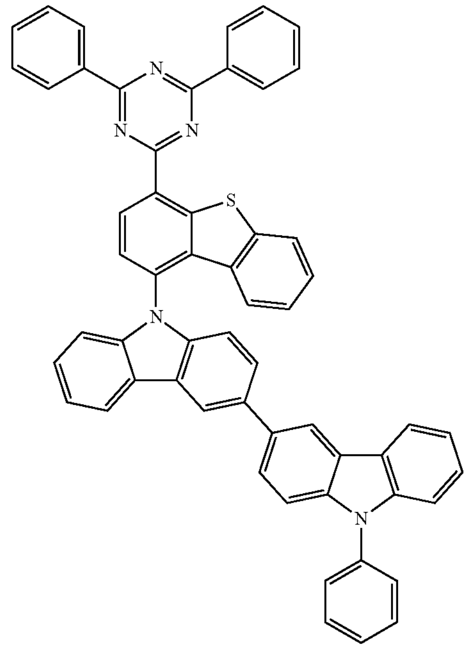
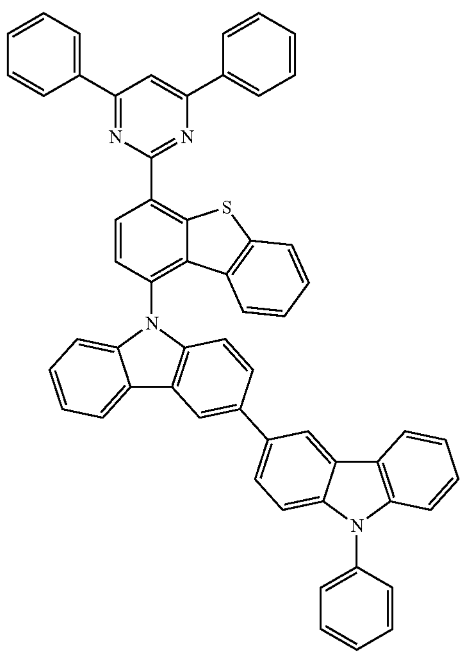
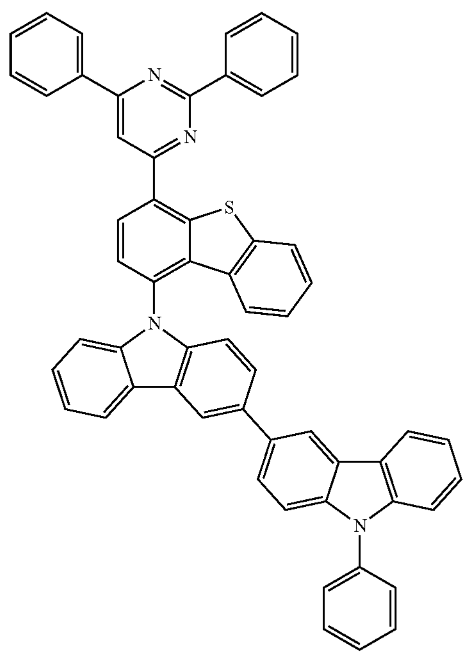

-continued
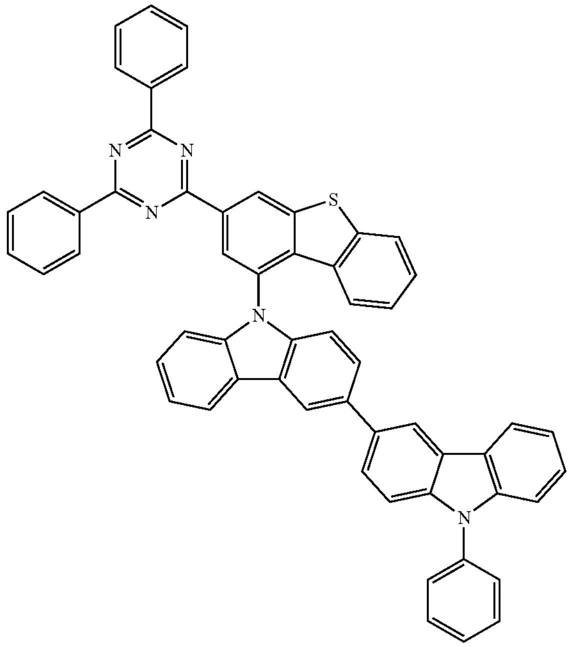
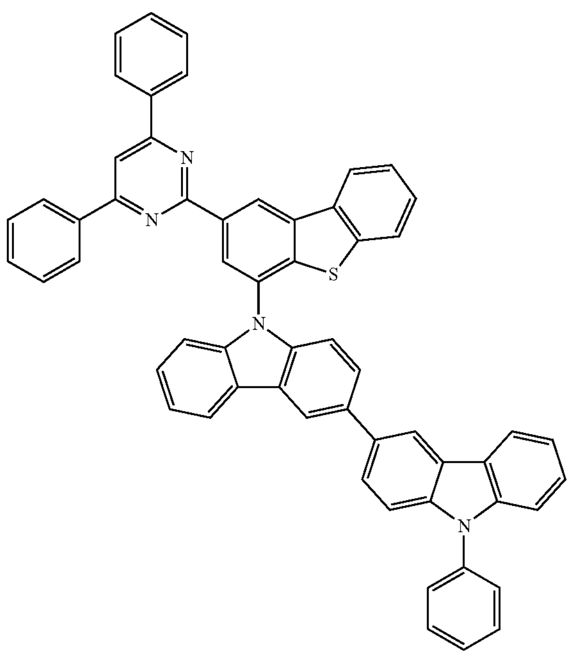

-continued
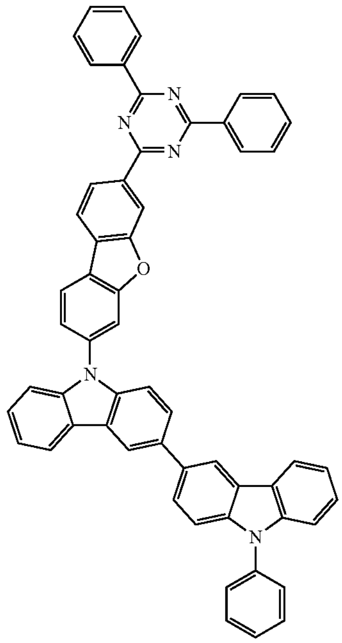
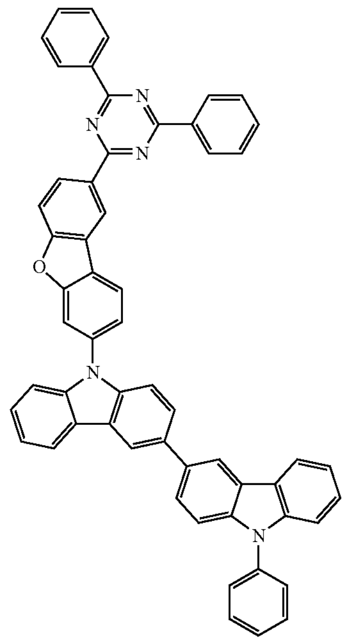
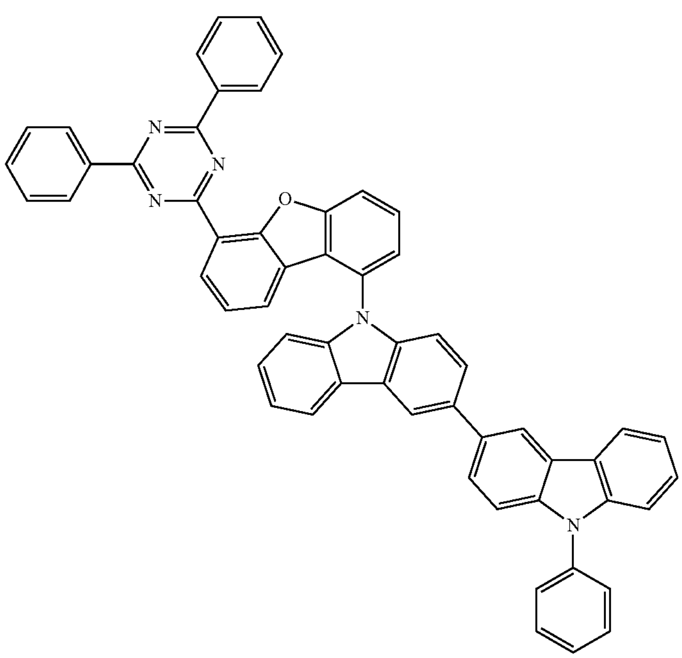

-continued
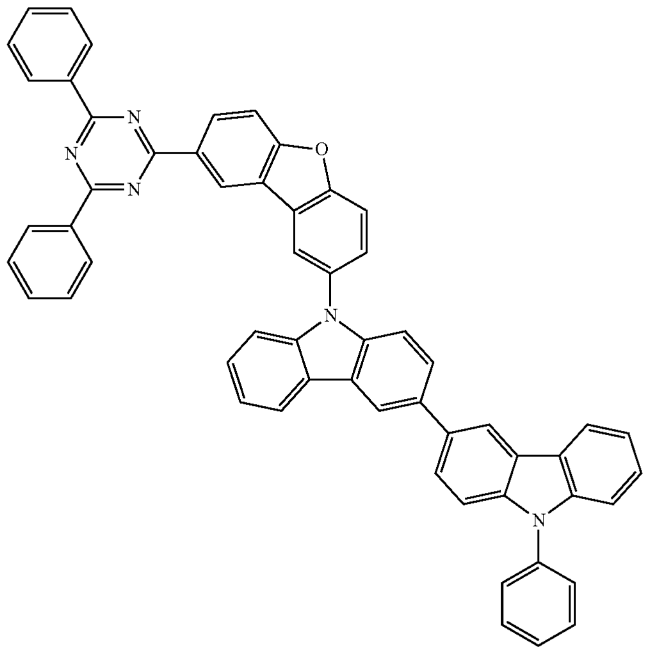
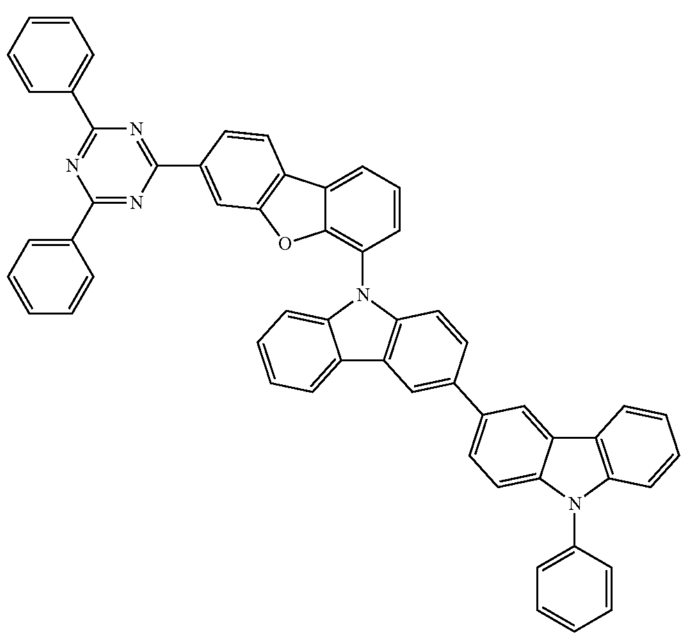

-continued
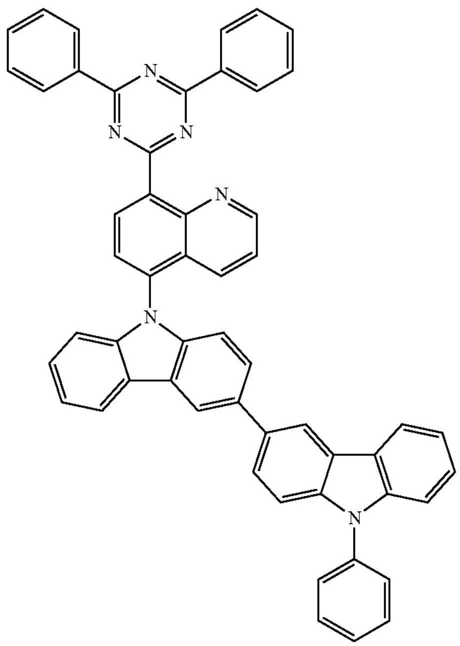
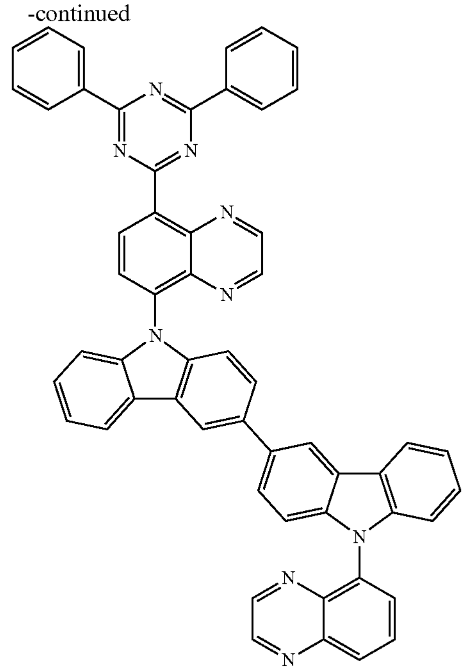
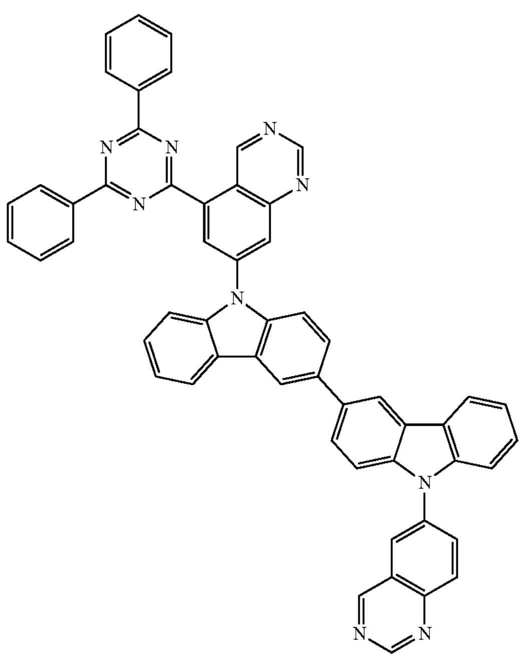
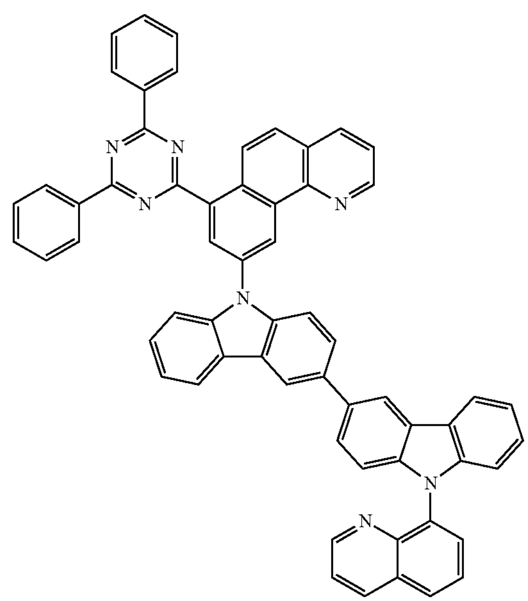

-continued
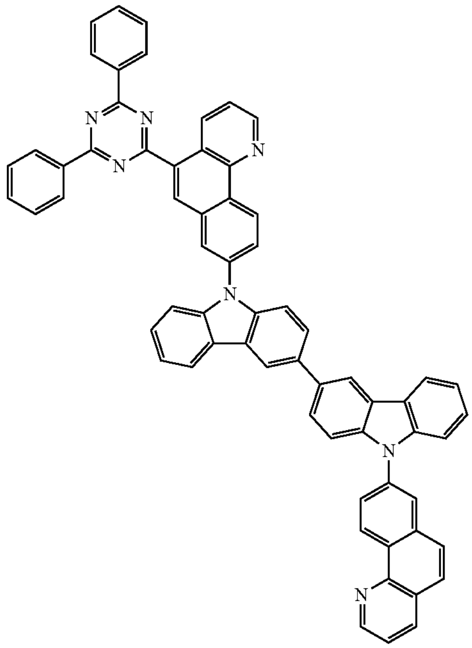
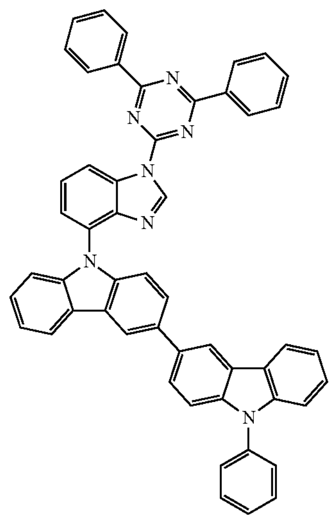
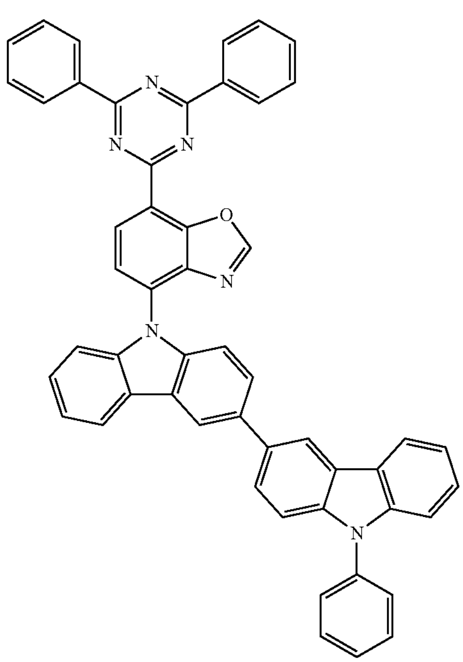
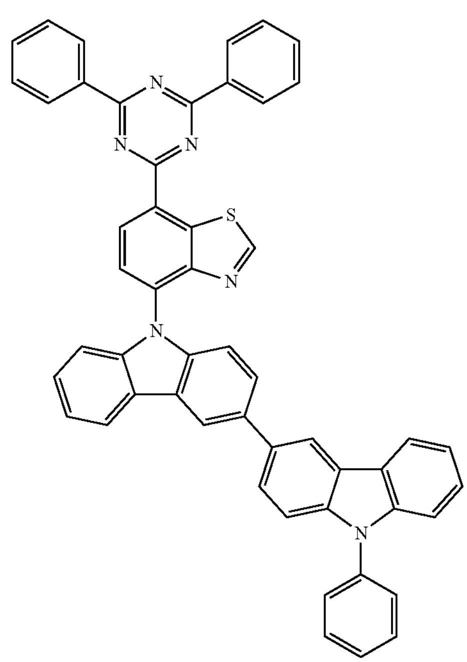

-continued
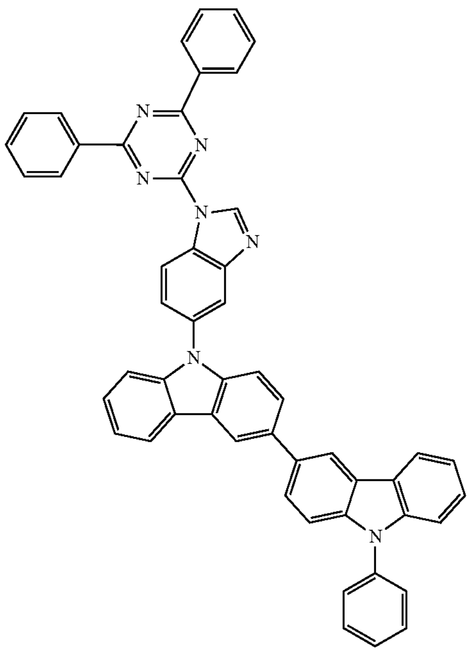
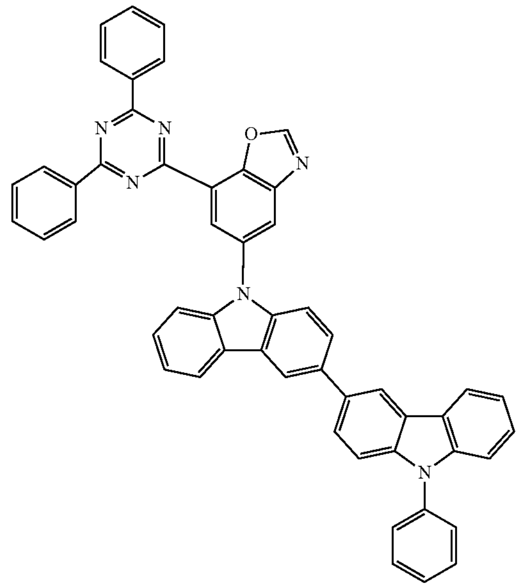
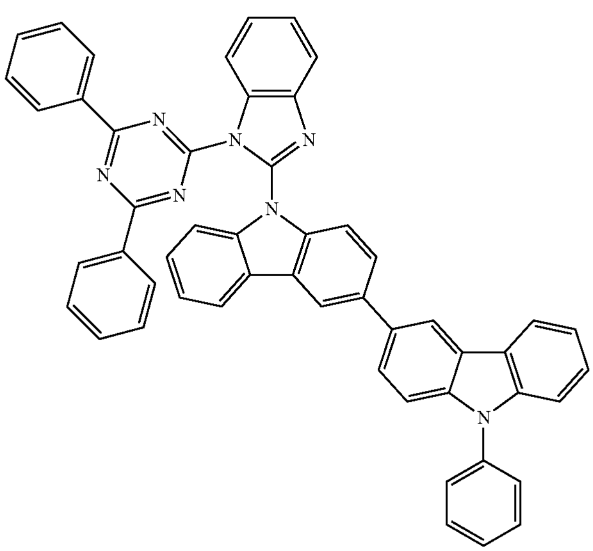

-continued
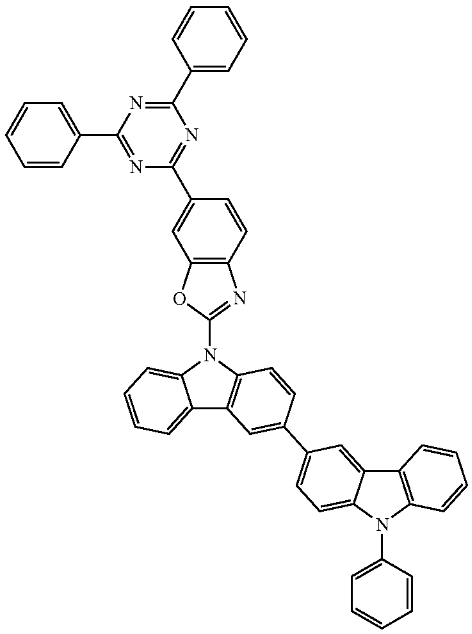
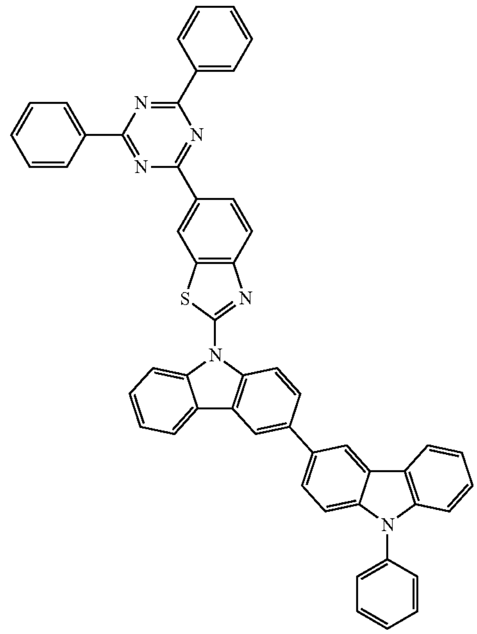
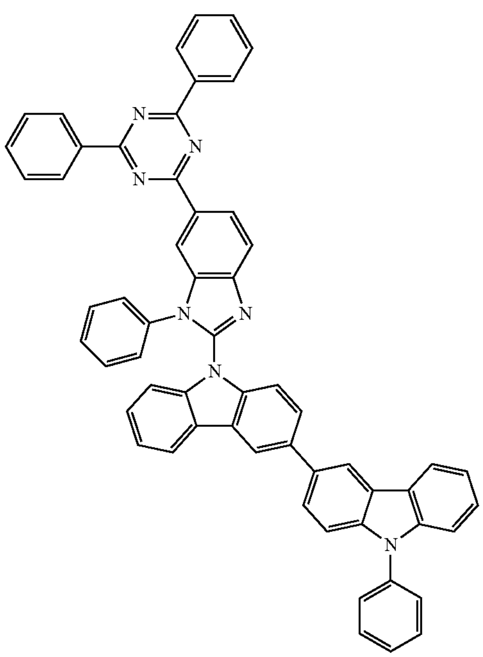
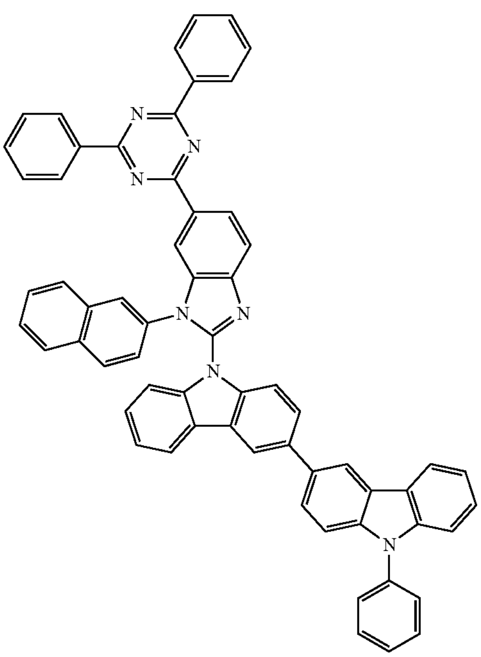

-continued
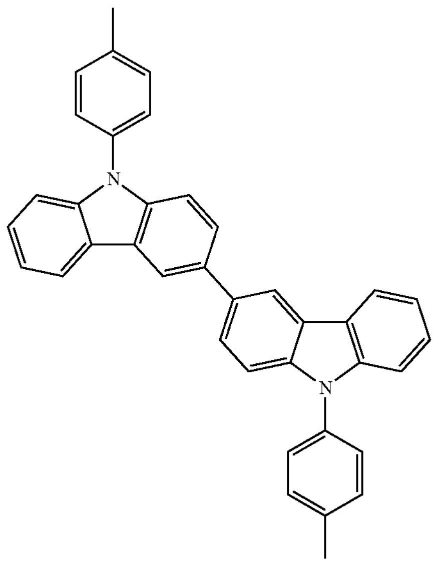
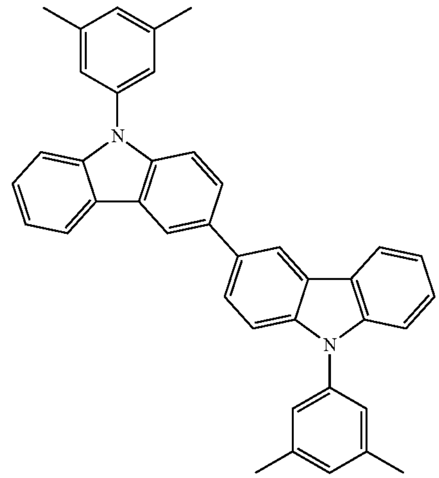
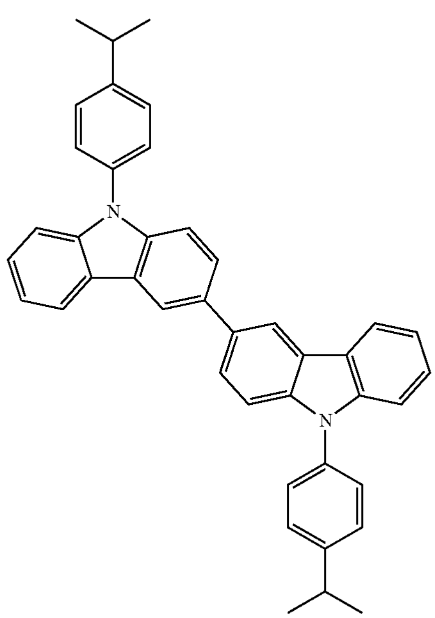
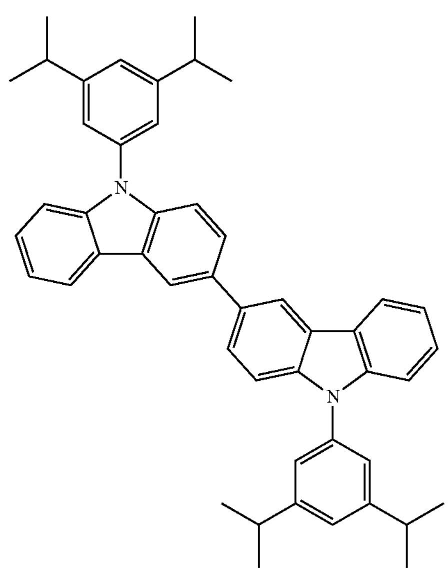

-continued
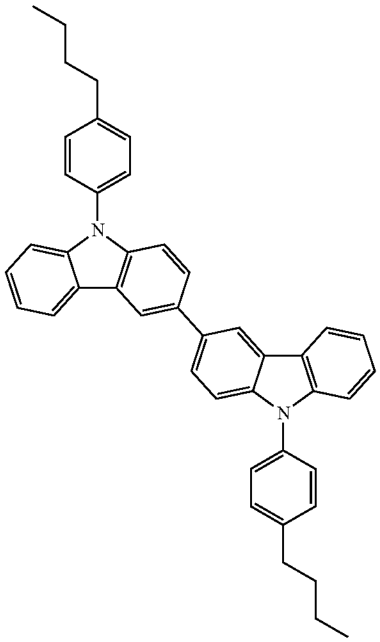
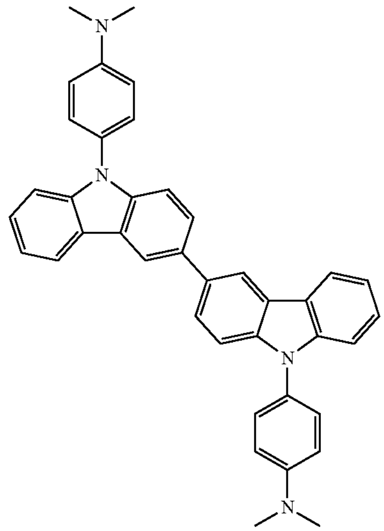
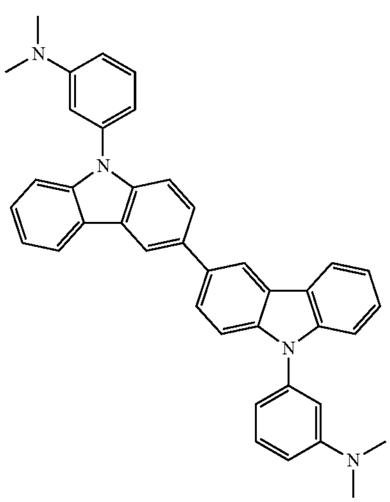
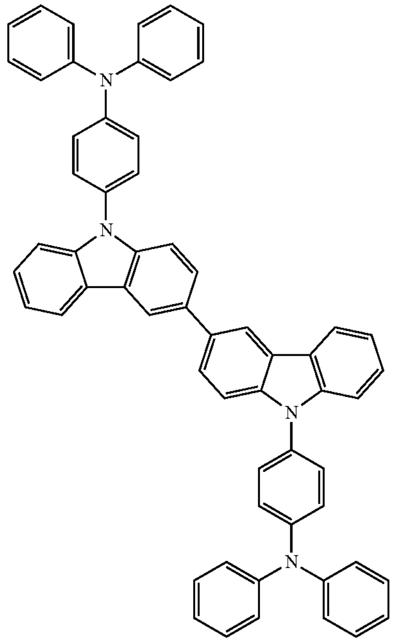

-continued
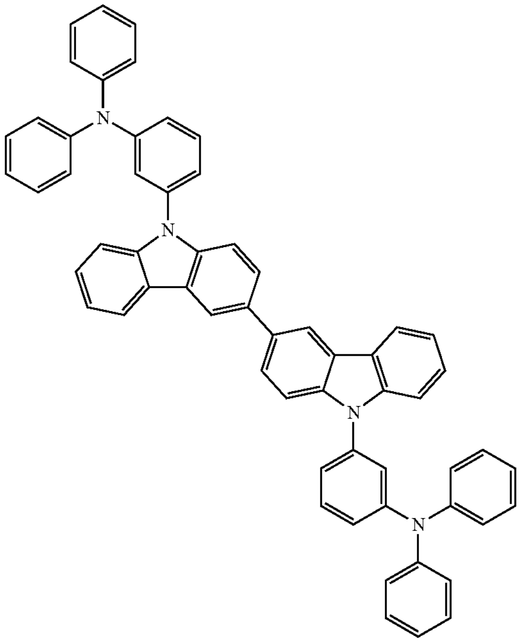
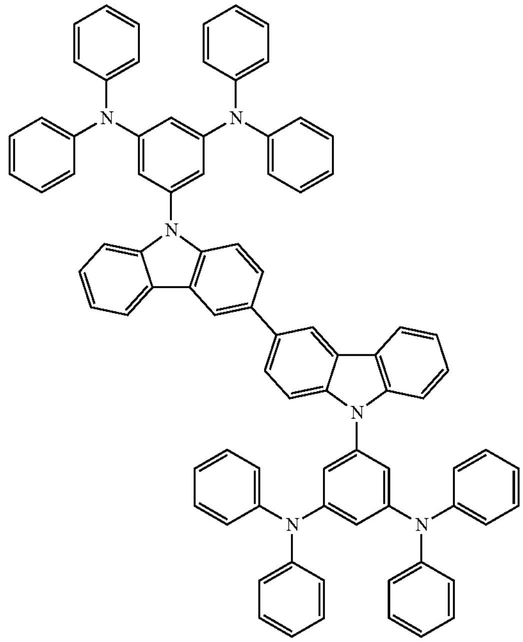
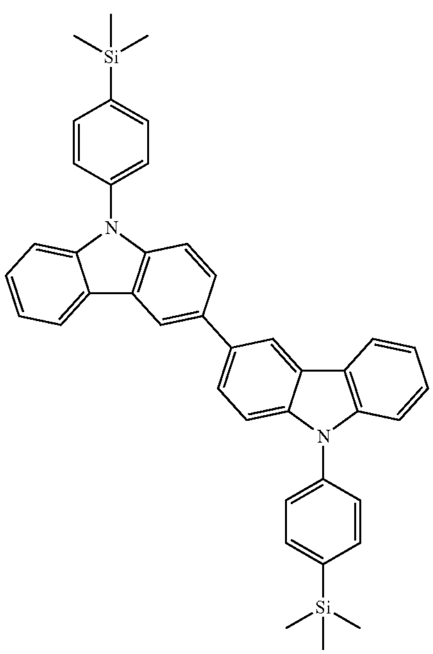
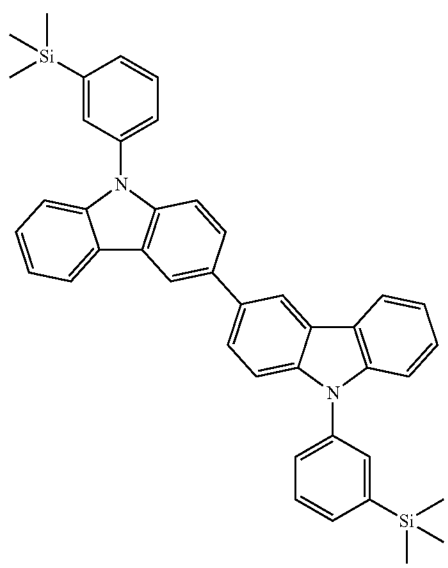

-continued
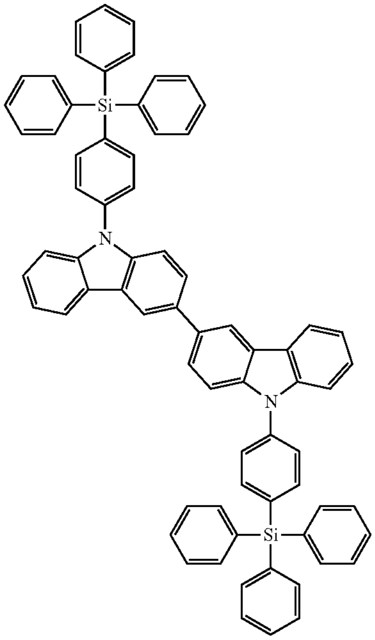
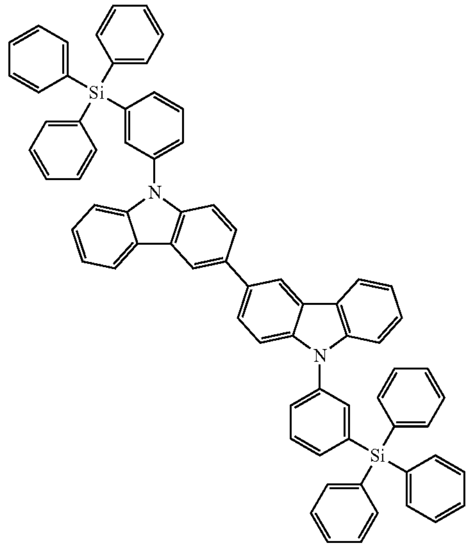
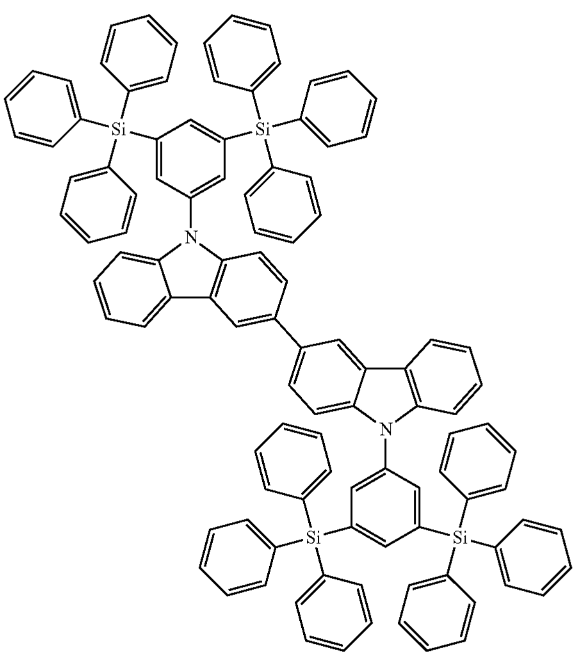
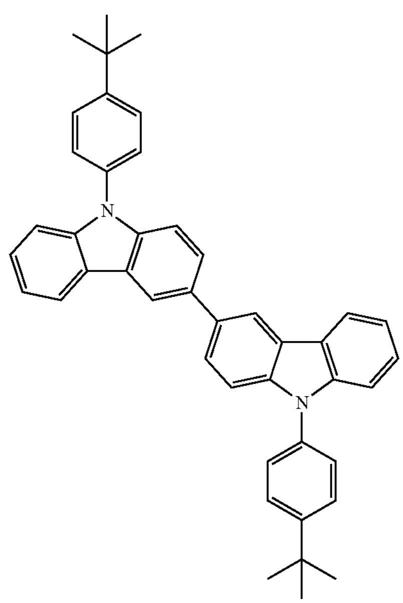

-continued
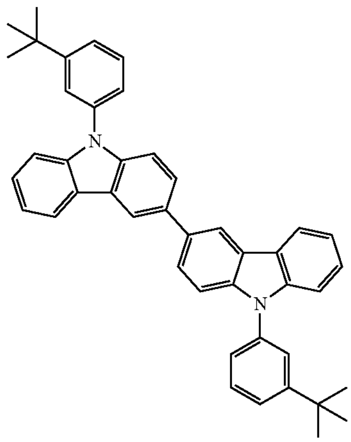
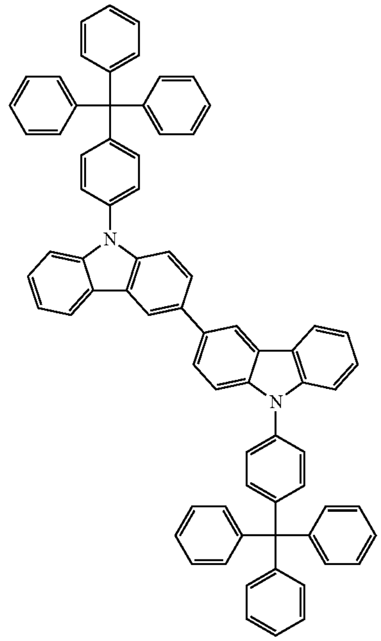
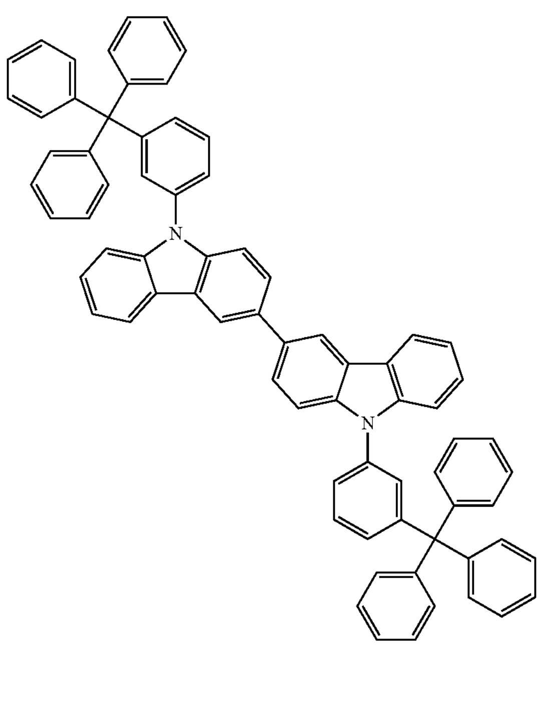
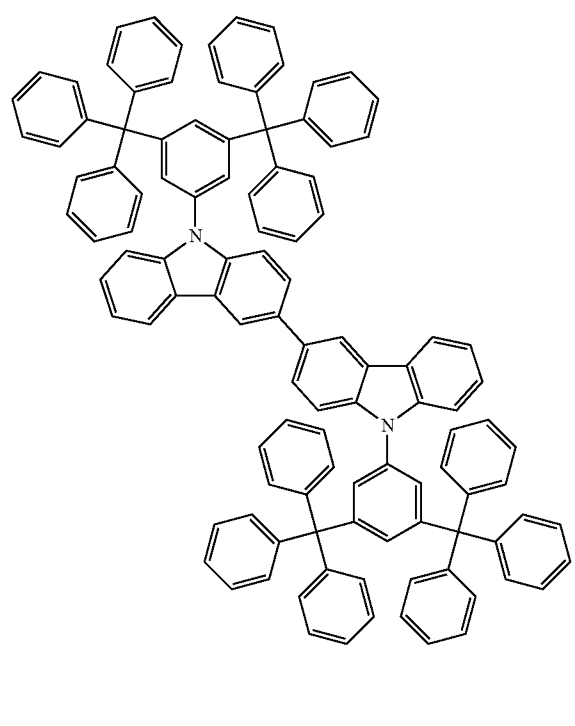

-continued
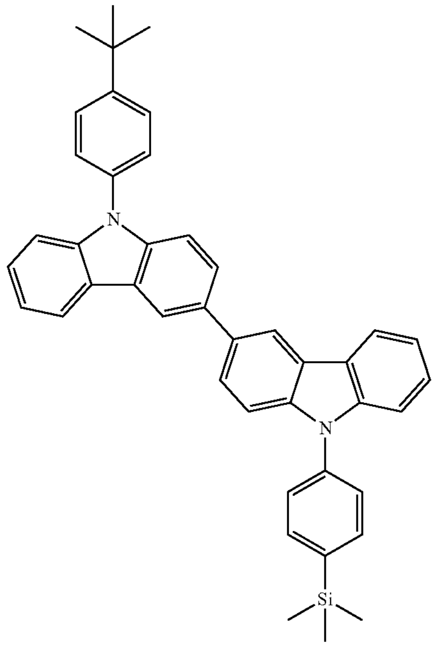
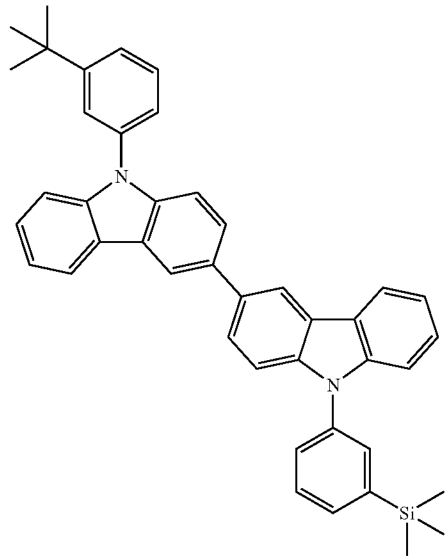
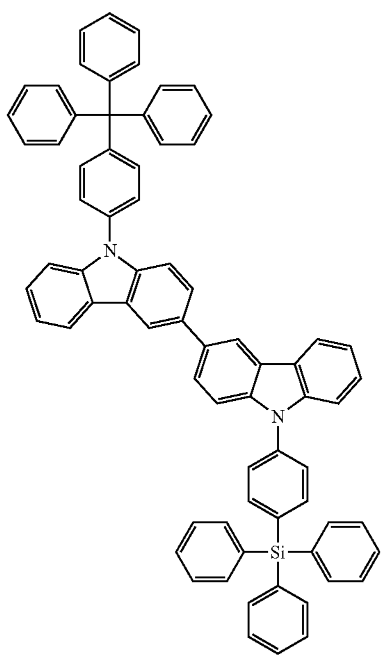
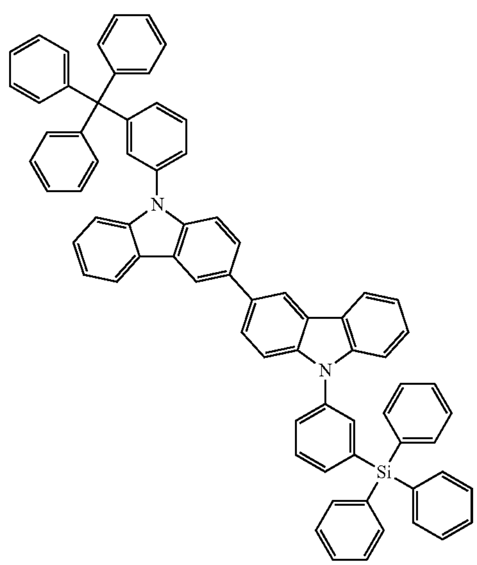

-continued
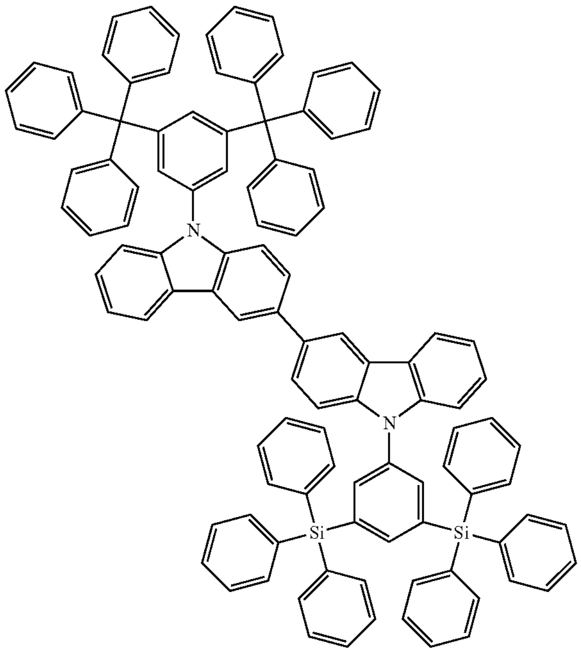
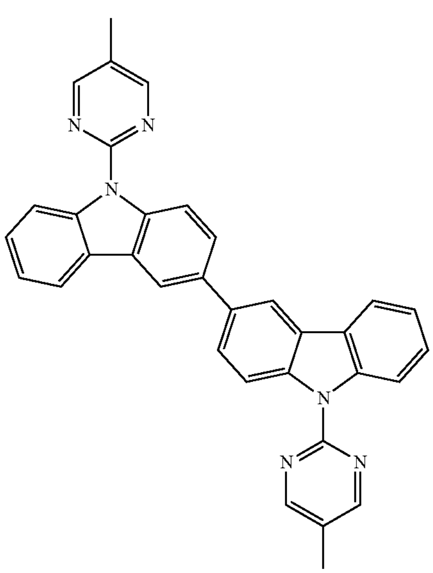
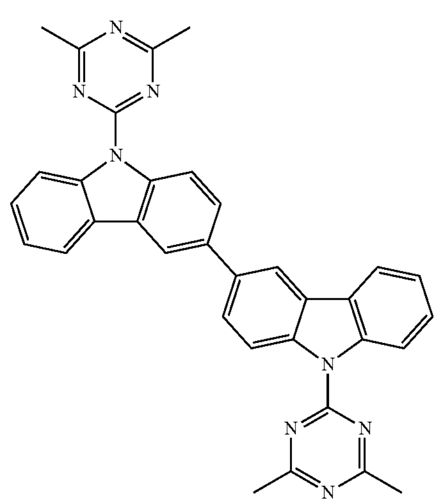

-continued
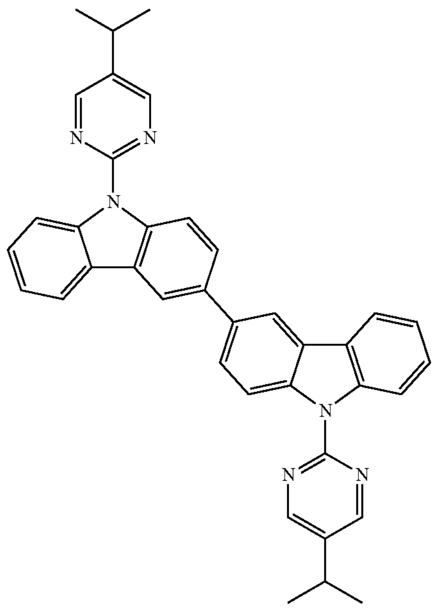
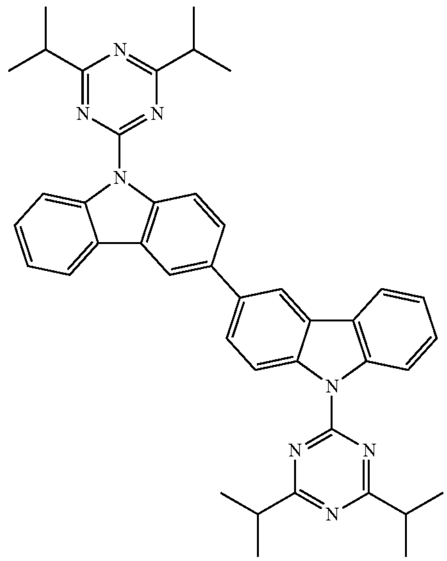
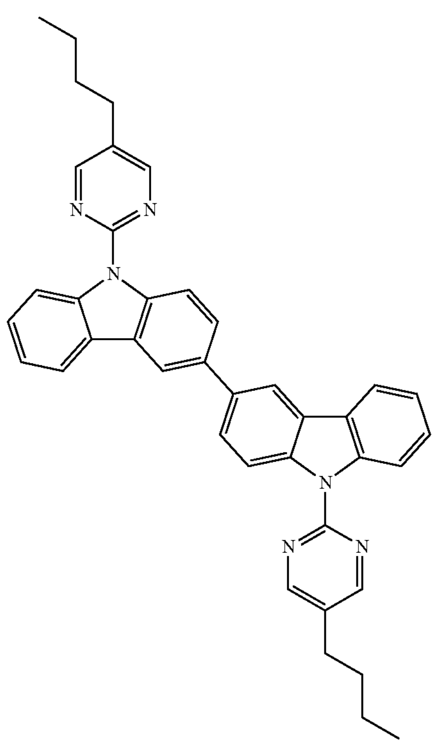
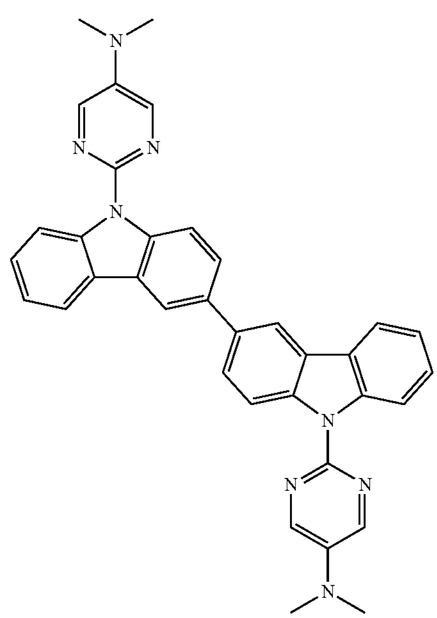

-continued
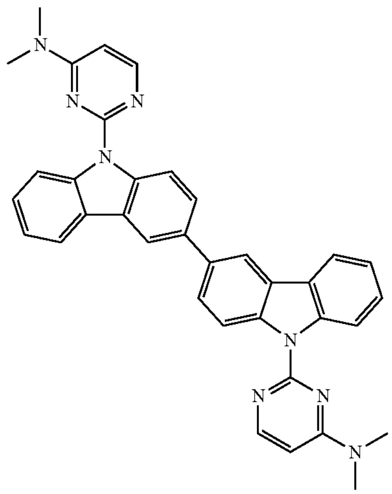
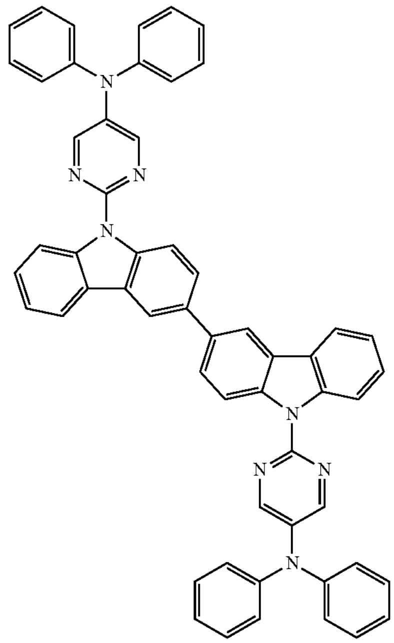
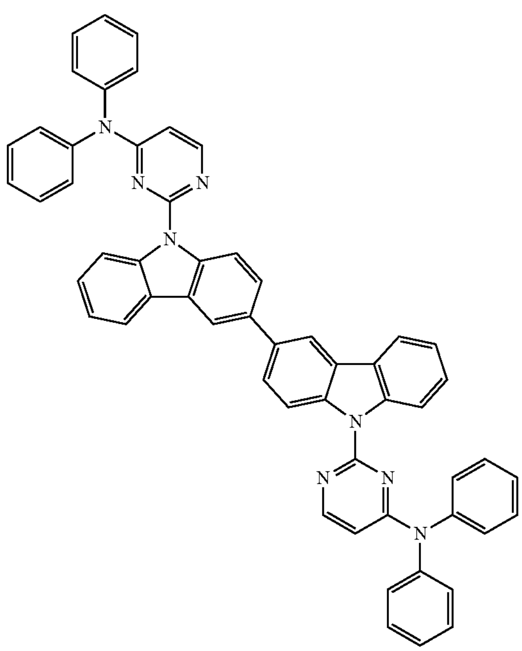
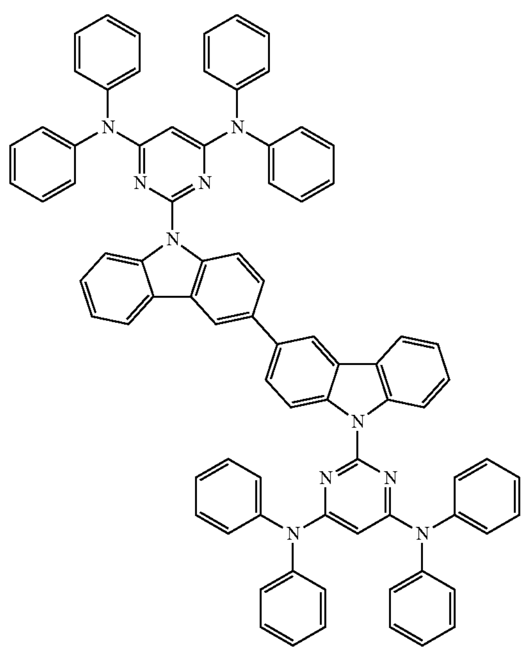

-continued
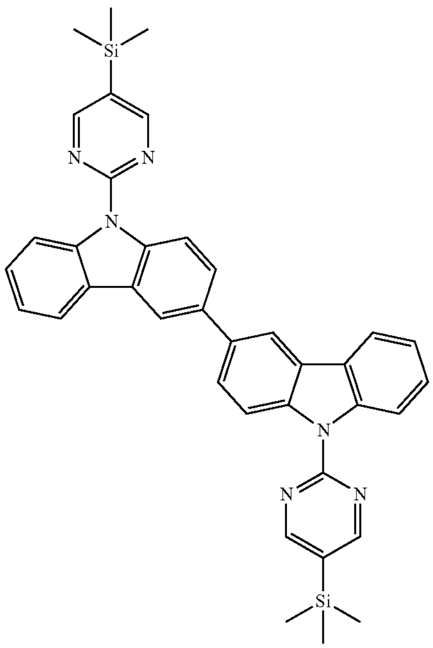
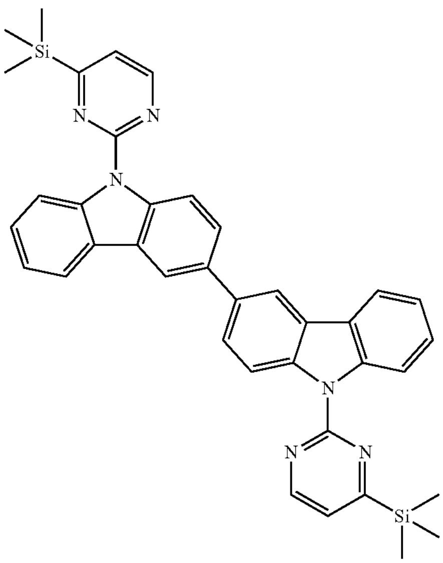
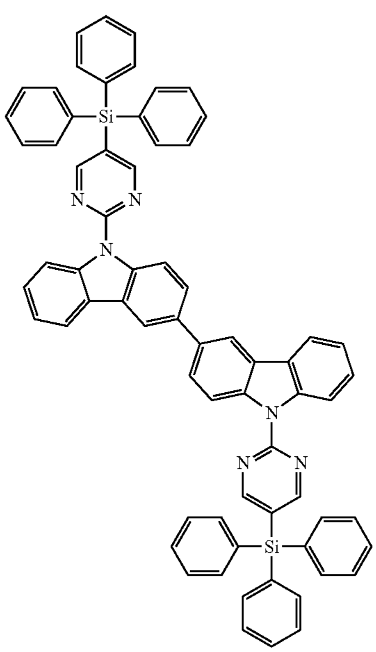
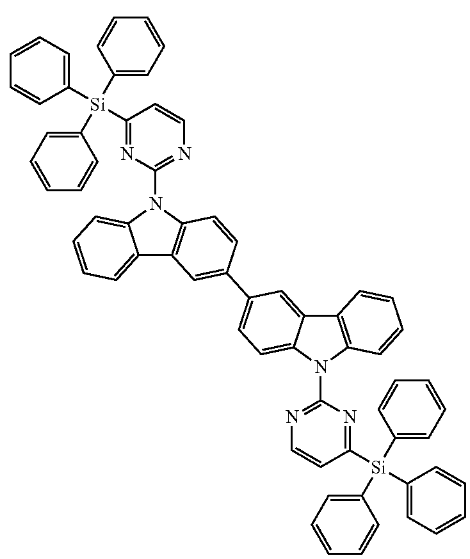

-continued
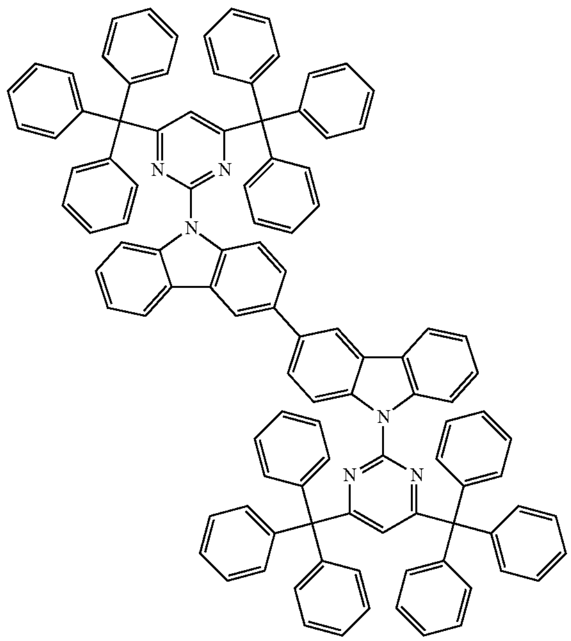
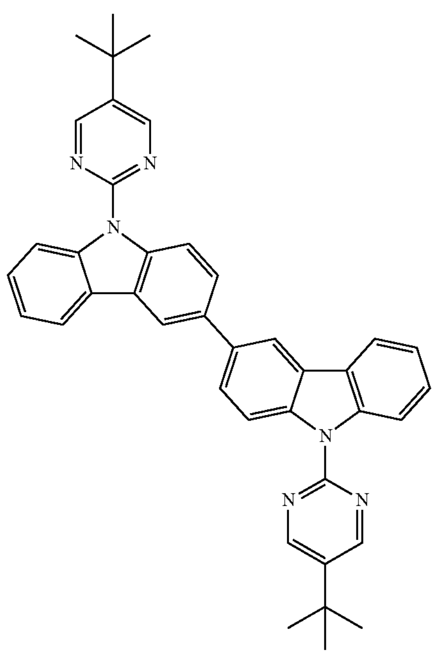
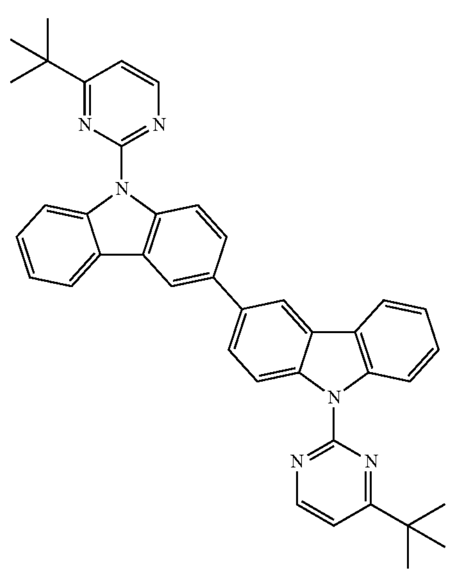

-continued
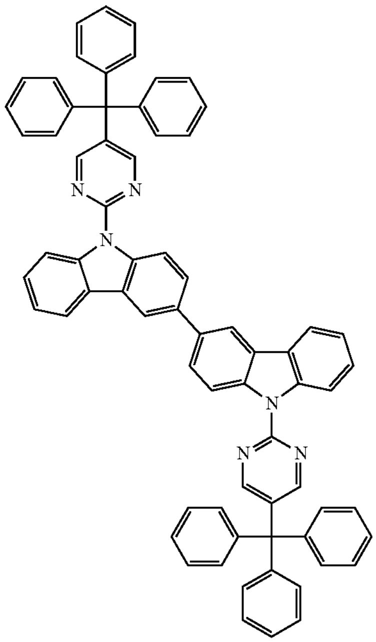
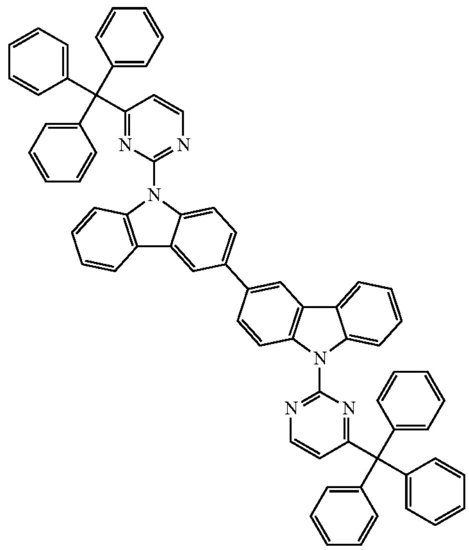
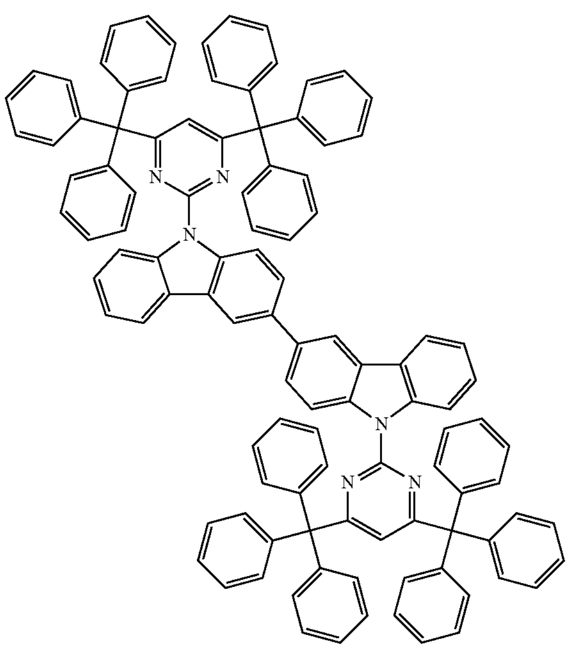

-continued
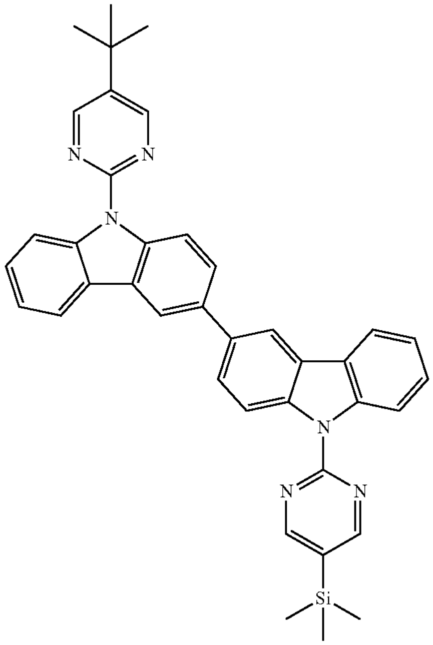
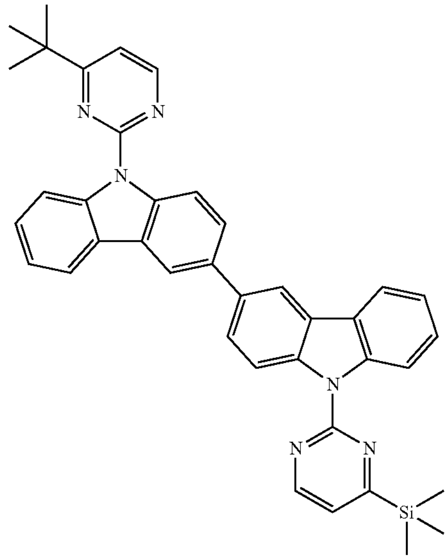
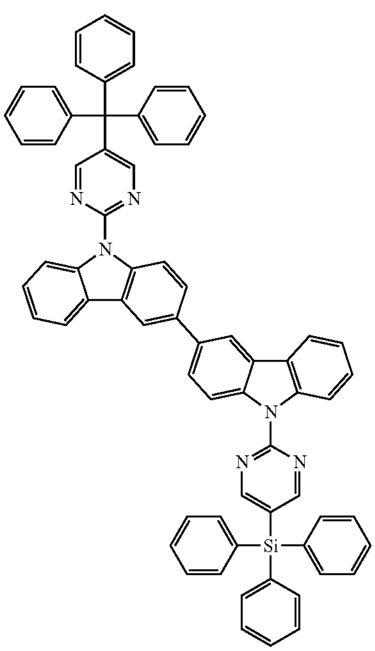
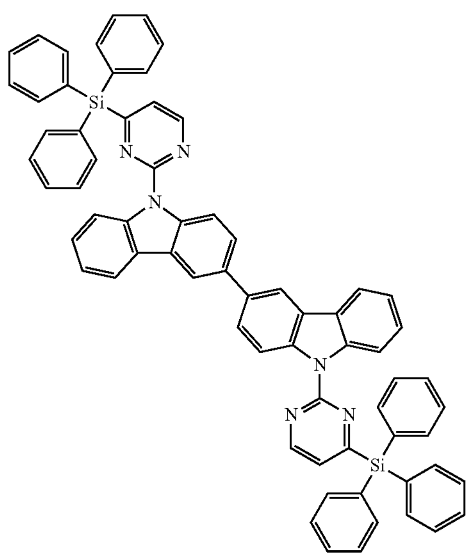

-continued
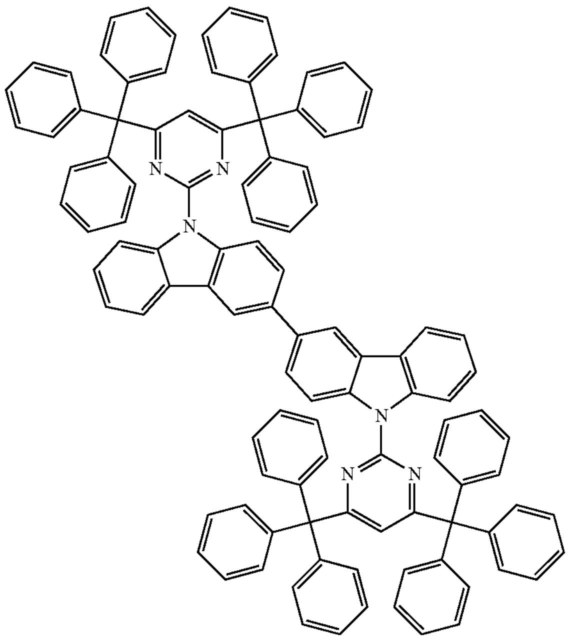 [SMILES: c1ccc(C(c2ccccc2)(c2ccccc2)c2cc(C(c3ccccc3)(c3ccccc3)c3ccccc3)nc(-n3c4ccccc4c4cc(-c5ccc6c(c5)c5ccccc5n6-c5nc(C(c6ccccc6)(c6ccccc6)c6ccccc6)cc(C(c6ccccc6)(c6ccccc6)c6ccccc6)n5)ccc43)n2)cc1]
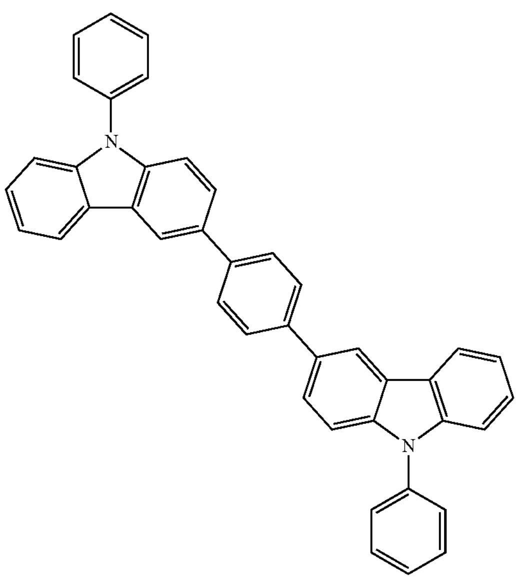
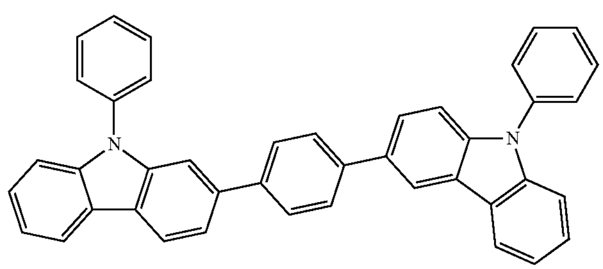

-continued
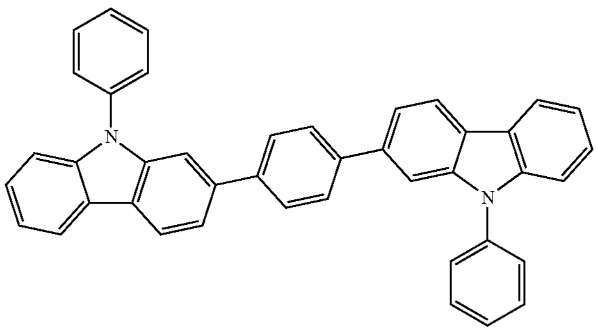
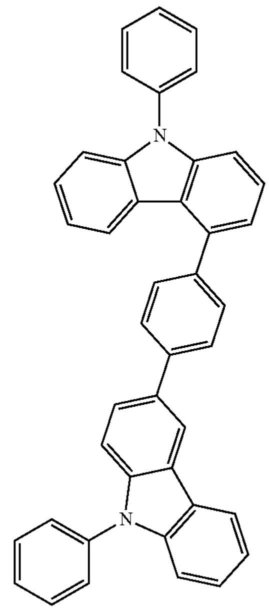
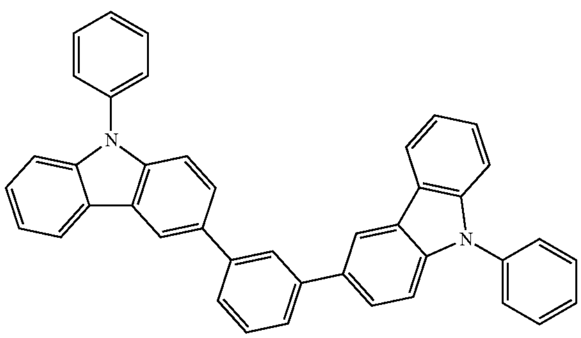
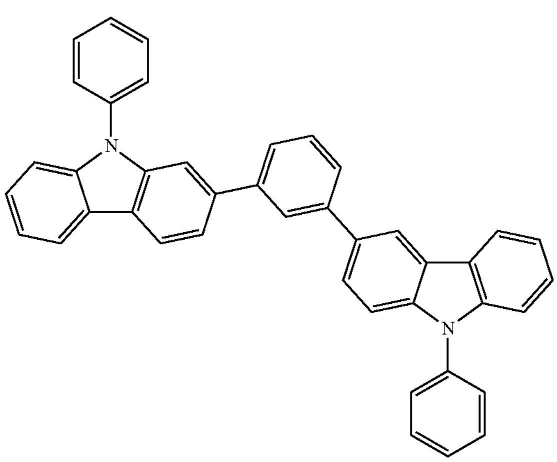
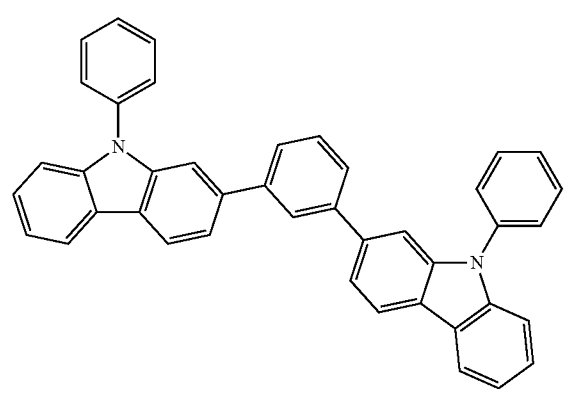

-continued
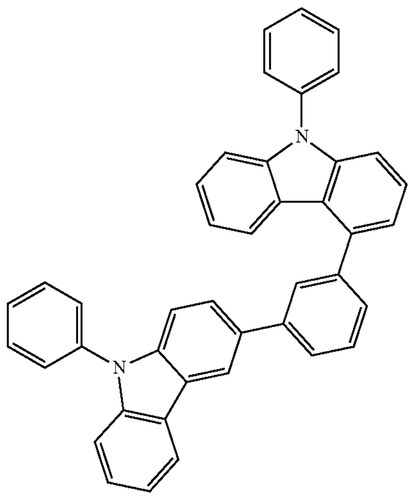
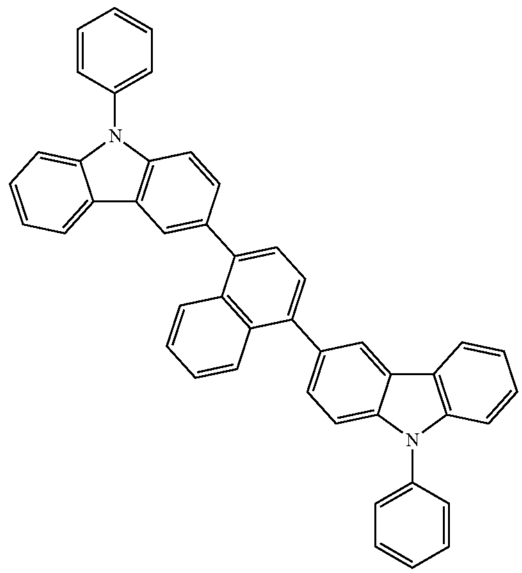
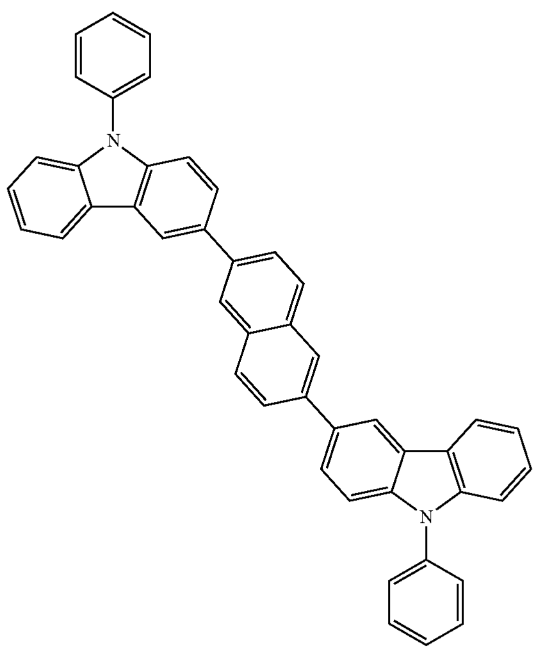
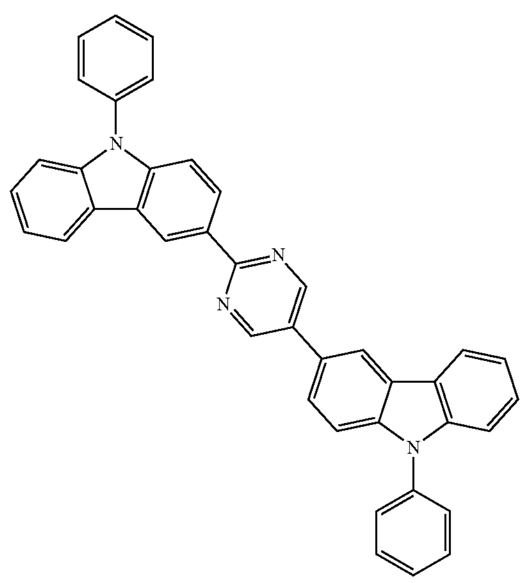

-continued
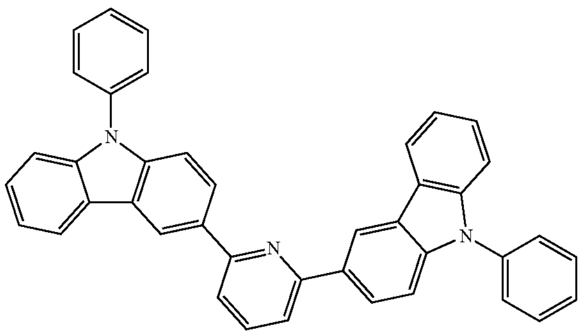
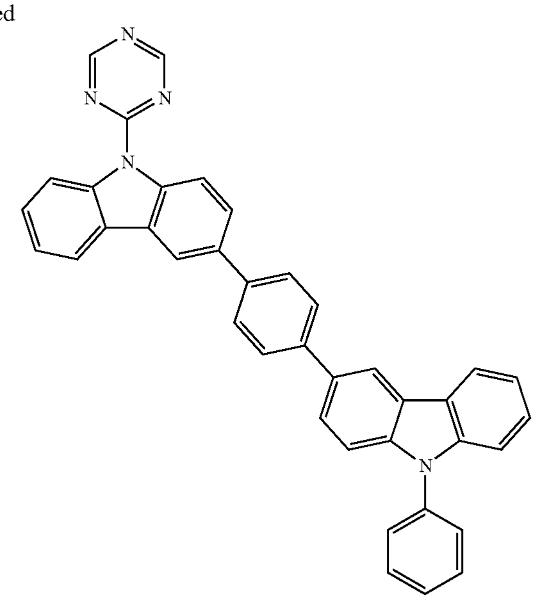
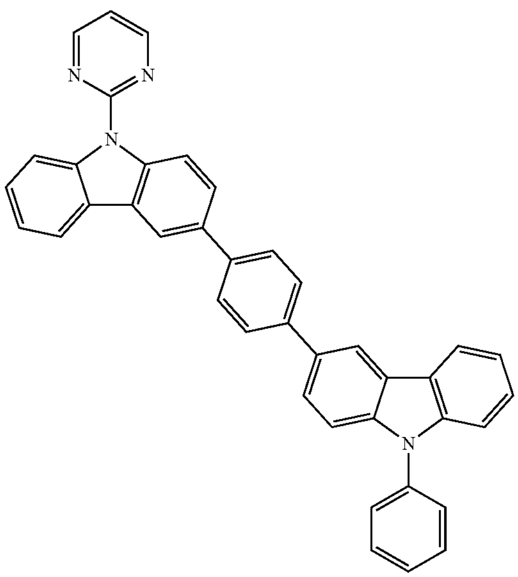
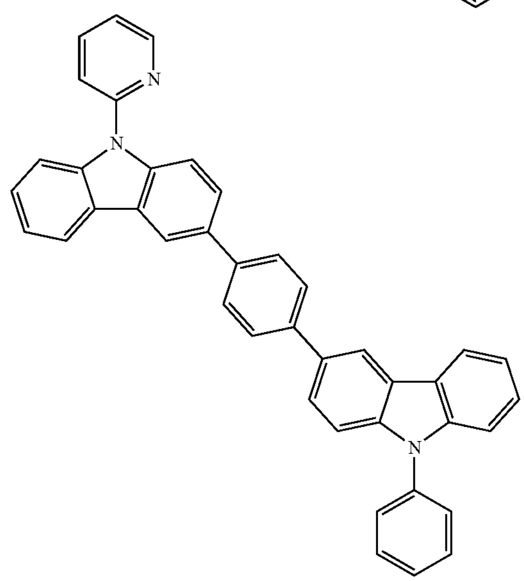
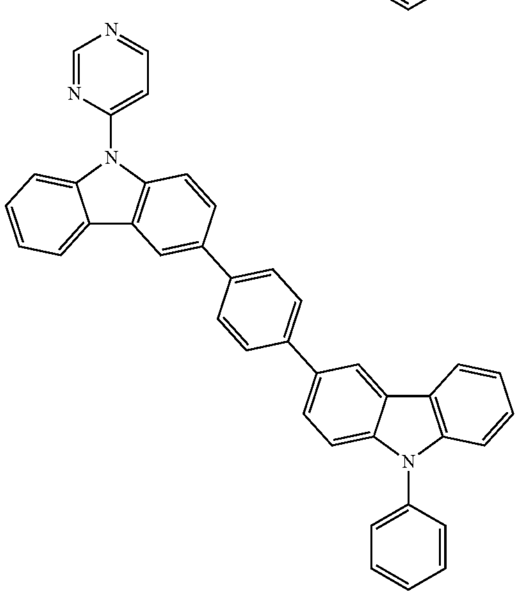
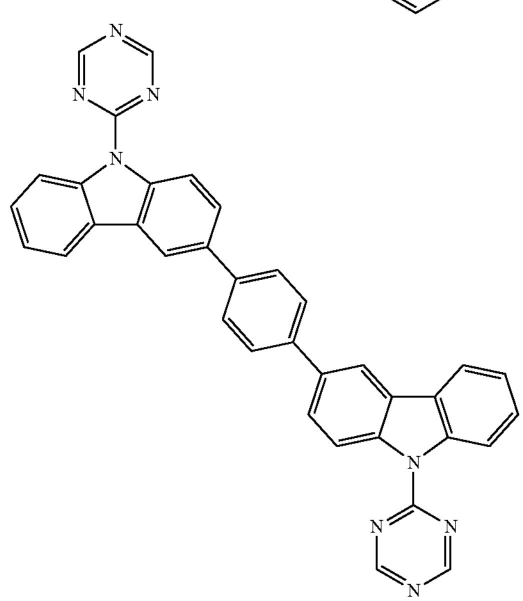

-continued
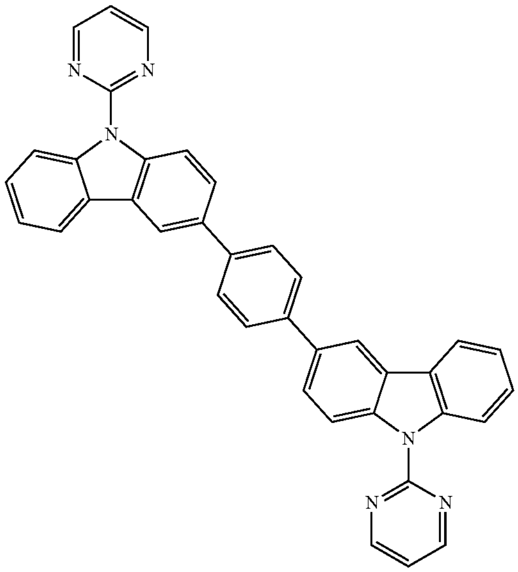
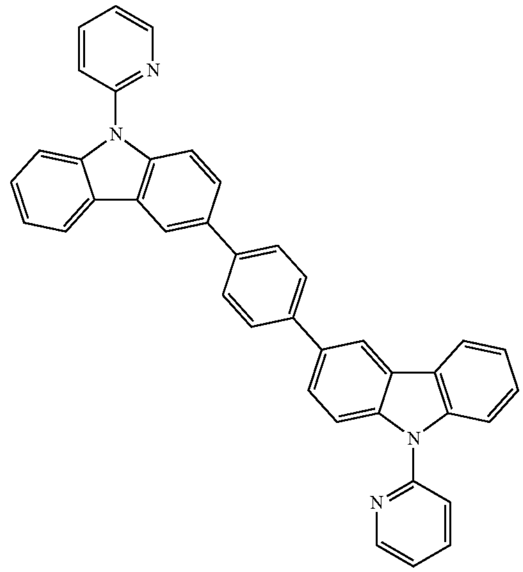
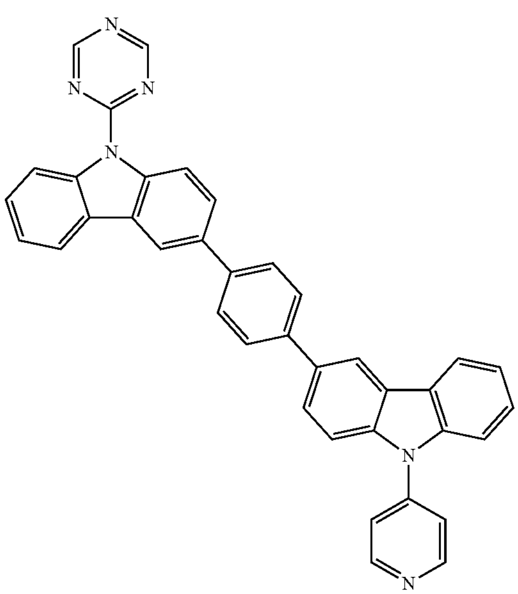
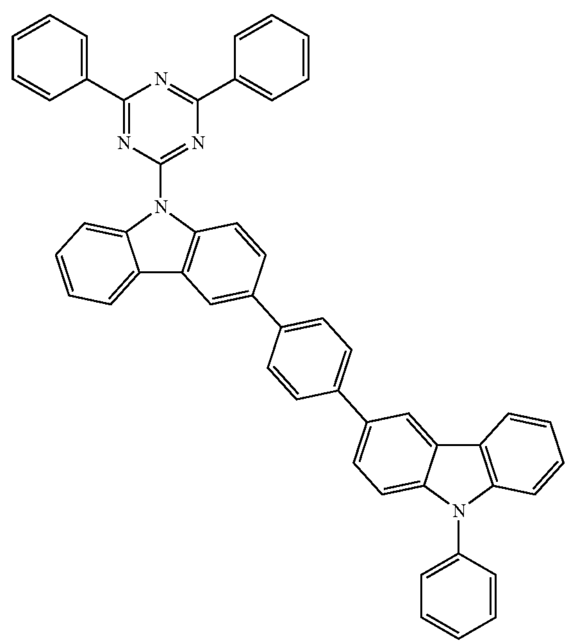

-continued
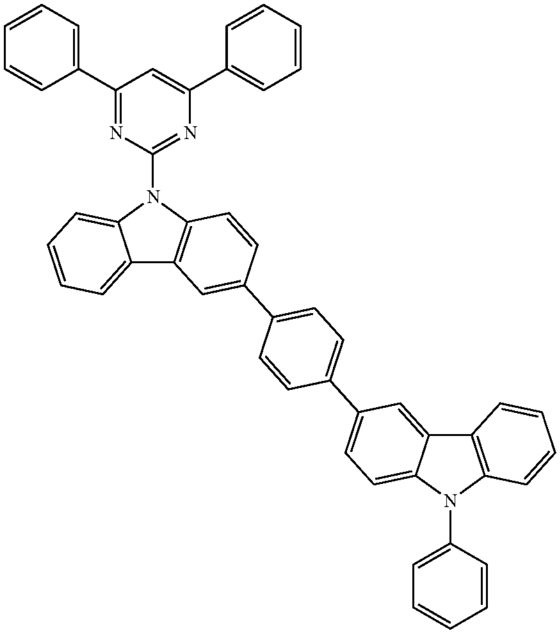
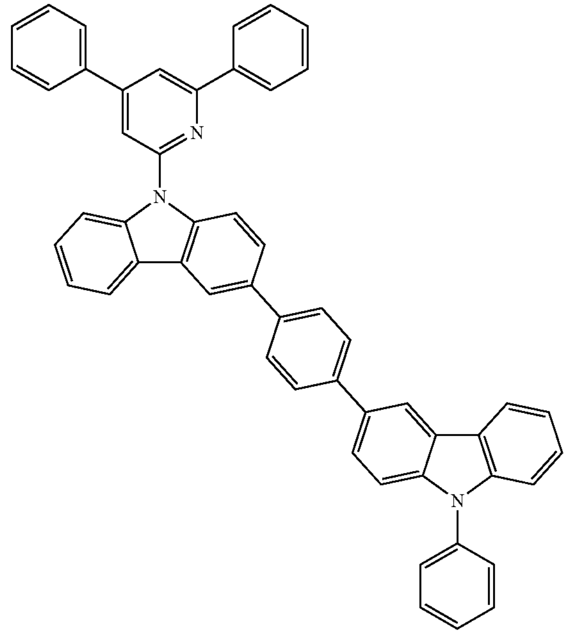
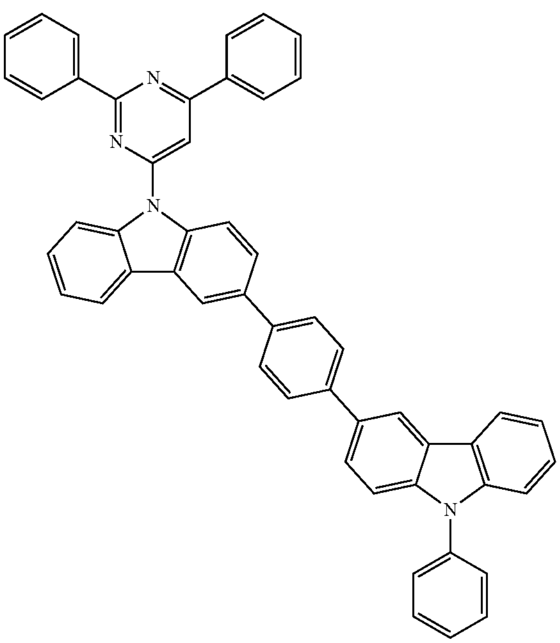
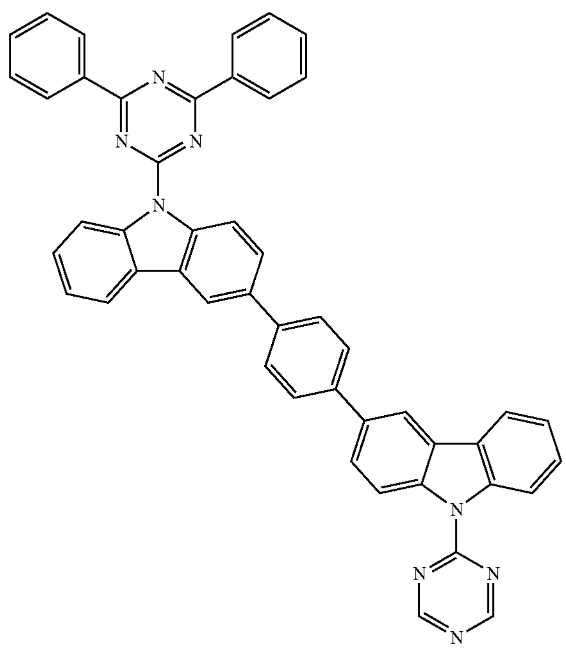

-continued
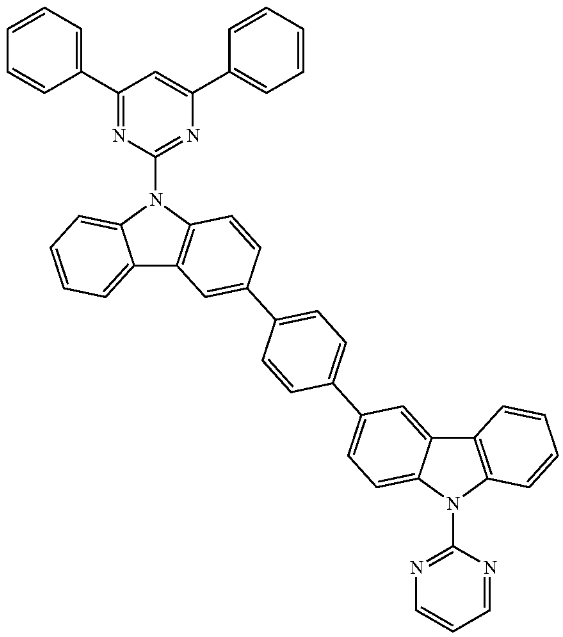
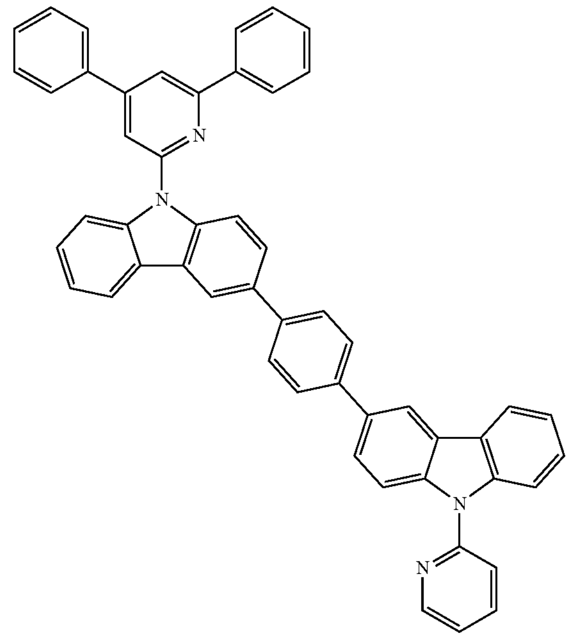
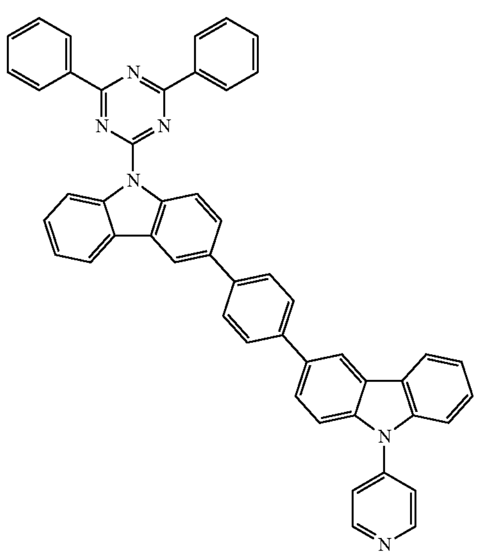
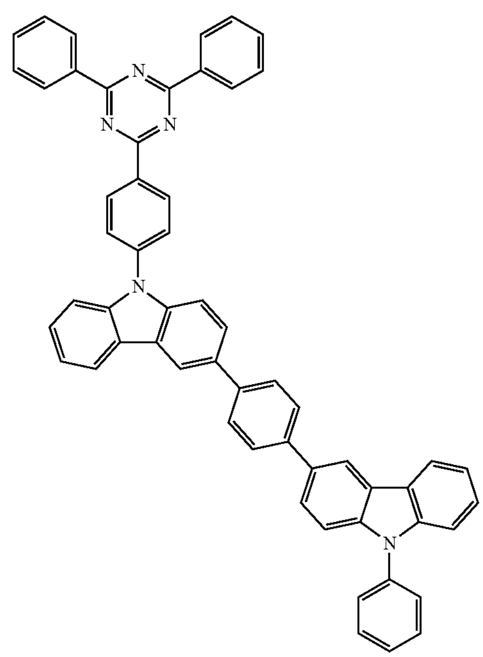

-continued
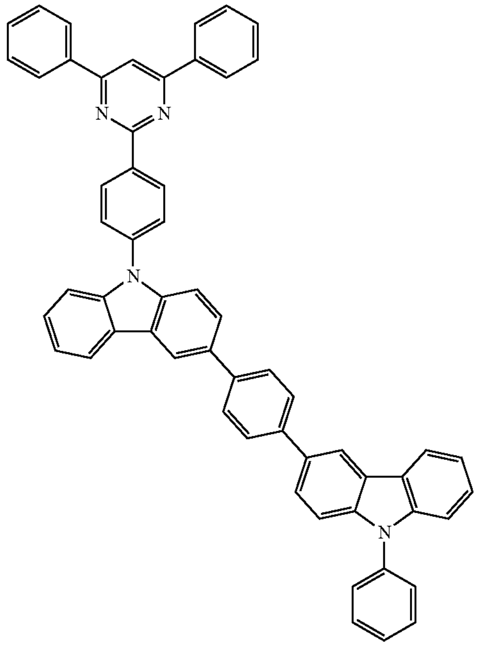
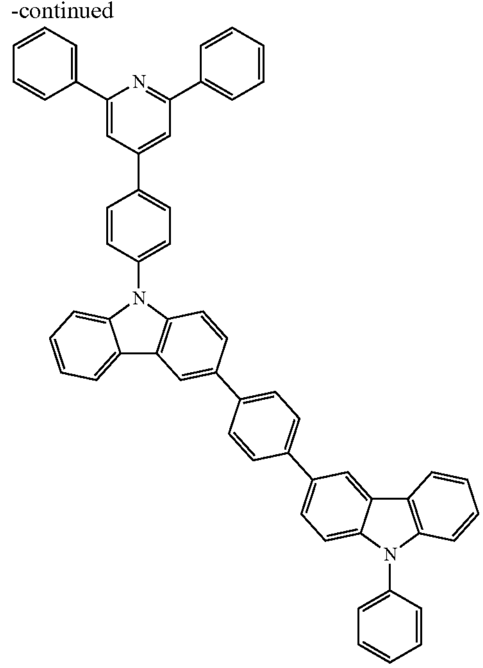
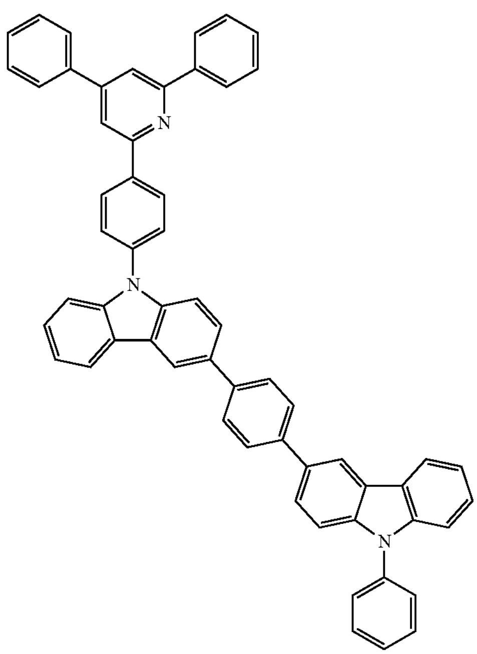
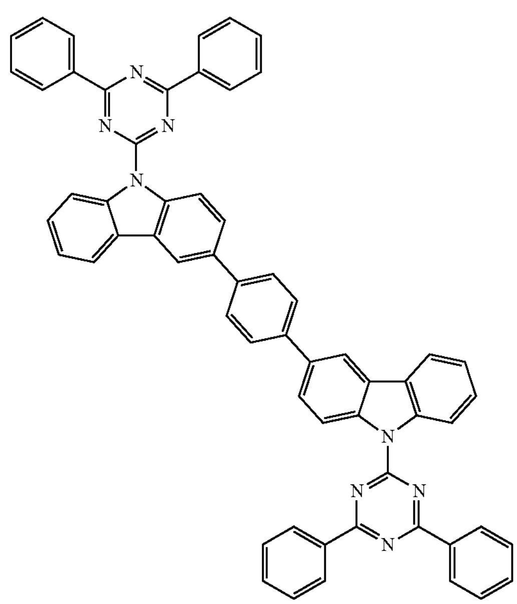

-continued
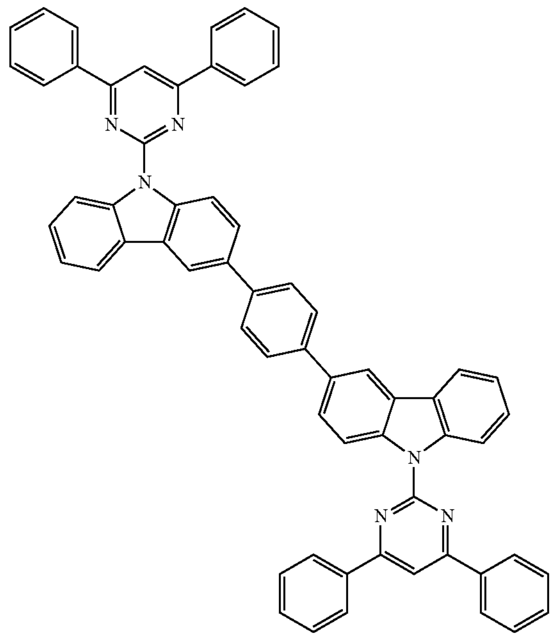
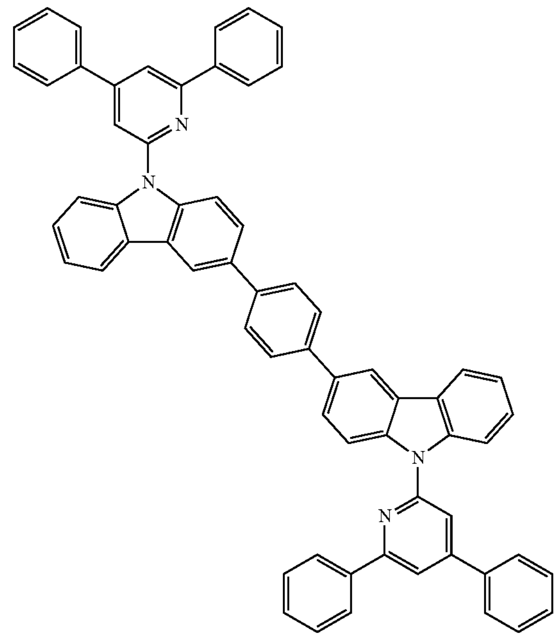
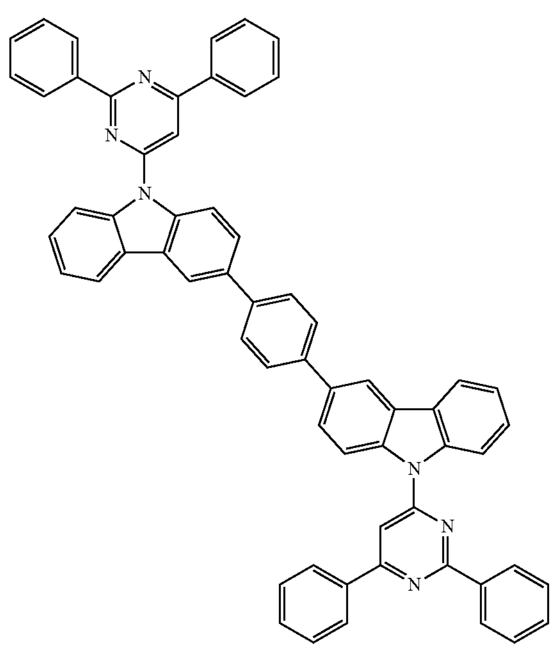
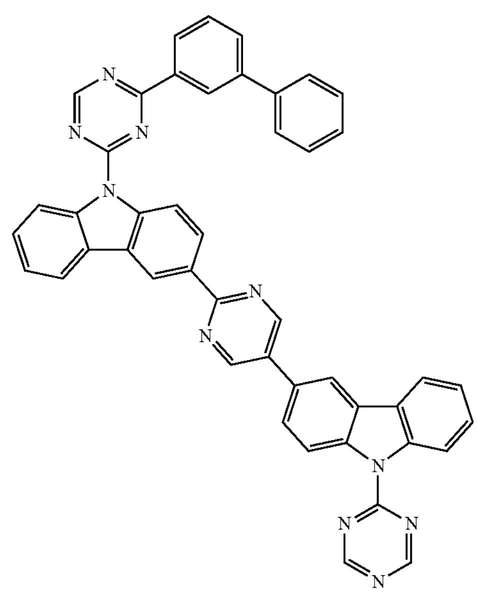

-continued
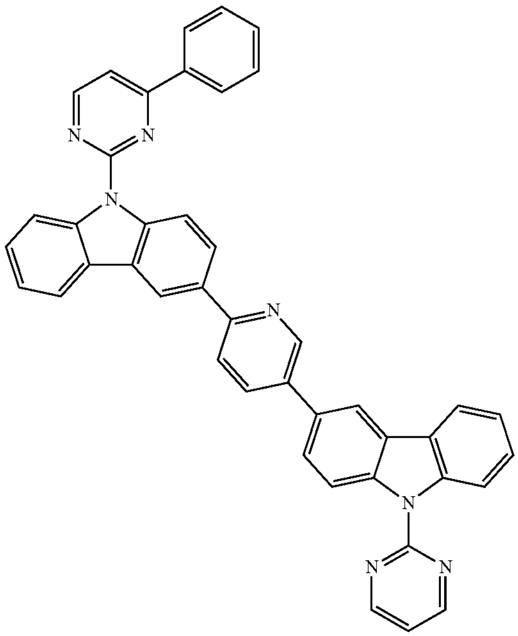
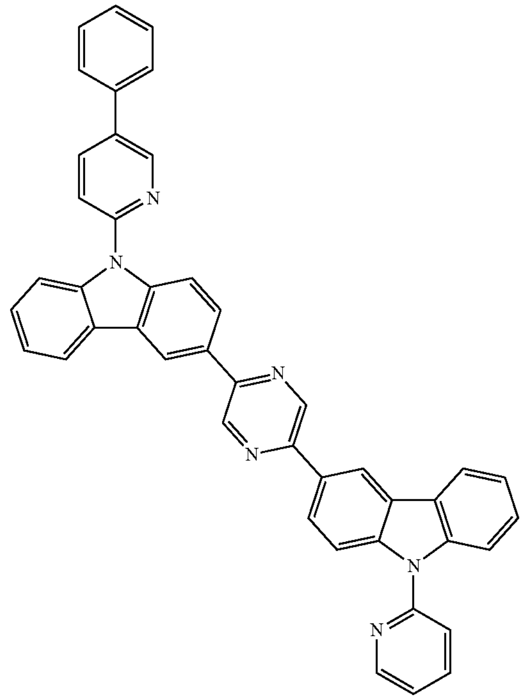
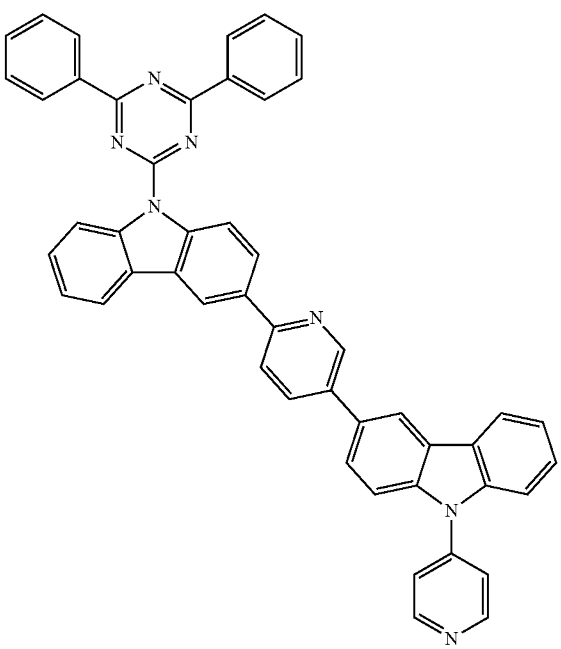
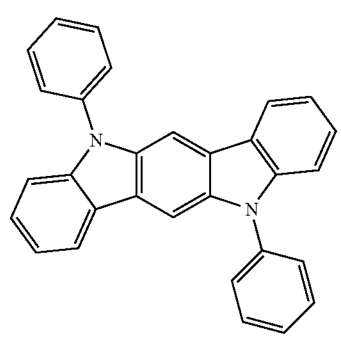

-continued
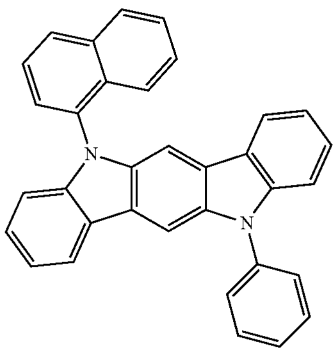
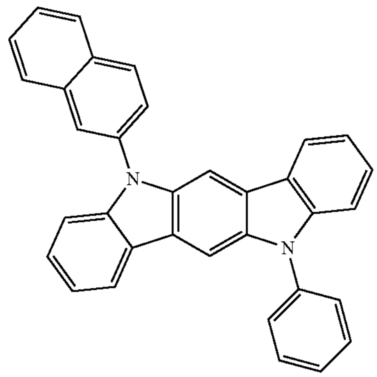
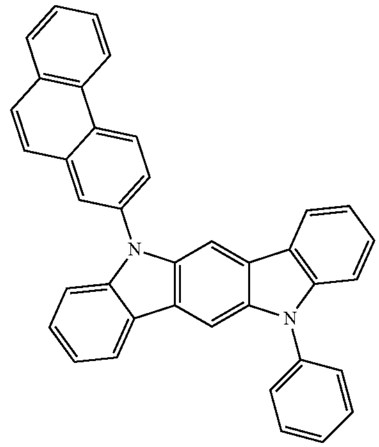
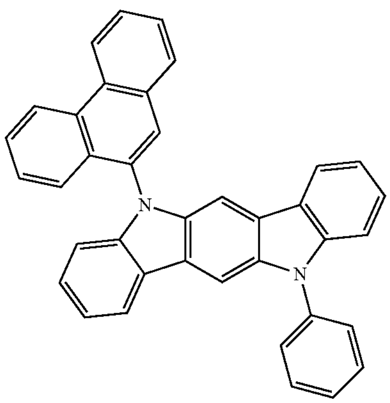
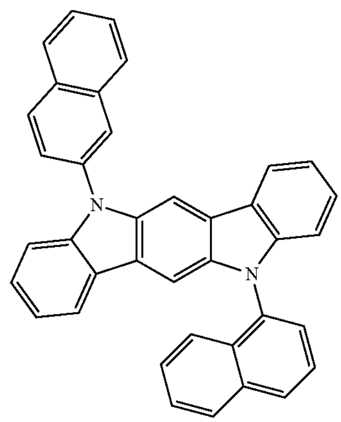
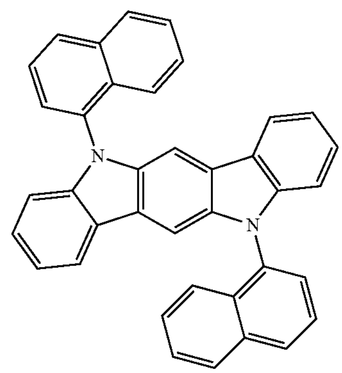
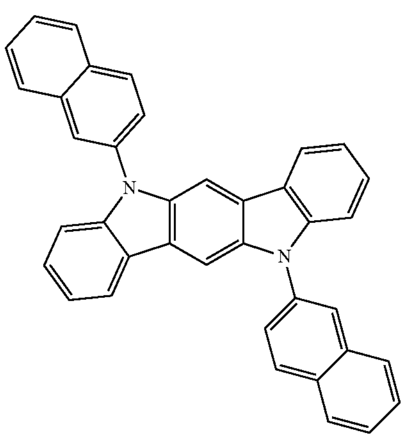
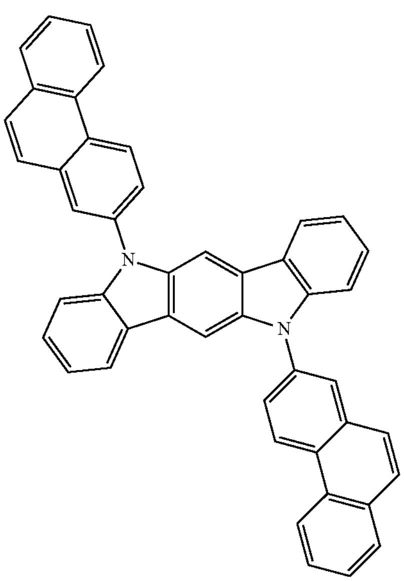

-continued
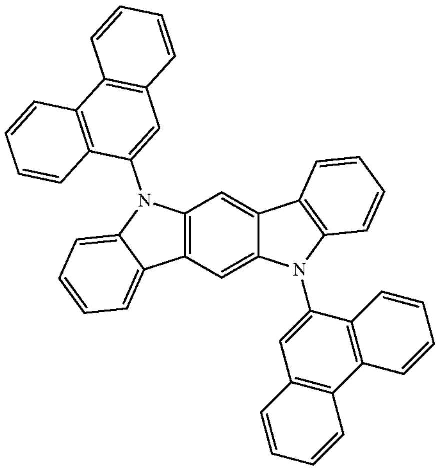
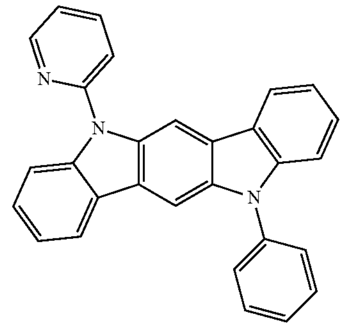
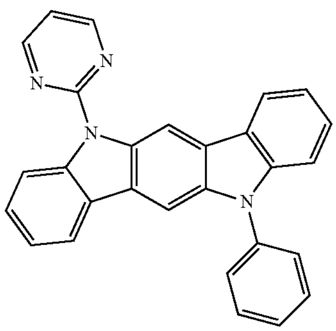
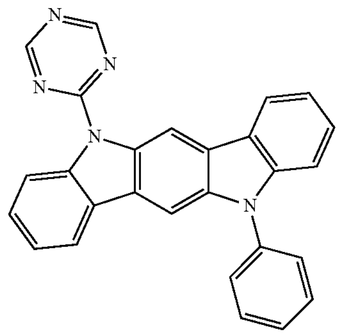
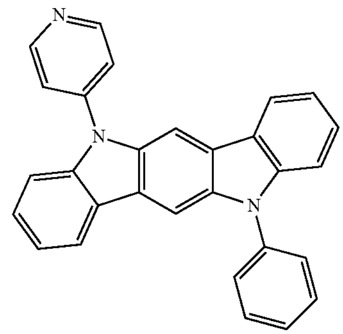
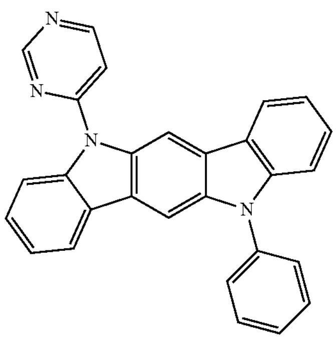
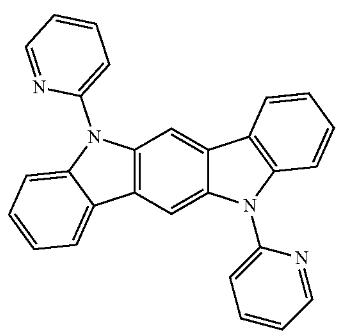
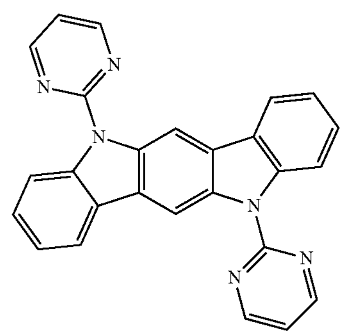
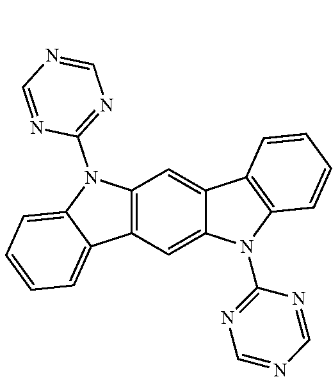
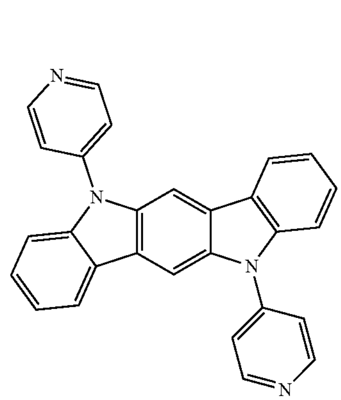
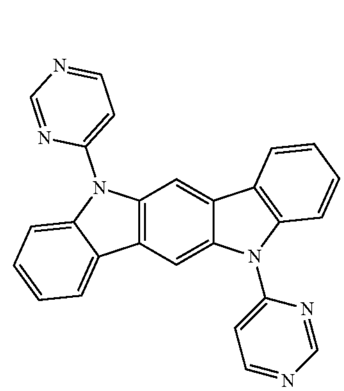

-continued
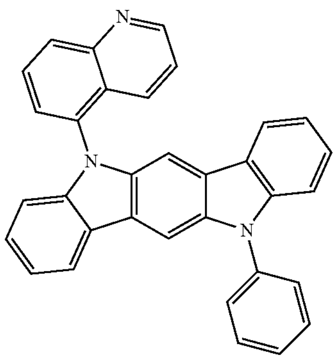
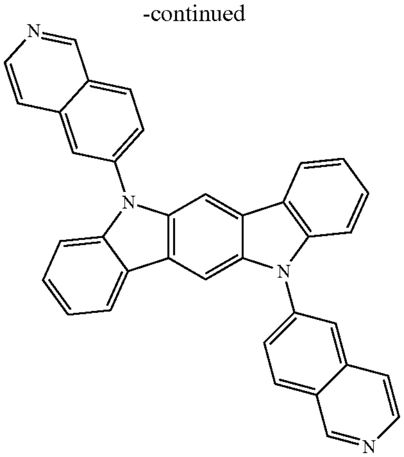
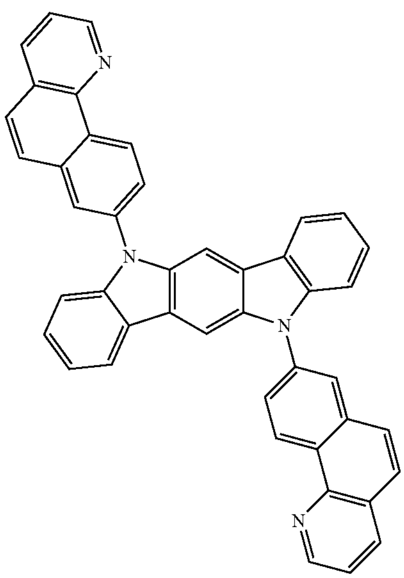
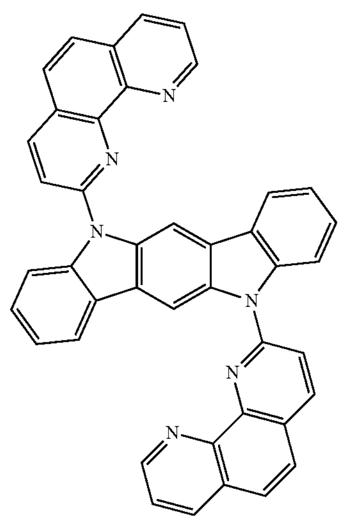
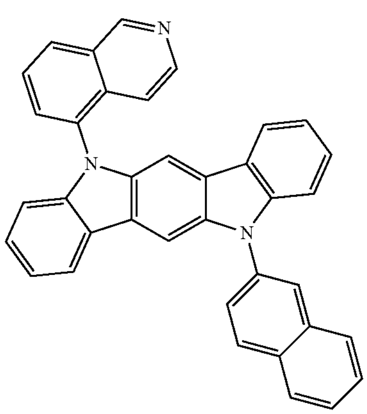
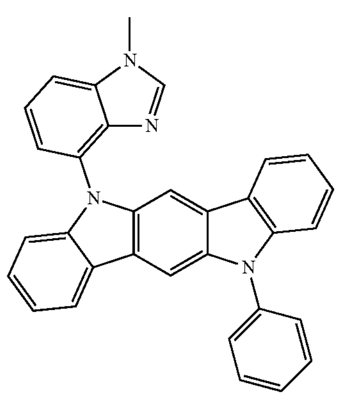
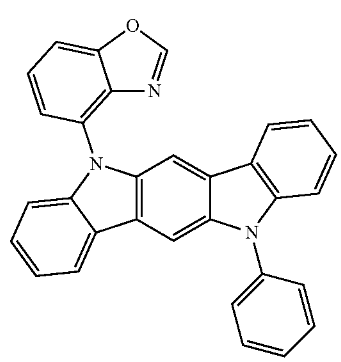

-continued
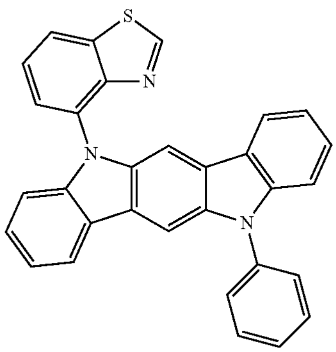
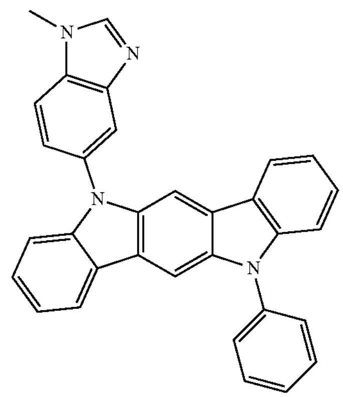
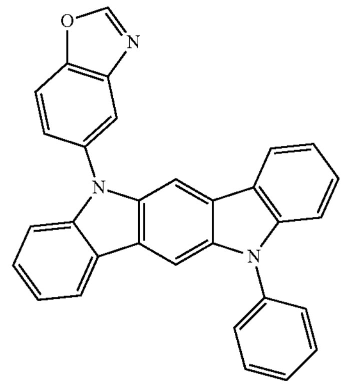
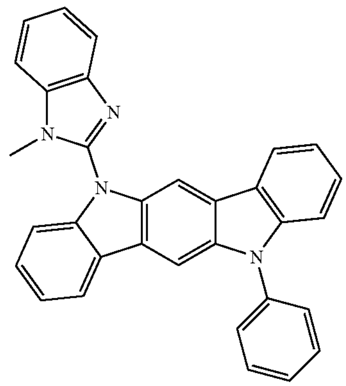
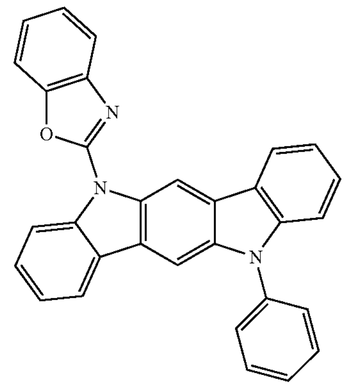
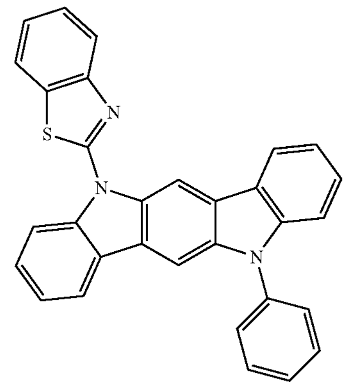
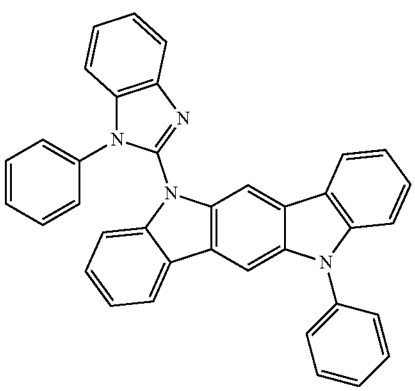
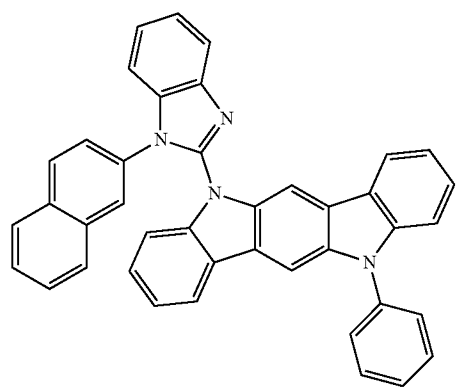
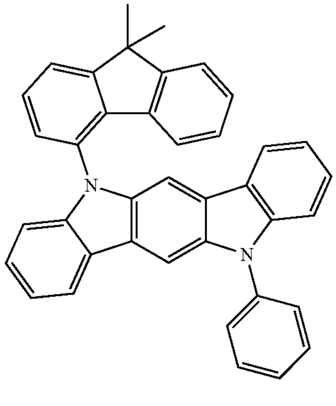
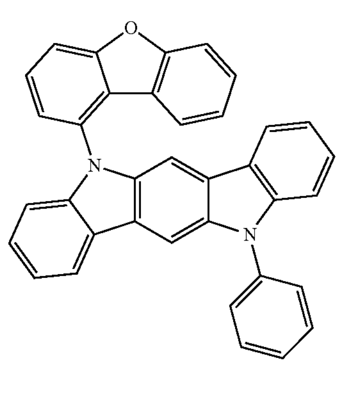
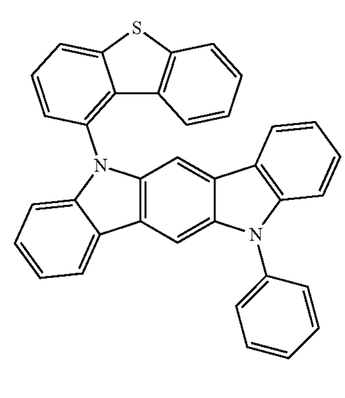

-continued
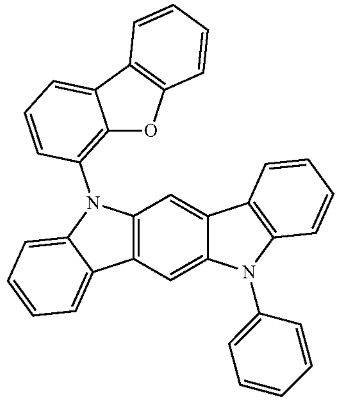
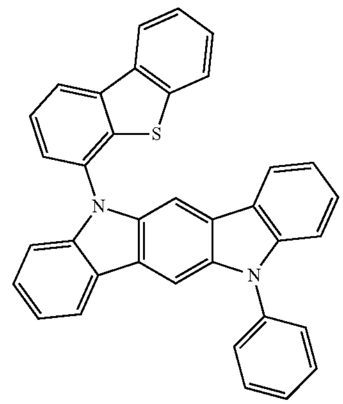
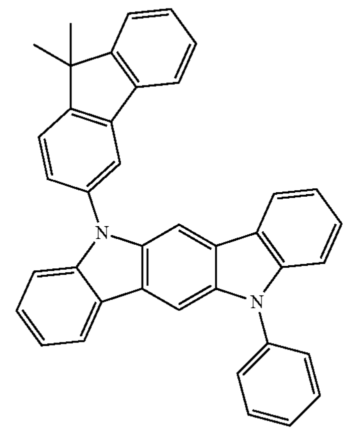
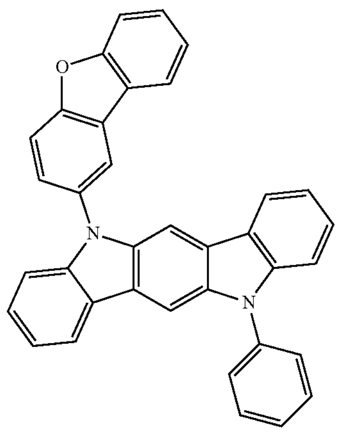
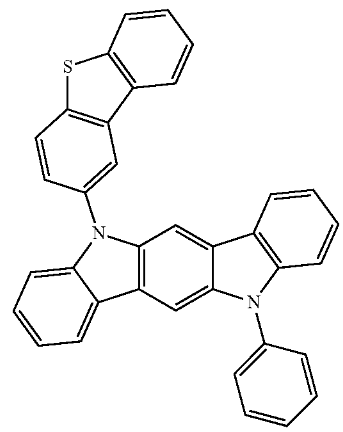
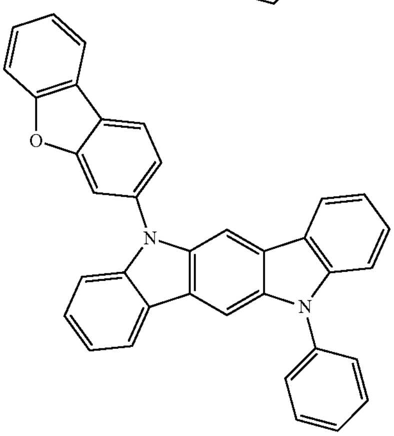
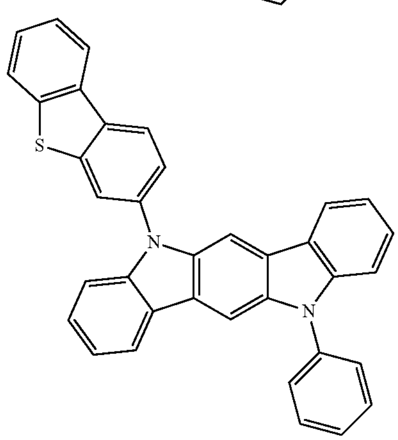
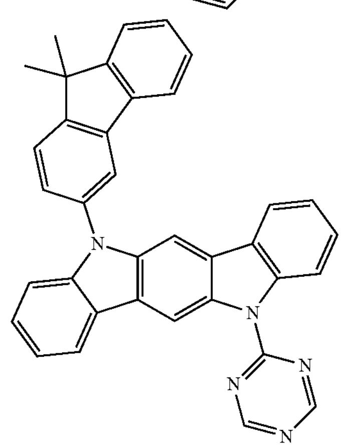
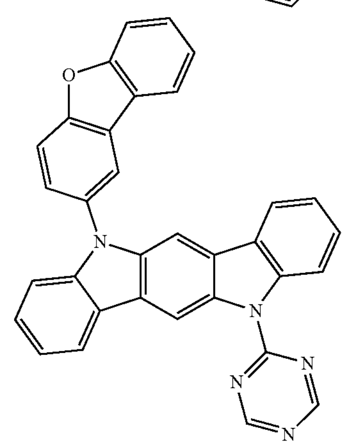
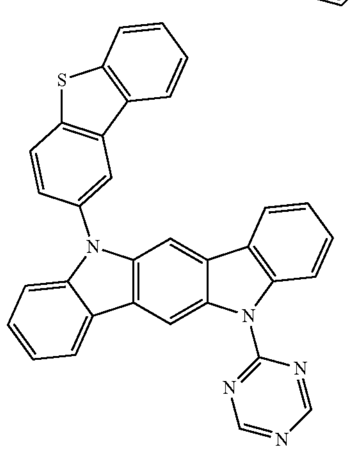
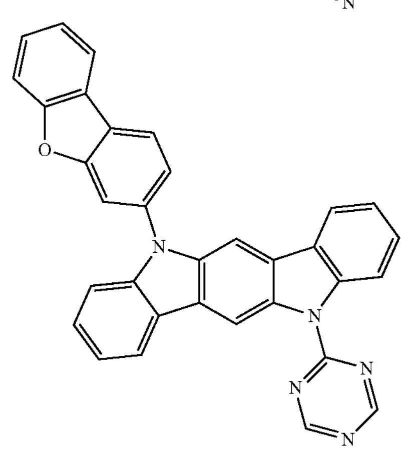

-continued
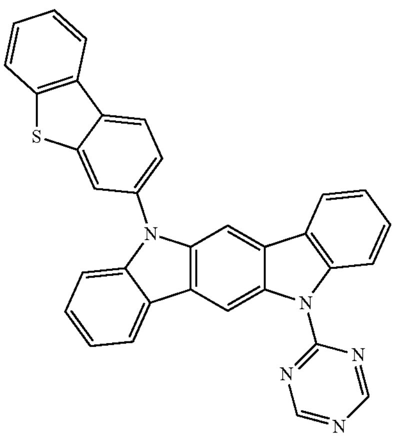
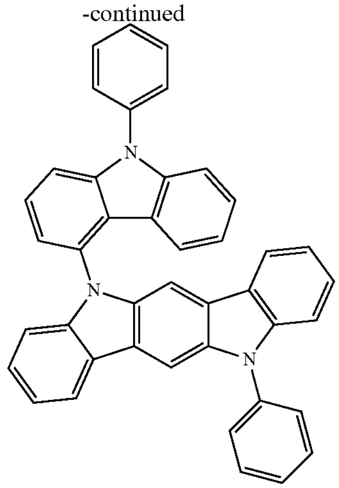
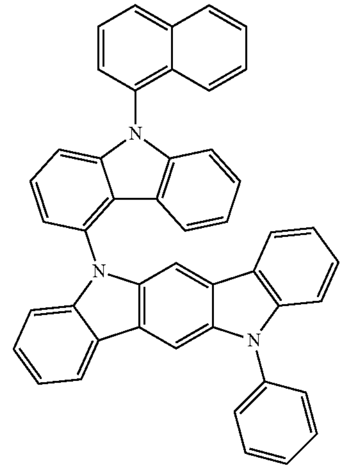
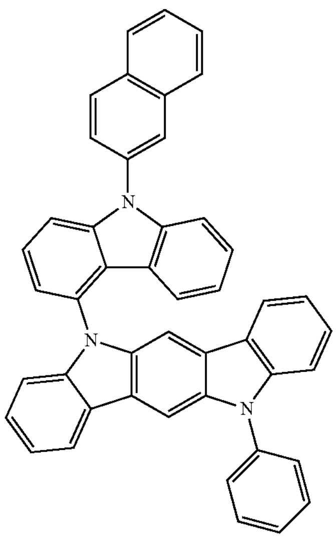
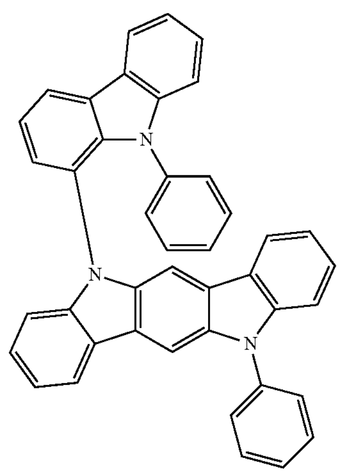
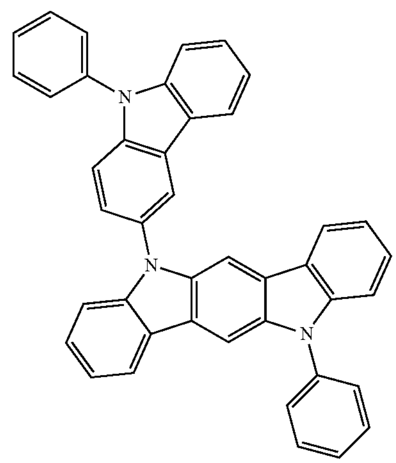
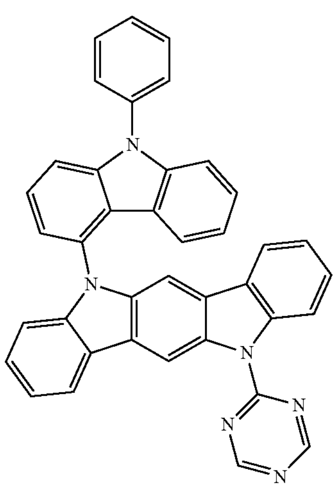
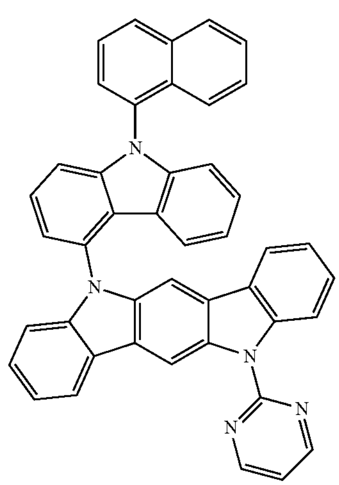
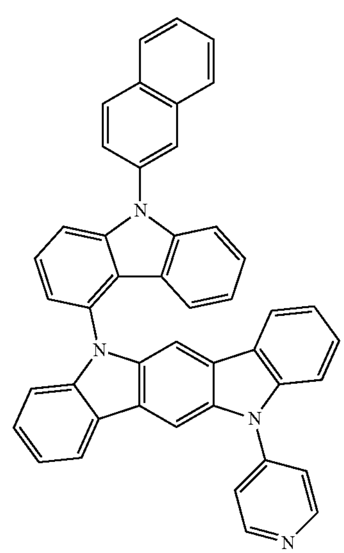

-continued
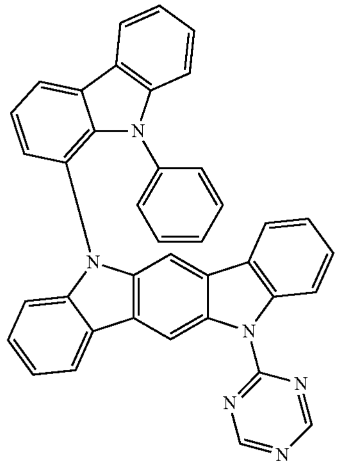
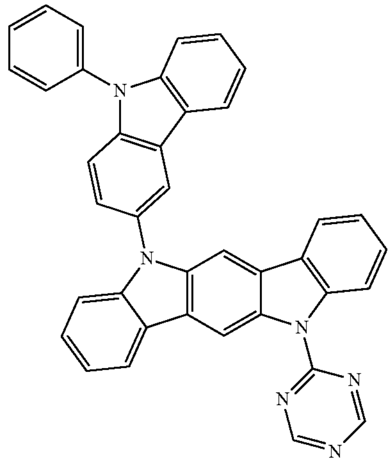
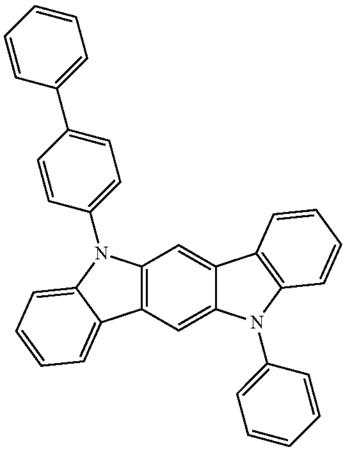
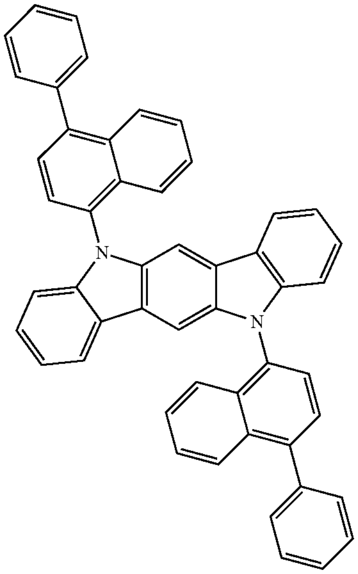
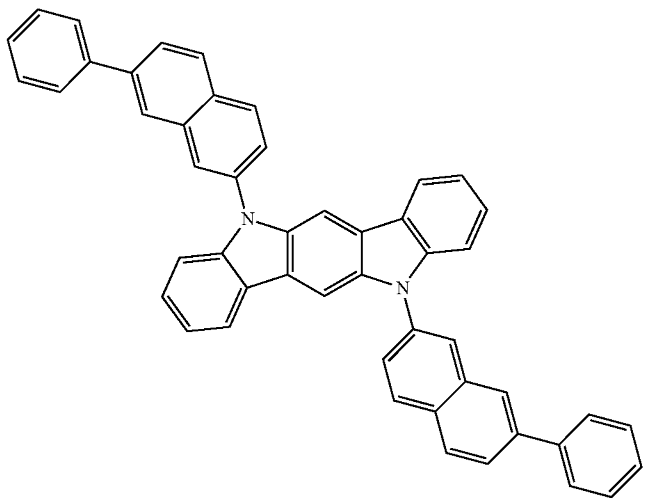
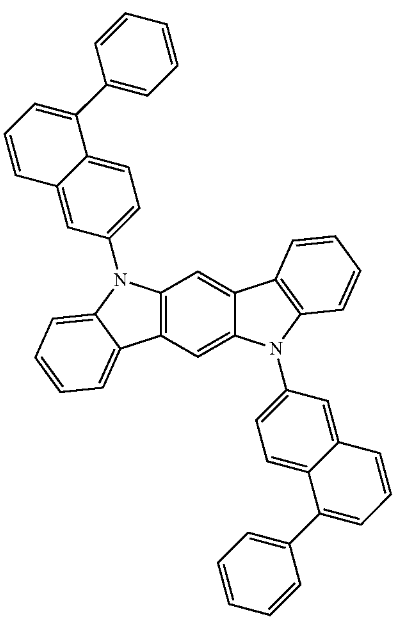
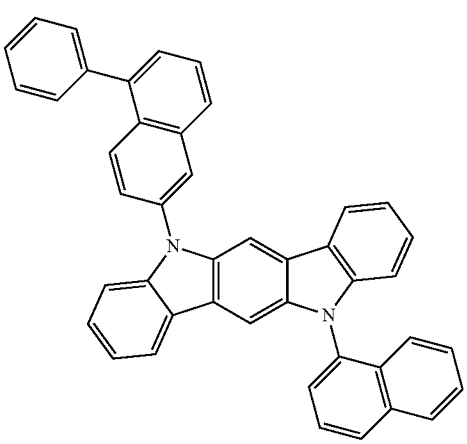

-continued
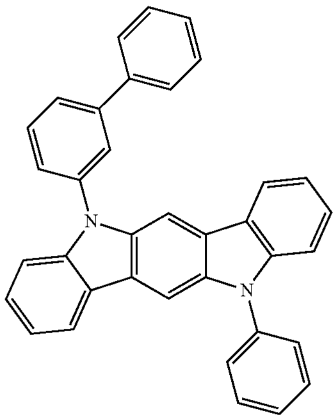
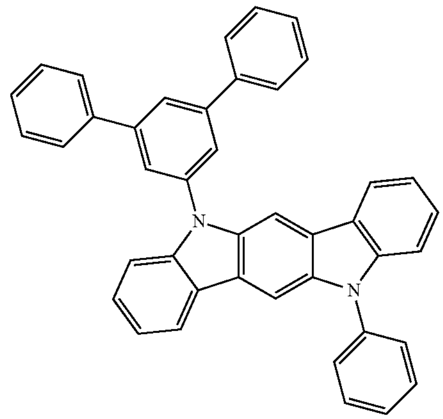
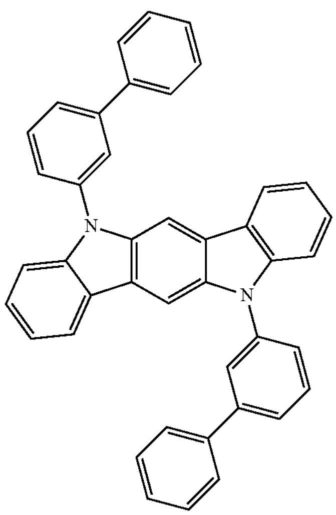
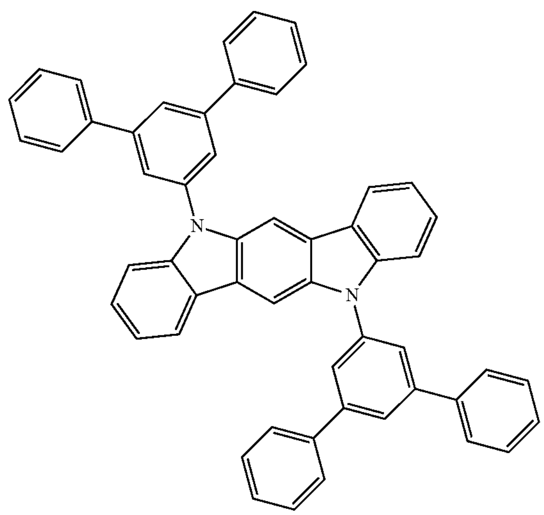
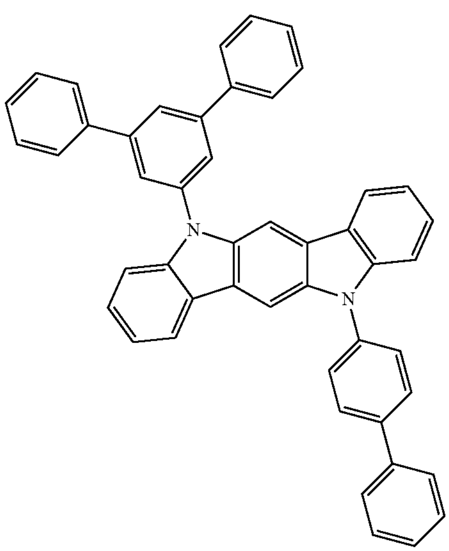
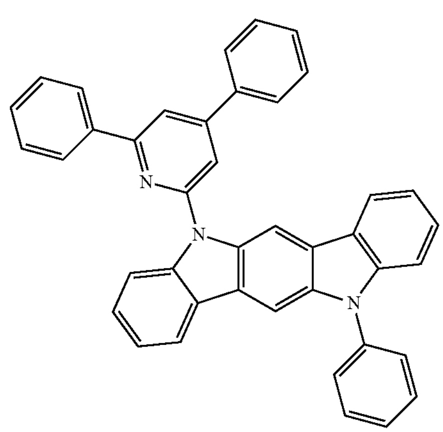

-continued
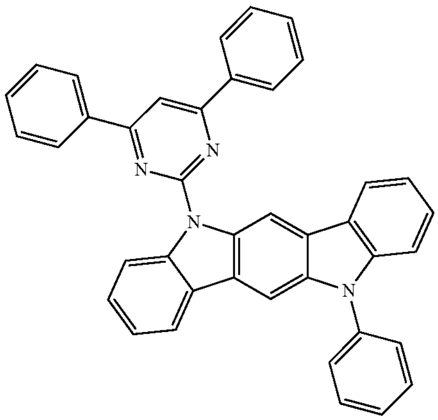
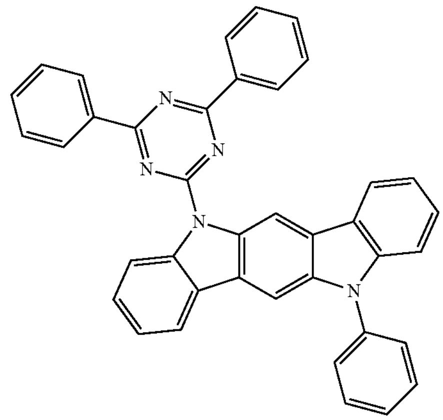
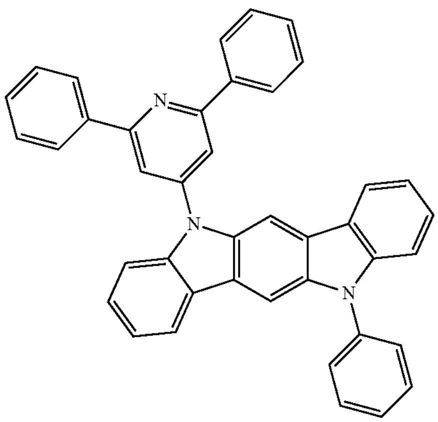
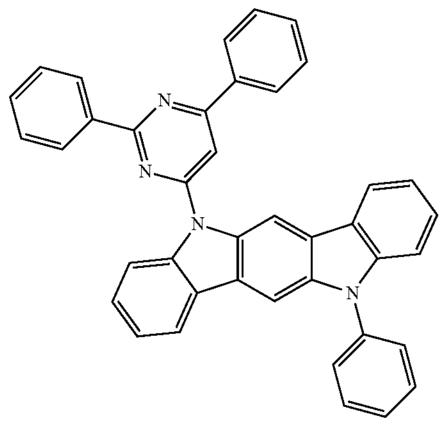
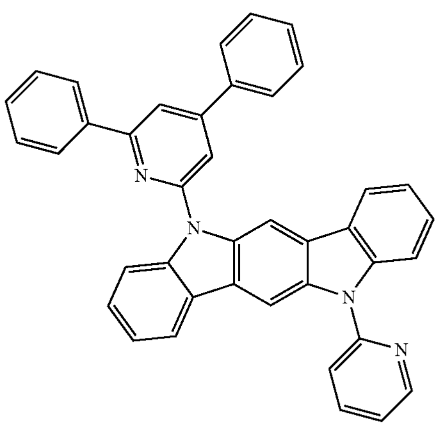
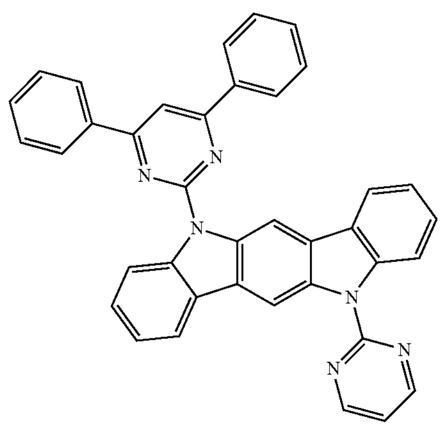
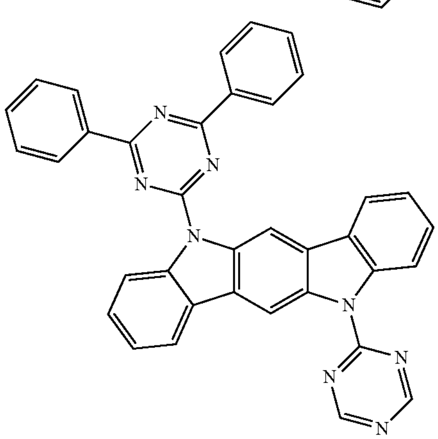
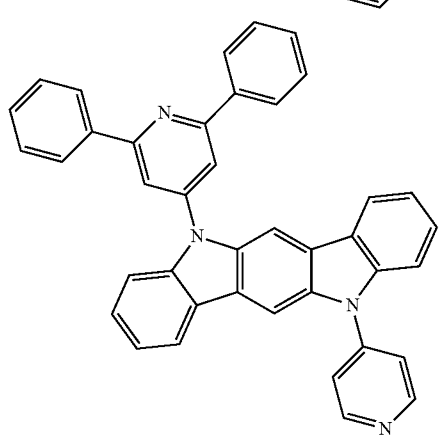

-continued
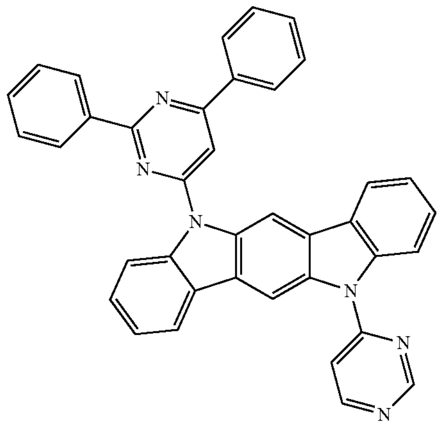
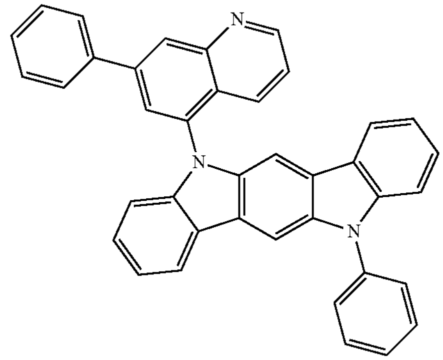
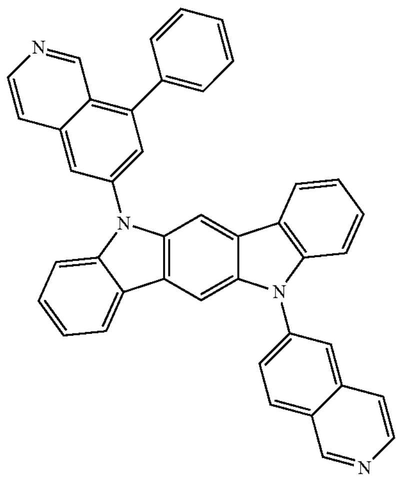
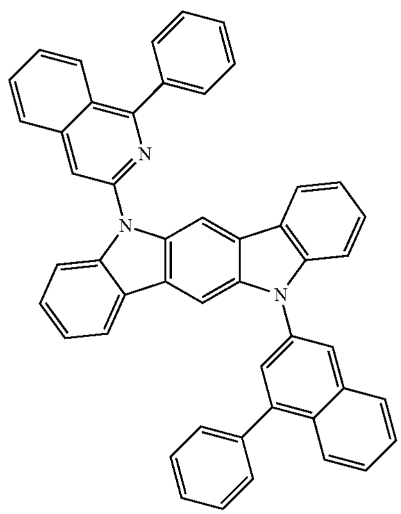
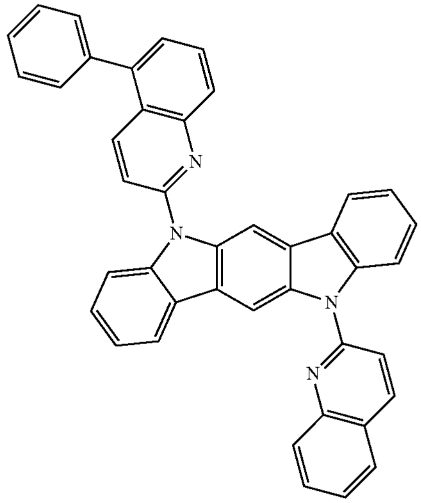
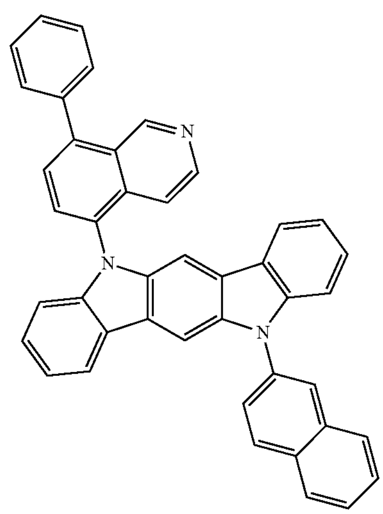

-continued
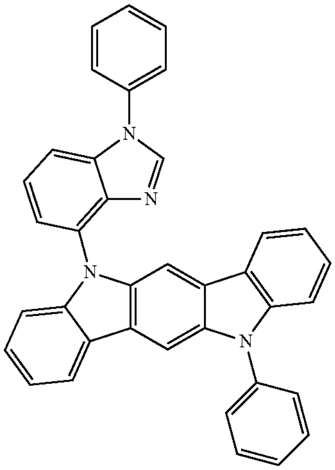
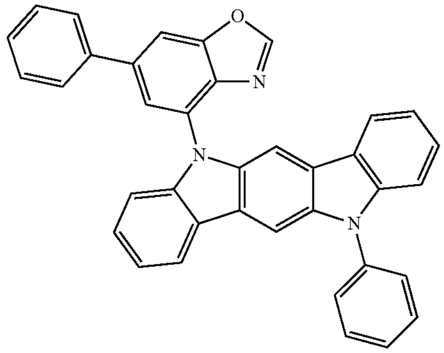
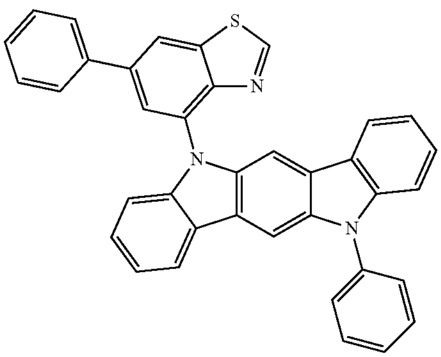
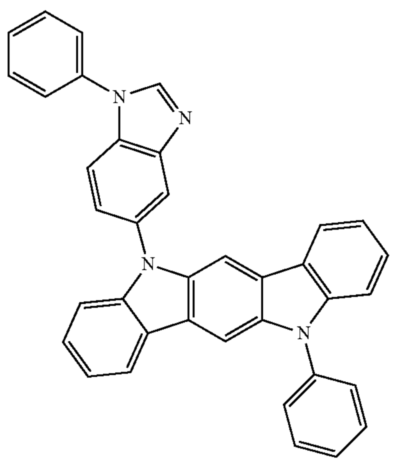
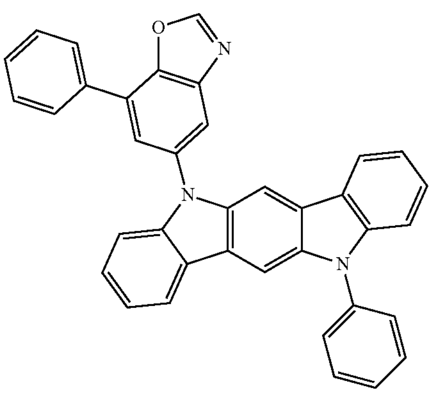
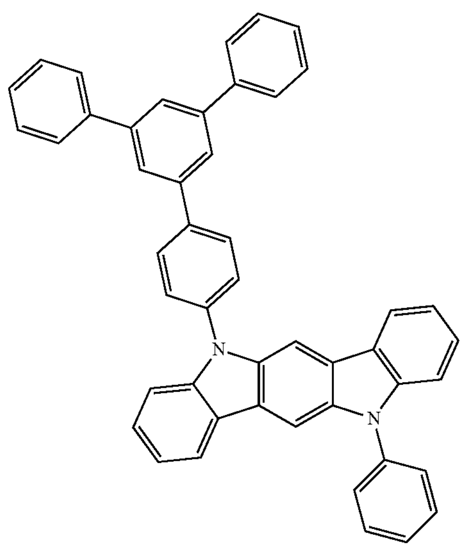

-continued
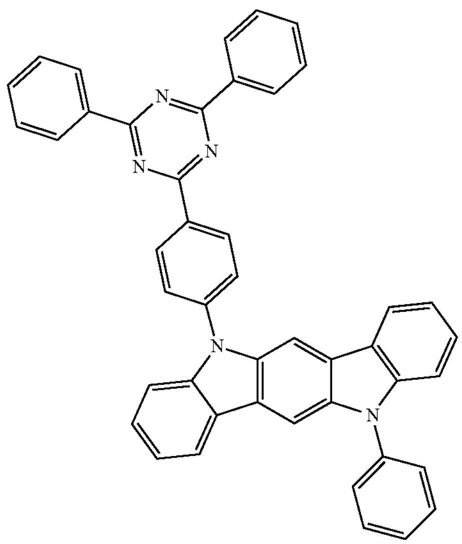
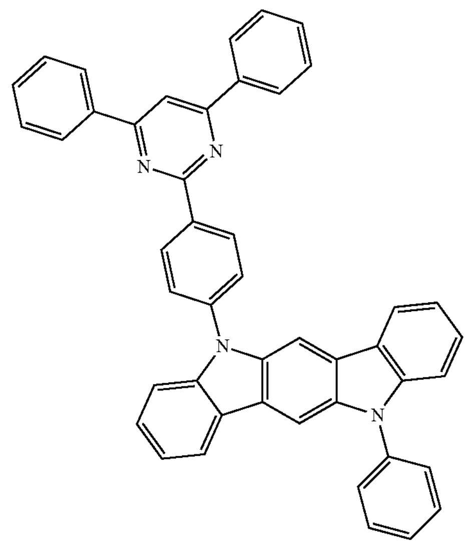
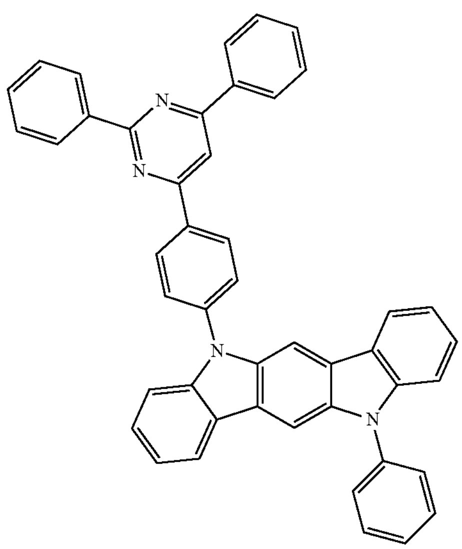
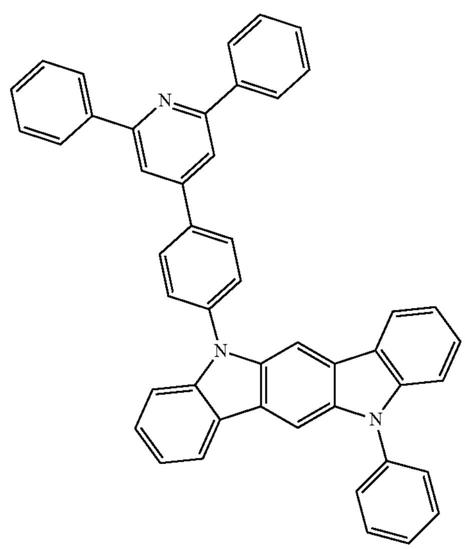
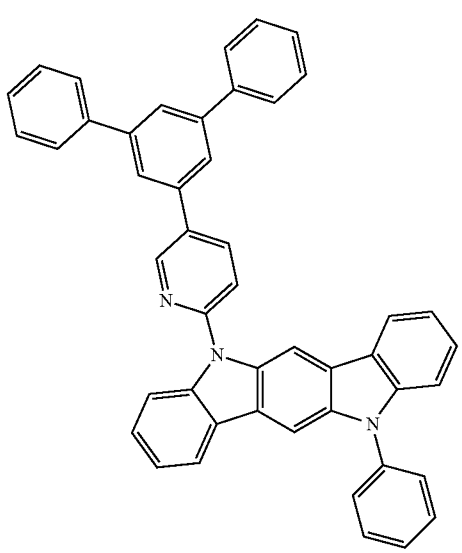
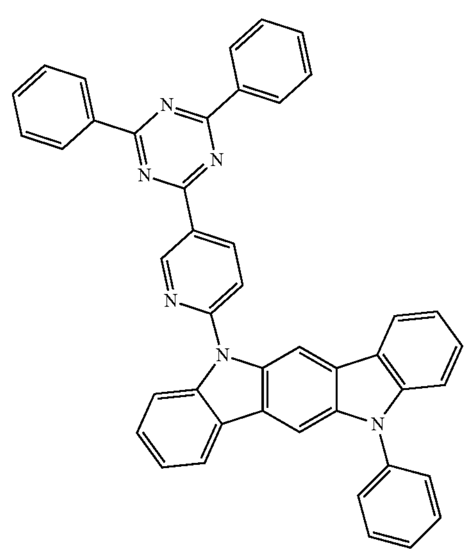

-continued
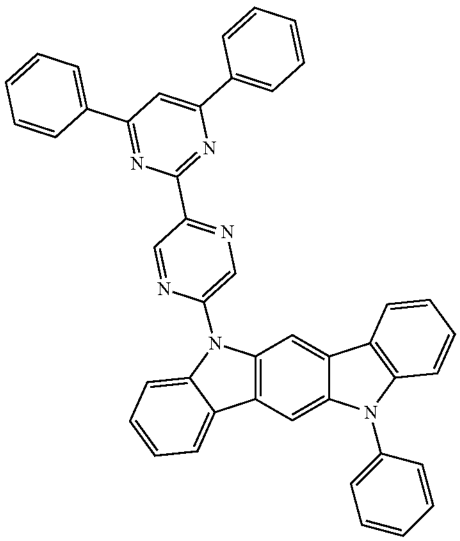
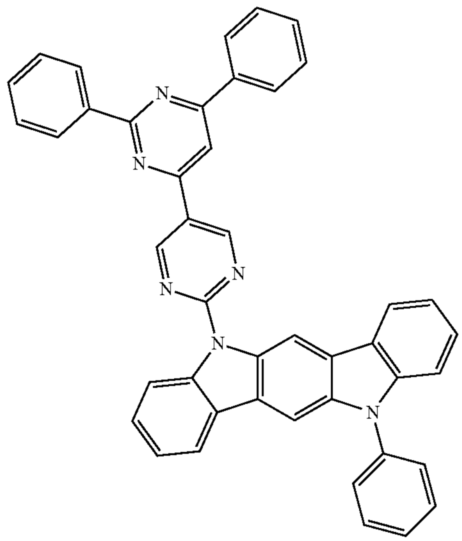
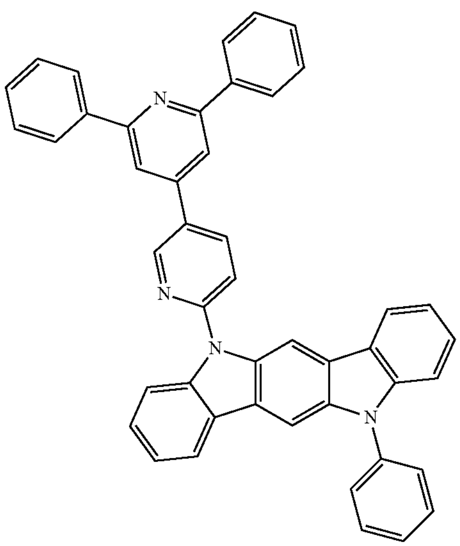
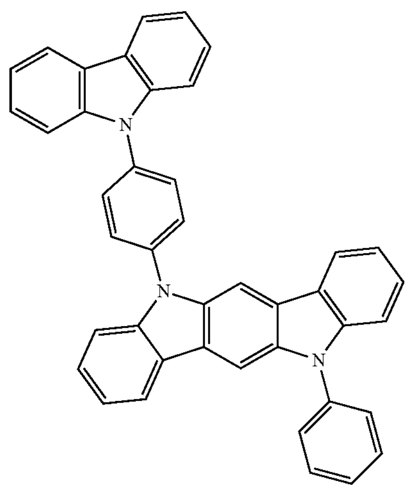
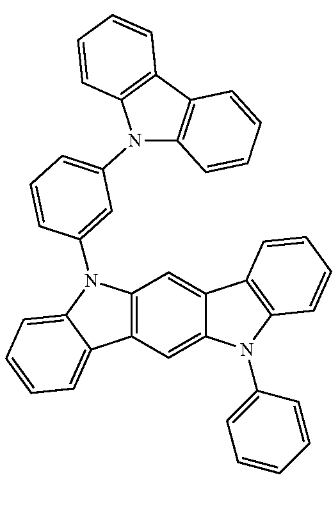
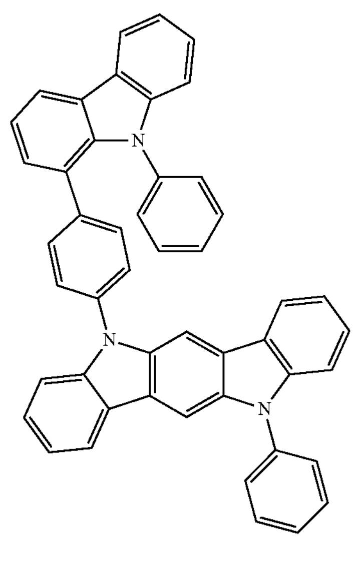
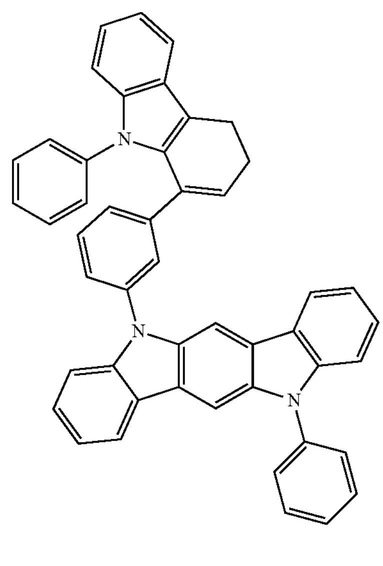

-continued
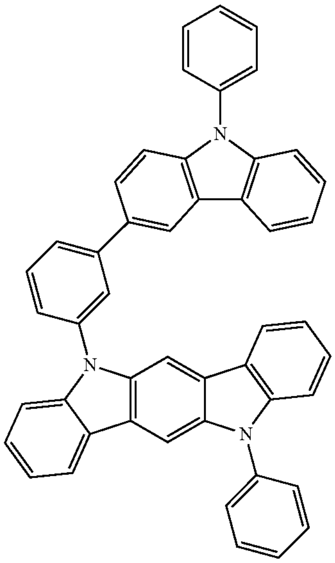
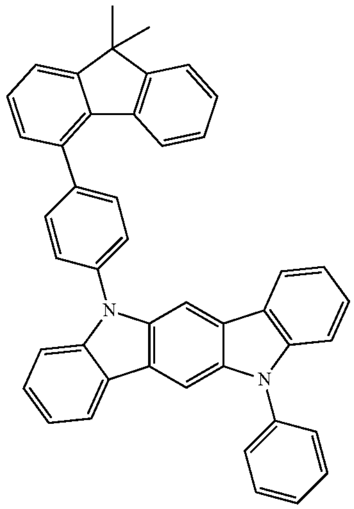
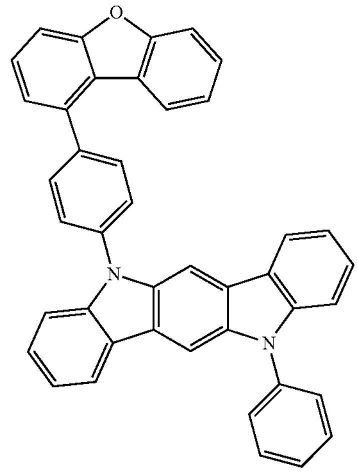
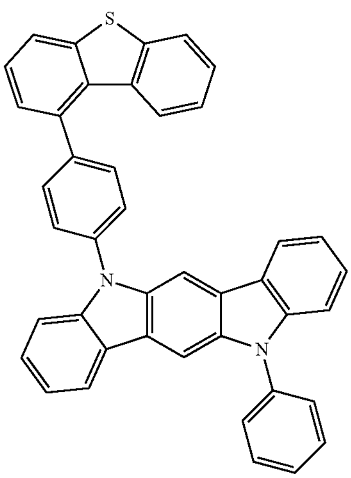
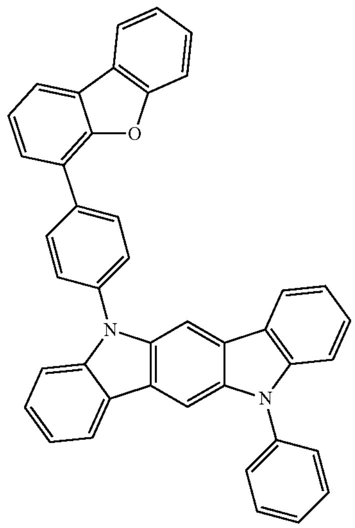
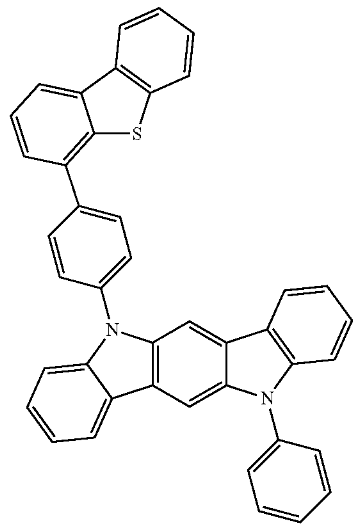
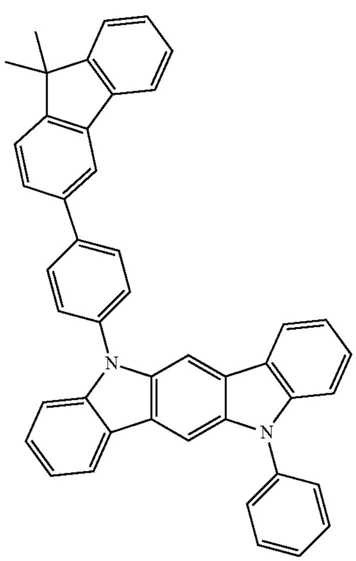
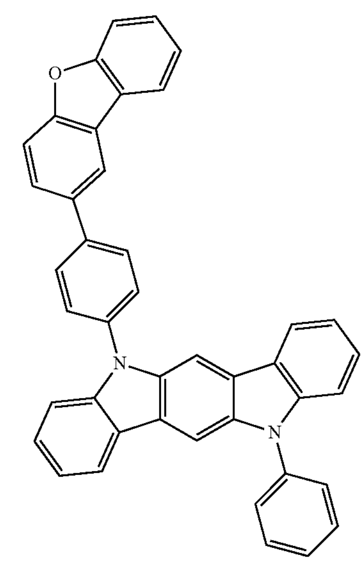
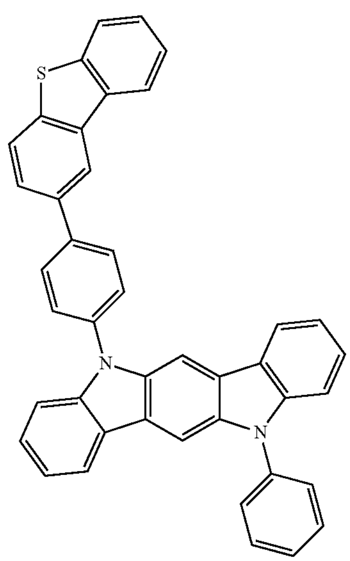

-continued
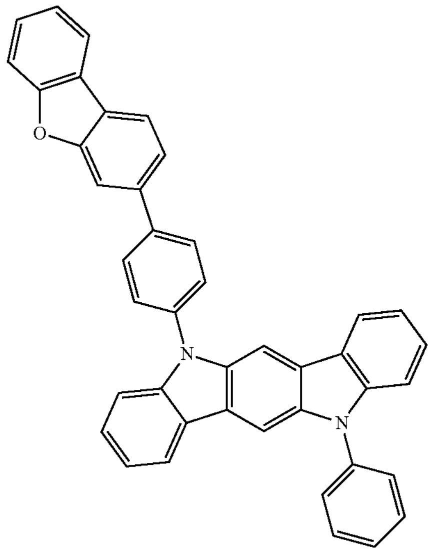
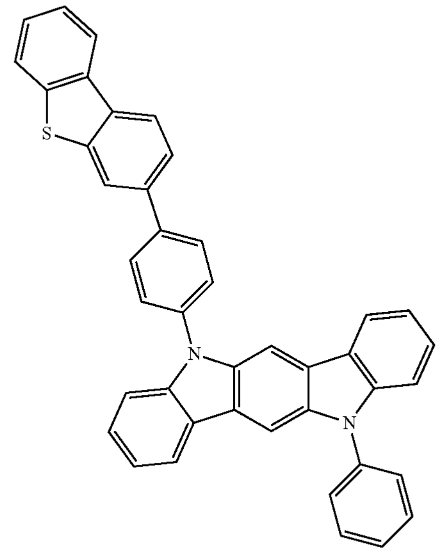
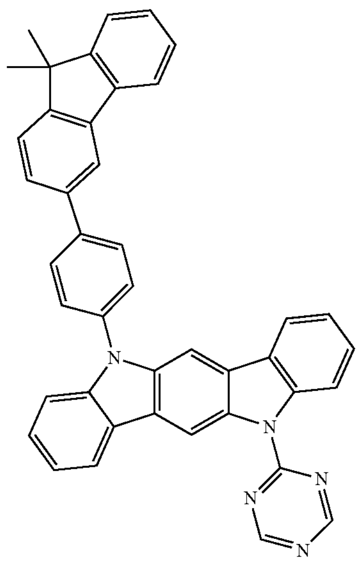
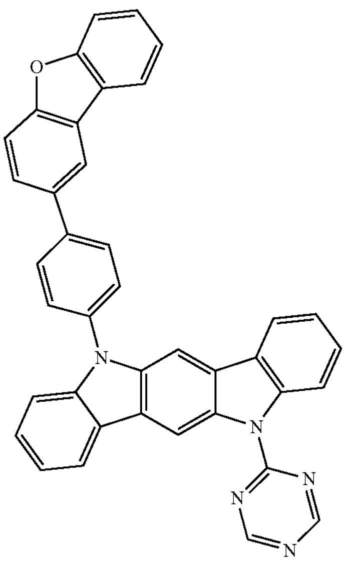
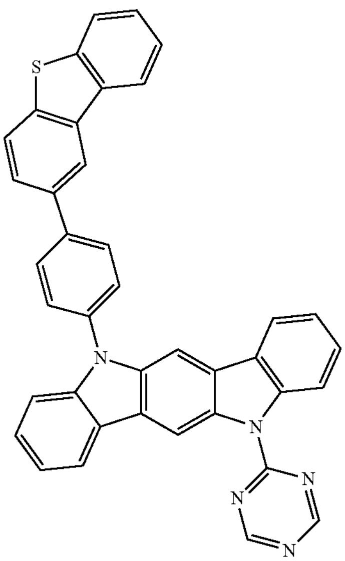
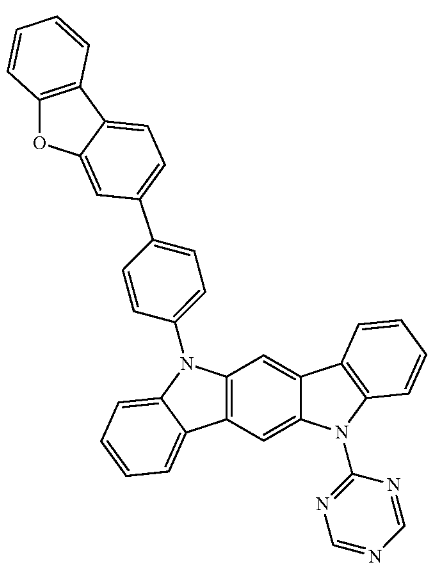
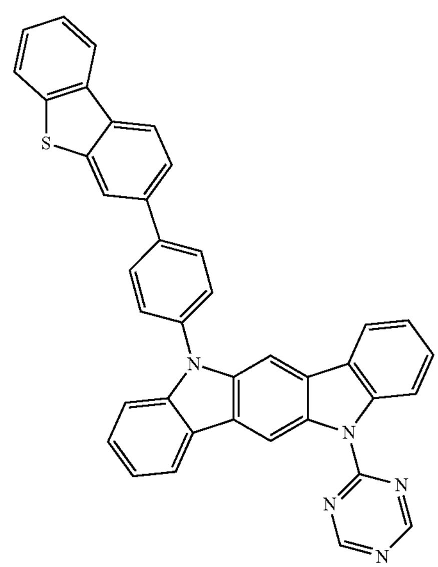

-continued
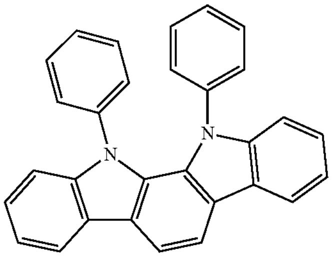
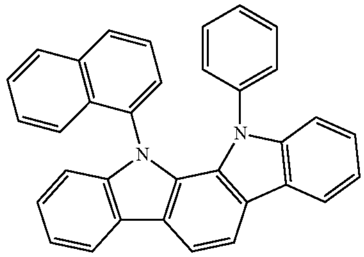
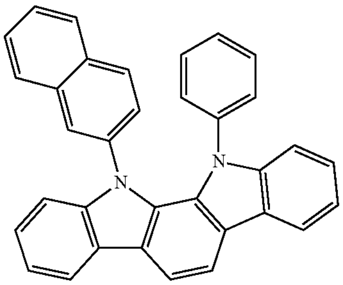
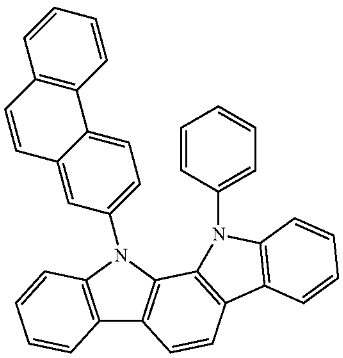
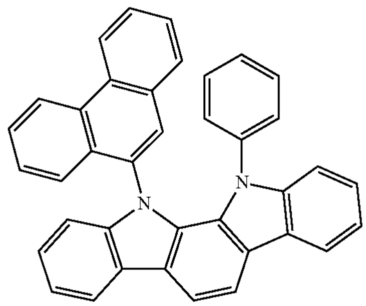
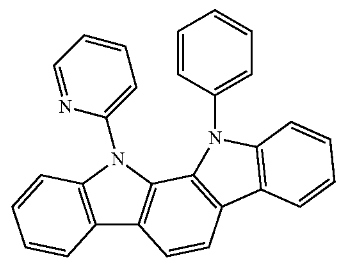
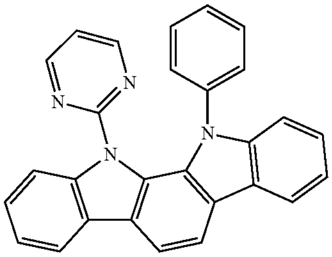
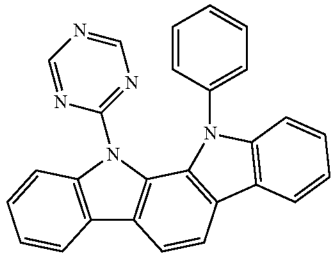
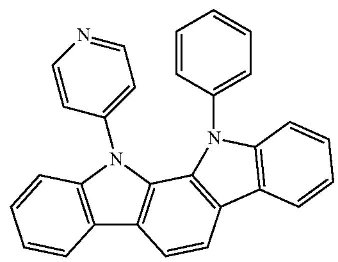
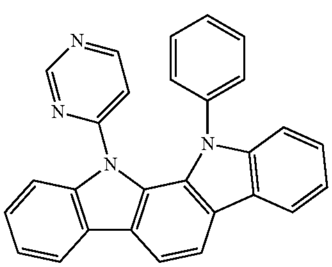
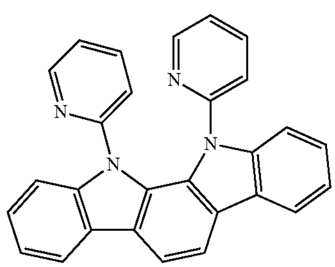
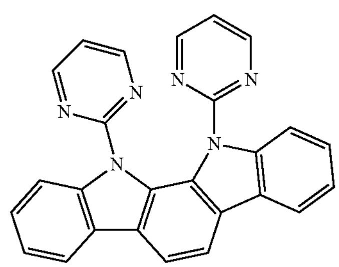
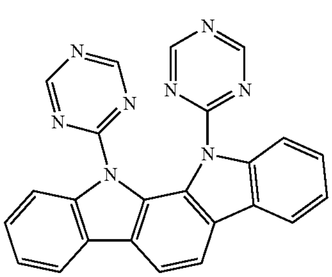
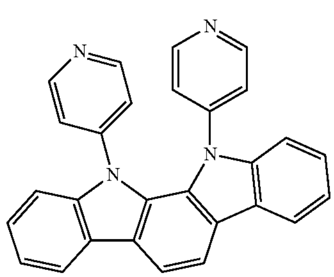
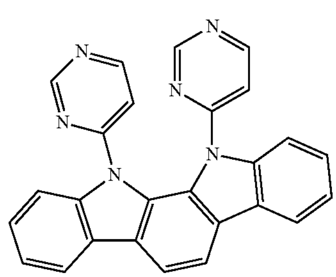

-continued
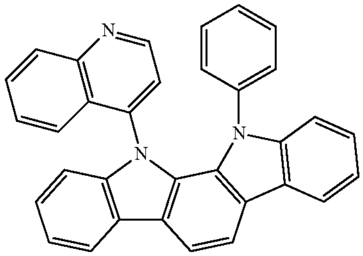
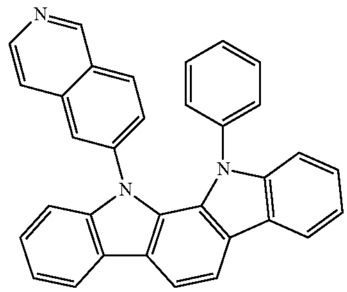
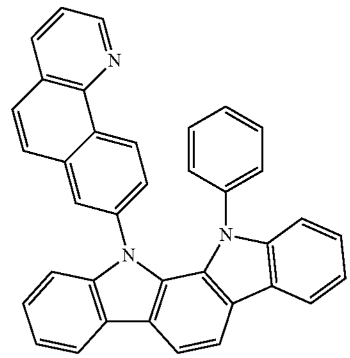
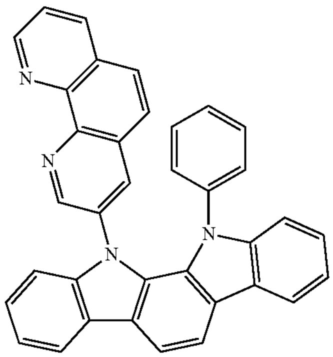
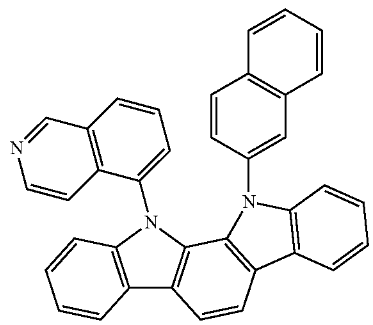
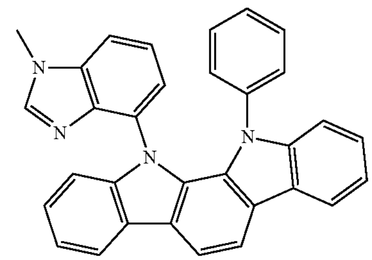
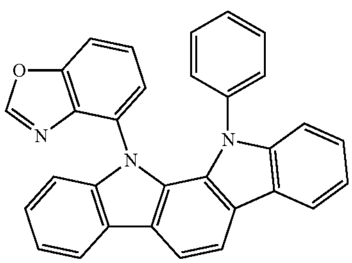
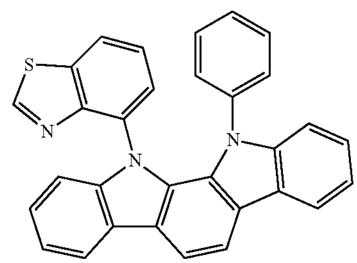
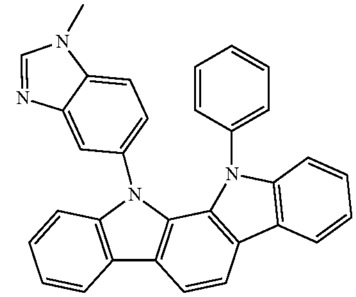
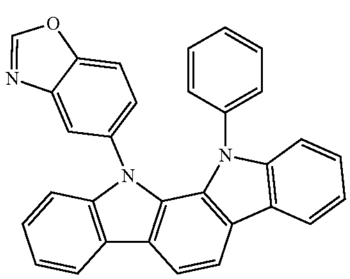
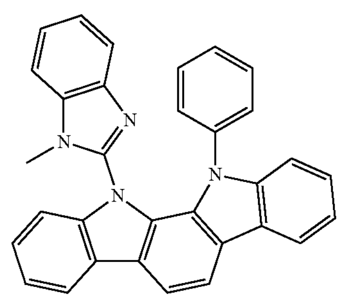
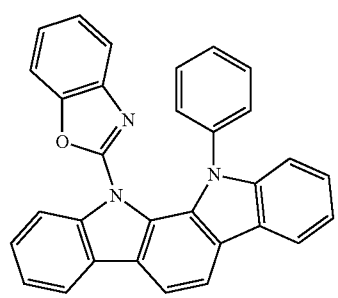
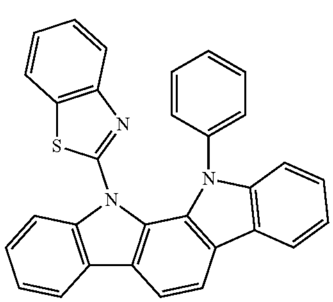
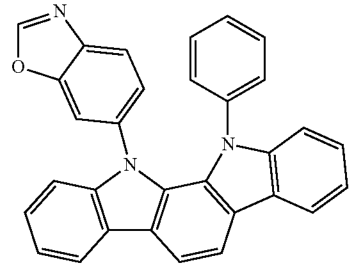
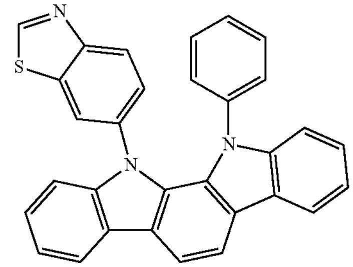

-continued
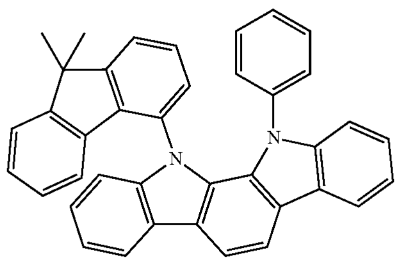
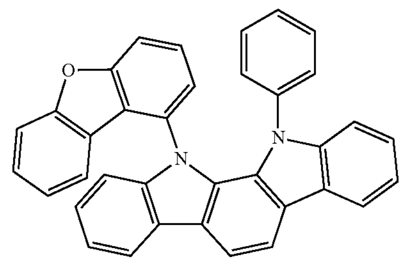
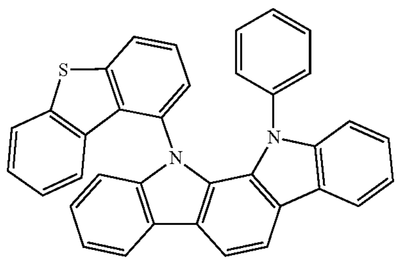
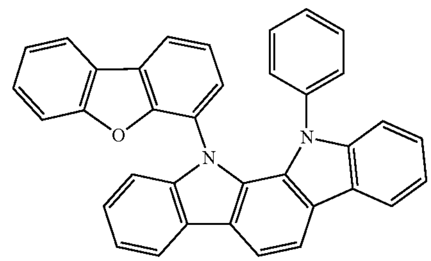
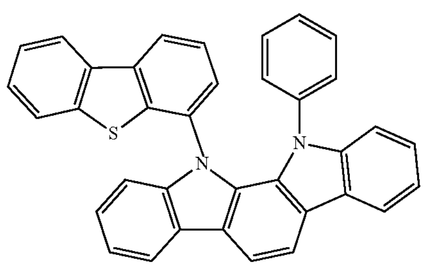
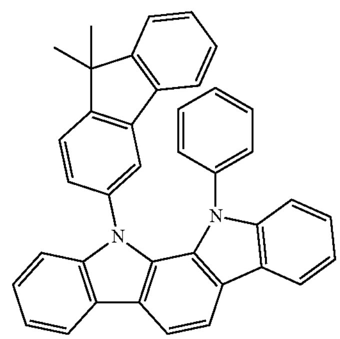
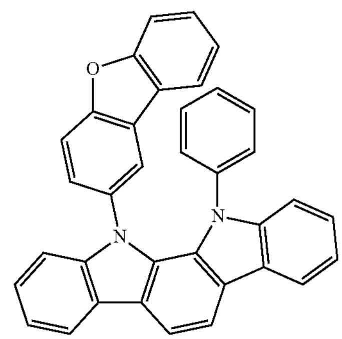
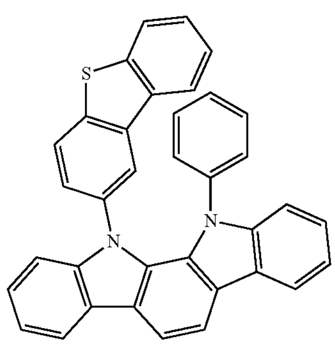
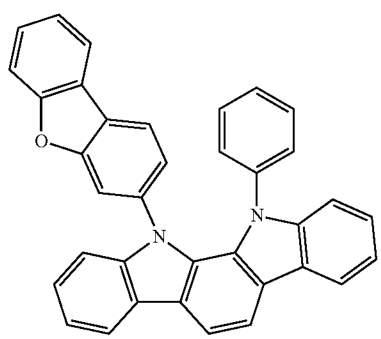
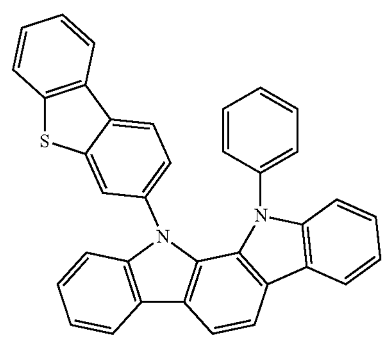
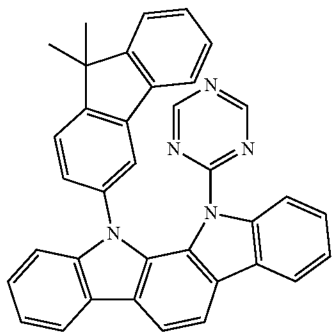
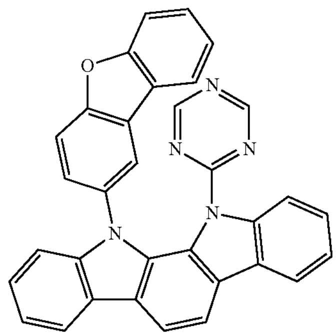
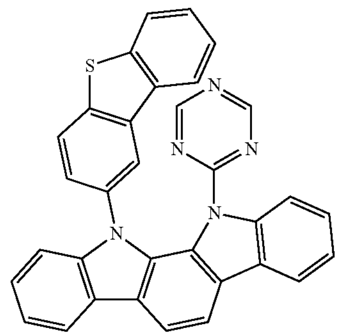

-continued
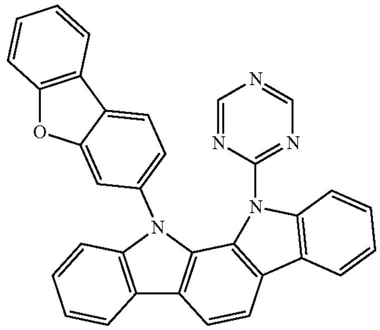
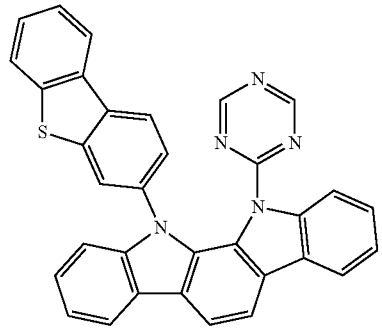
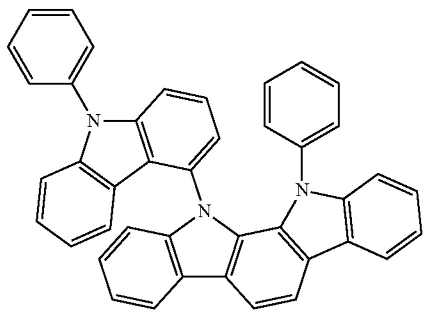
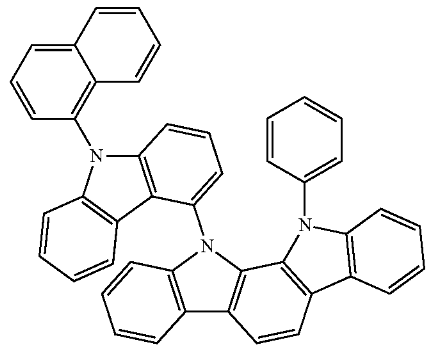
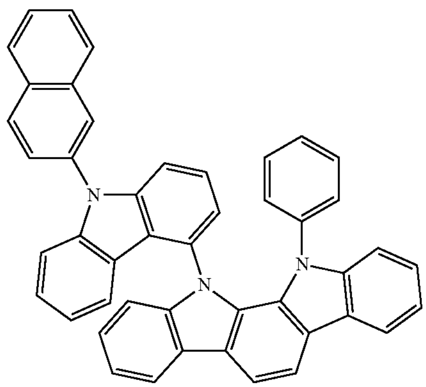
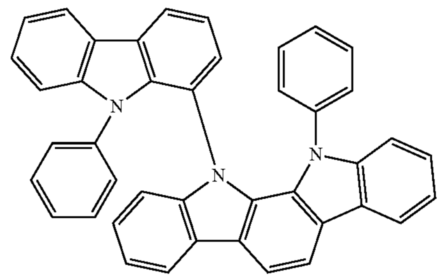
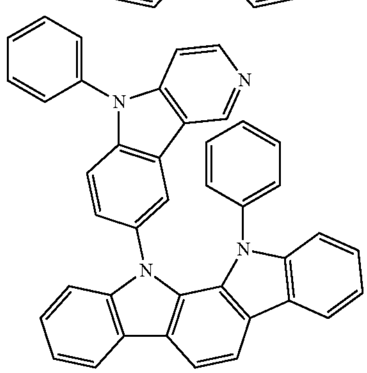
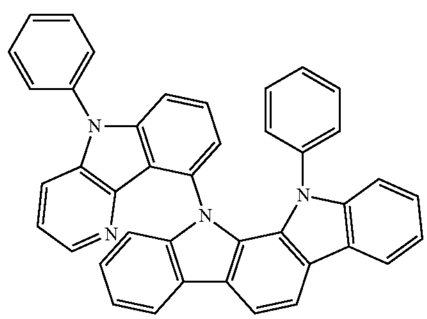
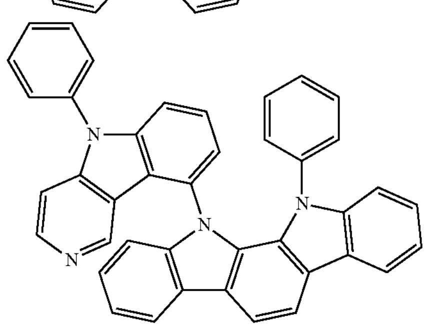
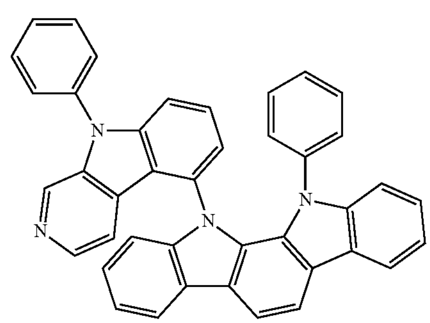

-continued
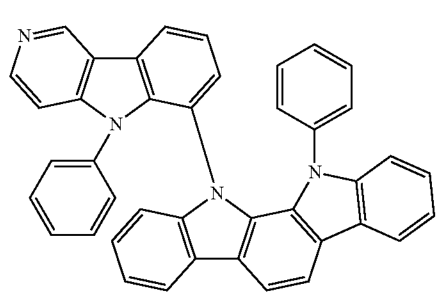
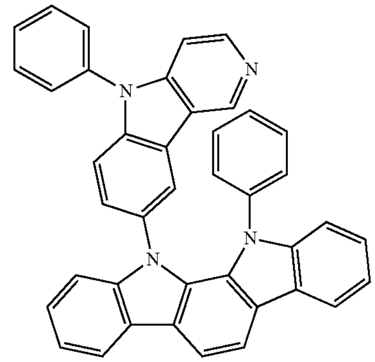
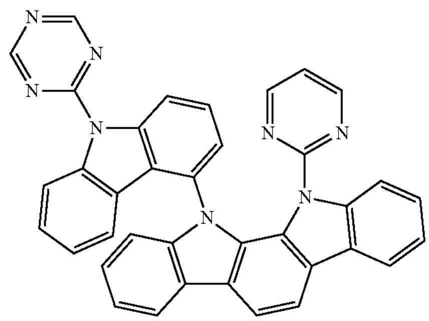
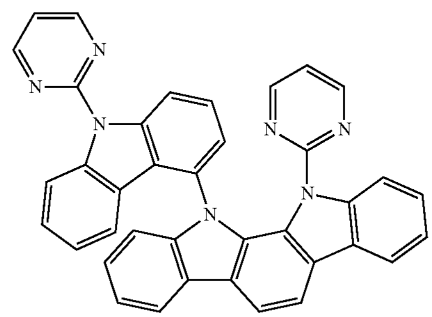
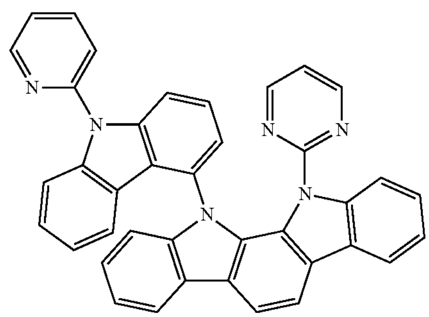
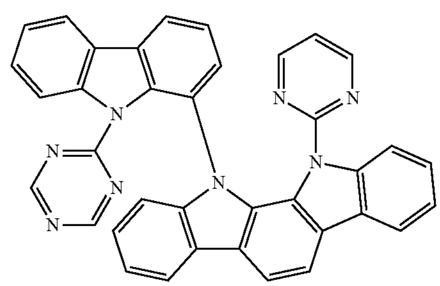
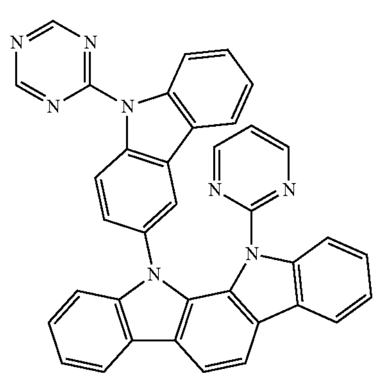

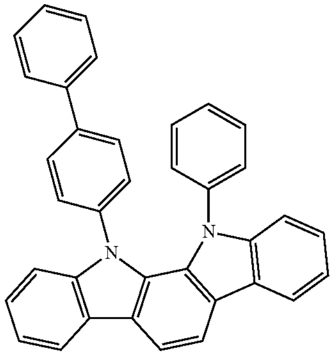
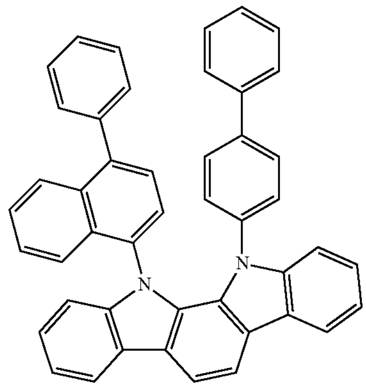
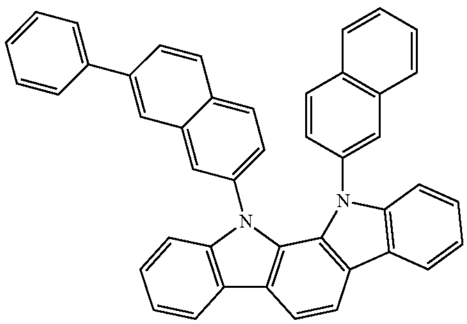
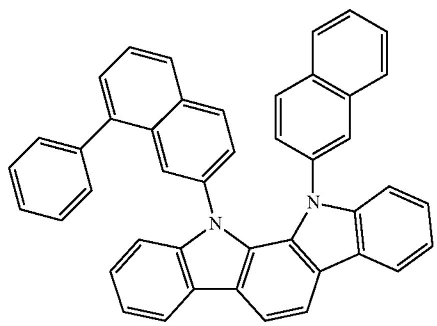
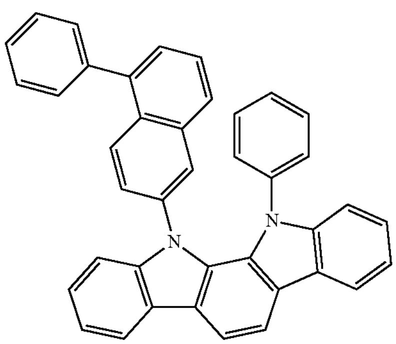
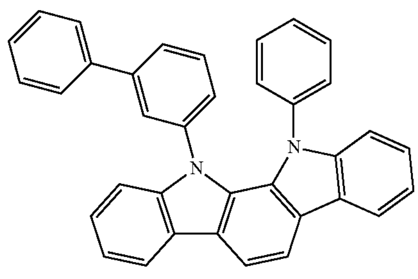
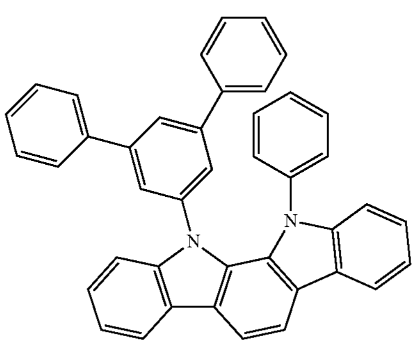
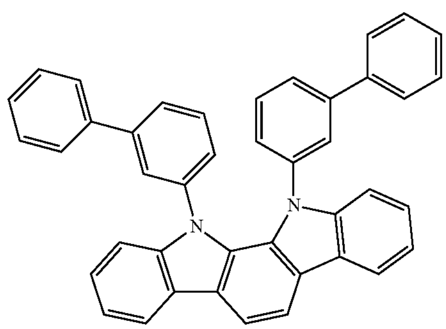

-continued
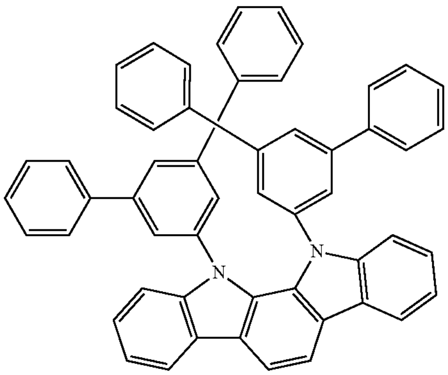
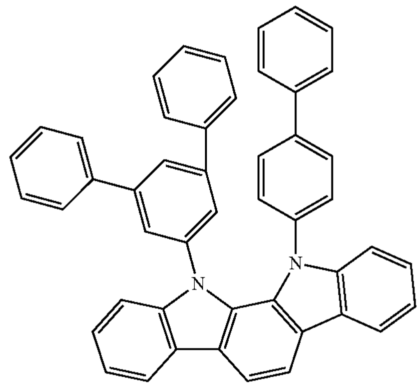
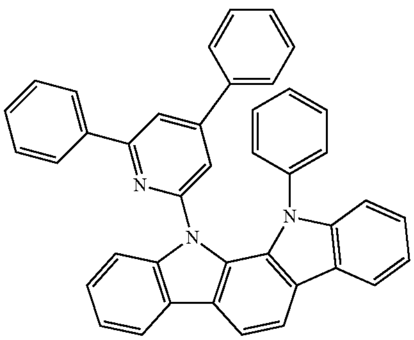
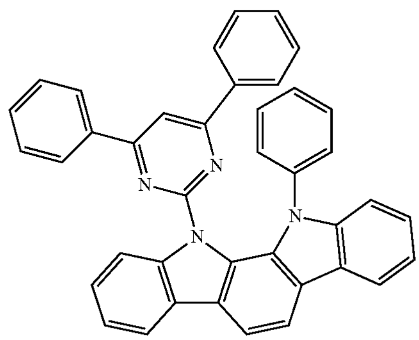
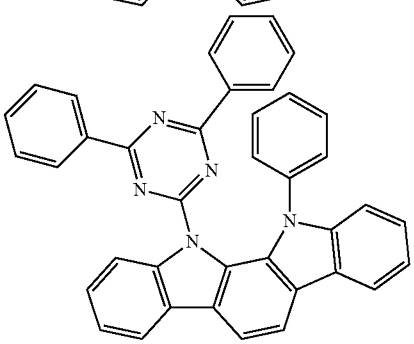
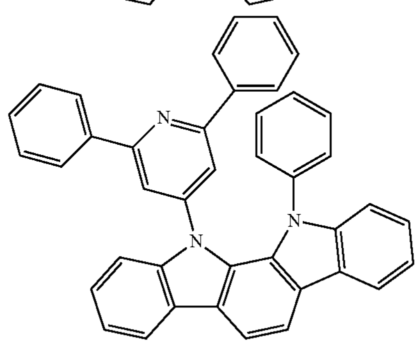
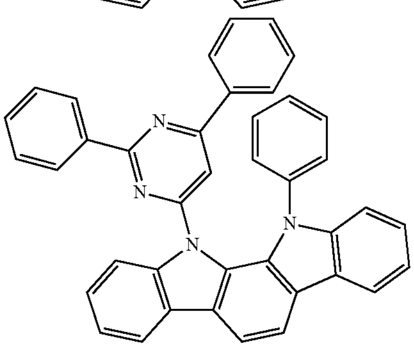
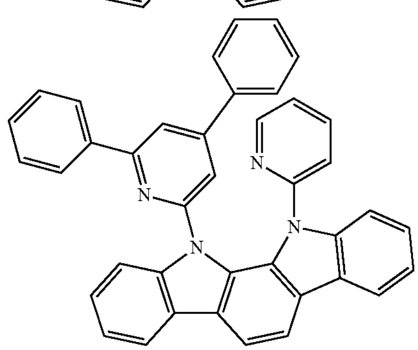
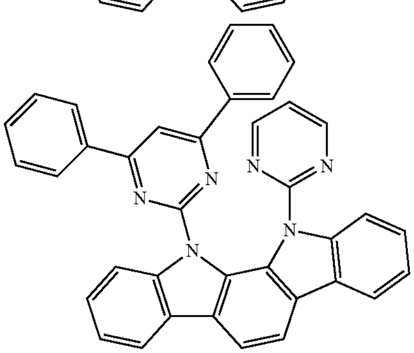
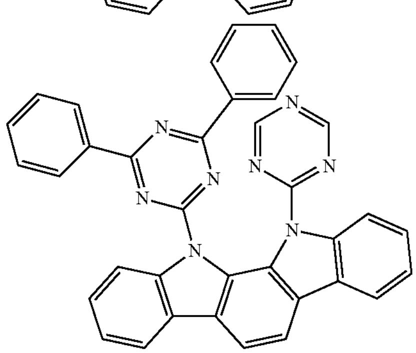

-continued
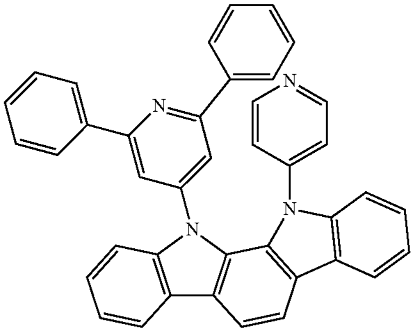
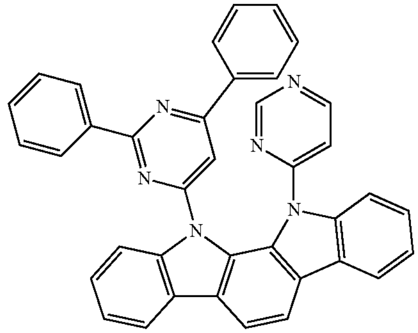
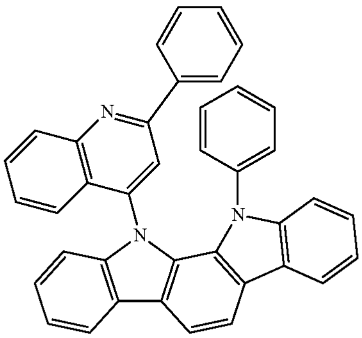
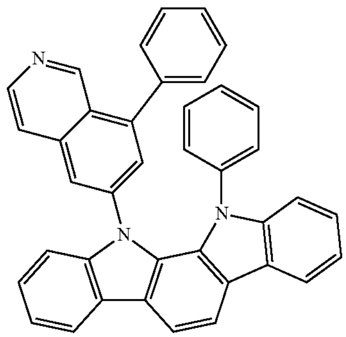
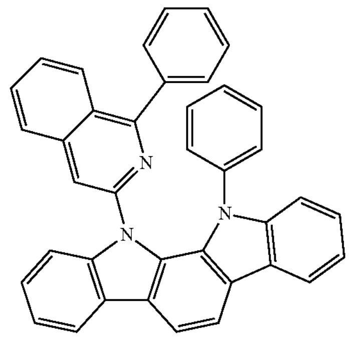
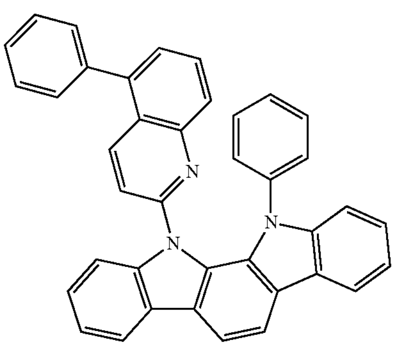
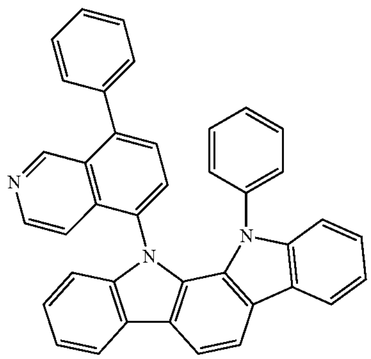
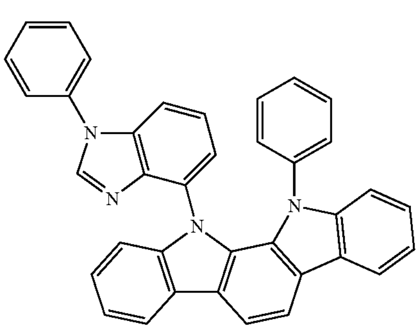
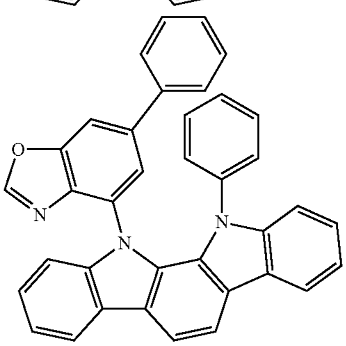
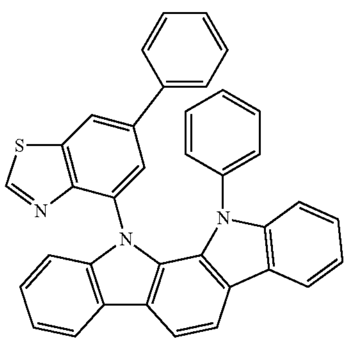
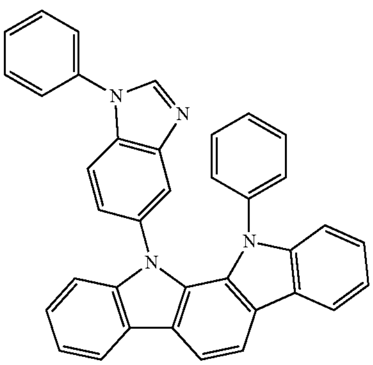
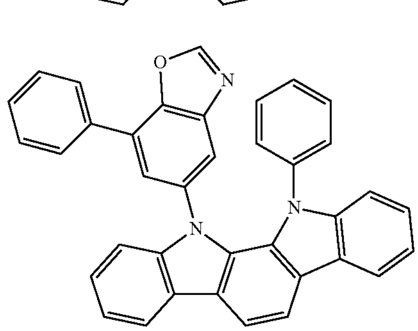

-continued
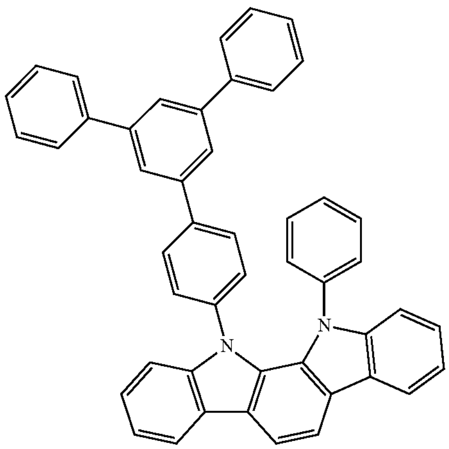
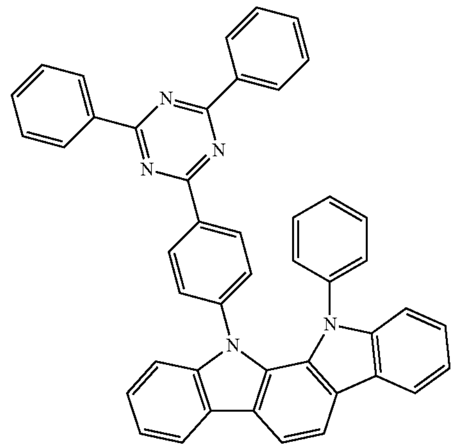
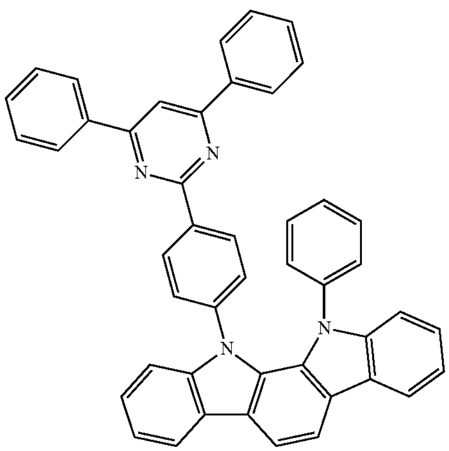
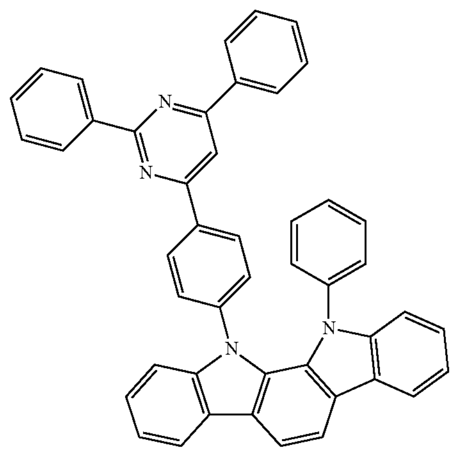
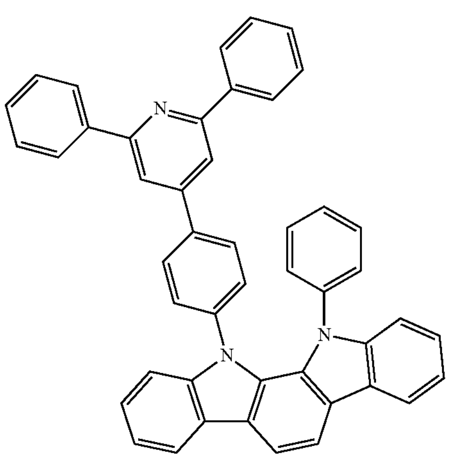
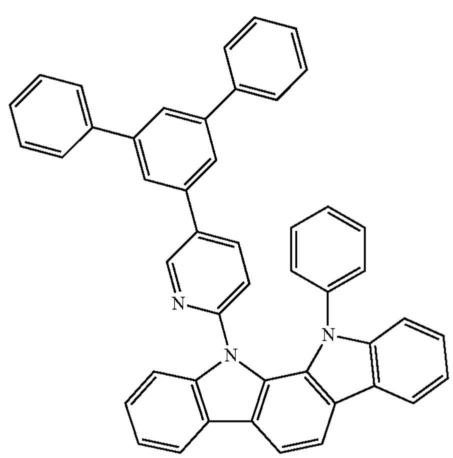

-continued
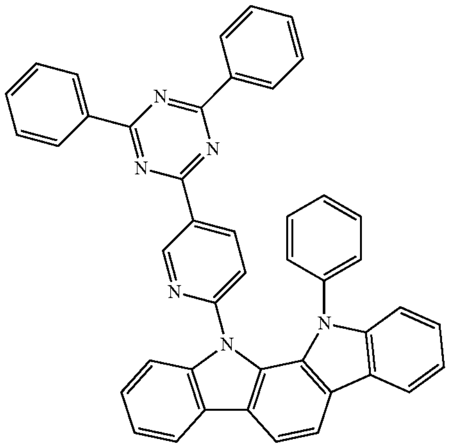
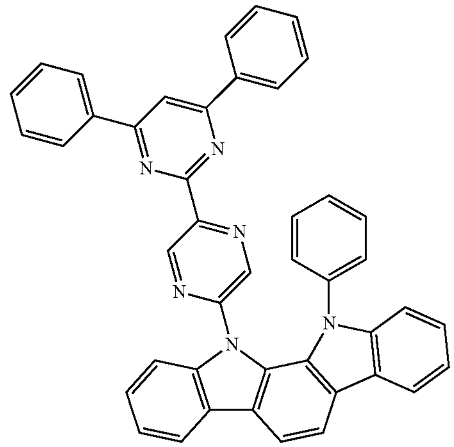
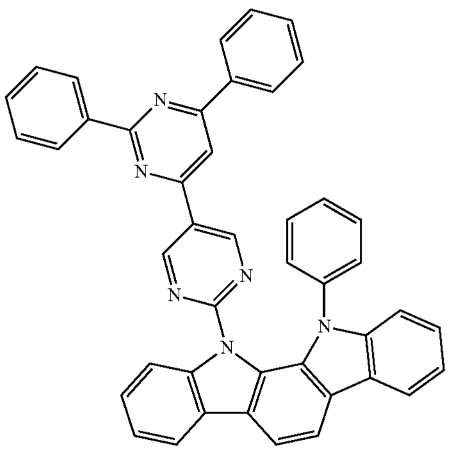
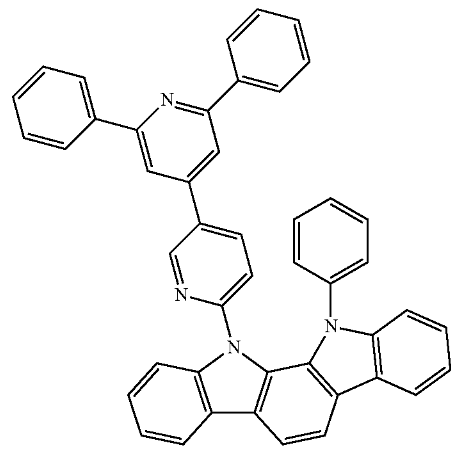
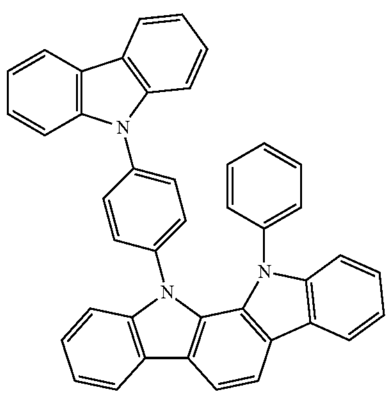
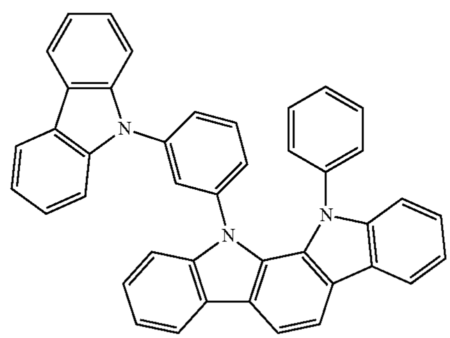
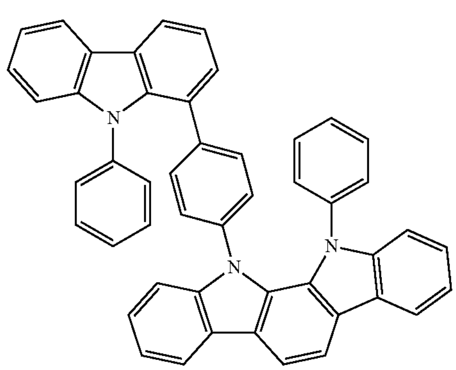
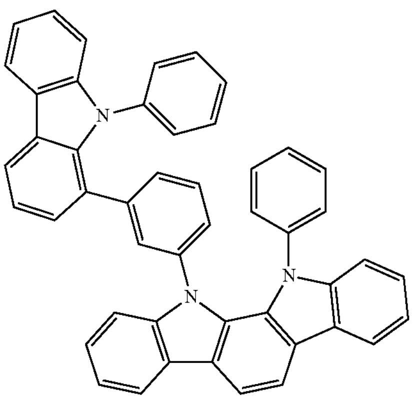

-continued
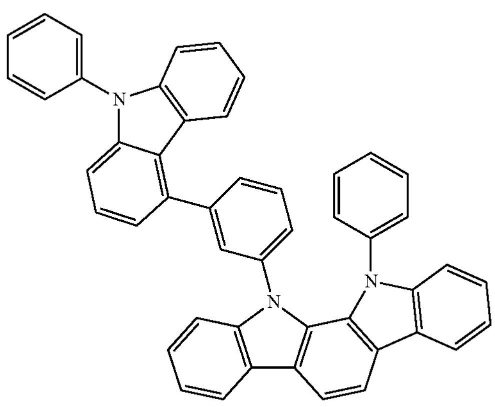
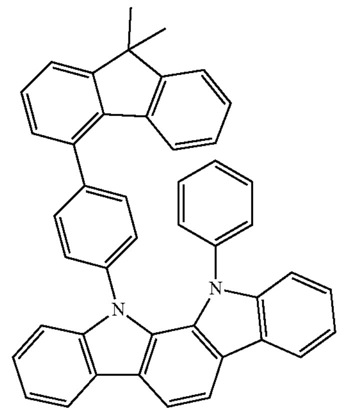
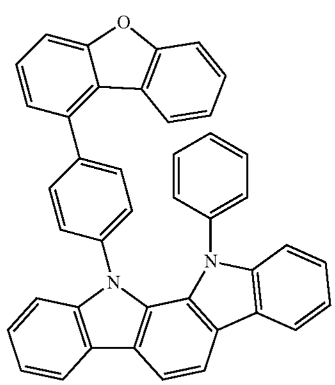
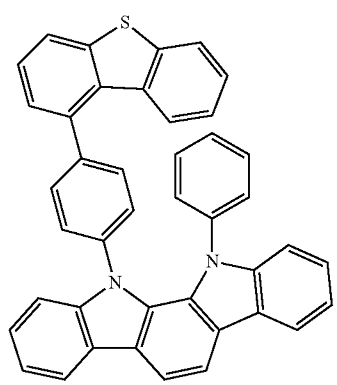
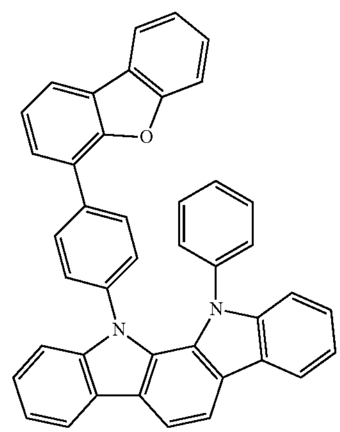
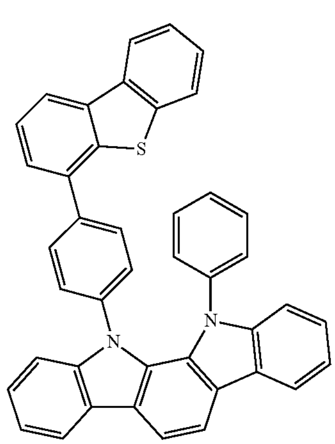
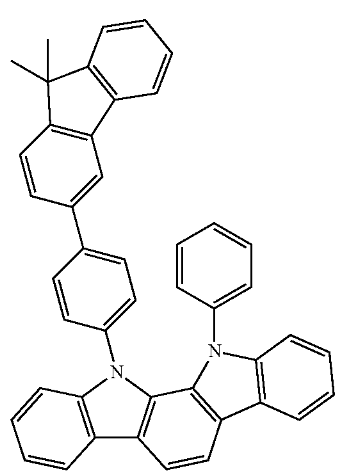
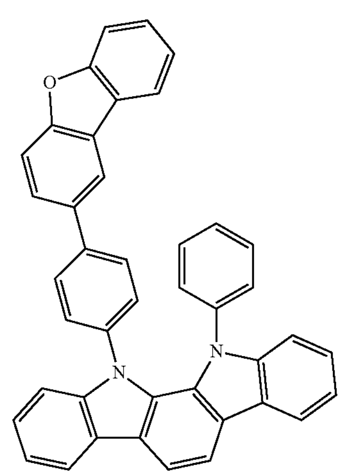

-continued
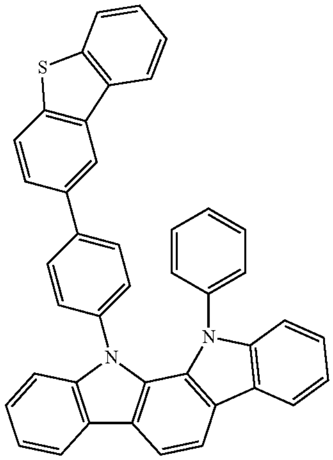
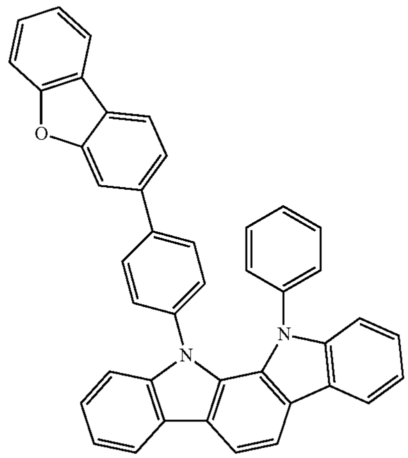
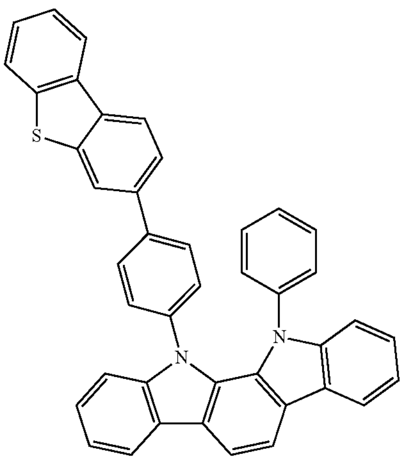
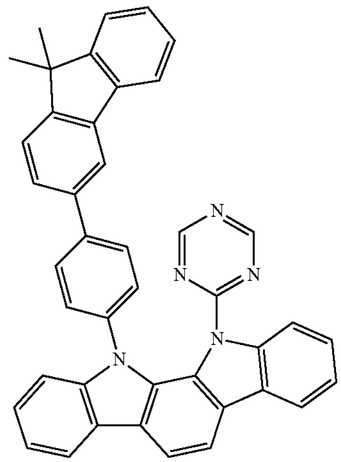
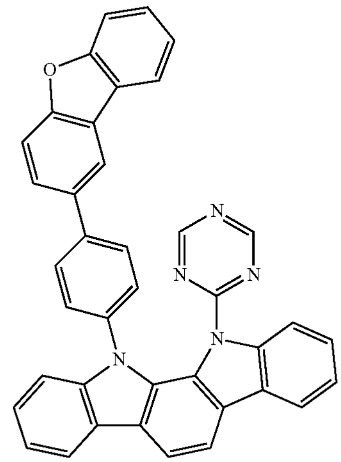
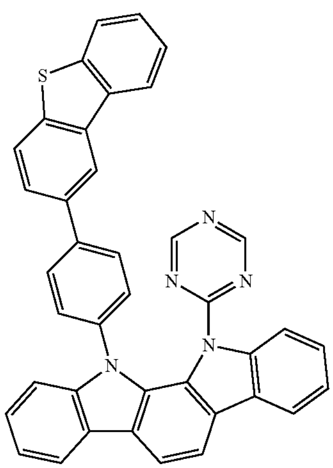
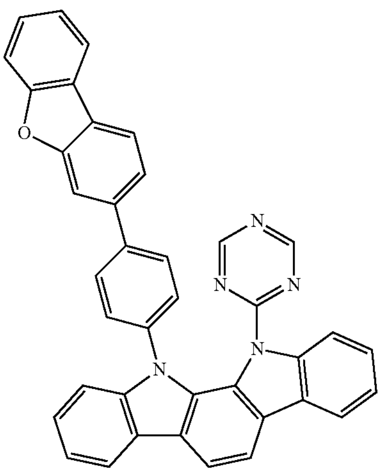
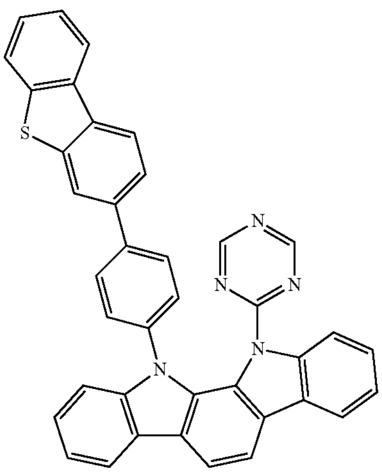
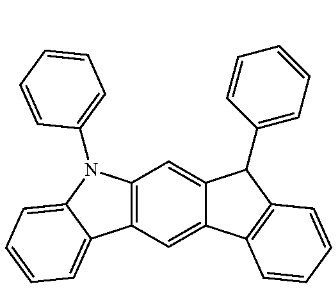
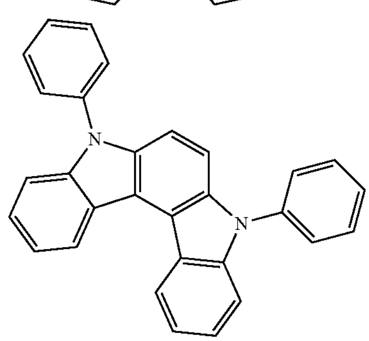
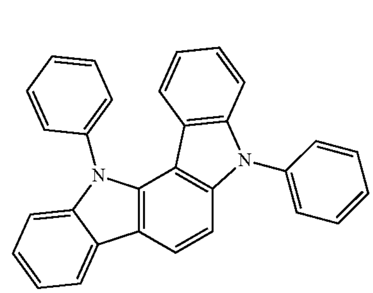

-continued
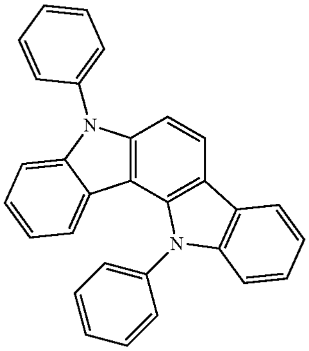
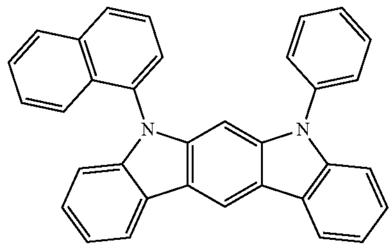
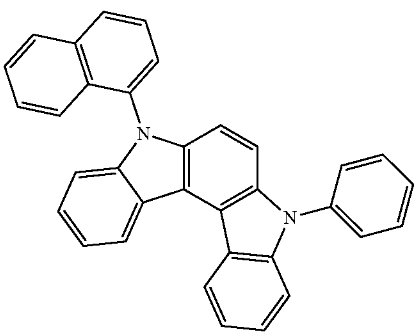
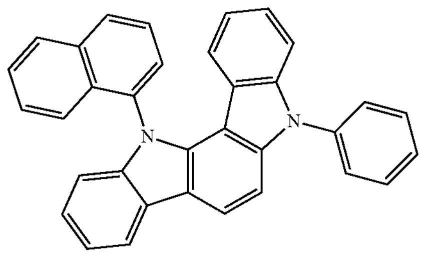
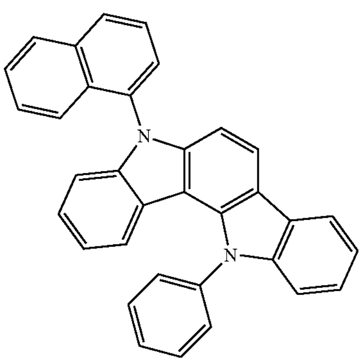
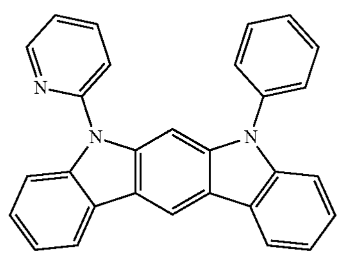
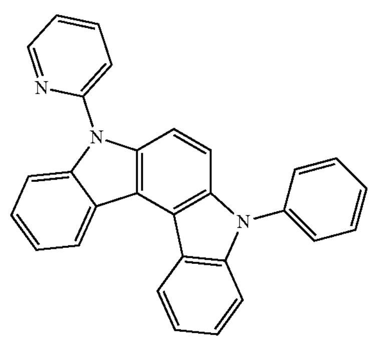
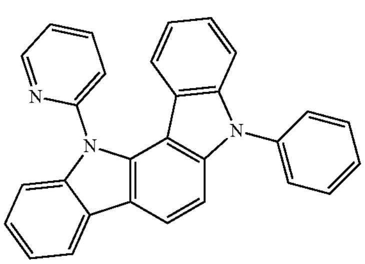
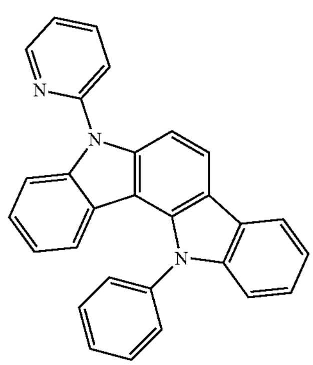
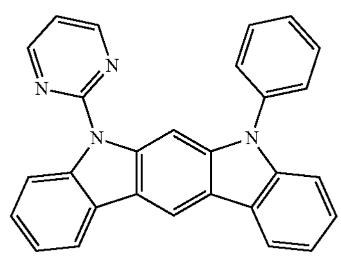

-continued
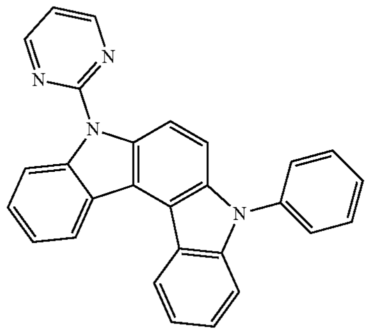
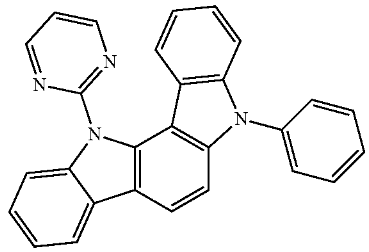
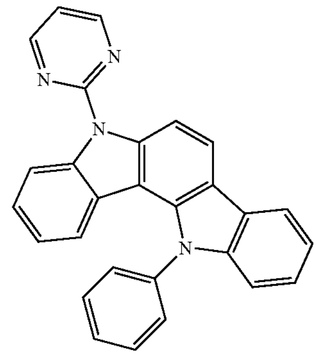
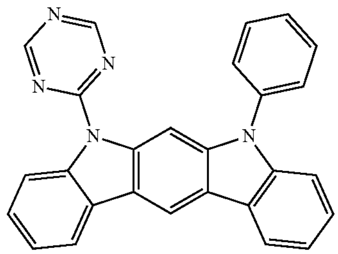
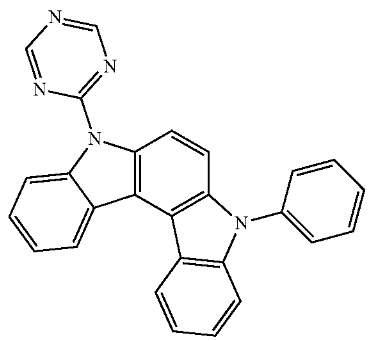
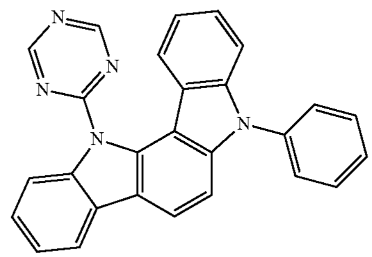
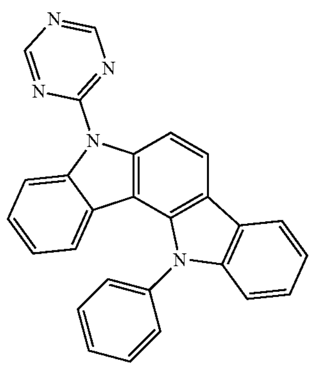
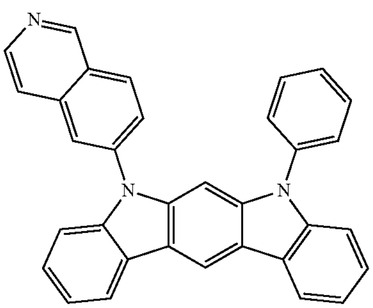
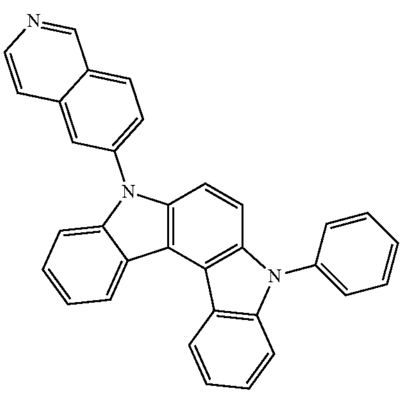
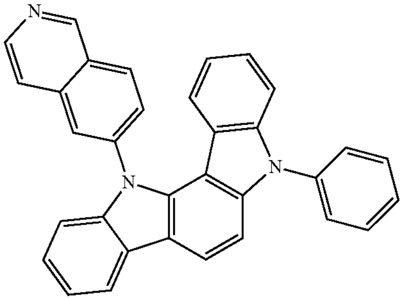
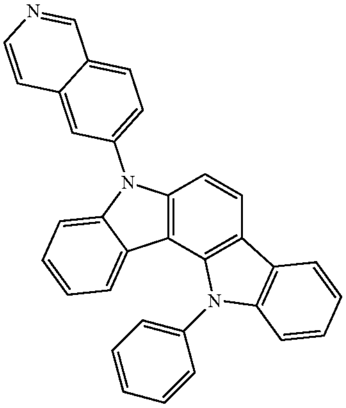

-continued
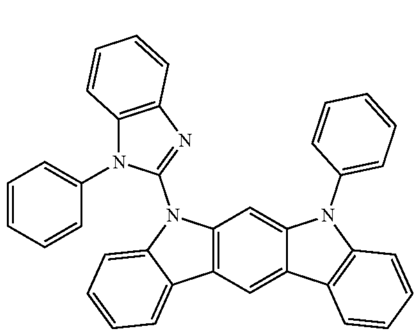
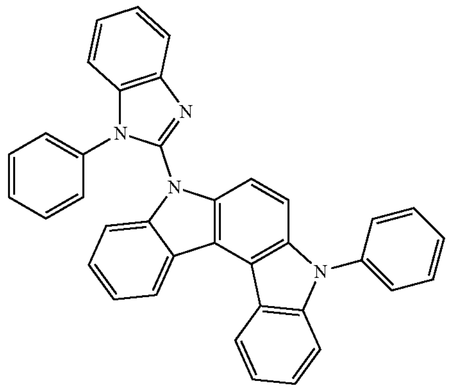
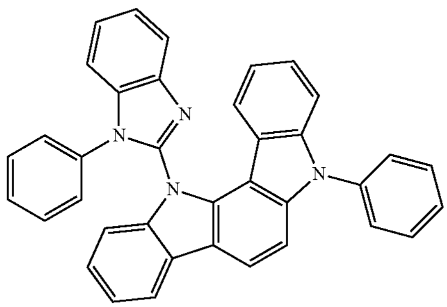
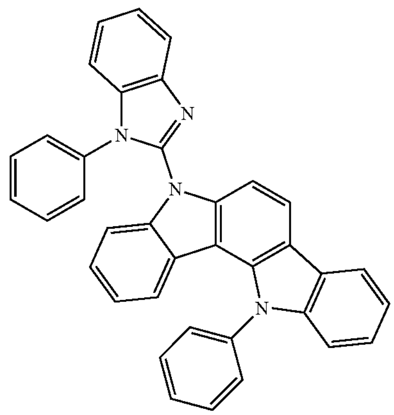
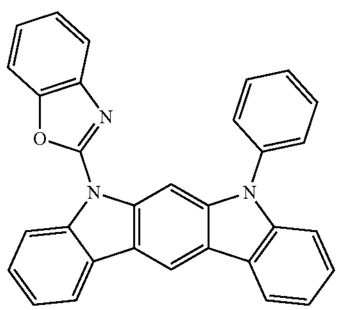
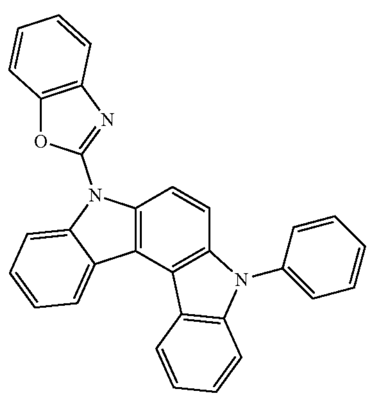
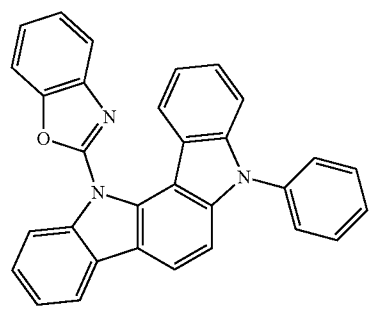
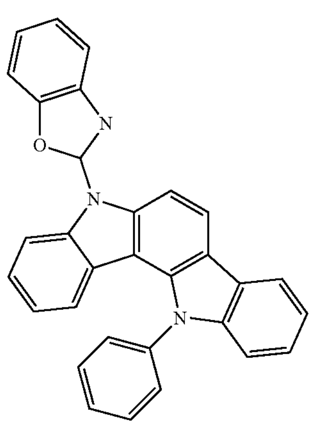
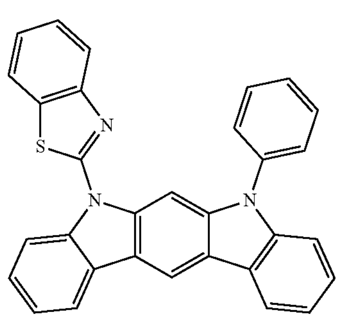
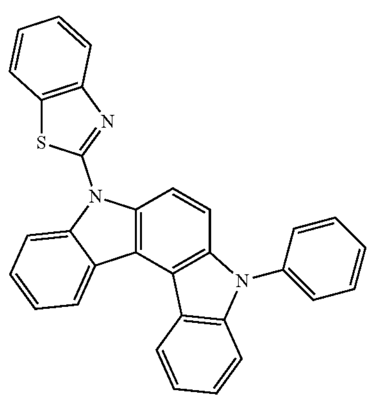

-continued
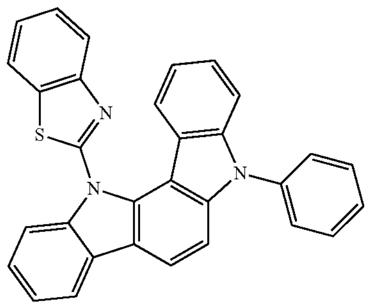
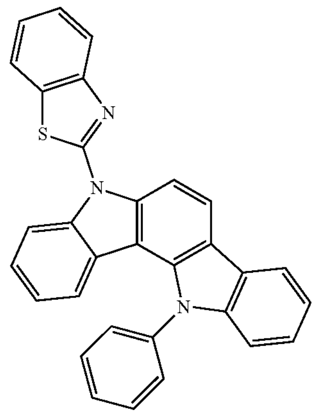
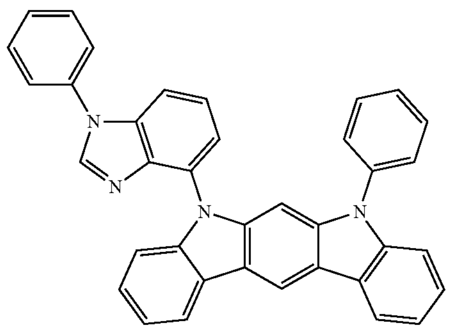
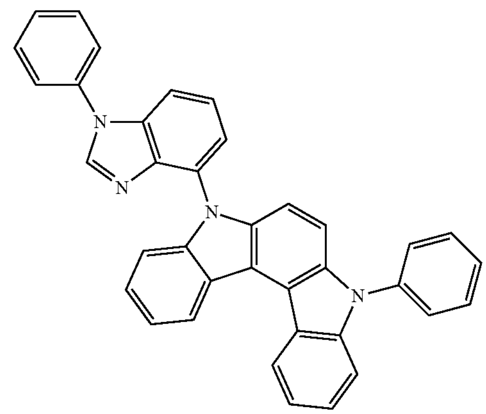
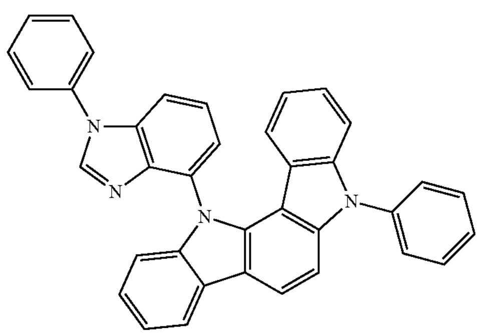
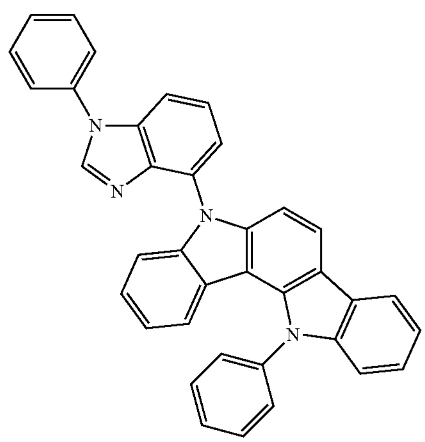
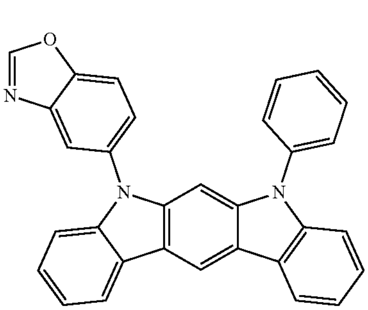
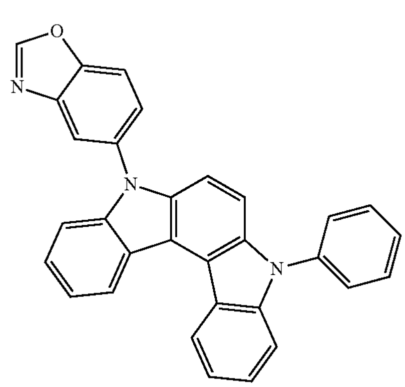

-continued
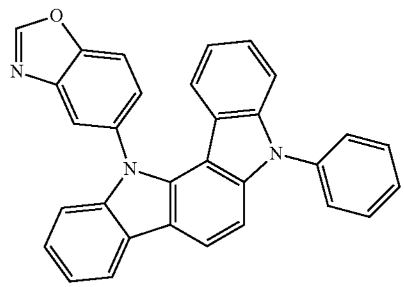
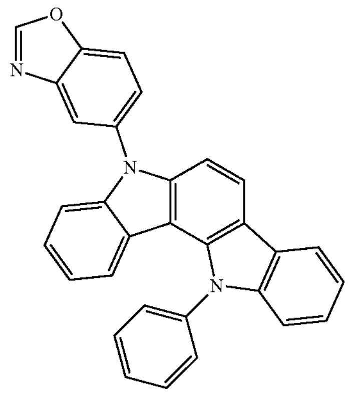
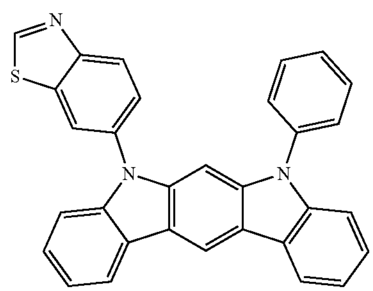
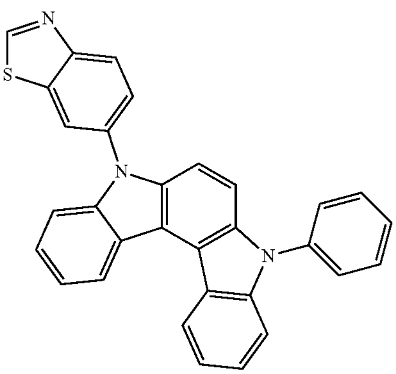
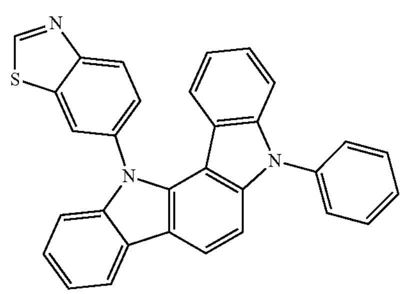
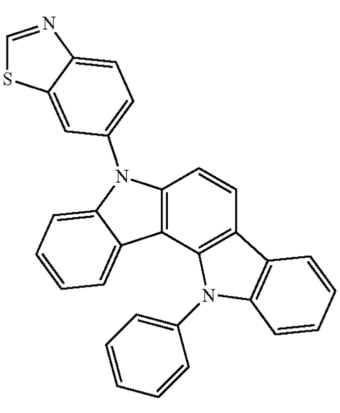
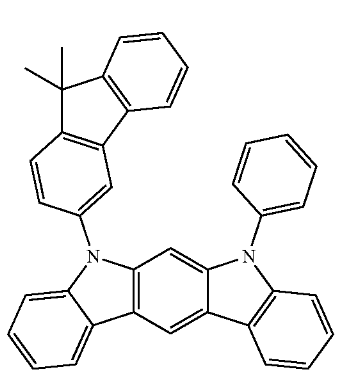
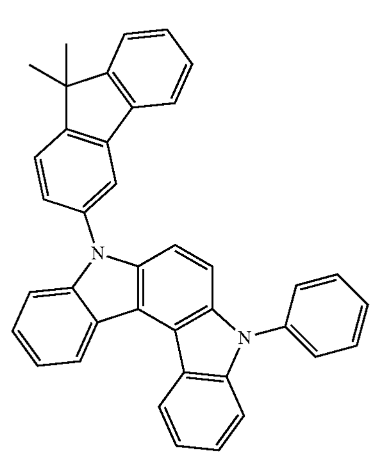
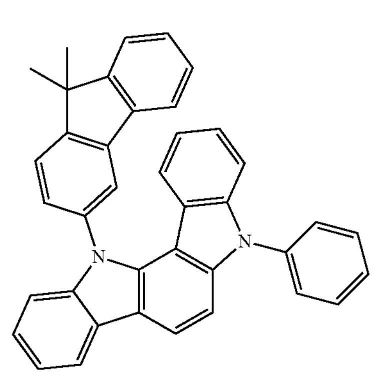

-continued
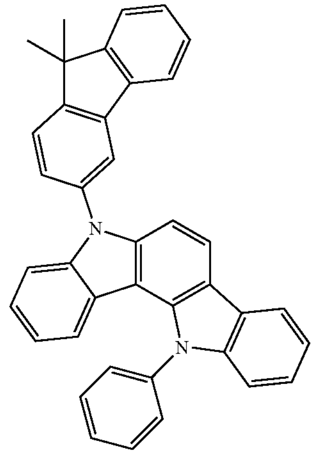
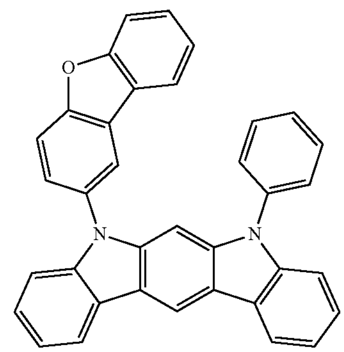
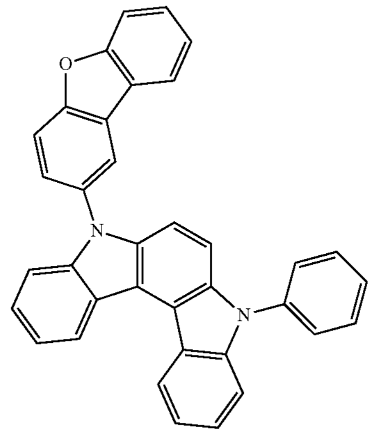
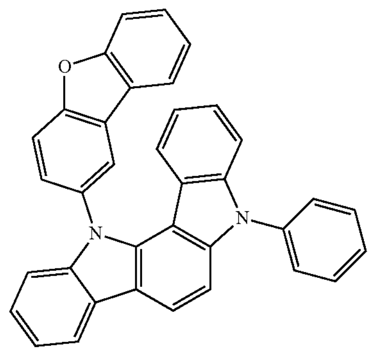
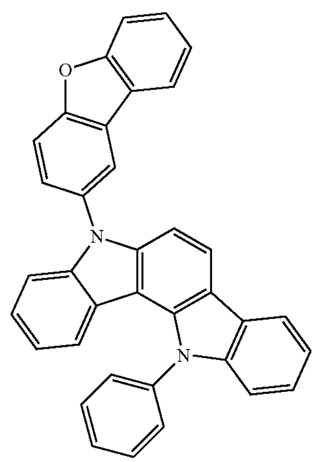
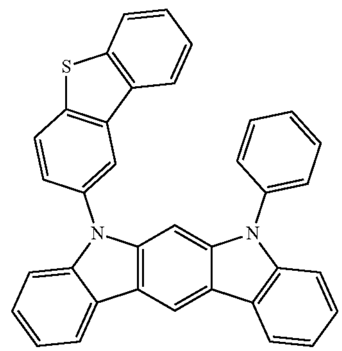
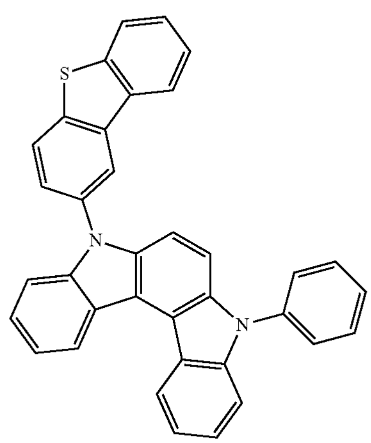
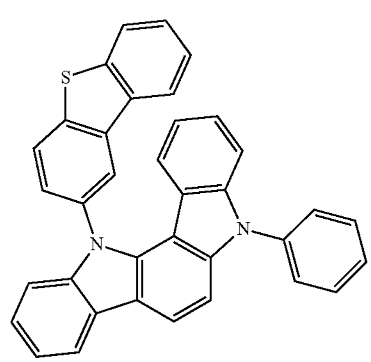
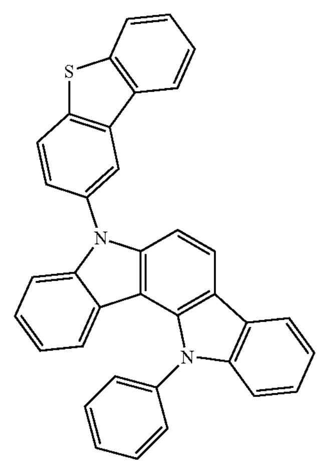

-continued
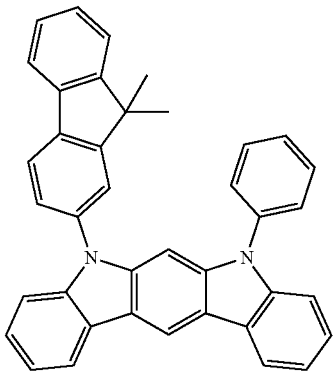
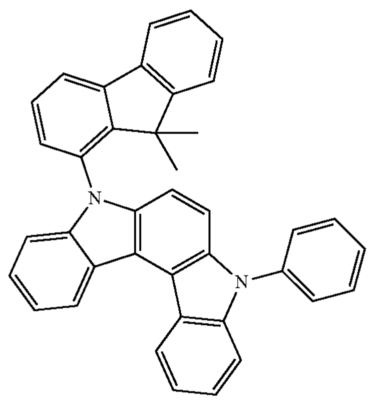
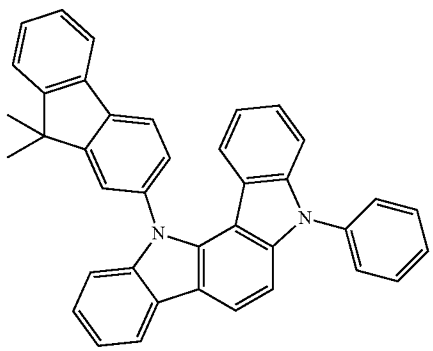
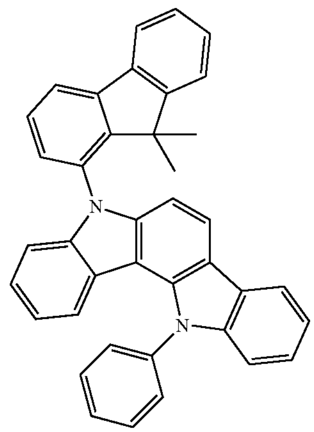
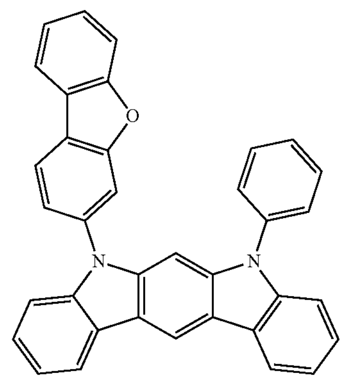
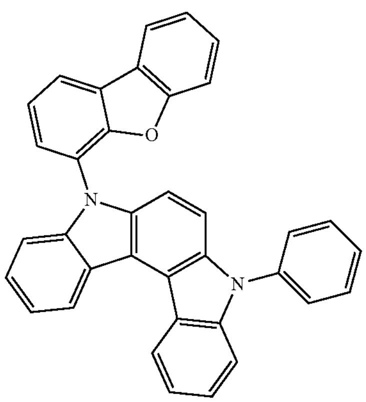
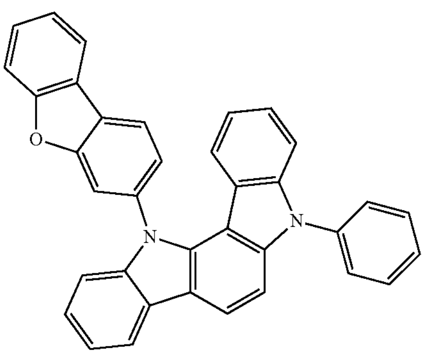
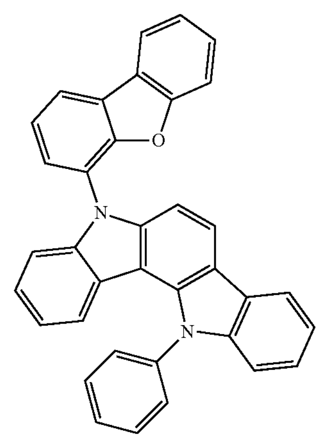
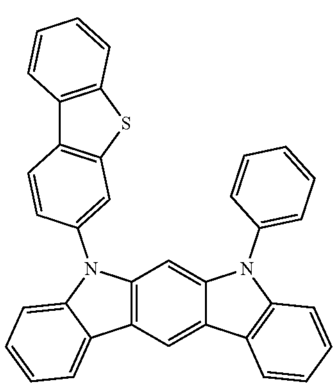
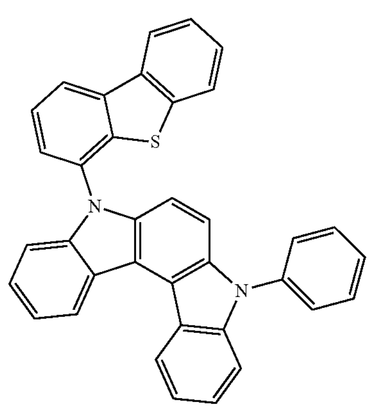

-continued
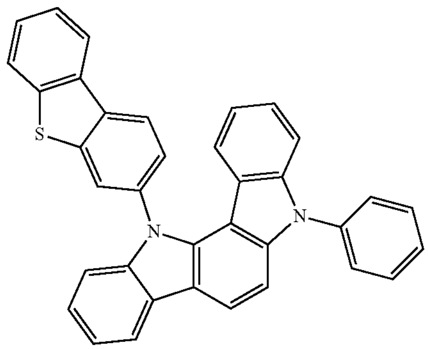
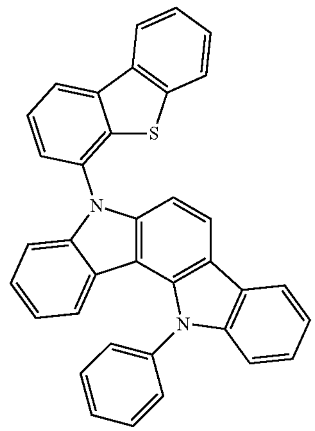
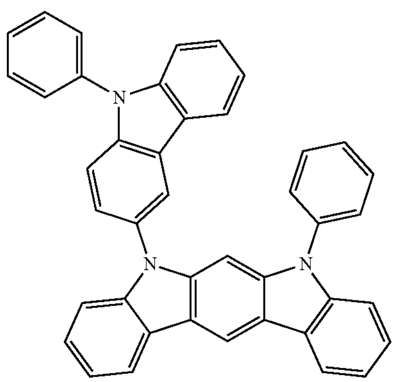
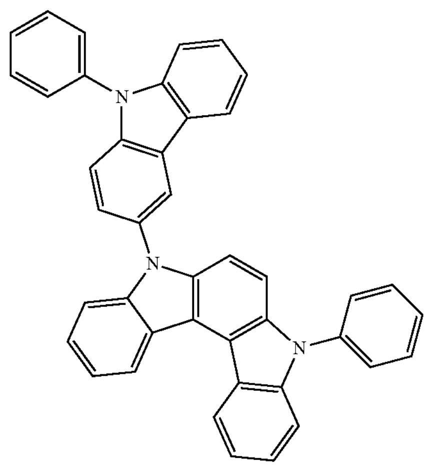
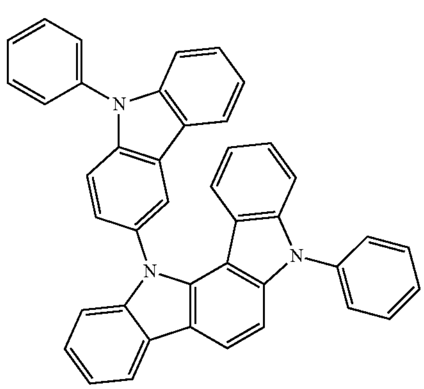
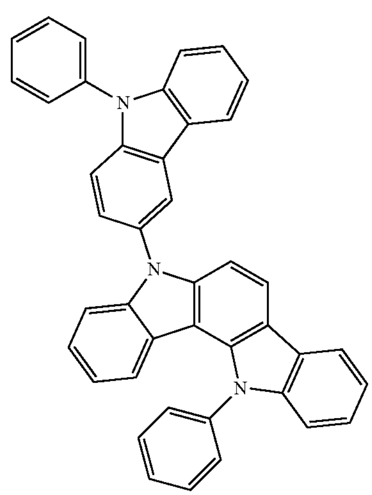

-continued
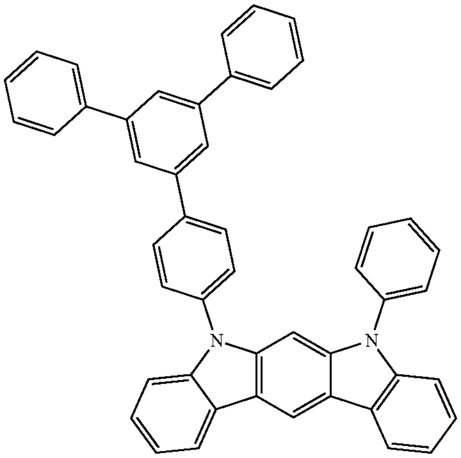
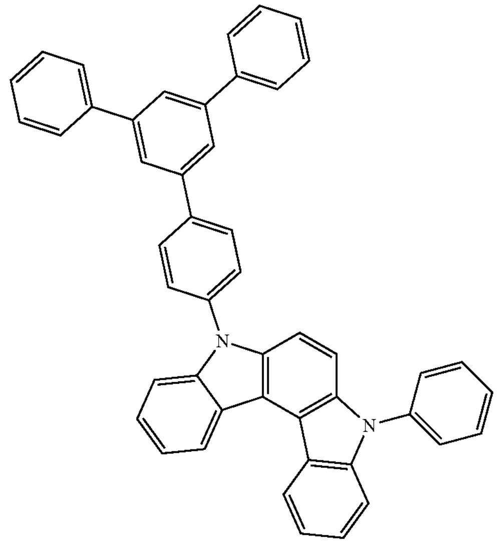
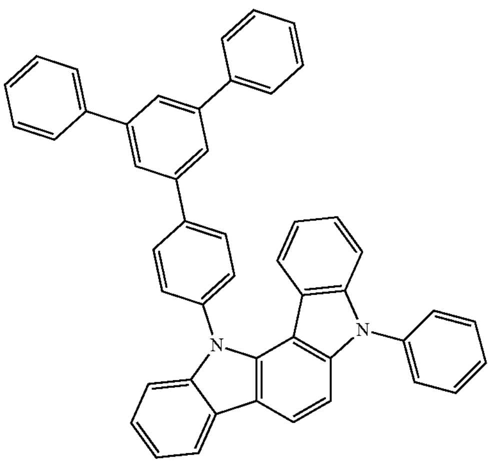
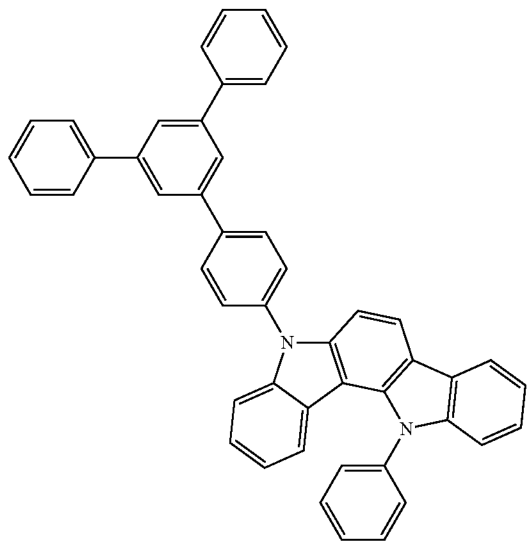
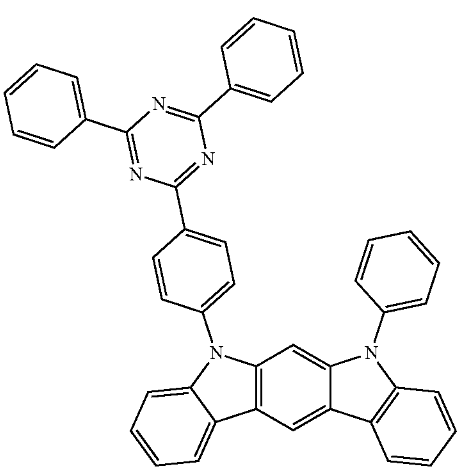
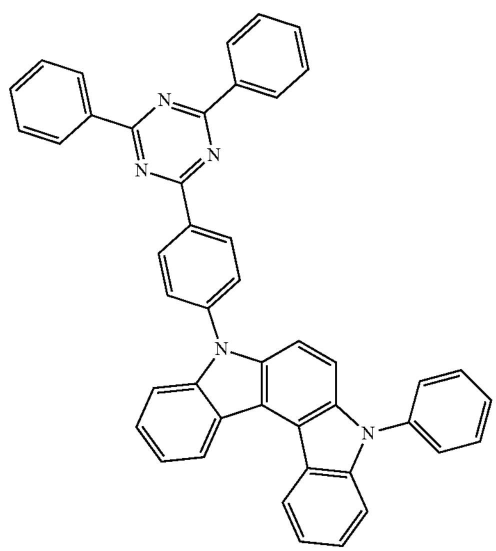

-continued
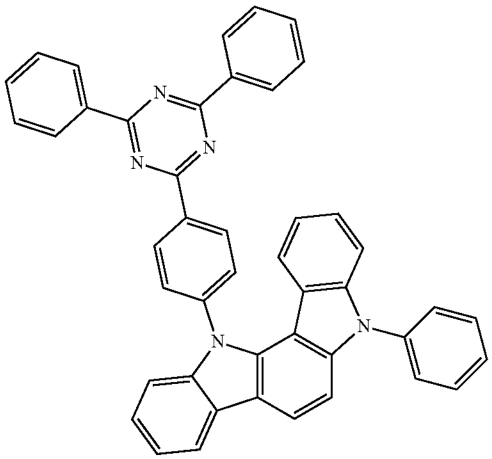
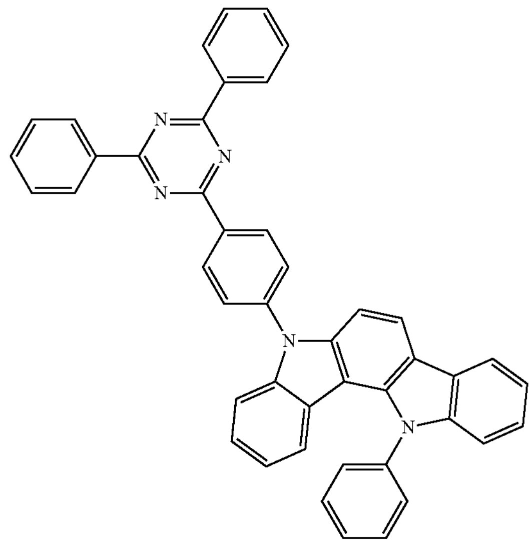
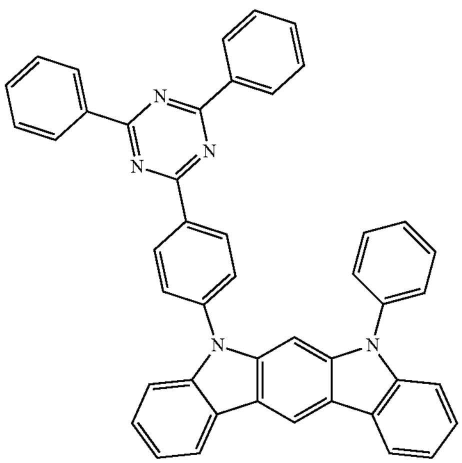
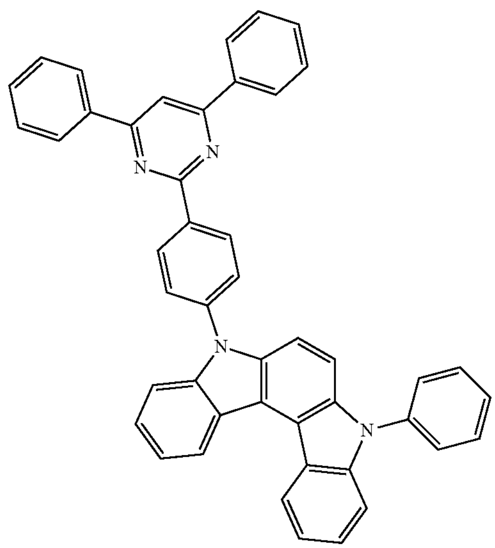
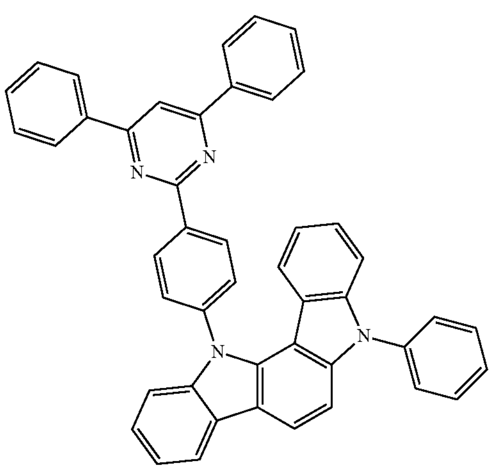
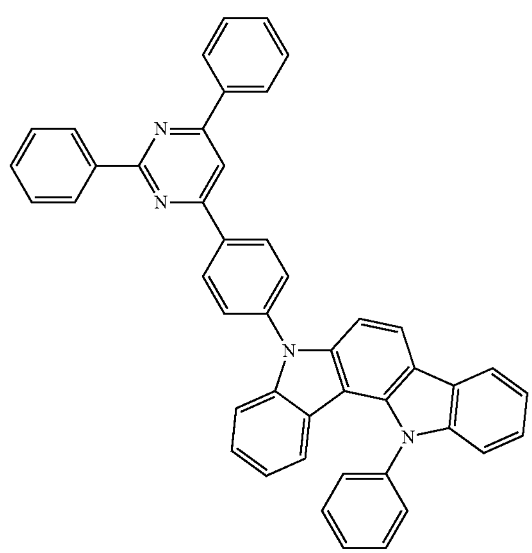

-continued
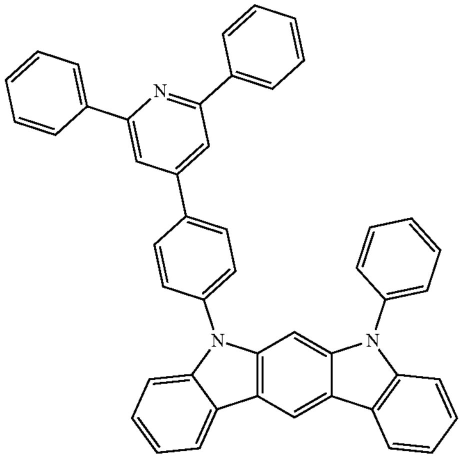
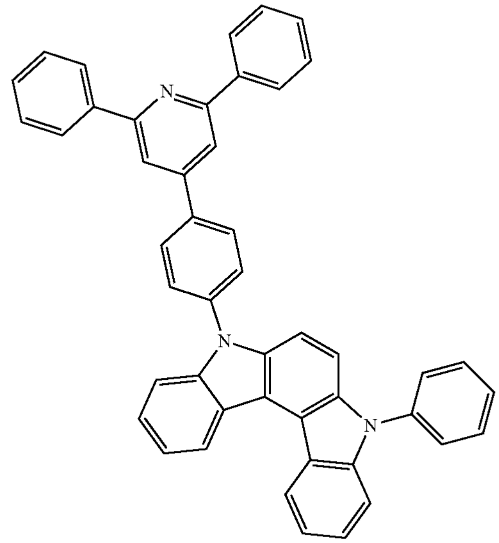
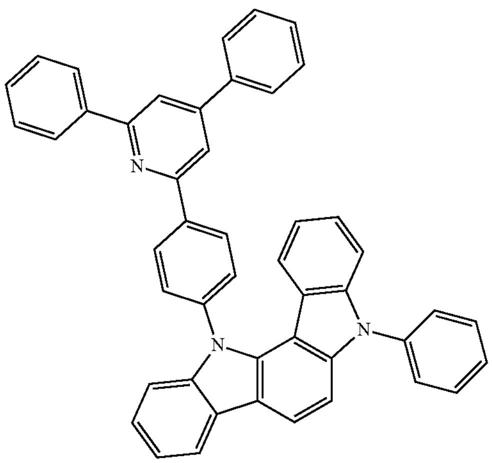
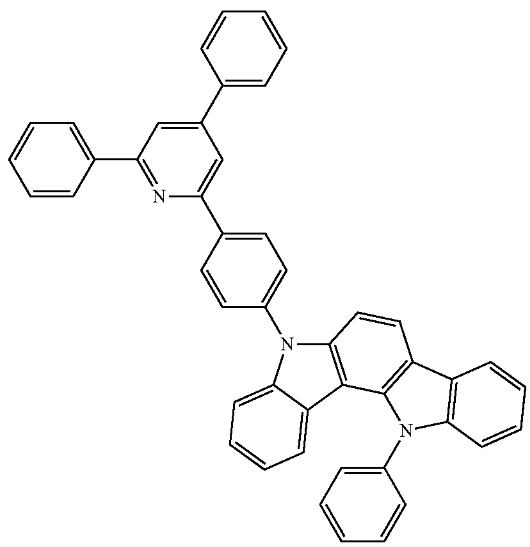
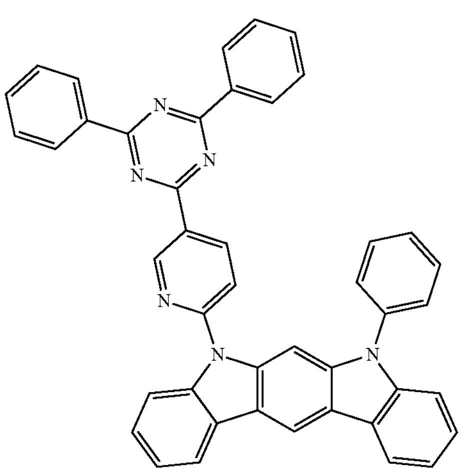
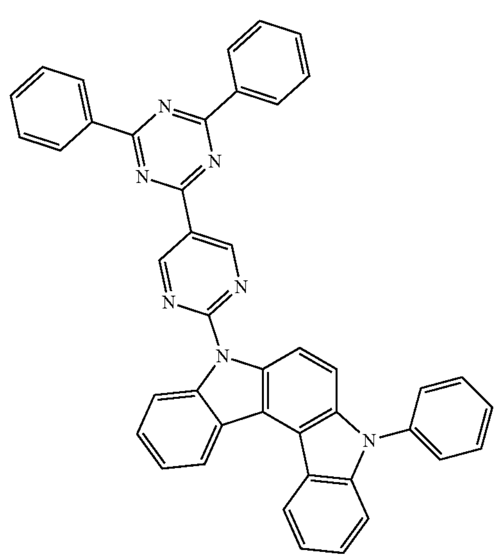

-continued
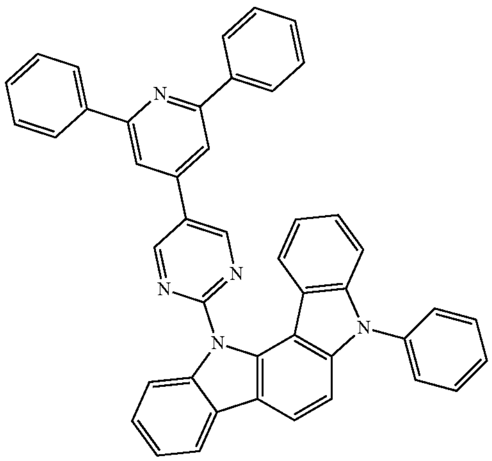
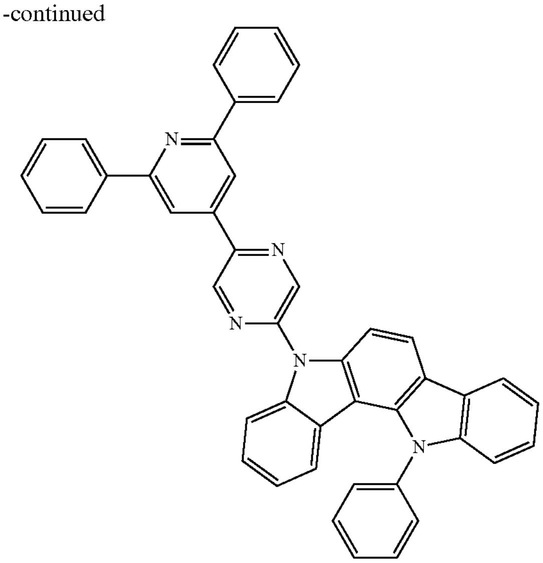
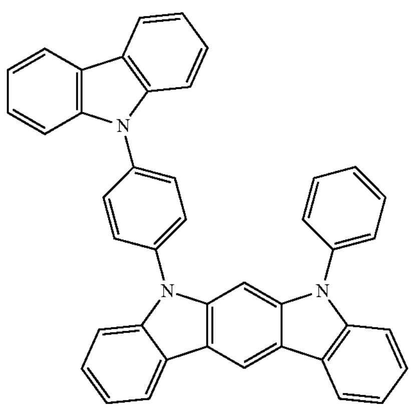
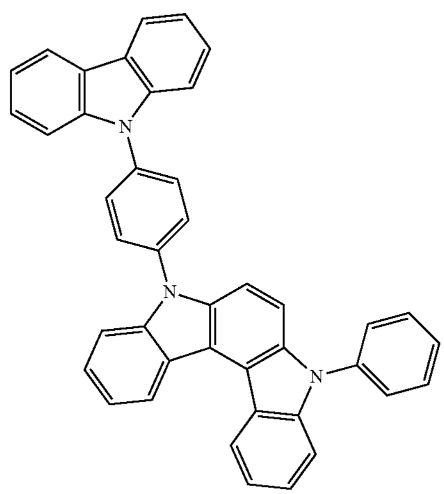
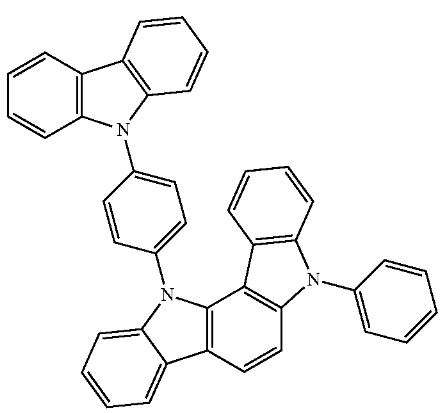
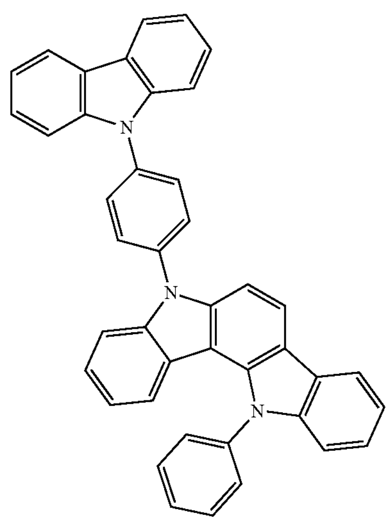

-continued
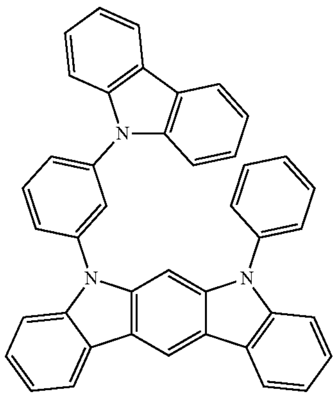
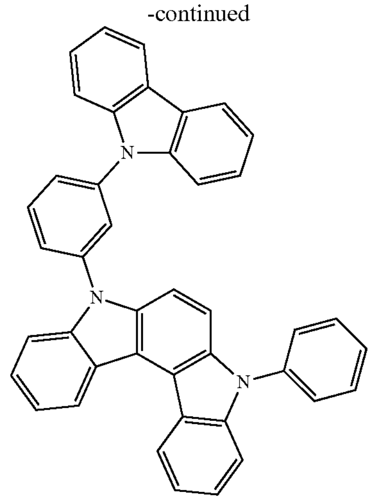
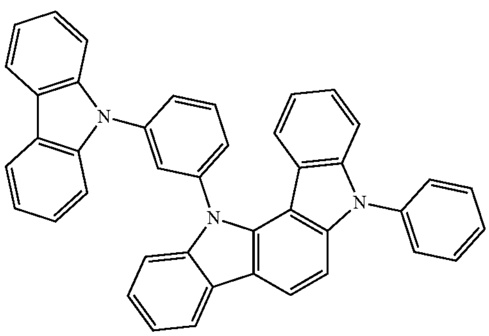
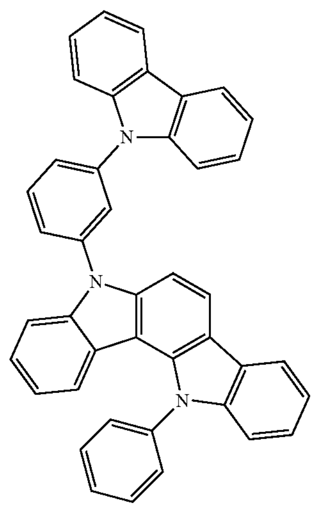
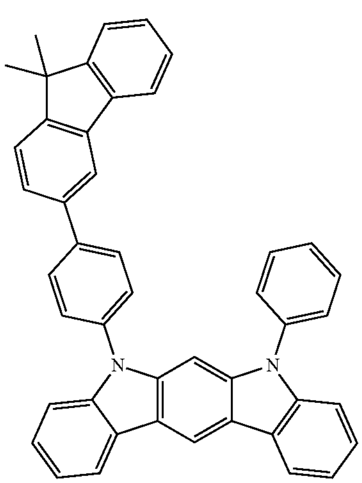
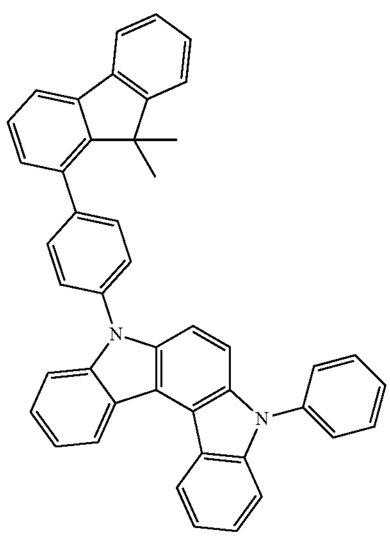

-continued
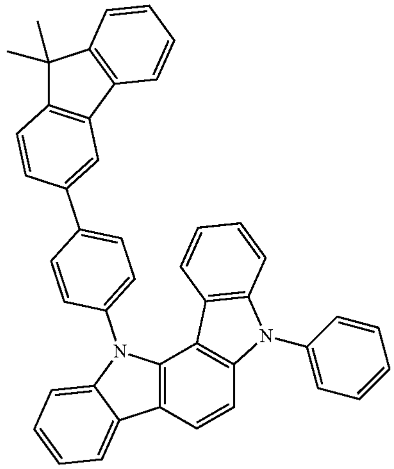
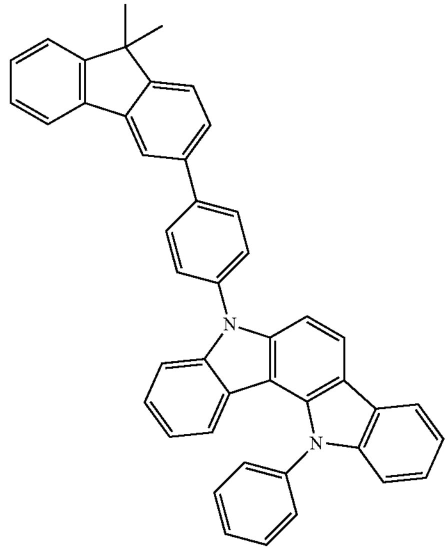
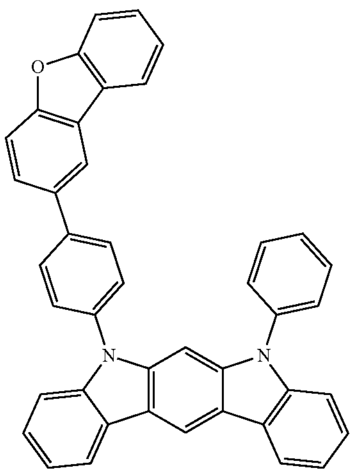
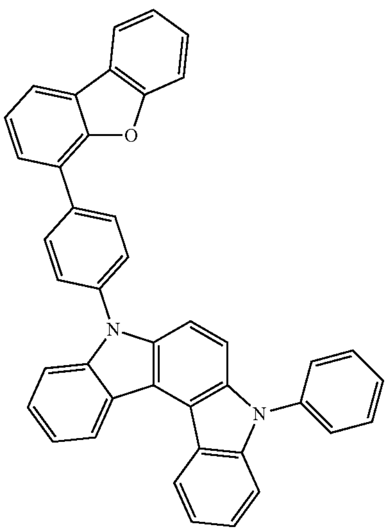
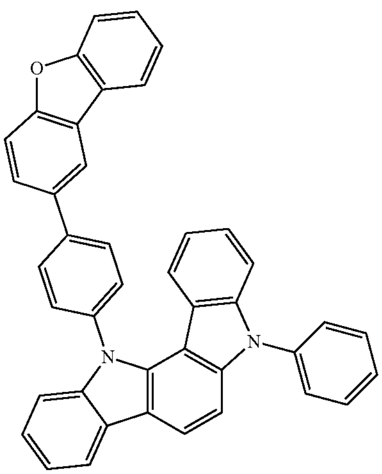
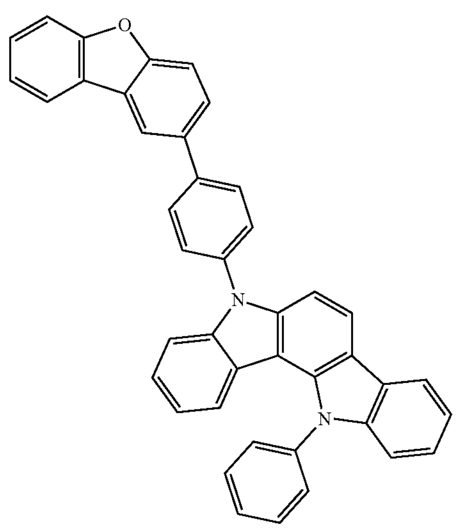

-continued
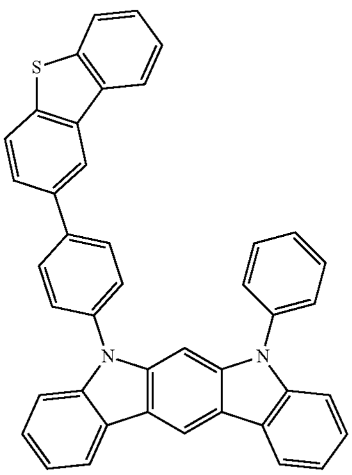
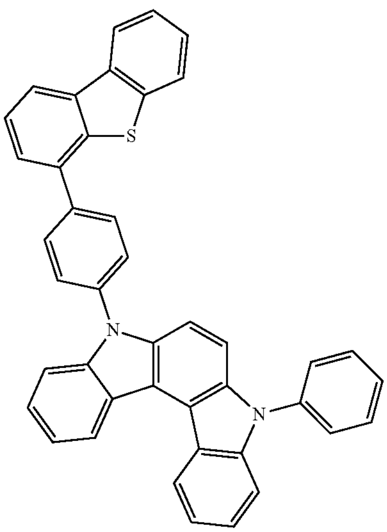
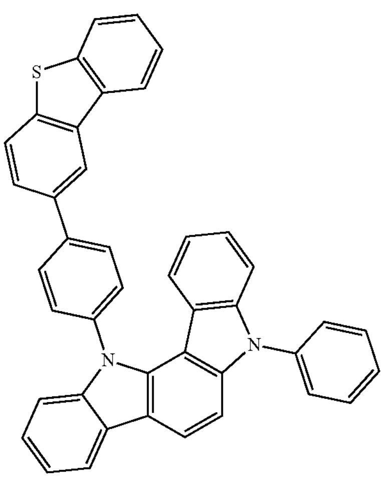
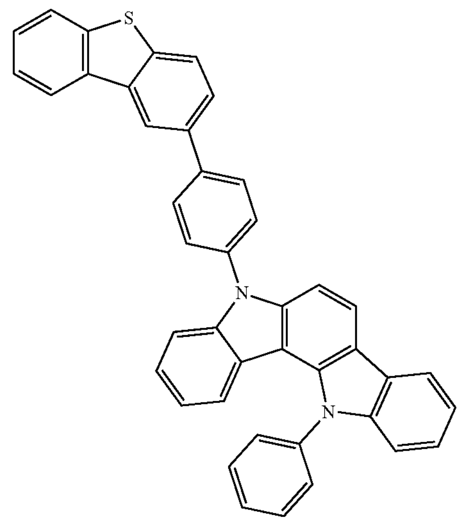
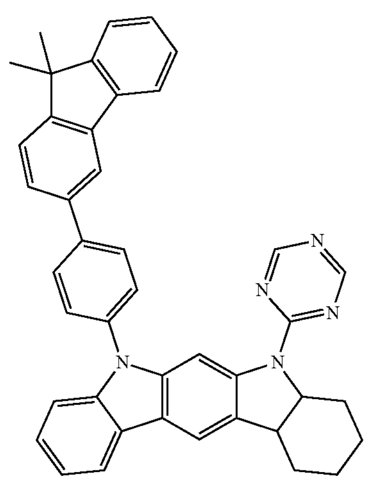
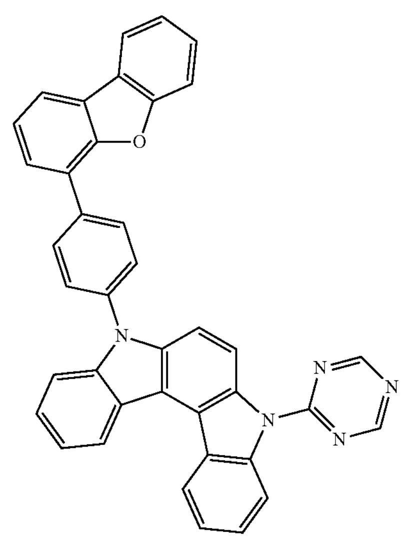

-continued
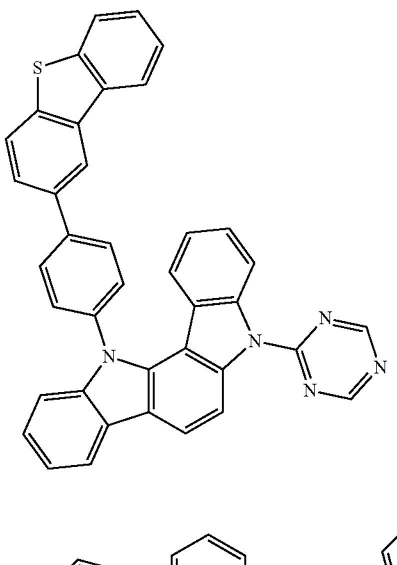
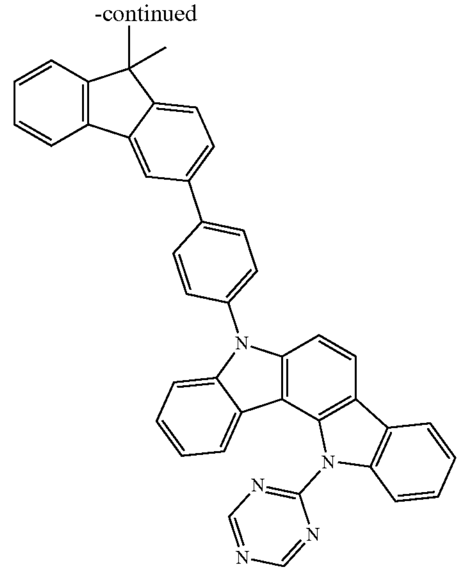
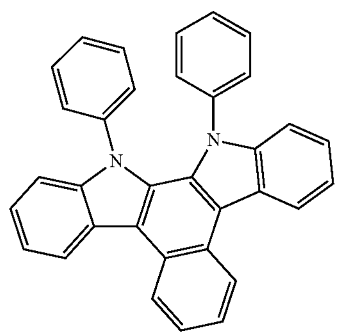
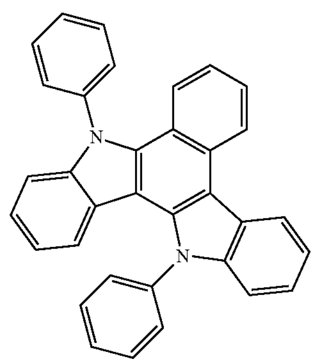
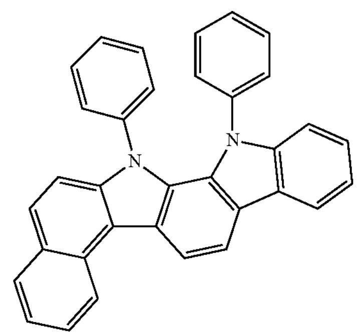
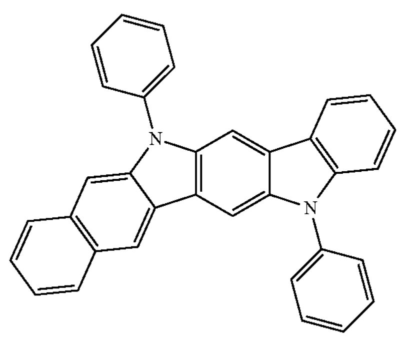
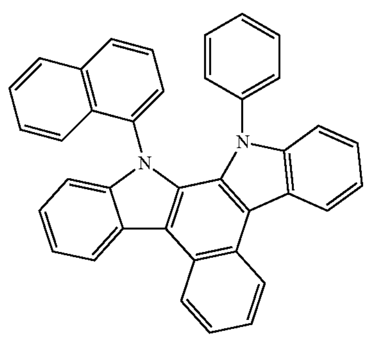
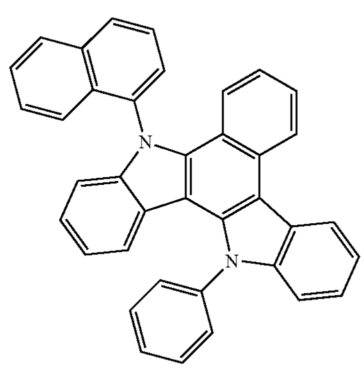
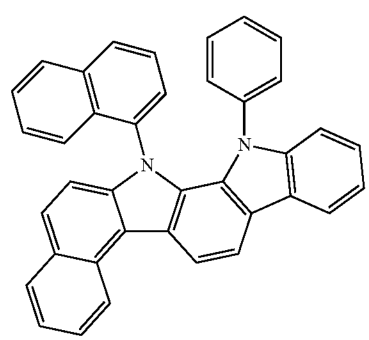

-continued
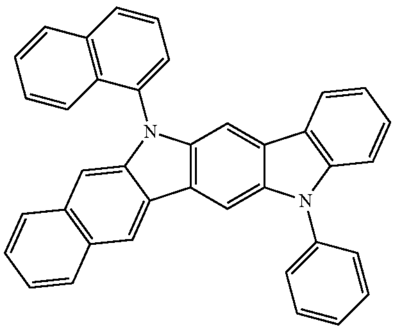
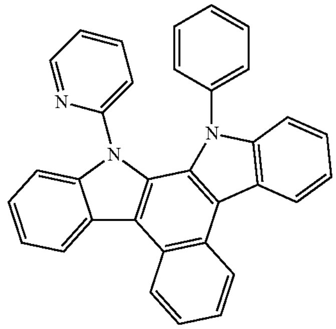
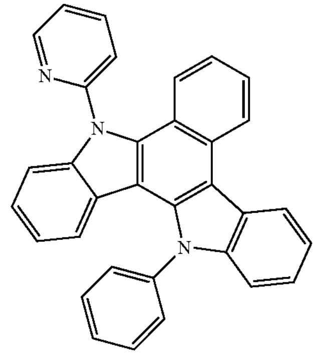
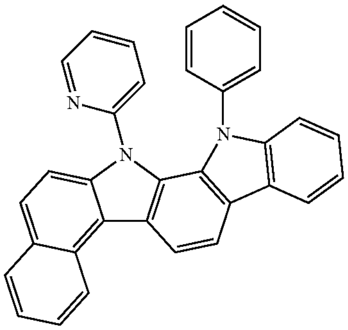
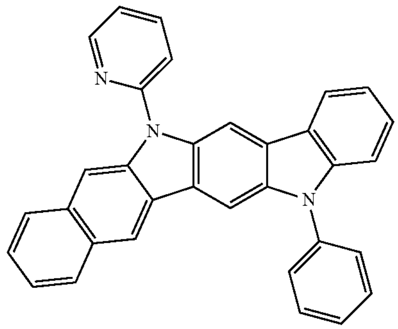
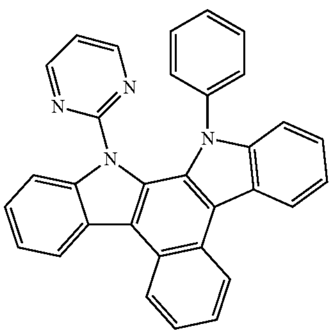
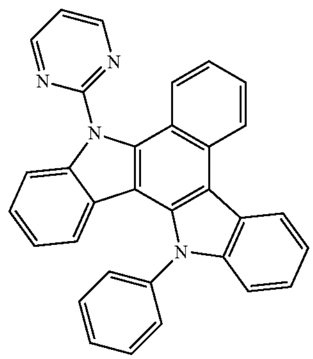
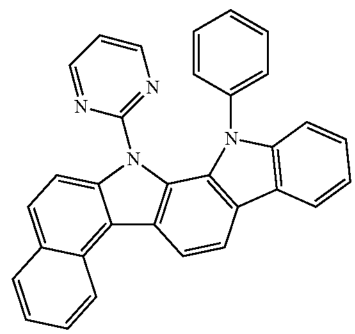
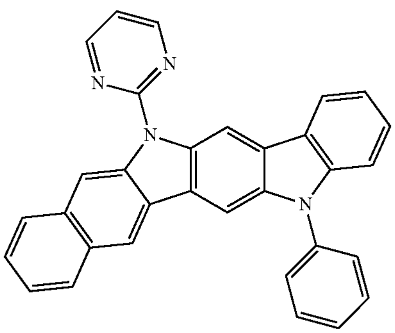
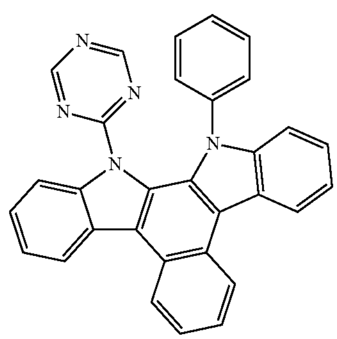
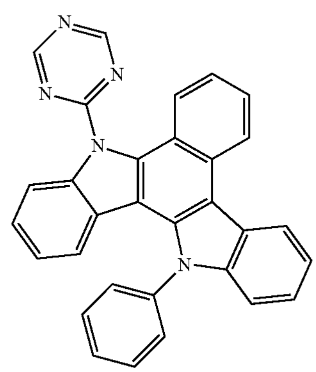
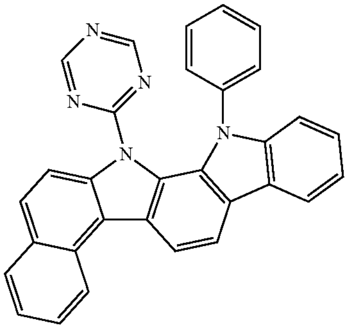
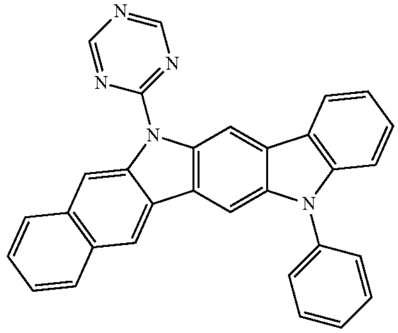

-continued
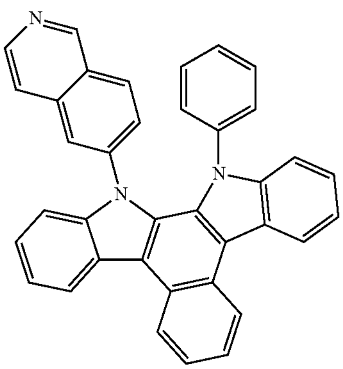
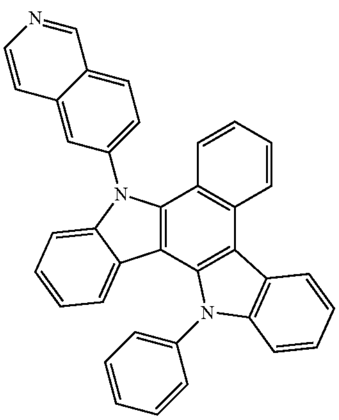
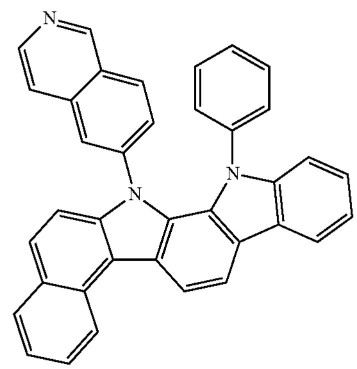
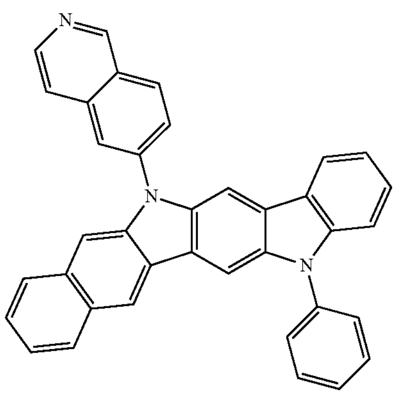
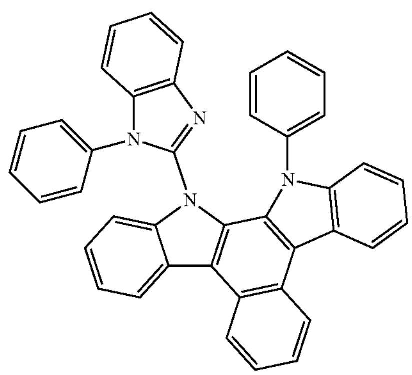
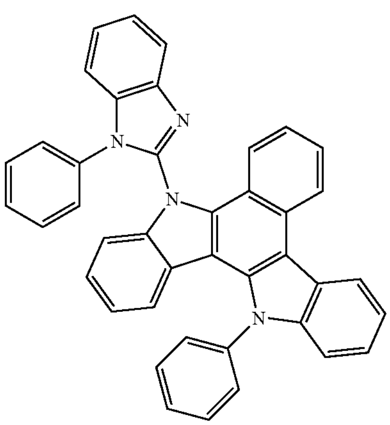
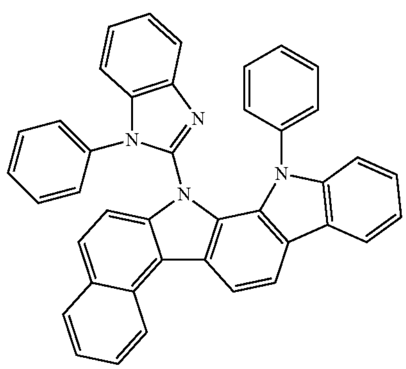
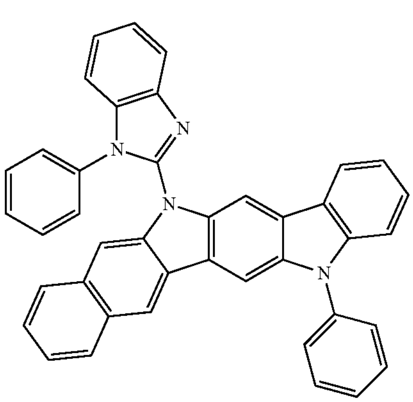
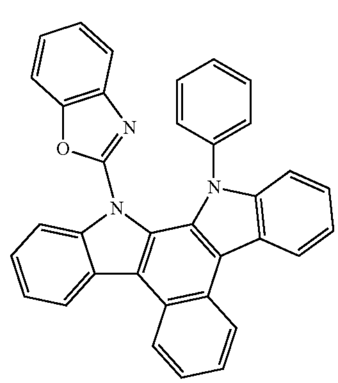
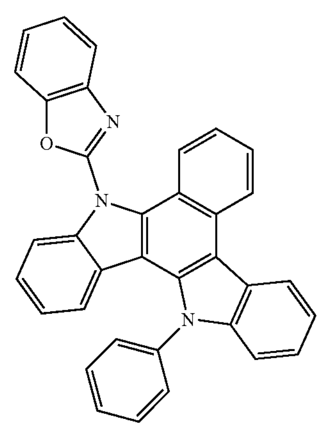

-continued
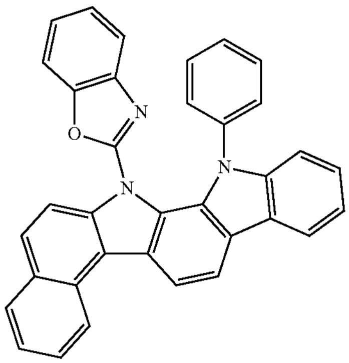
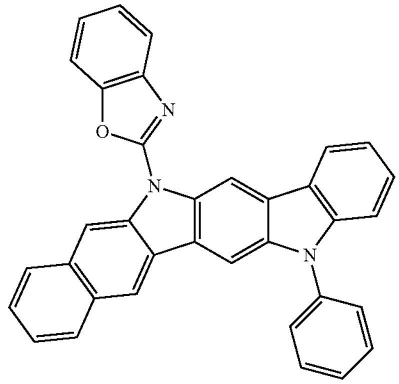
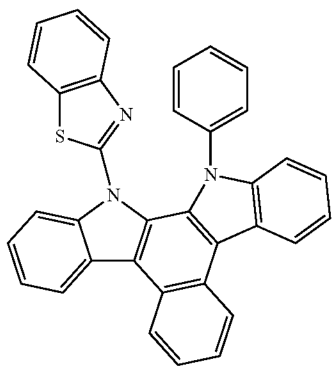
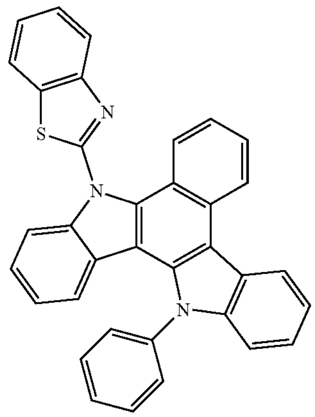
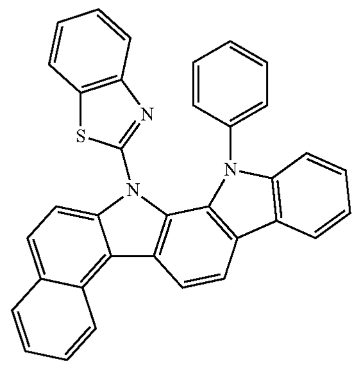
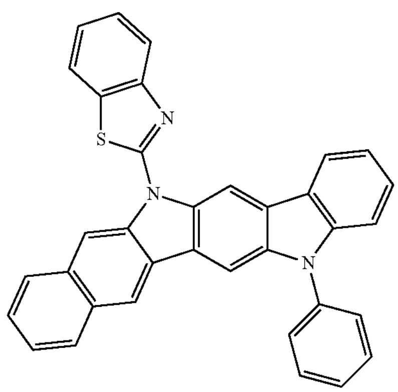
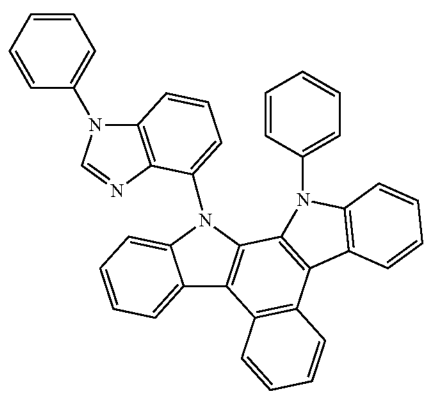
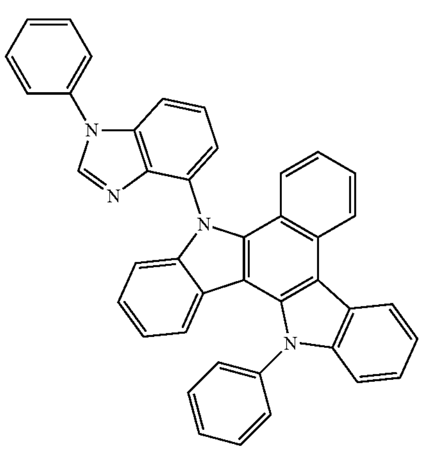
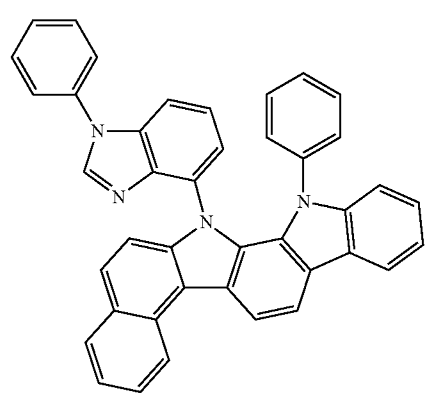

-continued
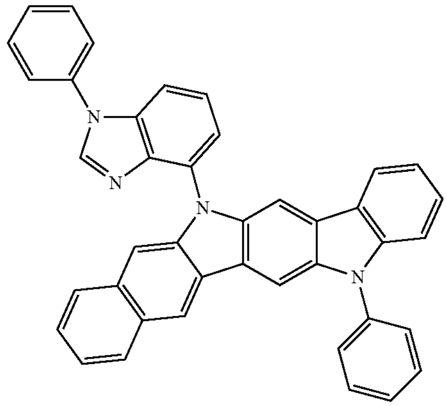
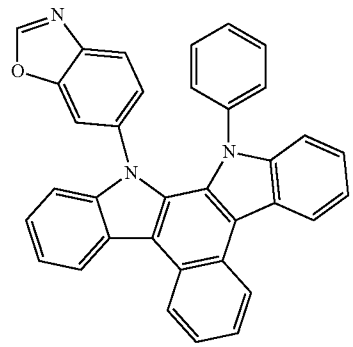
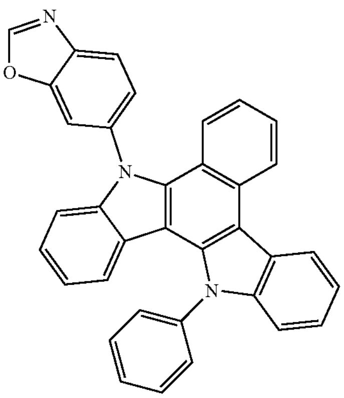
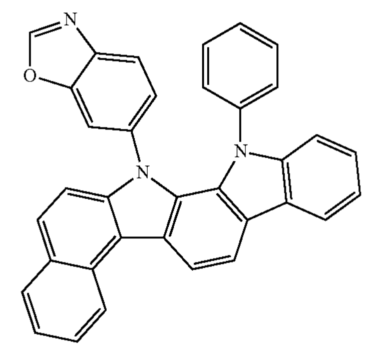
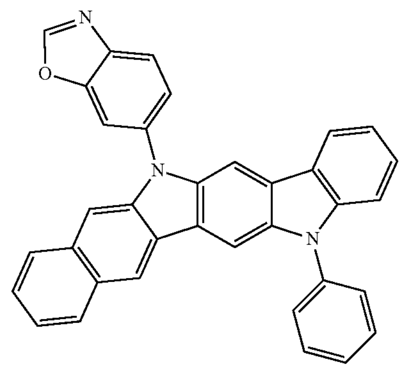
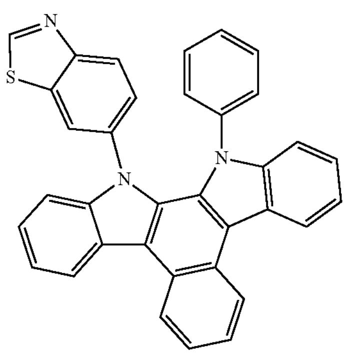
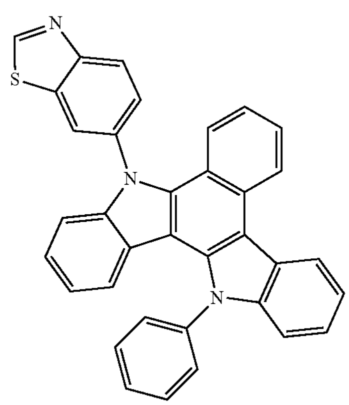
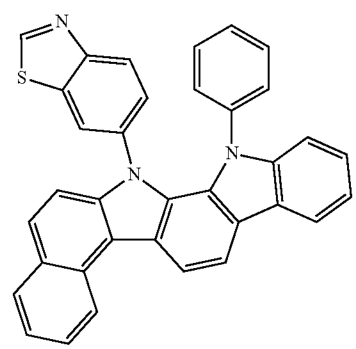
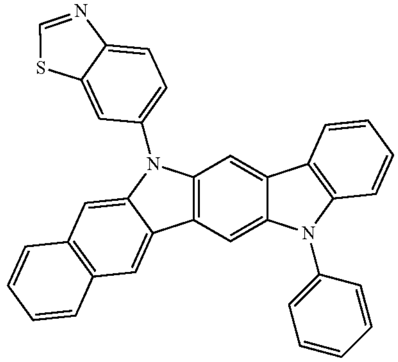
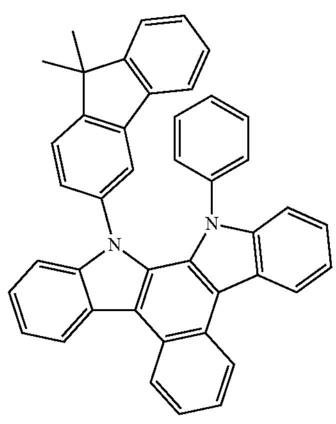
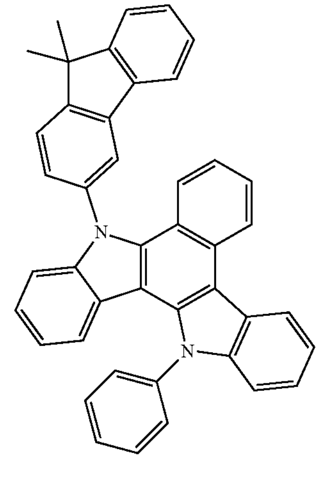

-continued
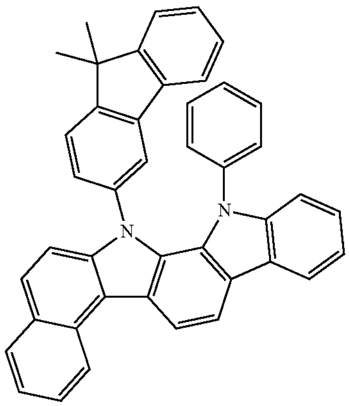
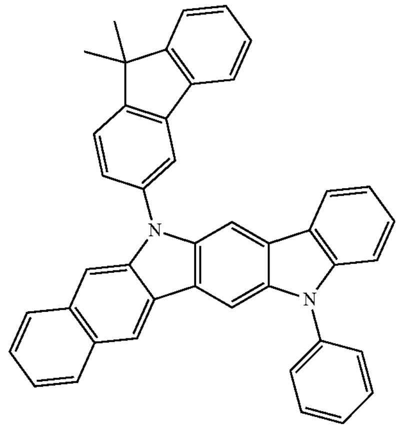
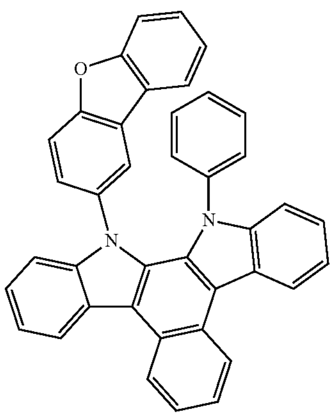
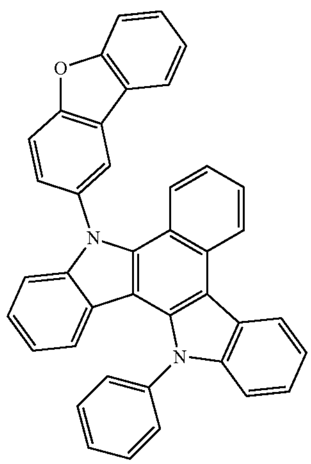
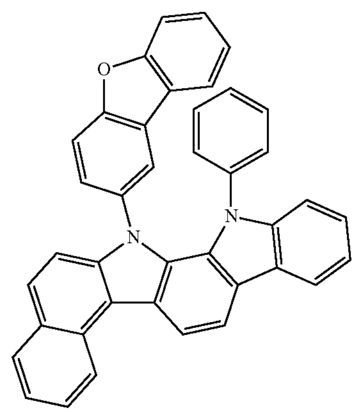
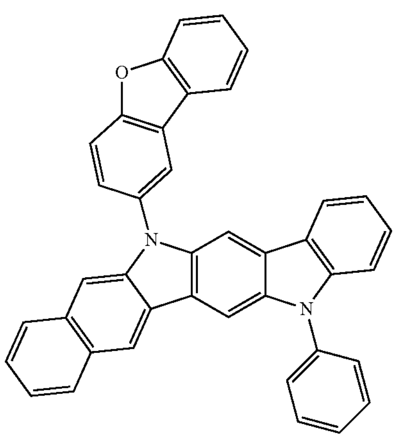
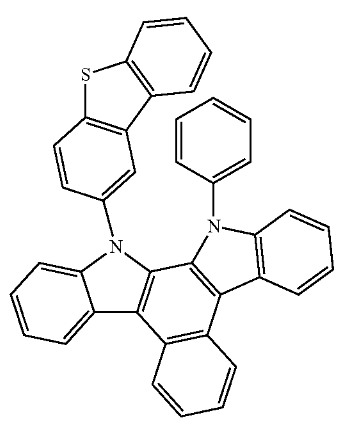
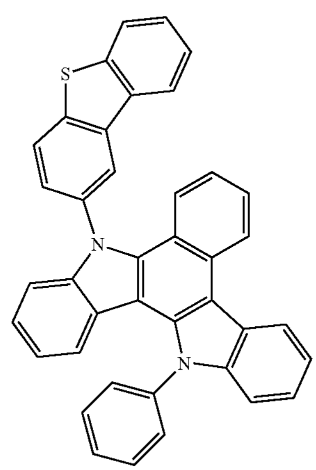

-continued
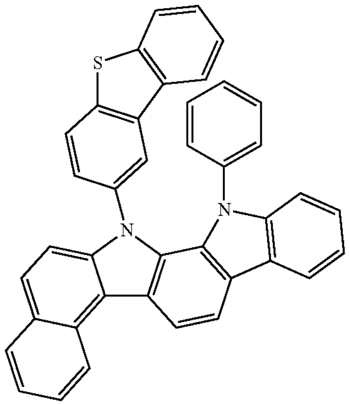
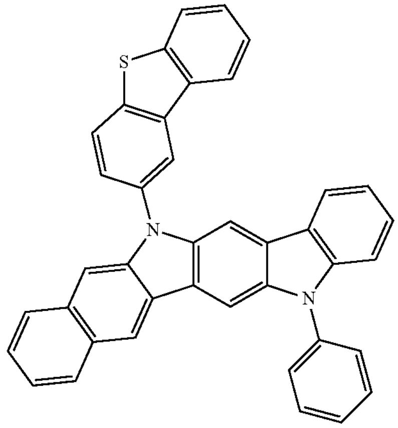
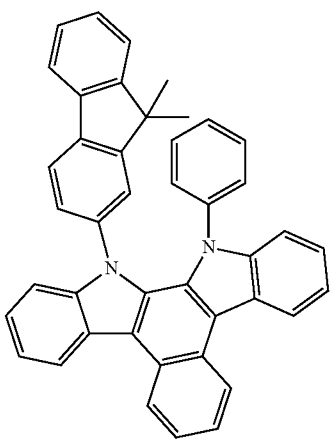
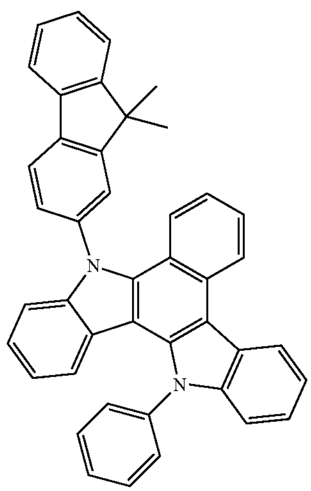
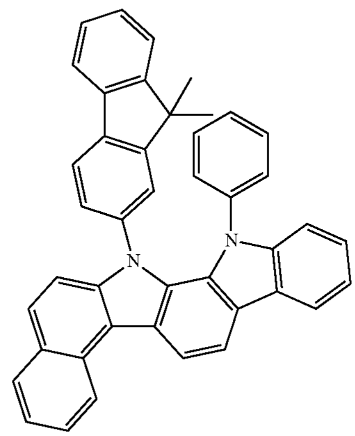
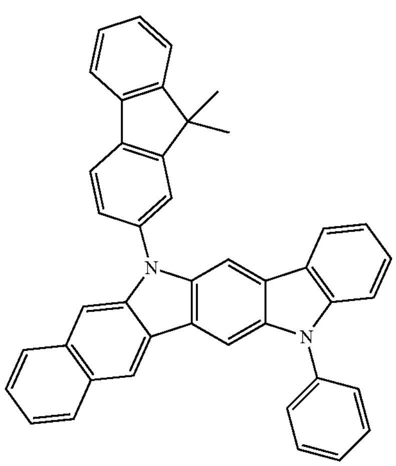
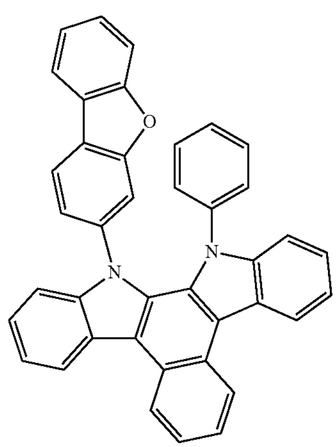
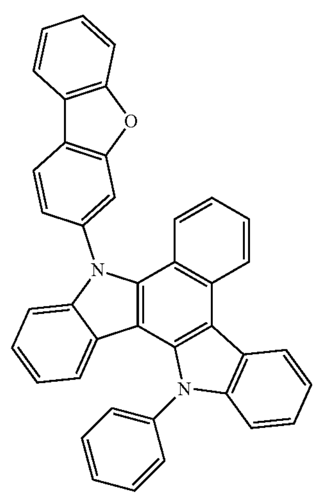

-continued
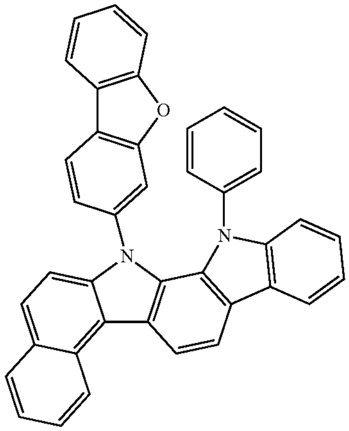
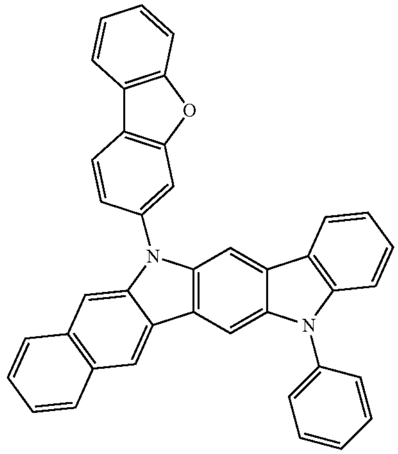
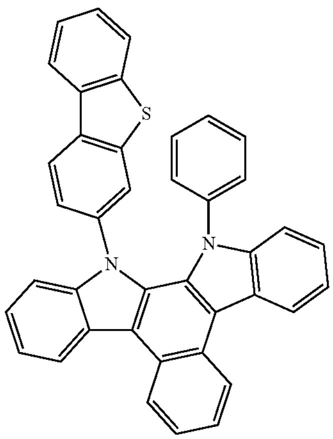
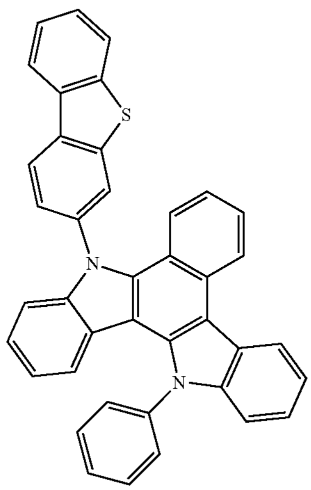
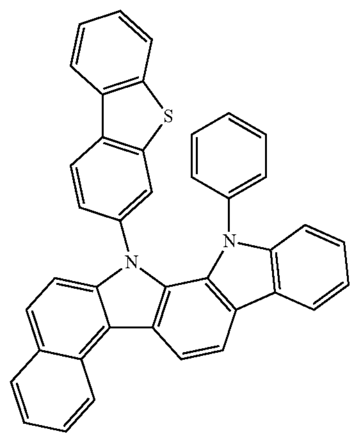
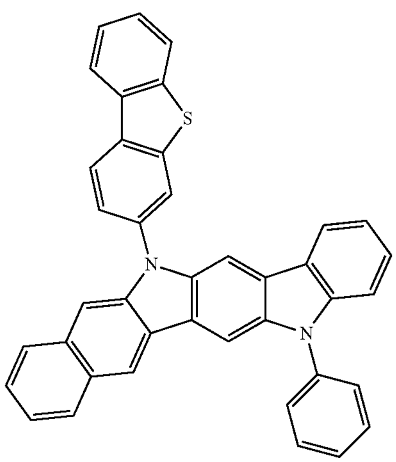
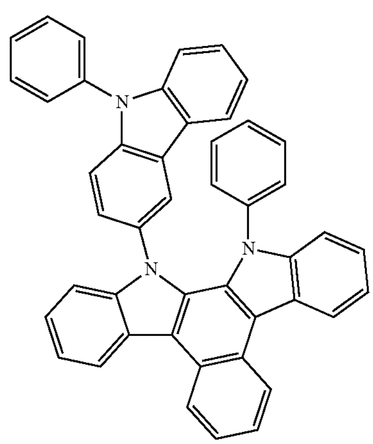

-continued
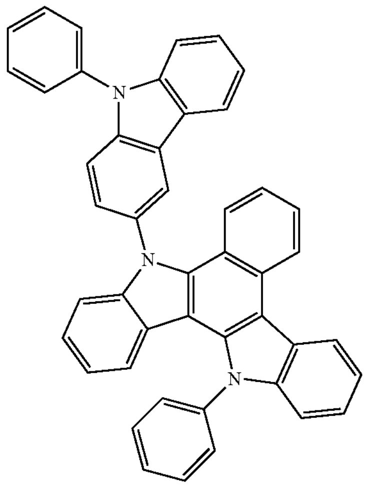
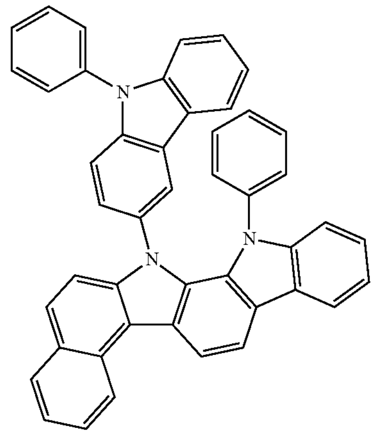
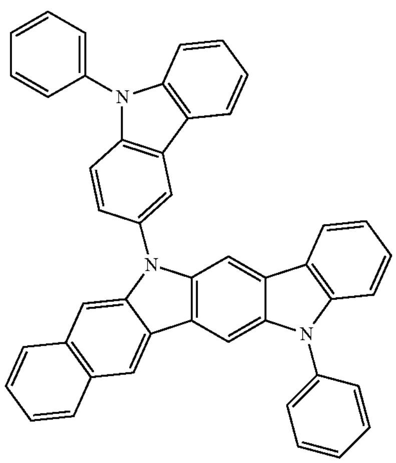
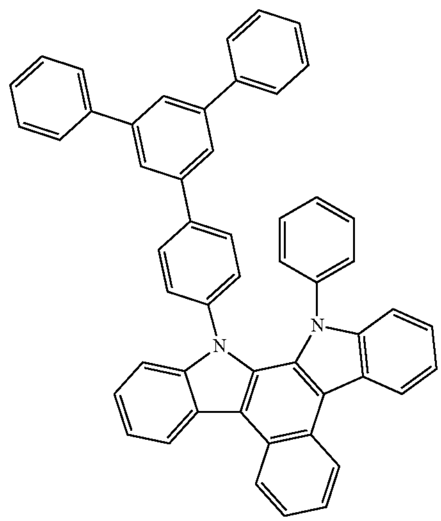
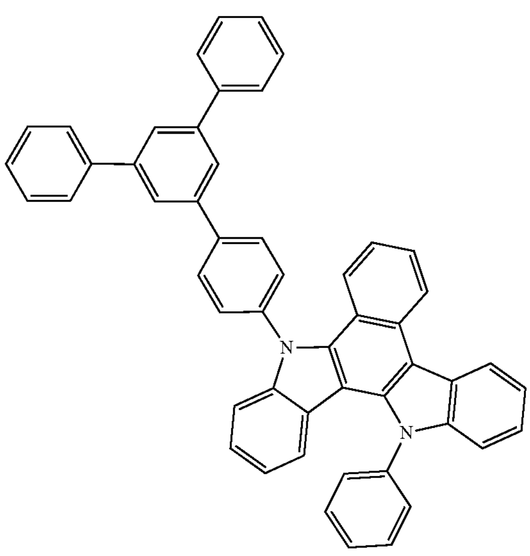
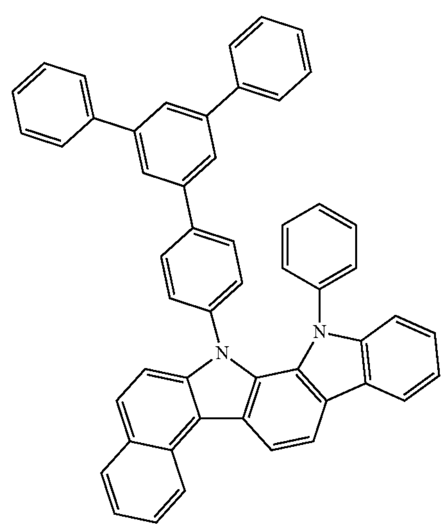

-continued
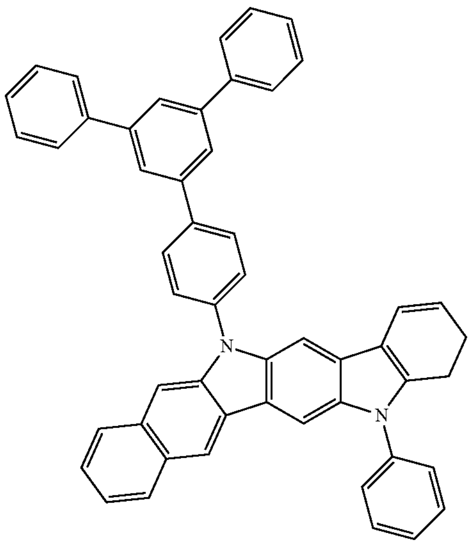
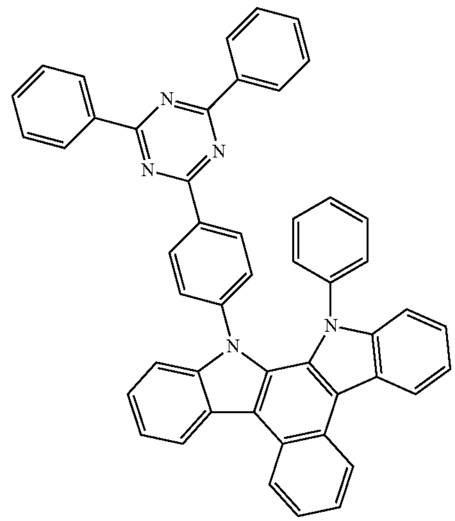
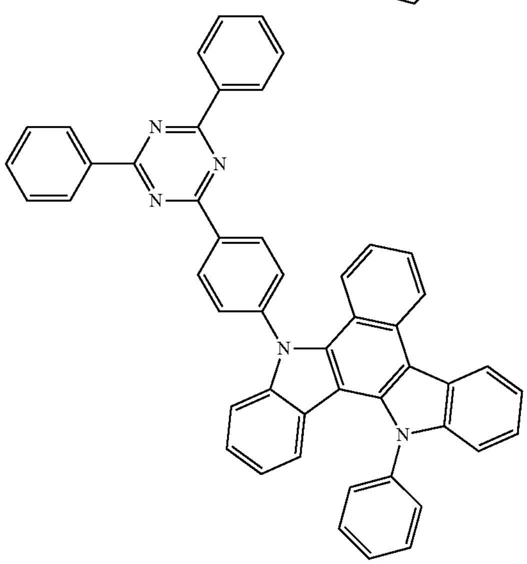
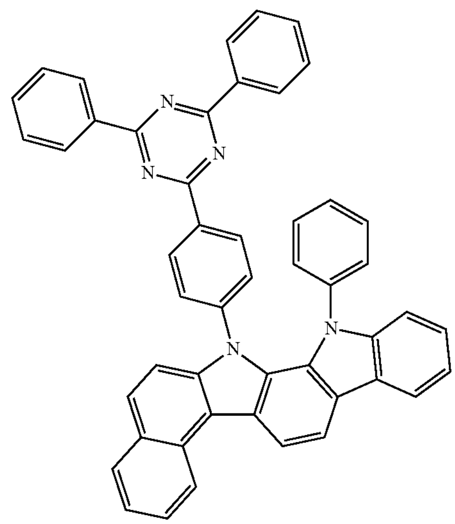
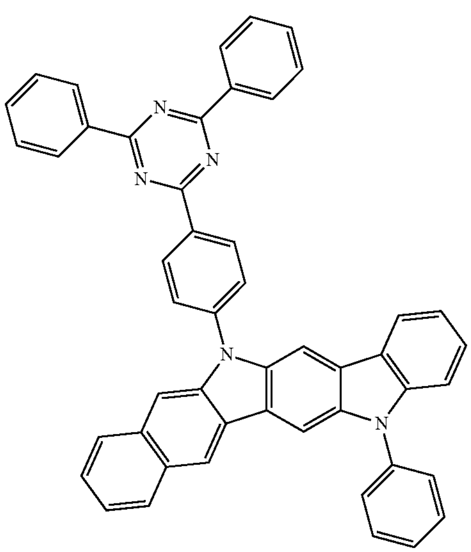
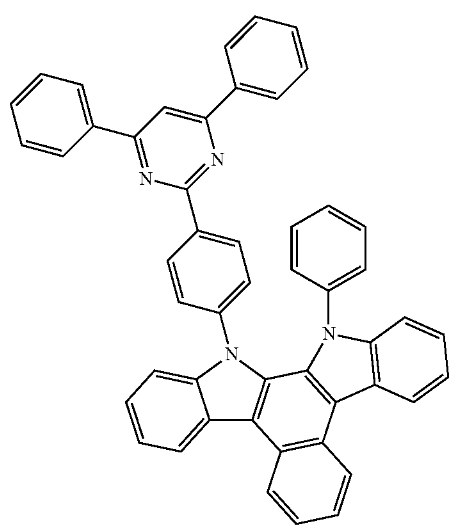

-continued
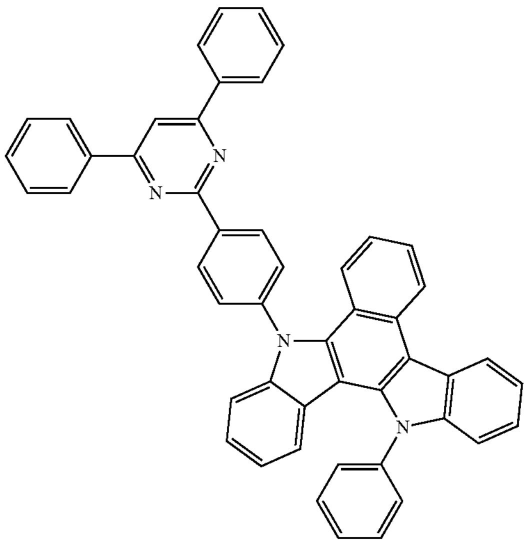
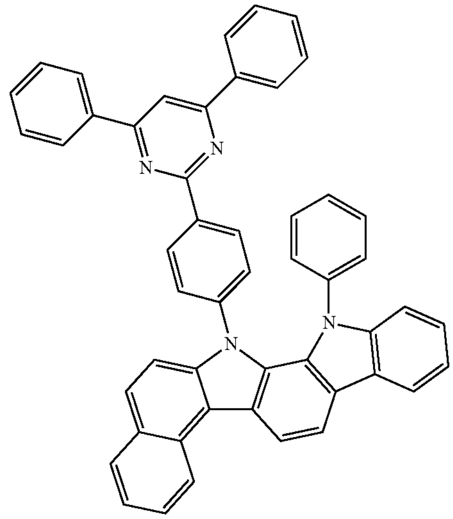
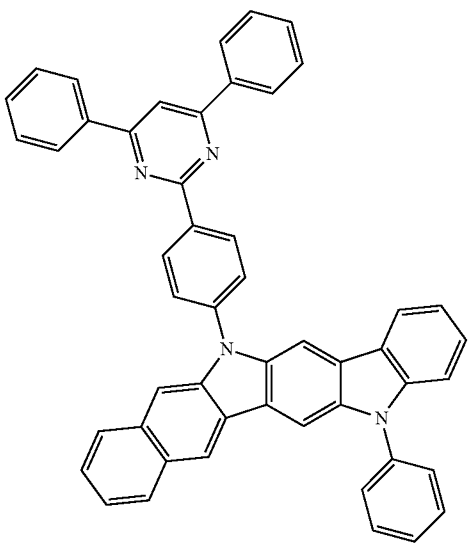
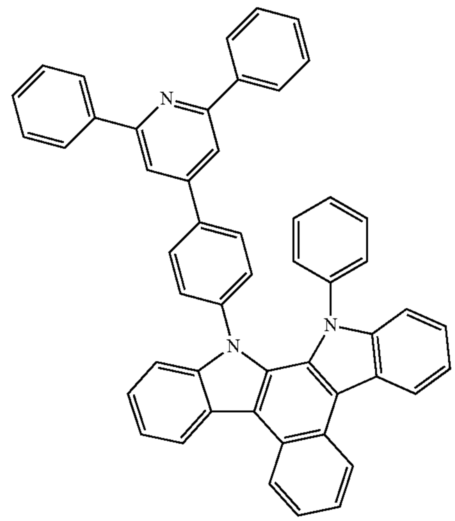
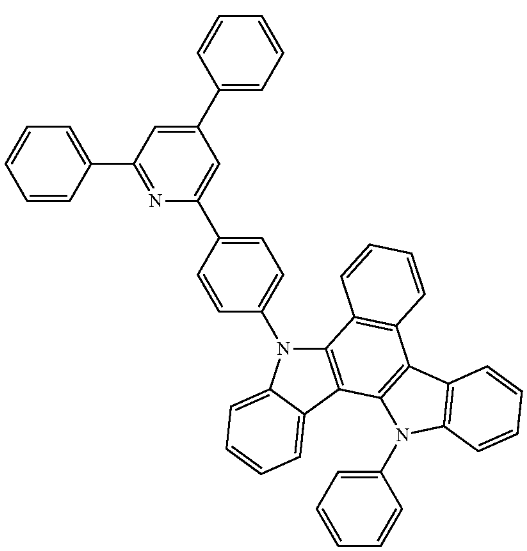
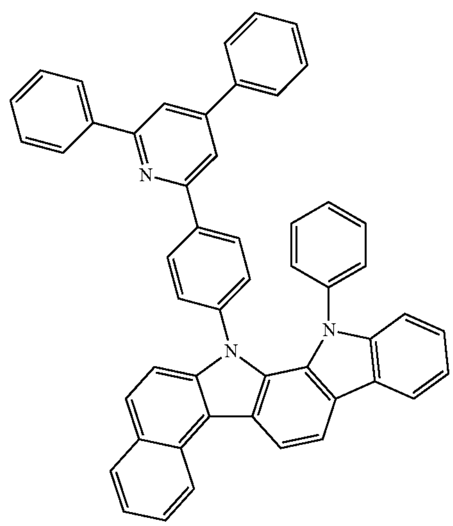

-continued
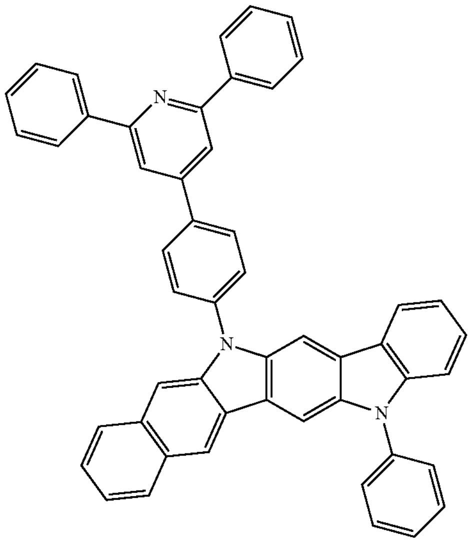
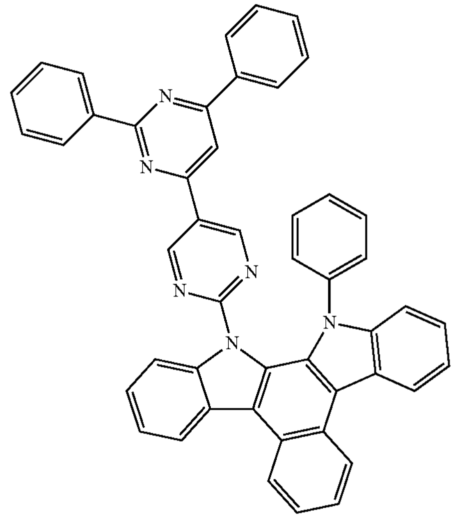
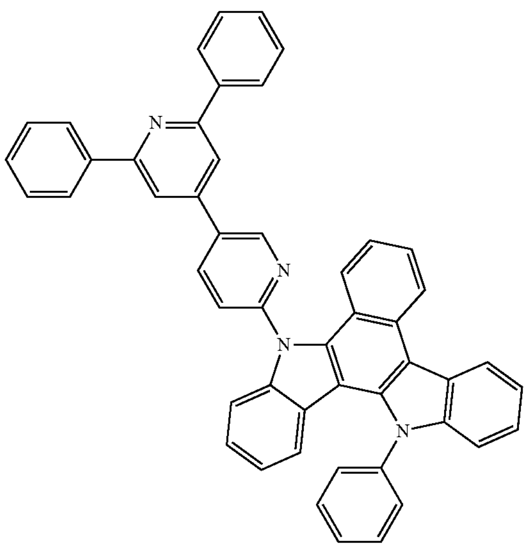
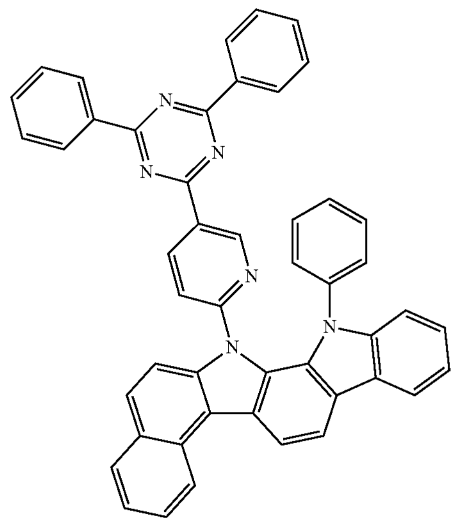
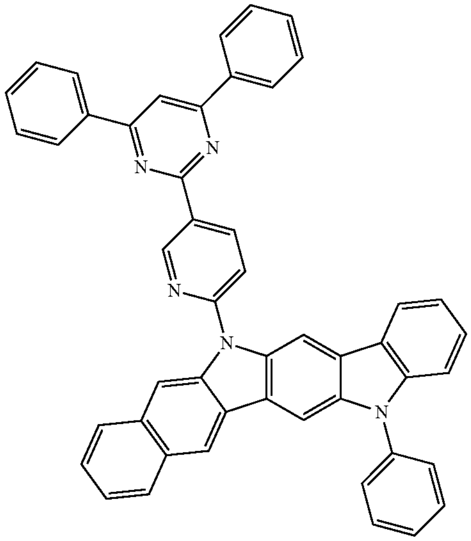
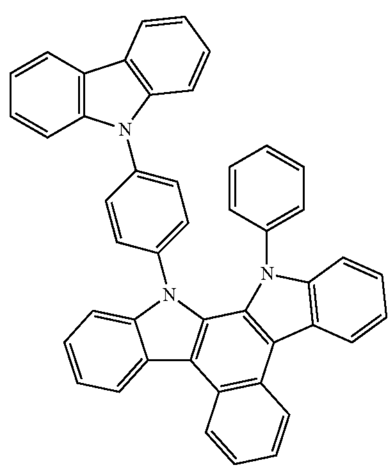

-continued
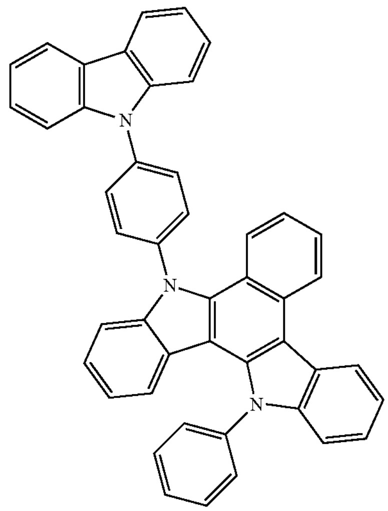
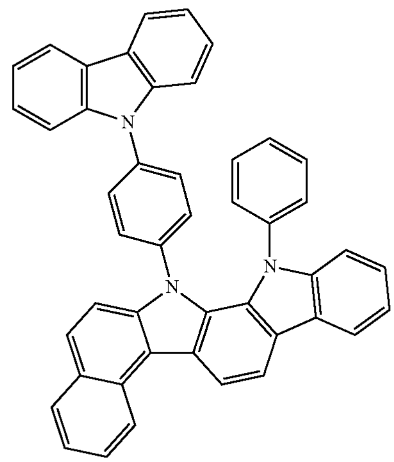
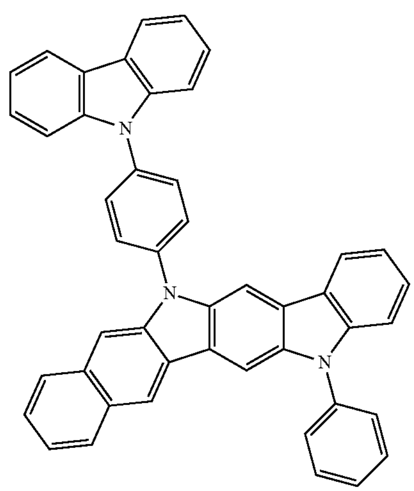
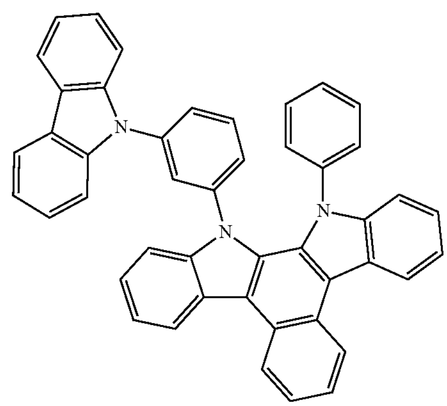
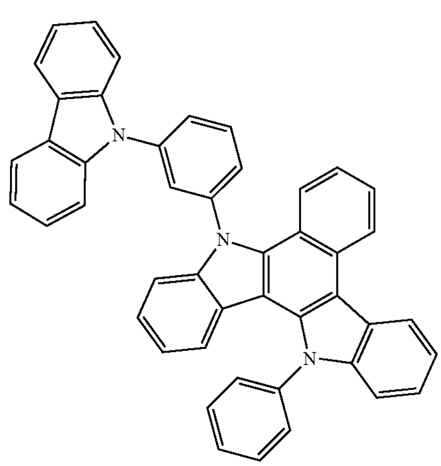
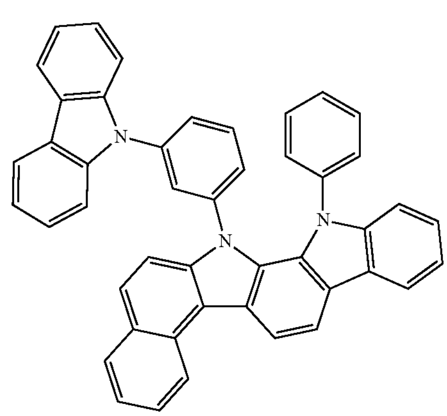

-continued
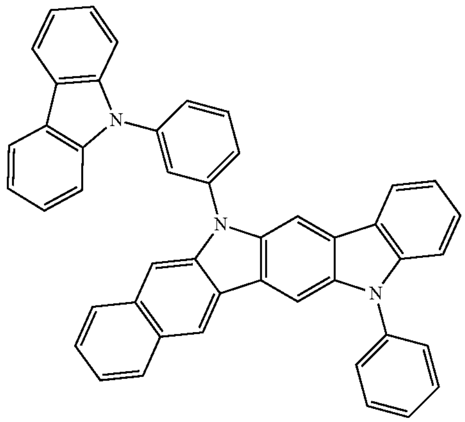
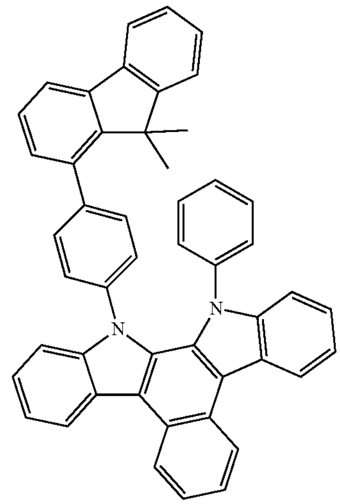
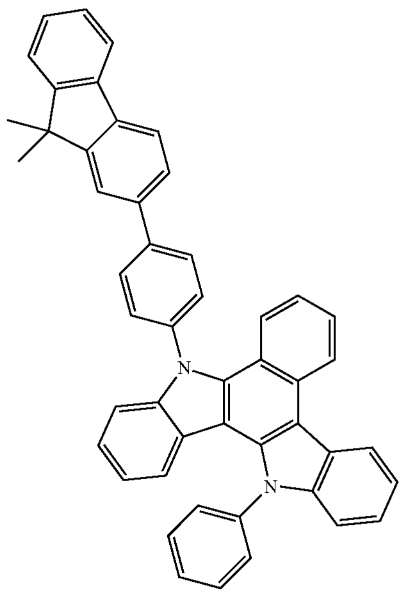
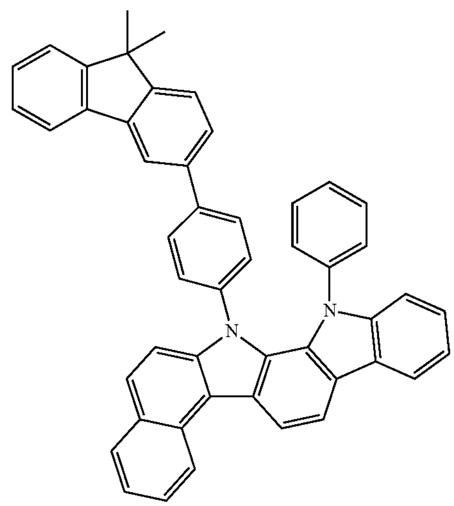
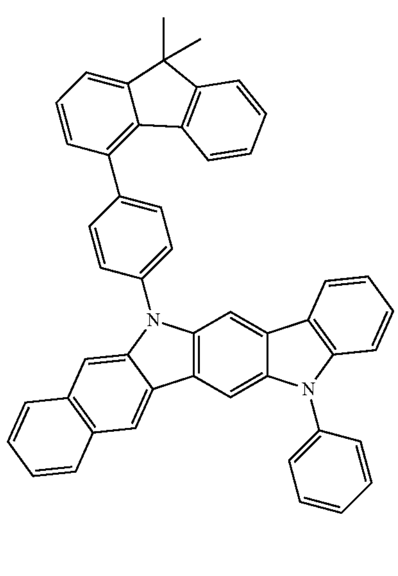
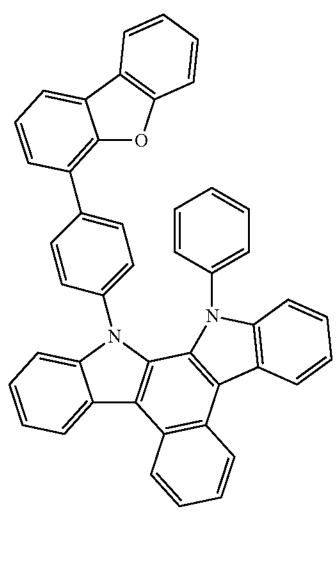
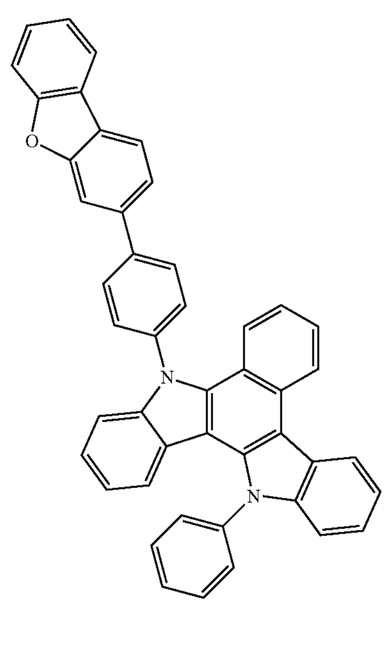

-continued
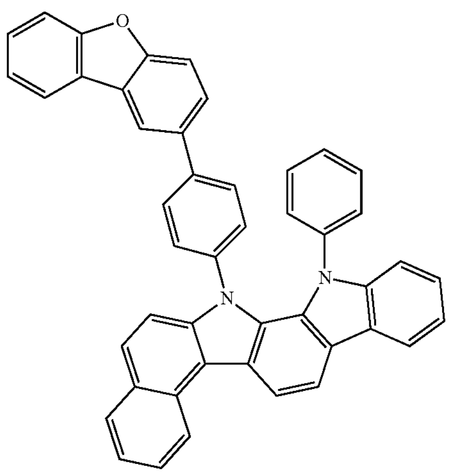
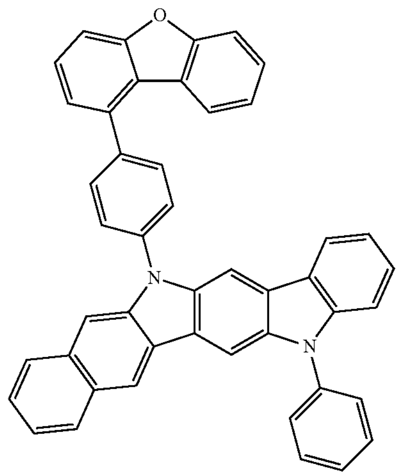
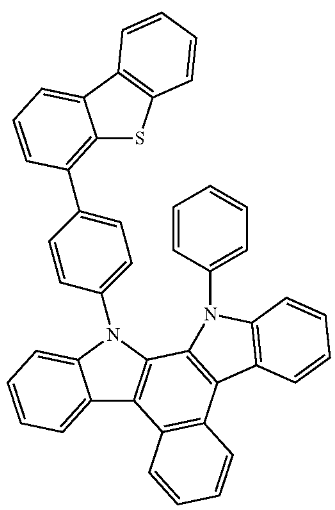
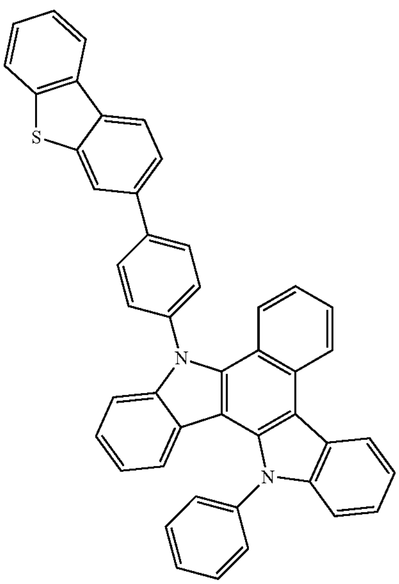
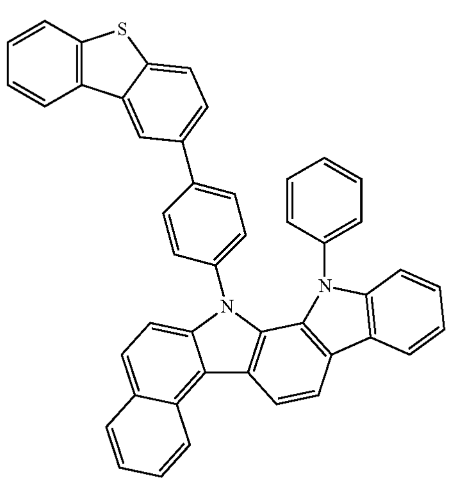
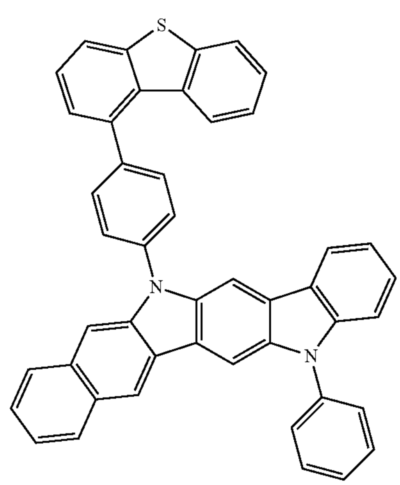

-continued
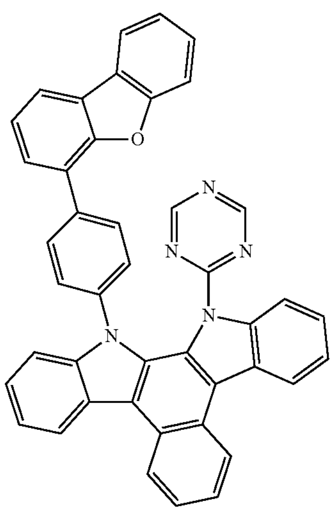
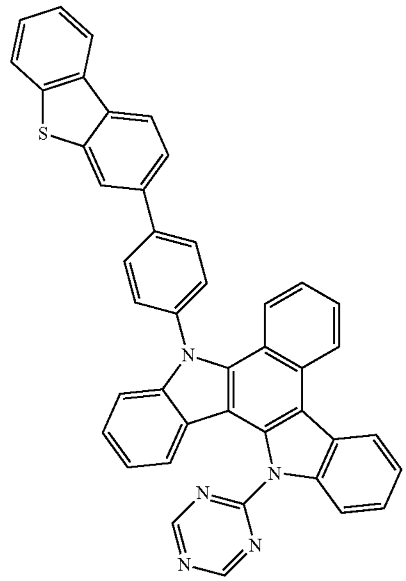
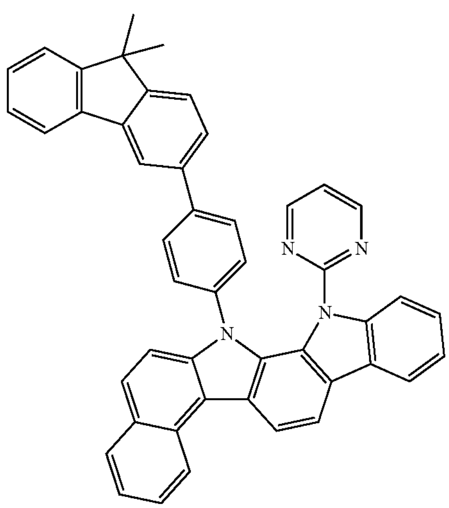
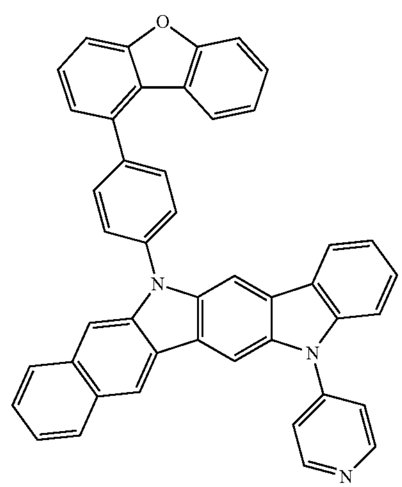
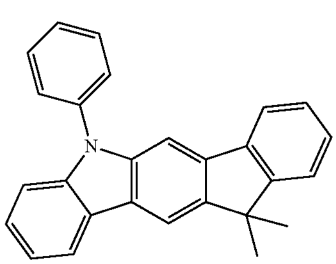
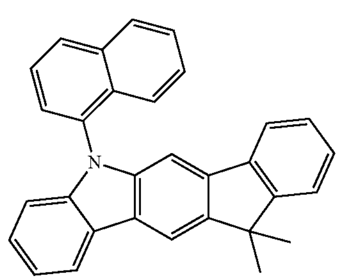
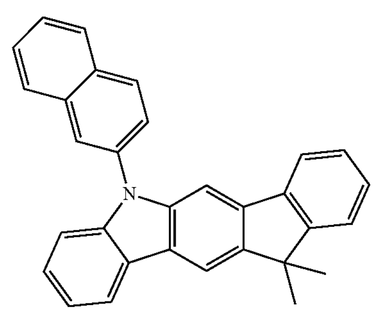

-continued
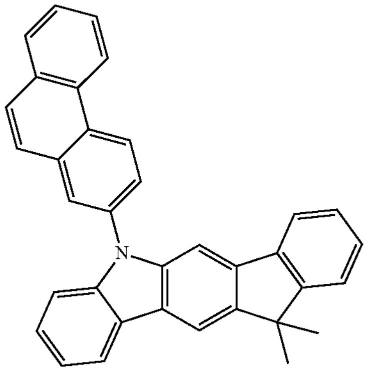
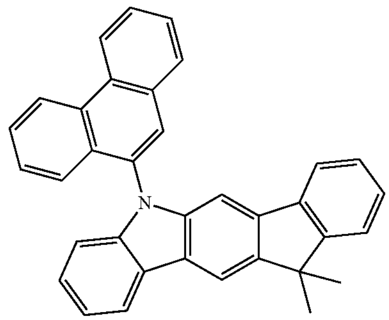
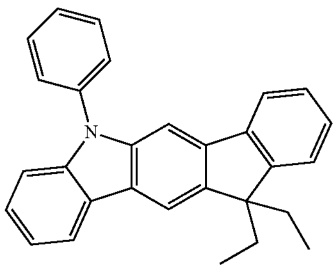
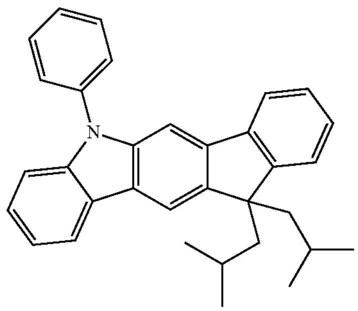
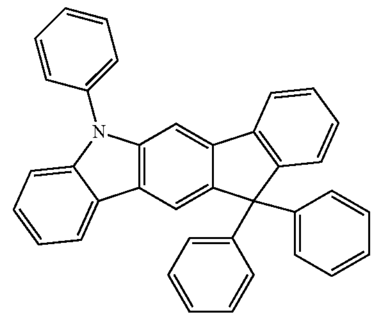
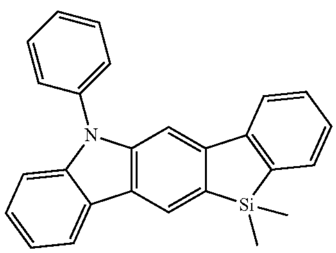
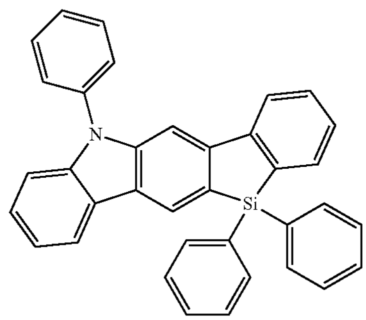
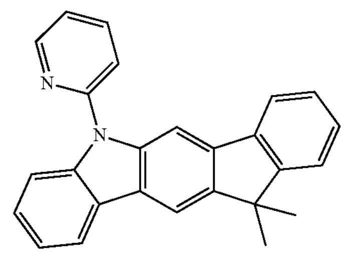
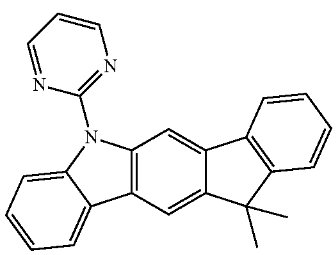
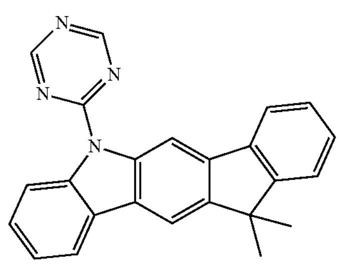
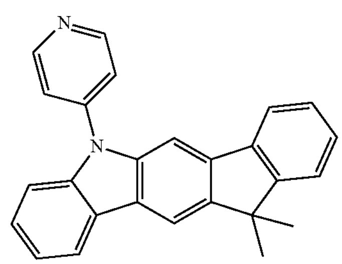
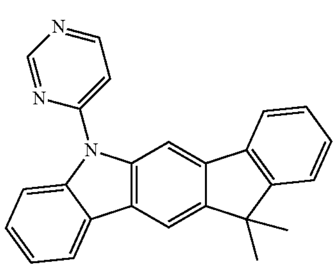
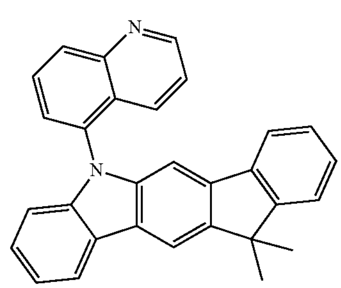
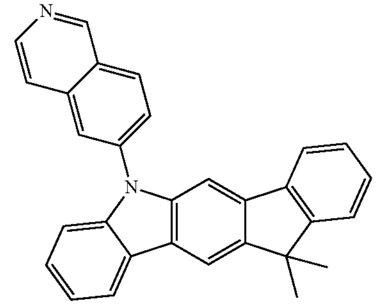

-continued
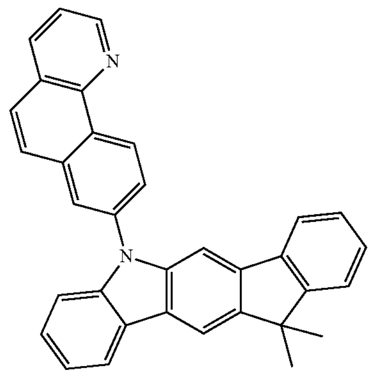
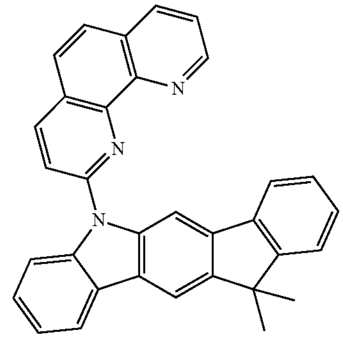
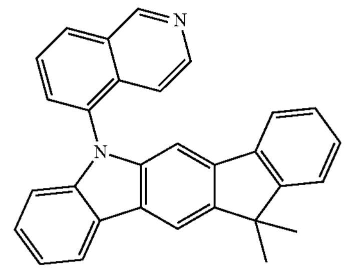
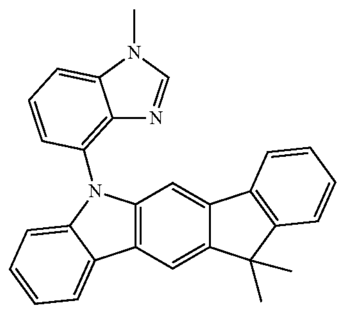
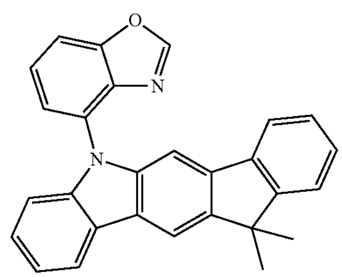
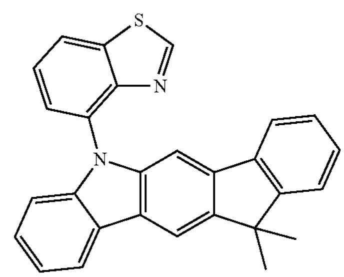
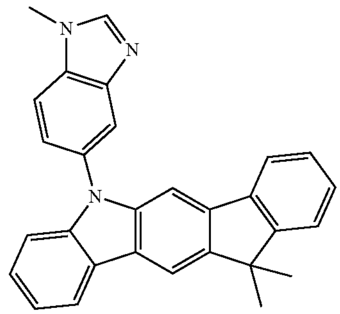
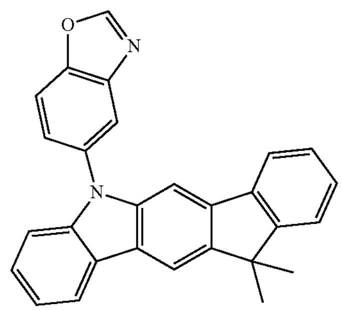
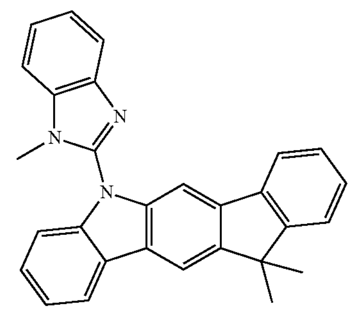
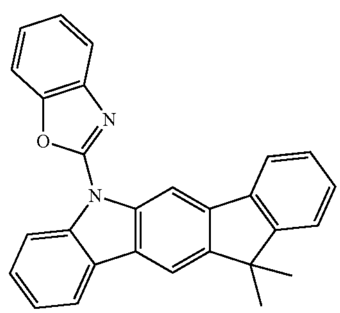
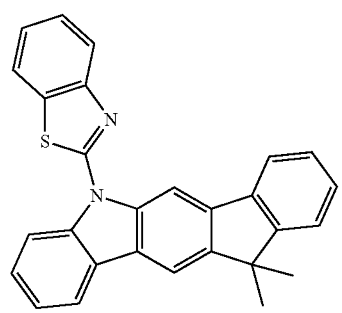
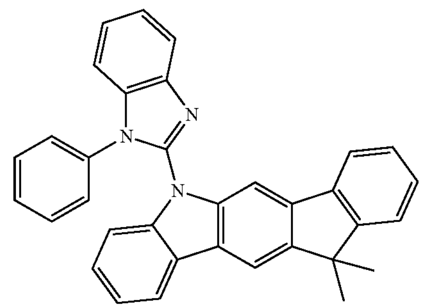
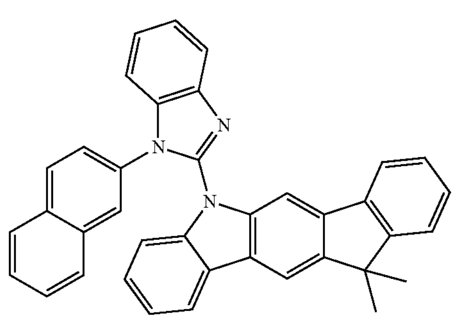
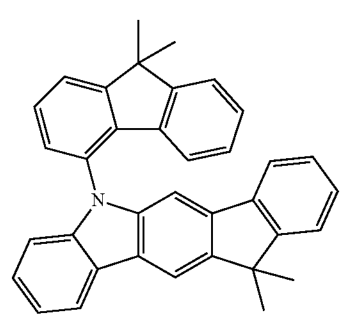

-continued
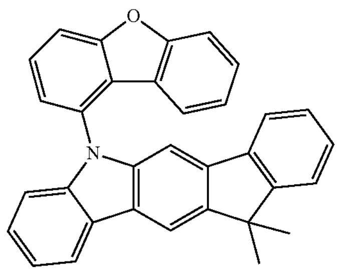
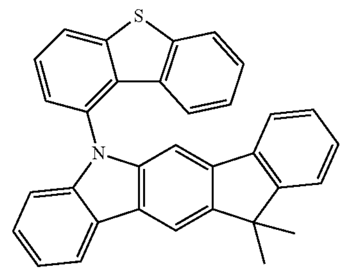
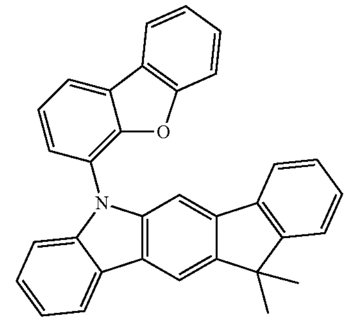
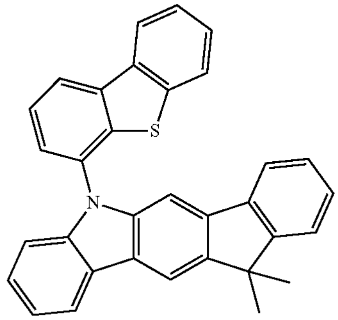
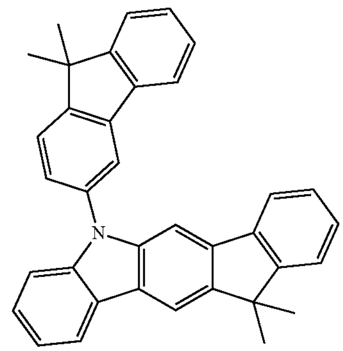
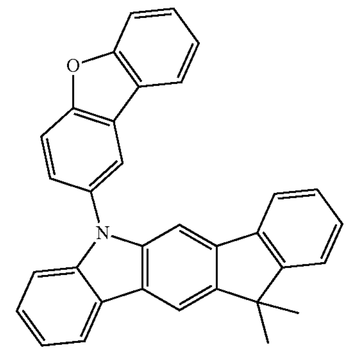
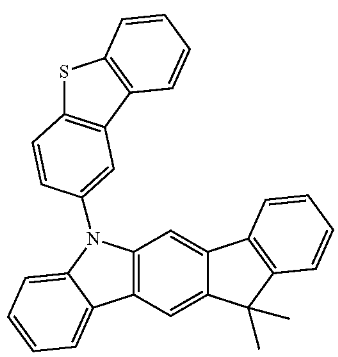
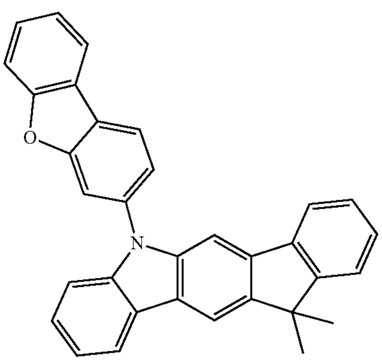
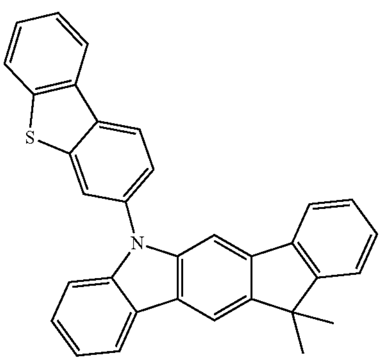
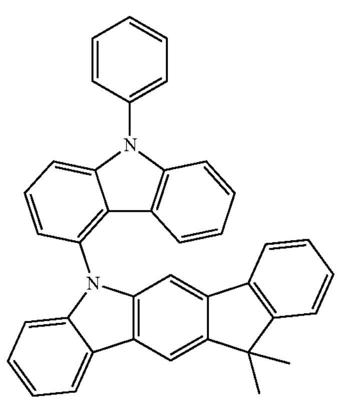
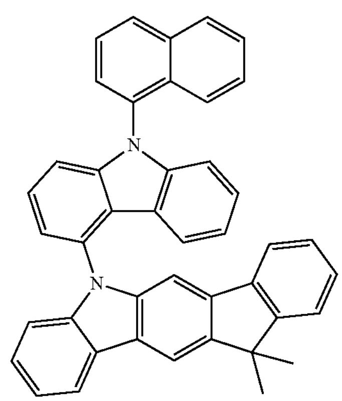
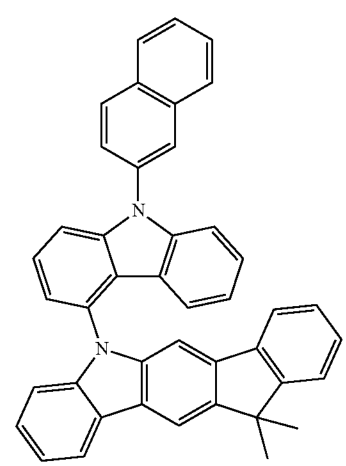

-continued
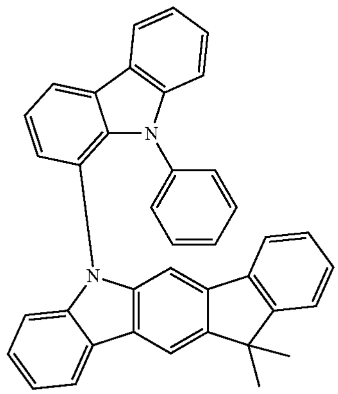
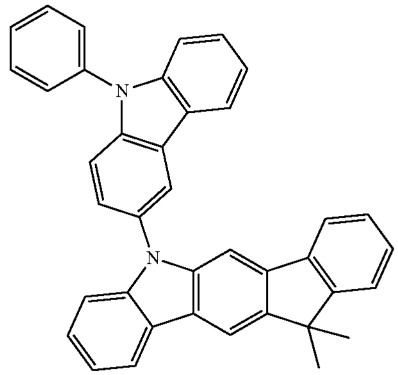
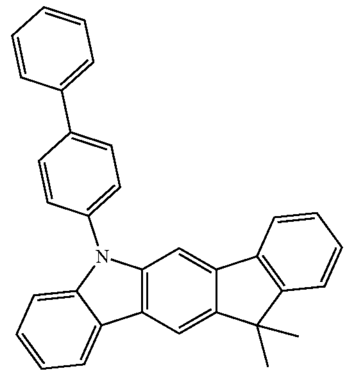
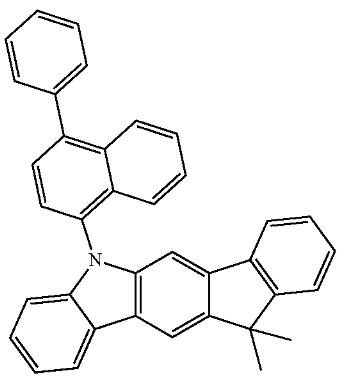
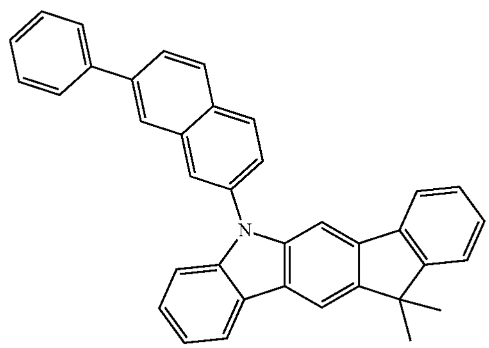
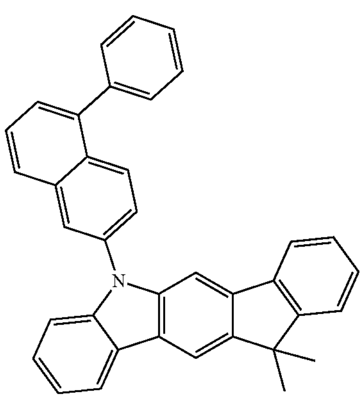
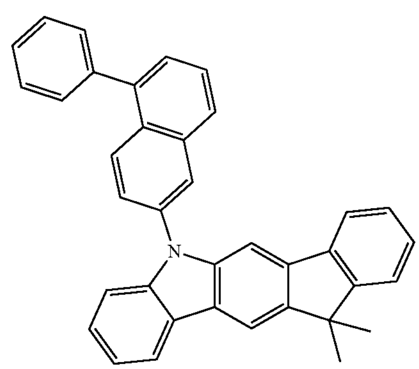
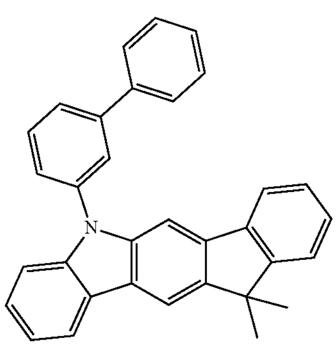
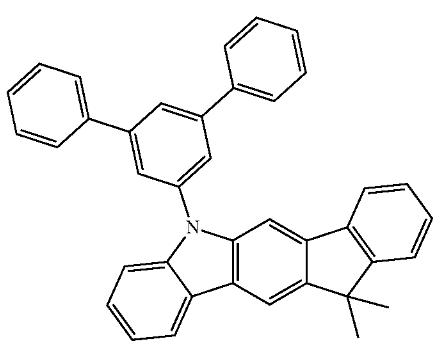

-continued
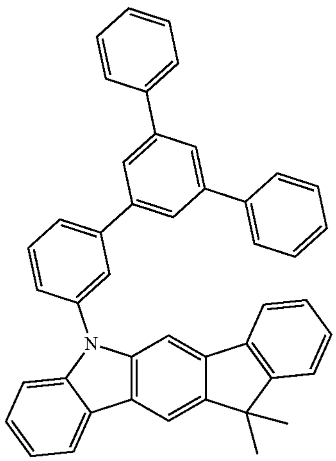
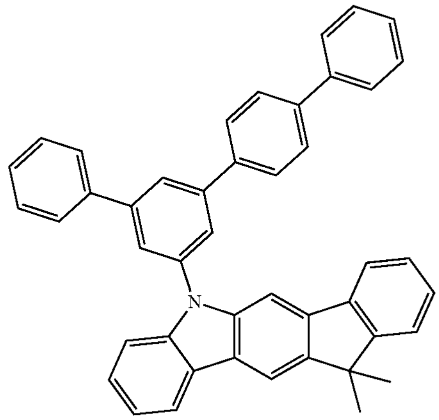
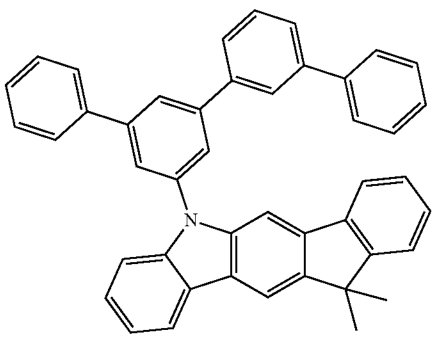
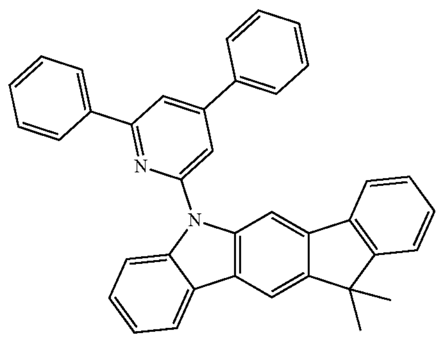
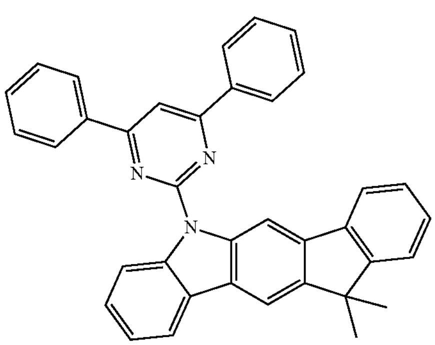
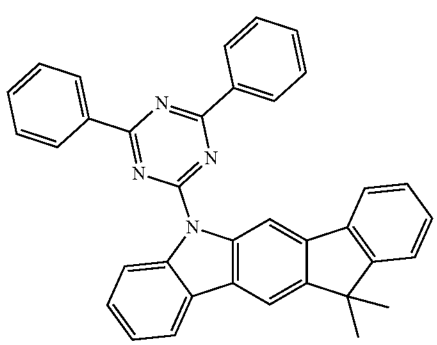
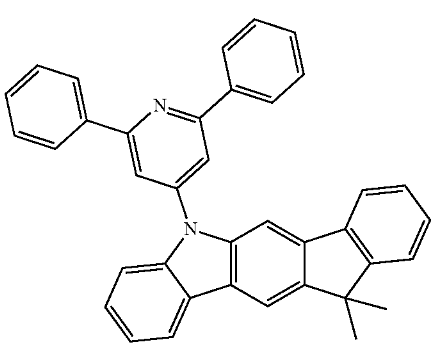
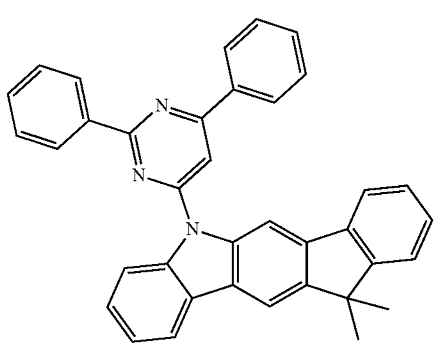

-continued
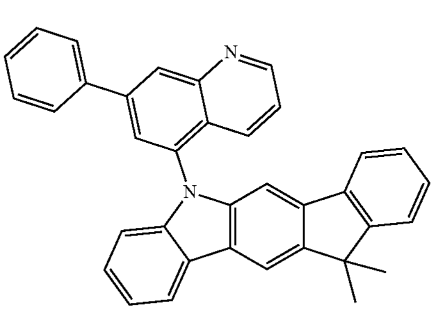
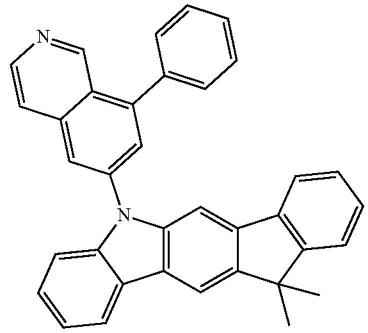
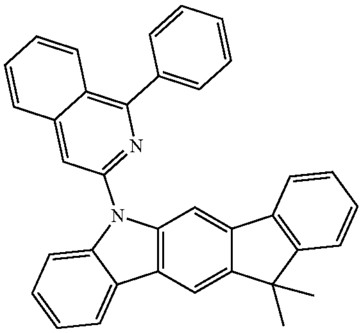
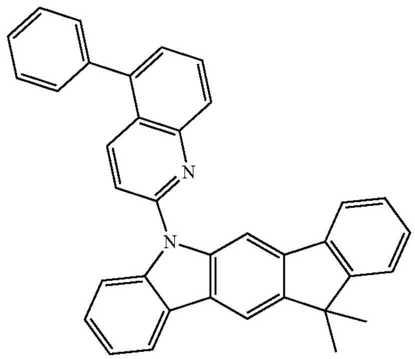
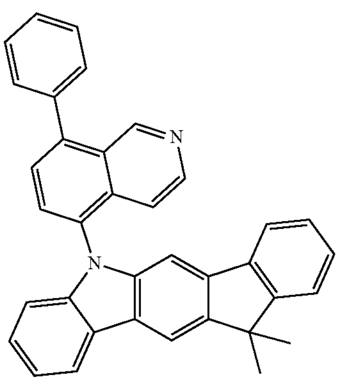
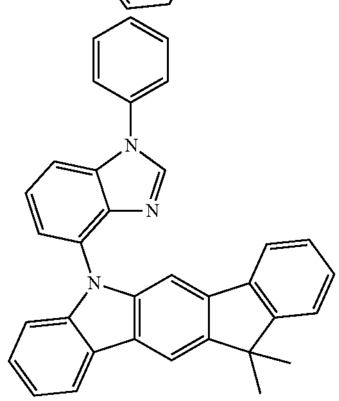
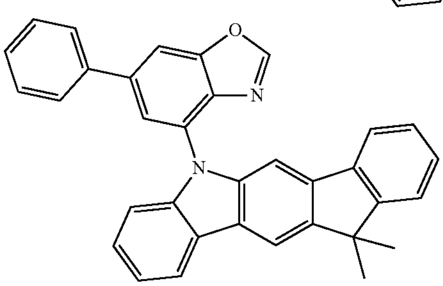
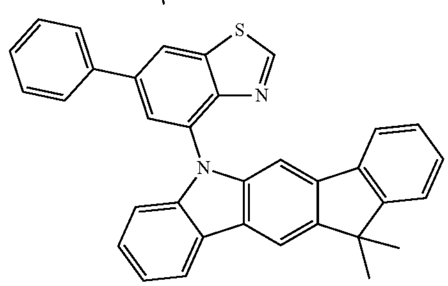
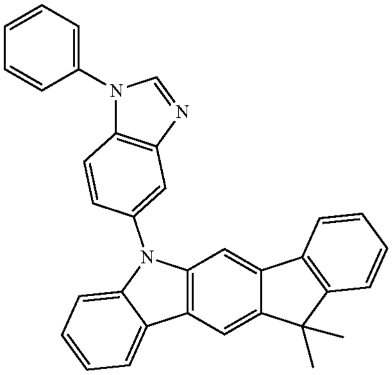
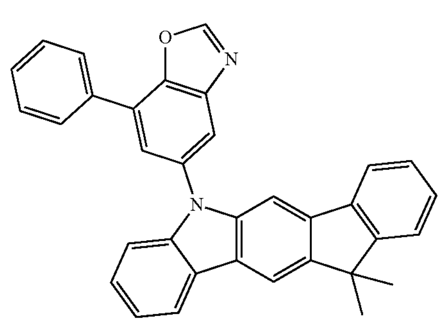

-continued
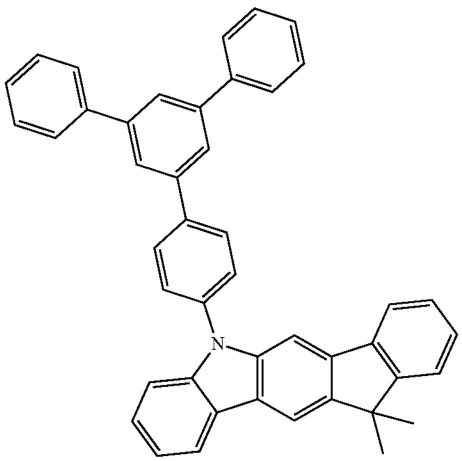
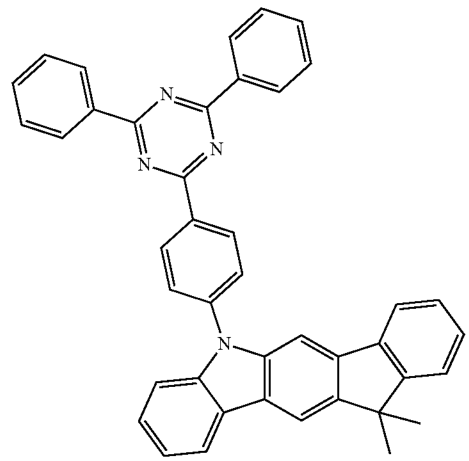
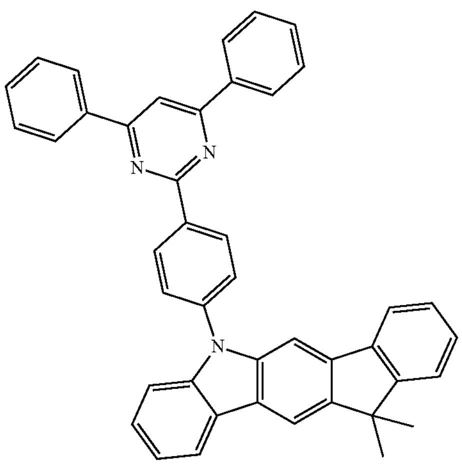
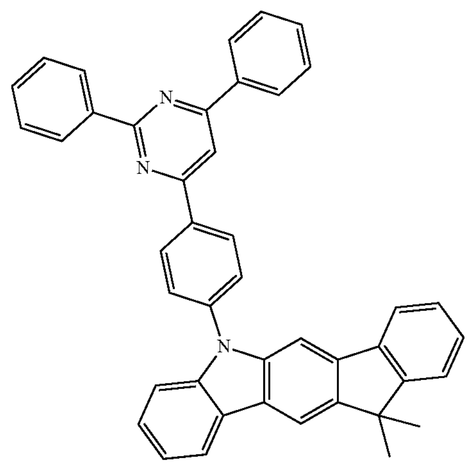
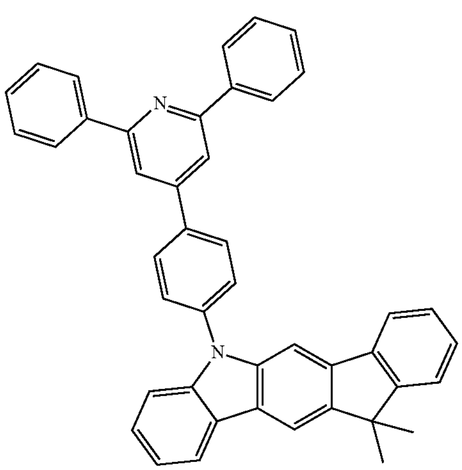
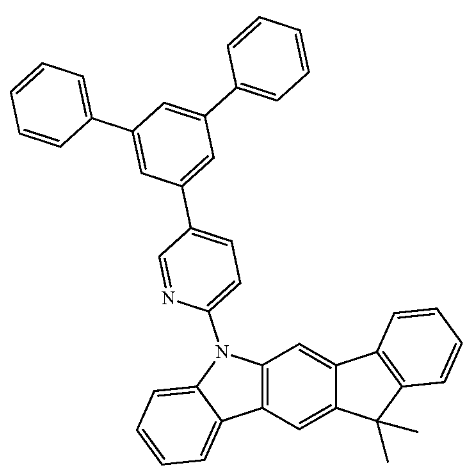

-continued
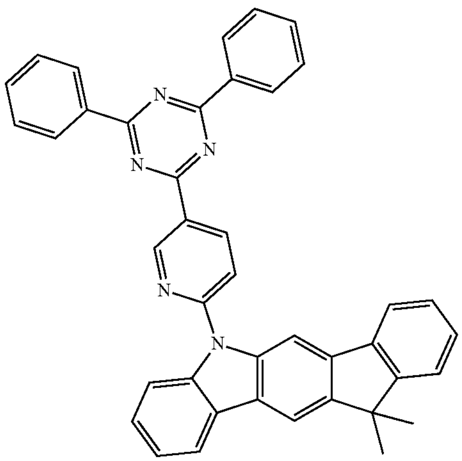
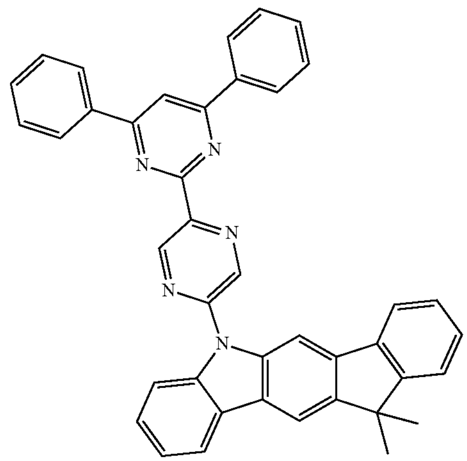
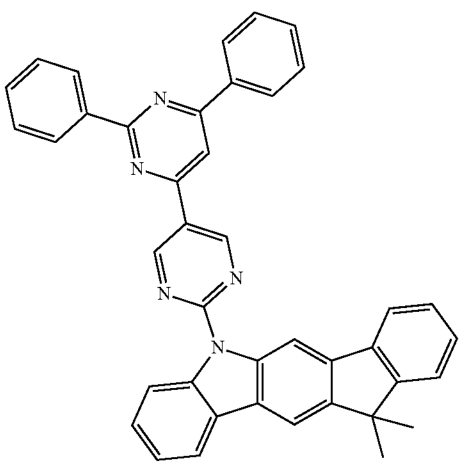
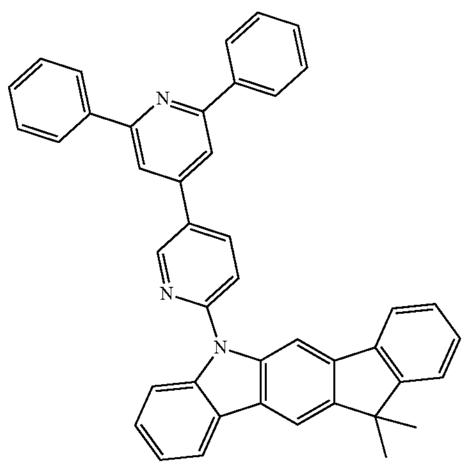
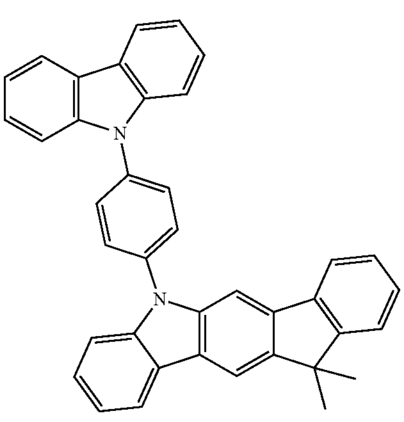
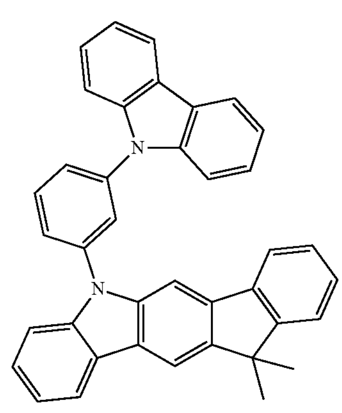

-continued
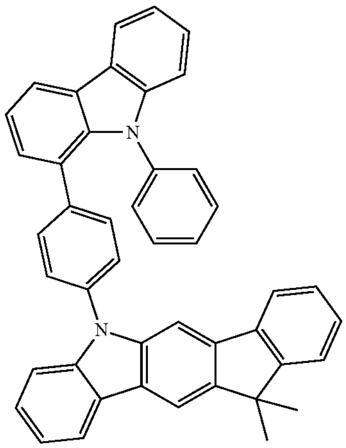
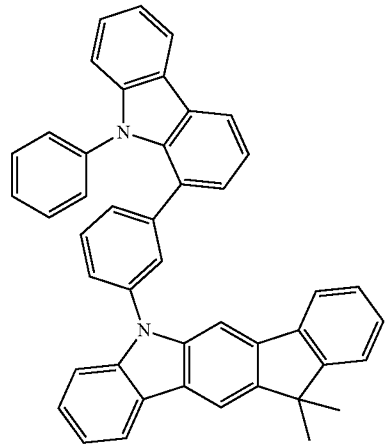
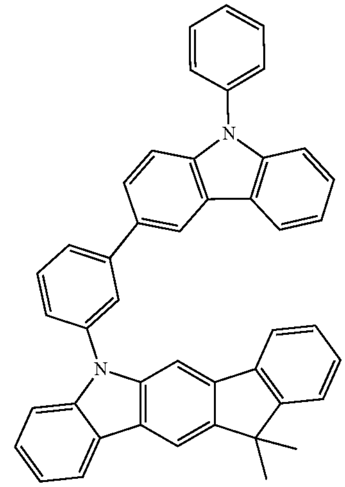
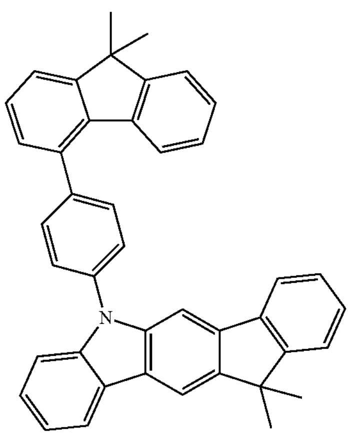
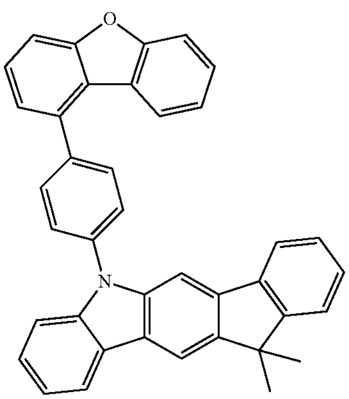
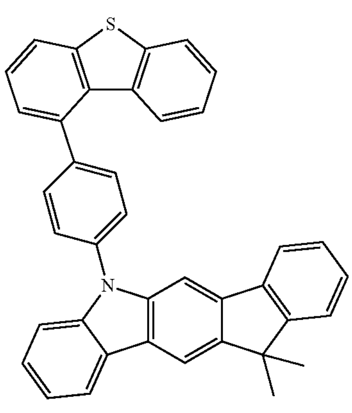
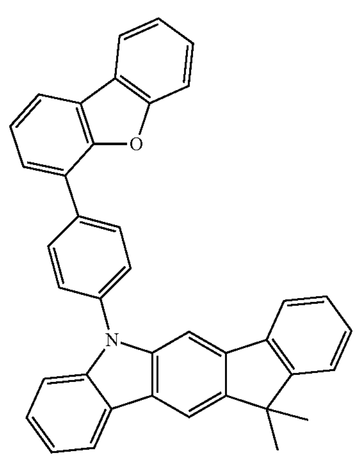

-continued
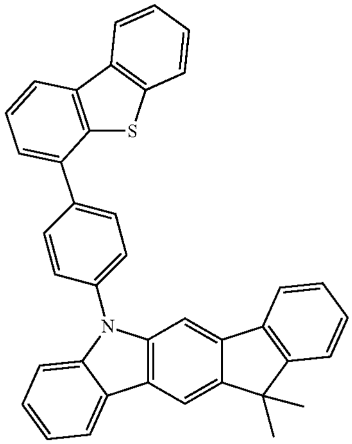
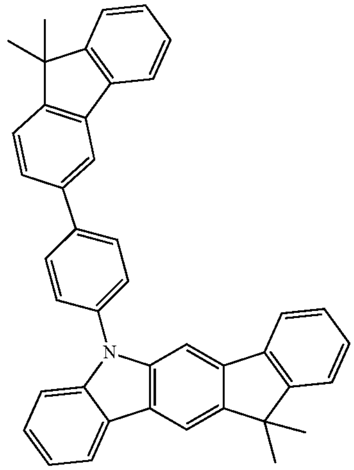
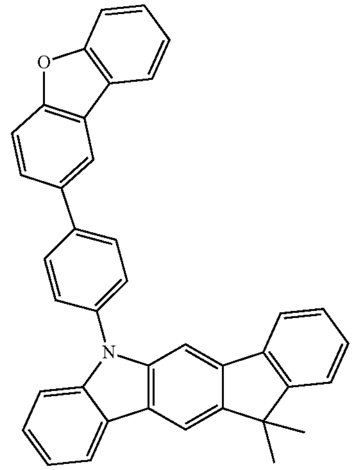
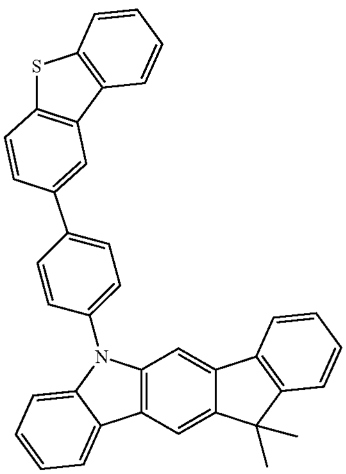
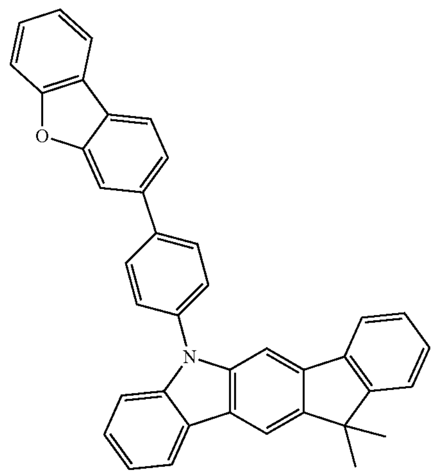
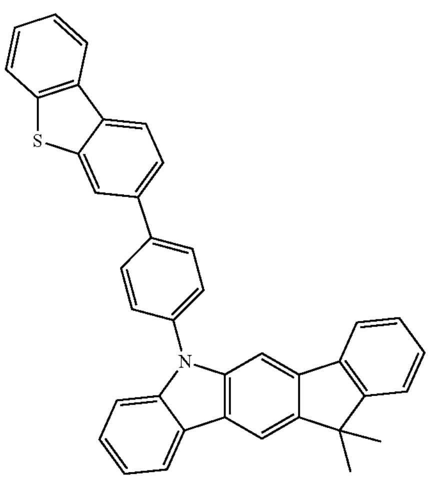
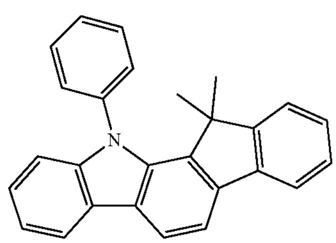

-continued
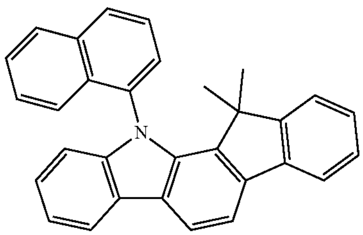
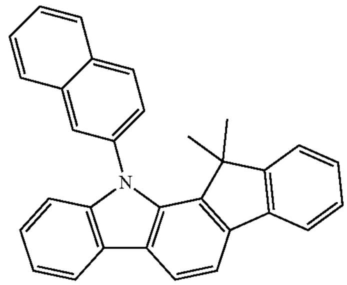
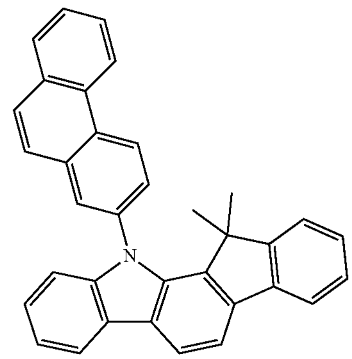
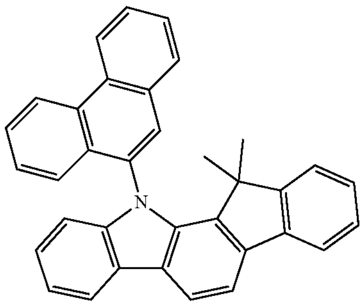
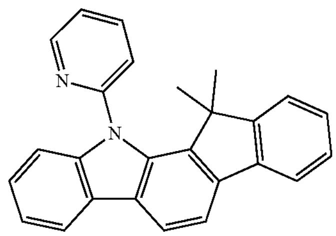
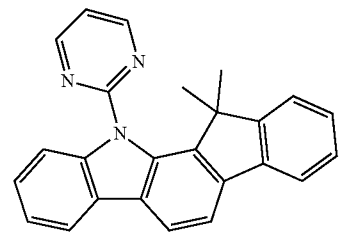
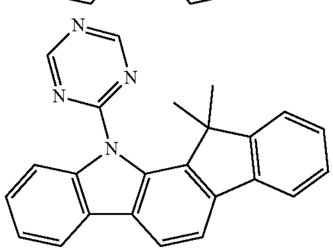
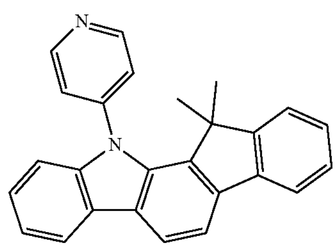
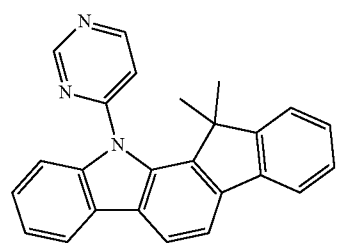
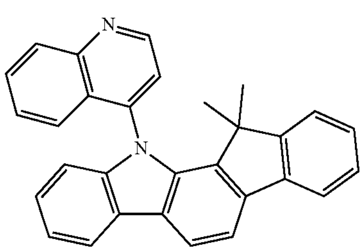
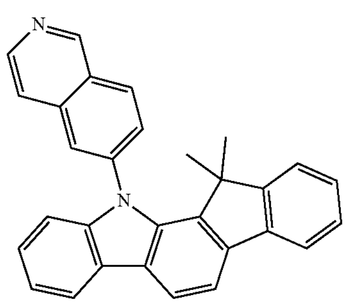
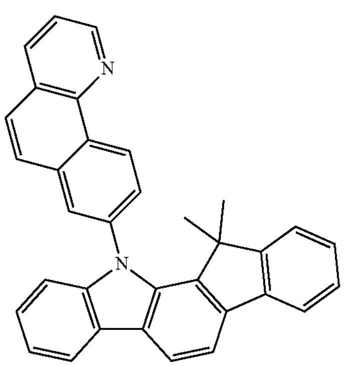
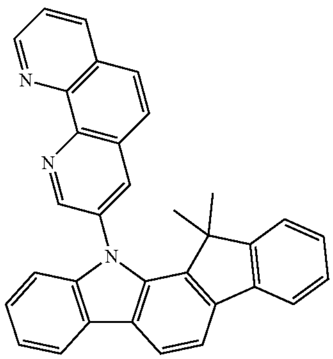
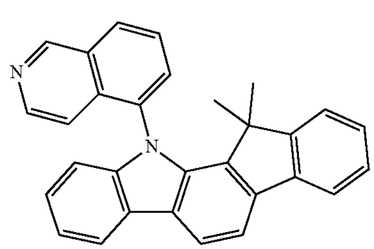
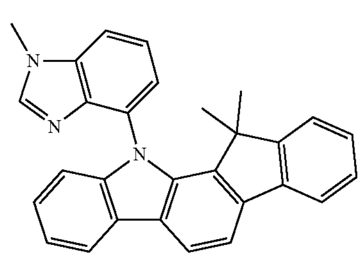

-continued
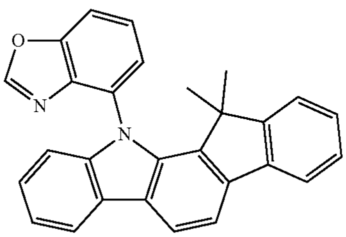
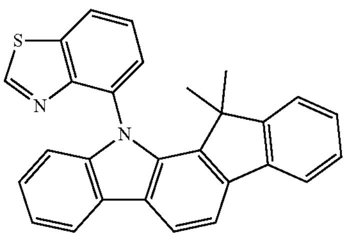
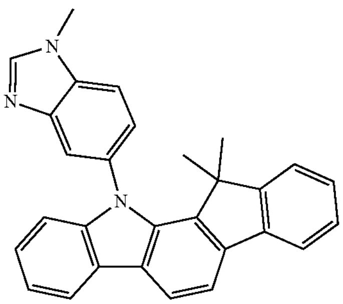
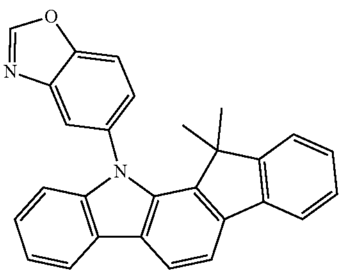
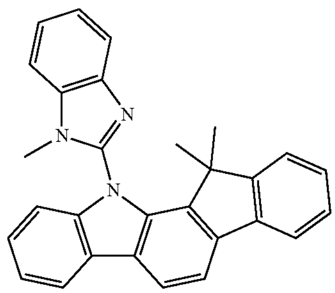
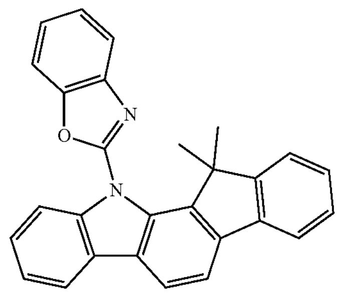
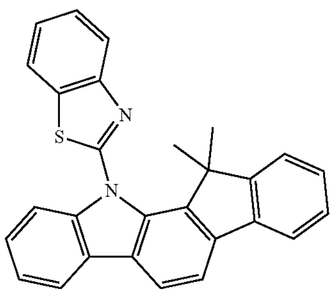
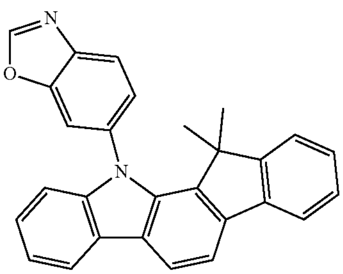
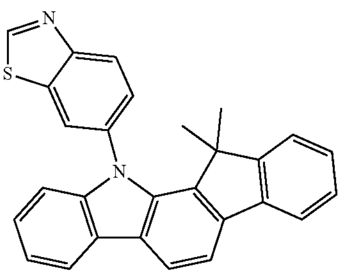
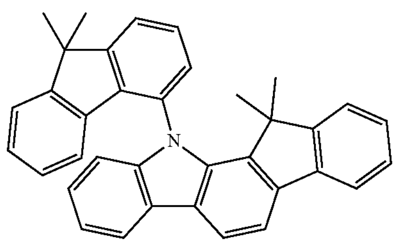
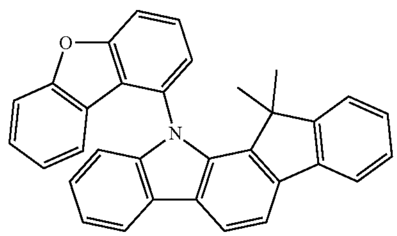
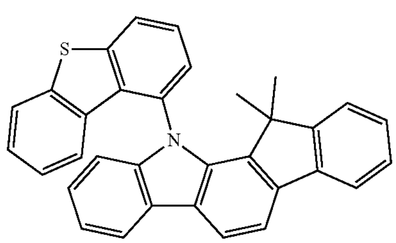
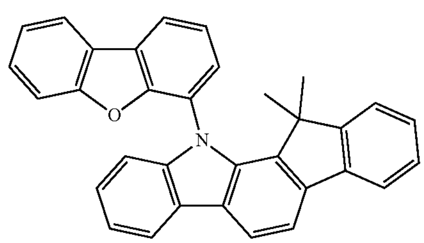
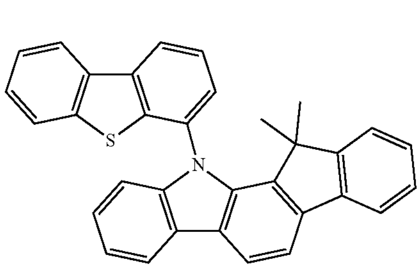
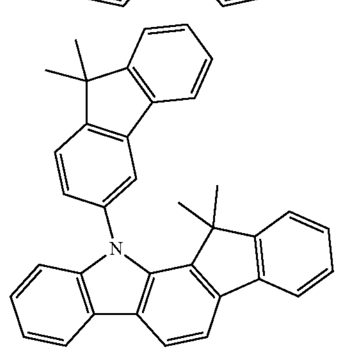

-continued
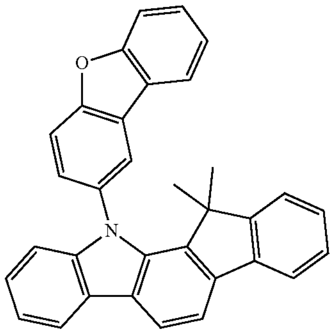
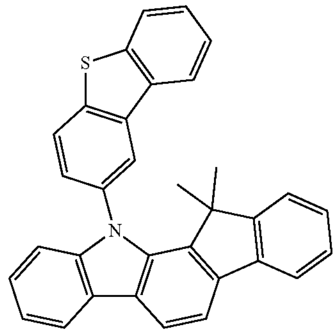
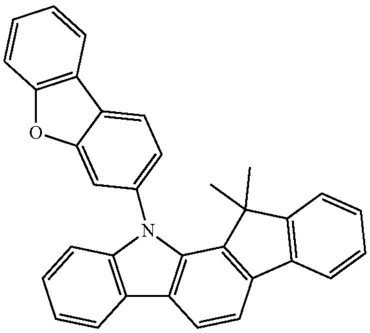
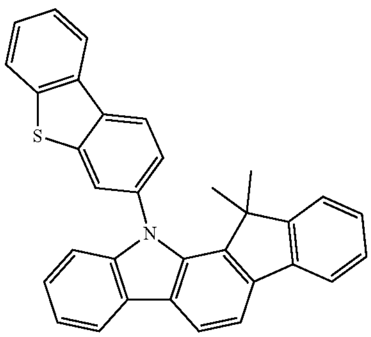
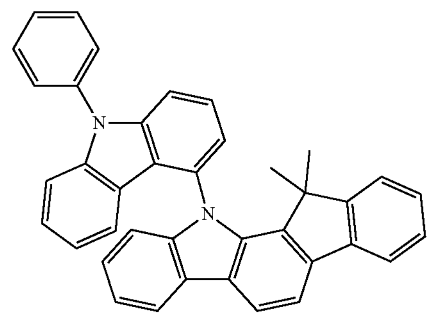
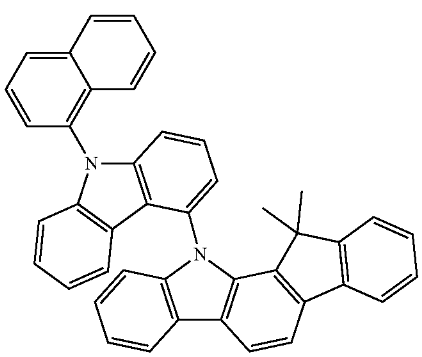
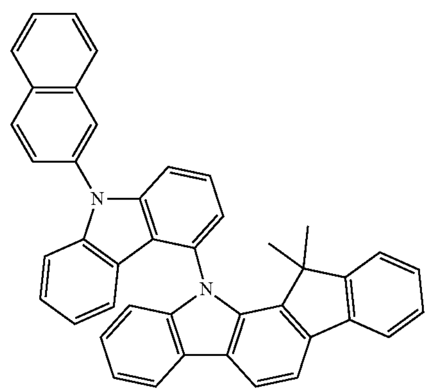
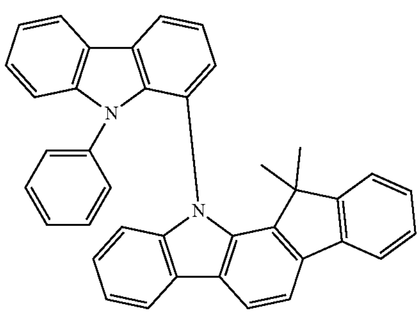
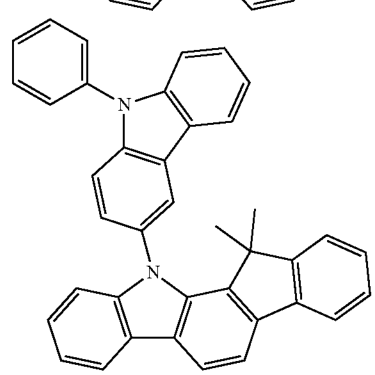
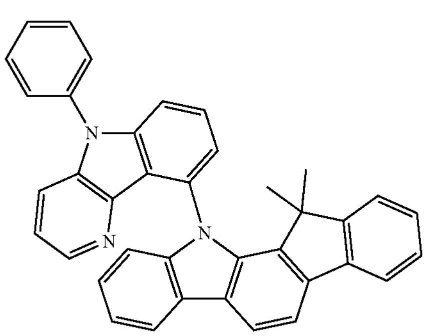
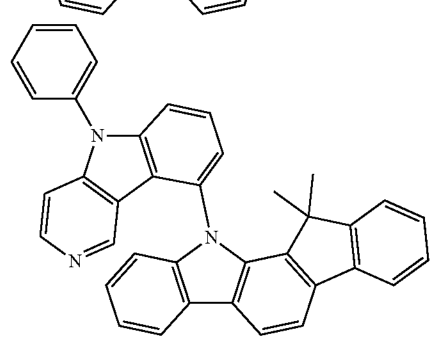

-continued
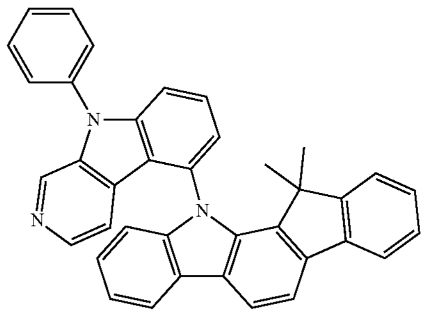
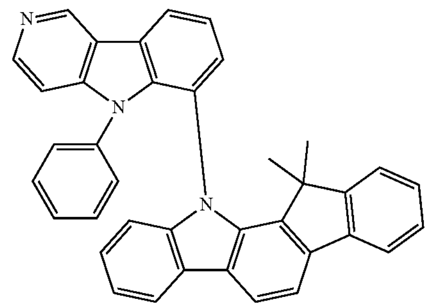
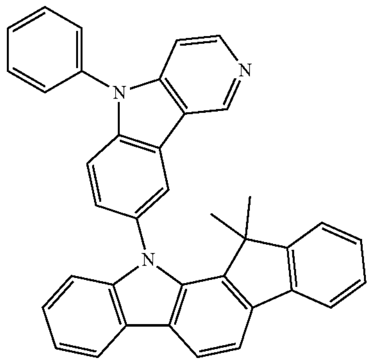
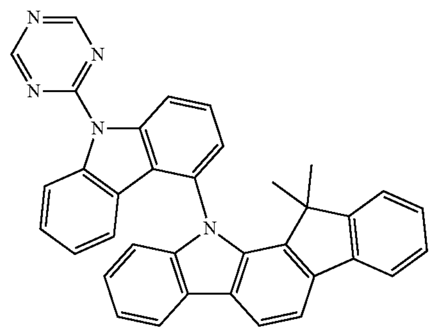
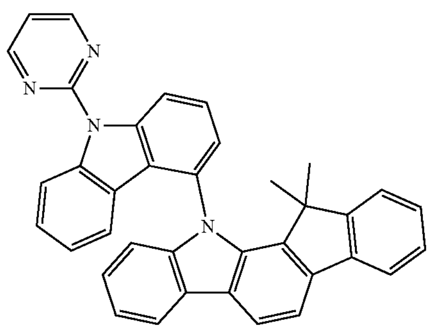
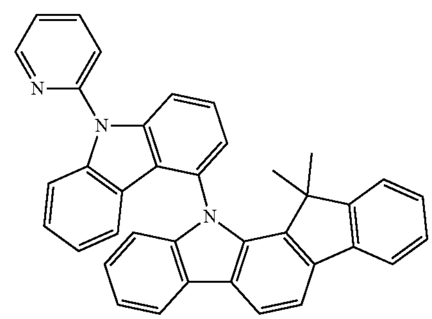
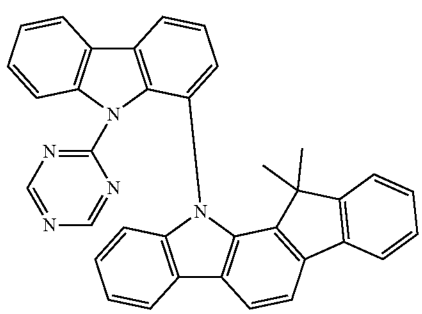
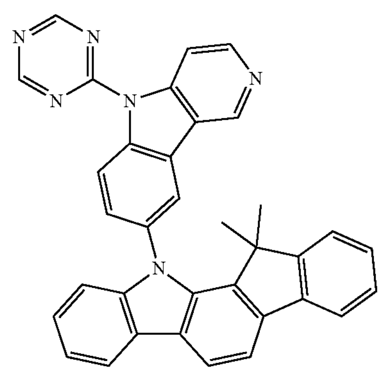
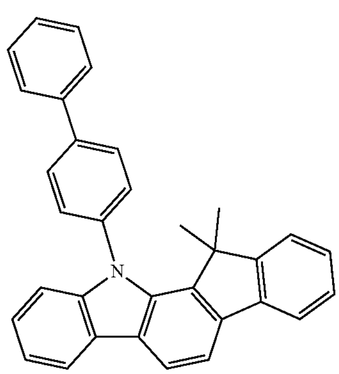
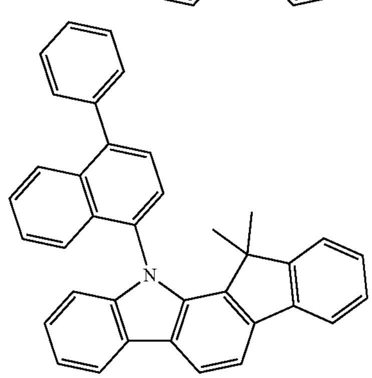

-continued
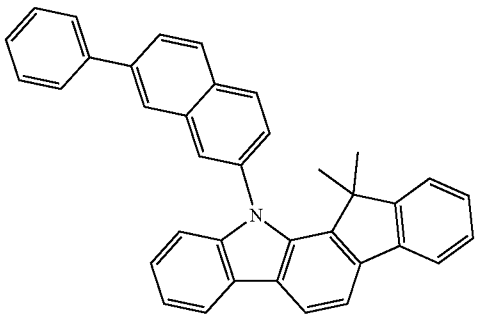
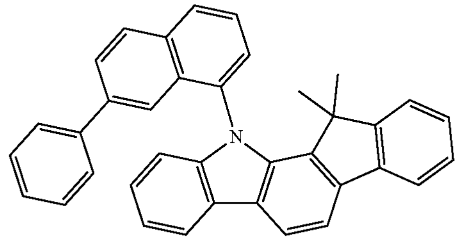
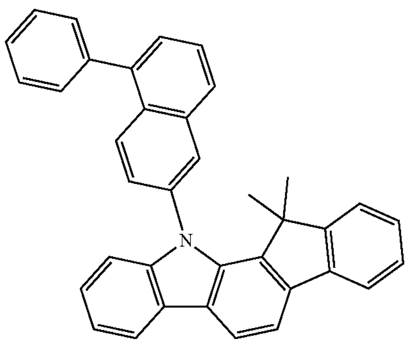
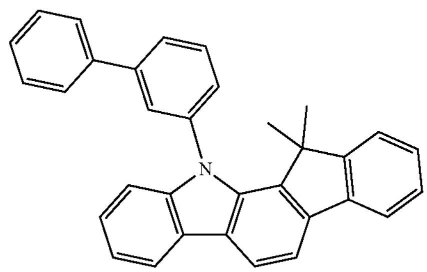
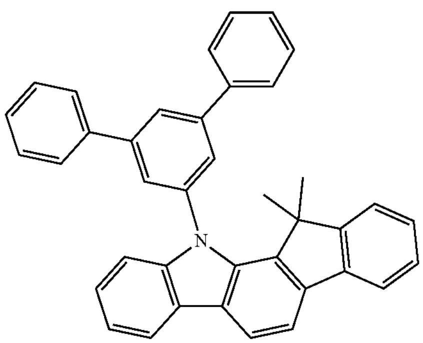
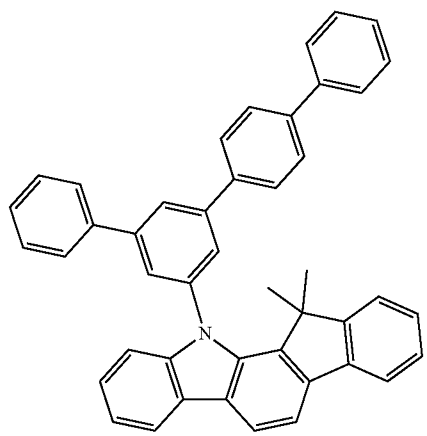
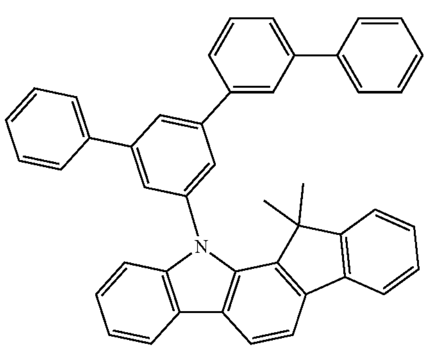
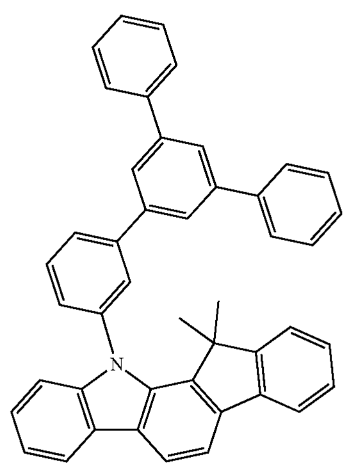

-continued
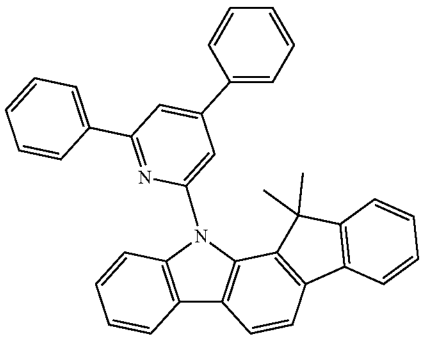
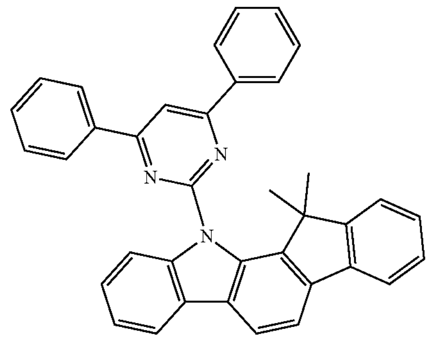
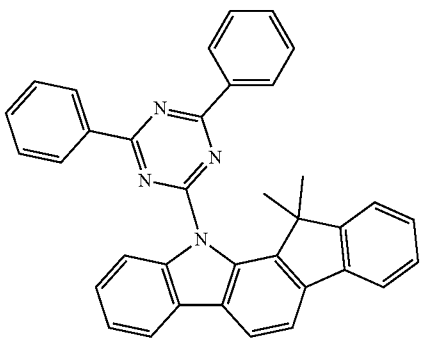
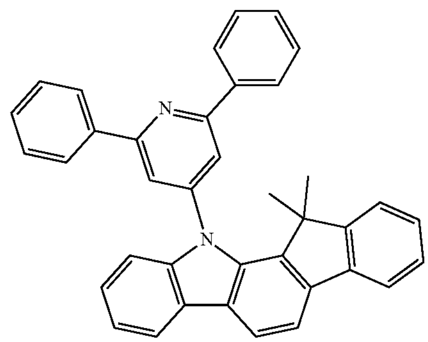
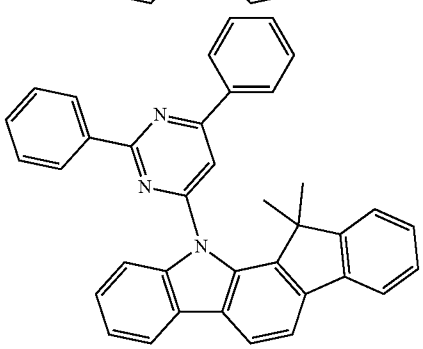
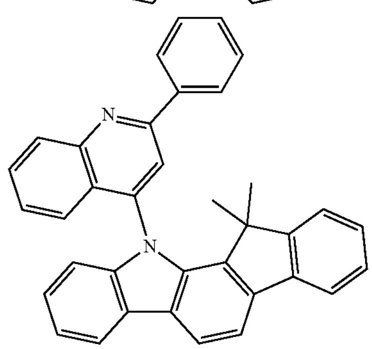
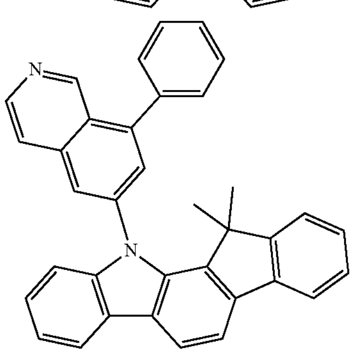
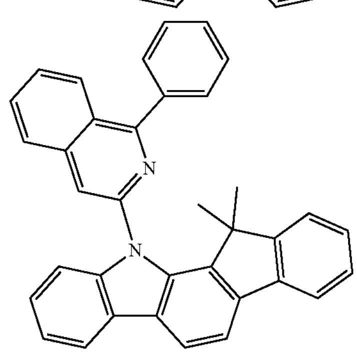
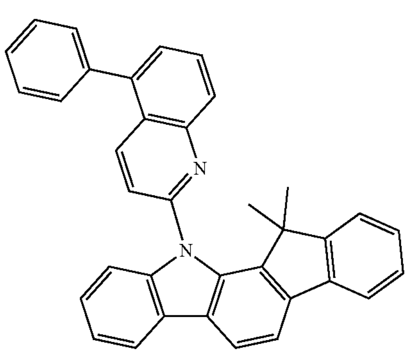
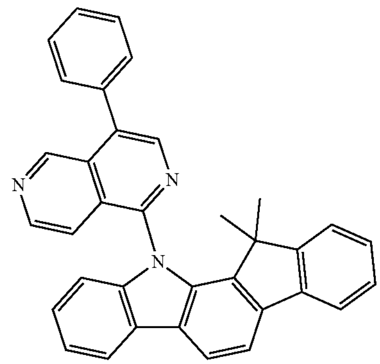

-continued
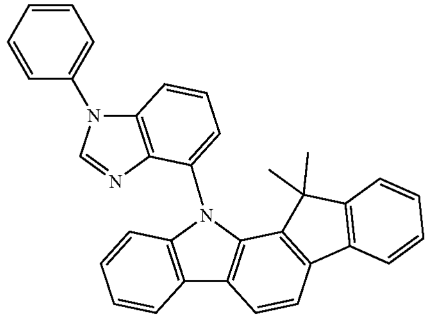
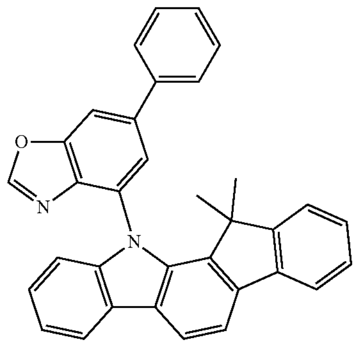
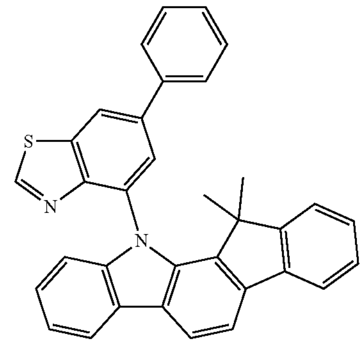
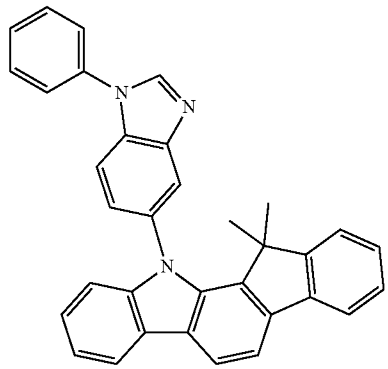
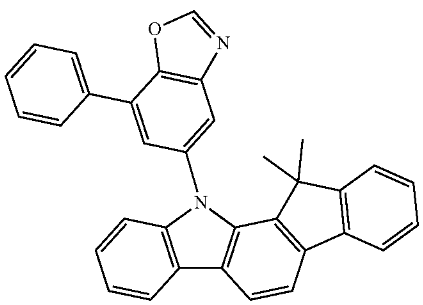
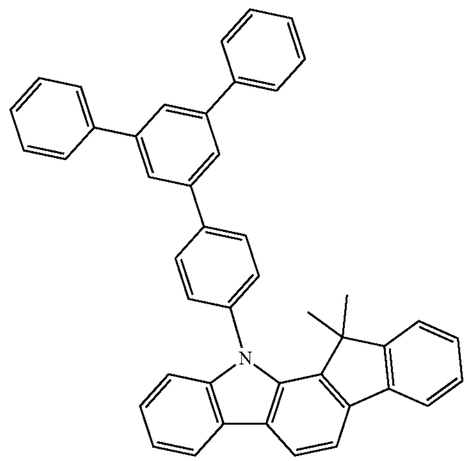
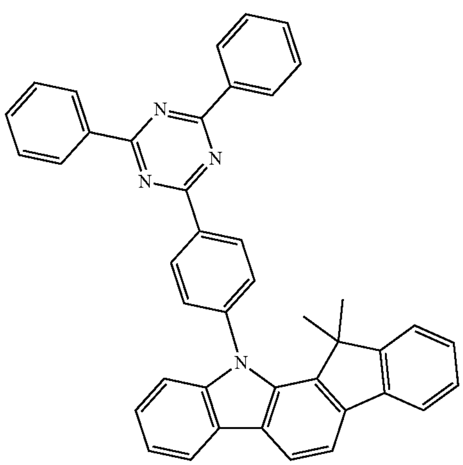
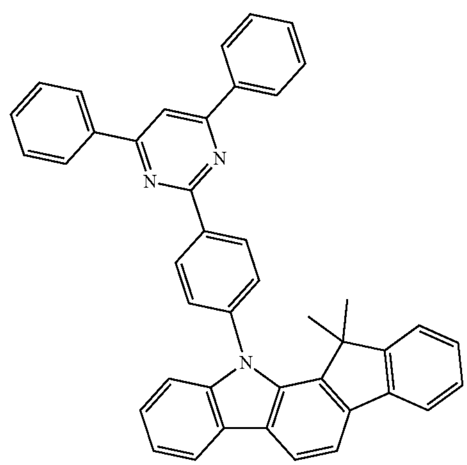

-continued
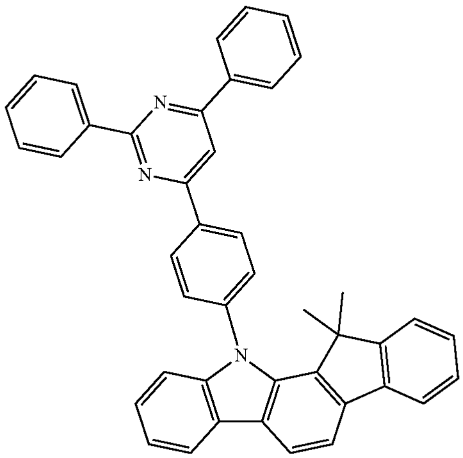
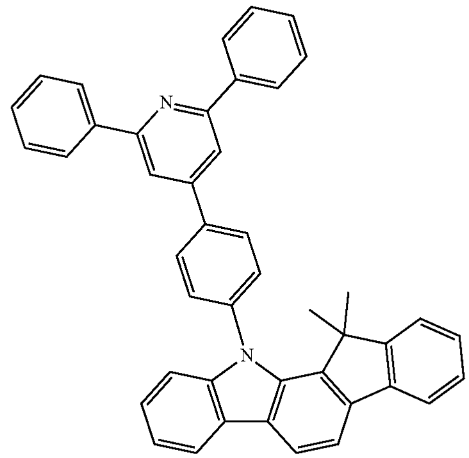
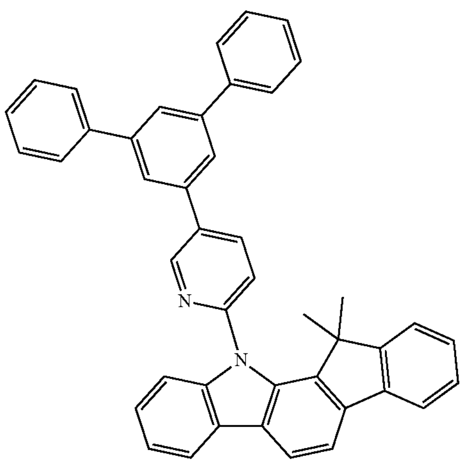
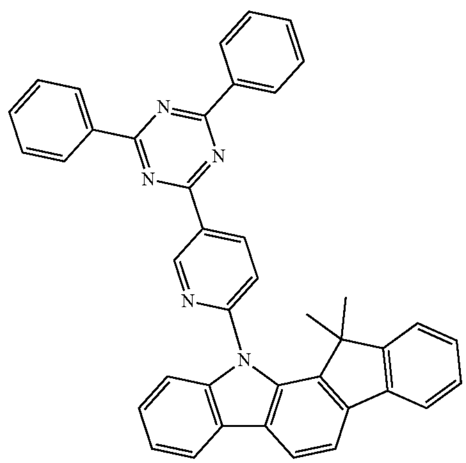
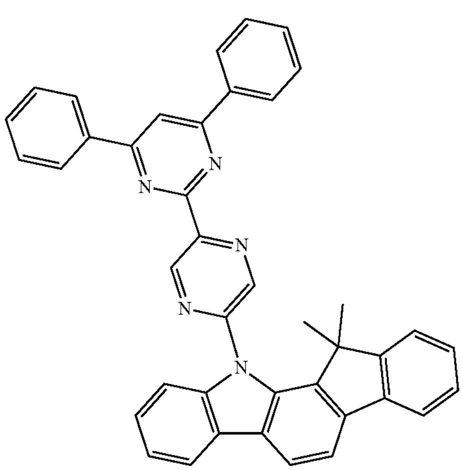
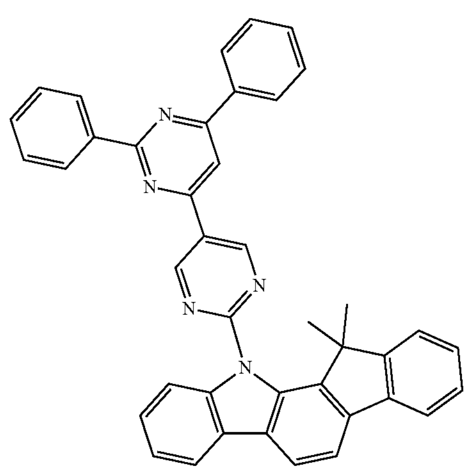

-continued
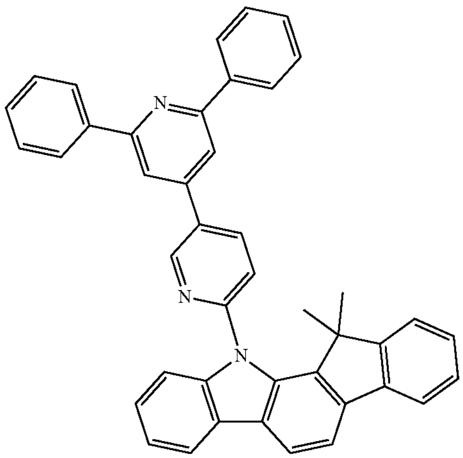
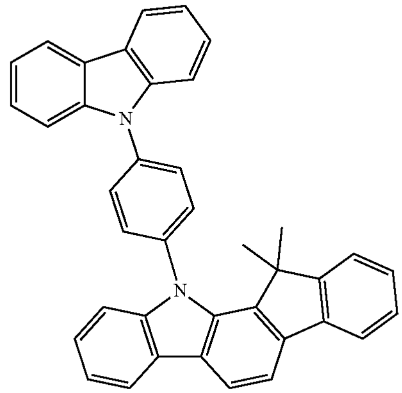
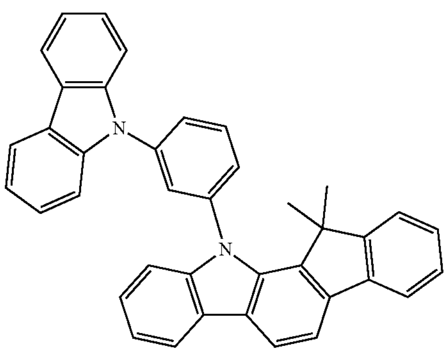
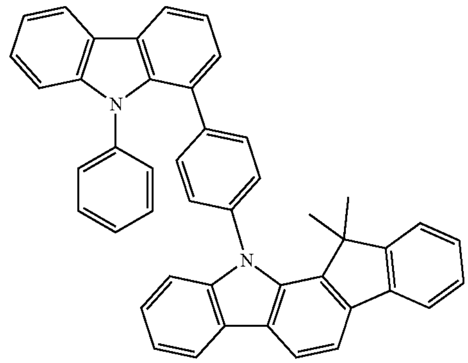
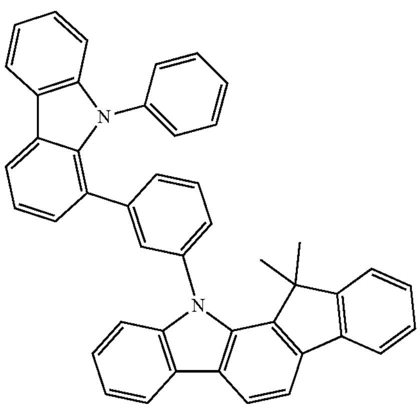
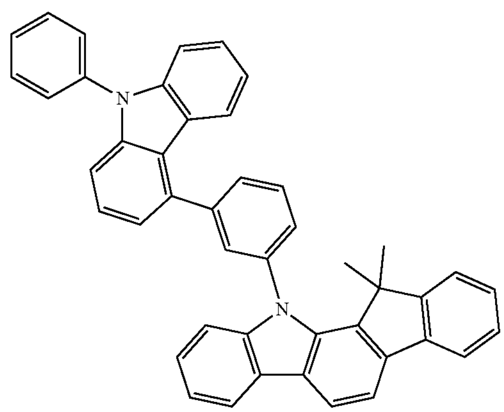
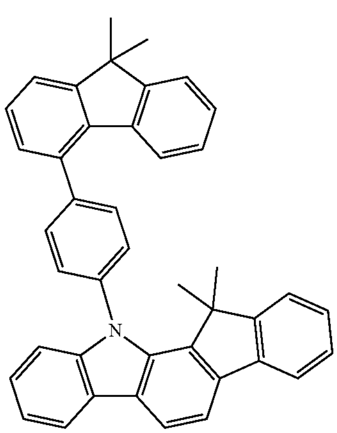
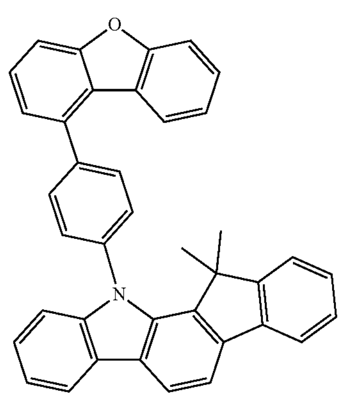

-continued
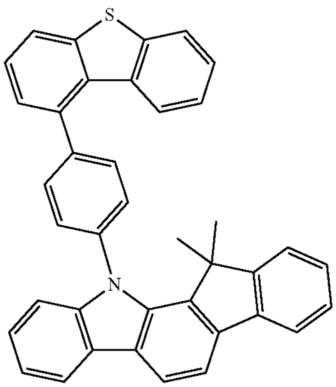
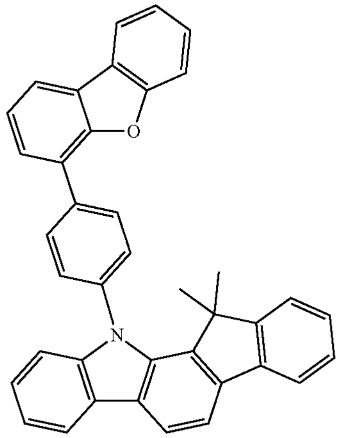
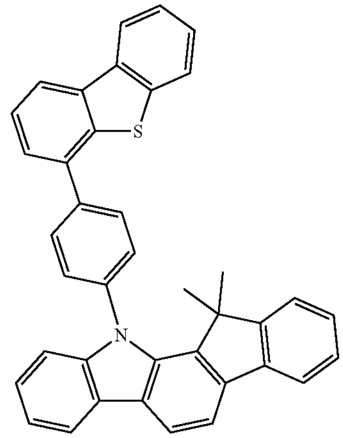
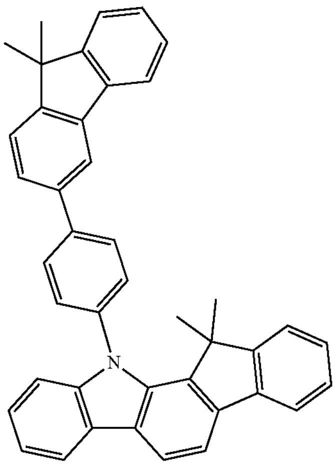
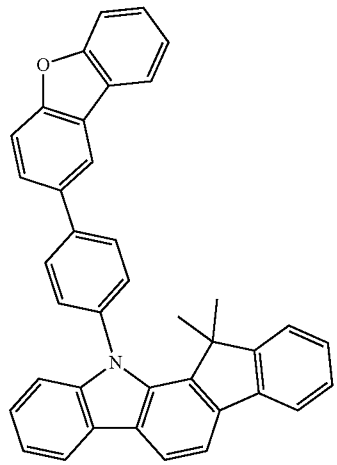
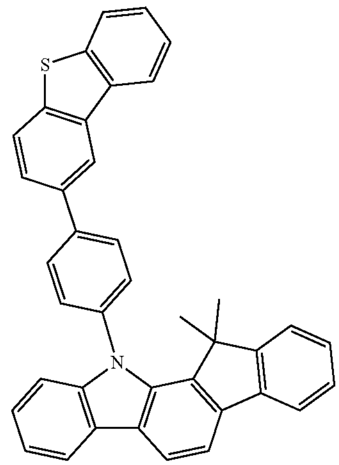
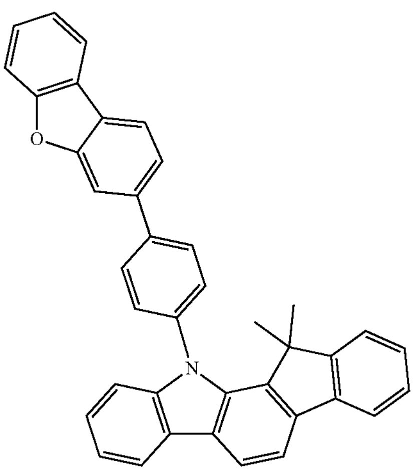
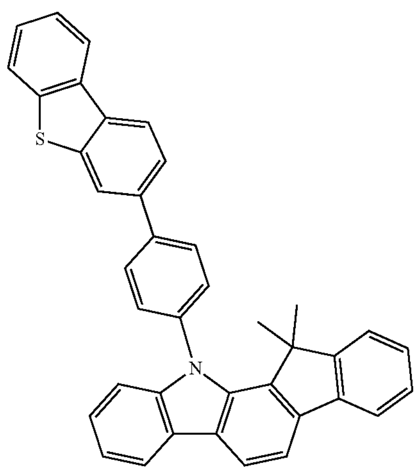
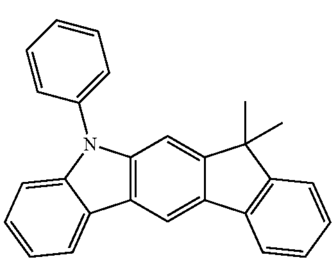
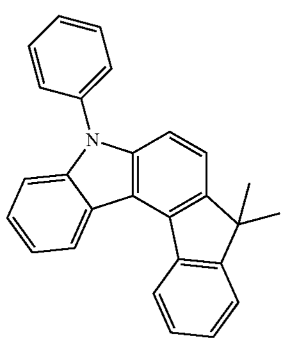
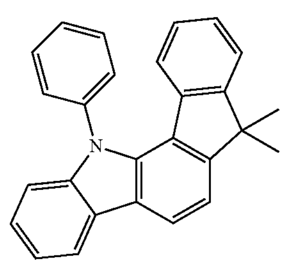

-continued
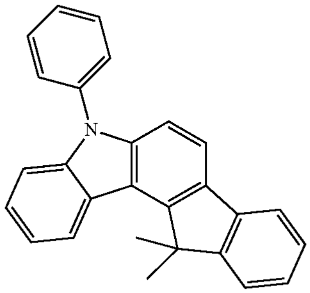
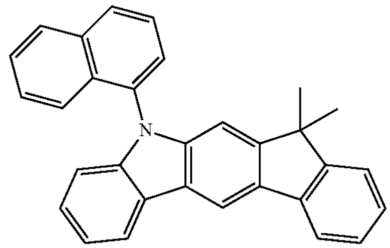
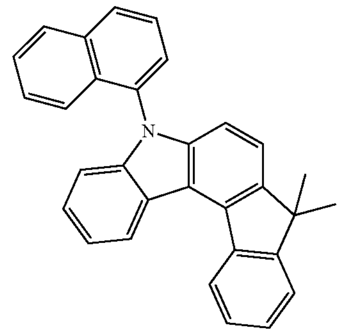
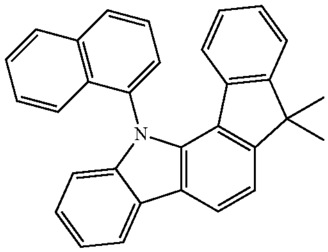
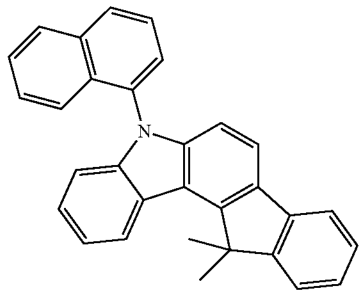
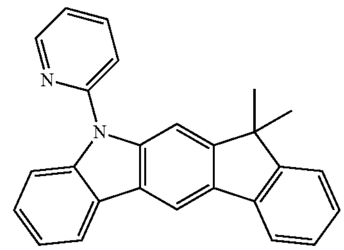
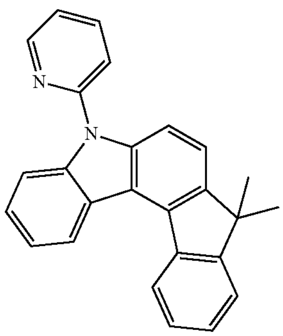
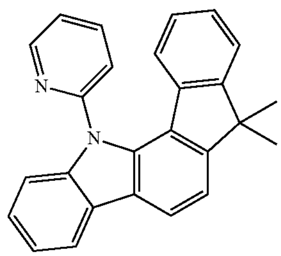
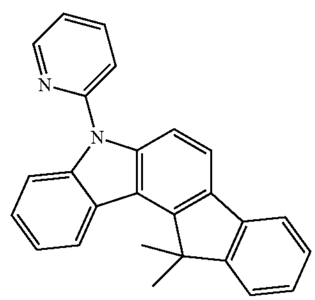
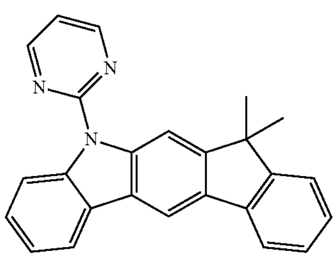
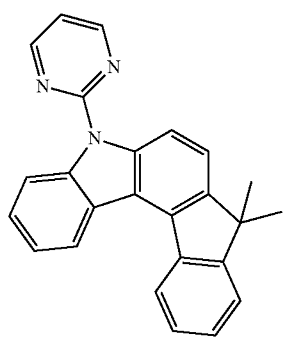
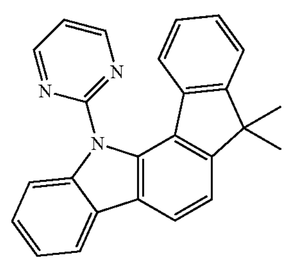
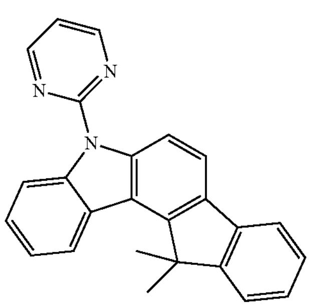
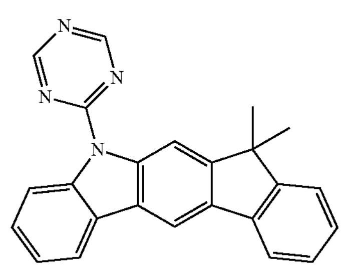
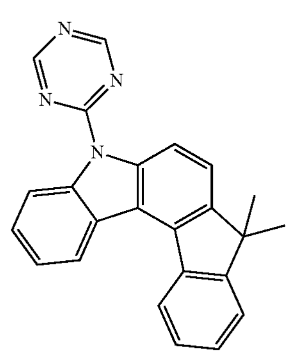

-continued
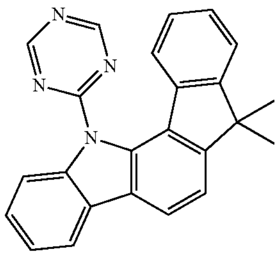
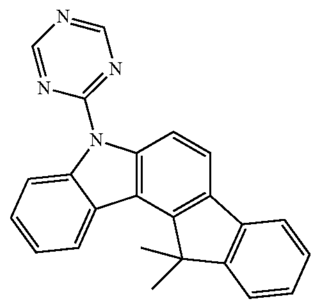
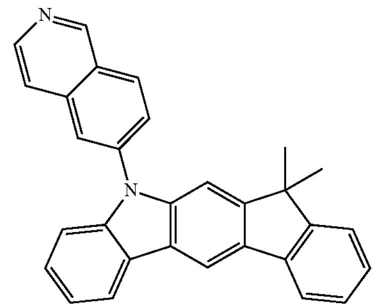
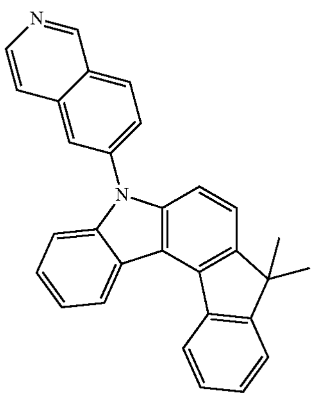
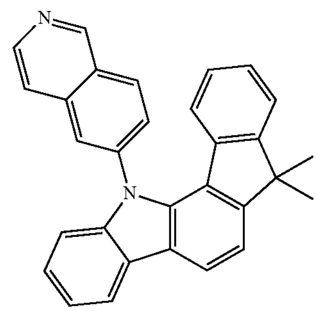
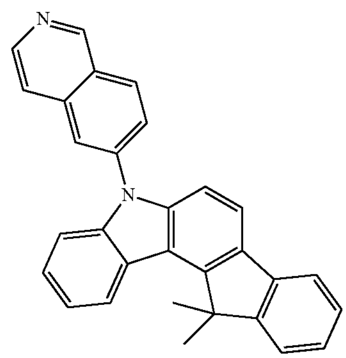
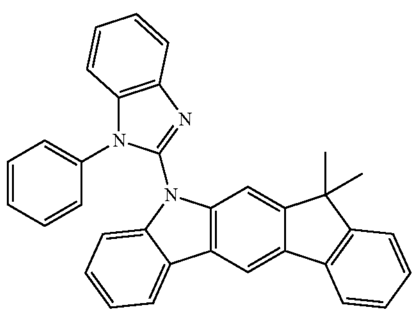
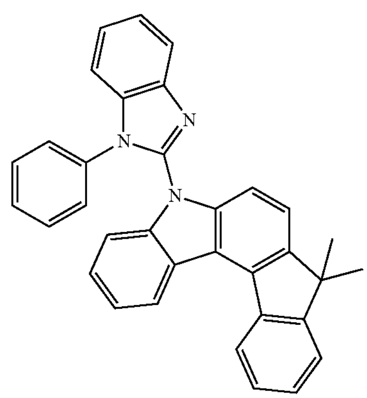
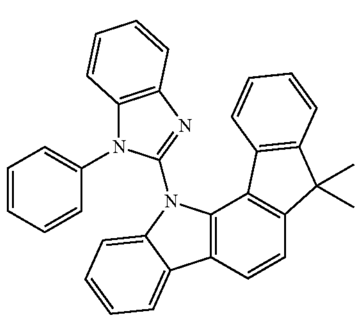
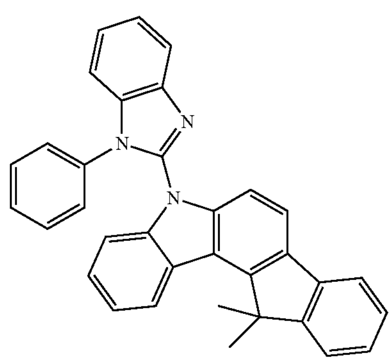

-continued
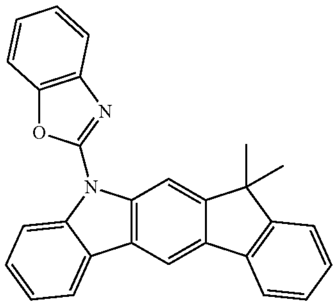
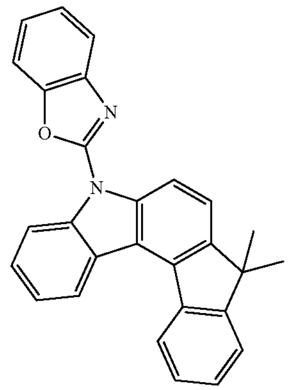
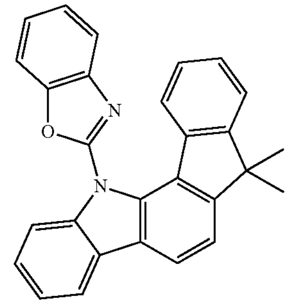
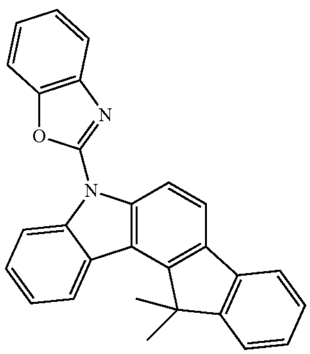
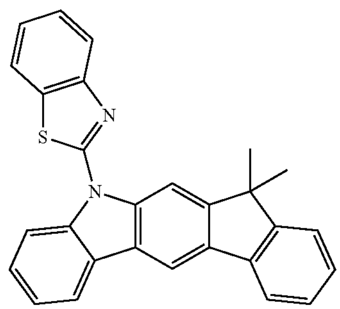
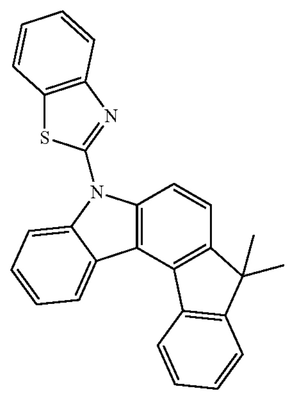
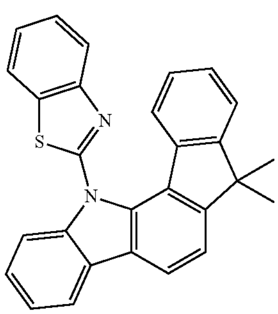
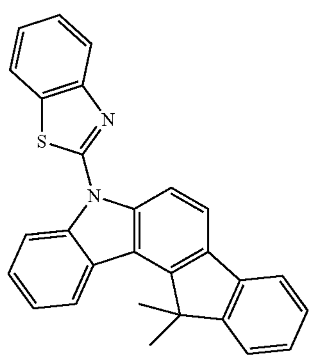
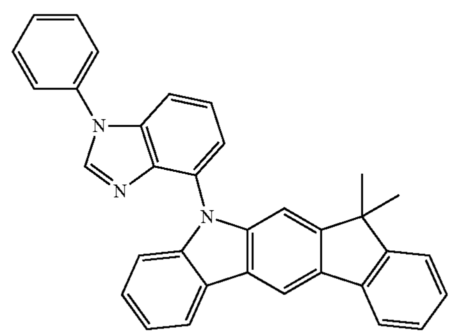
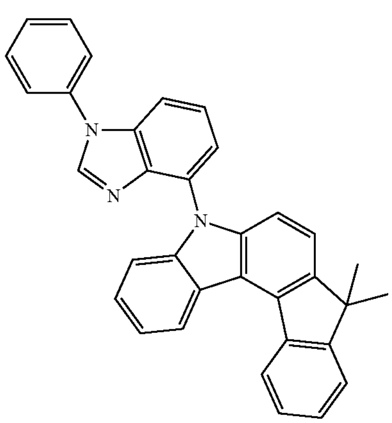
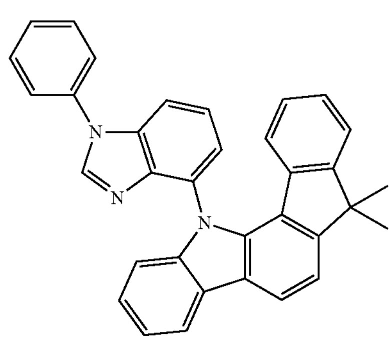

-continued
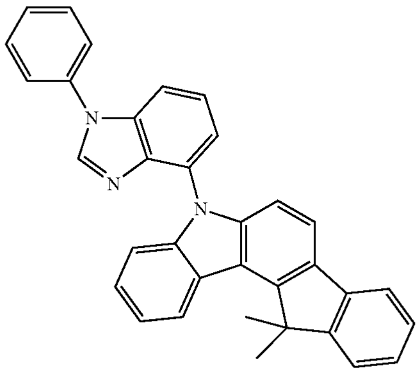
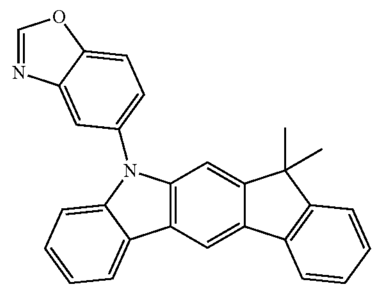
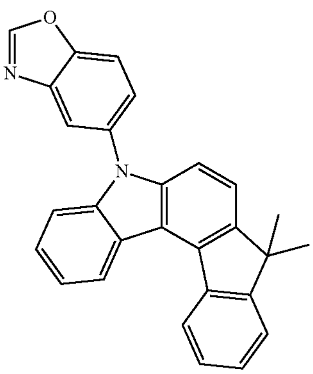
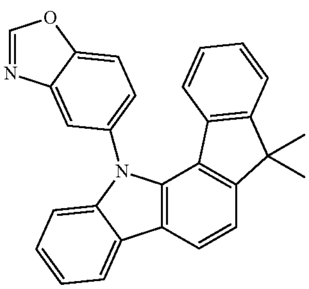
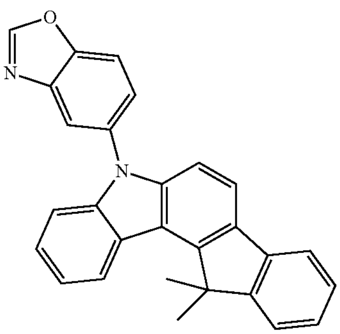
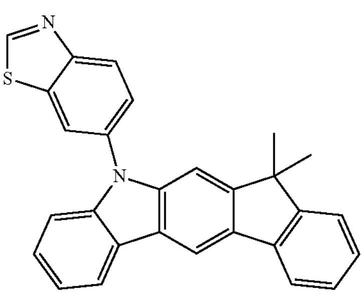
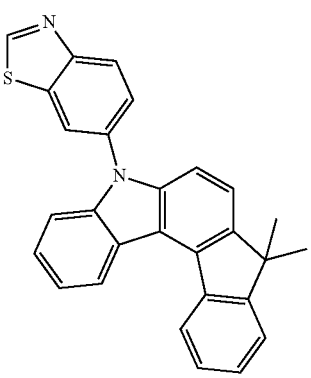
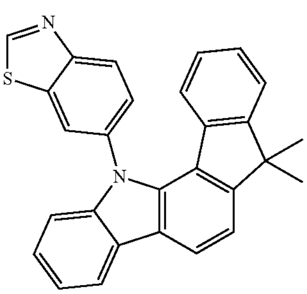
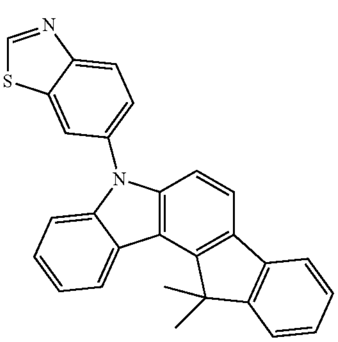

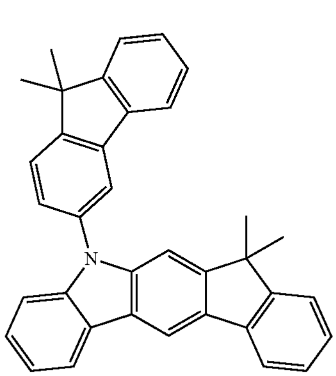
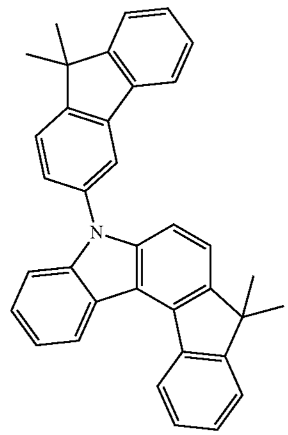
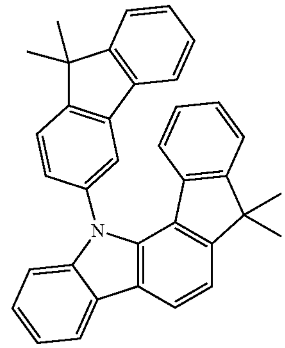
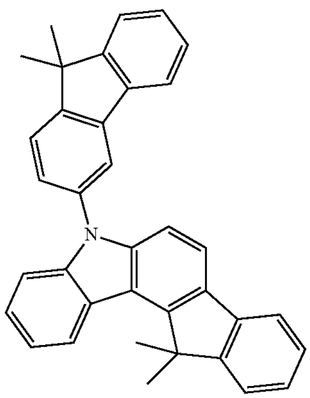
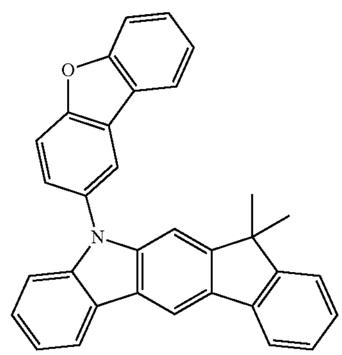
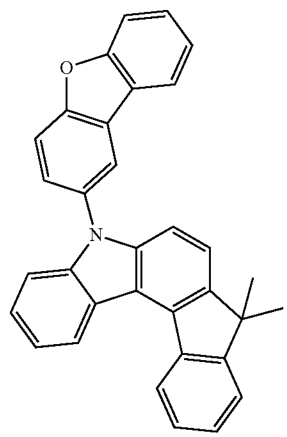
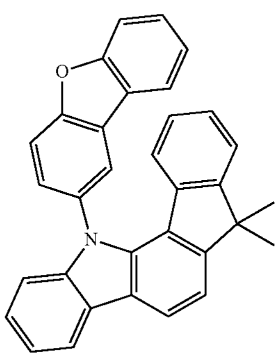
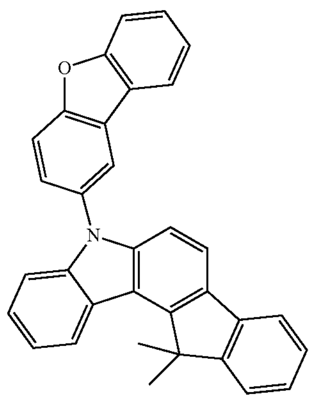
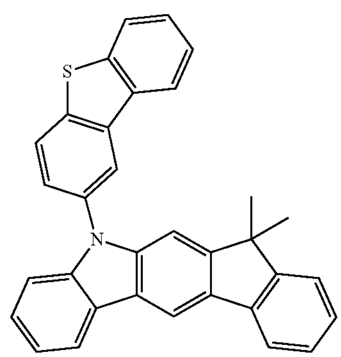
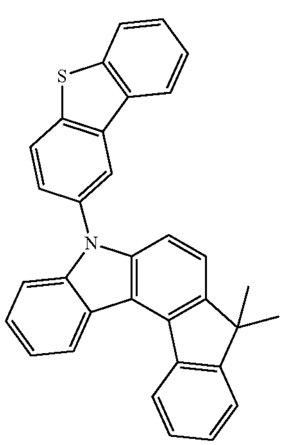
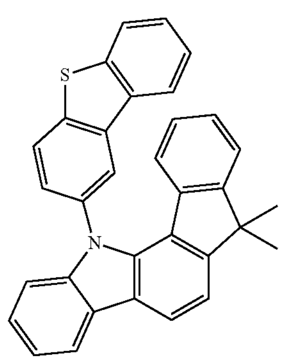
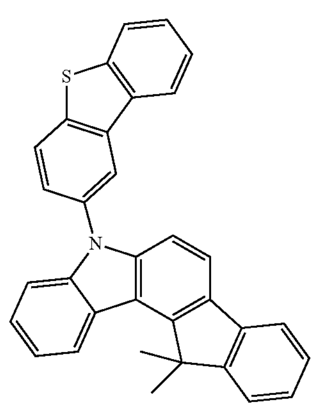

-continued
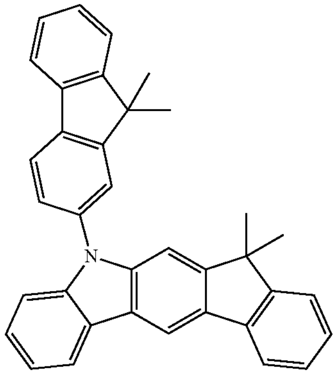
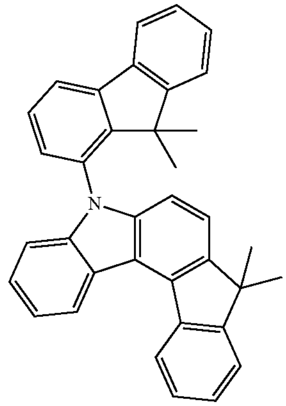
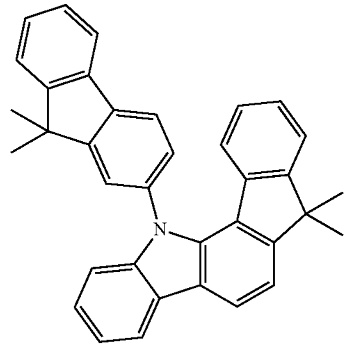
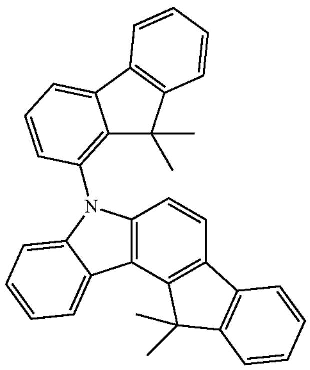
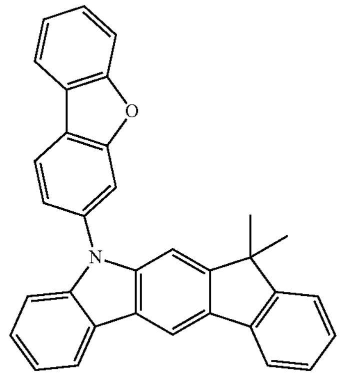
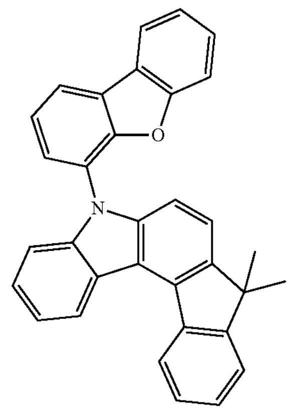
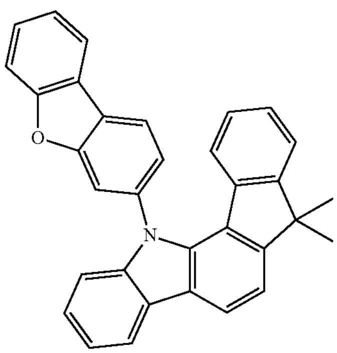
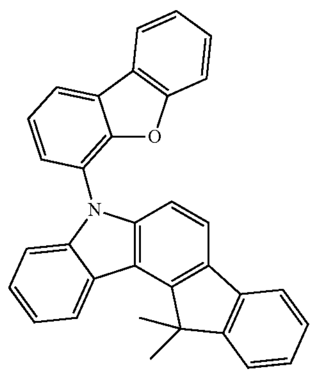
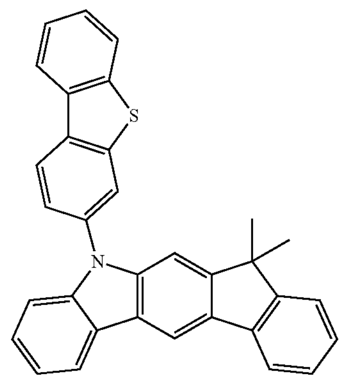
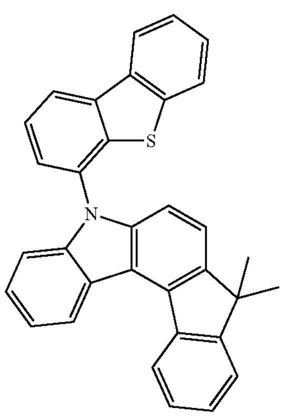
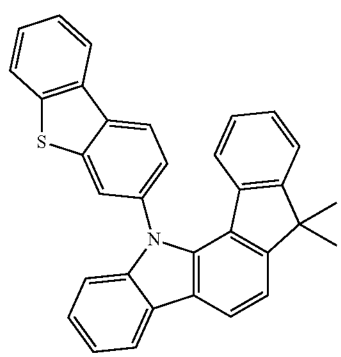
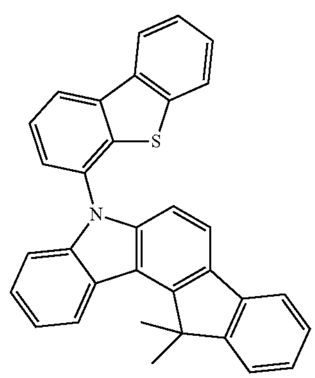

-continued
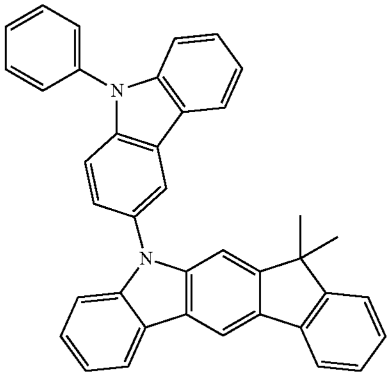
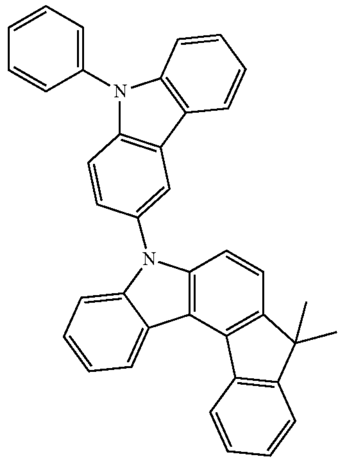
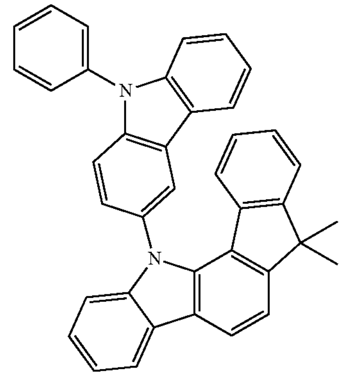
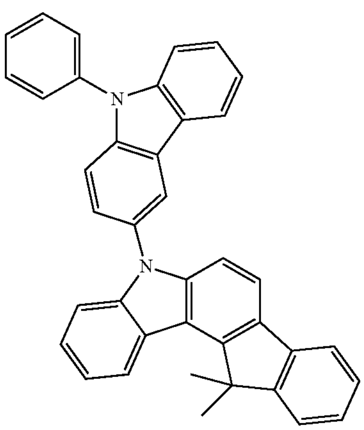
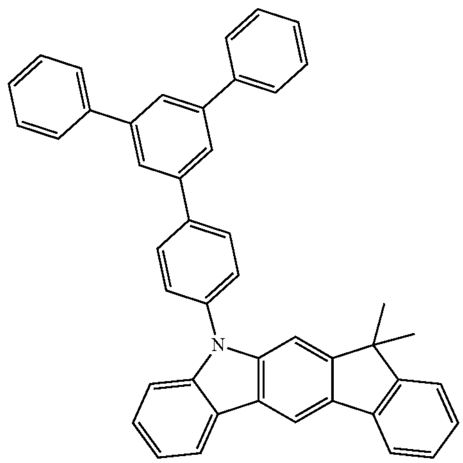
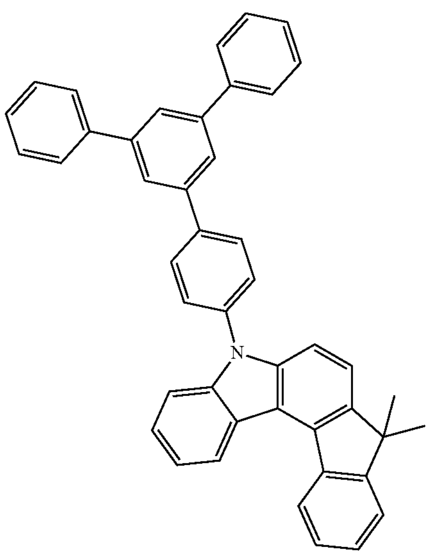
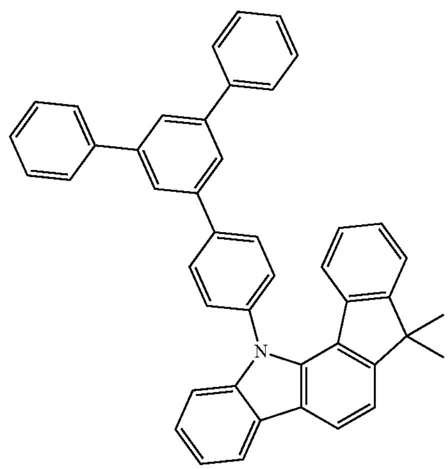

-continued
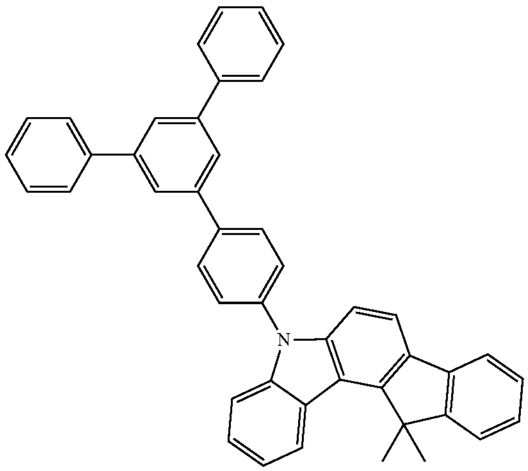
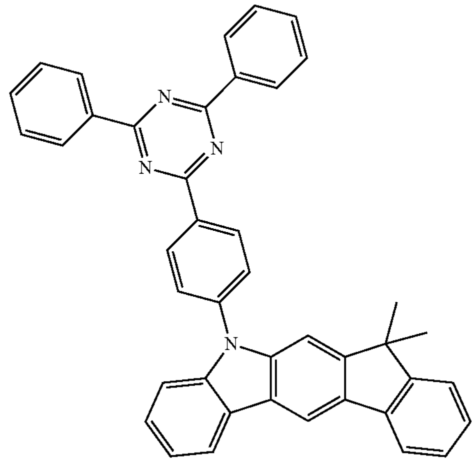
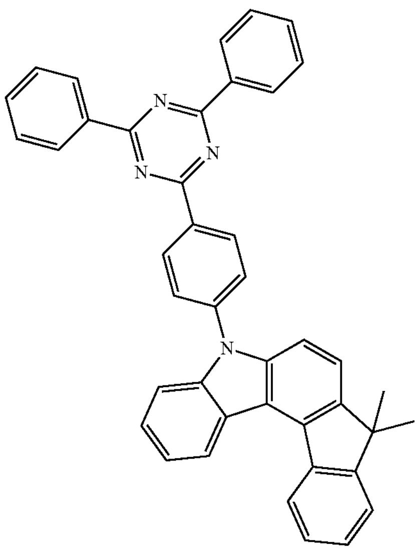
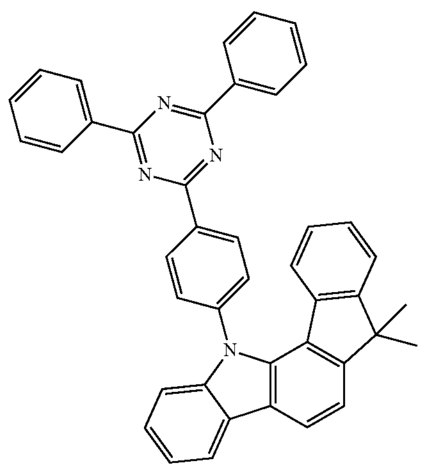
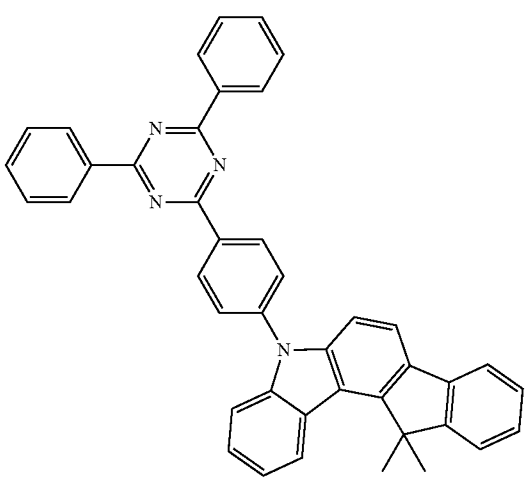
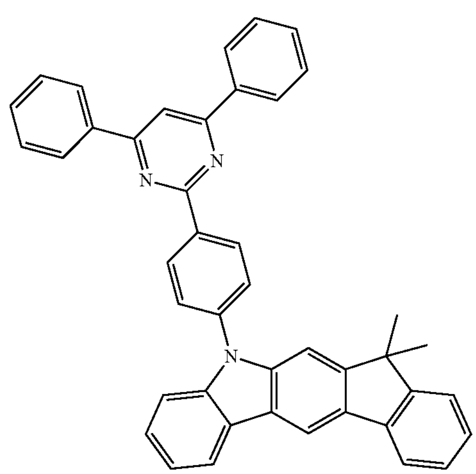

-continued
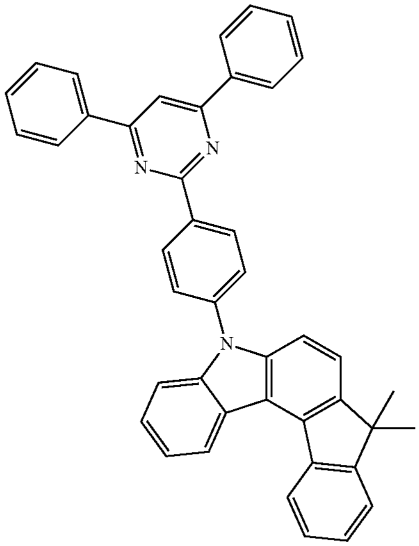
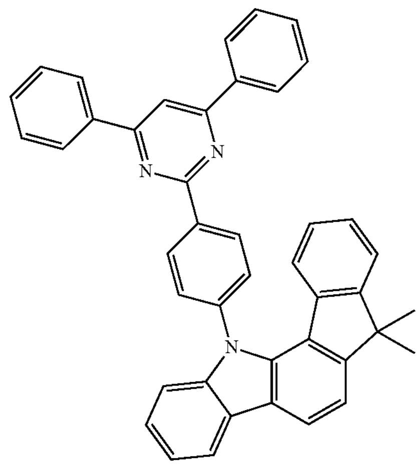
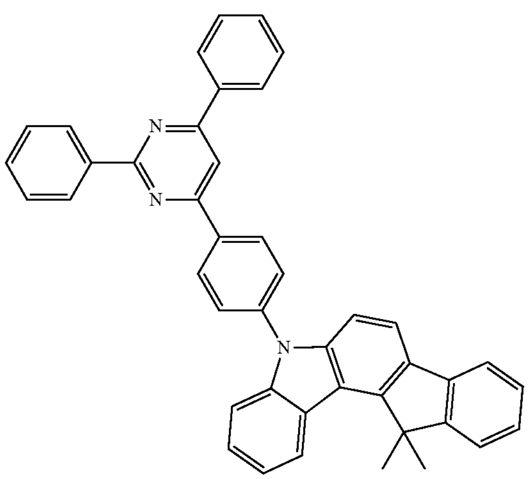
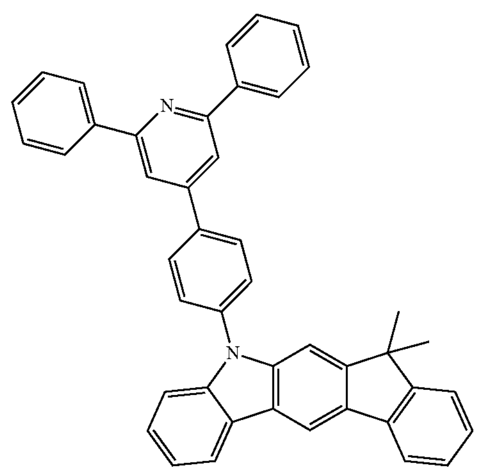
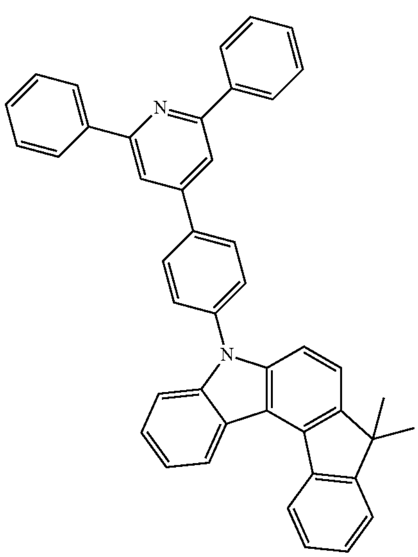
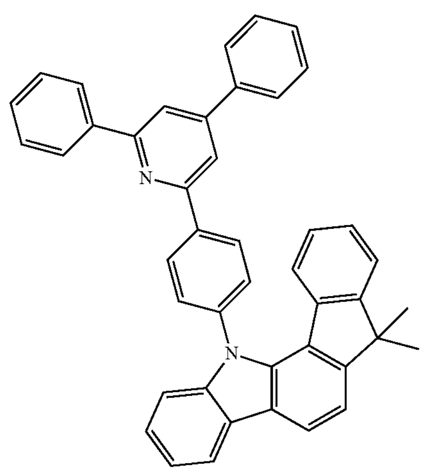

-continued
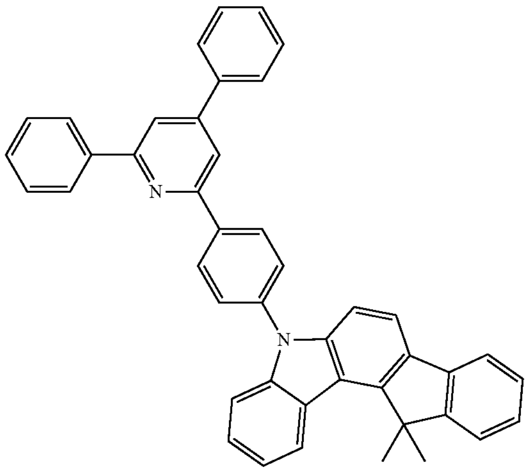
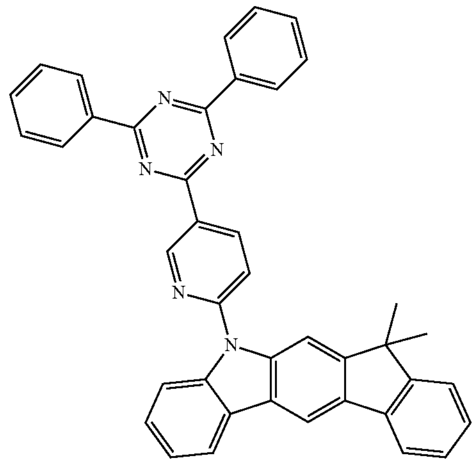
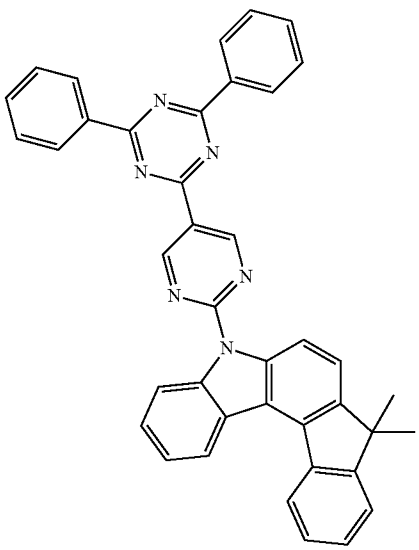
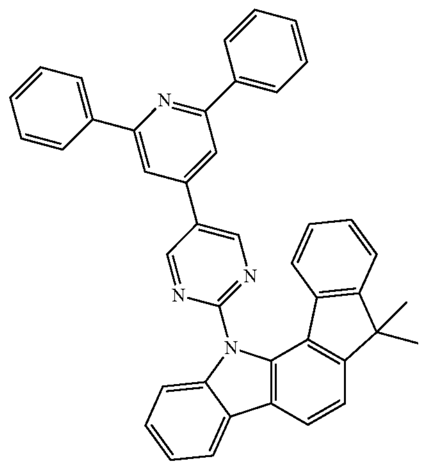
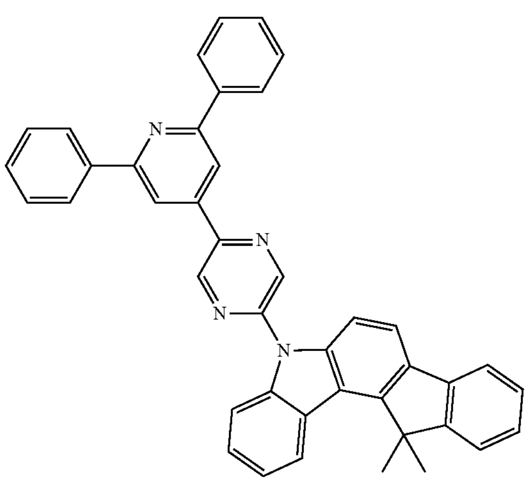
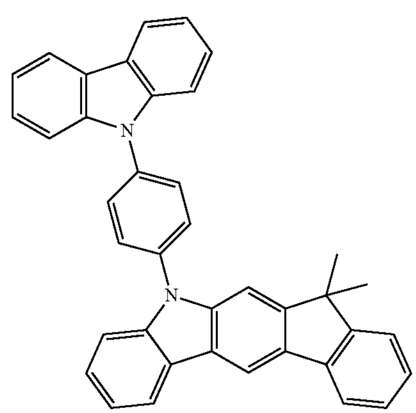

-continued
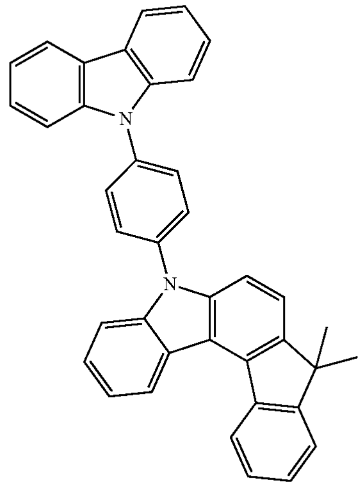
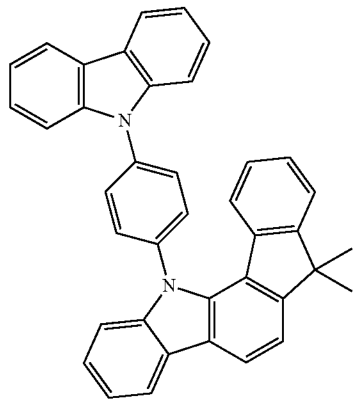
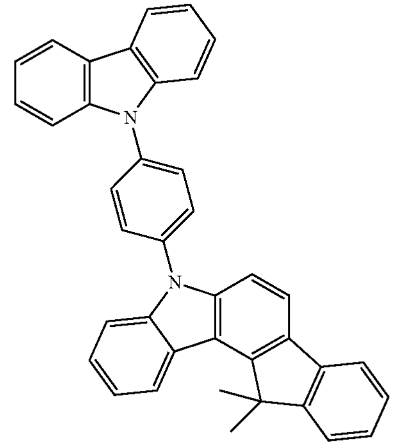
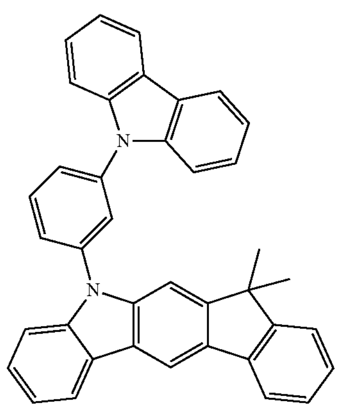
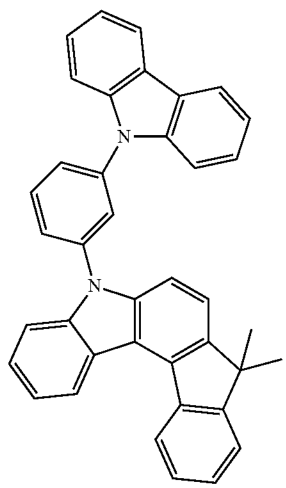
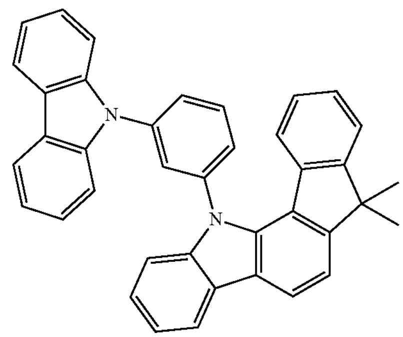
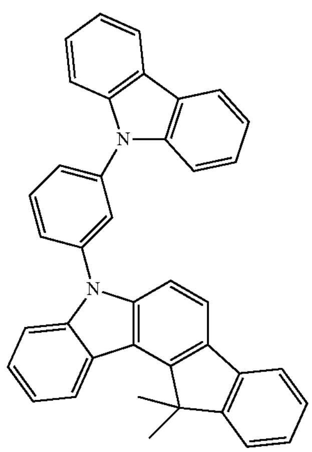
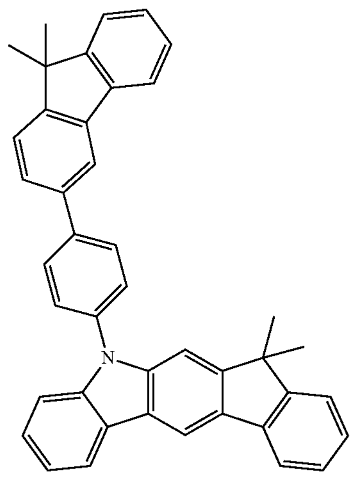
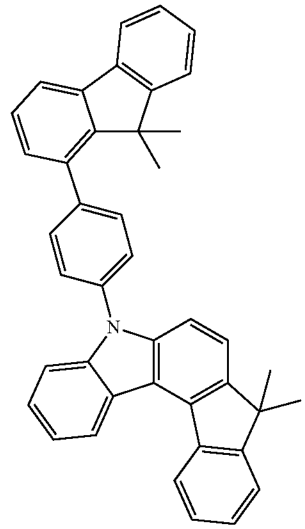

-continued
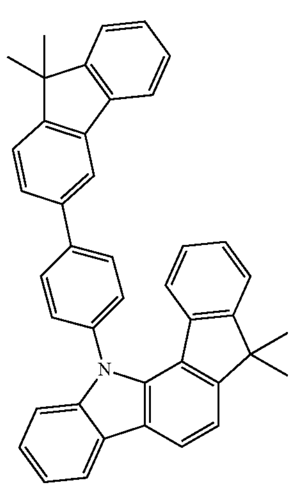
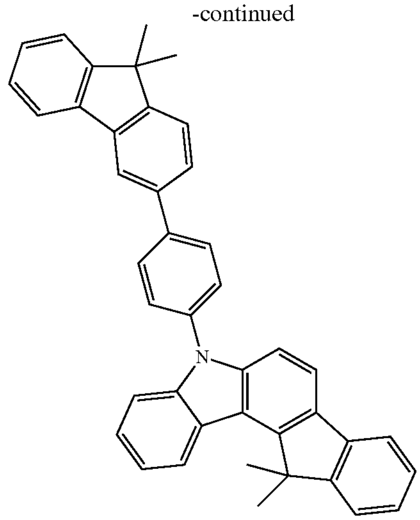
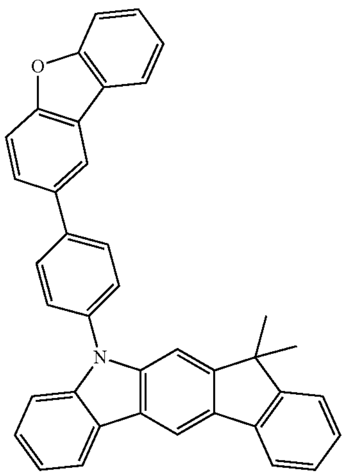
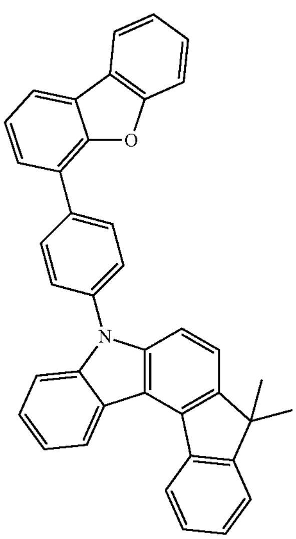
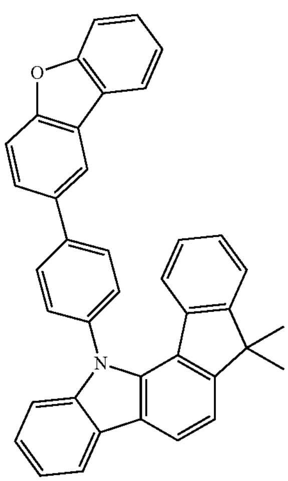
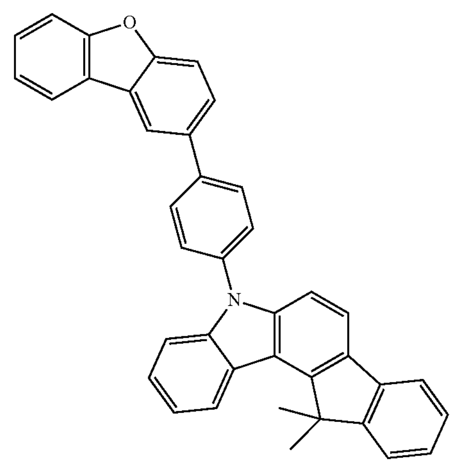
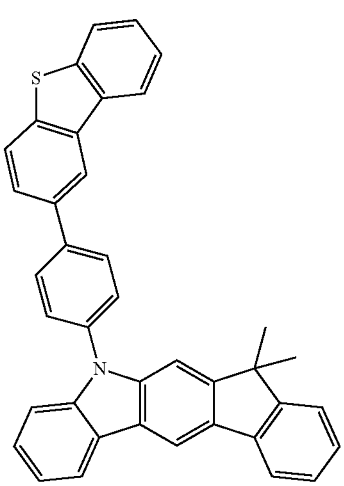
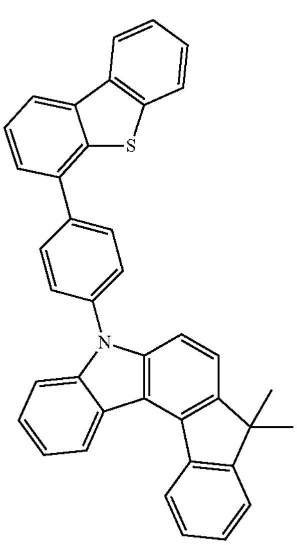
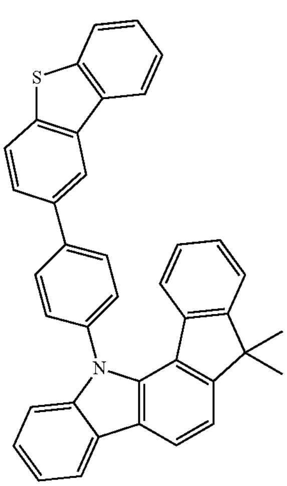

-continued
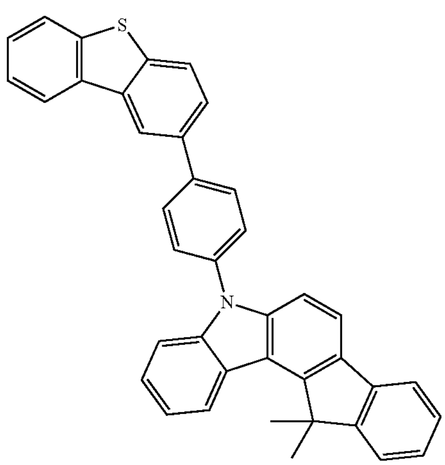
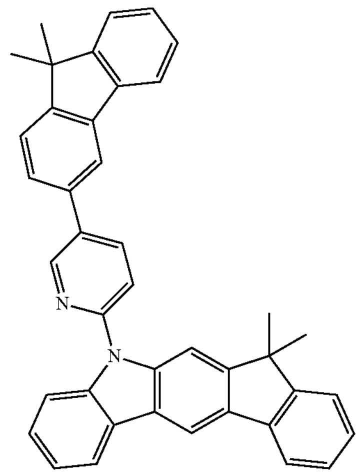
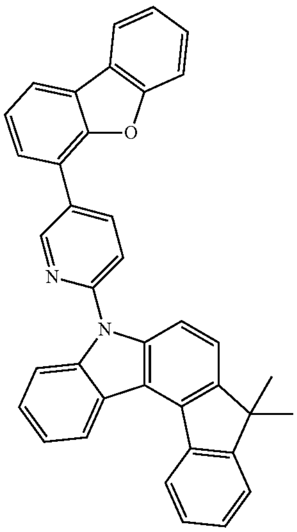
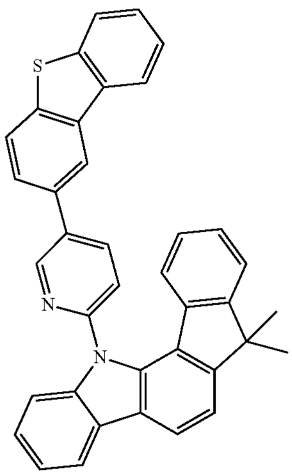
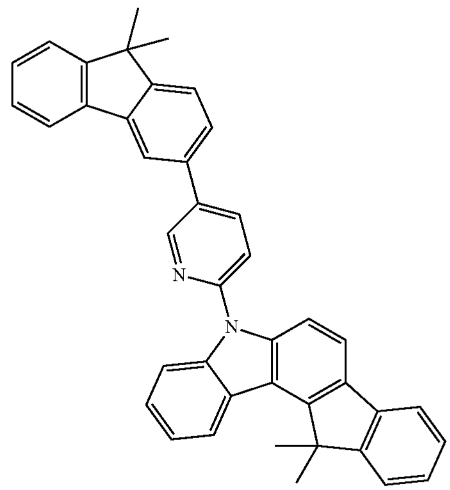
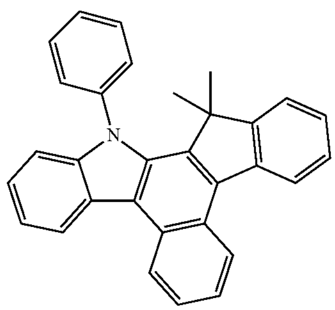
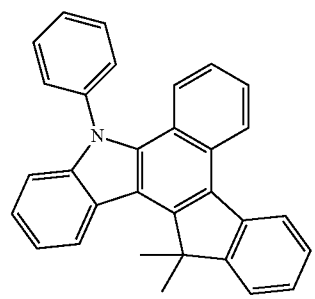
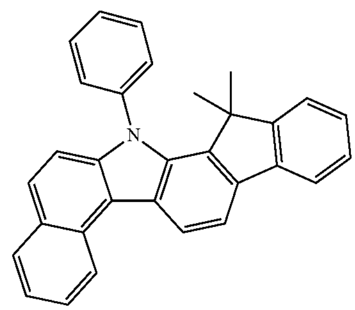
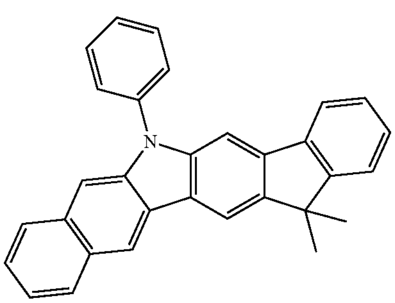
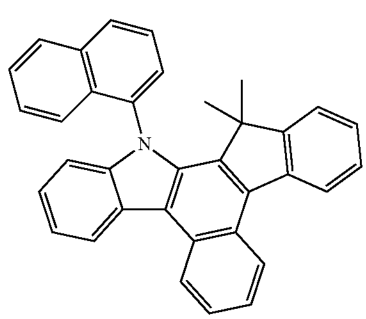

-continued
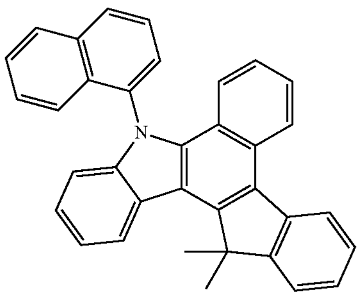
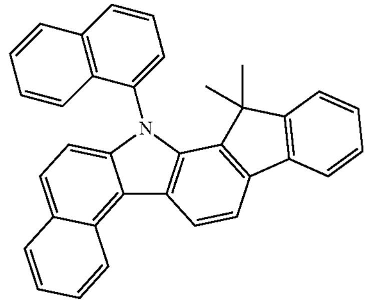
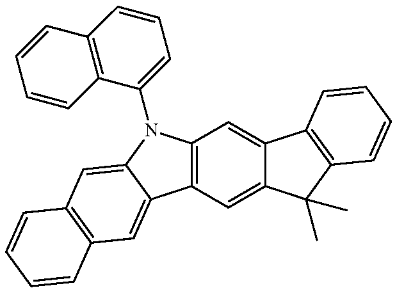
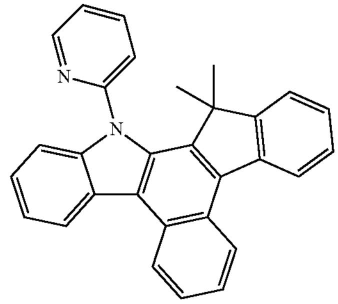
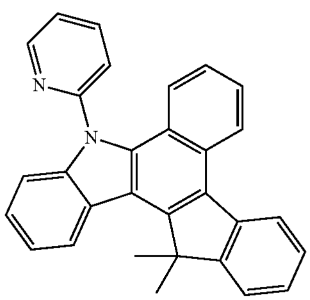
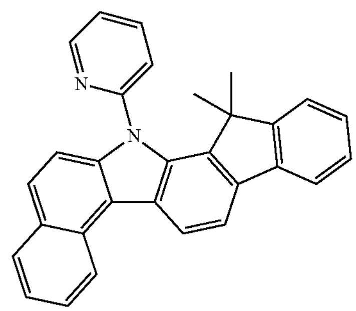
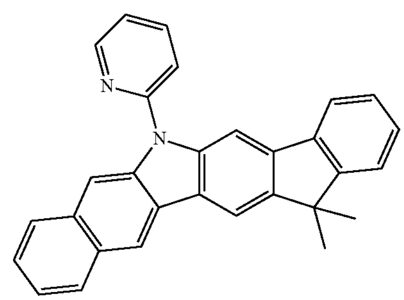
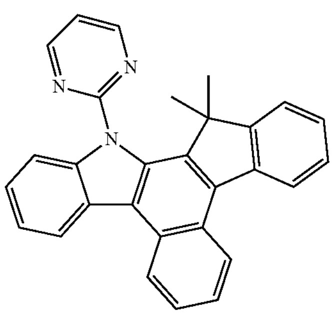
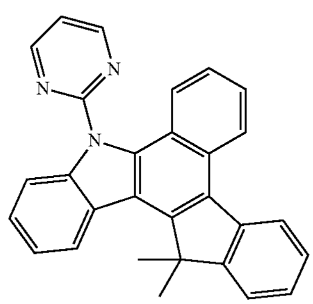
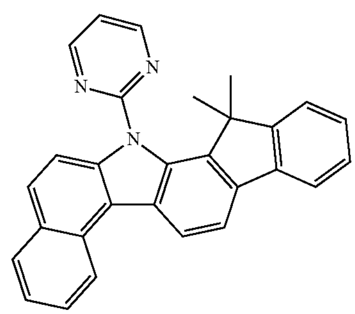
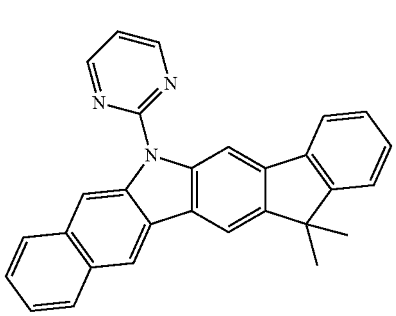
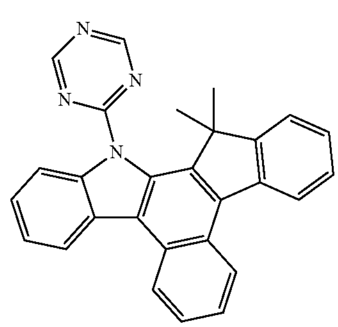
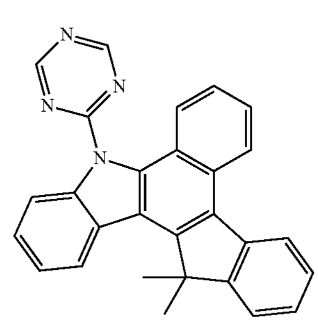

-continued
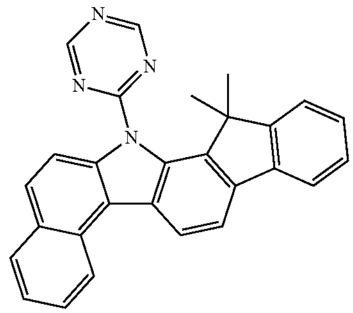
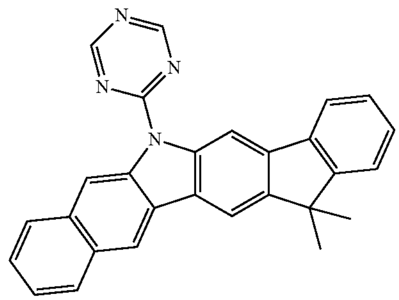
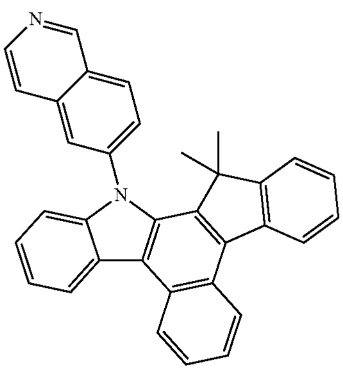
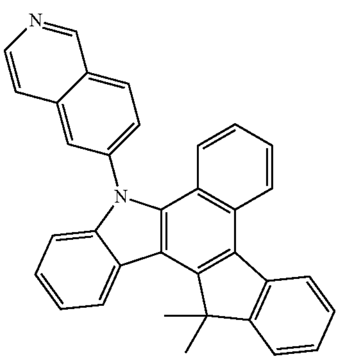
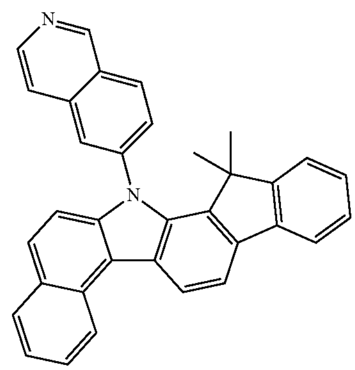
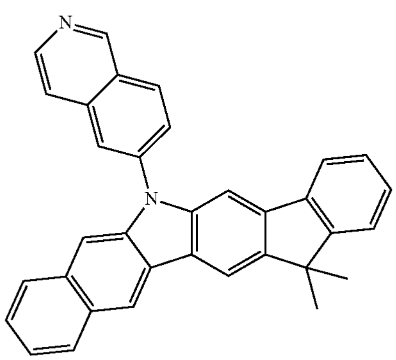
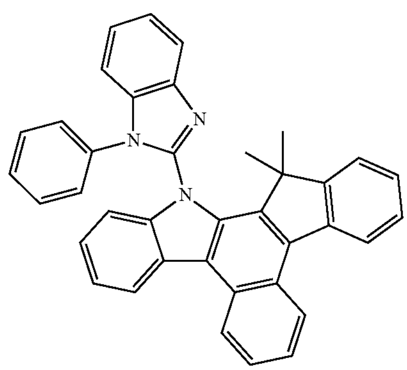
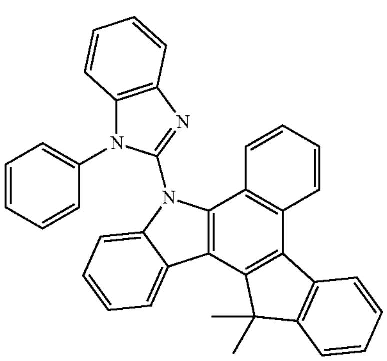
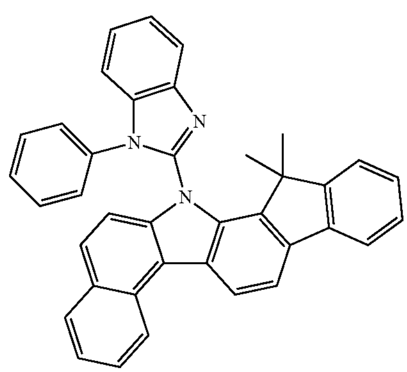

-continued
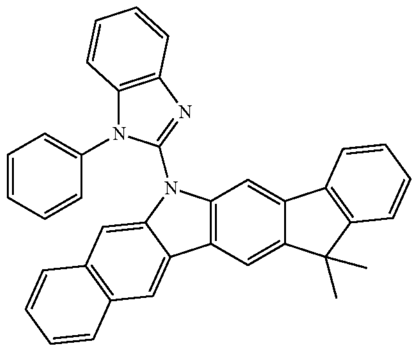
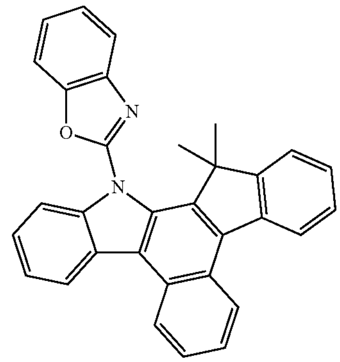
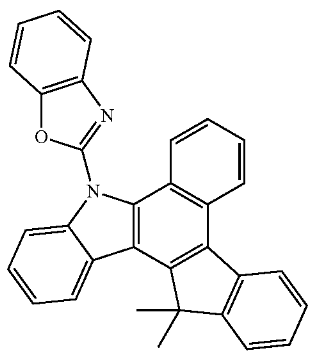
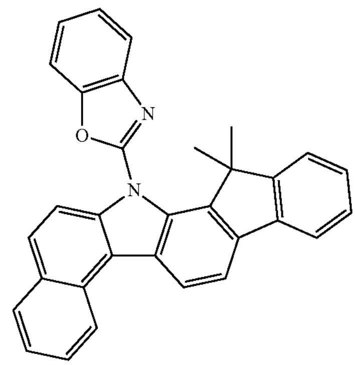
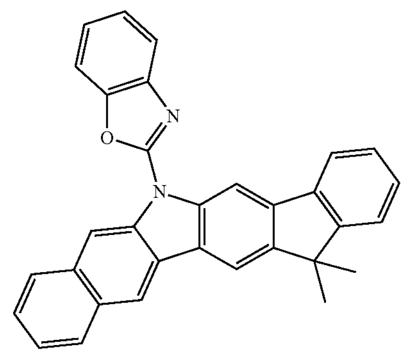
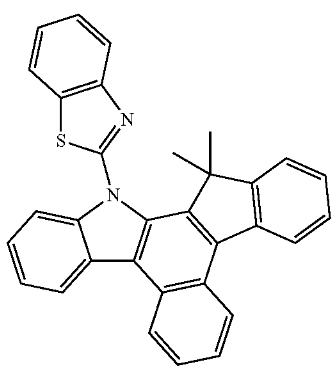
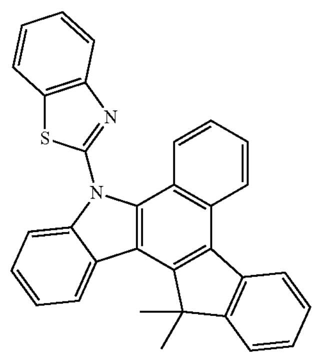
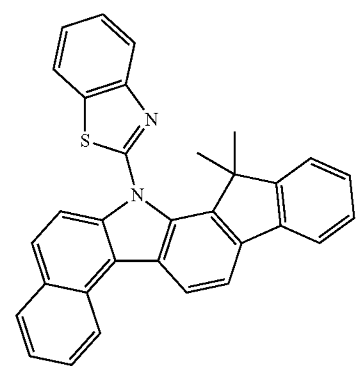
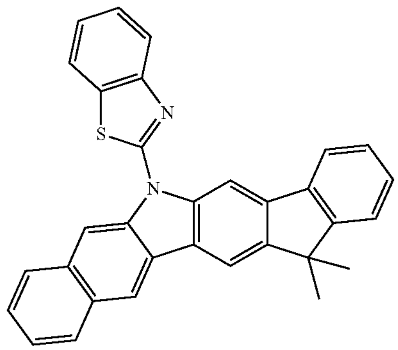
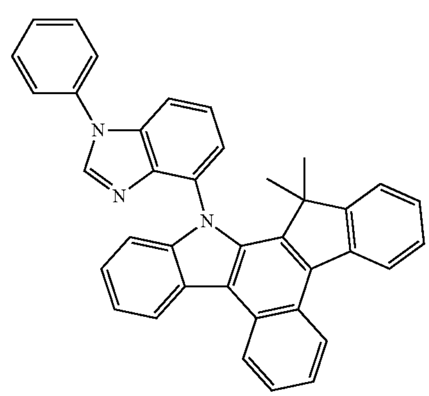

-continued
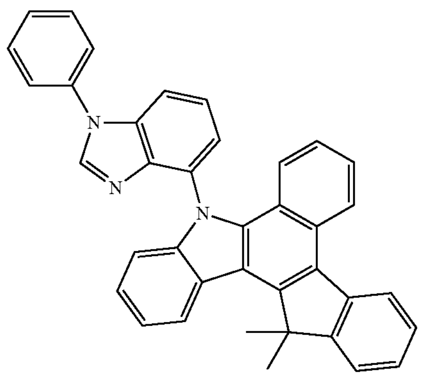
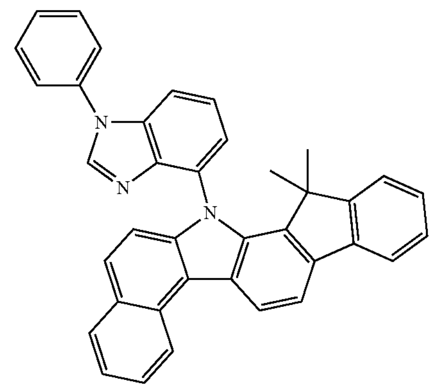
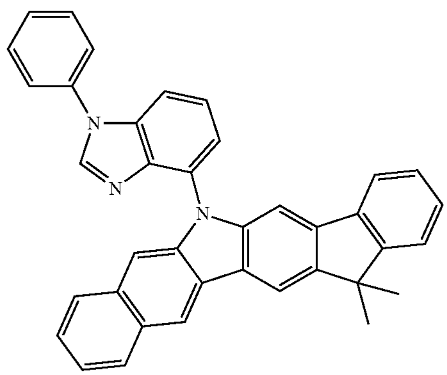
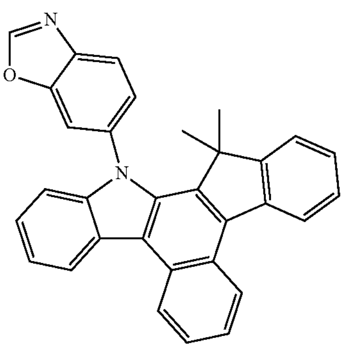
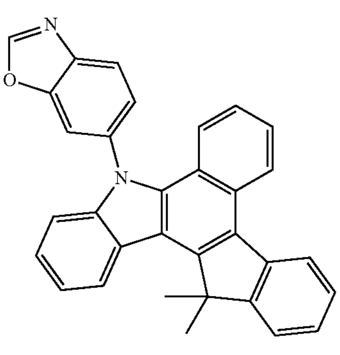
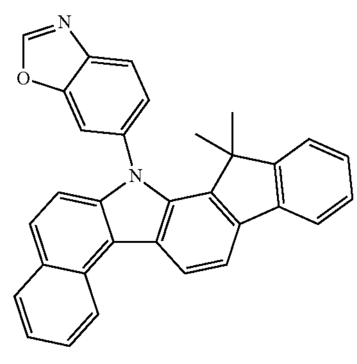
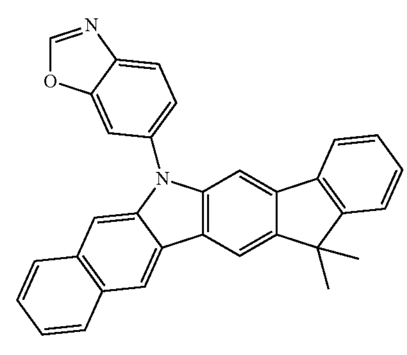
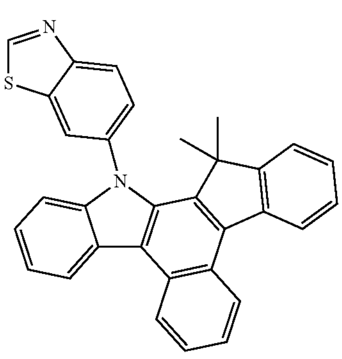
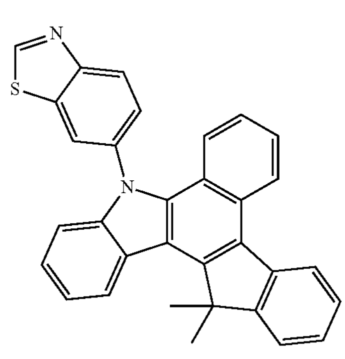
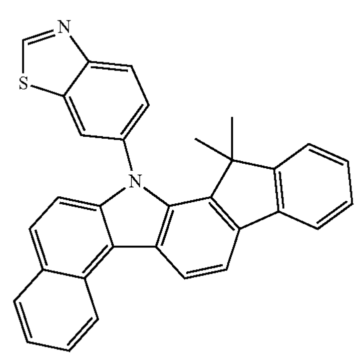

-continued
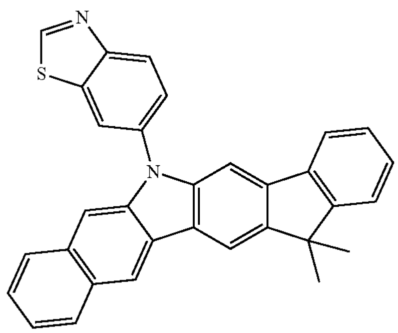
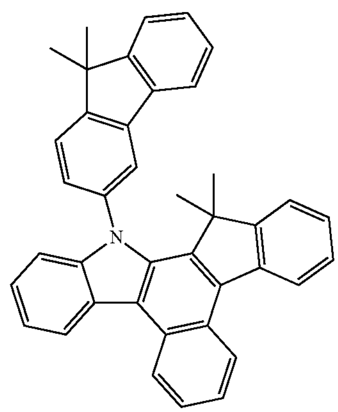
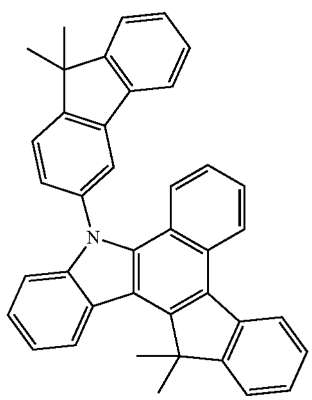
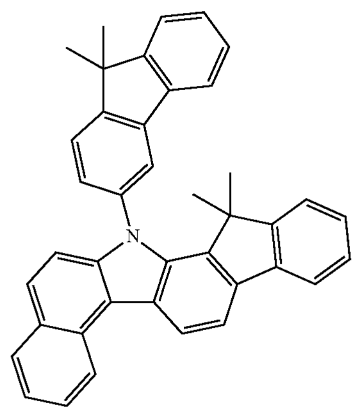
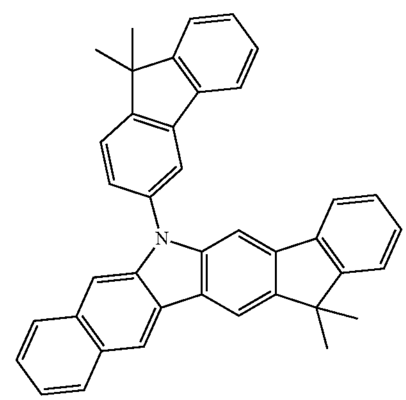
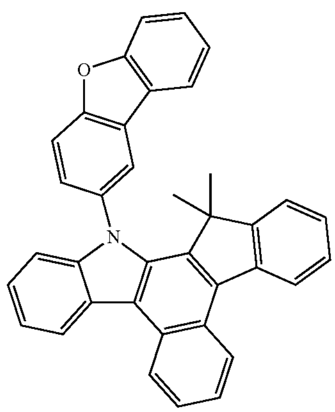
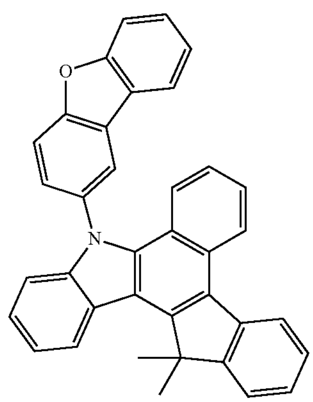
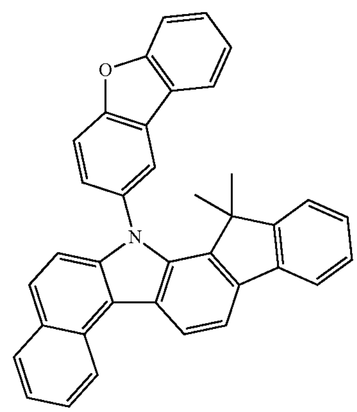
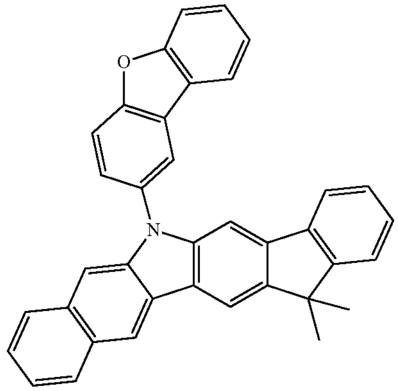
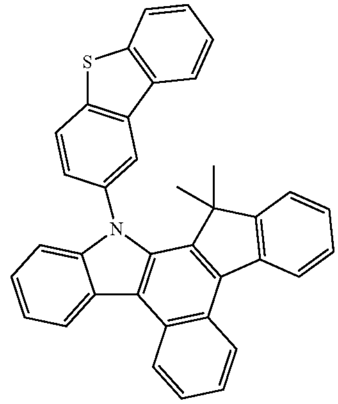
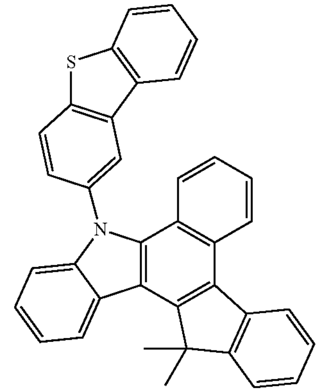

-continued
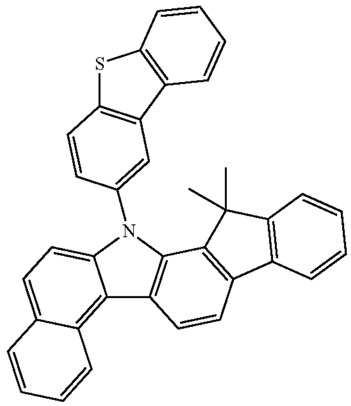
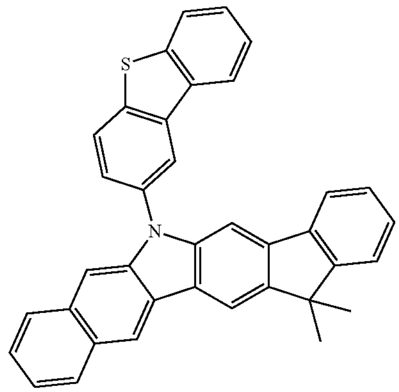
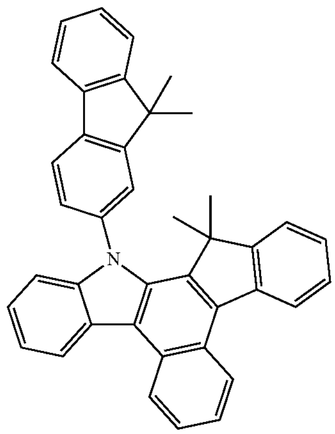
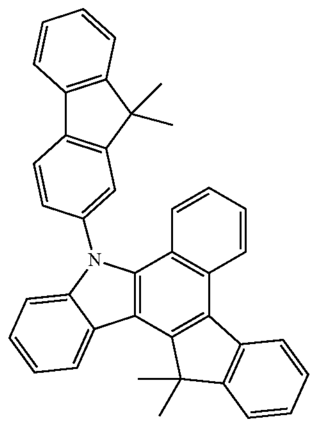
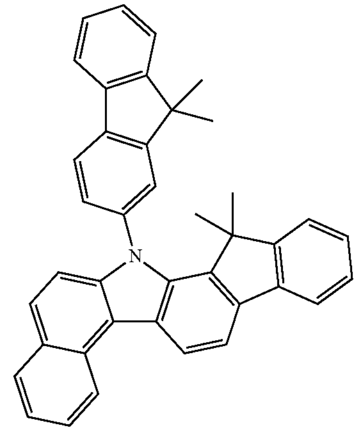
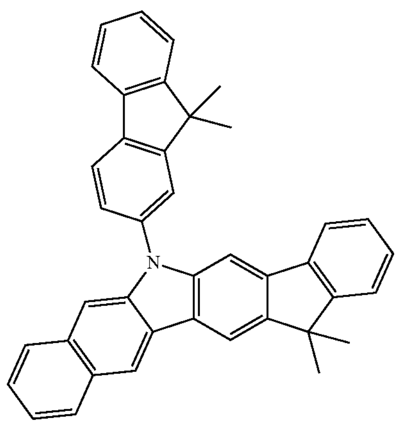
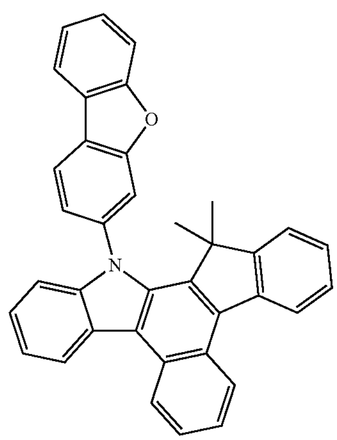
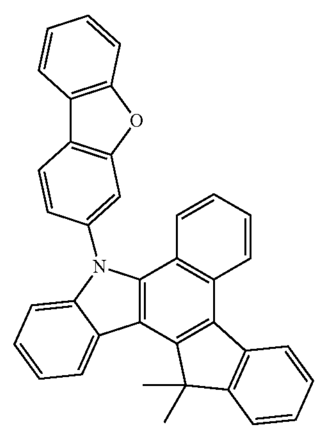
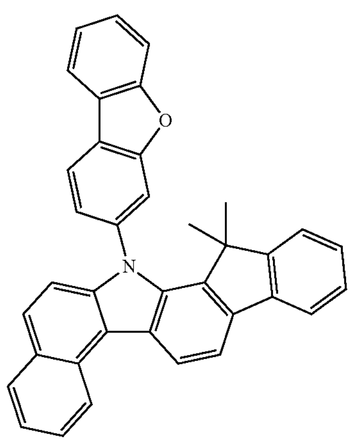
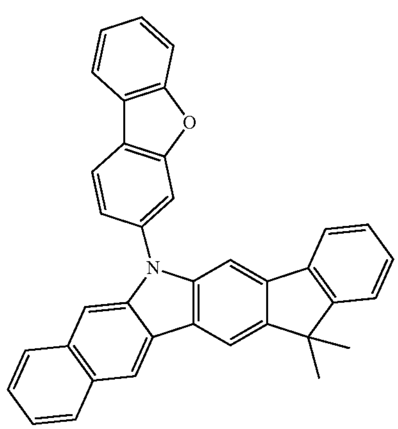
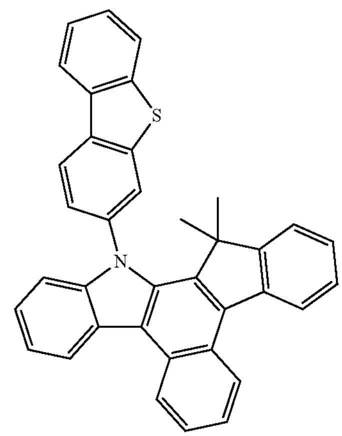

-continued
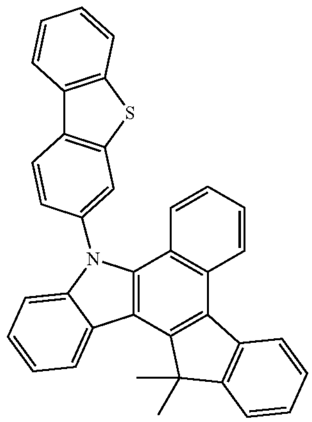
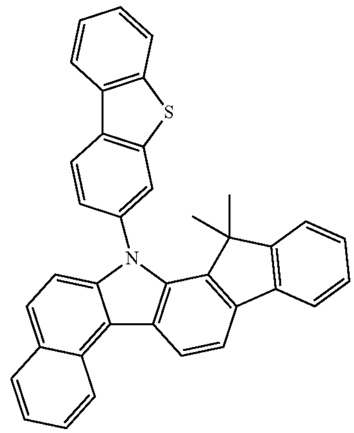
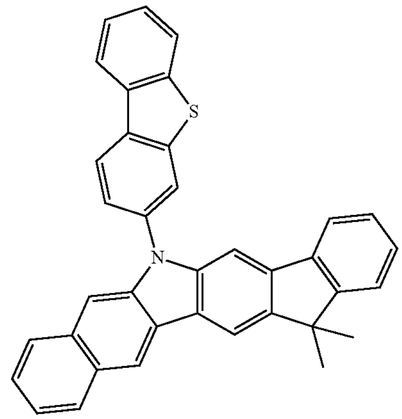
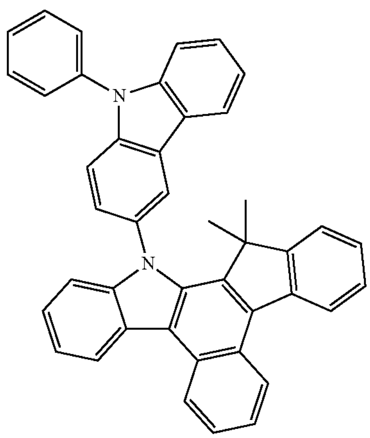
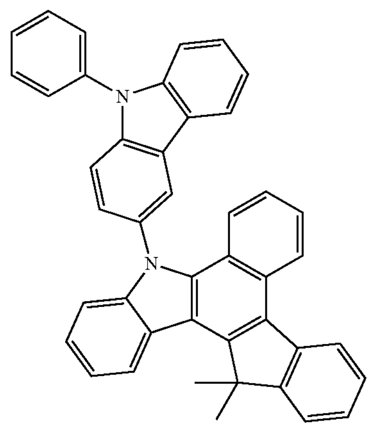
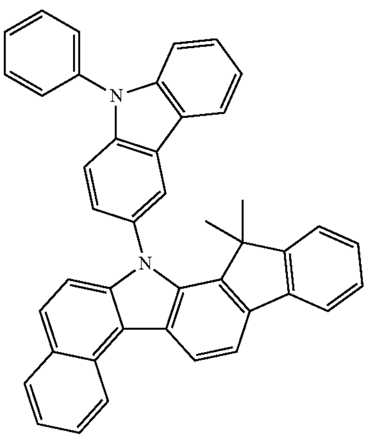
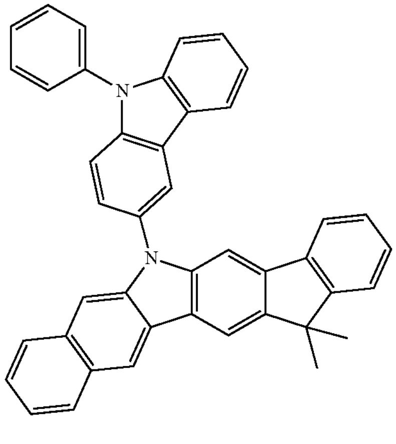
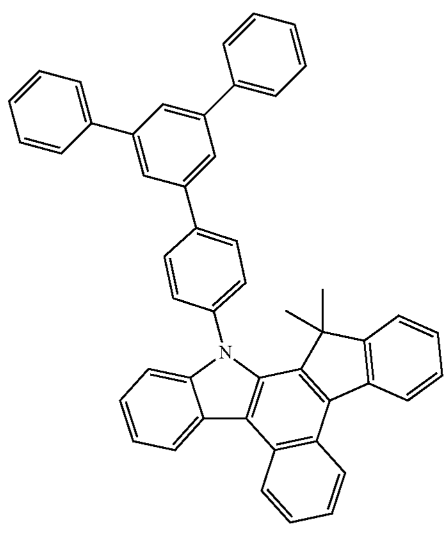

-continued
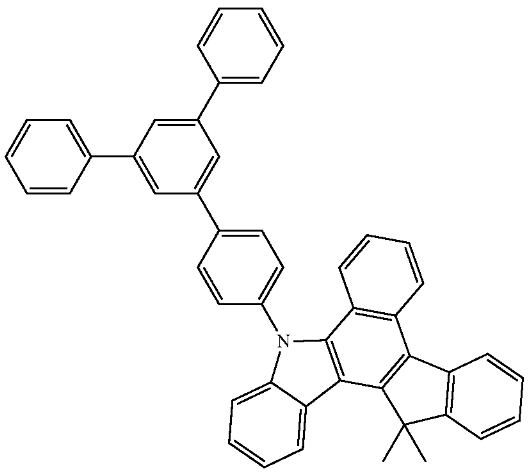
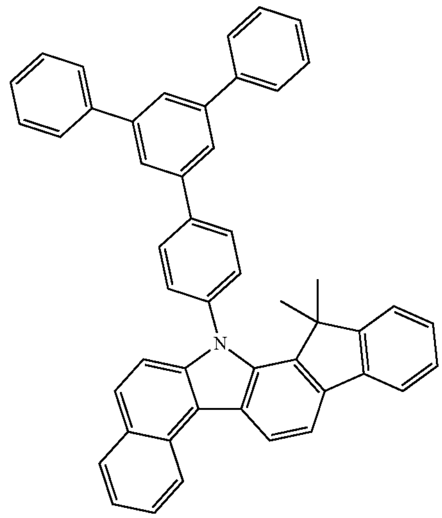
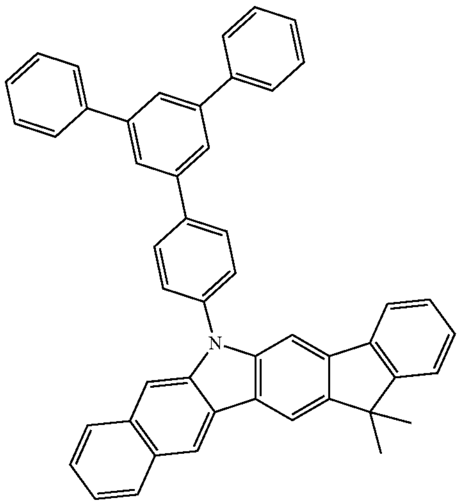
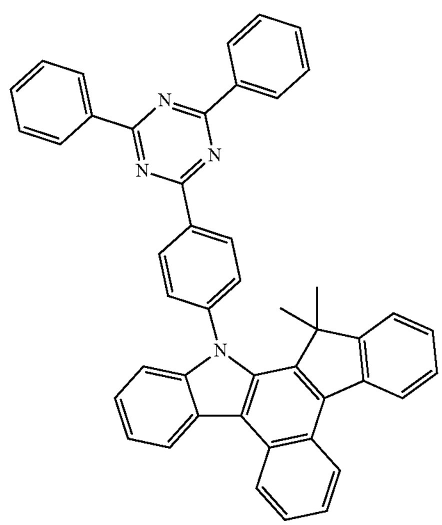
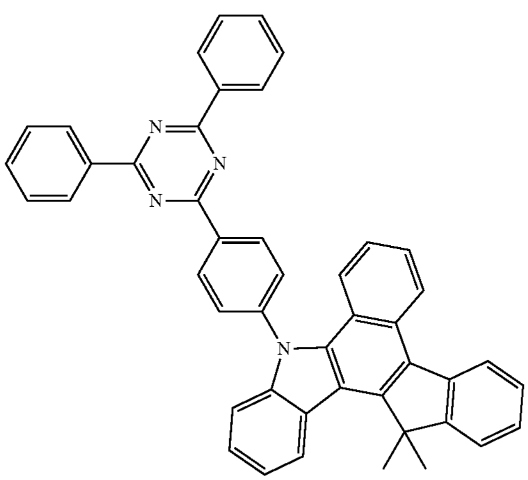
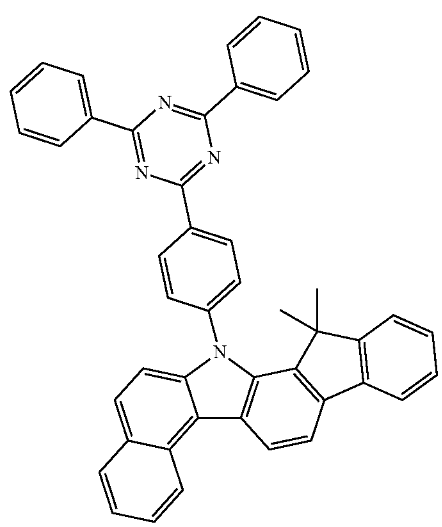

-continued
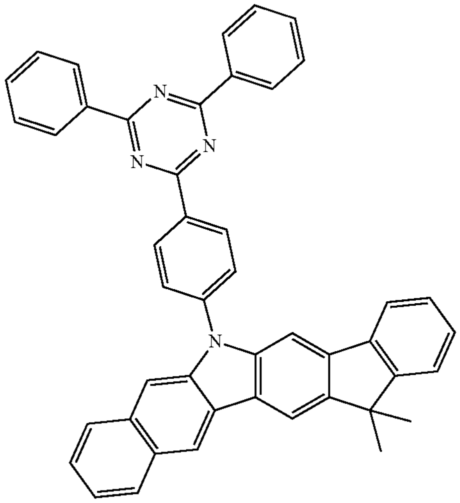
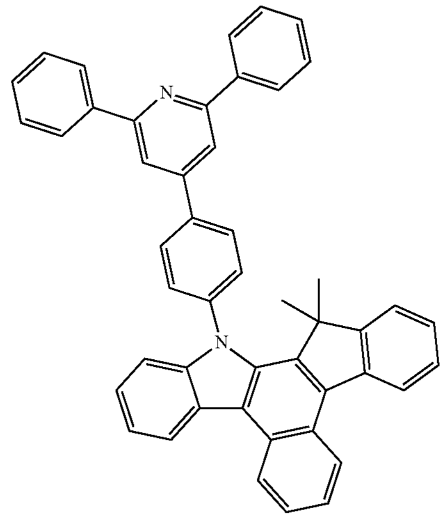
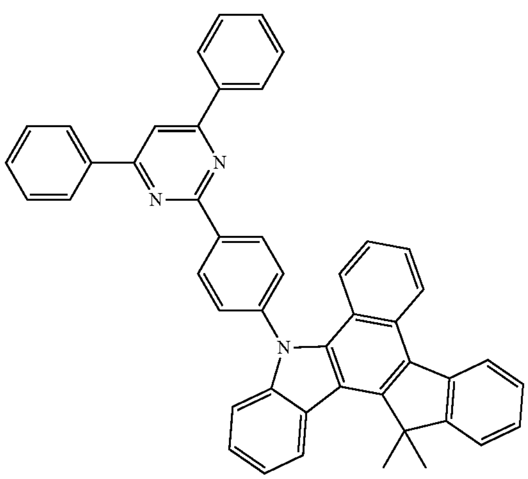
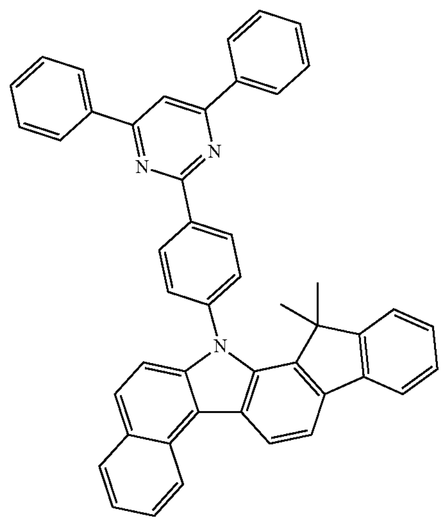
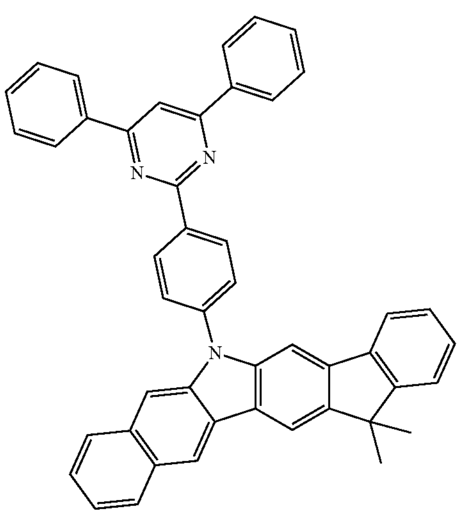
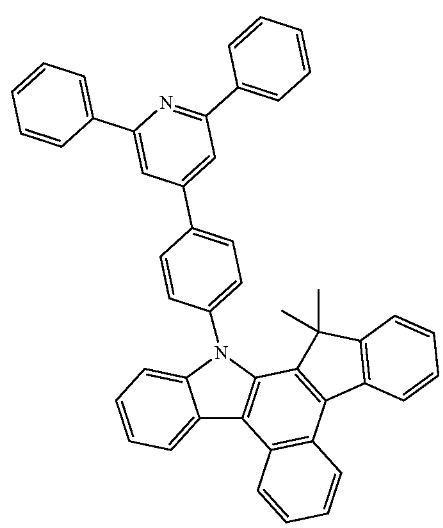

-continued
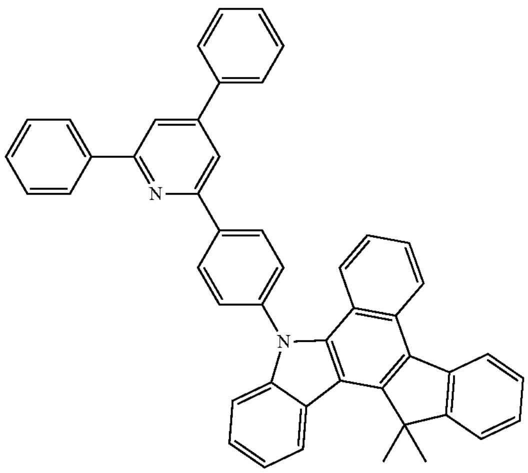
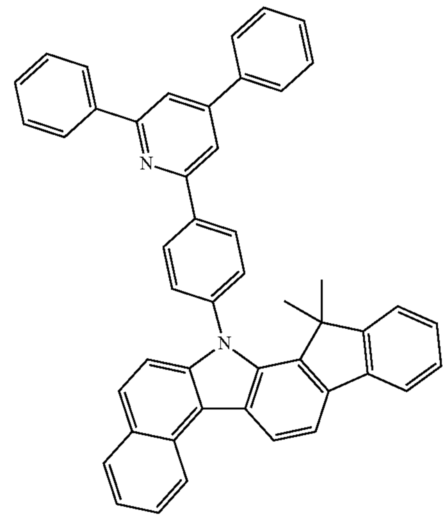
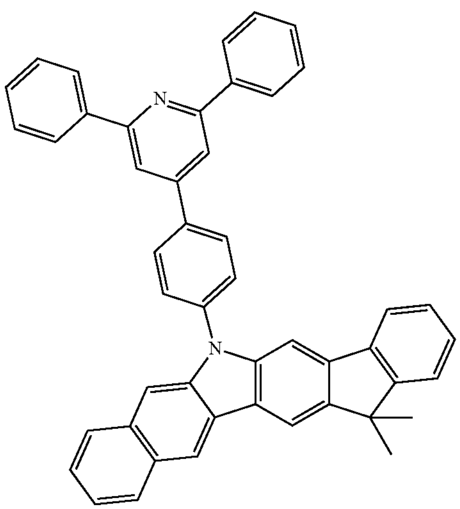
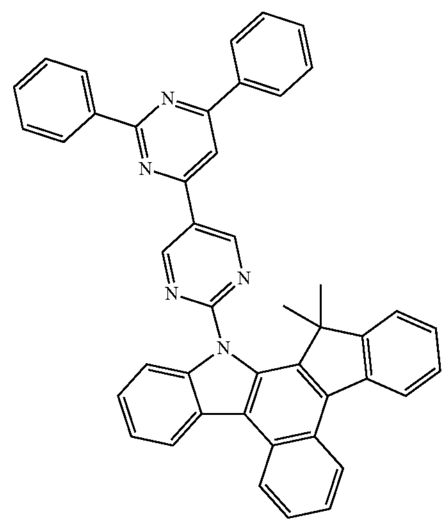
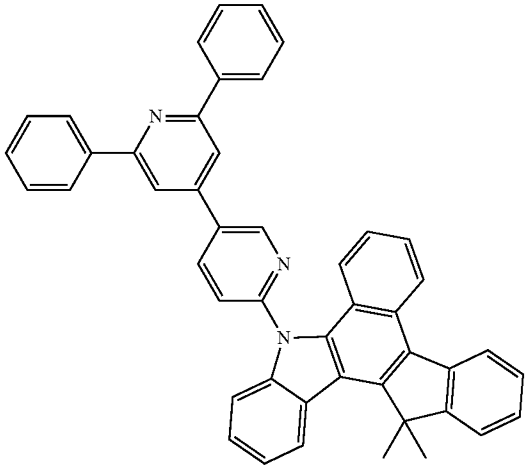
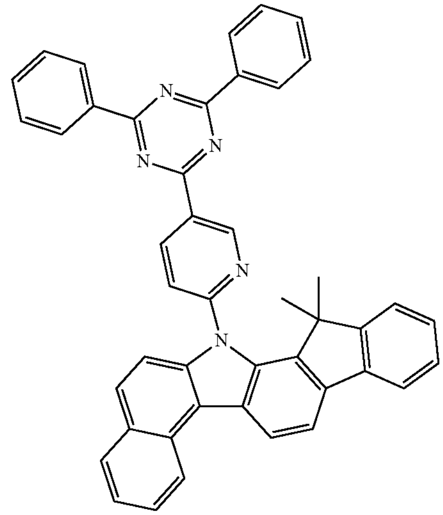

-continued
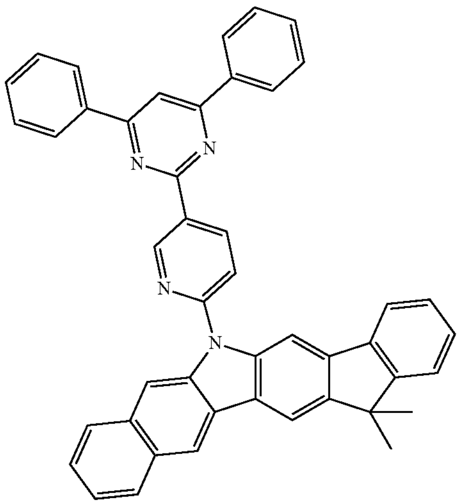
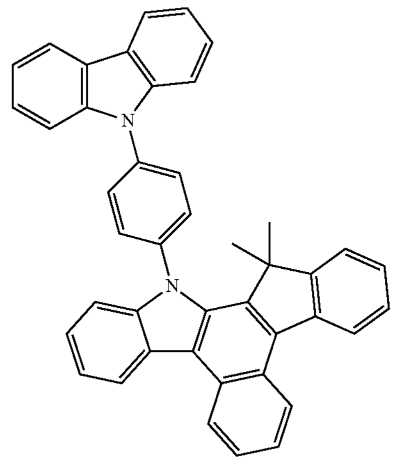
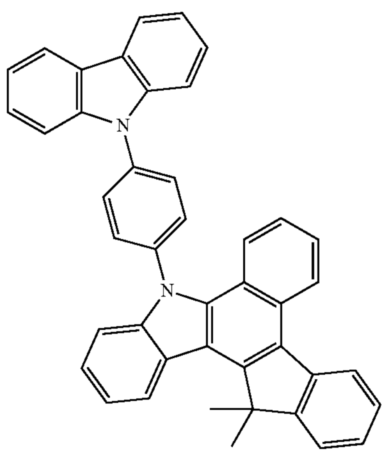
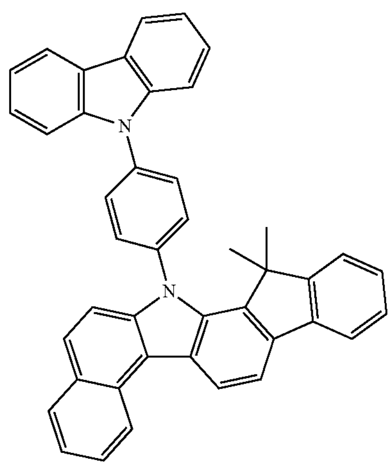
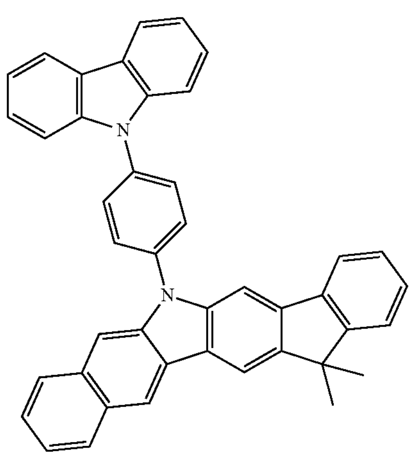
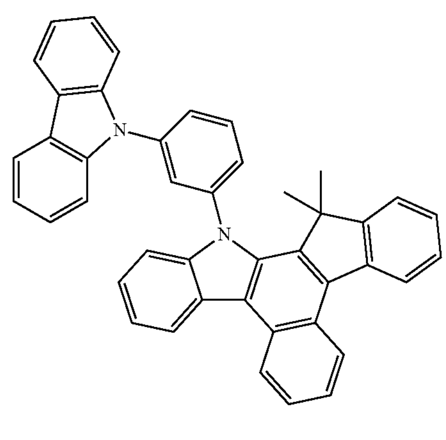

-continued
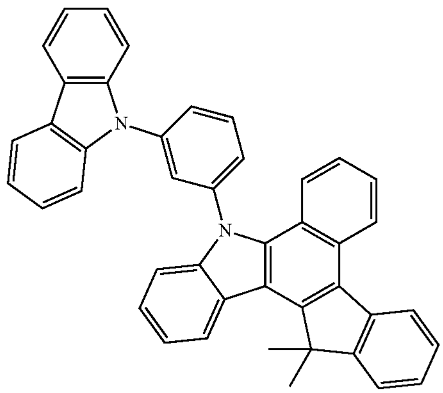
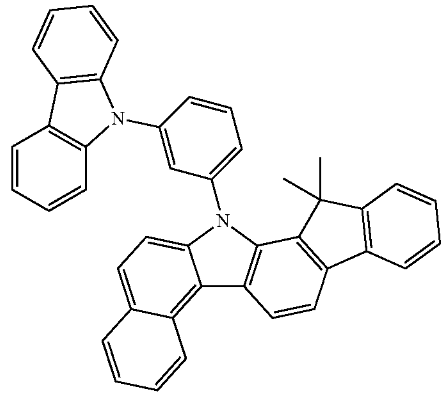
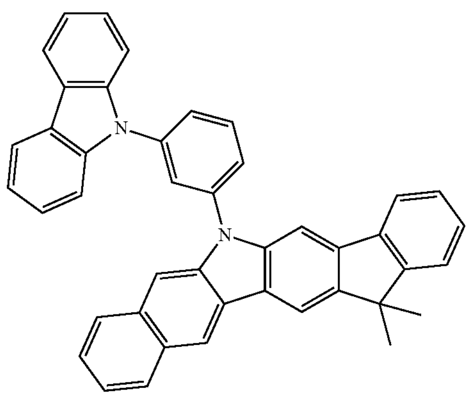
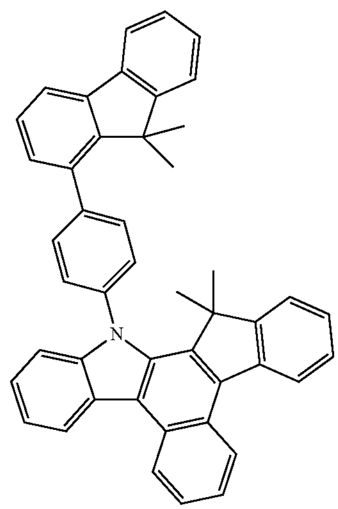
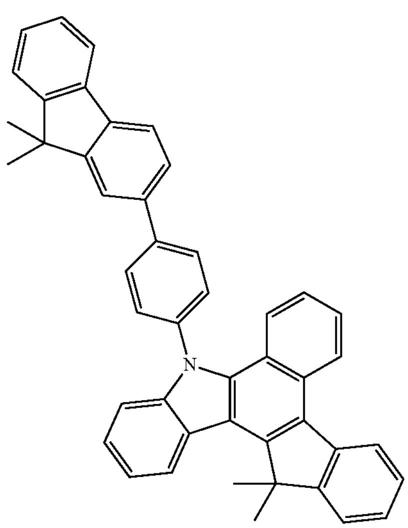
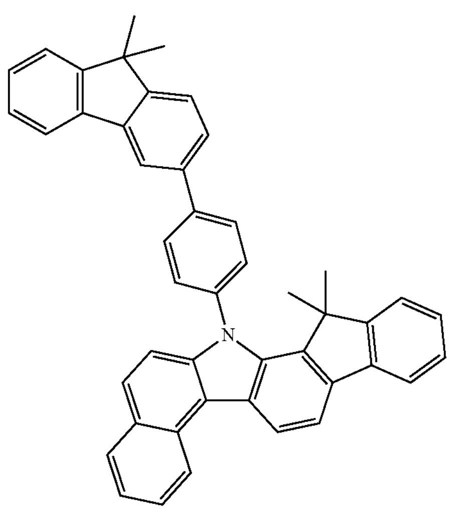

-continued
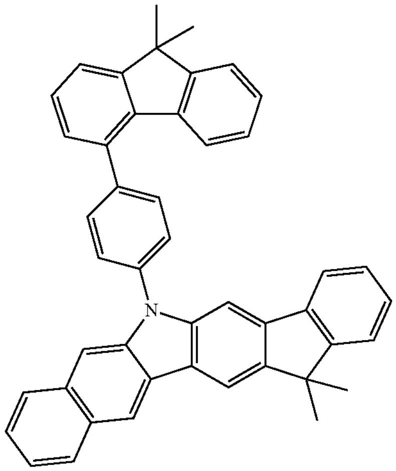
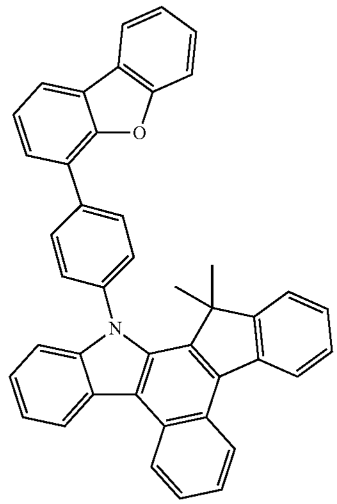
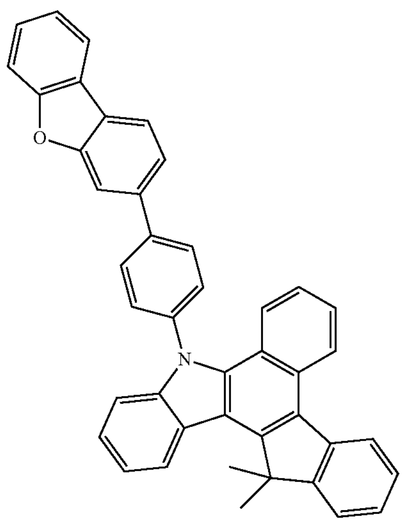
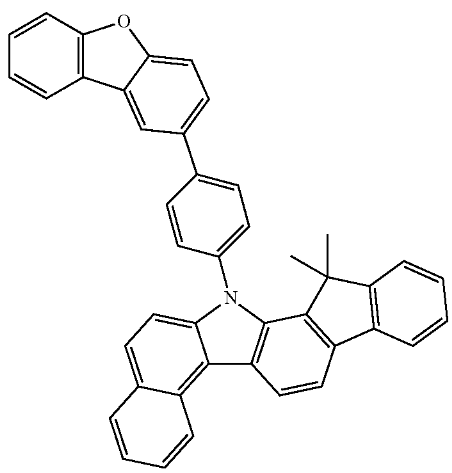
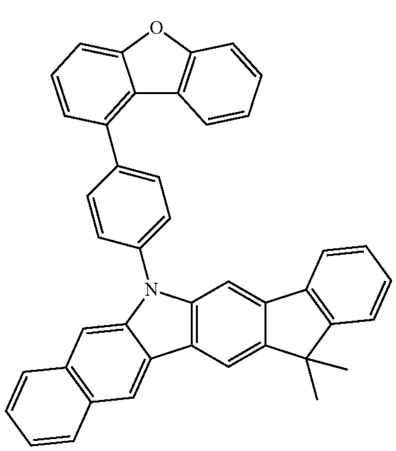
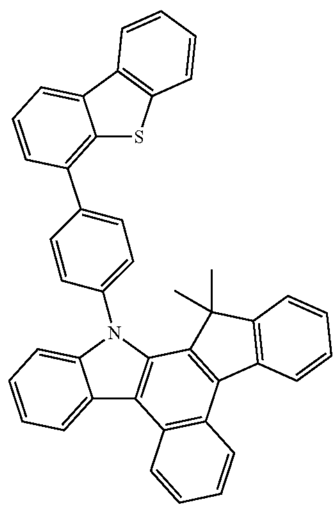

-continued
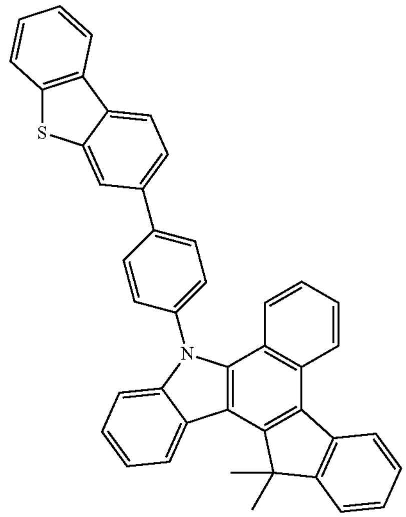
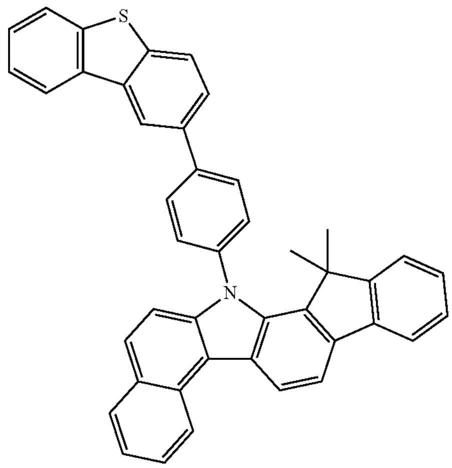
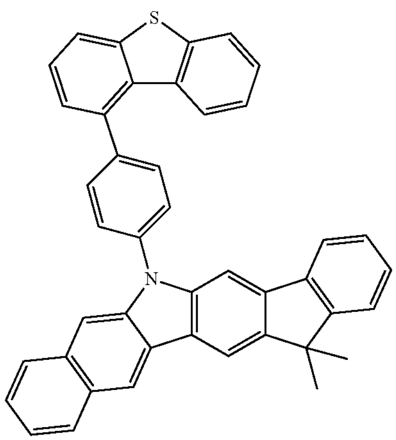
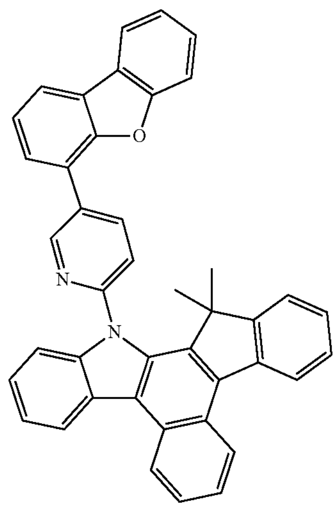
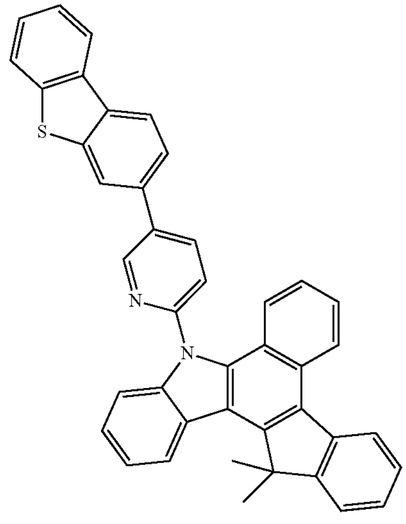
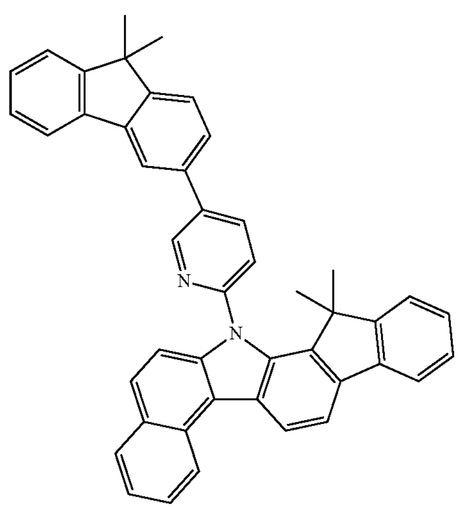

-continued
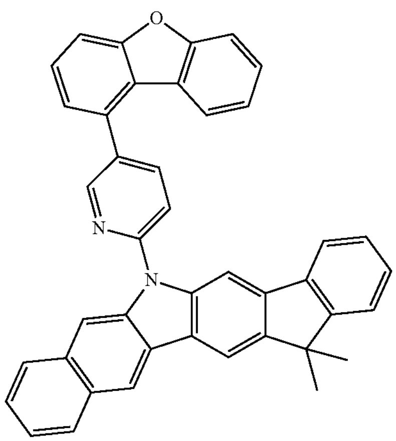
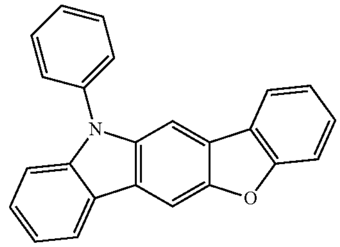
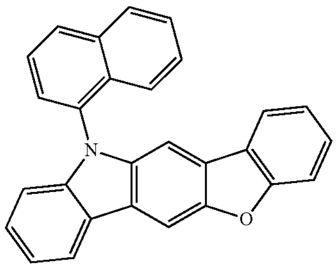
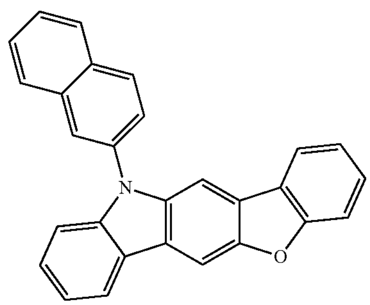
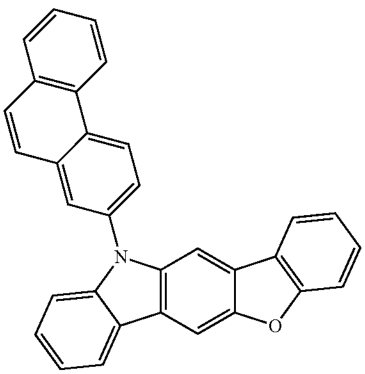
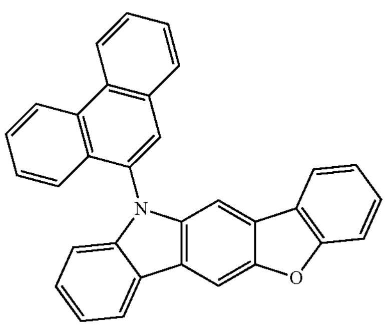
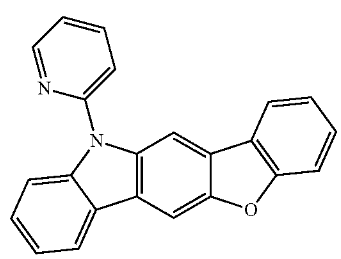
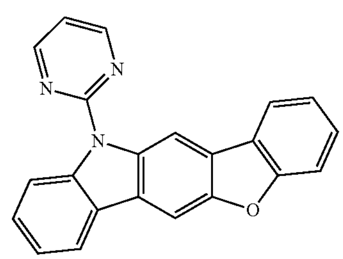
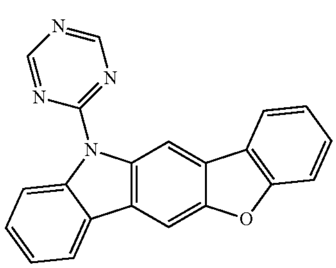
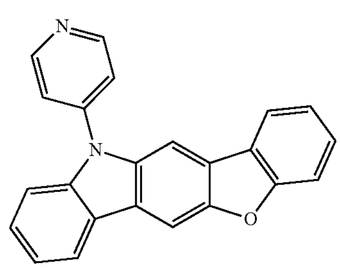
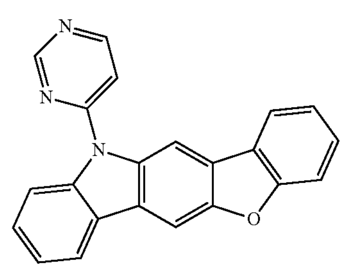

-continued
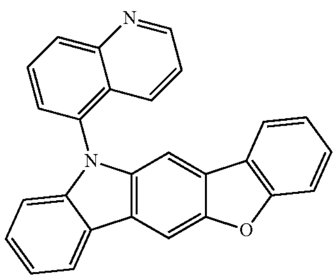
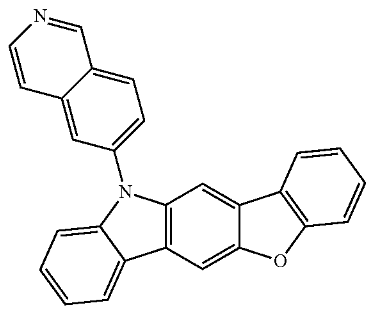
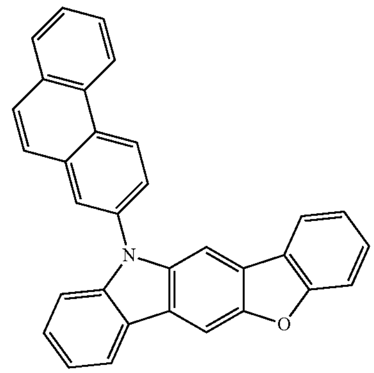
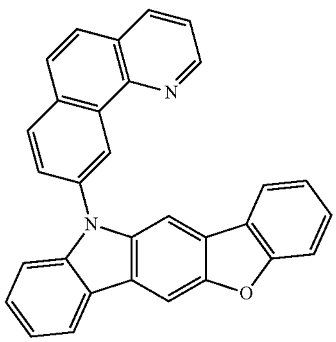
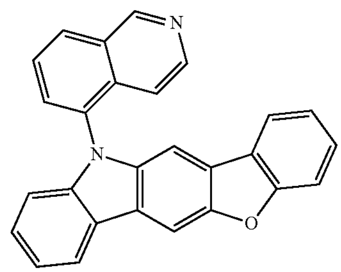
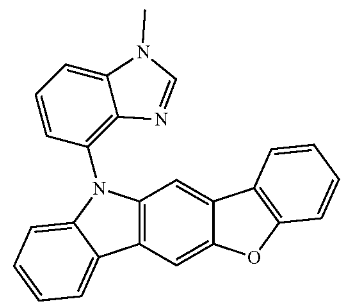
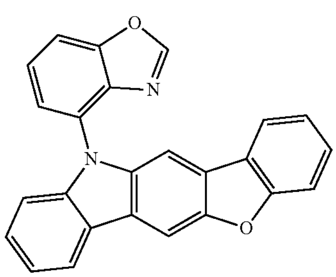
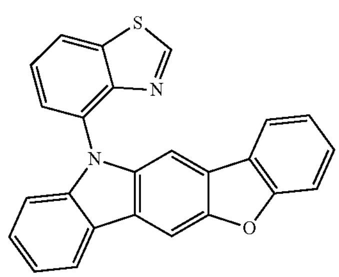
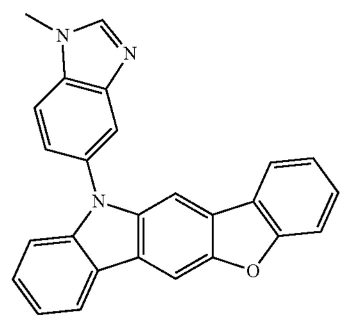
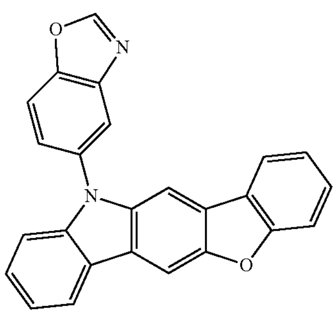
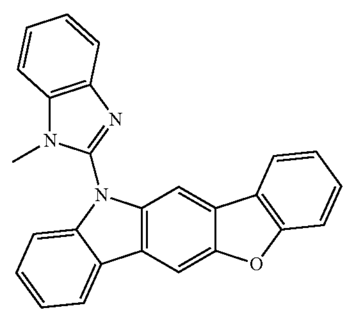
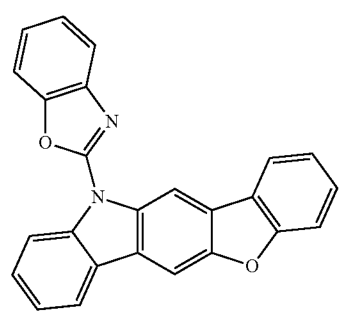
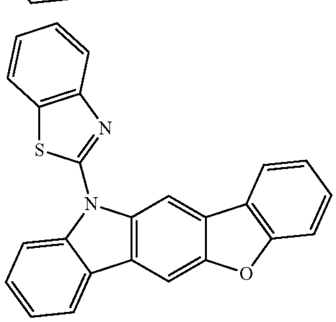
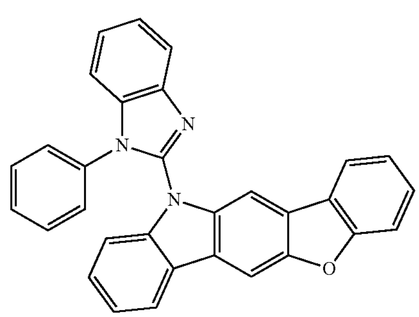

-continued
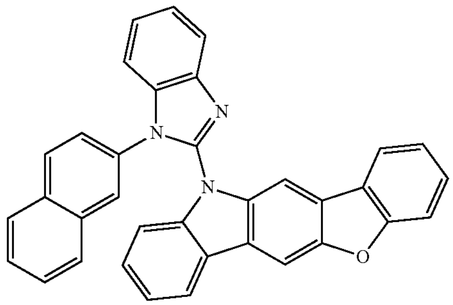
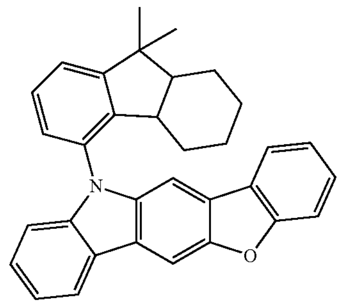
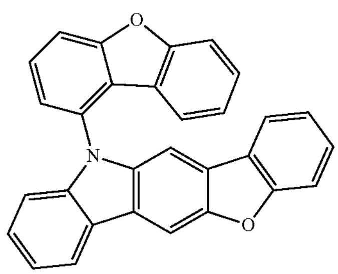
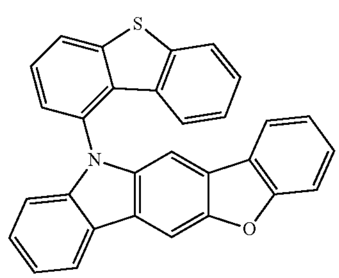
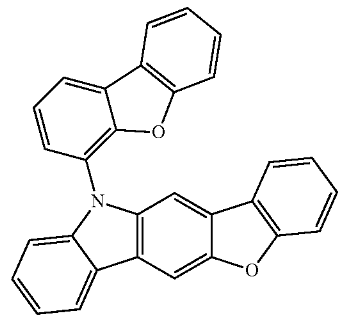
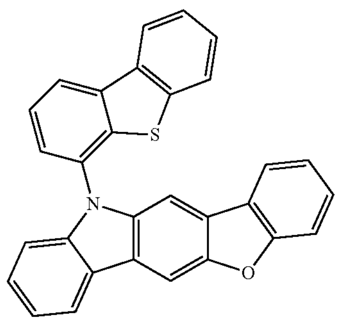
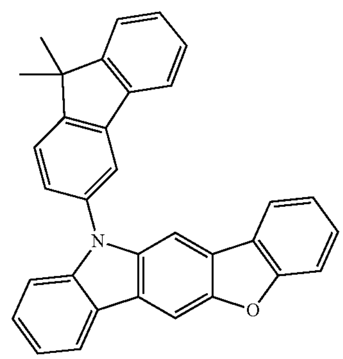
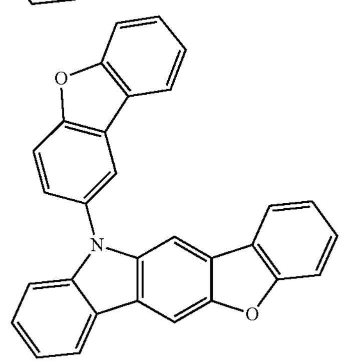
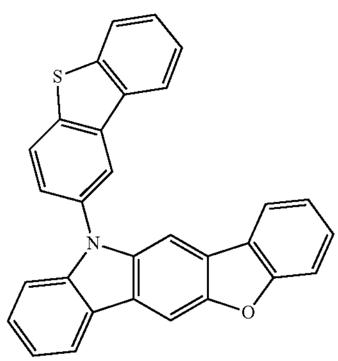
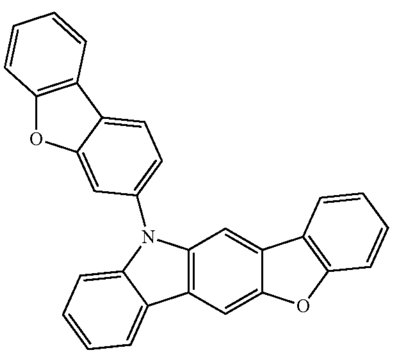
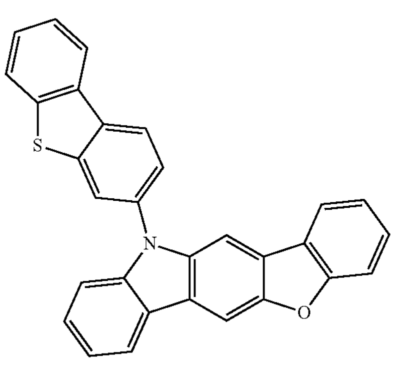
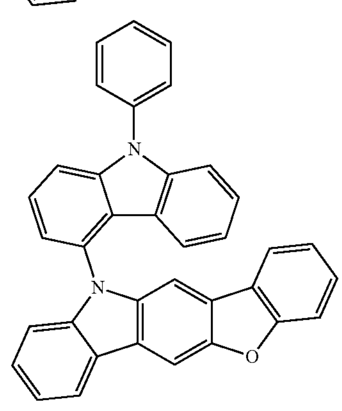

-continued
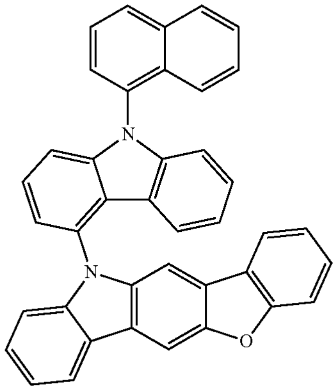
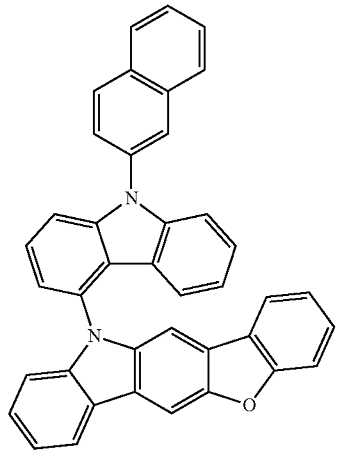
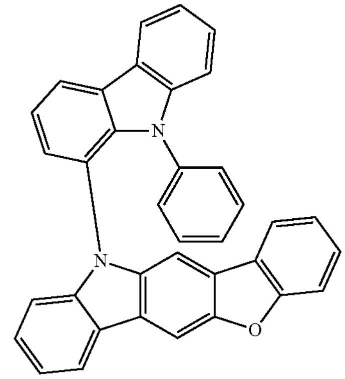
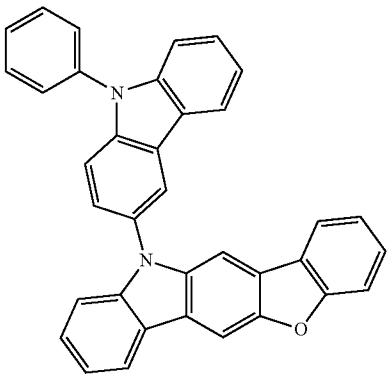
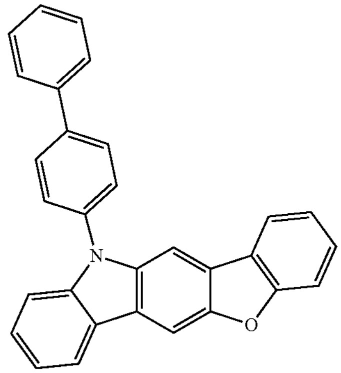
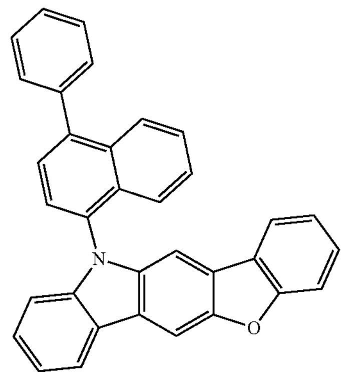
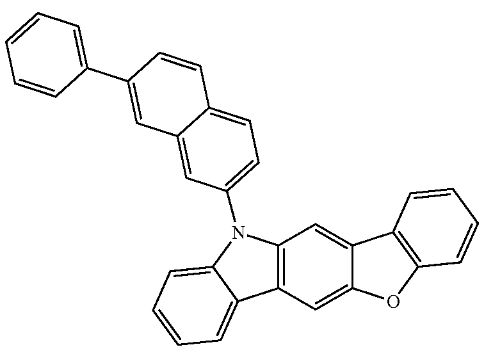
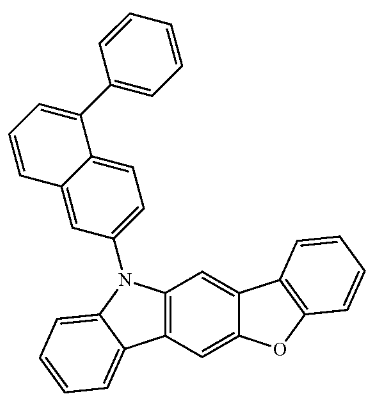
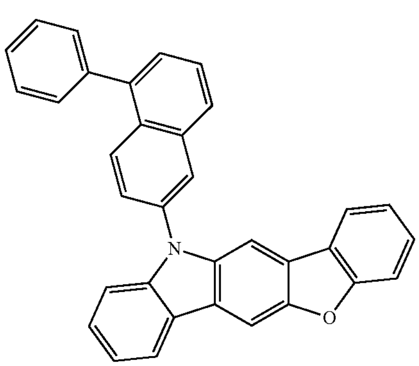
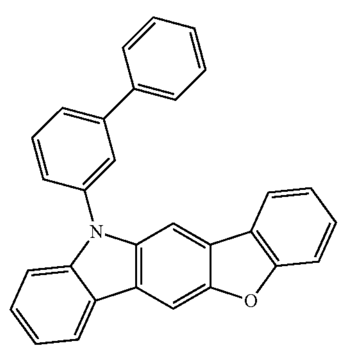

-continued
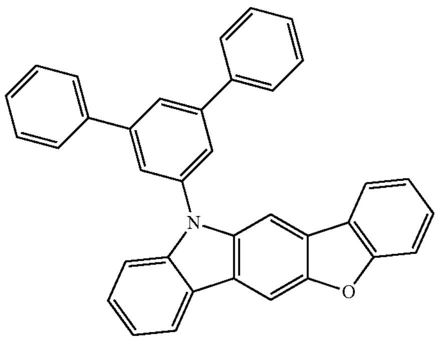
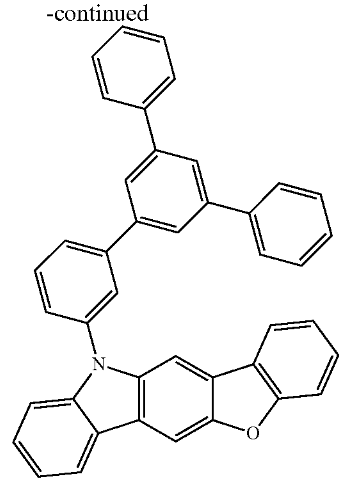
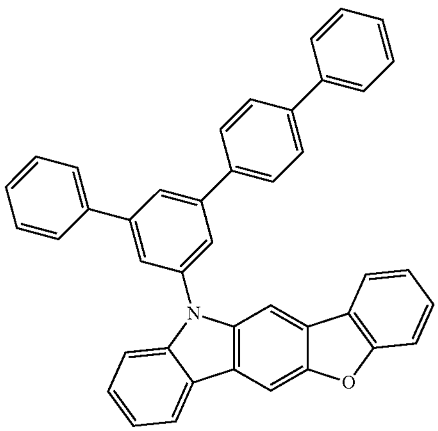
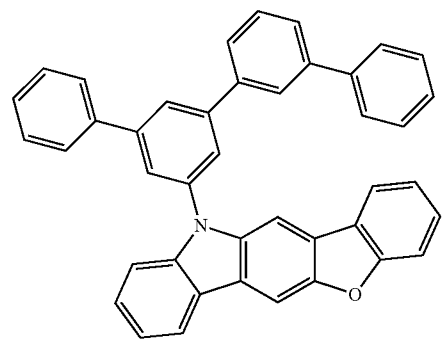
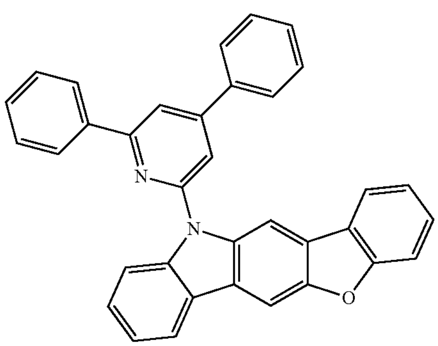
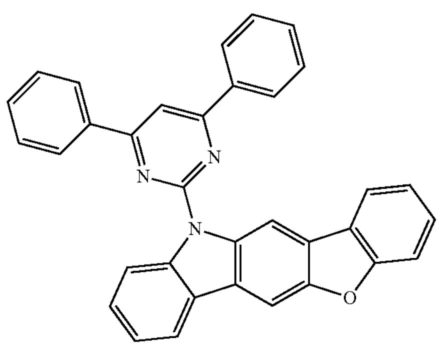
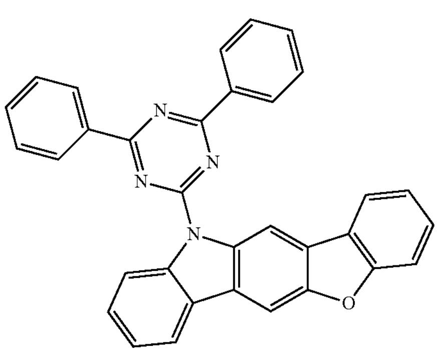
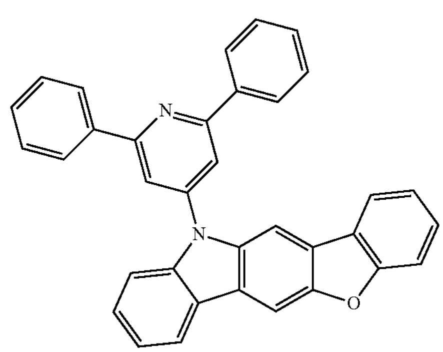

-continued
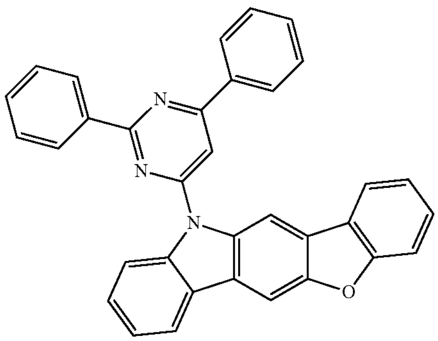
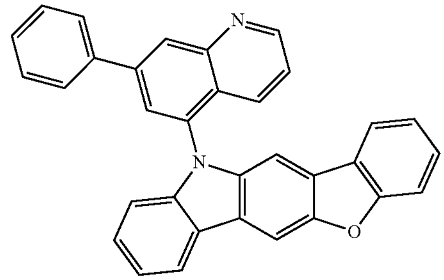
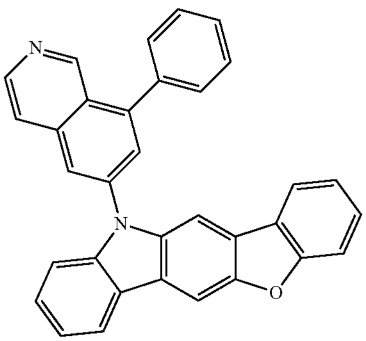
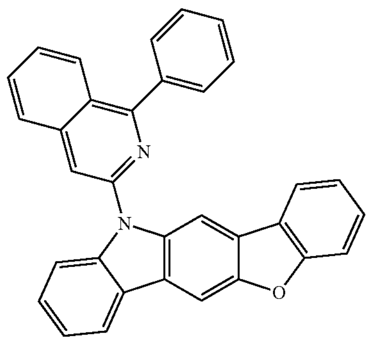
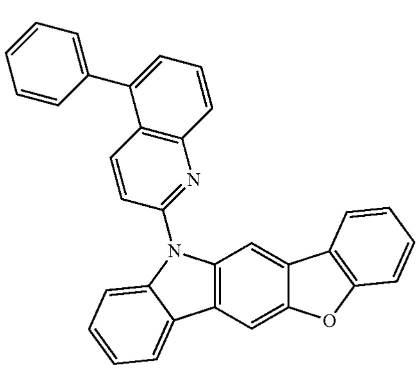
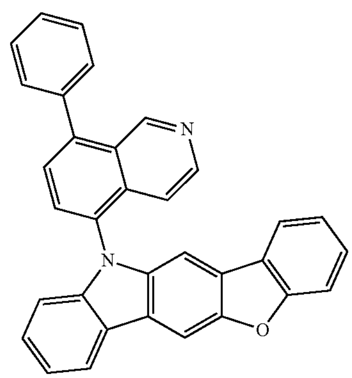
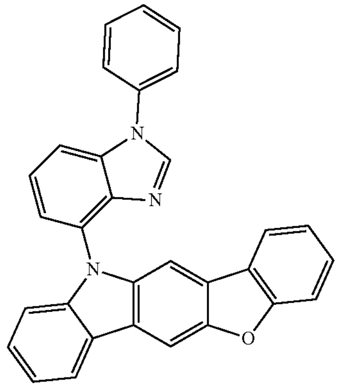
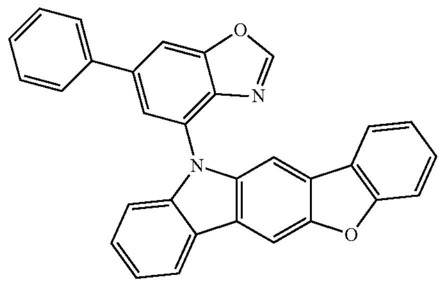

-continued
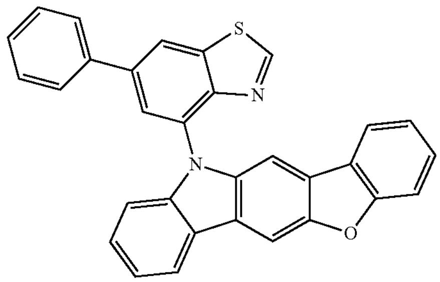
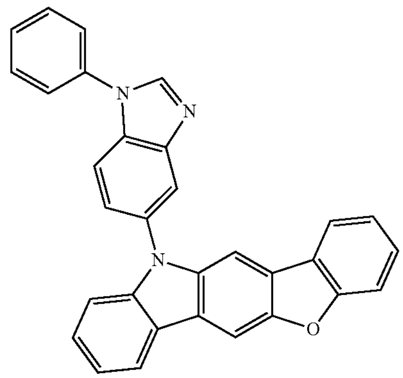
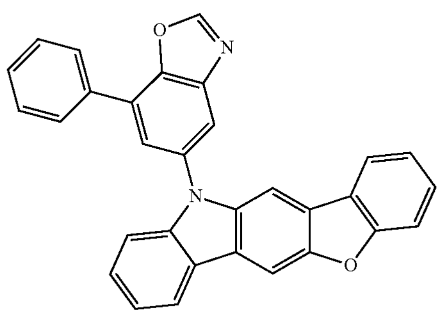
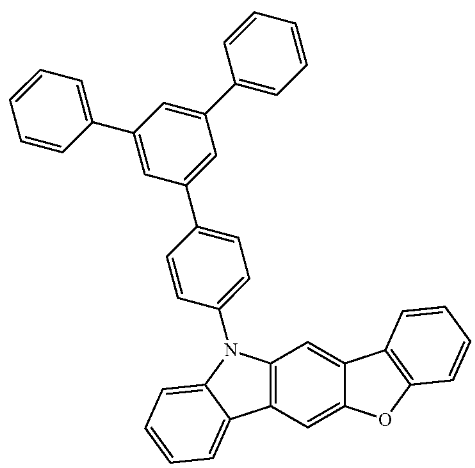
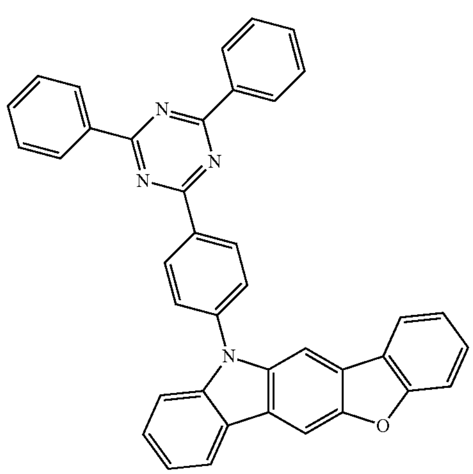
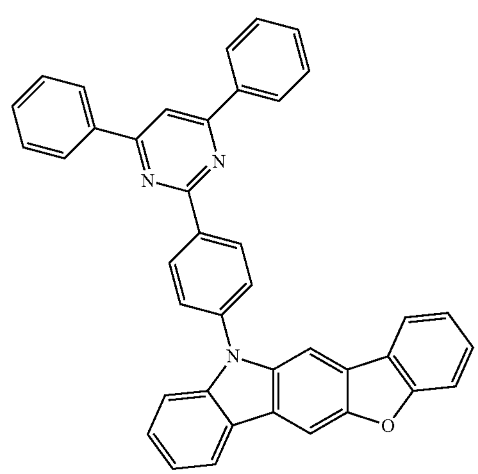

-continued
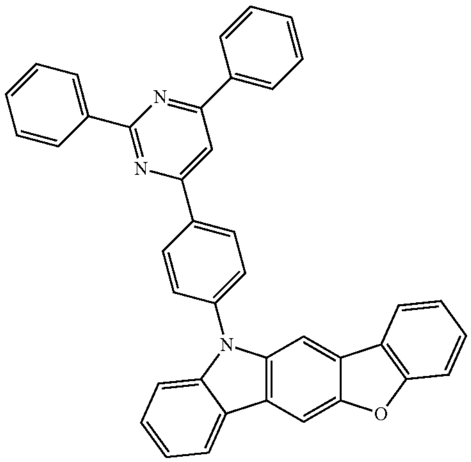
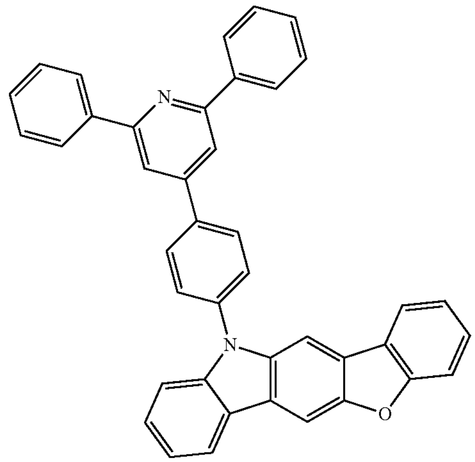
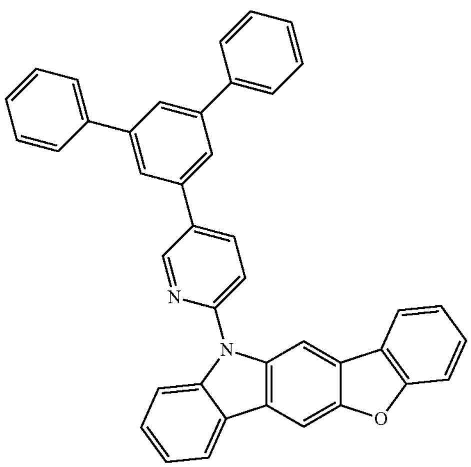
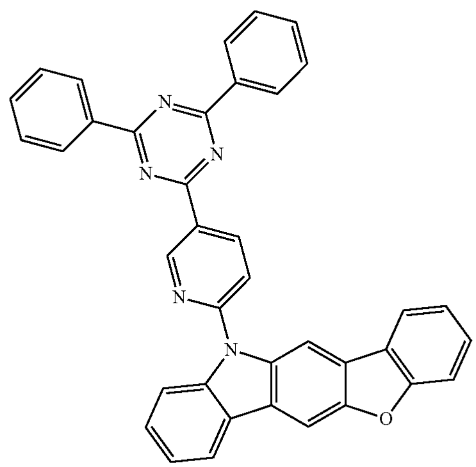
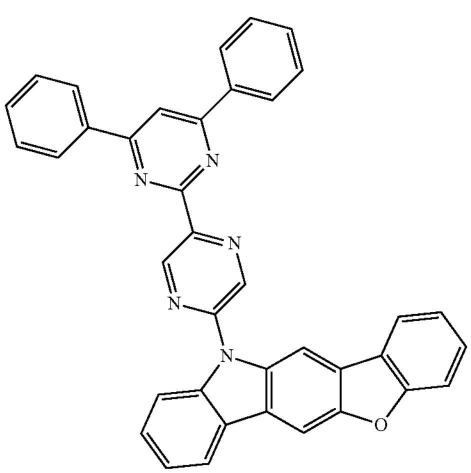
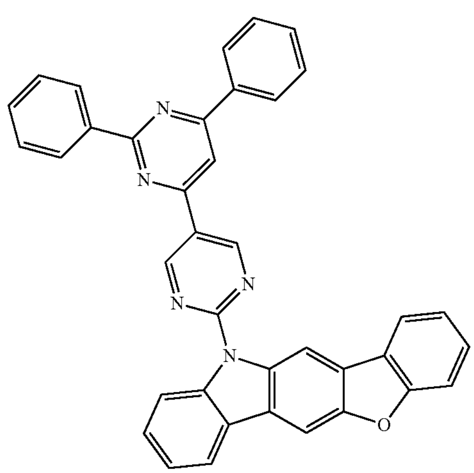

-continued
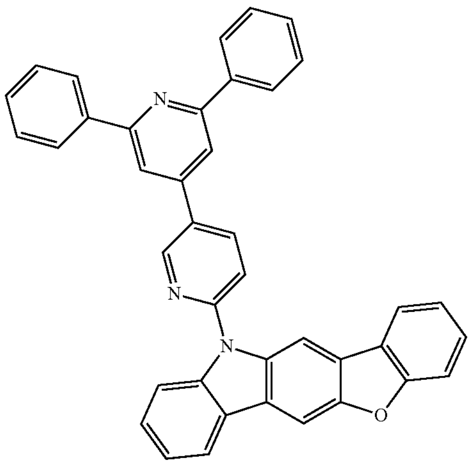
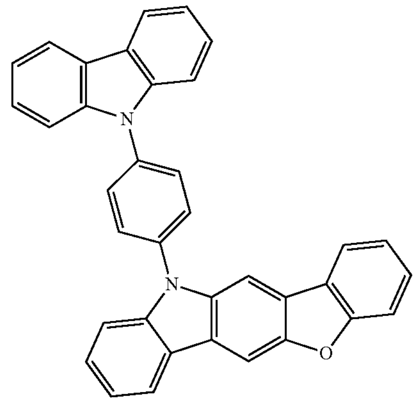
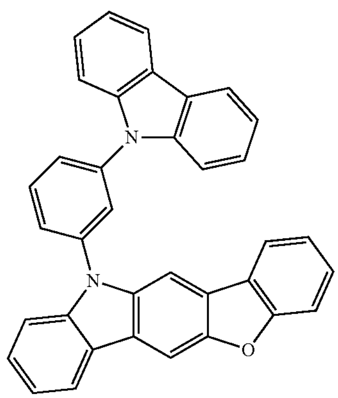
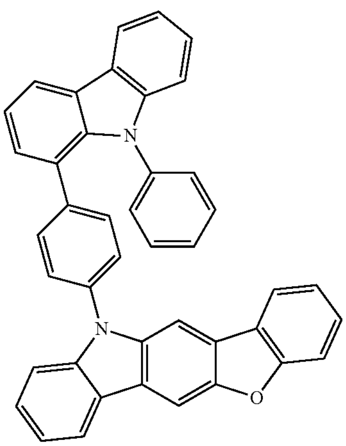
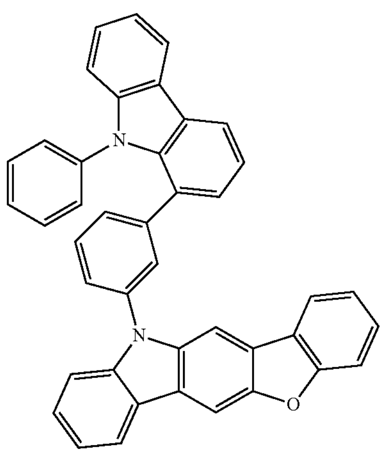
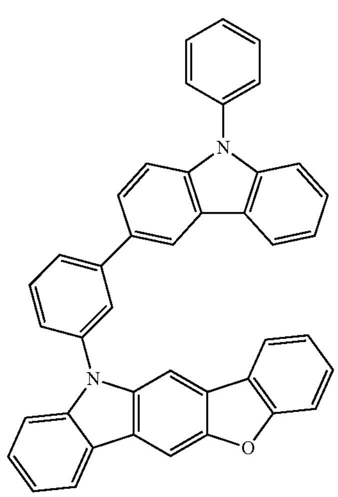
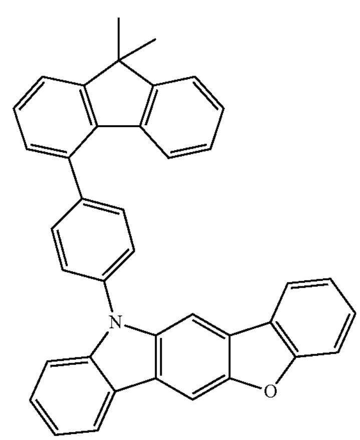

-continued
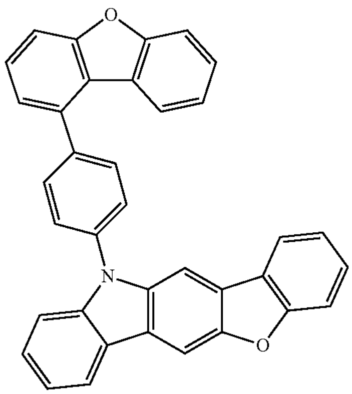
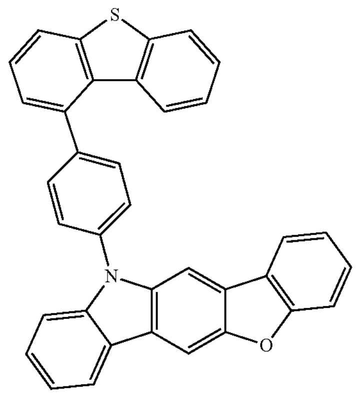
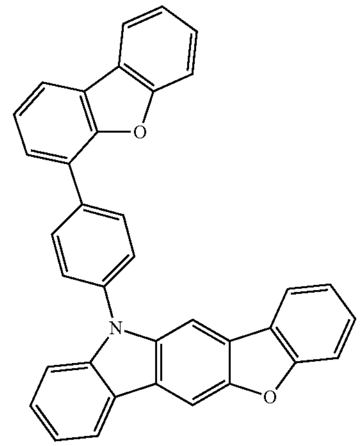
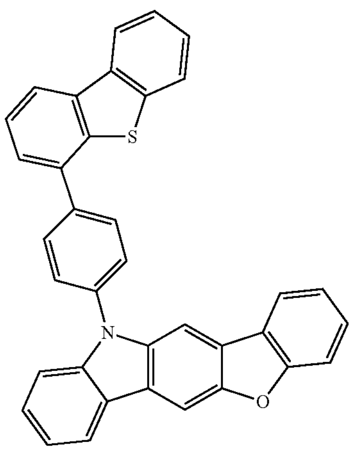
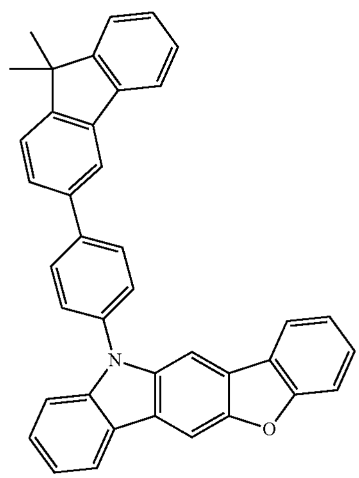
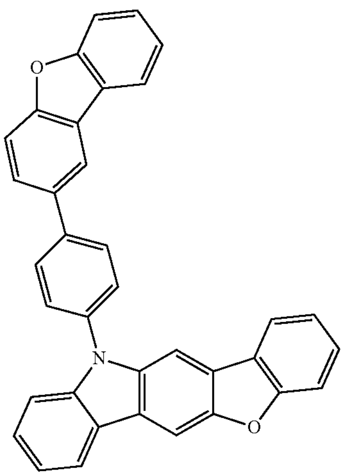
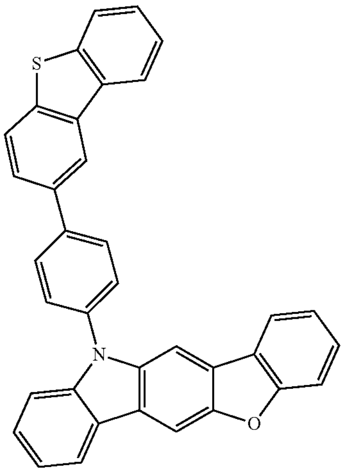
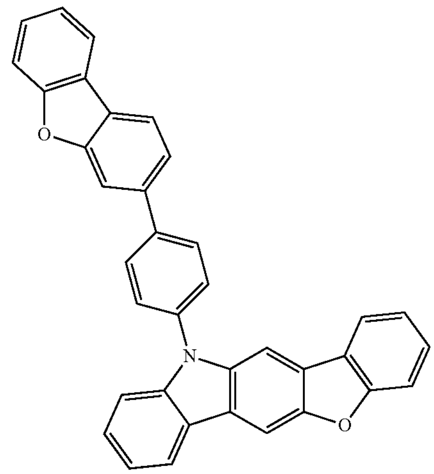

-continued
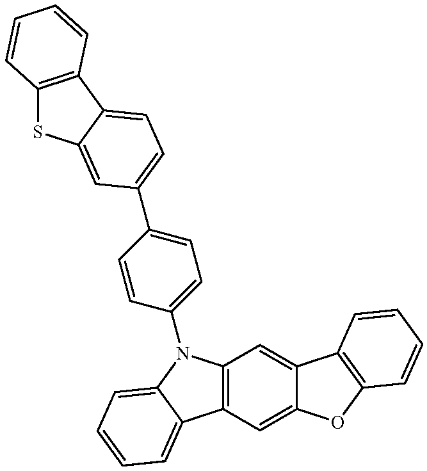
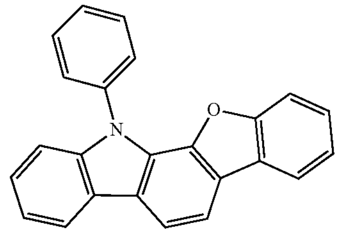
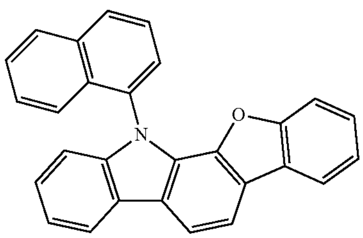
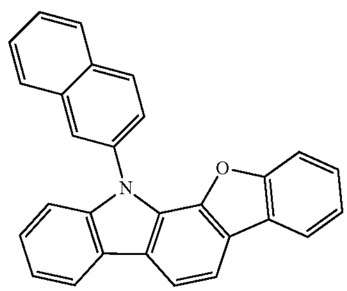
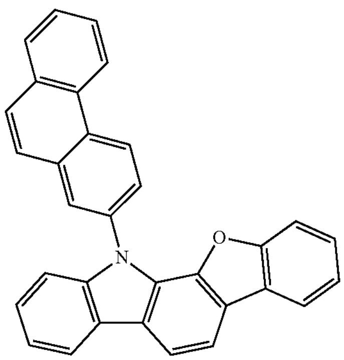
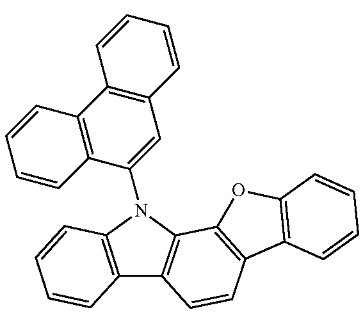
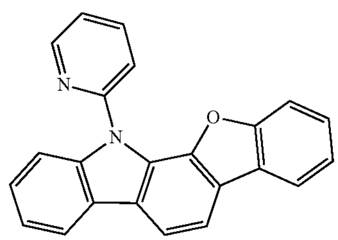
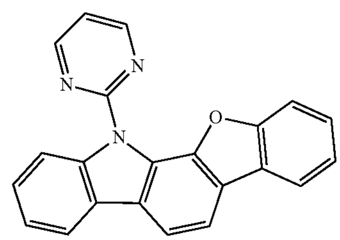
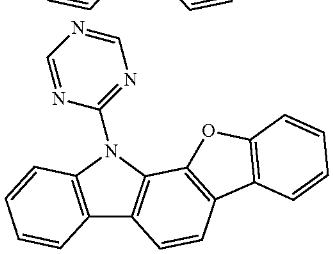
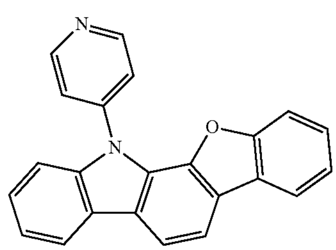
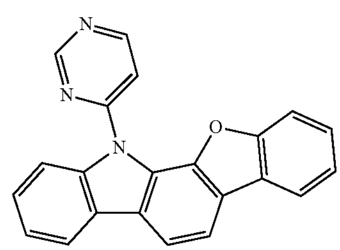
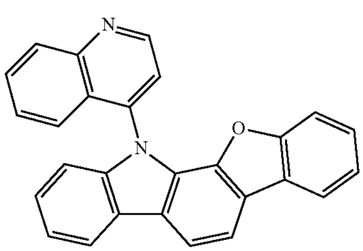
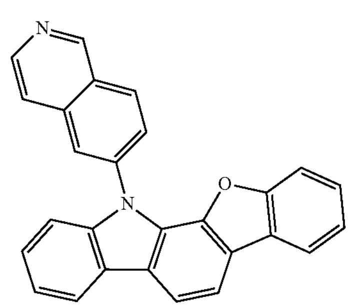
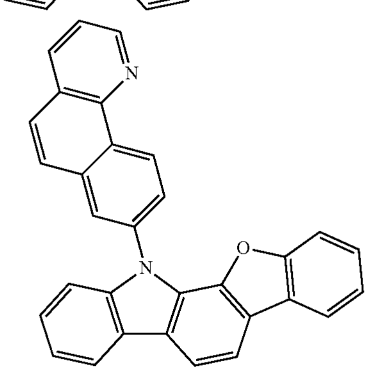

-continued
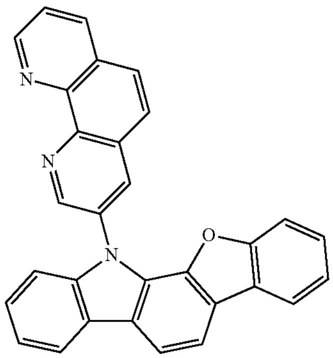
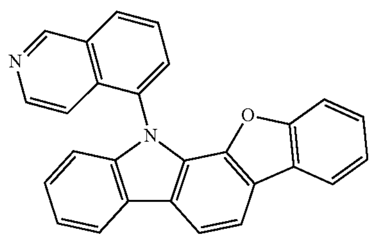
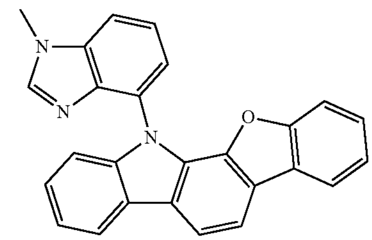
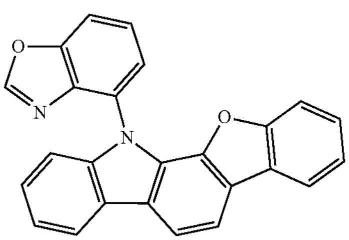
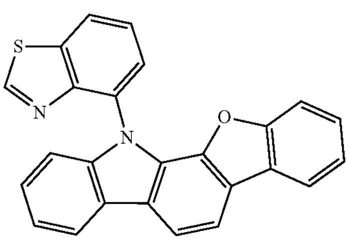
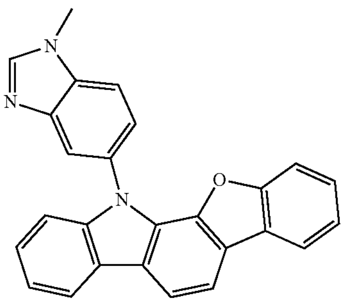
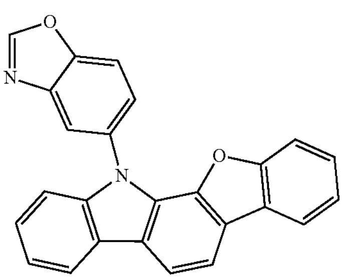
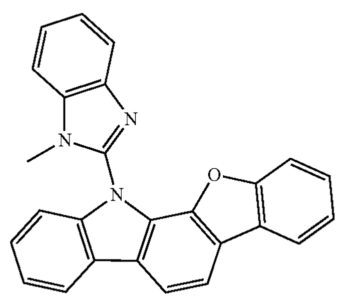
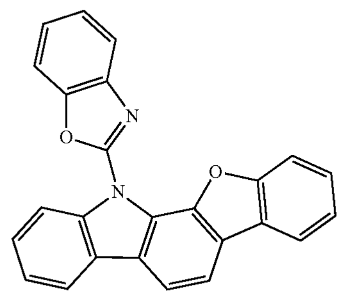
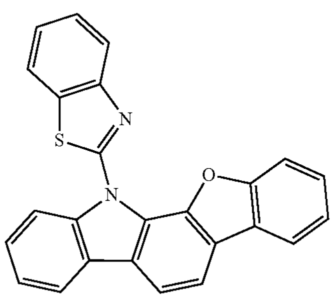
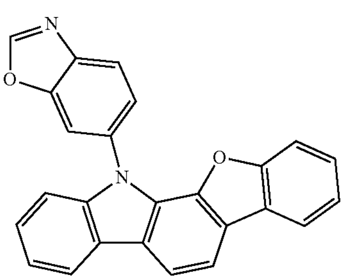
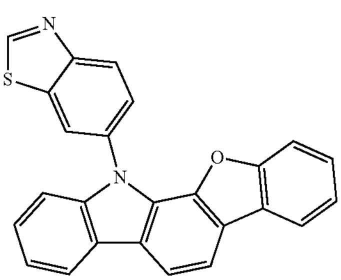
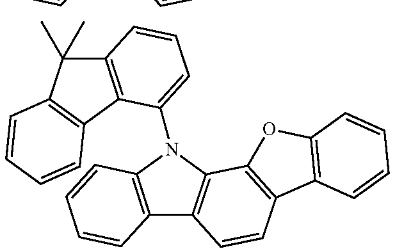
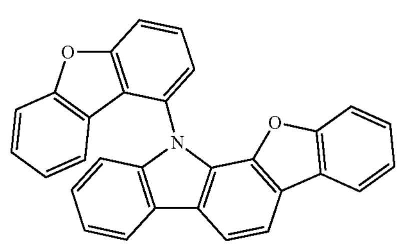
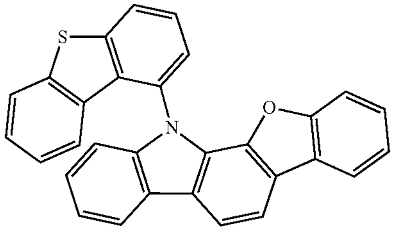
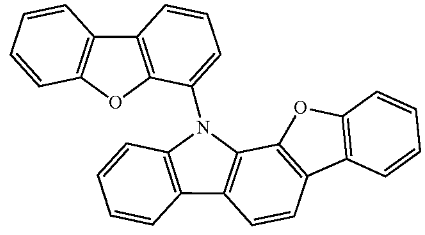

-continued
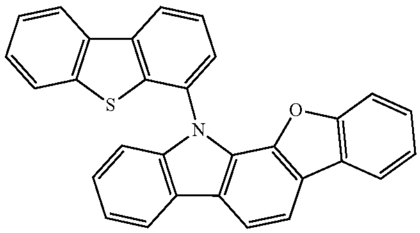
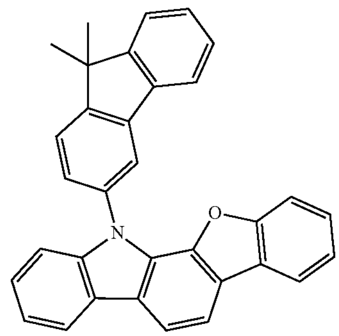
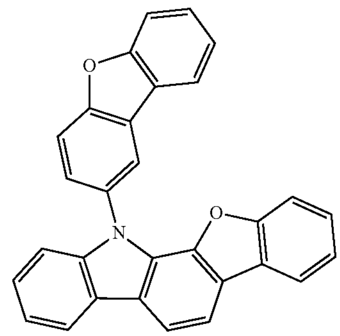
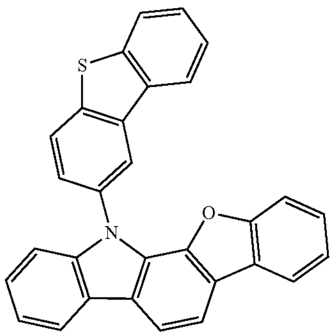
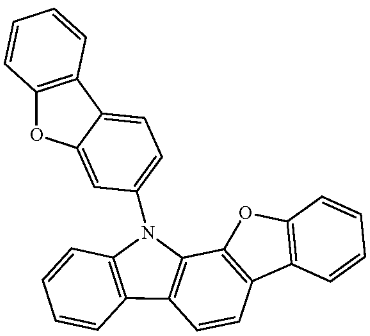
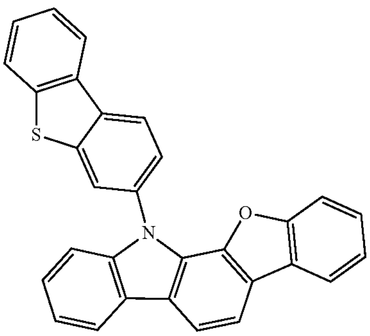
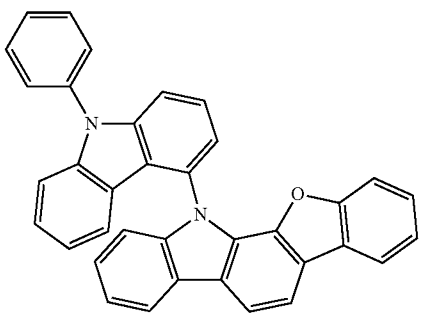
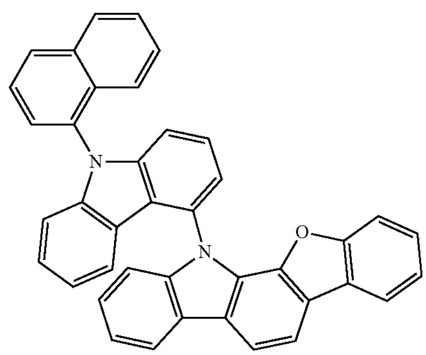
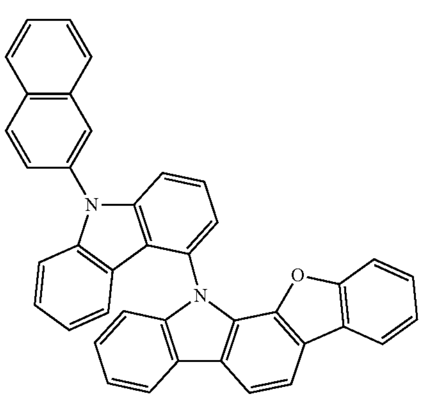
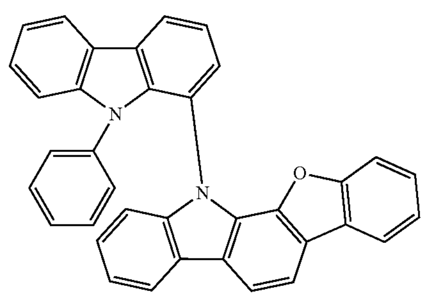

-continued
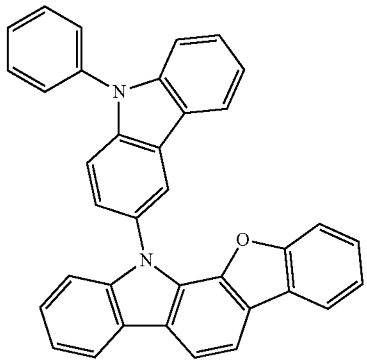
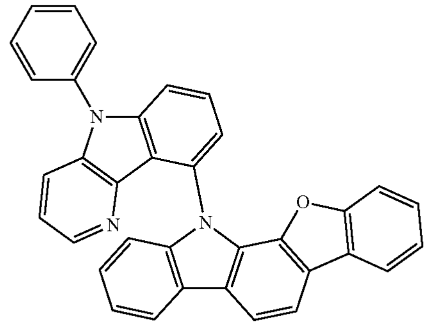
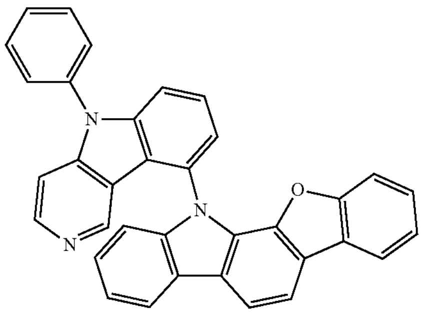
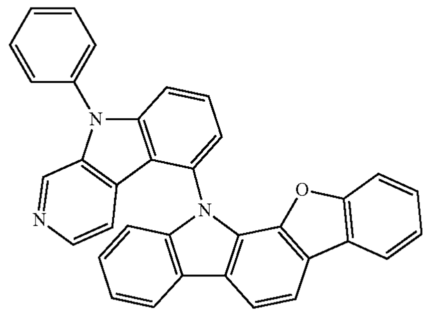
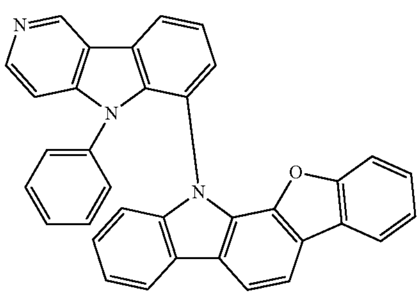
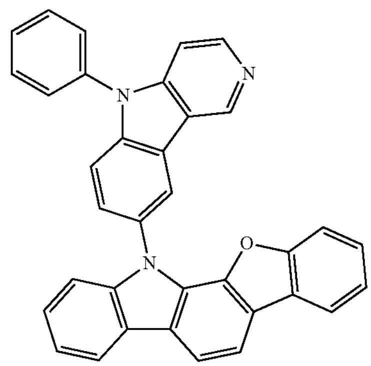
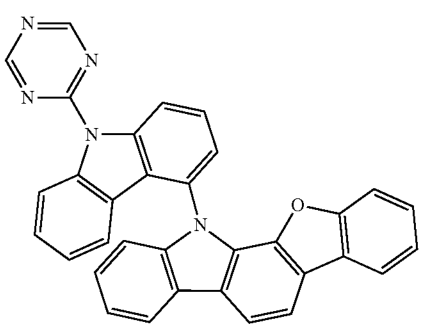
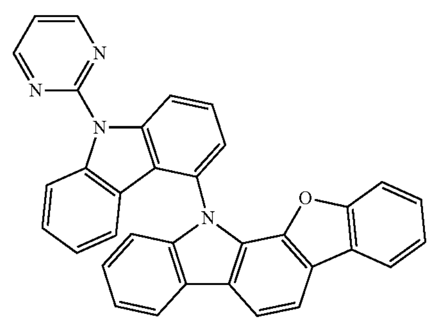
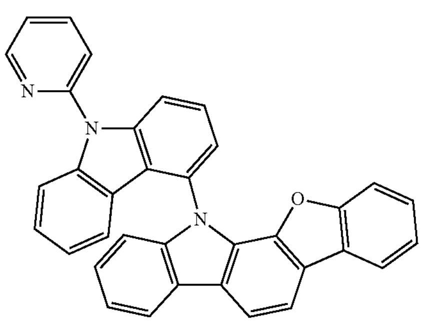
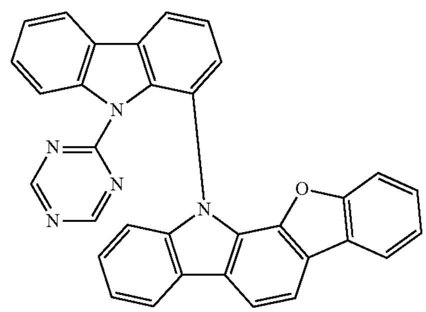

-continued
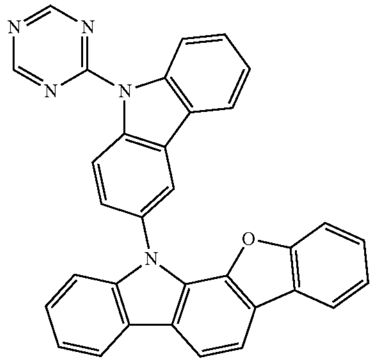
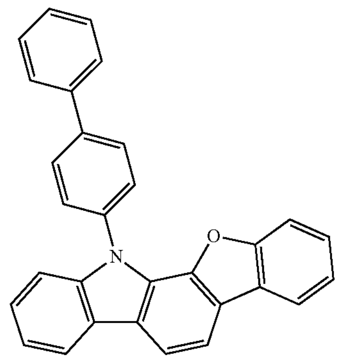
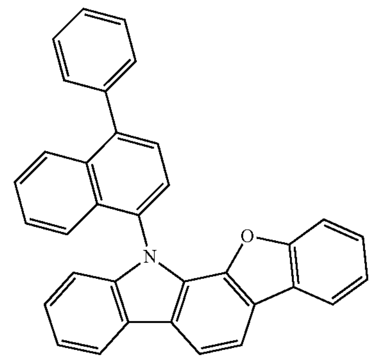
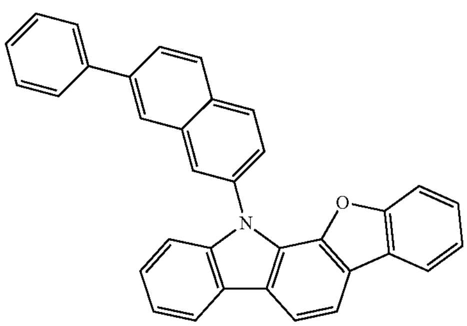
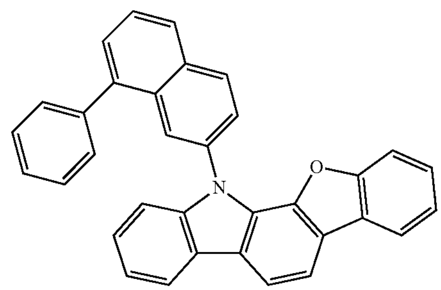
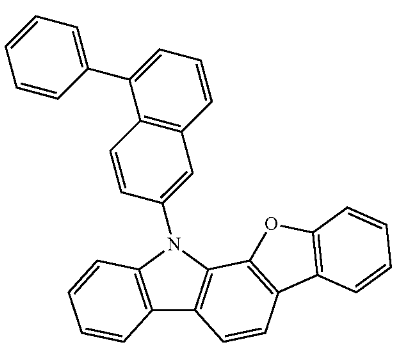
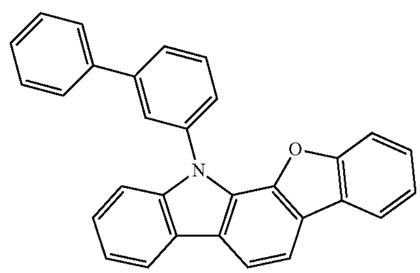
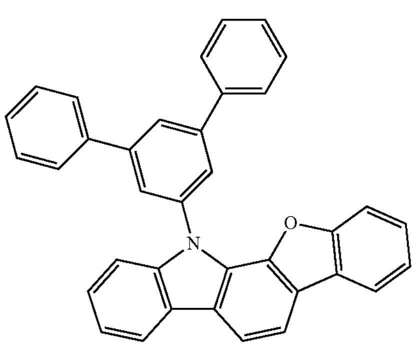
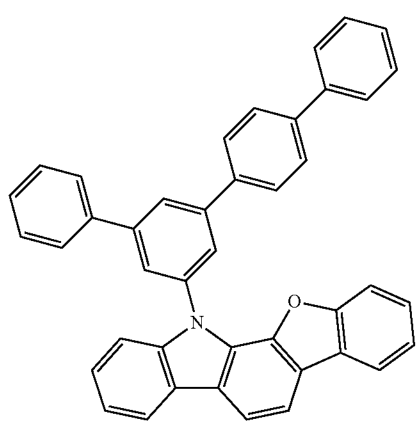

-continued
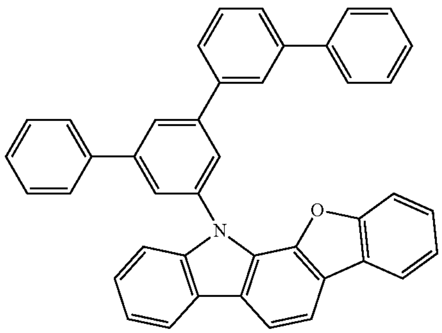
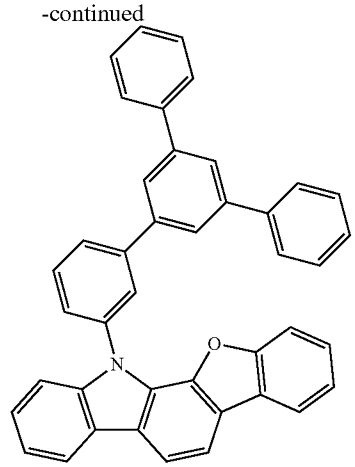
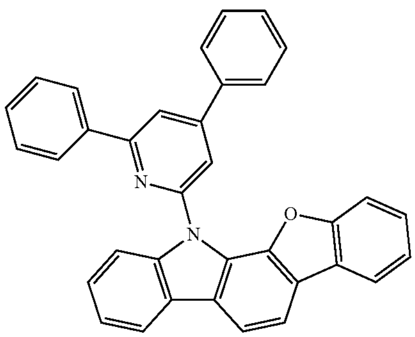
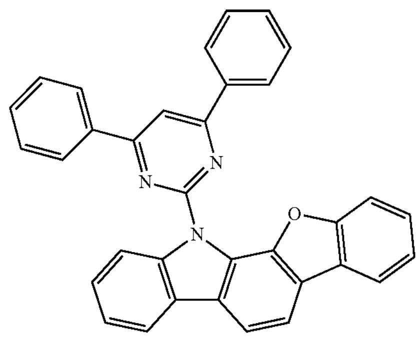
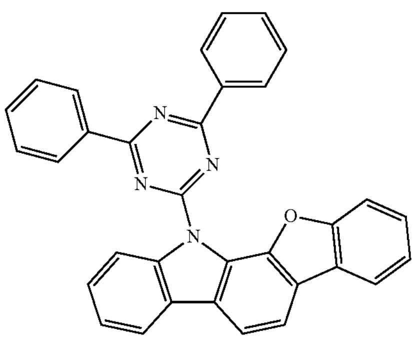
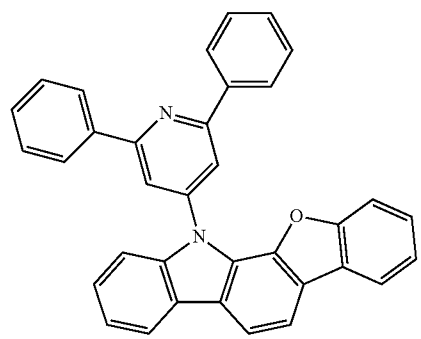
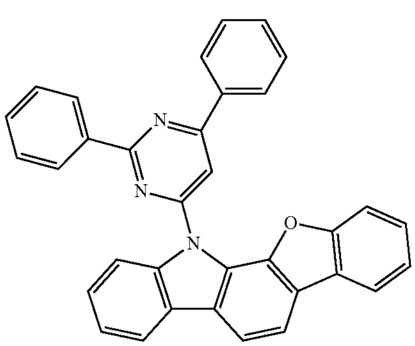
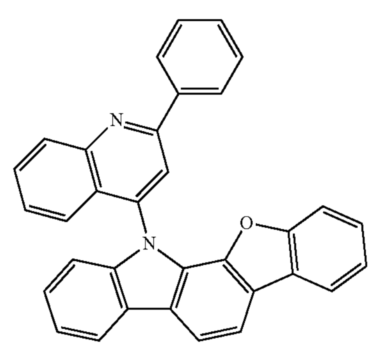

-continued
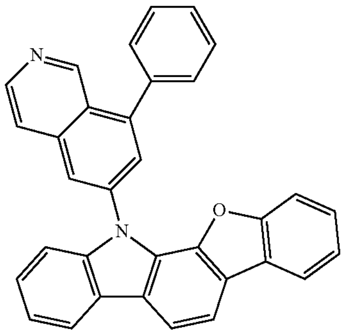
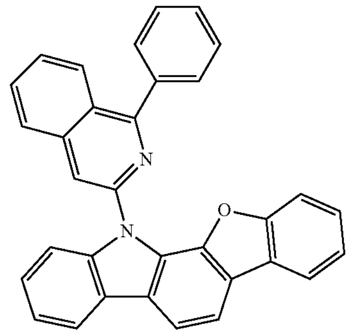
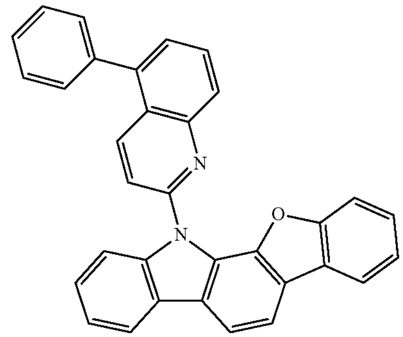
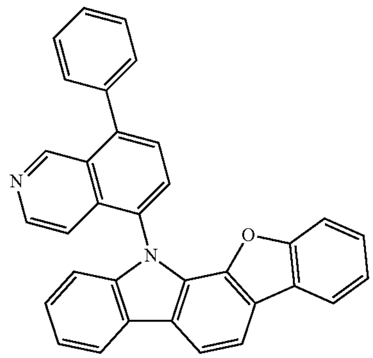
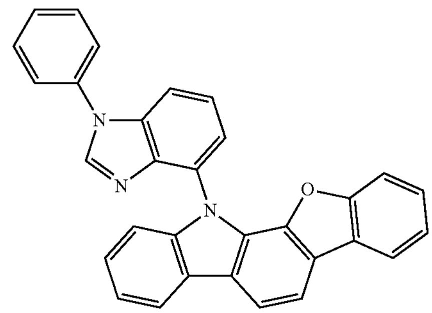
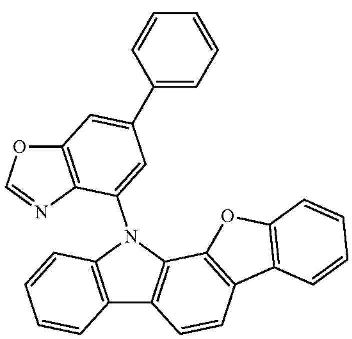
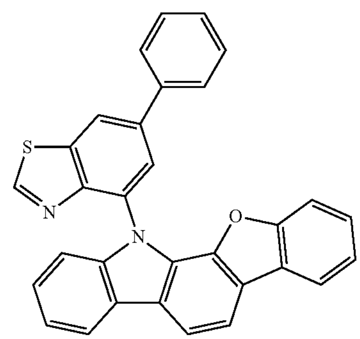
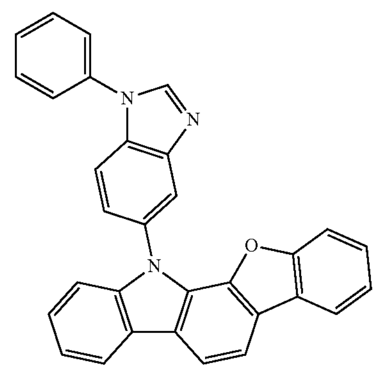
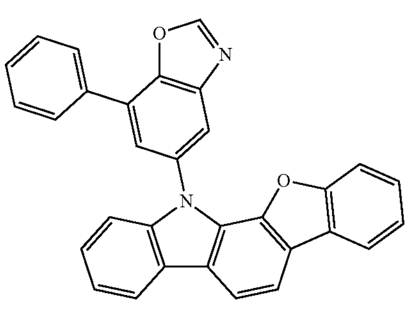
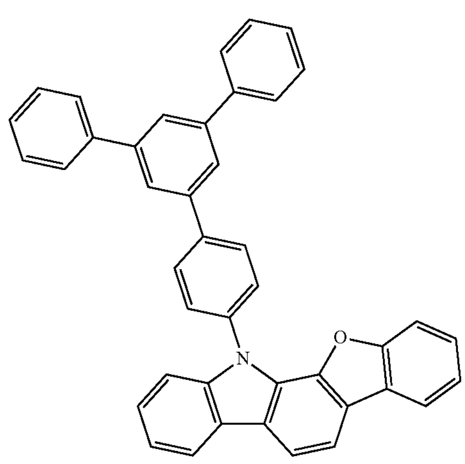

-continued
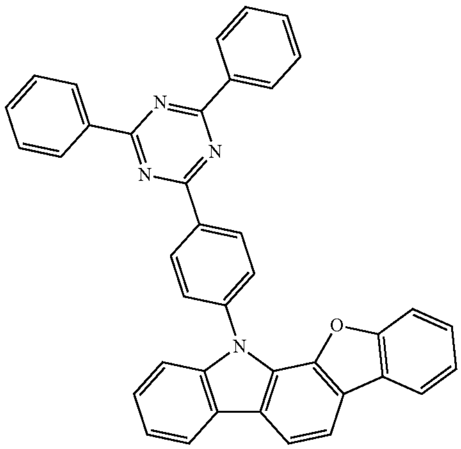
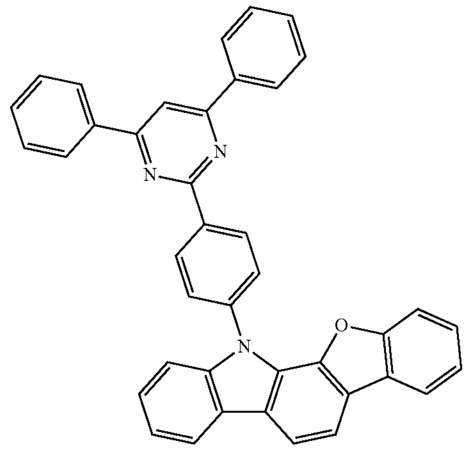
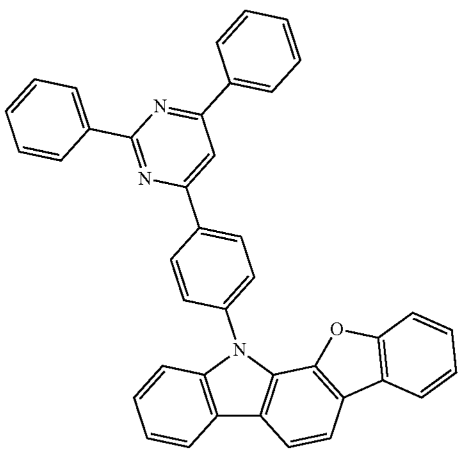
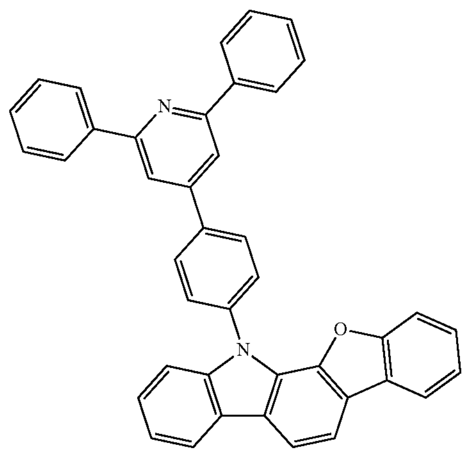
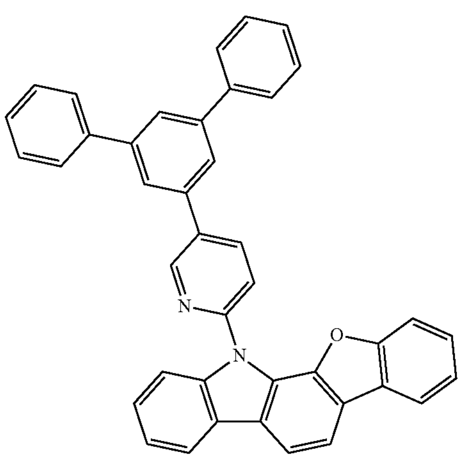
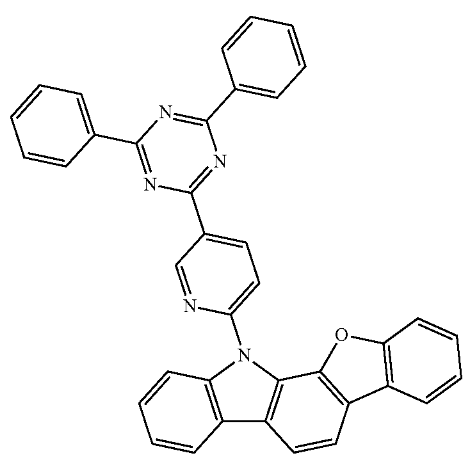

-continued
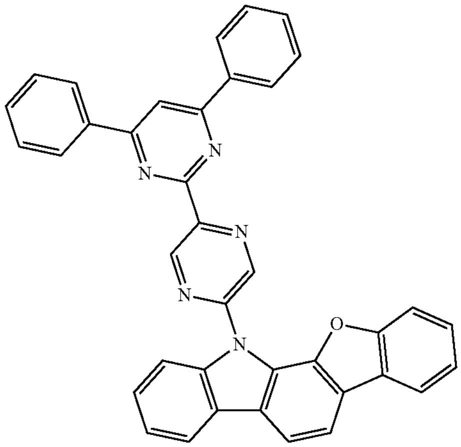
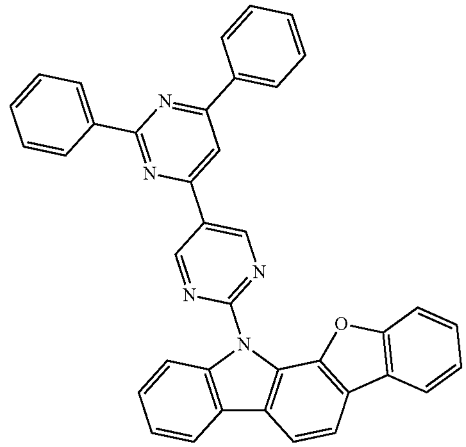
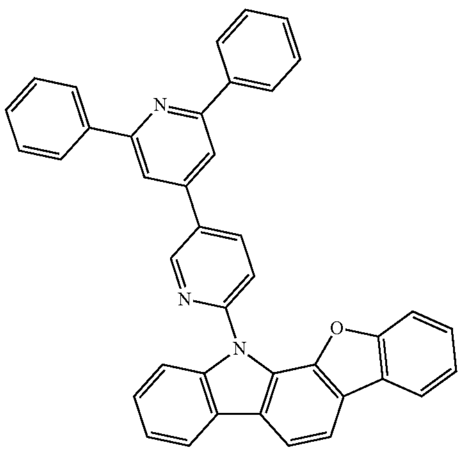
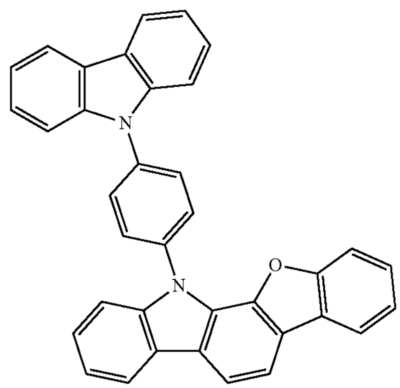
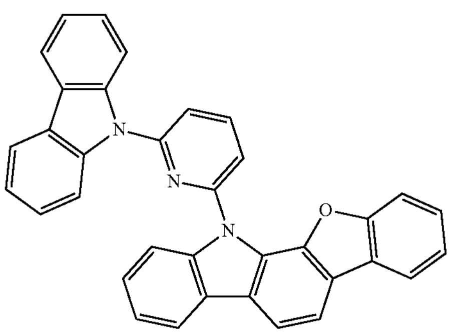
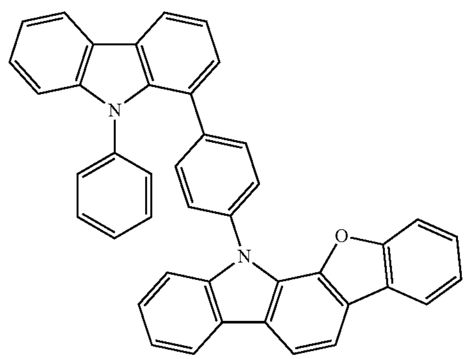
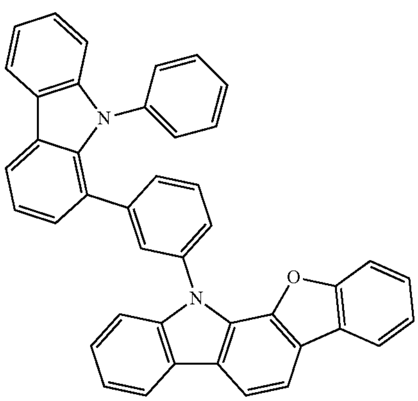
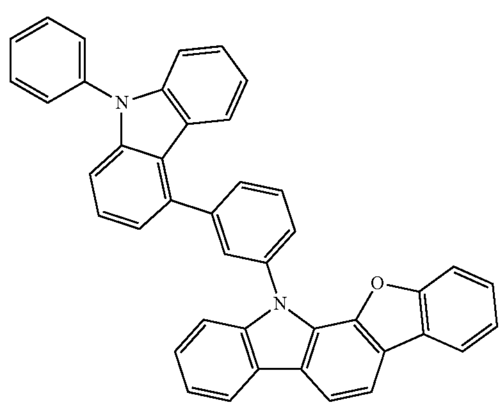

-continued
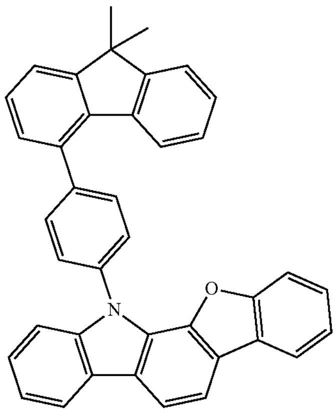
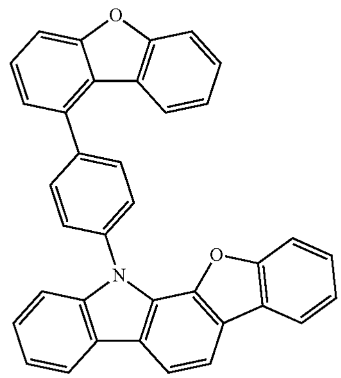
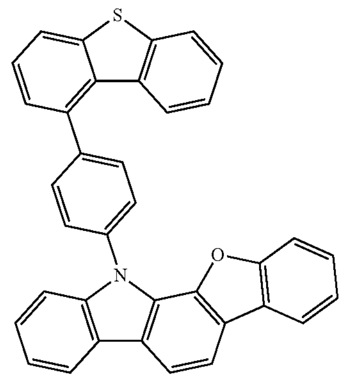
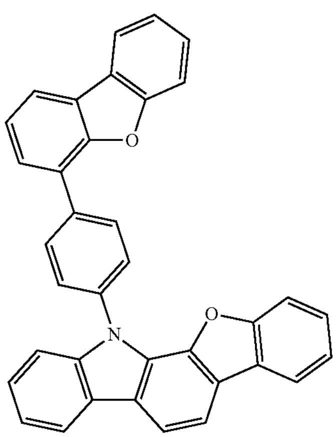
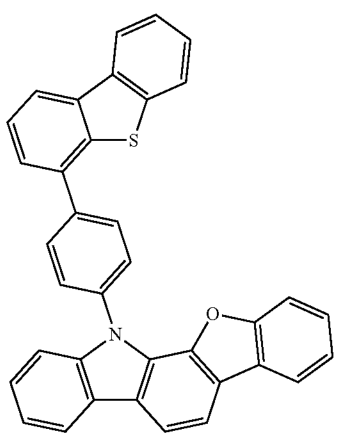
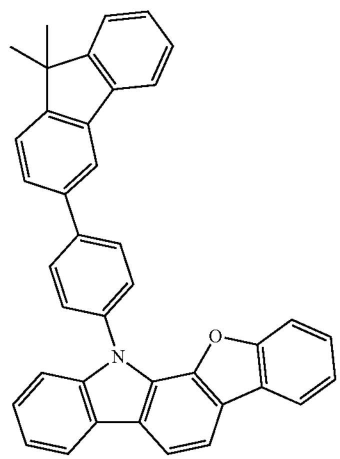
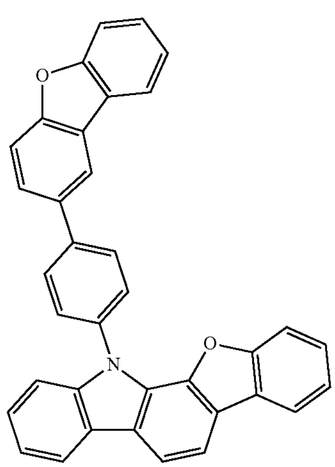
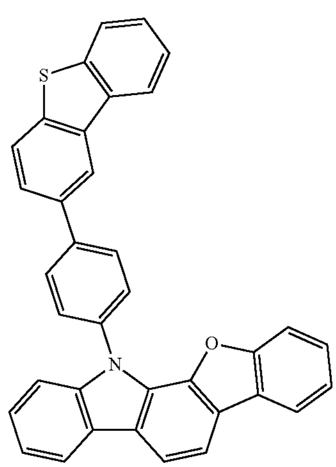
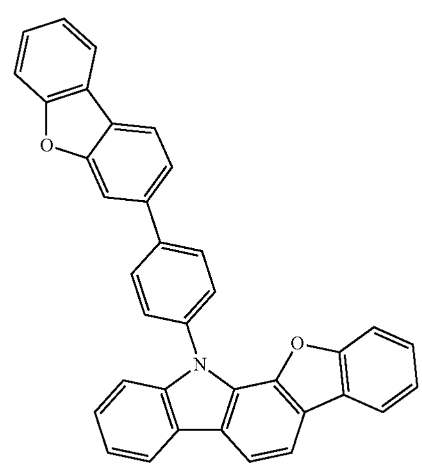

-continued
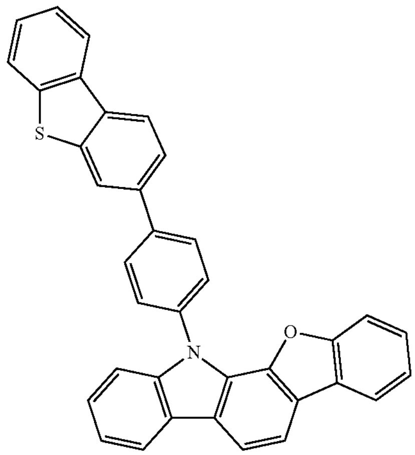
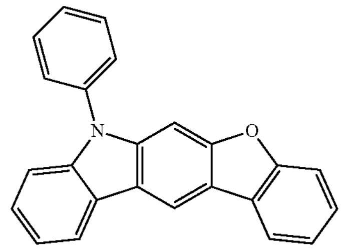
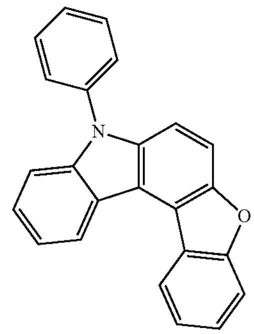
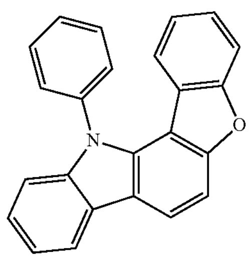
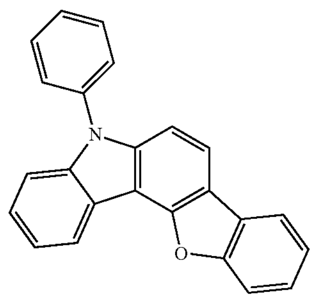
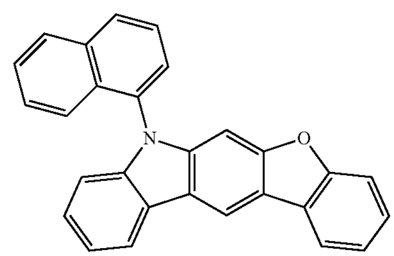
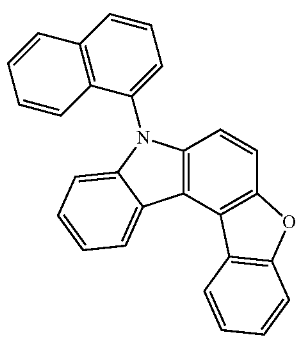
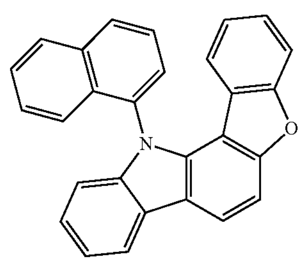
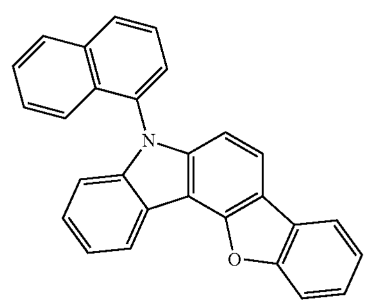
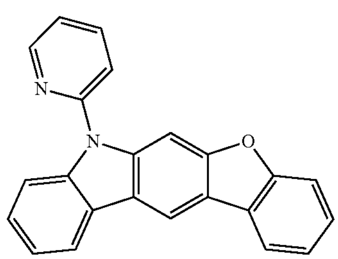
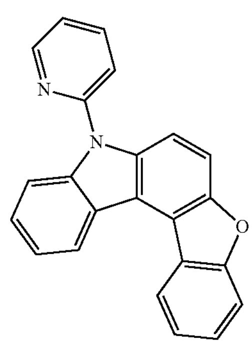
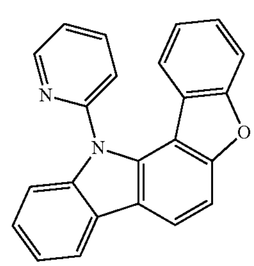

-continued
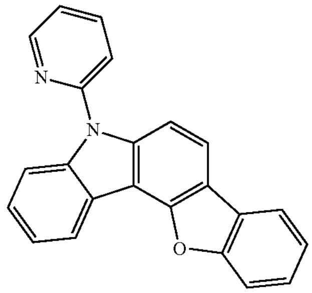
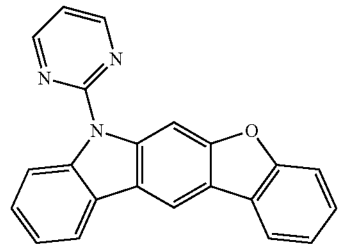
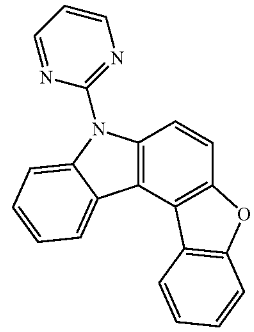
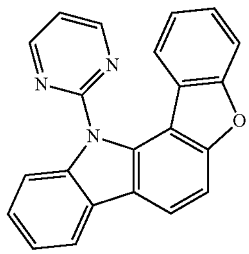
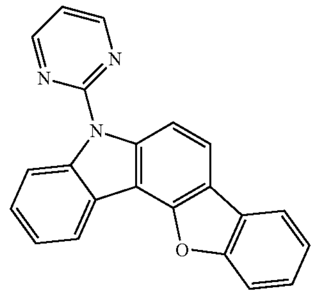
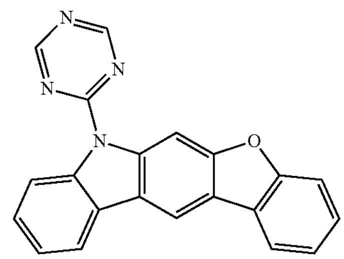
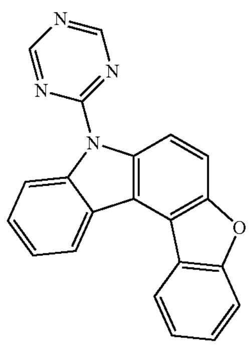
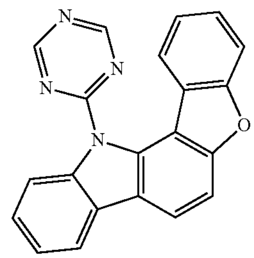
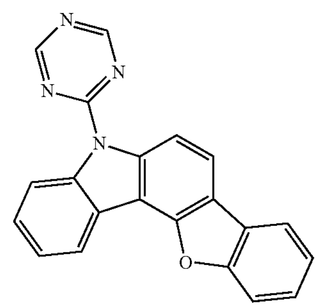
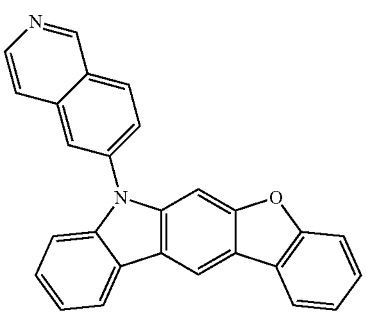
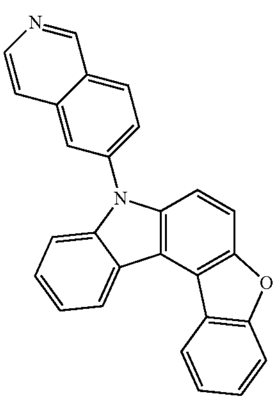
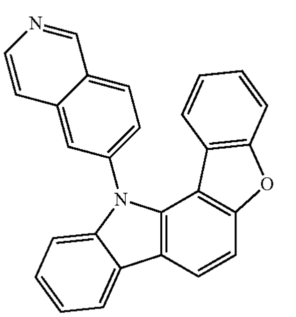
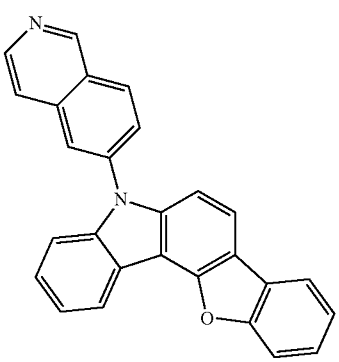
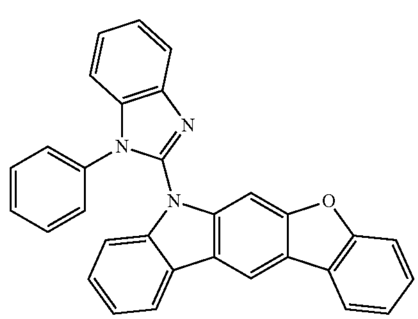

-continued
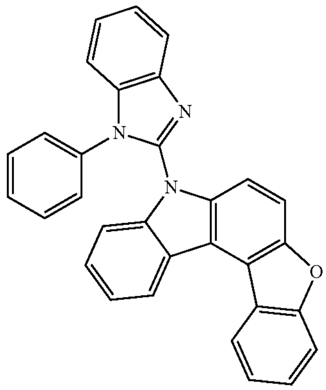
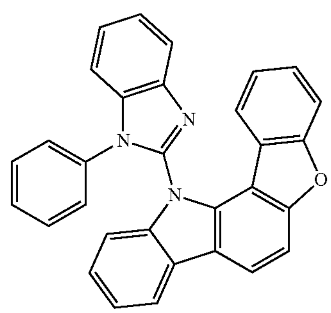
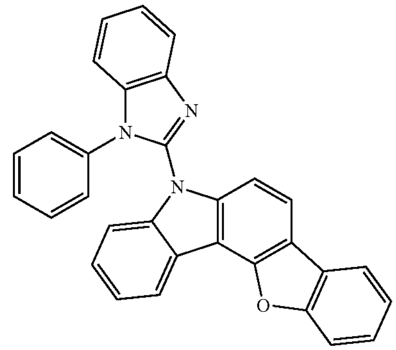
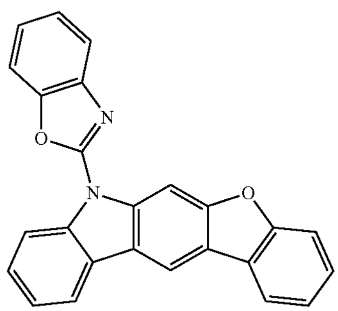
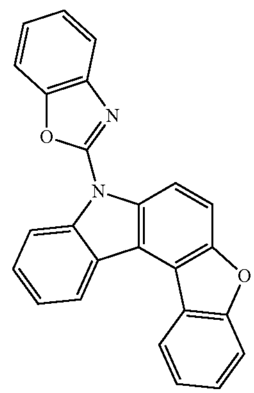
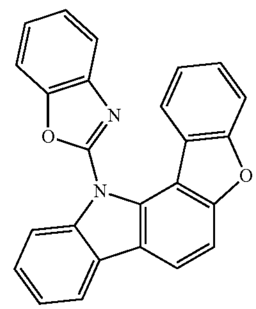
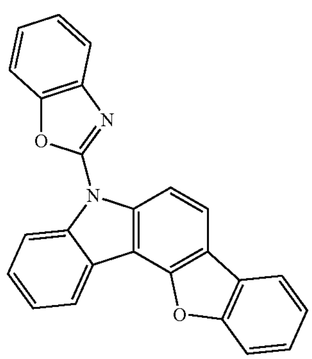
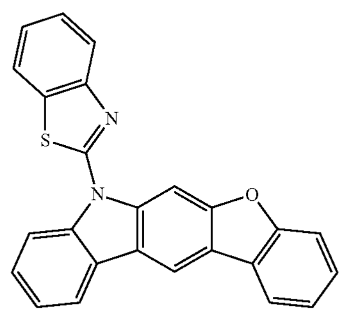
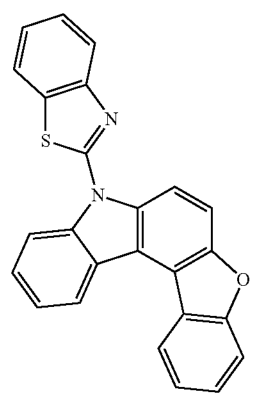
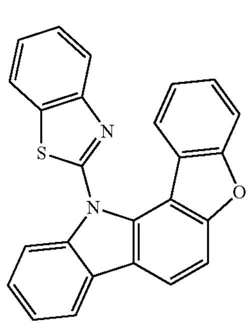
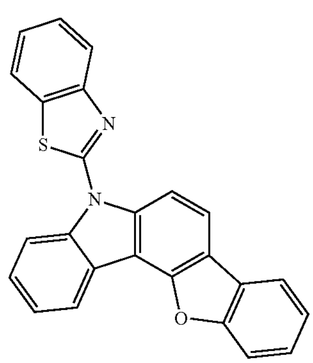
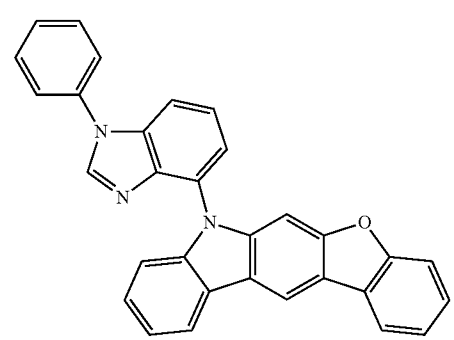

-continued
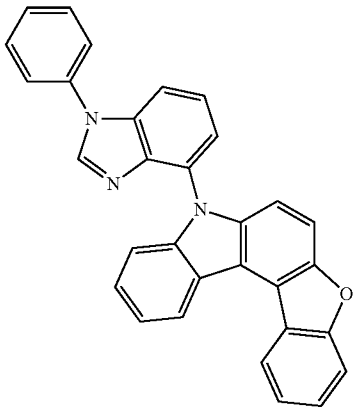
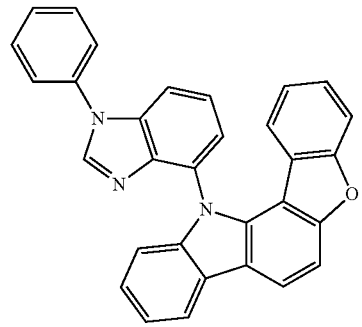
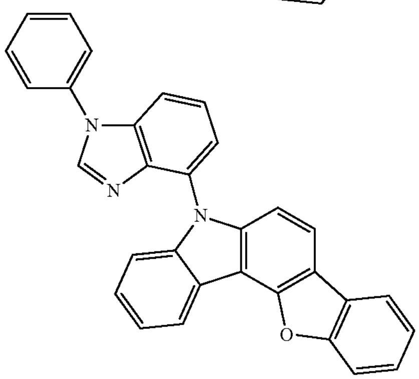
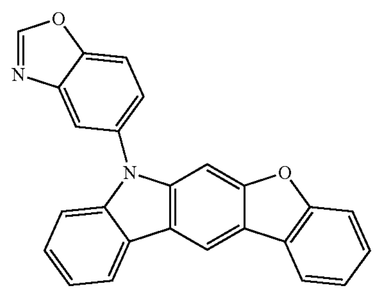
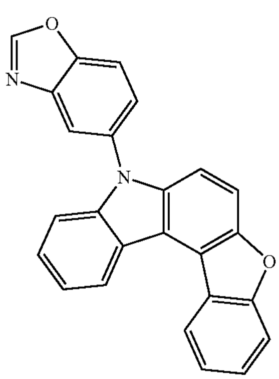
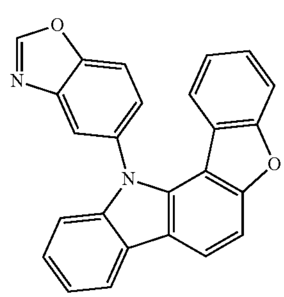
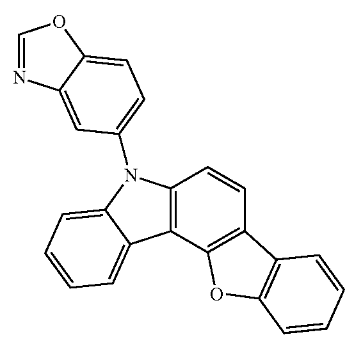
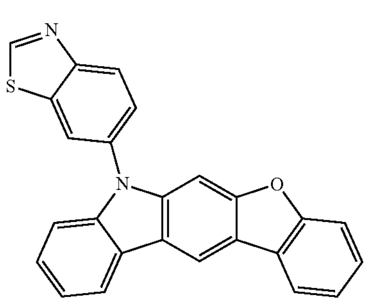
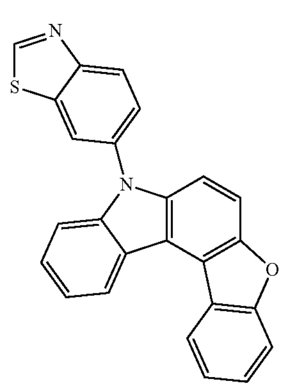
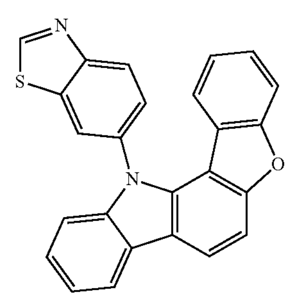

-continued
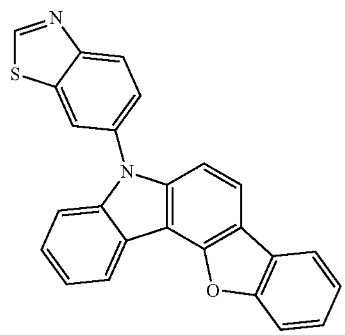
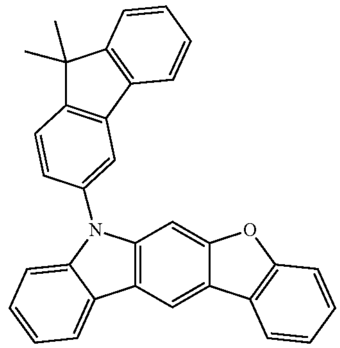
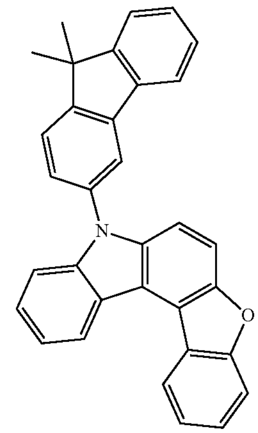
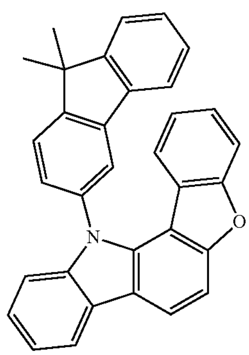
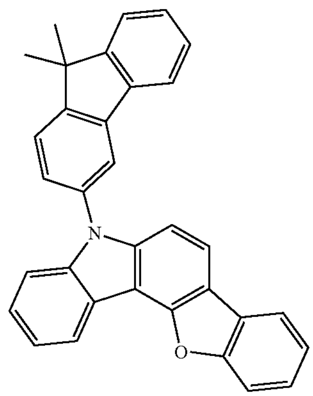
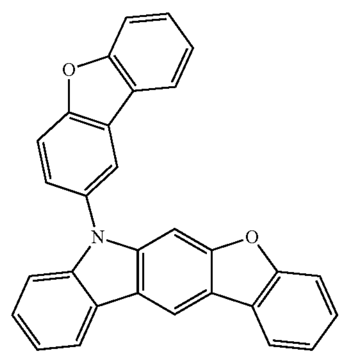
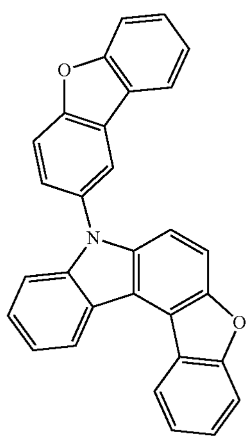
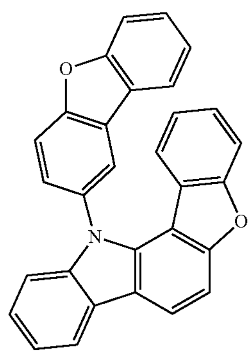
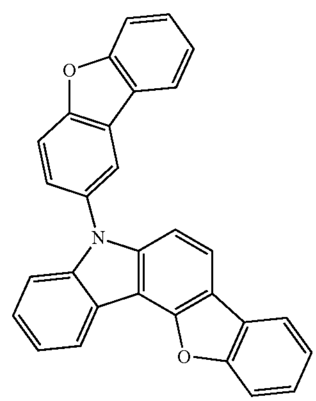
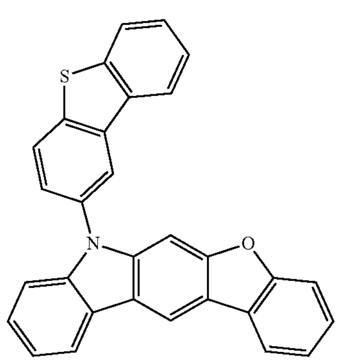
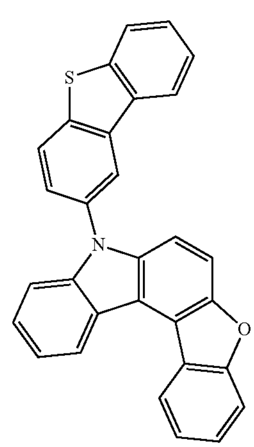
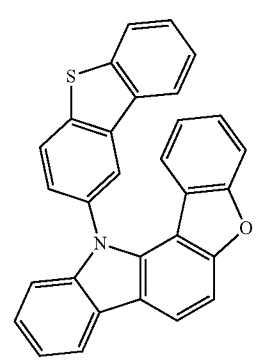

-continued
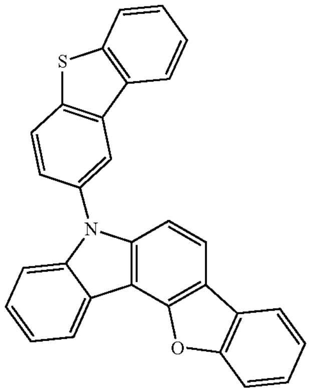
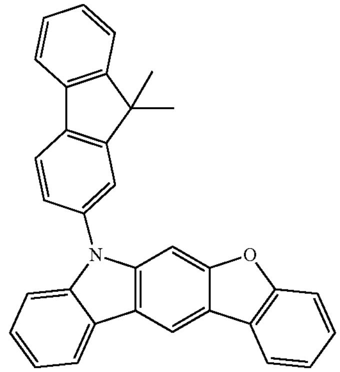
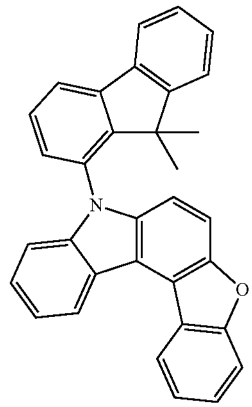
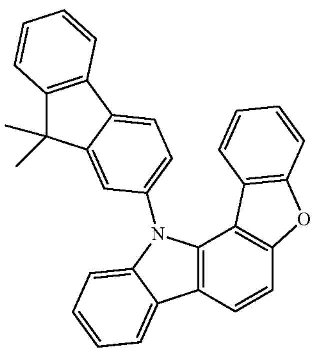
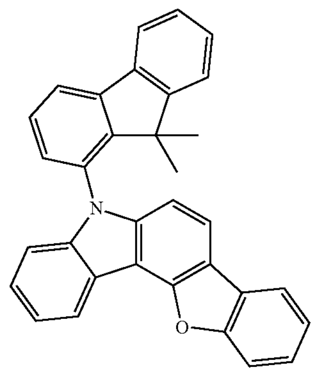
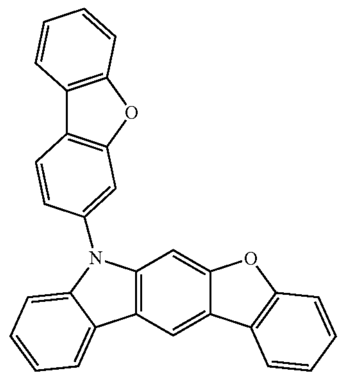
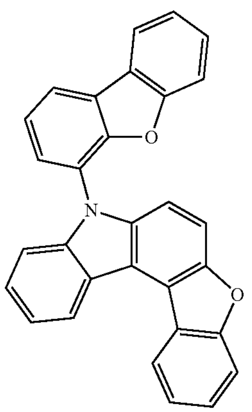
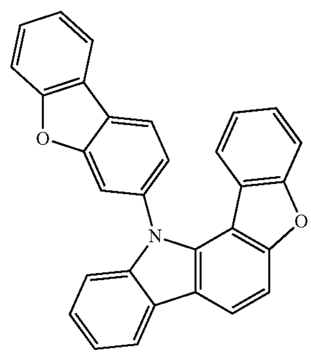
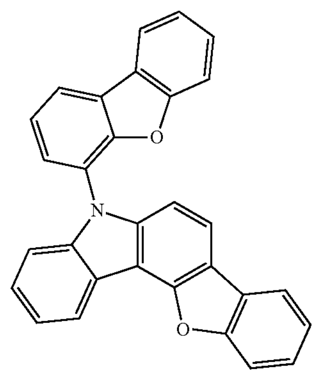
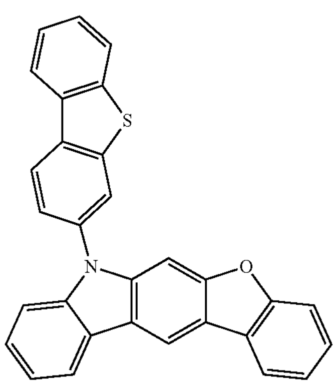
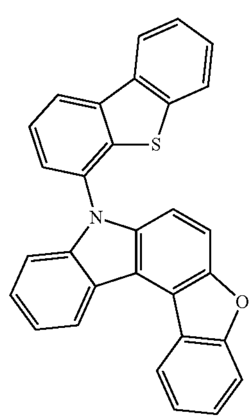
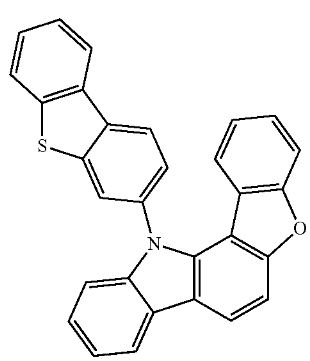

-continued
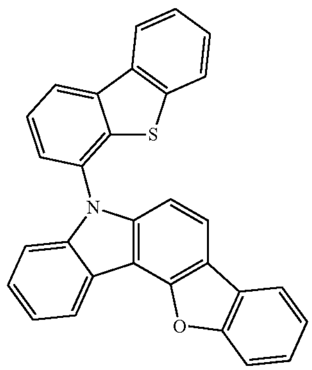
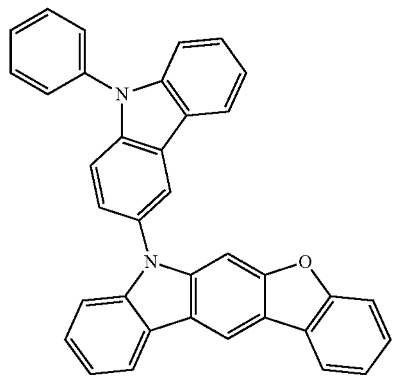
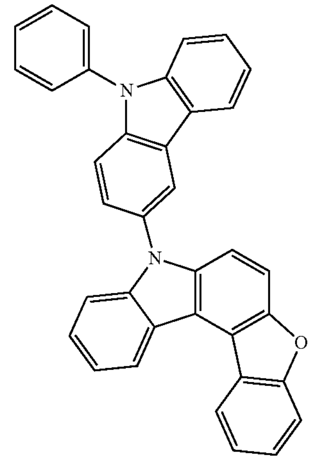
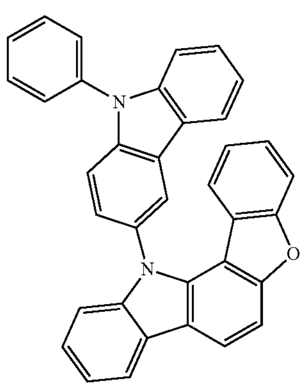
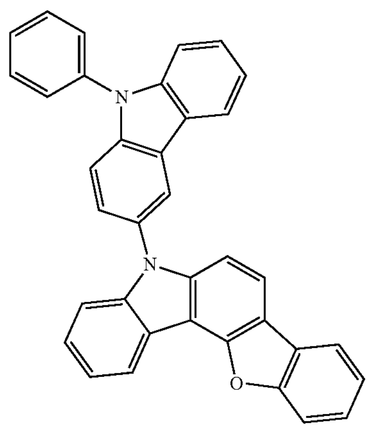
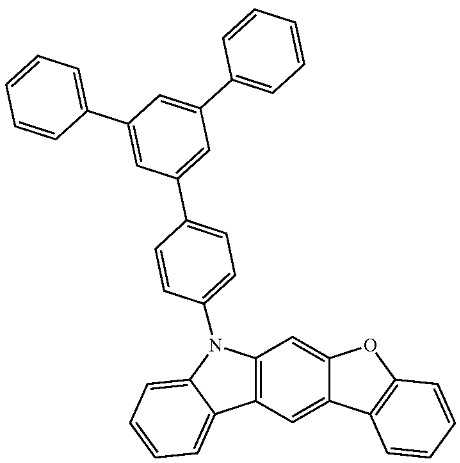
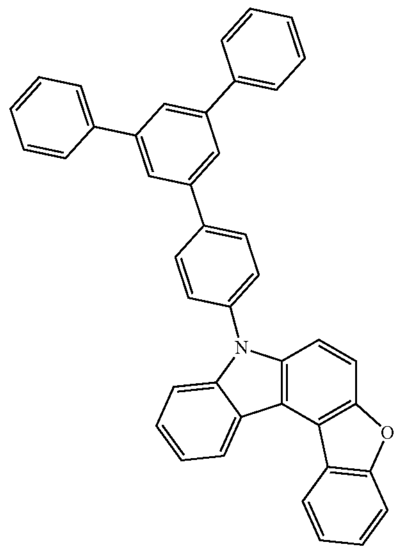

-continued
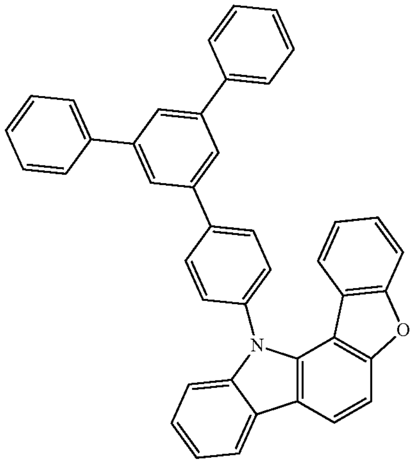
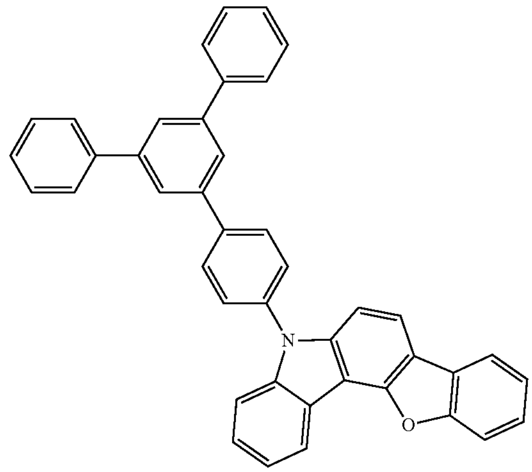
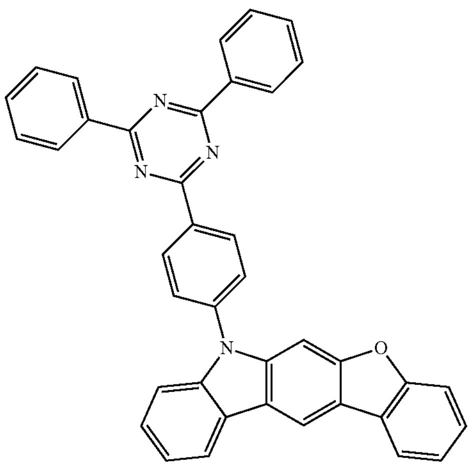
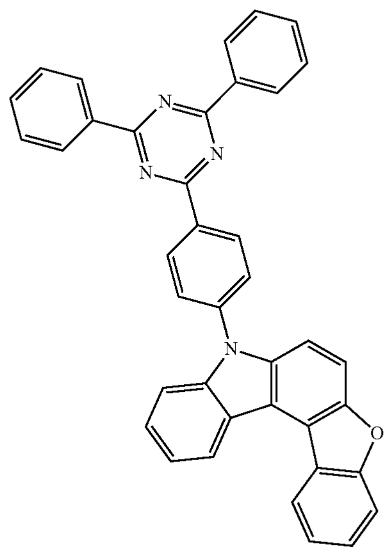
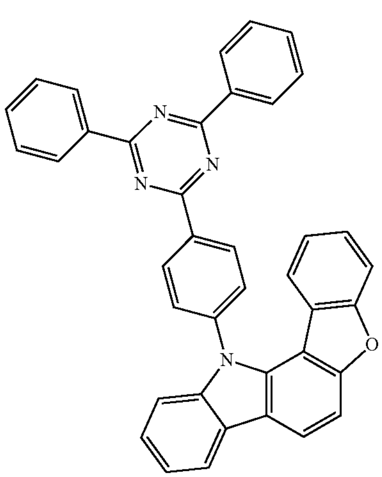
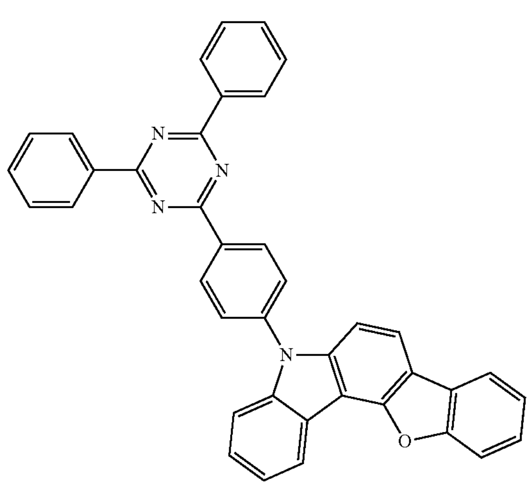

-continued
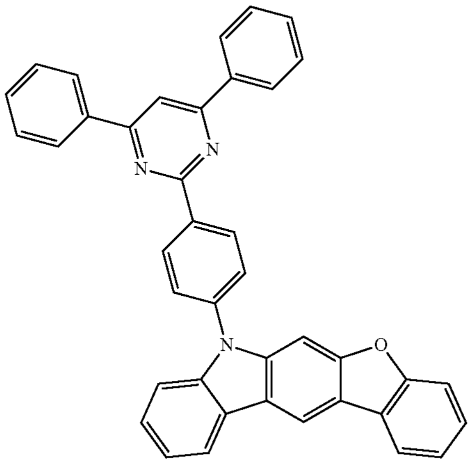
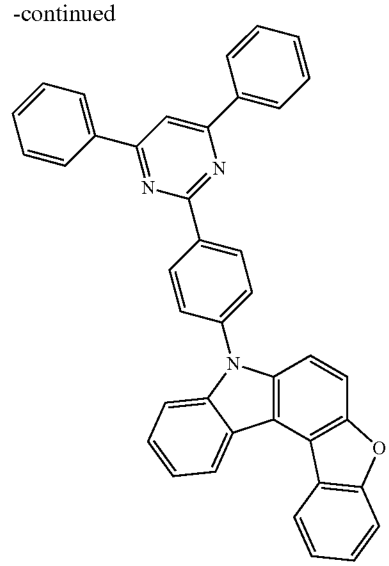
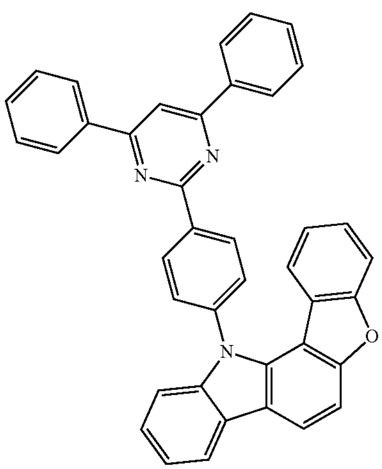
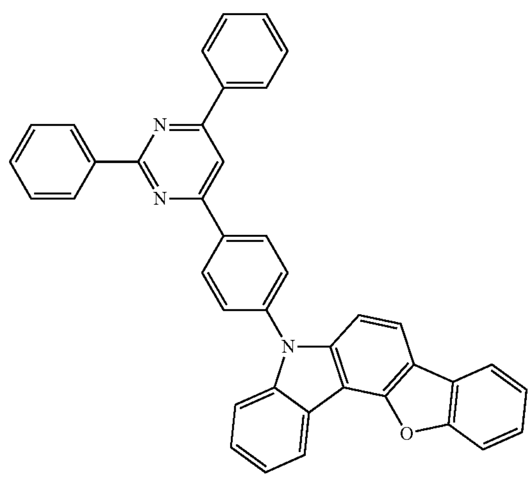
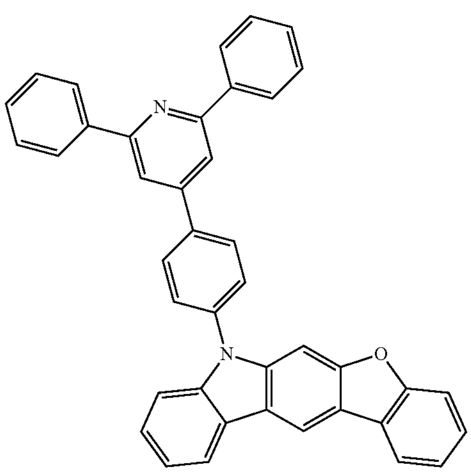
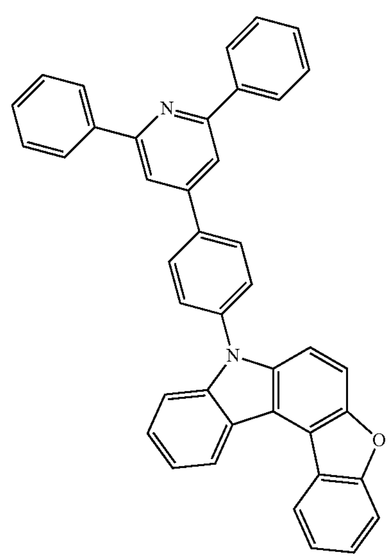

-continued
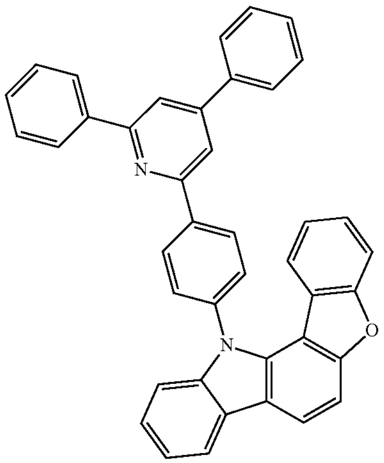
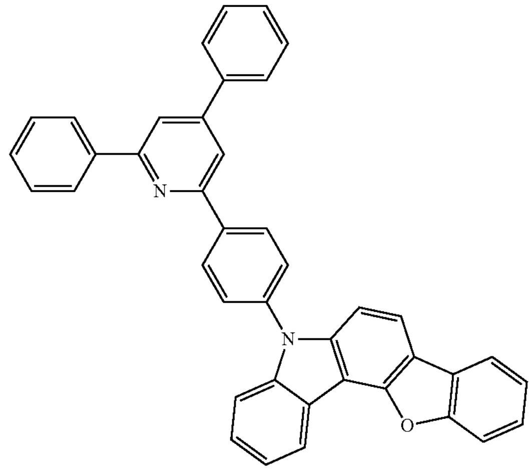
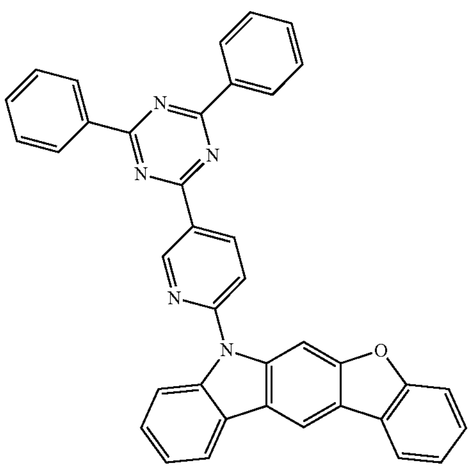
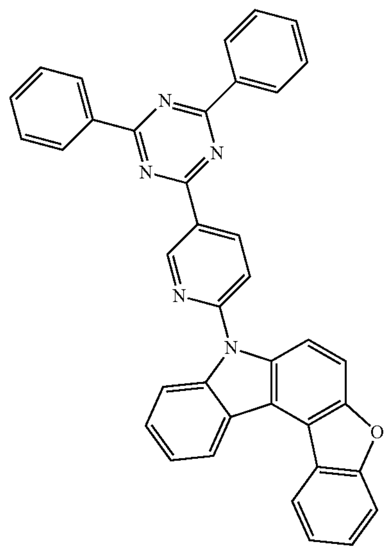
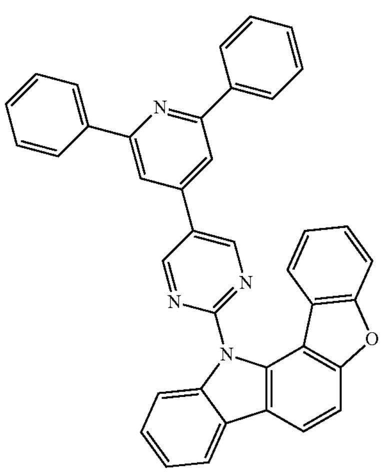
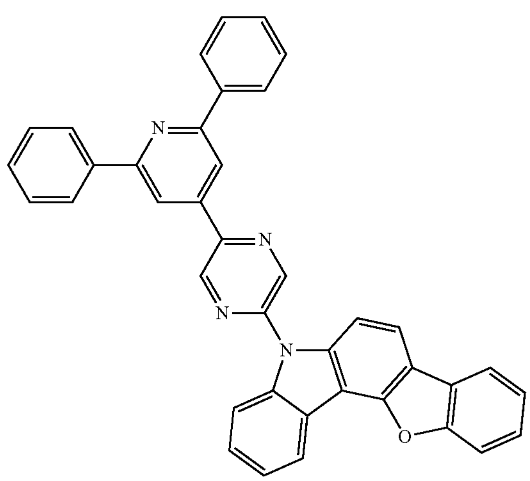

-continued
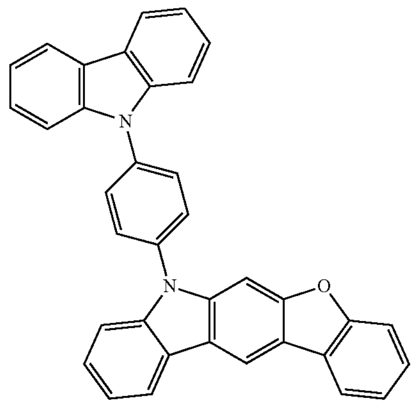
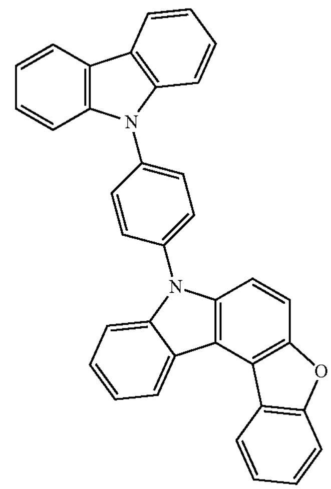
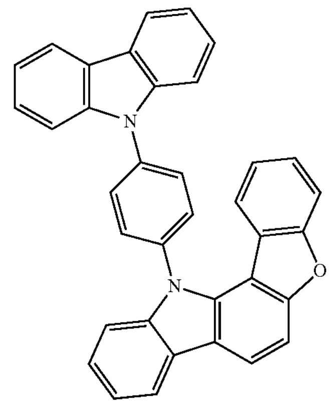
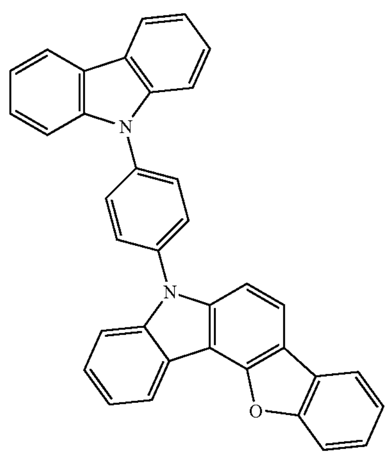
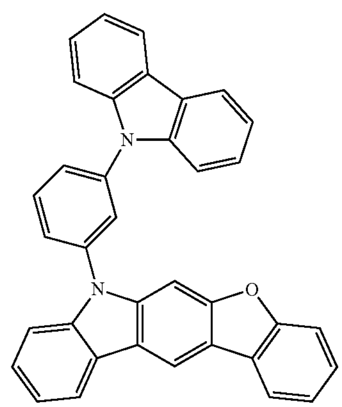
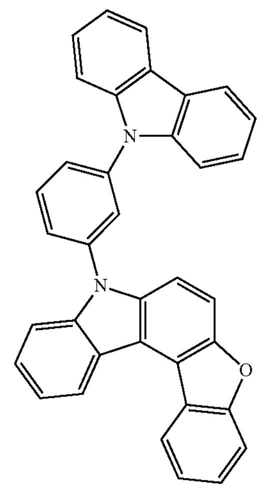
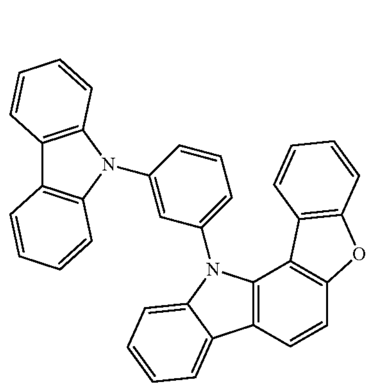
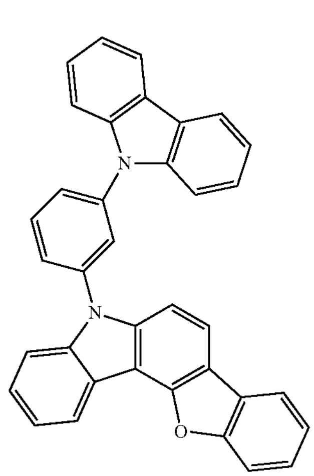
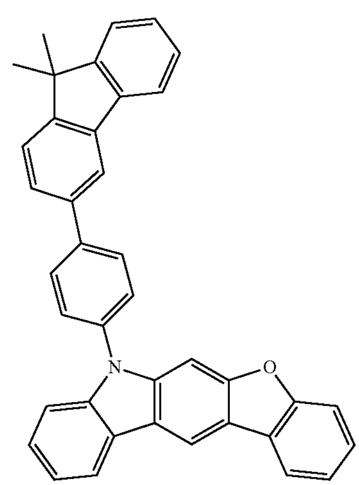

-continued
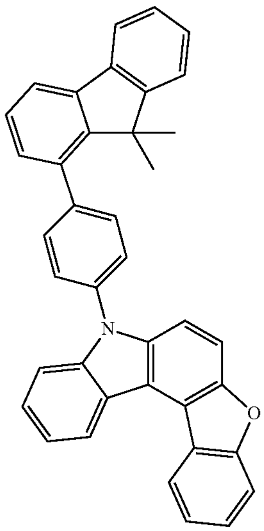
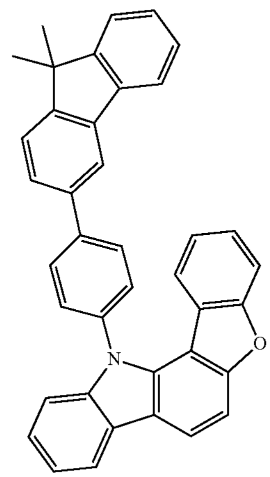
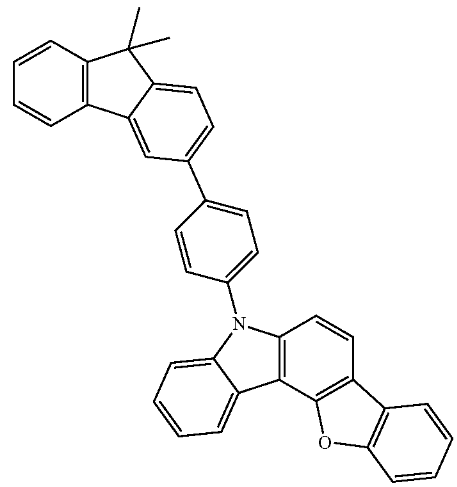
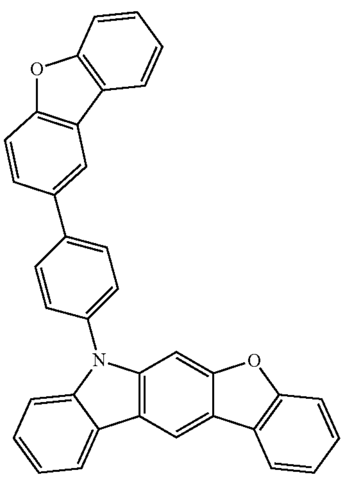
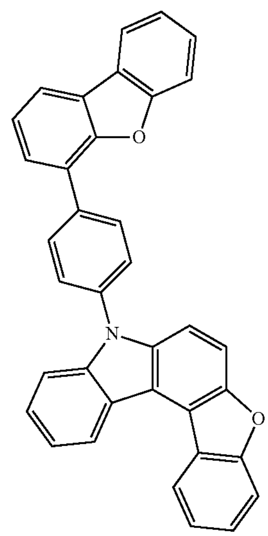
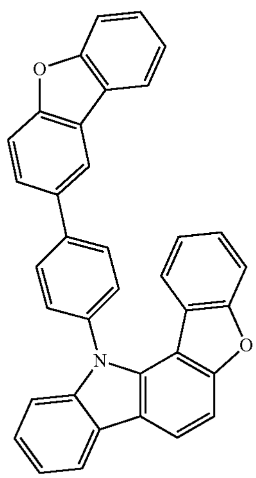
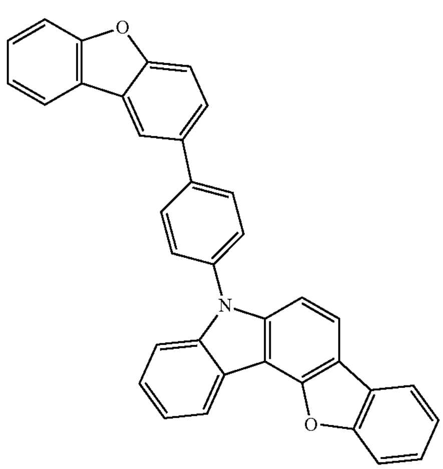
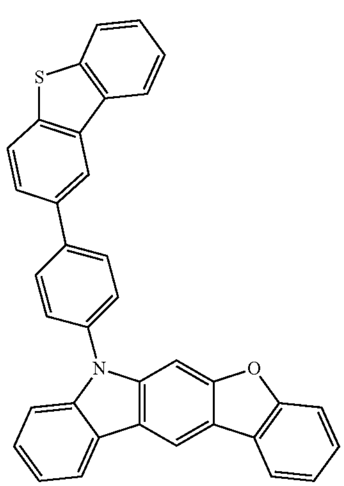

-continued
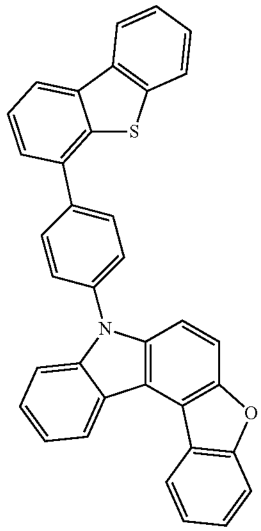
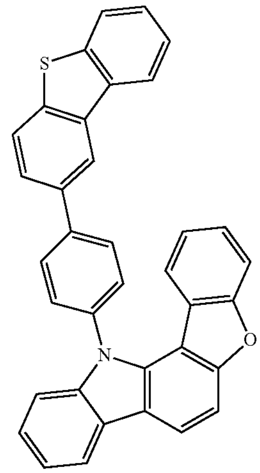
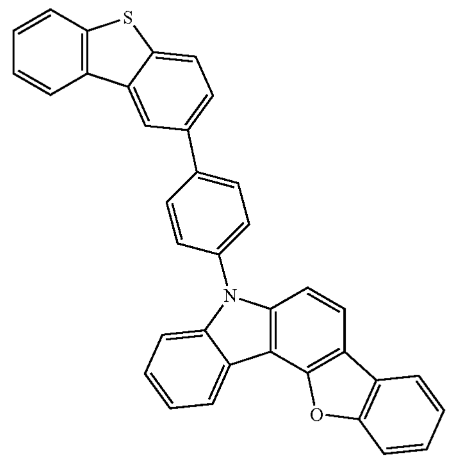
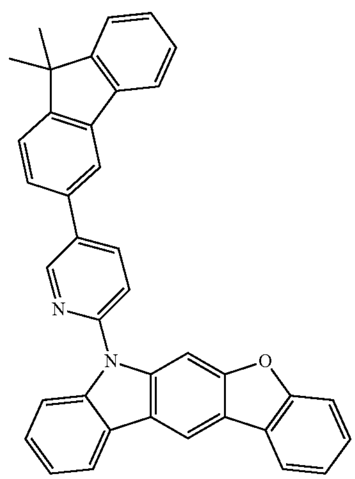
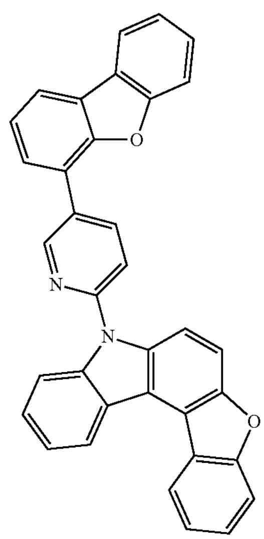
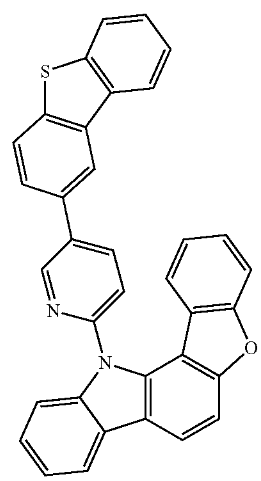
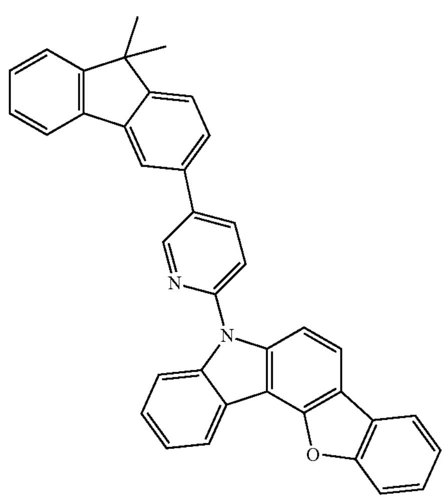
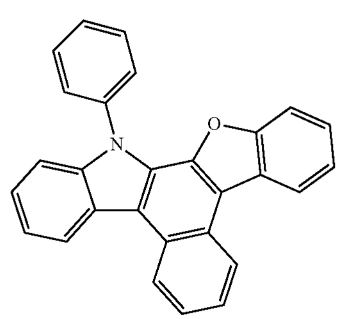
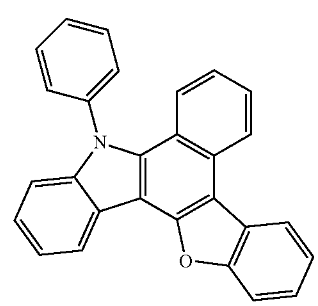

-continued
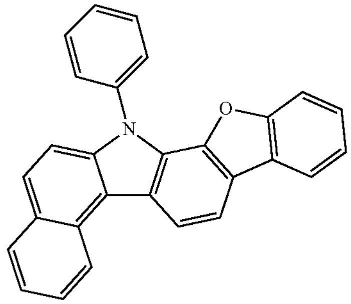
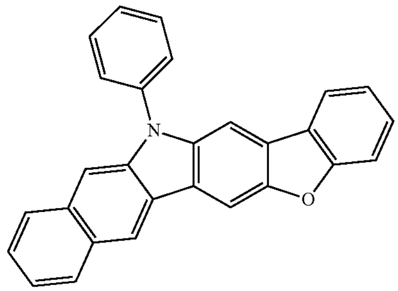
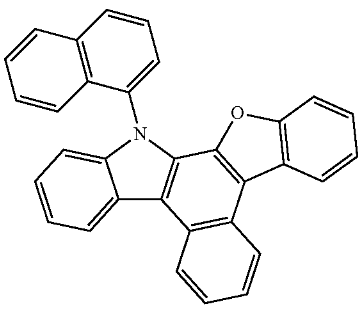
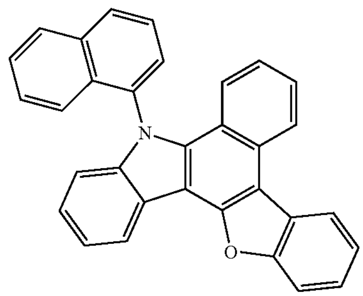
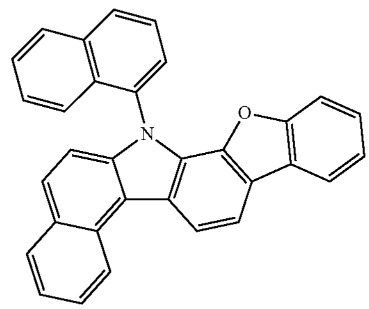
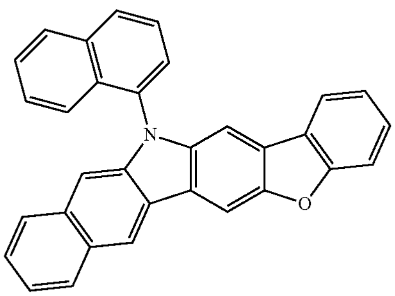
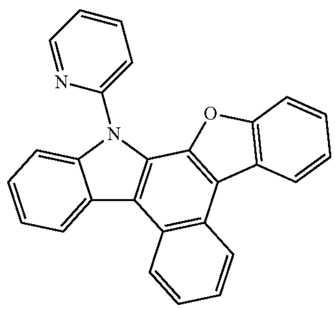
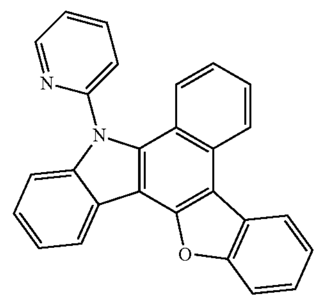
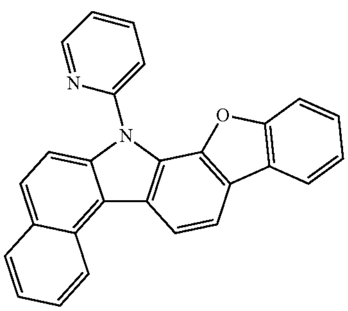
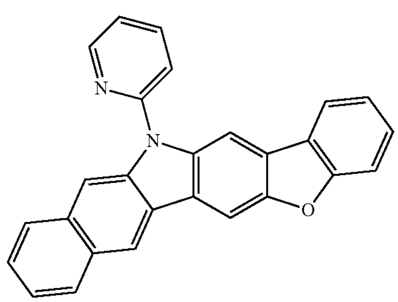
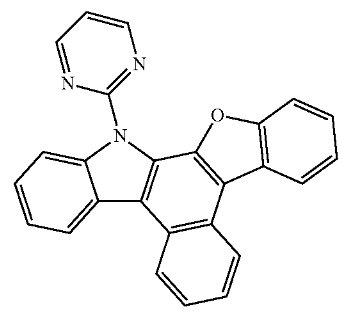
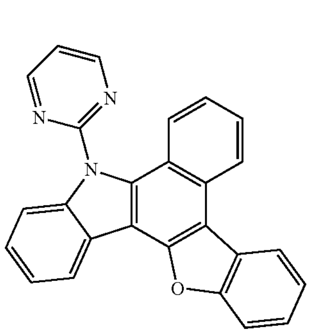
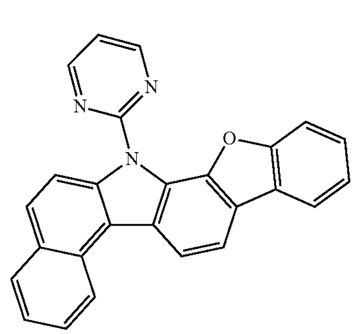
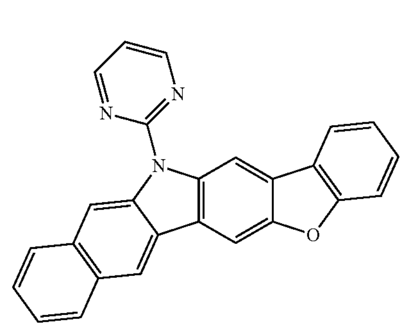

-continued
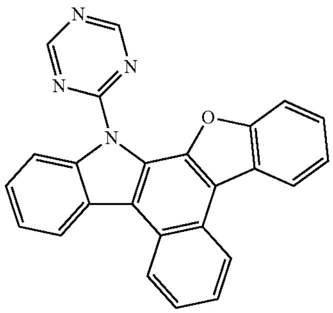
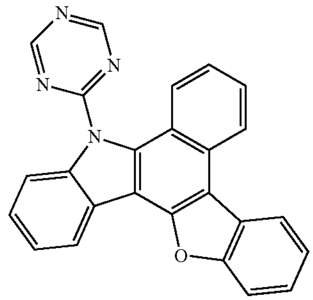
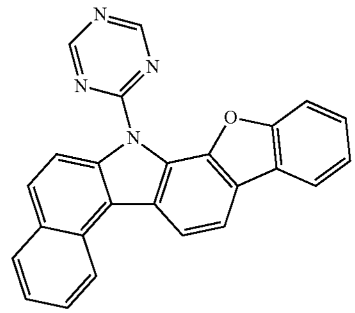
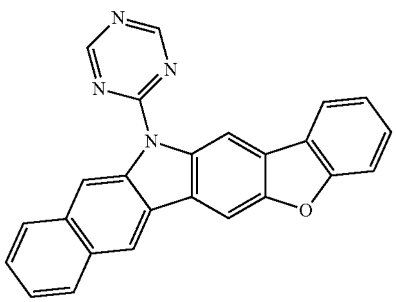
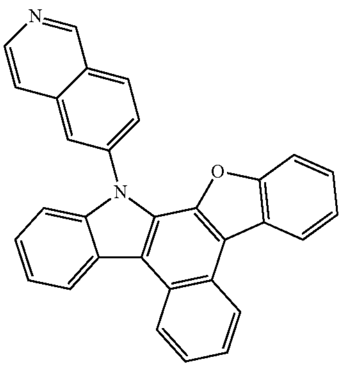
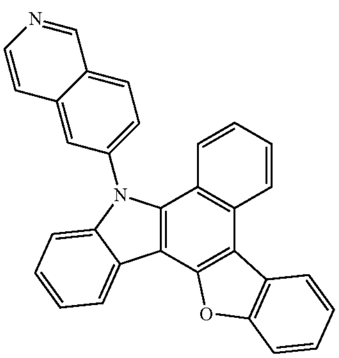
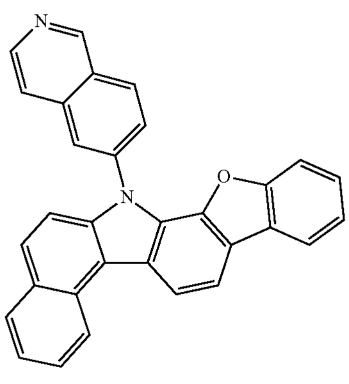
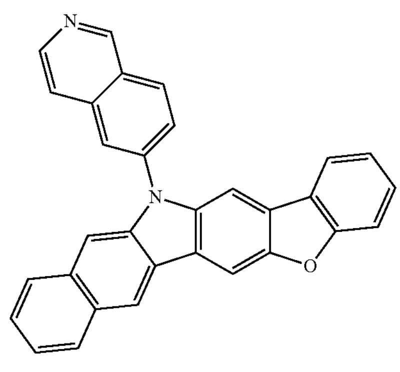
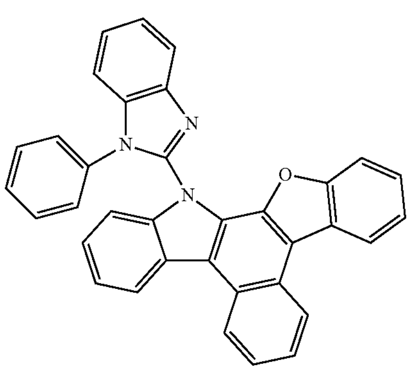
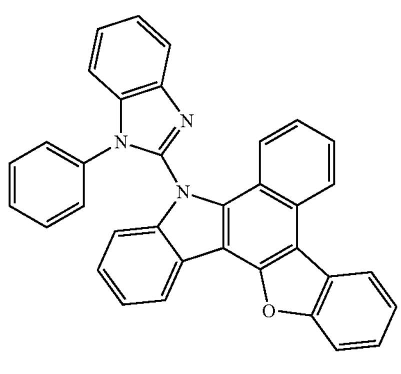

-continued
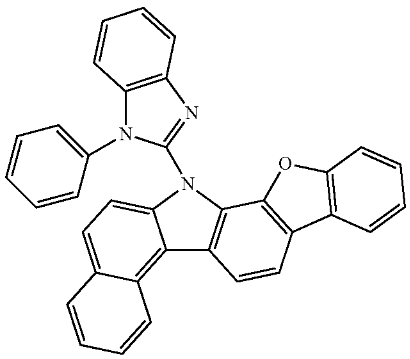
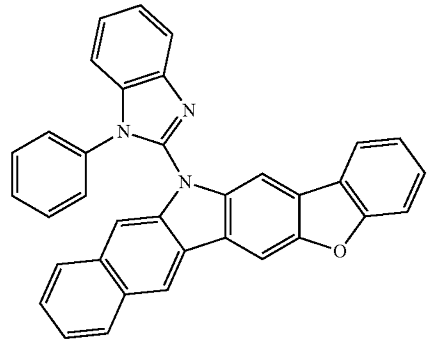
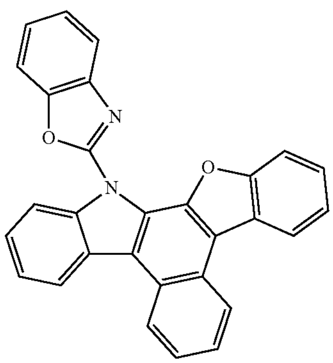
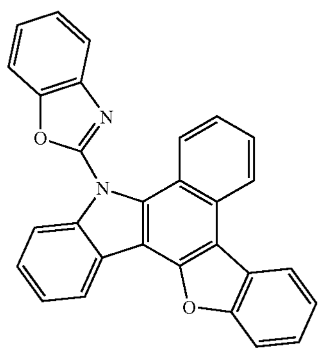
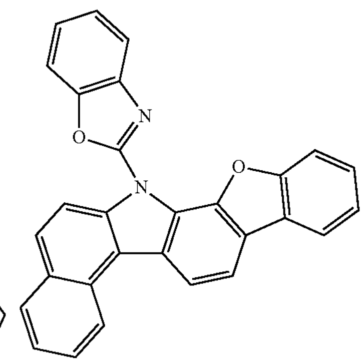
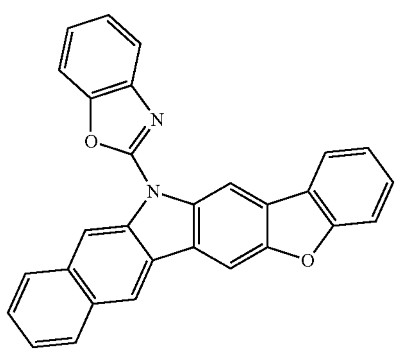
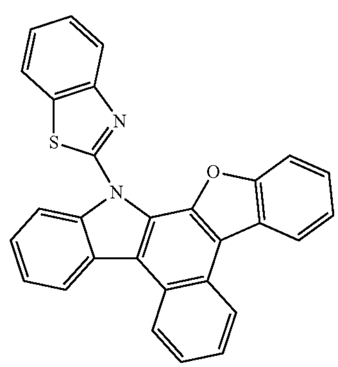
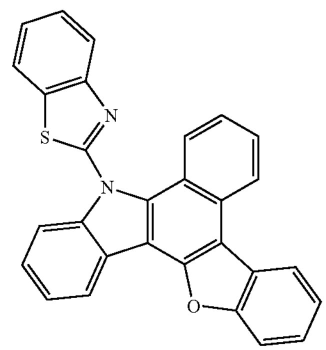
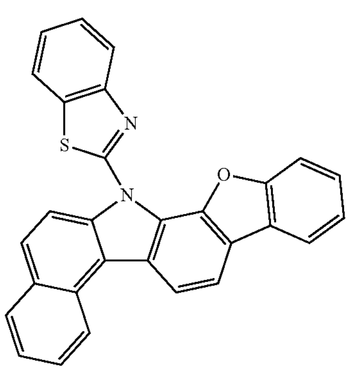
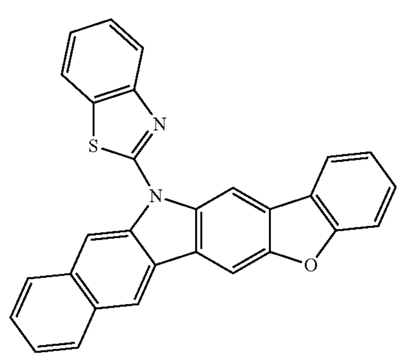

-continued
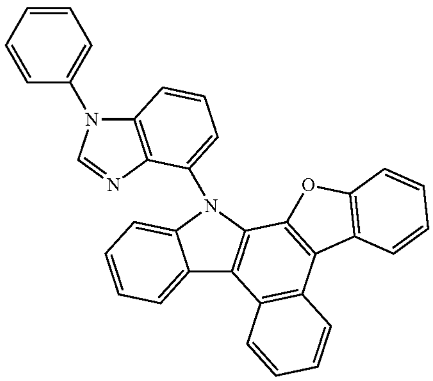
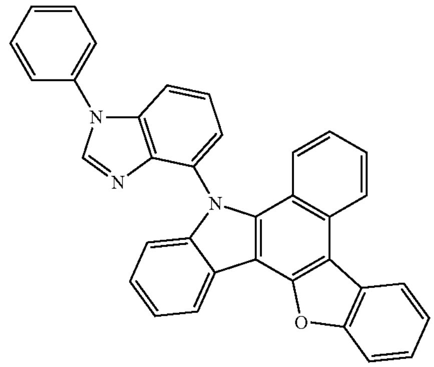
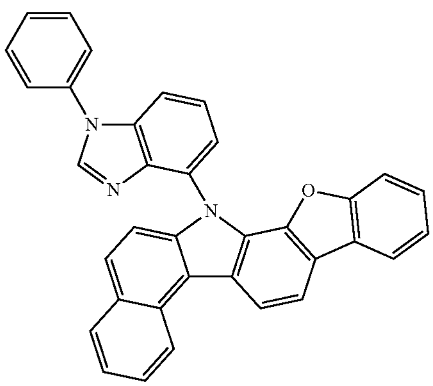
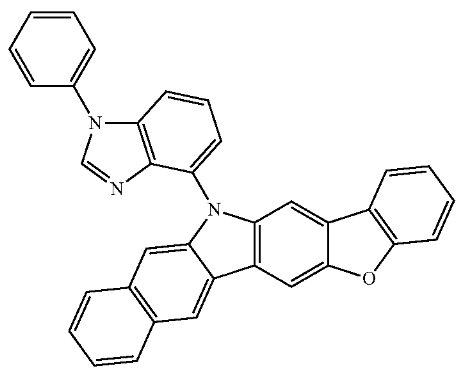
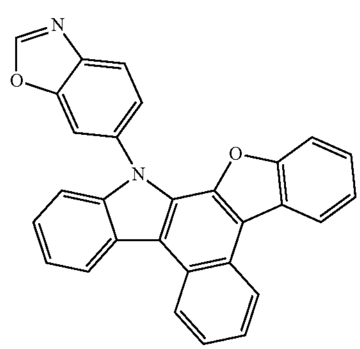
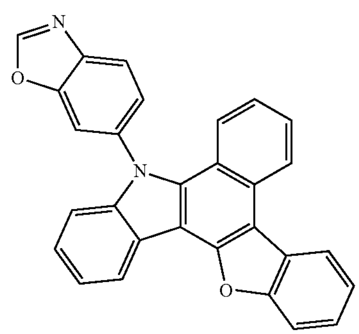
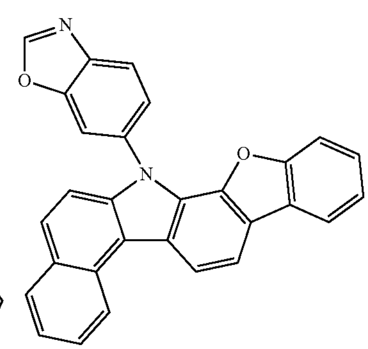
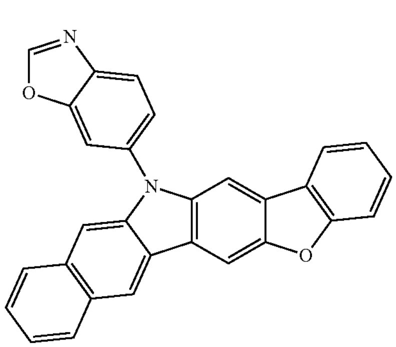
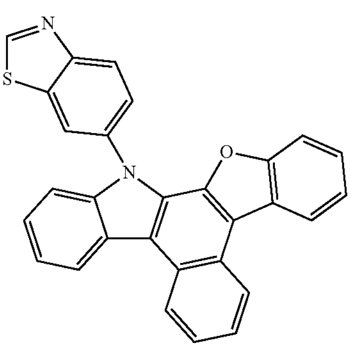
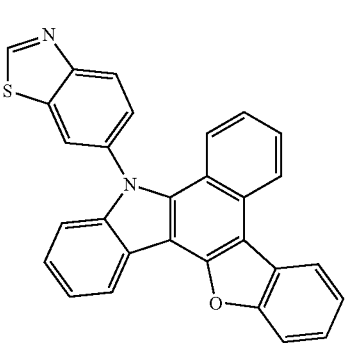

-continued
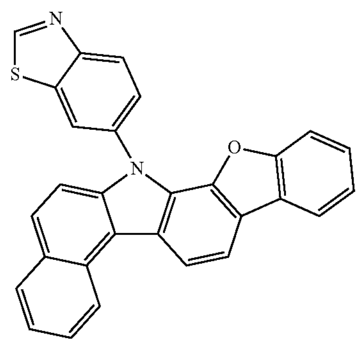
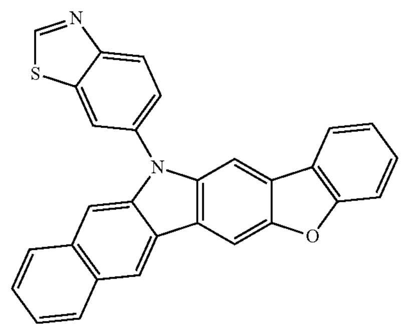
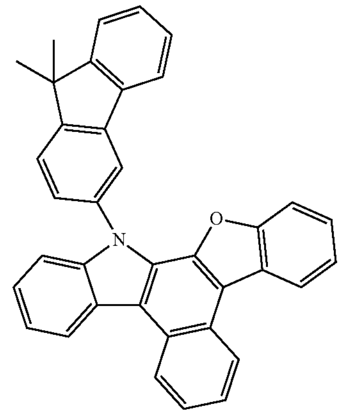
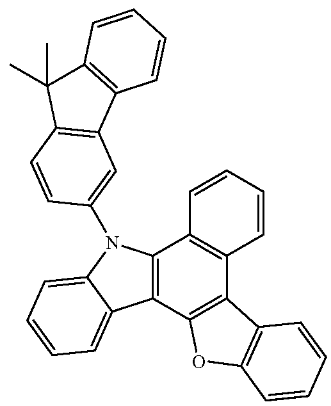
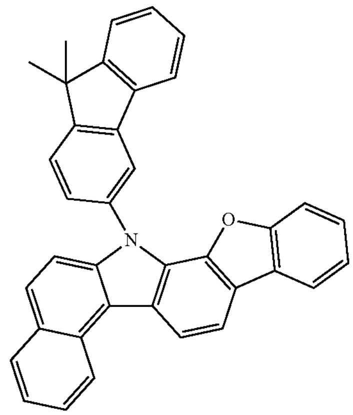
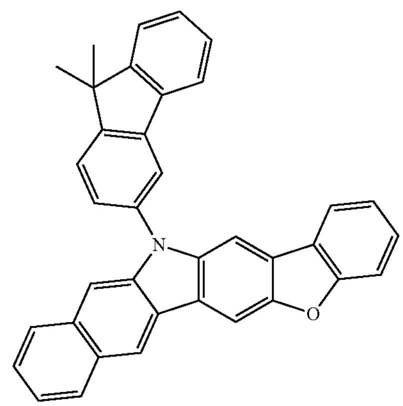
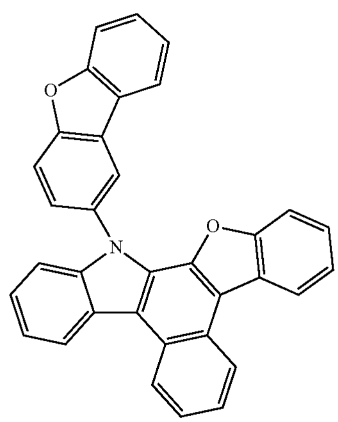
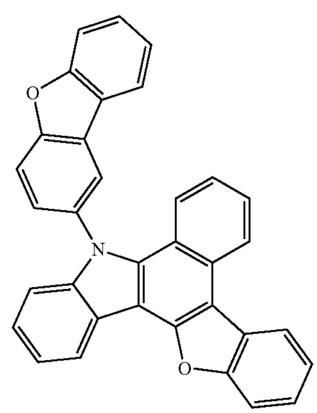
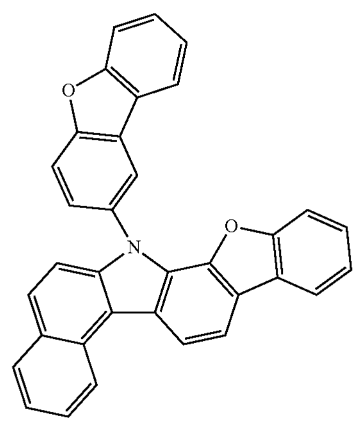
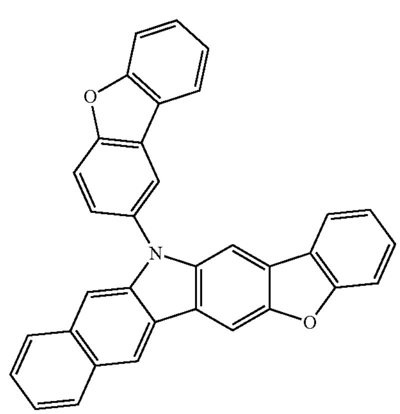
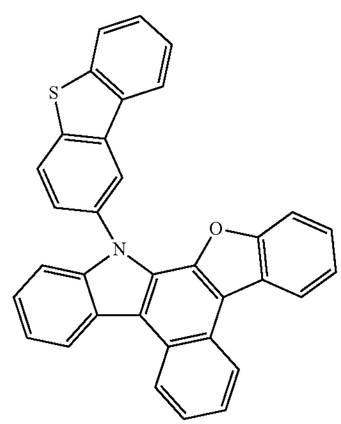
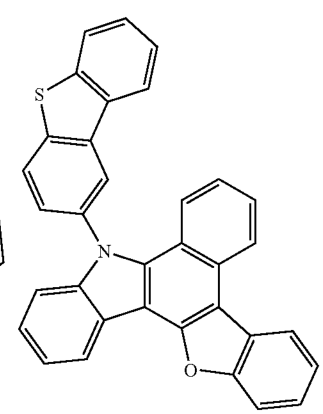

-continued
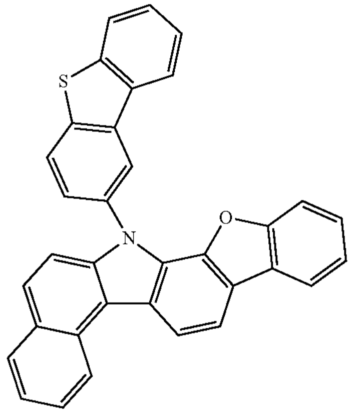
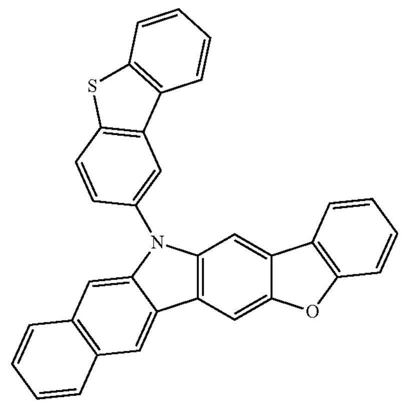
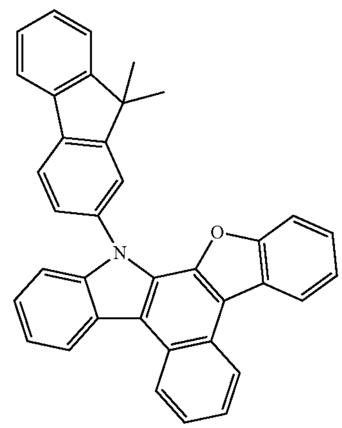
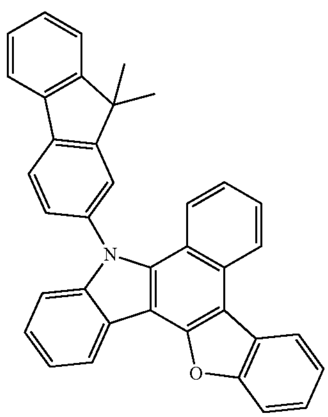
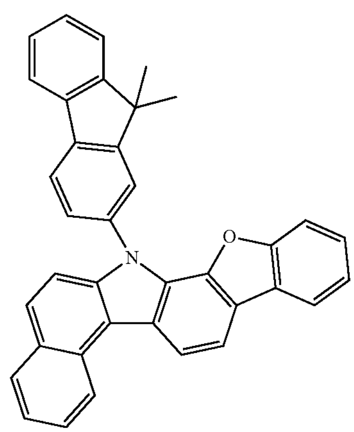
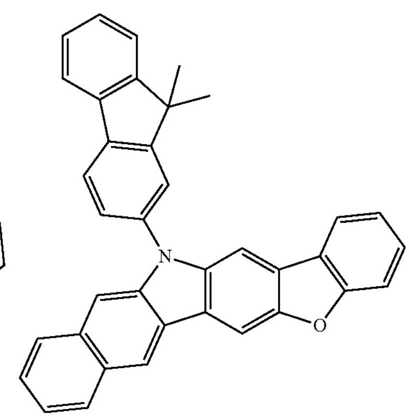
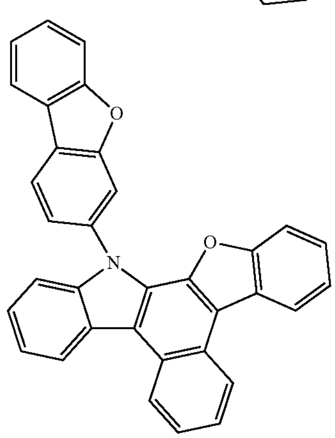
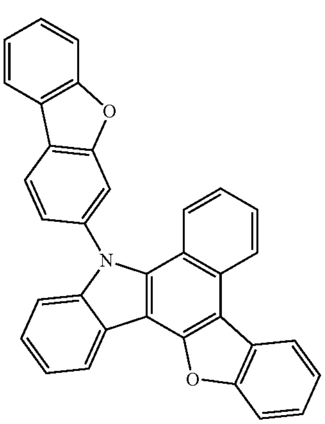
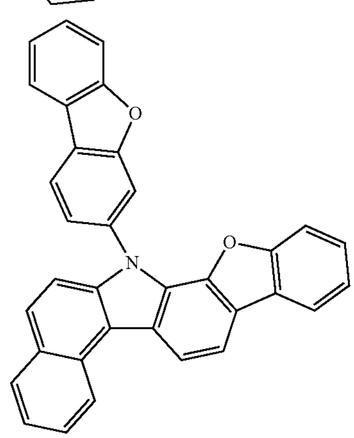
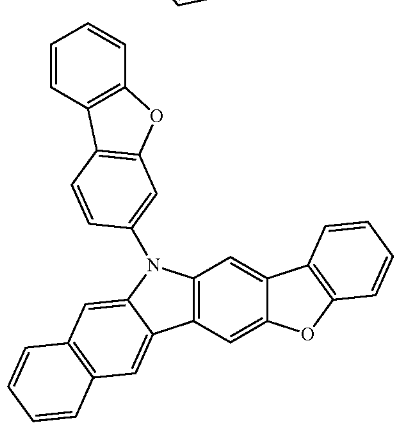
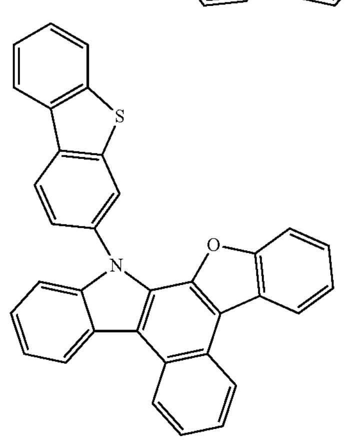
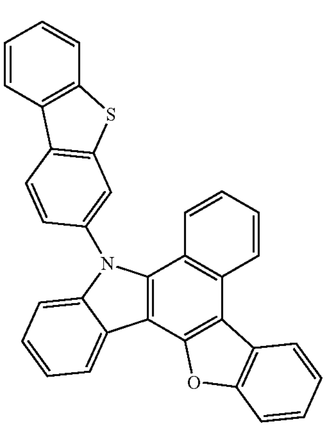

-continued
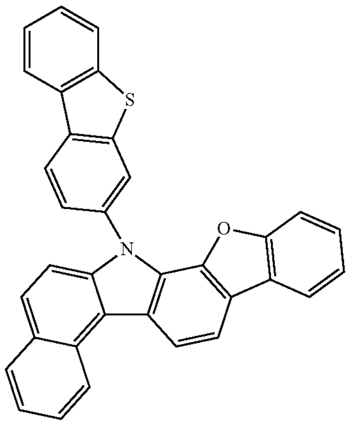
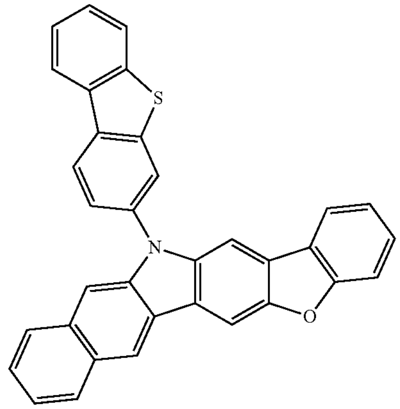
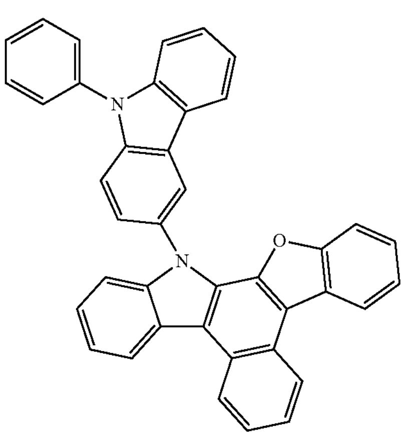
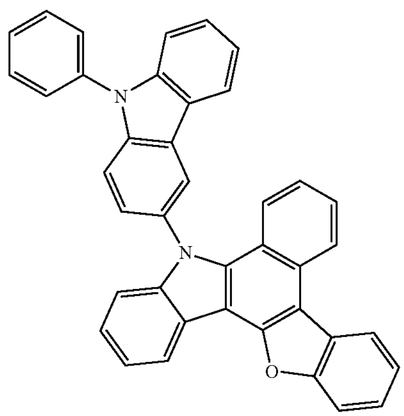
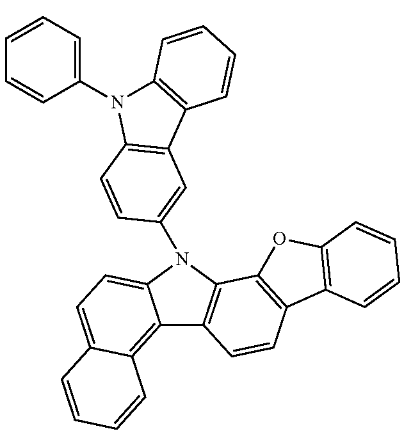
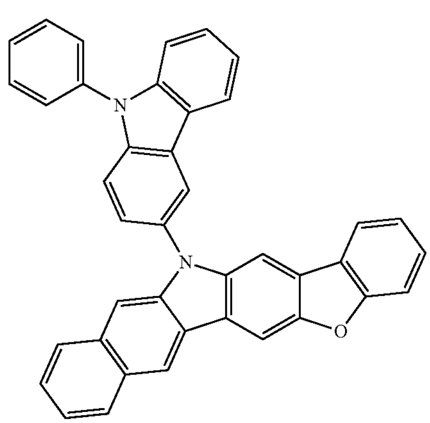

-continued
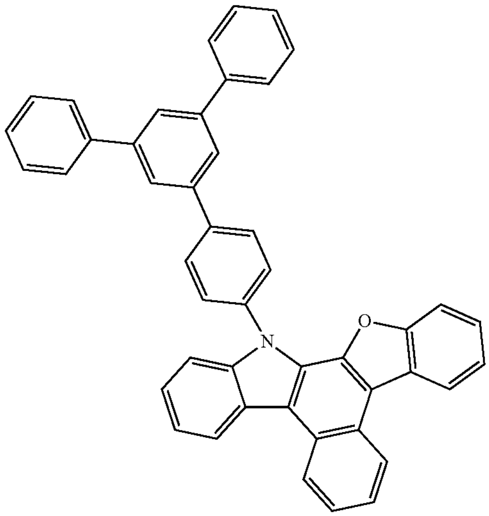
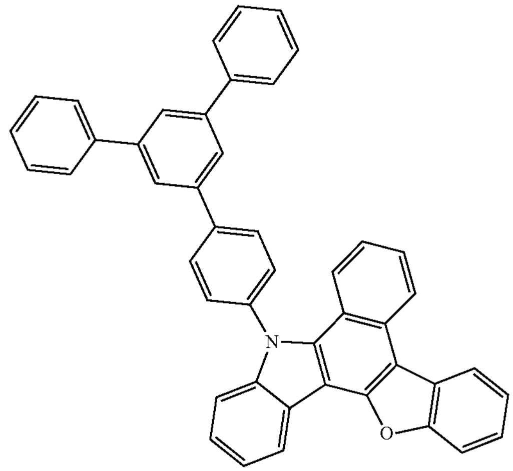
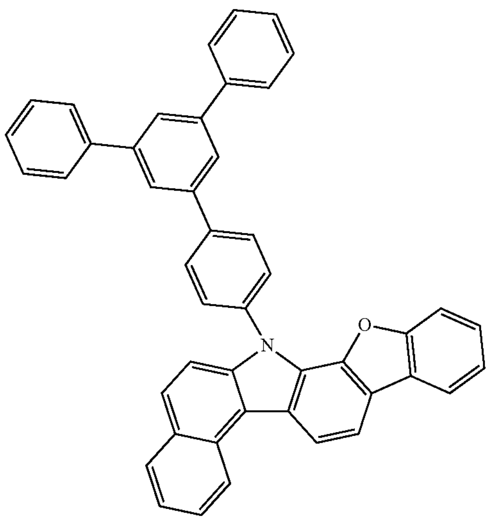
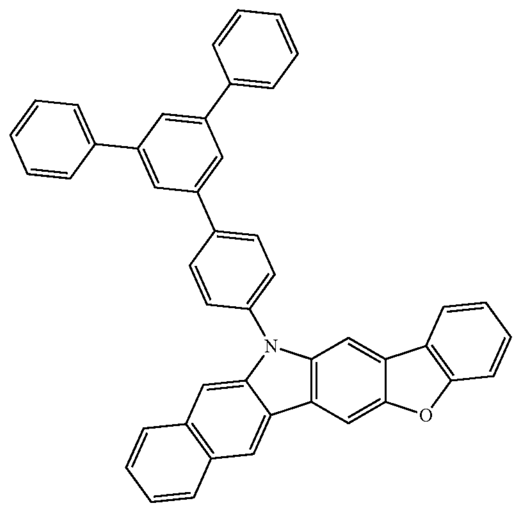
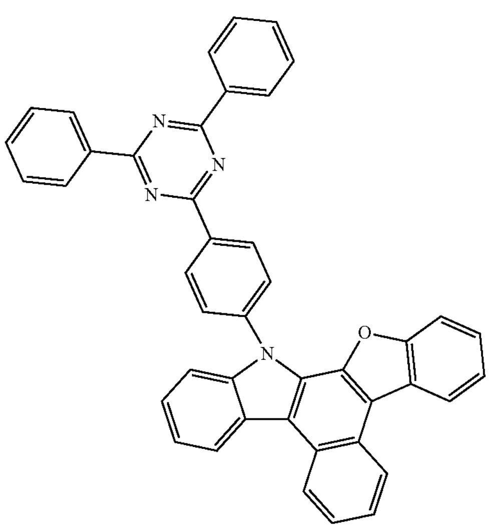
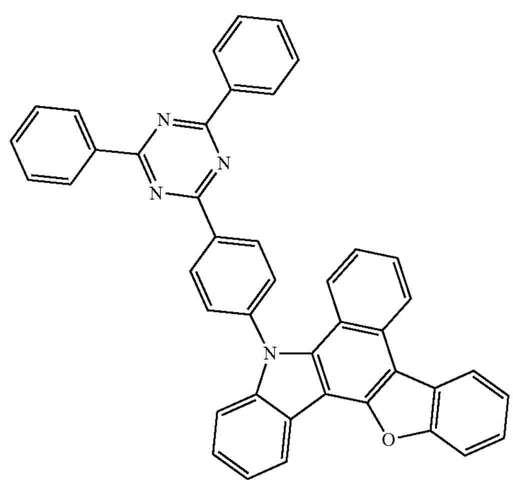

-continued
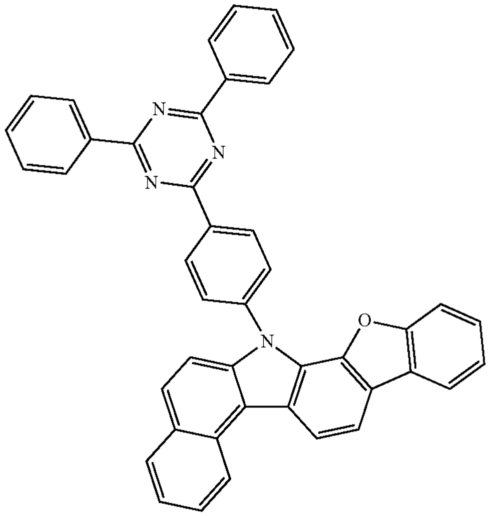
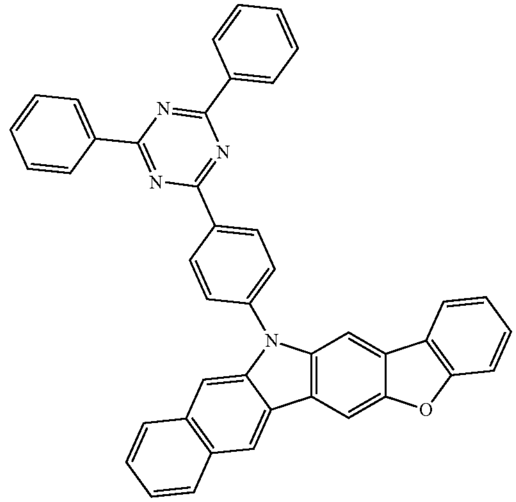
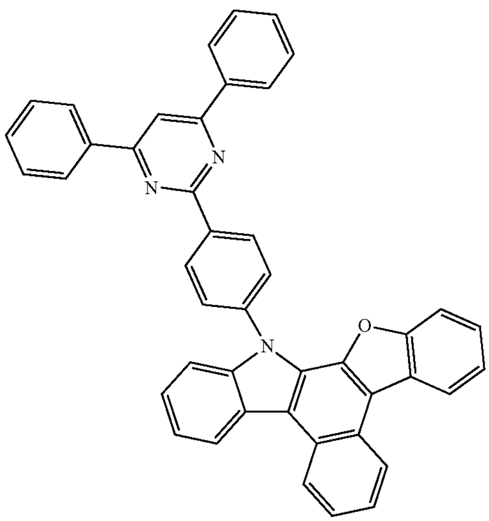
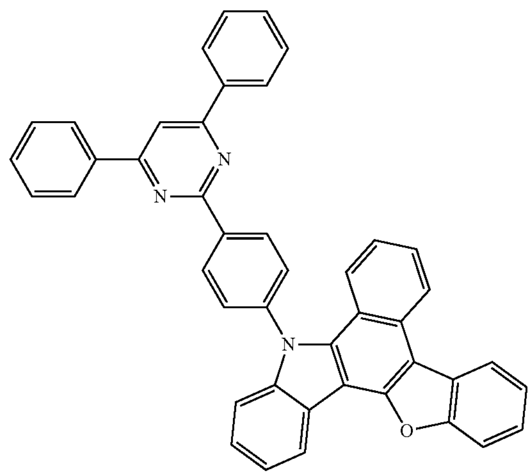
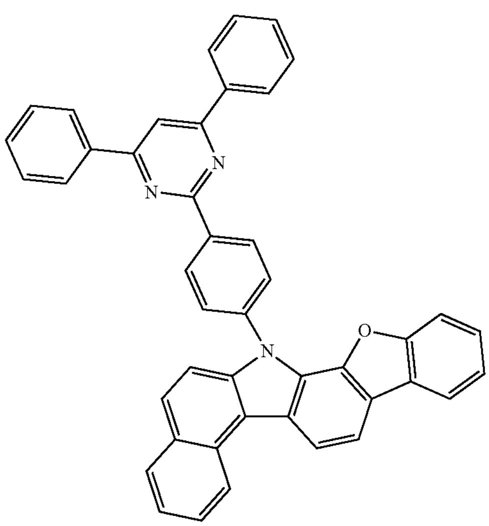
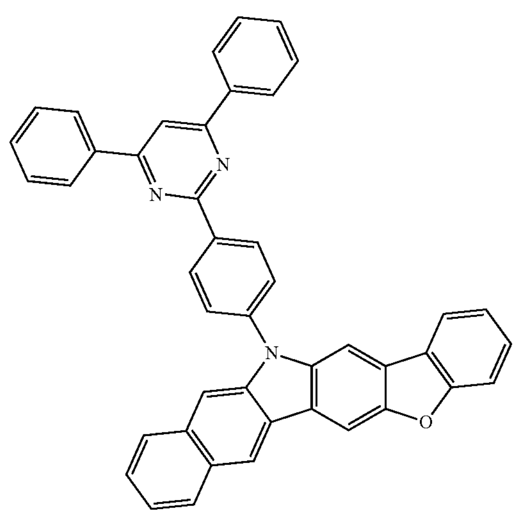

-continued
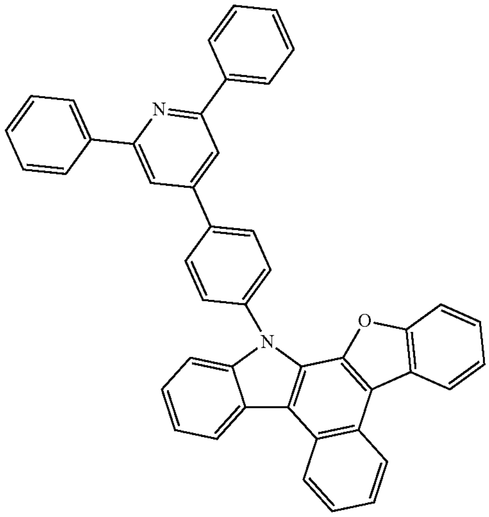
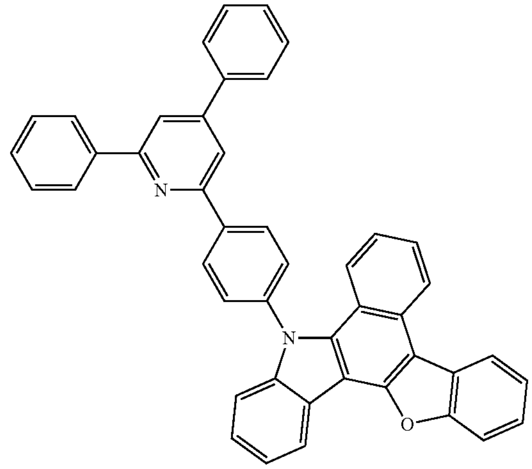
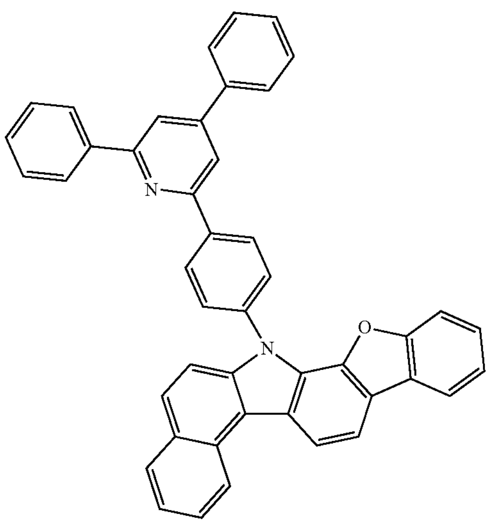
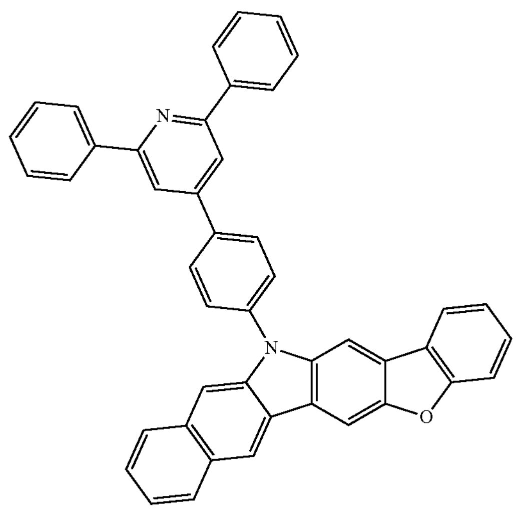
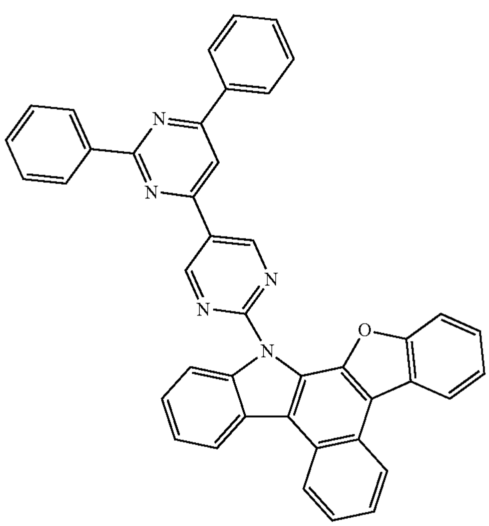
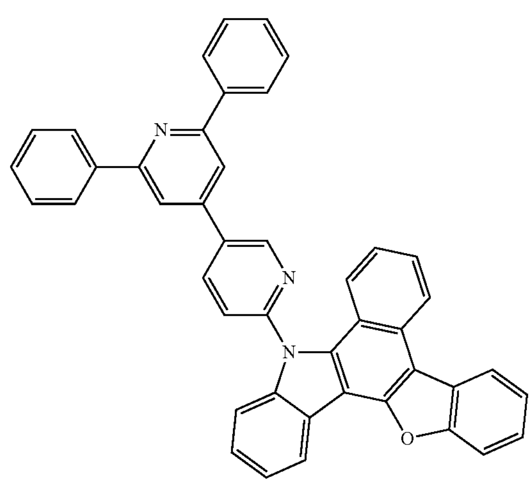

-continued
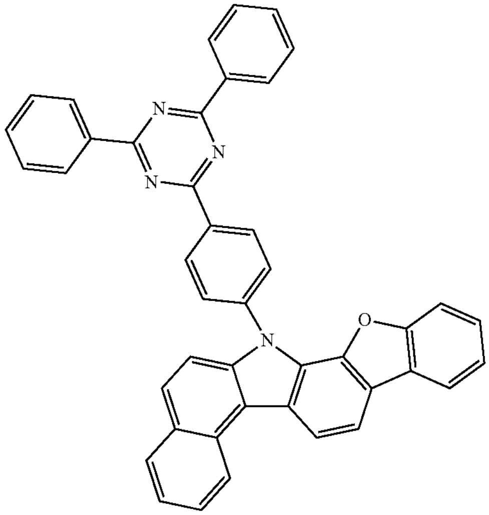
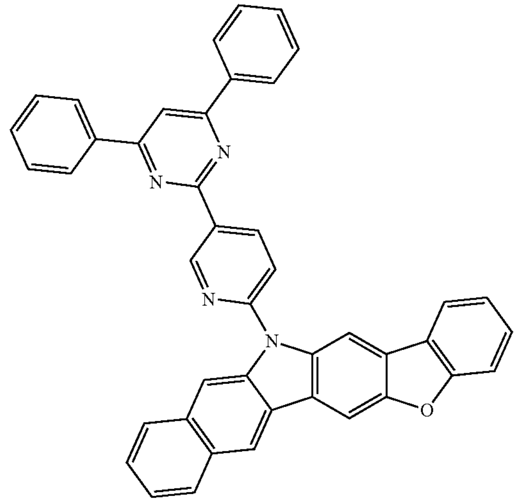
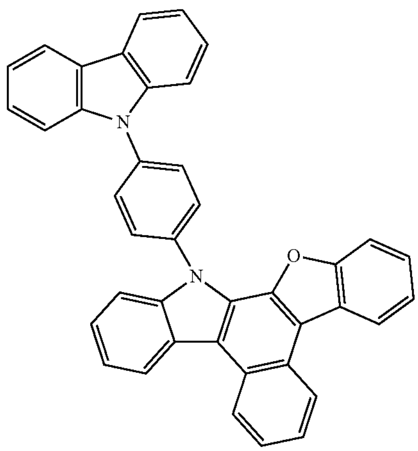
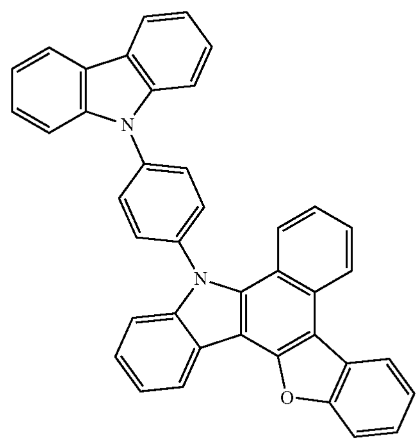
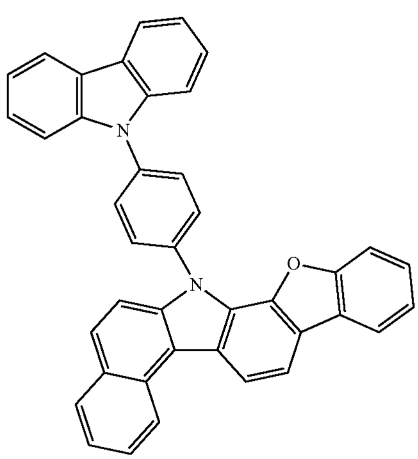
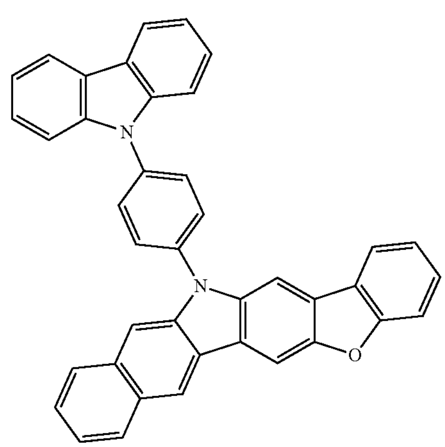

-continued
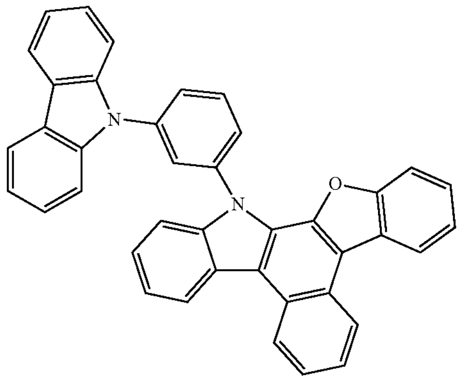
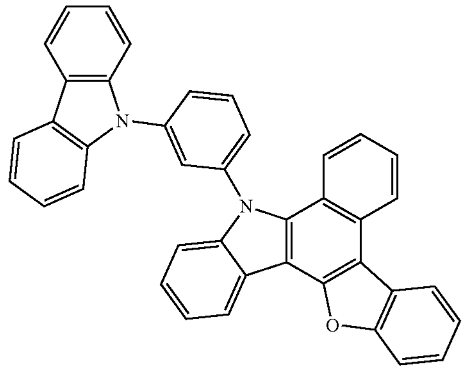
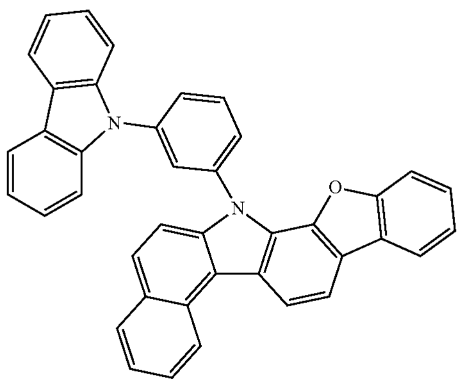
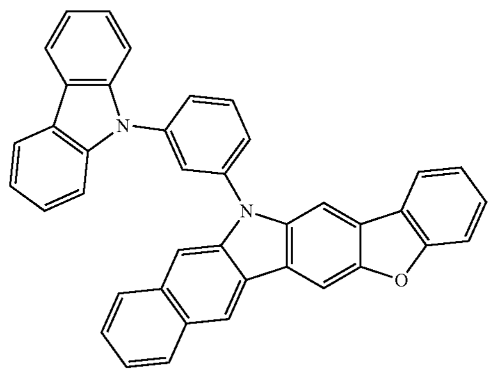
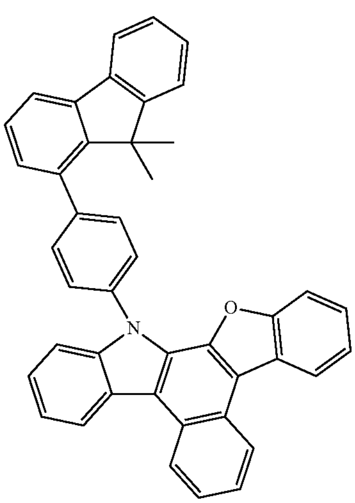
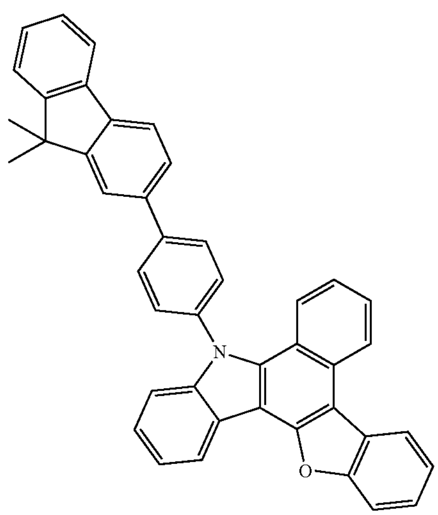

-continued
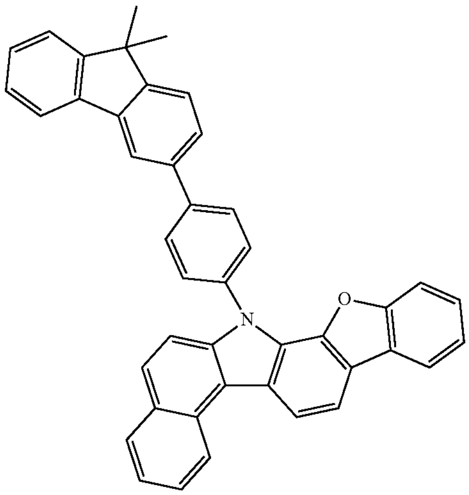
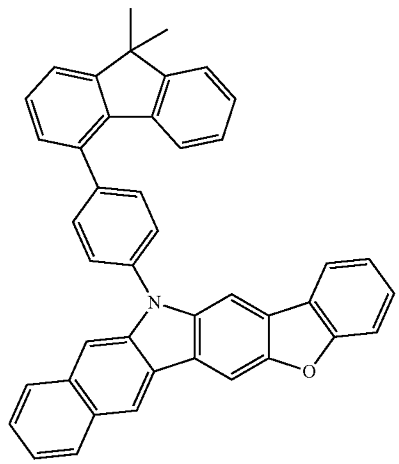
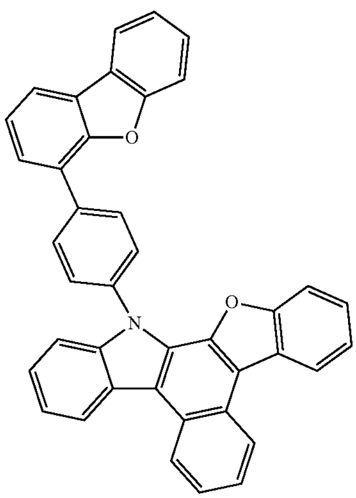
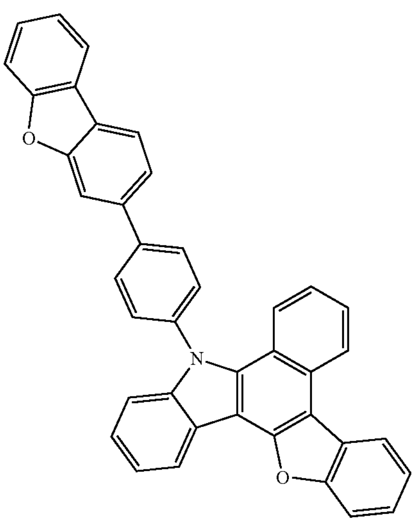
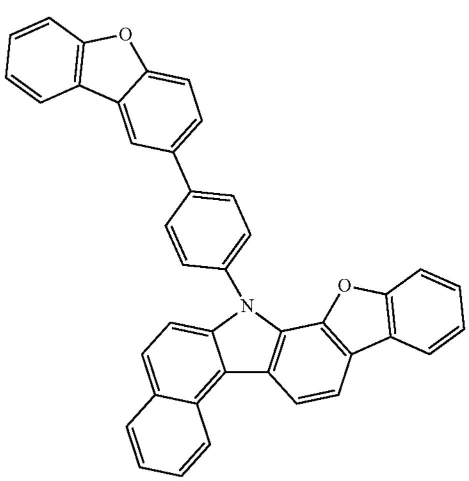
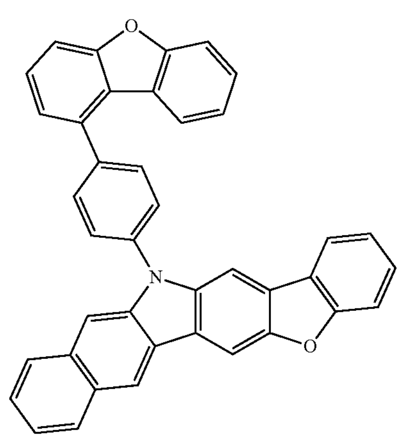

-continued
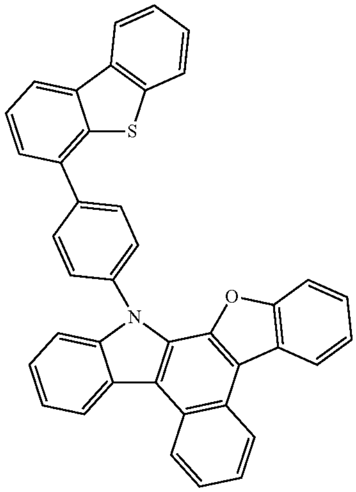
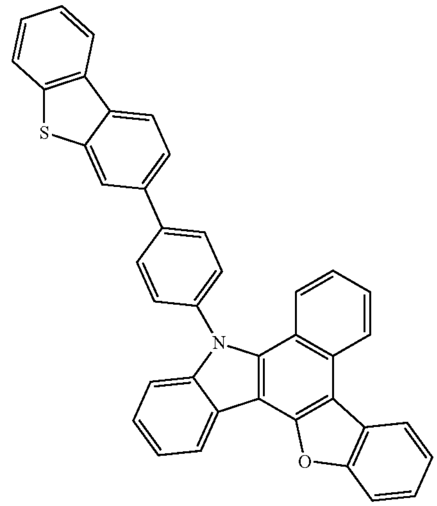
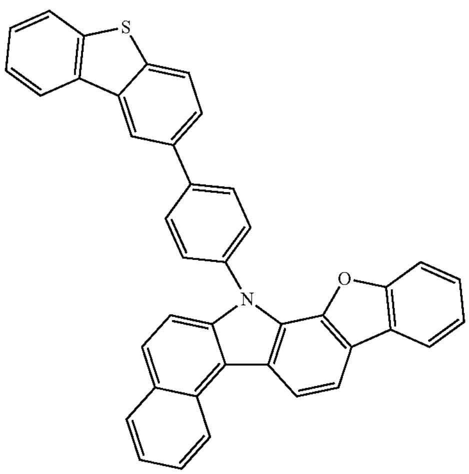
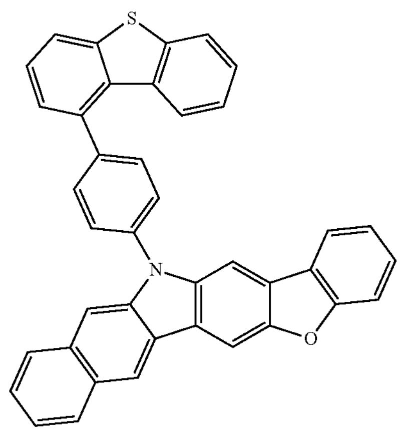
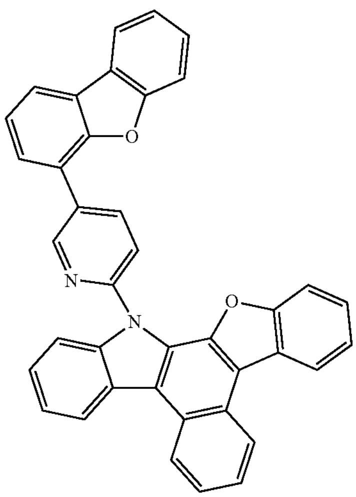
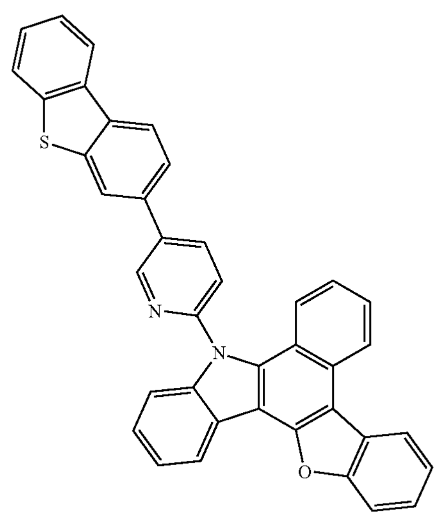

-continued
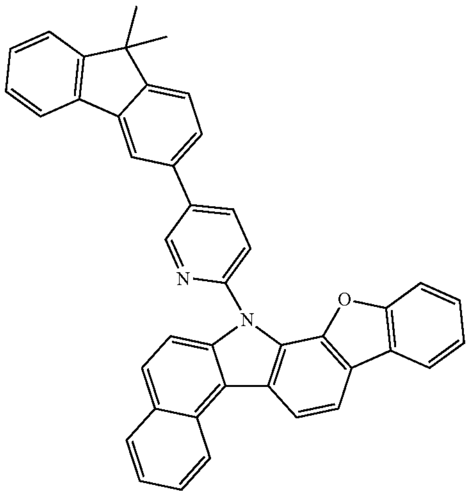
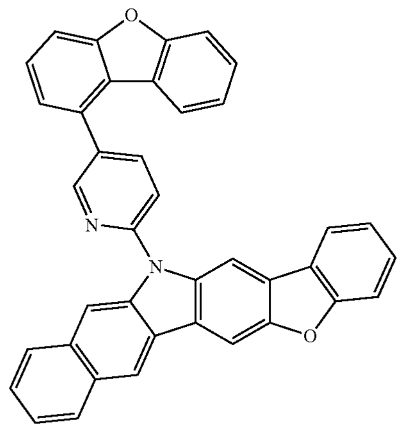
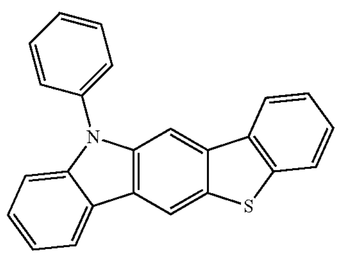
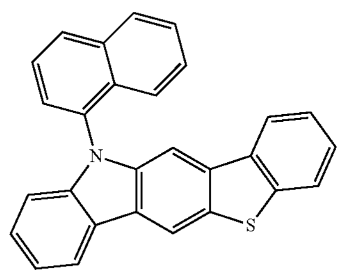
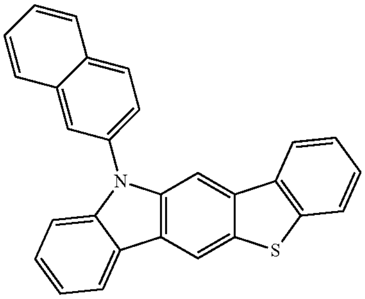
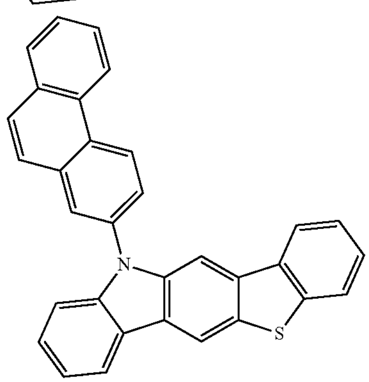
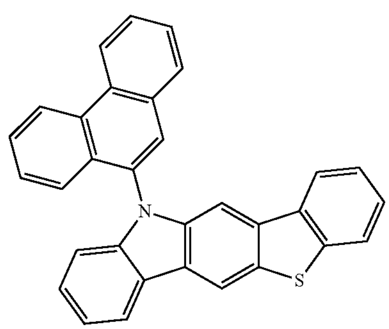
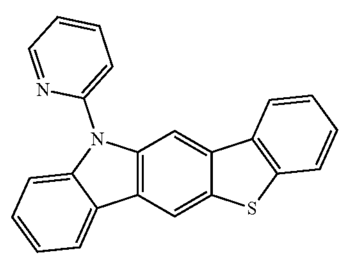
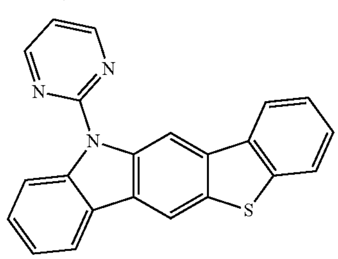
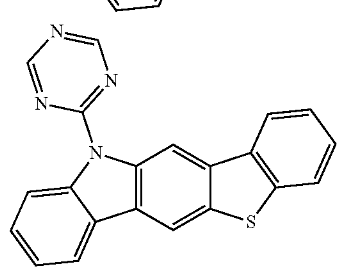
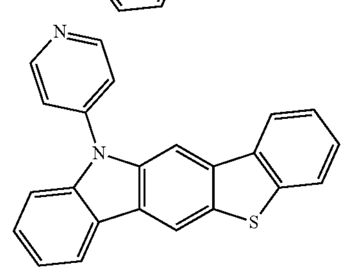
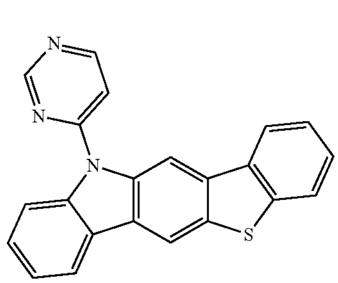
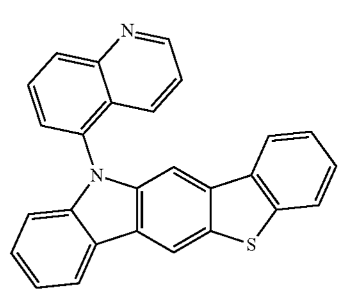
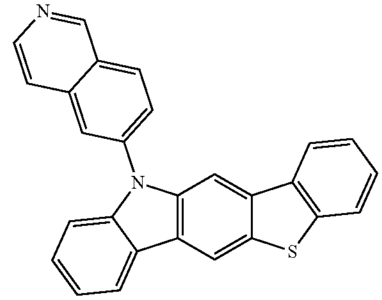

-continued
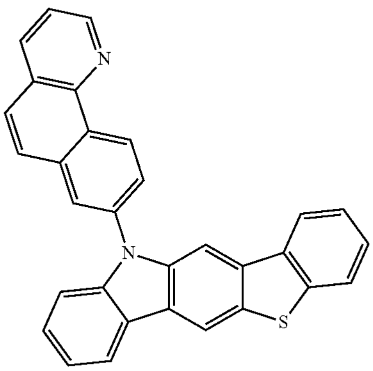
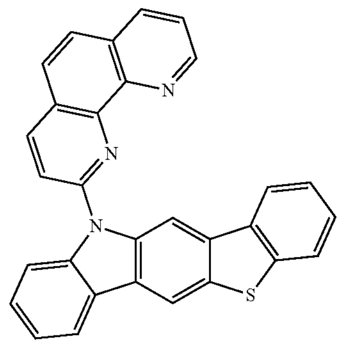
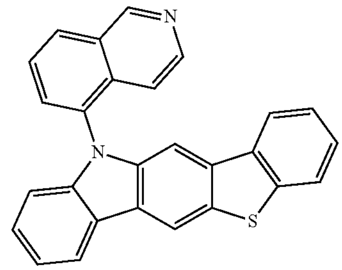
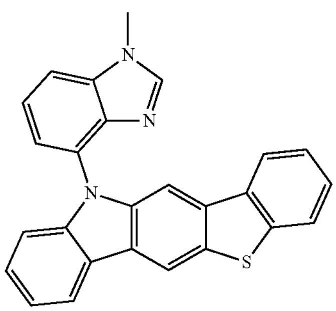
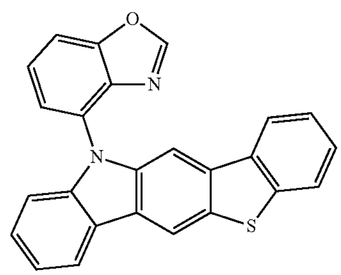
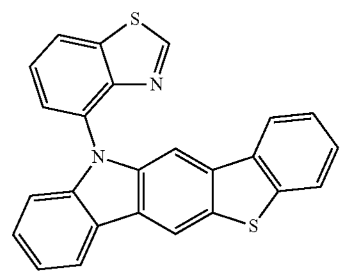
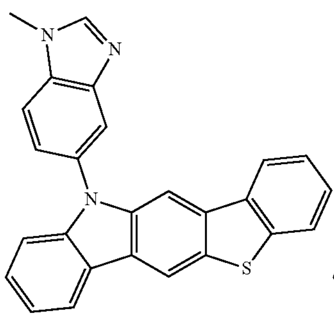
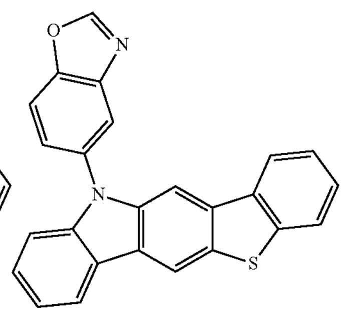
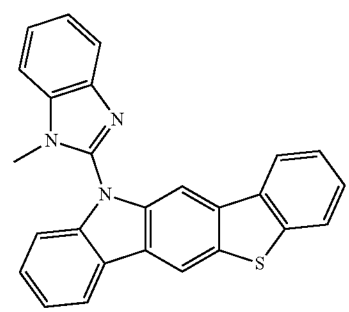
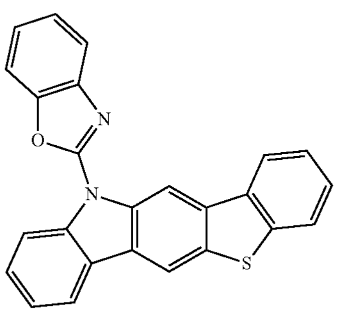
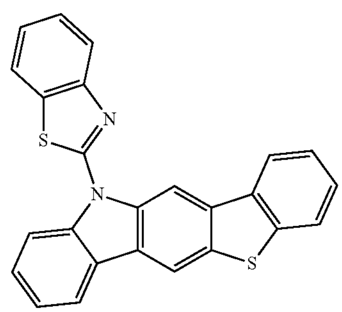
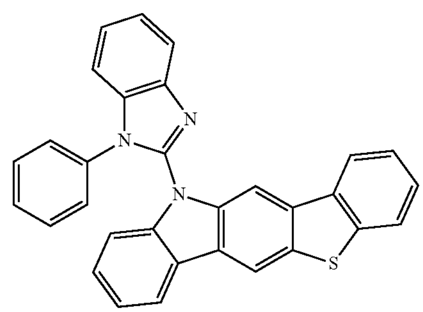
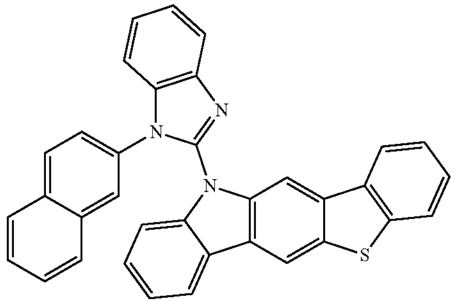
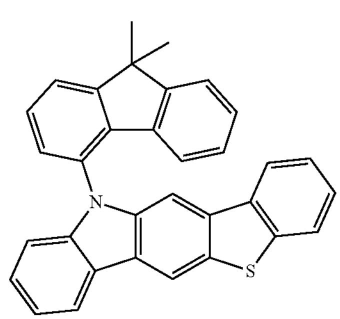
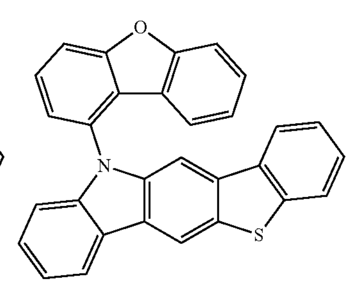

-continued
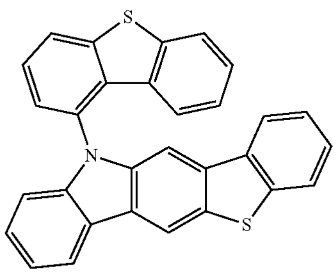
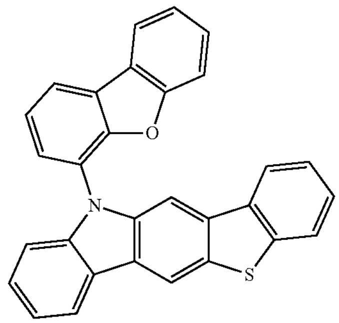
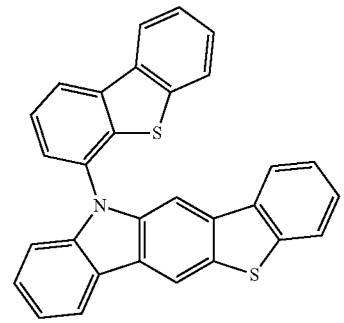
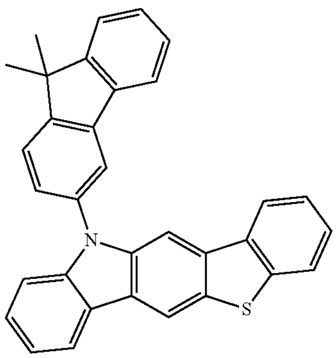
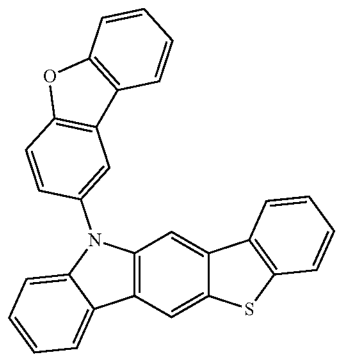
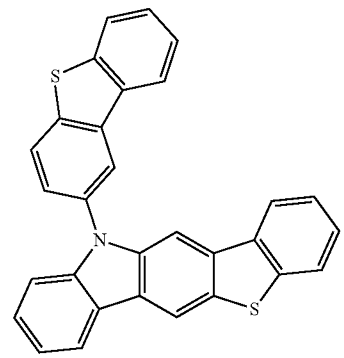
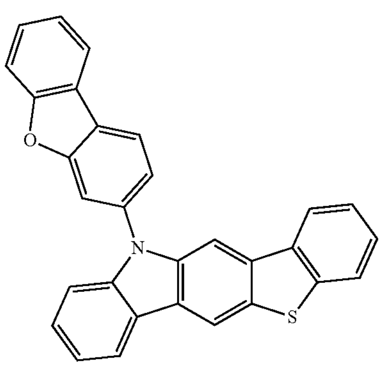
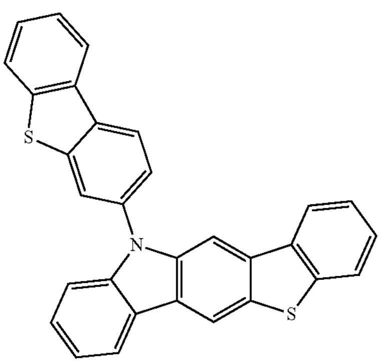
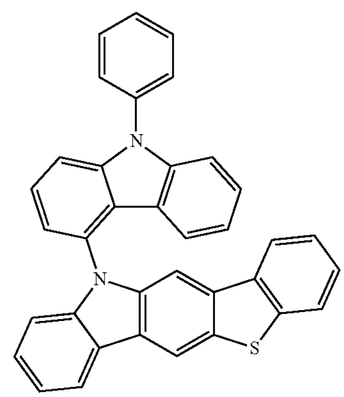
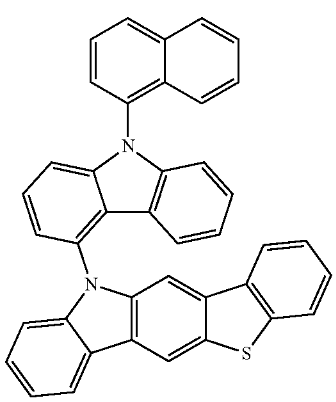
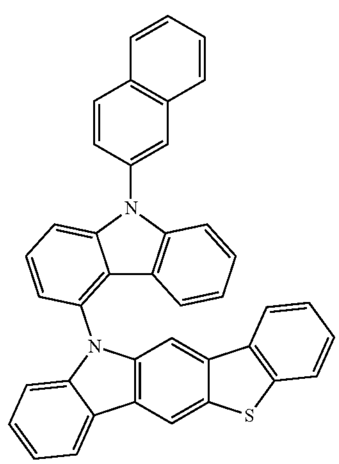
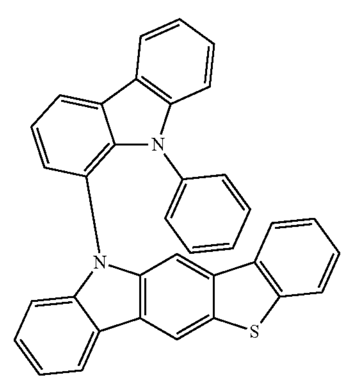

-continued
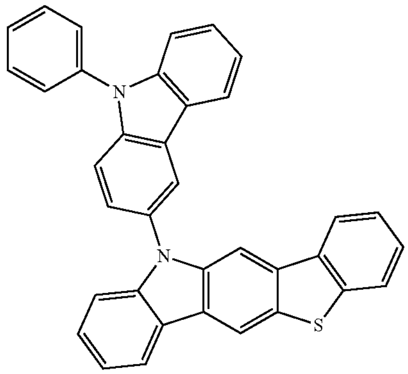
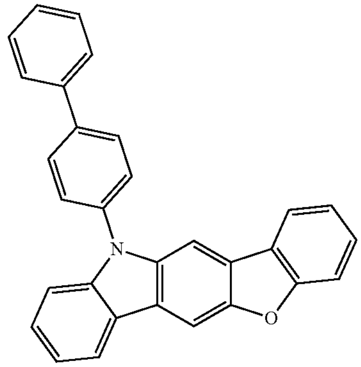
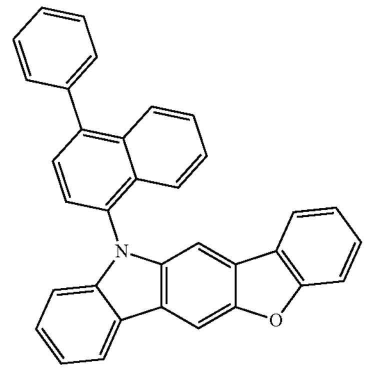
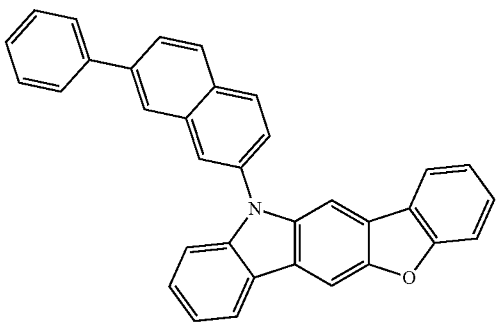
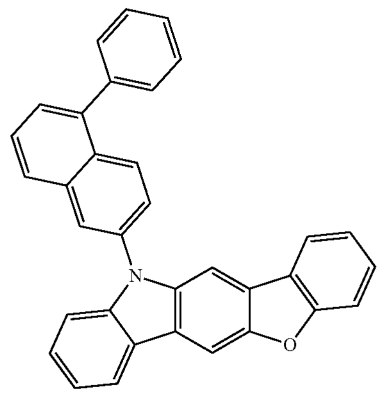
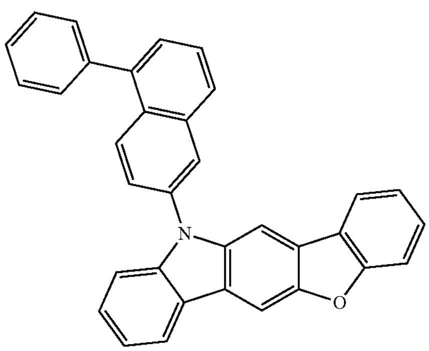
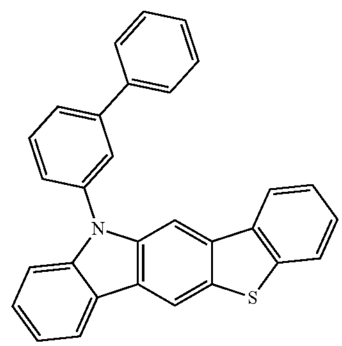
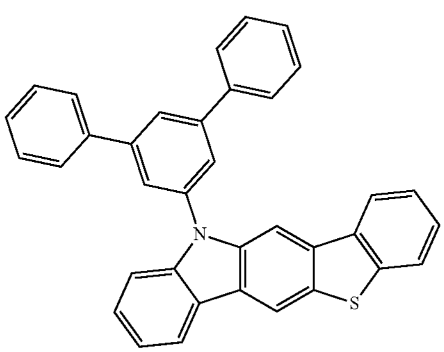
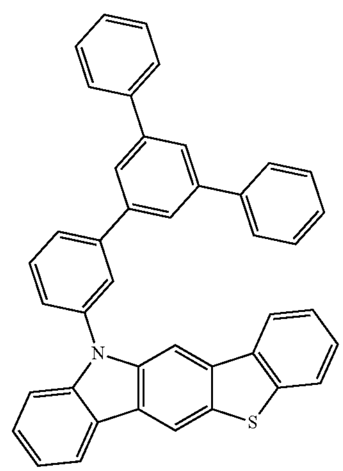

-continued
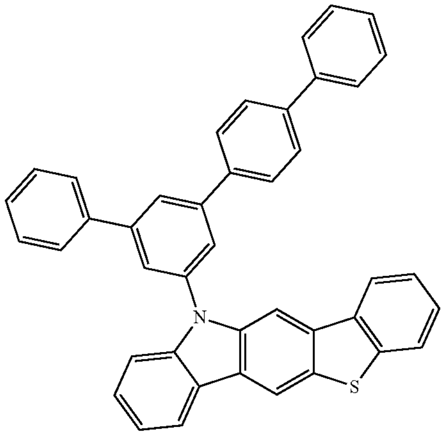
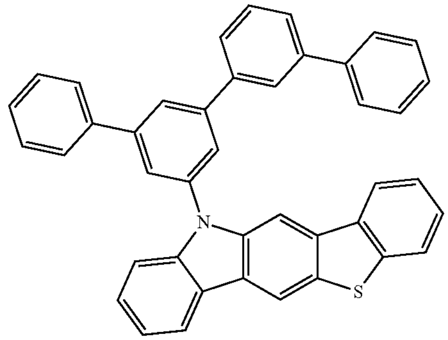
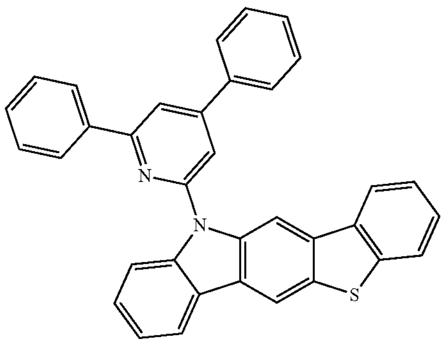
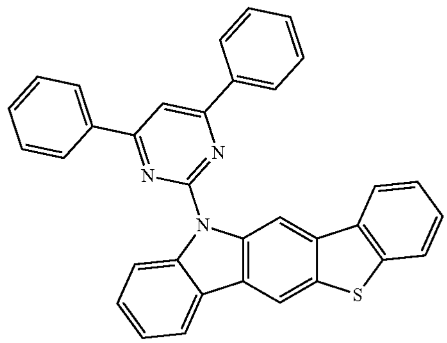
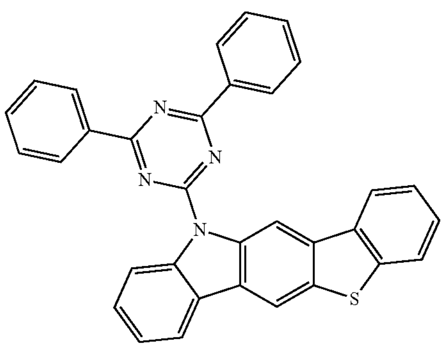
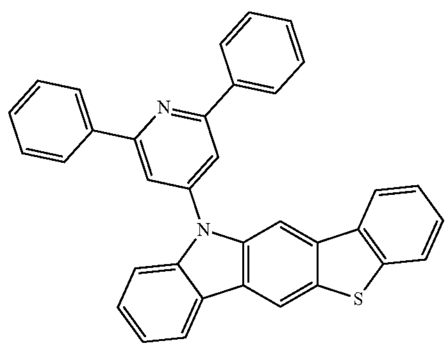
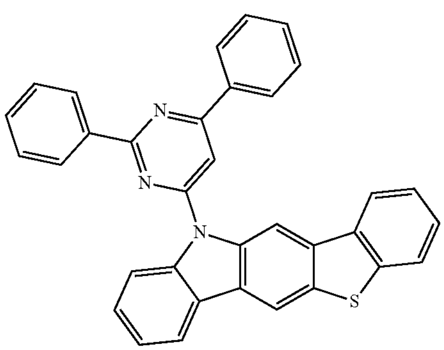
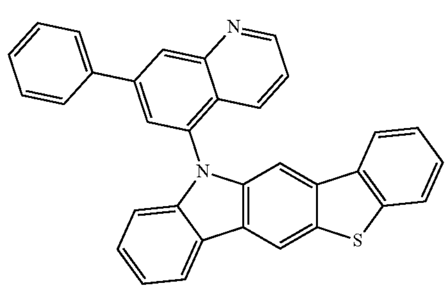

-continued
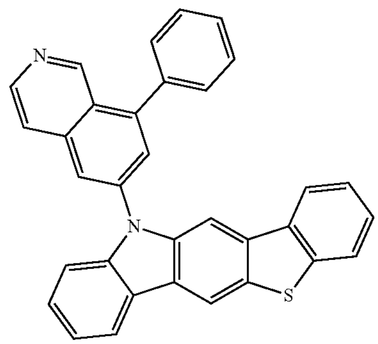
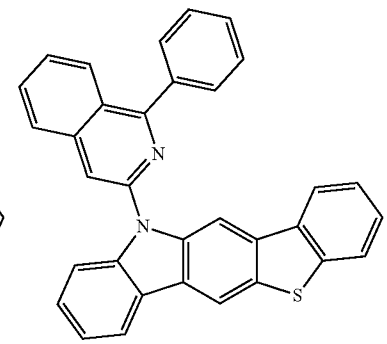
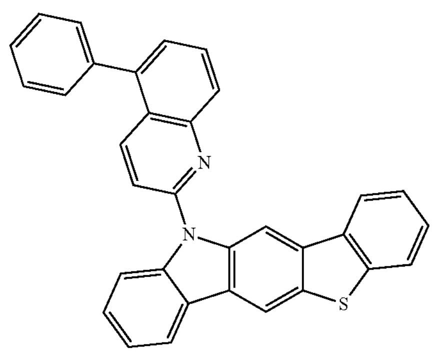
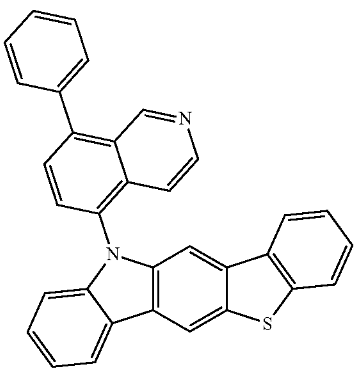
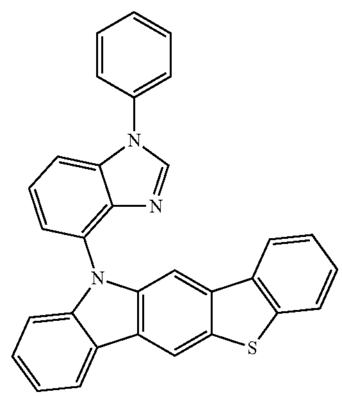
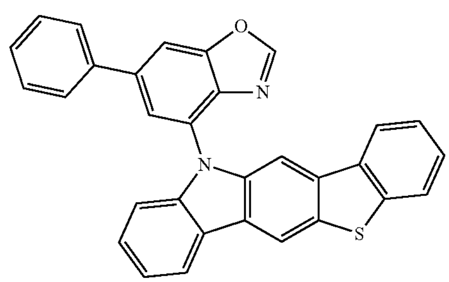
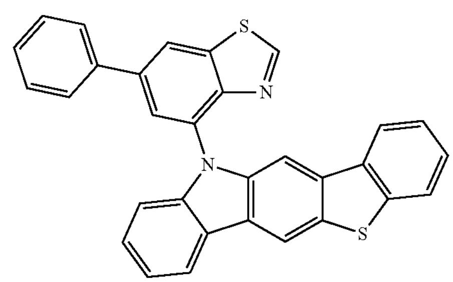
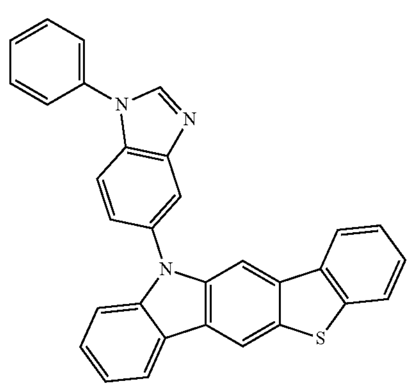
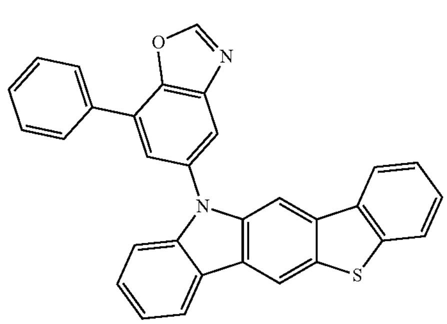

-continued
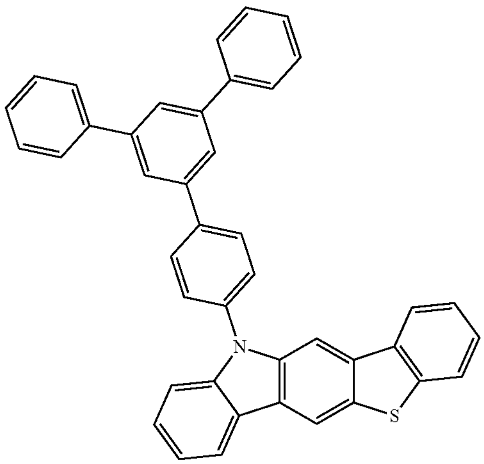
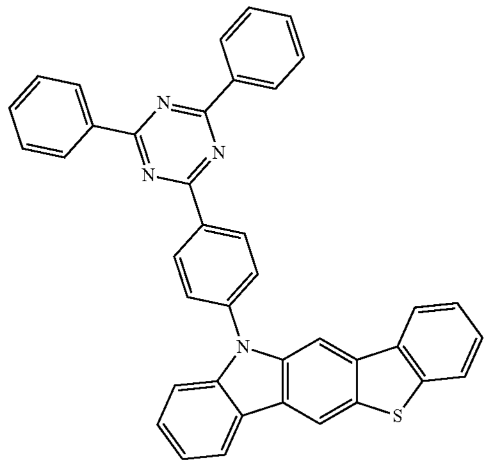
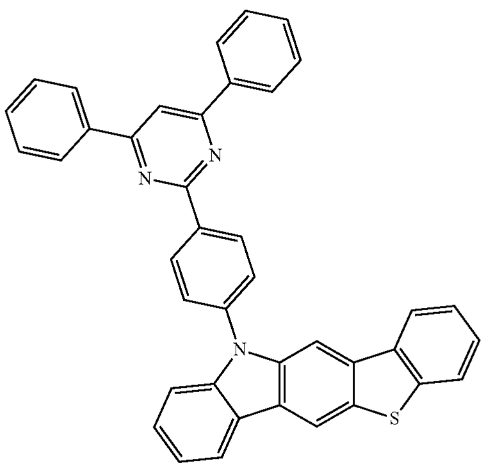
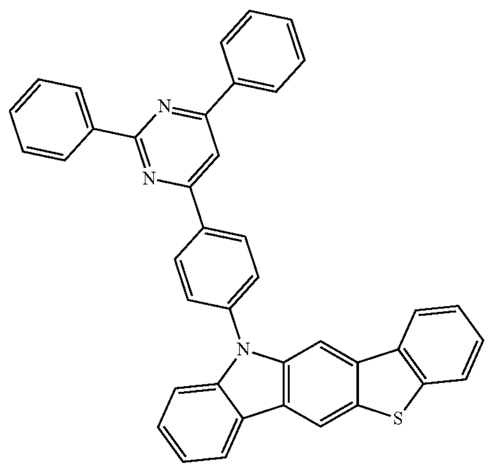
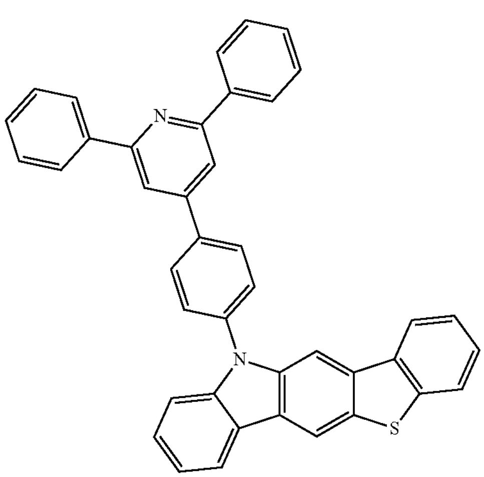
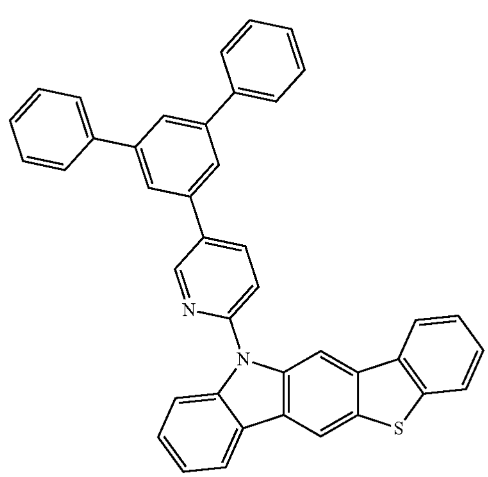

-continued
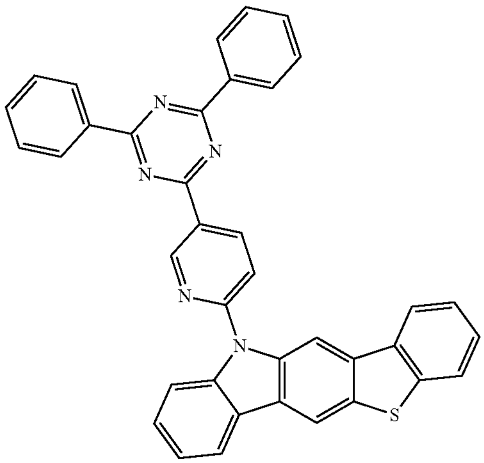
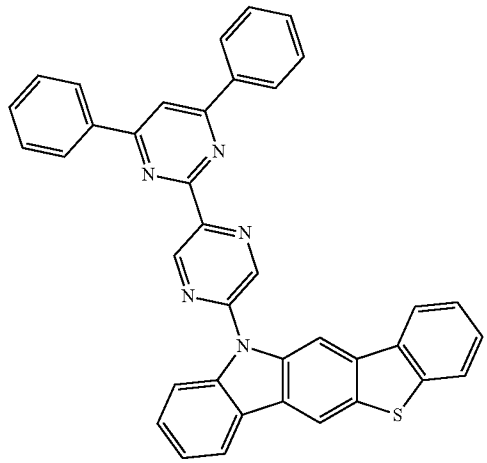
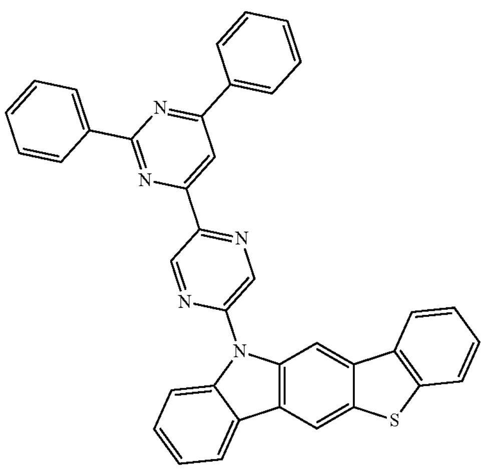
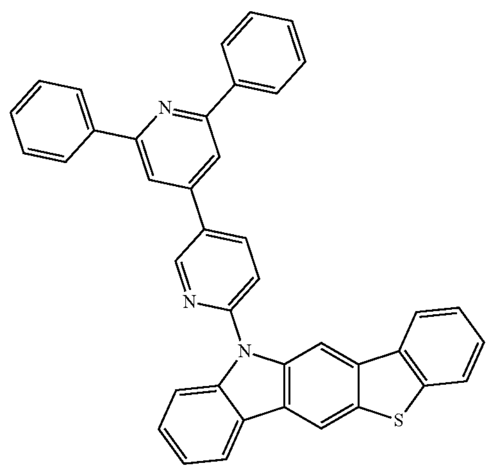
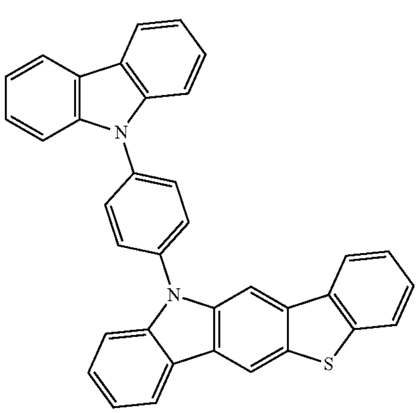
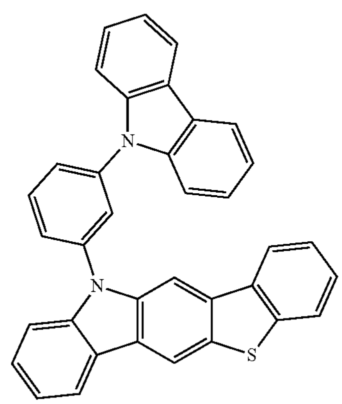
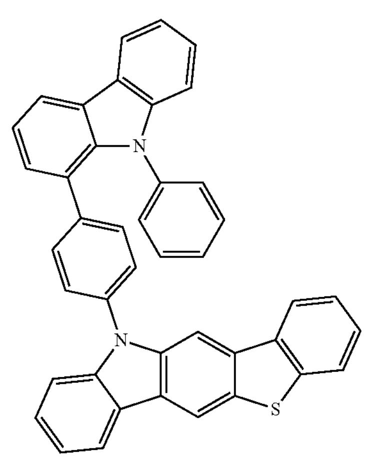

-continued
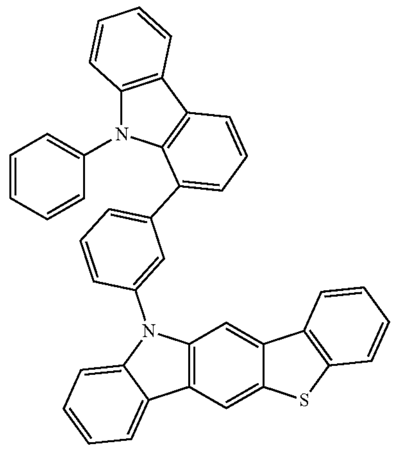
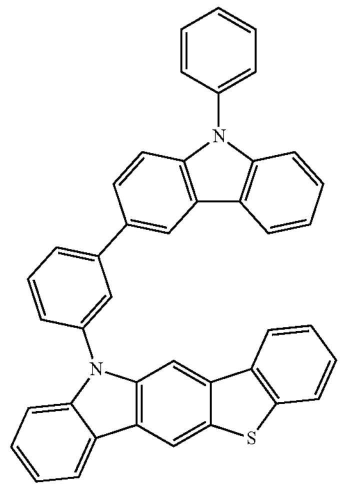
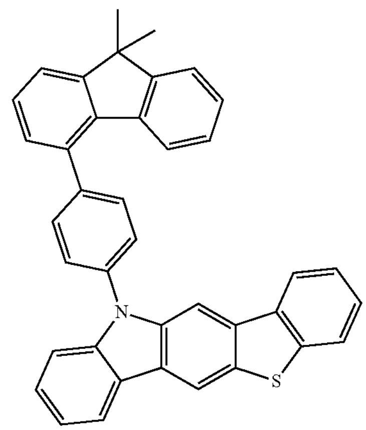
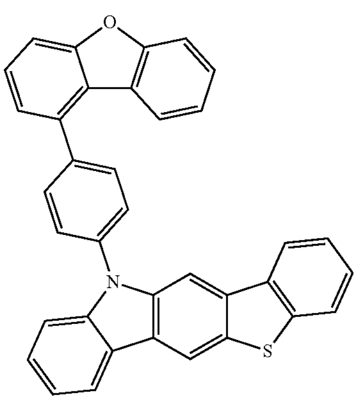
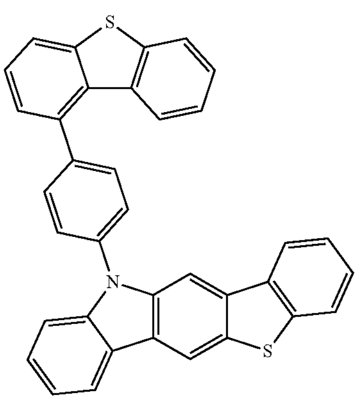
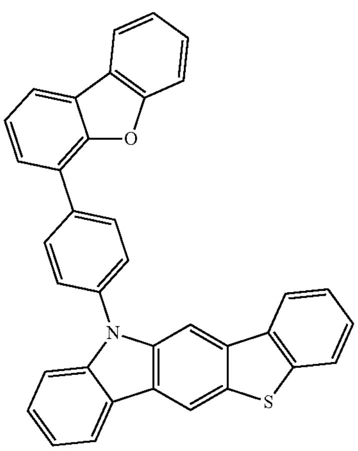
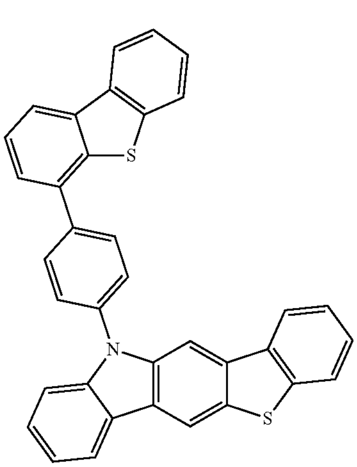
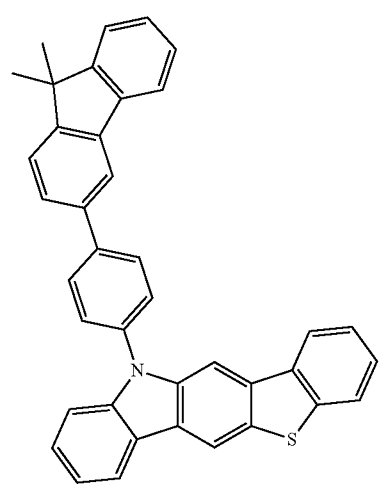
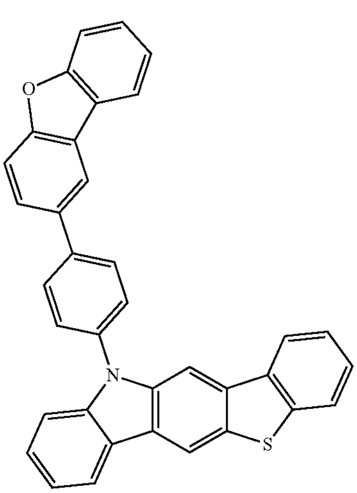

-continued
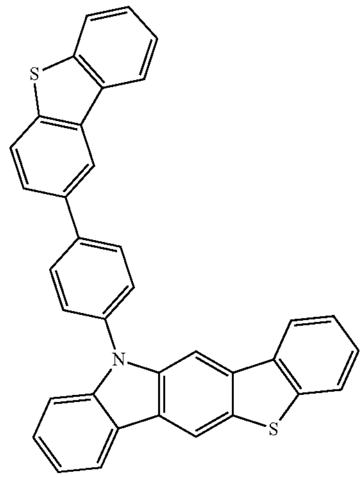
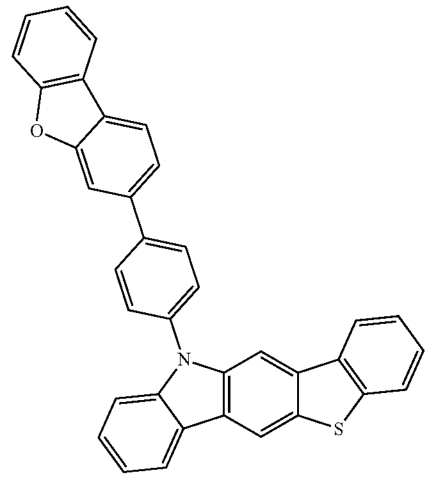
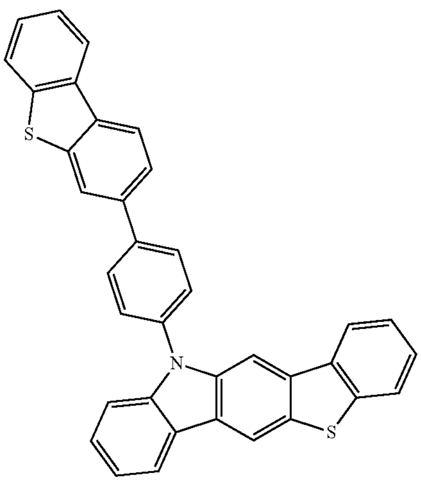
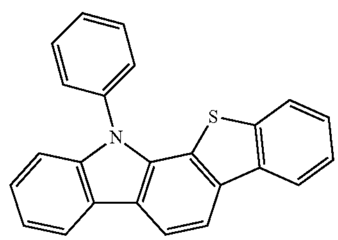
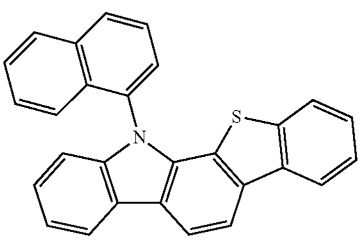
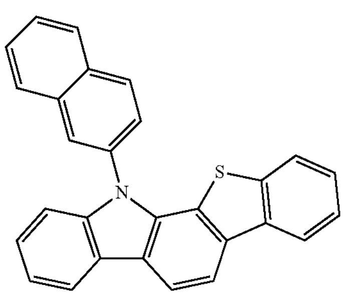
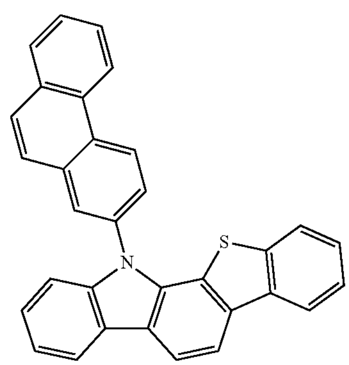
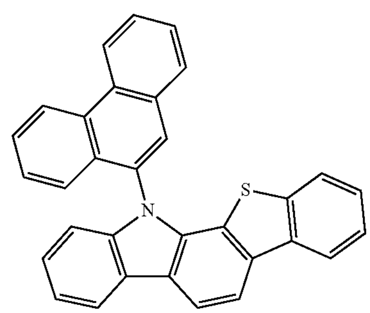
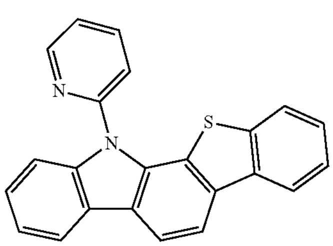
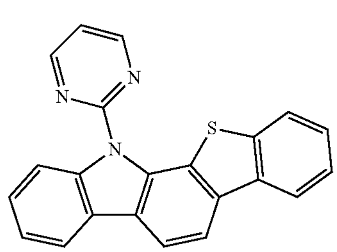
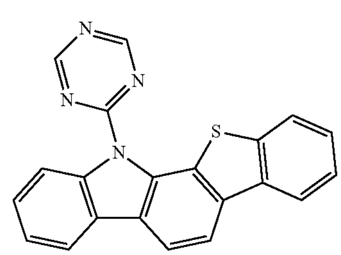

-continued
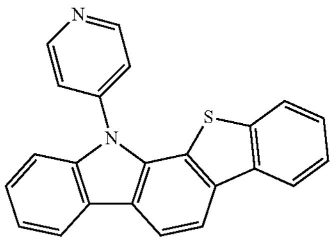
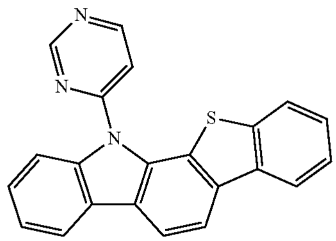
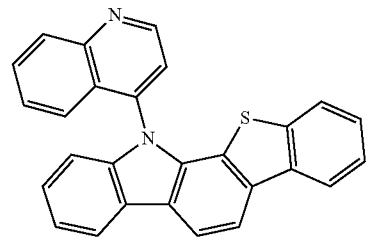
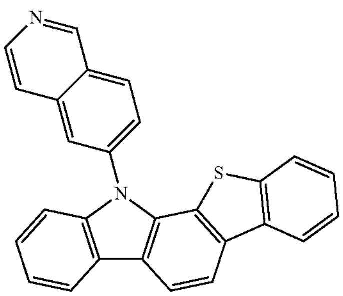
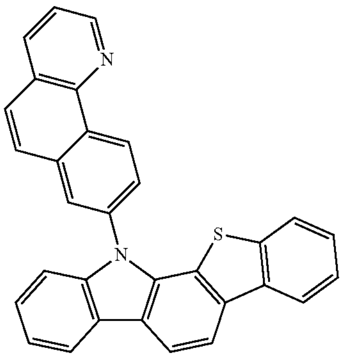
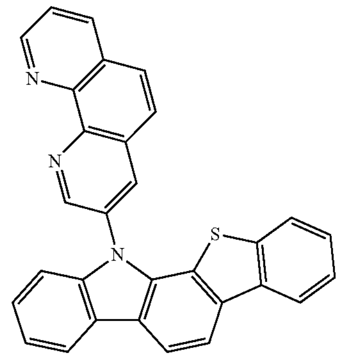
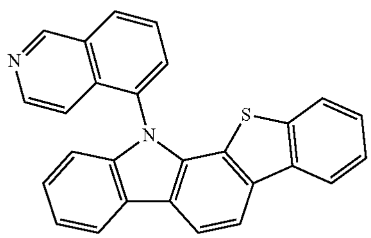
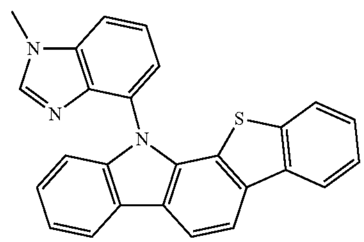
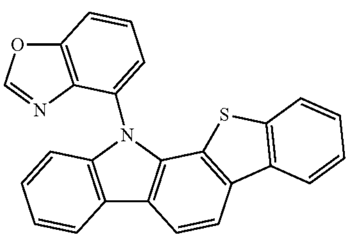
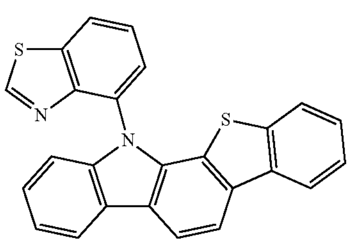
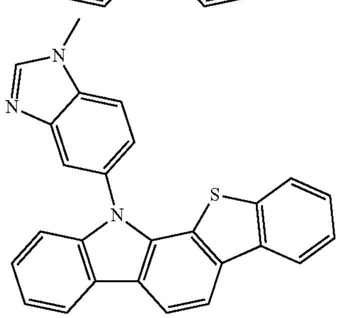
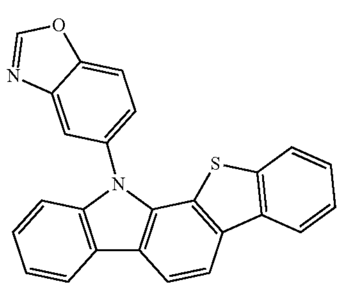
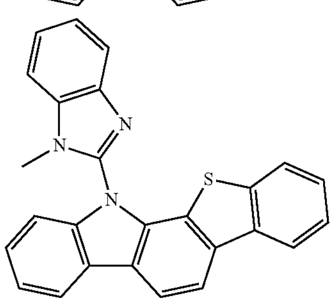
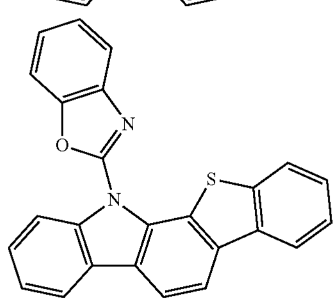
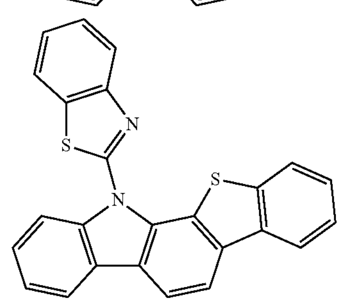
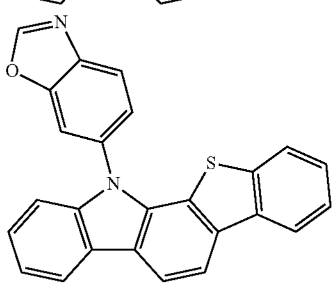
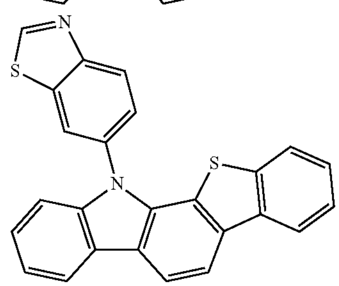
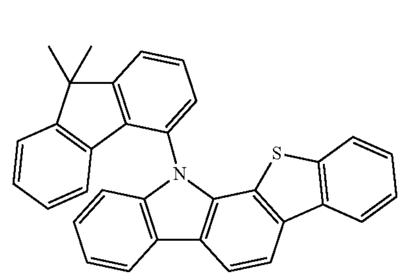

-continued
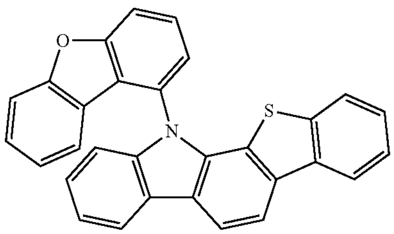
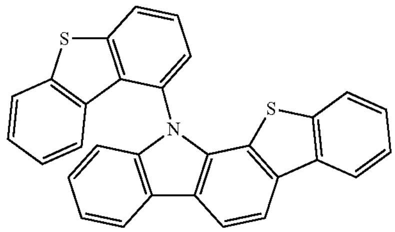
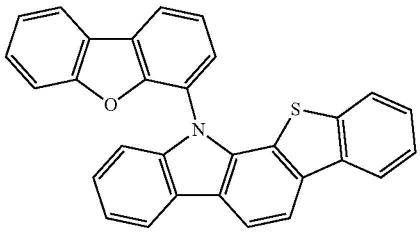
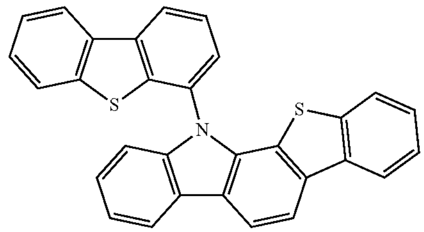
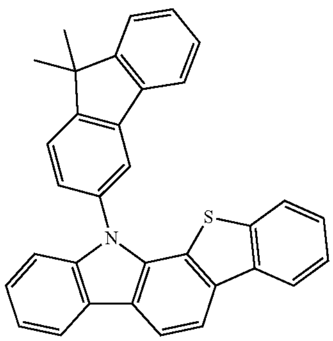
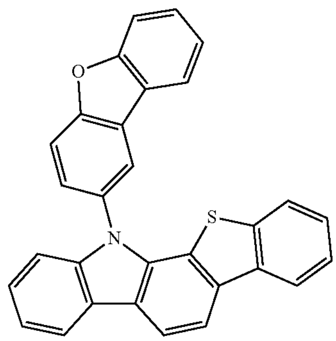
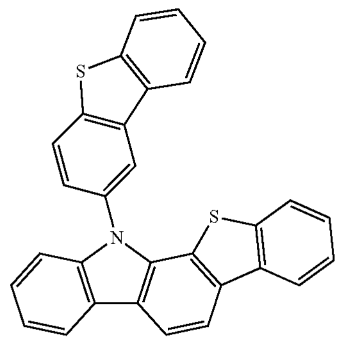
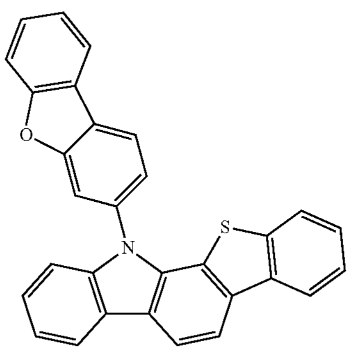
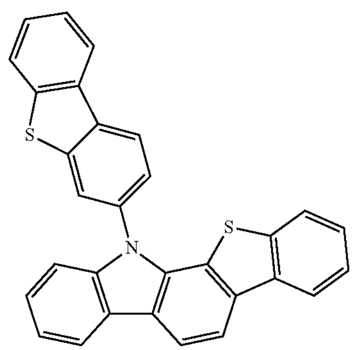
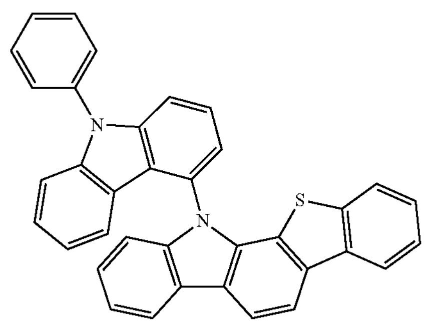
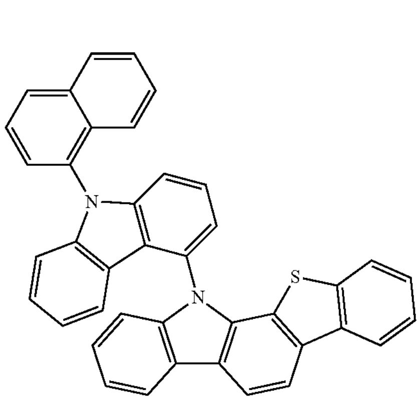
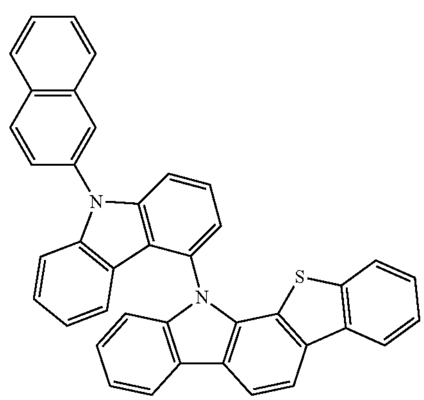

-continued
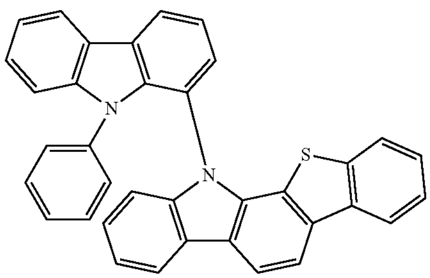
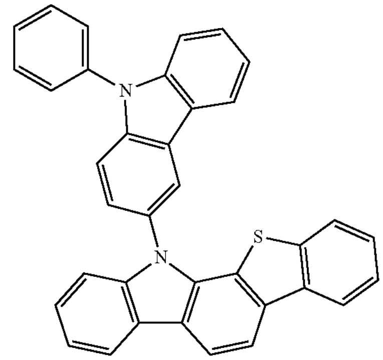
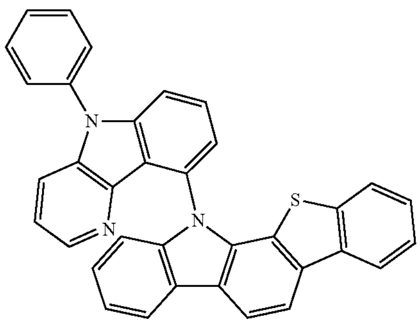
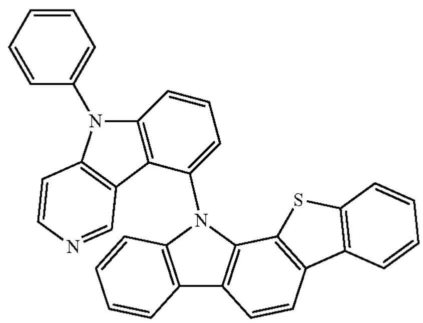
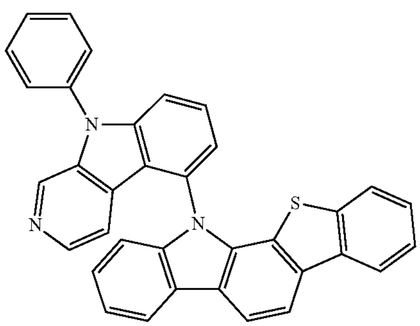
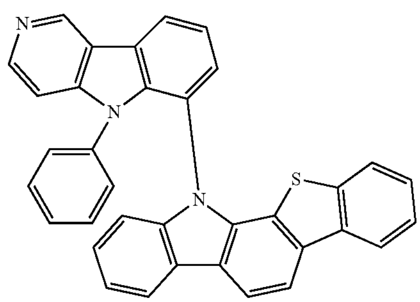
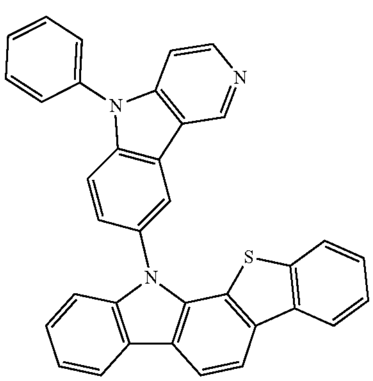
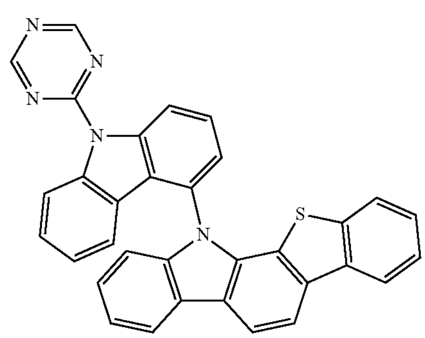
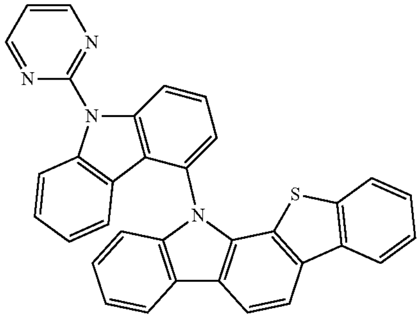
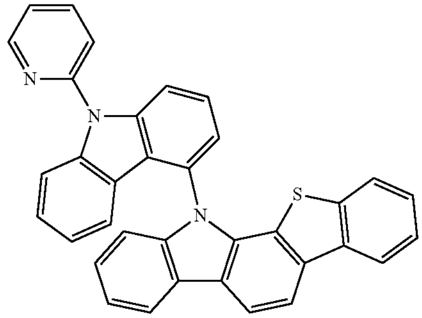

-continued
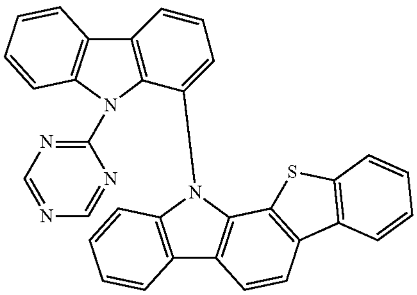
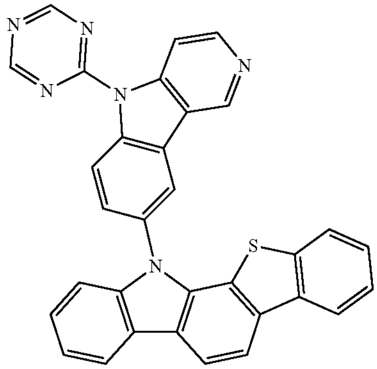
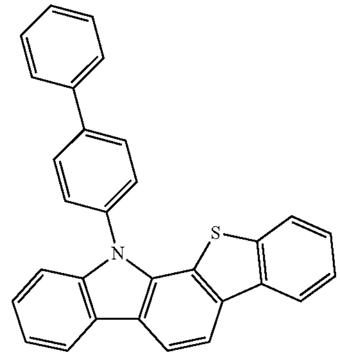
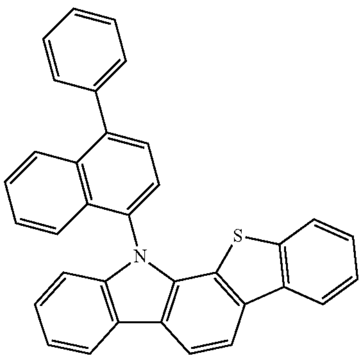
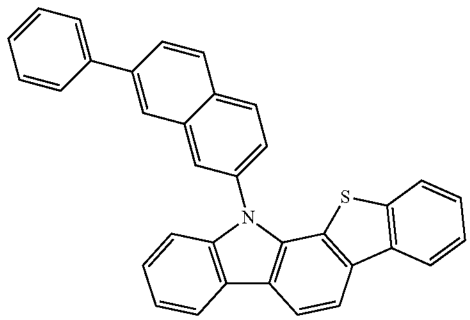
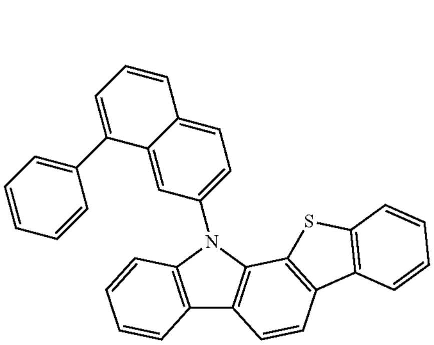
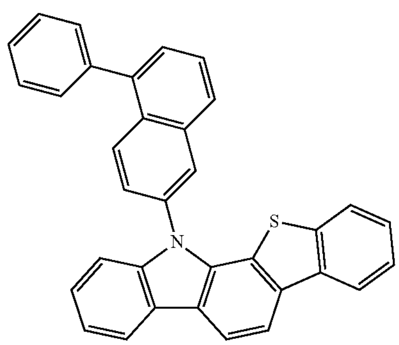
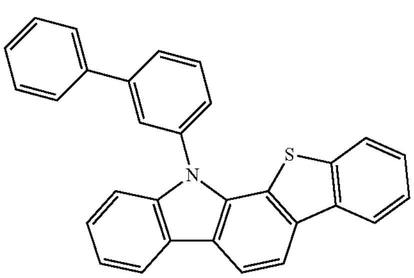
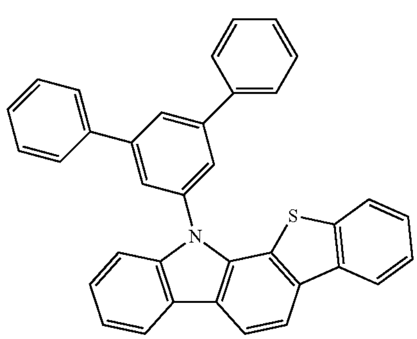

-continued
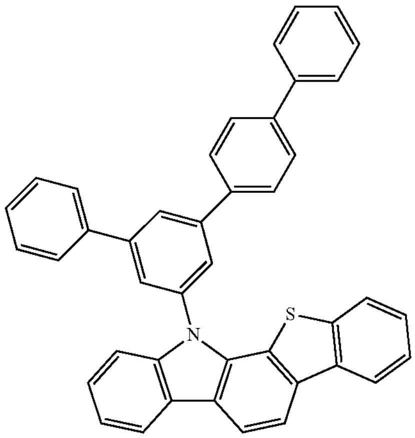
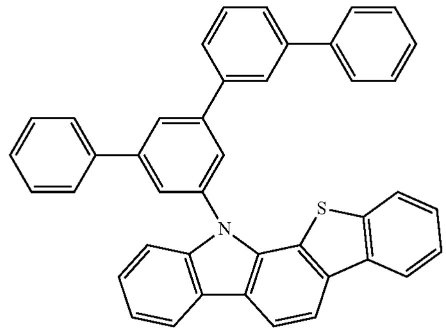
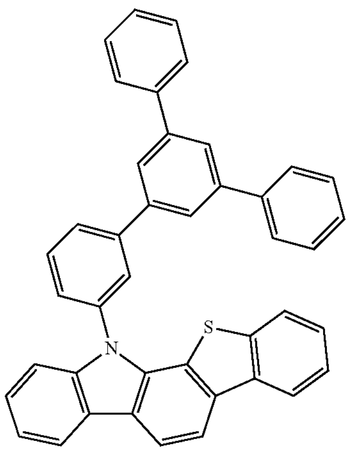
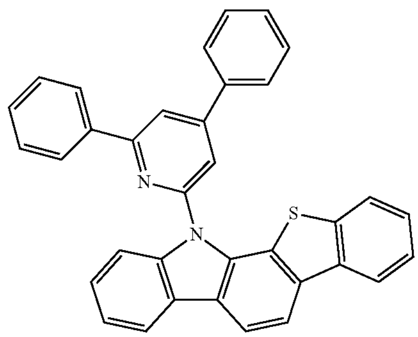
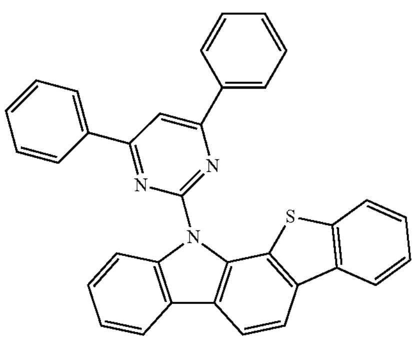
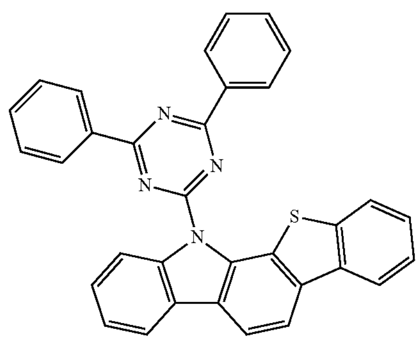
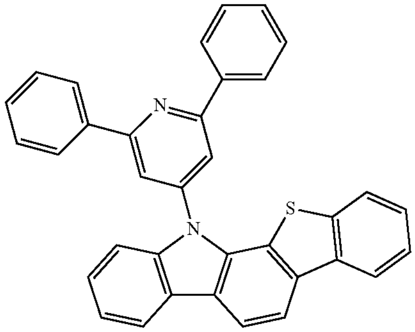
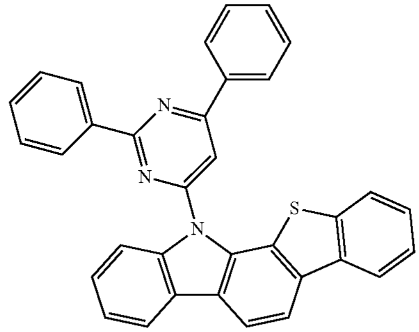

-continued
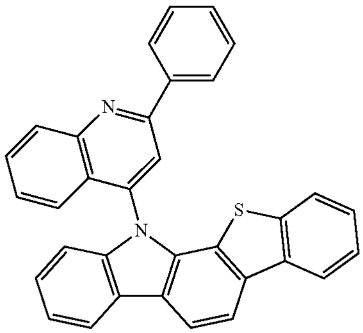
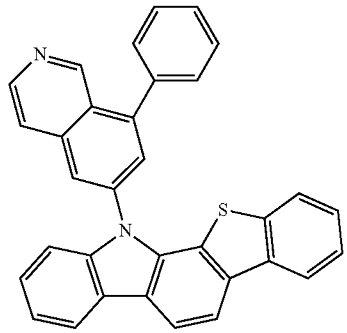
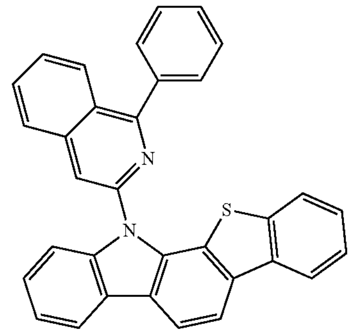
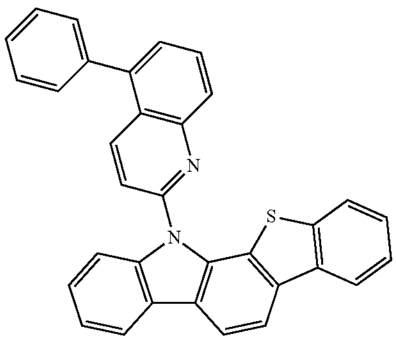
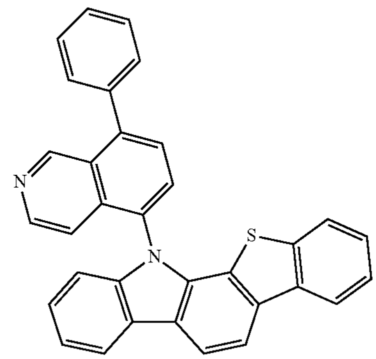
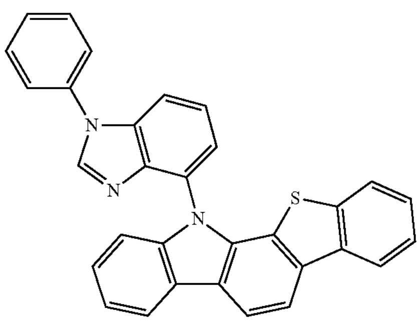
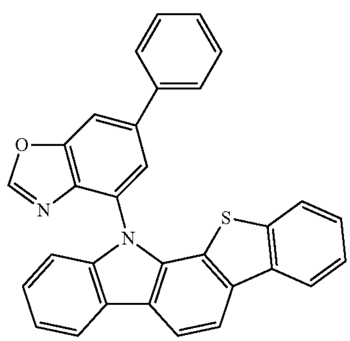
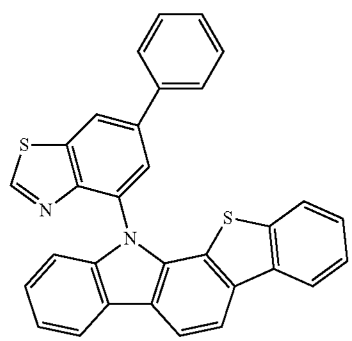
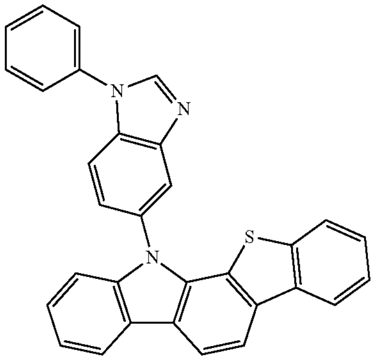
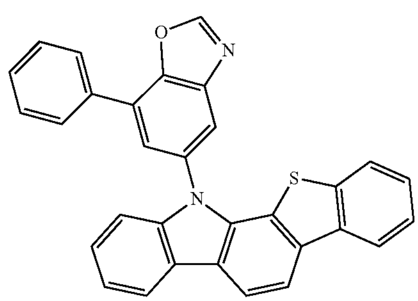

-continued
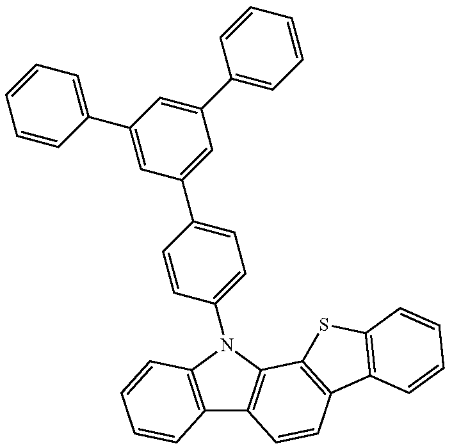
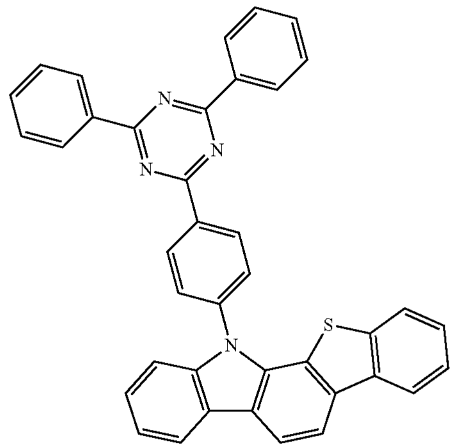
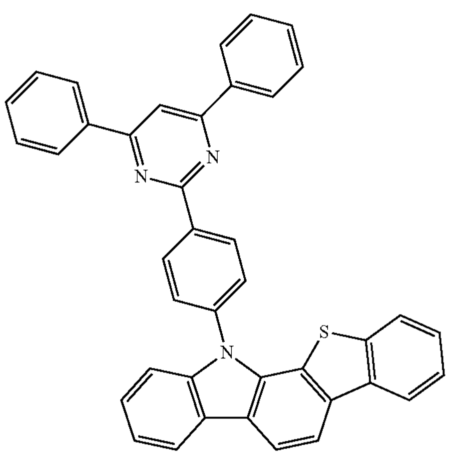
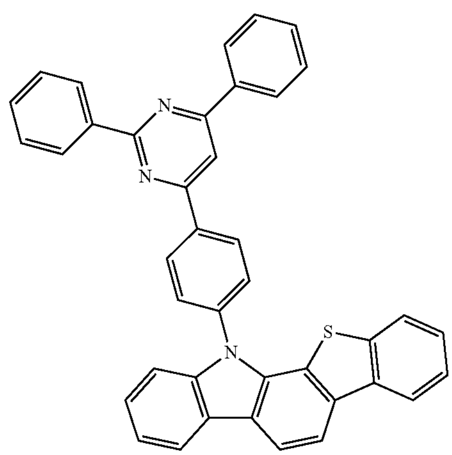
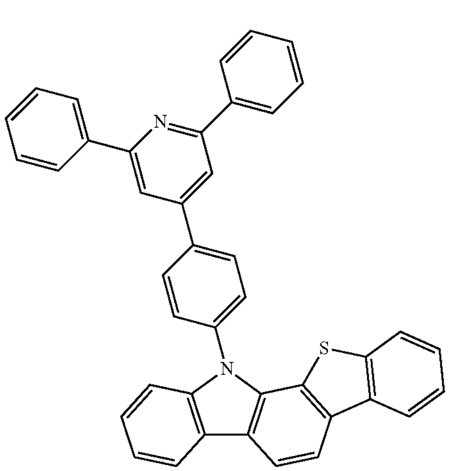
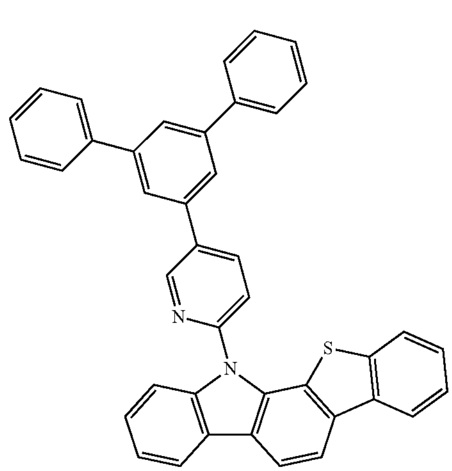

-continued
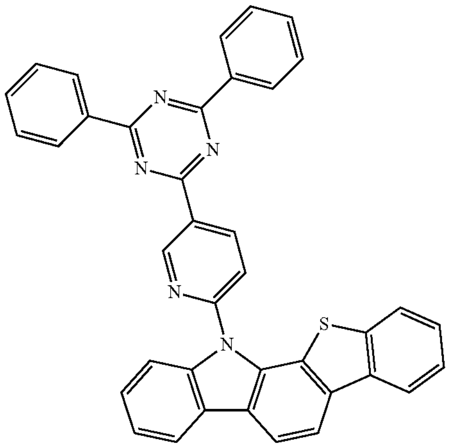
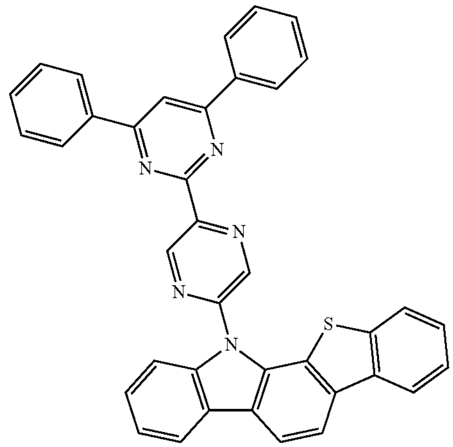
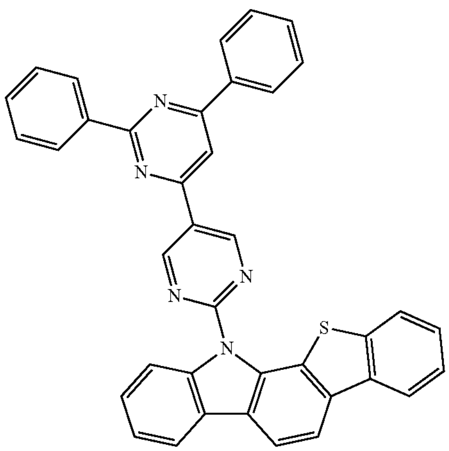
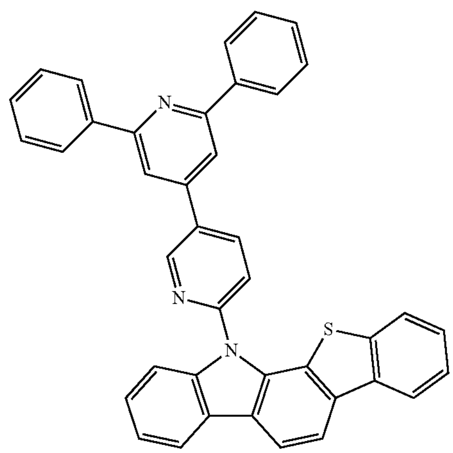
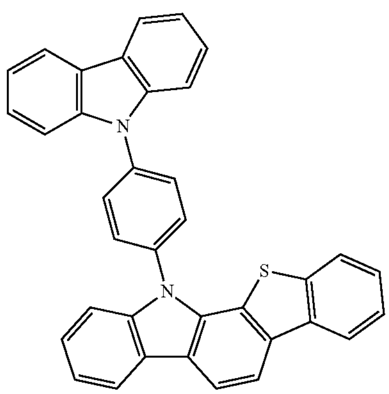
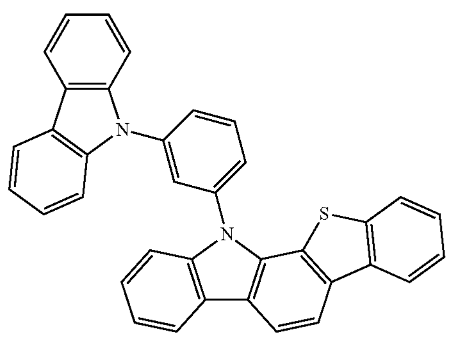
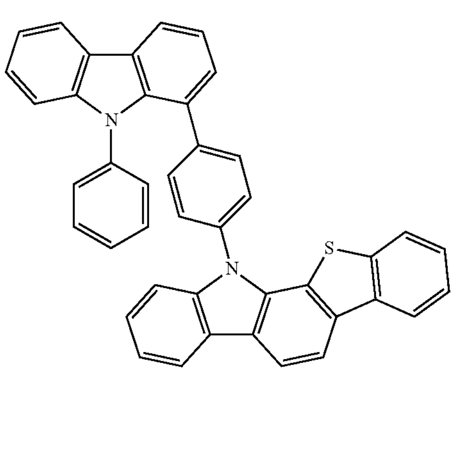
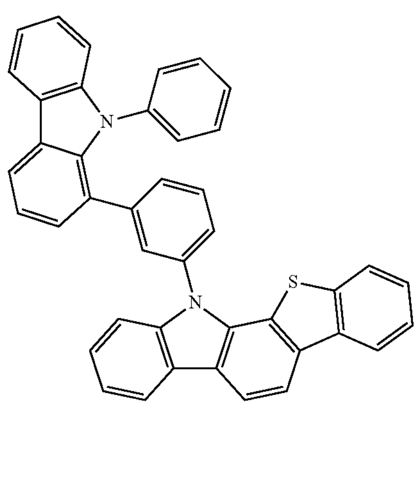

-continued
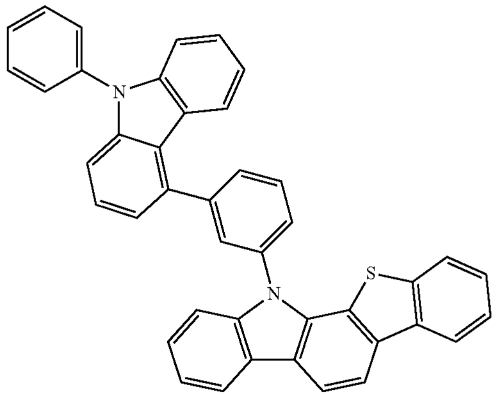
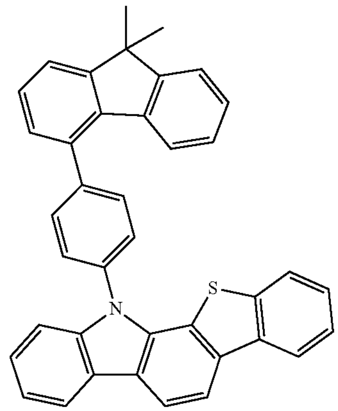
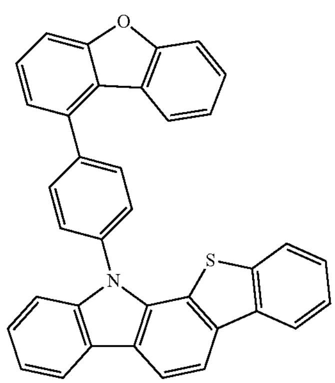
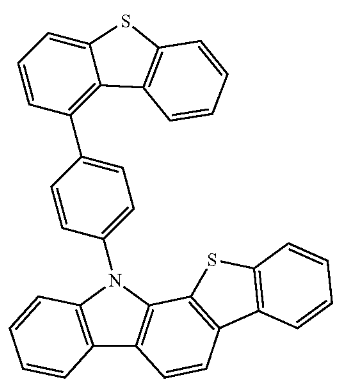
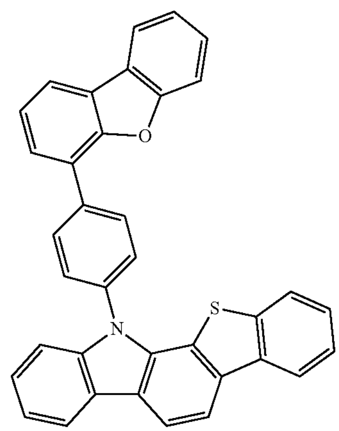
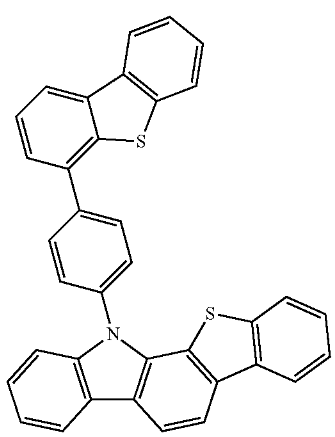
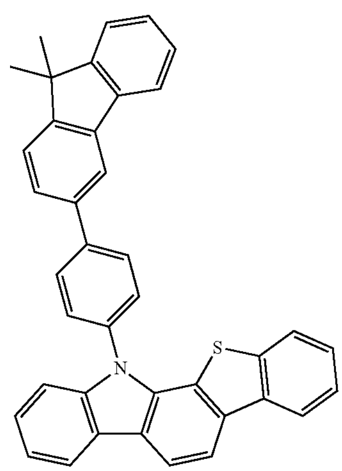
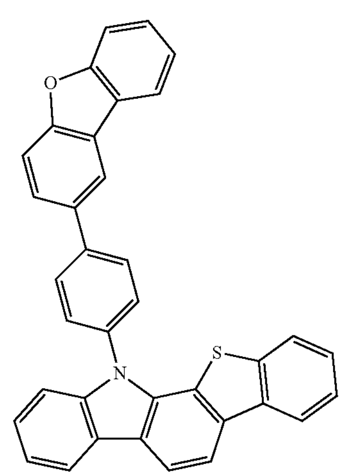

-continued
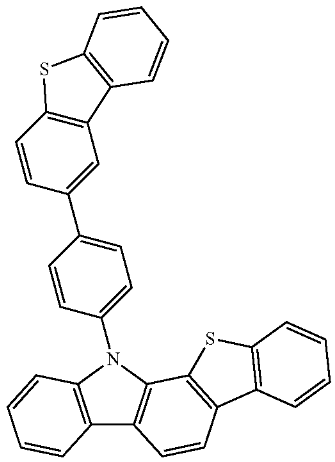
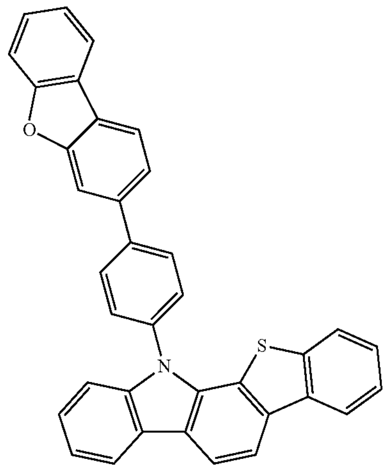
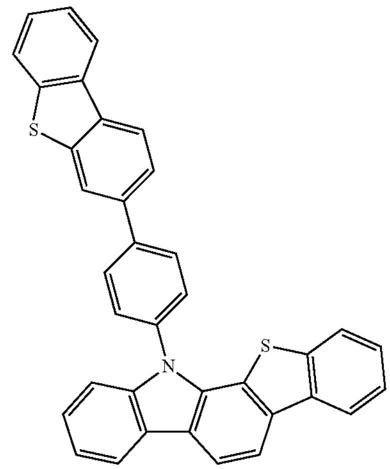
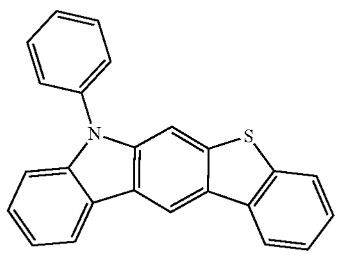
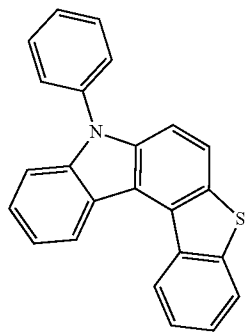
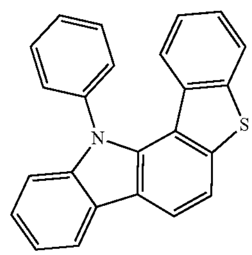
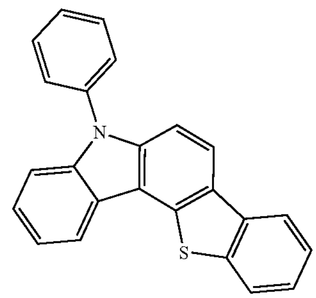
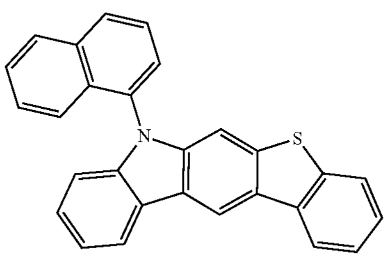
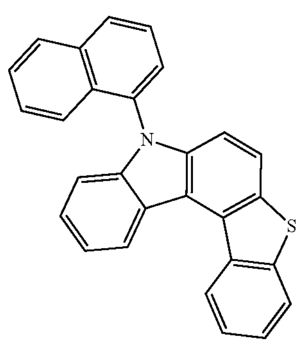
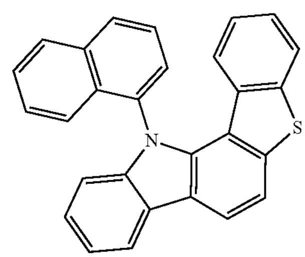
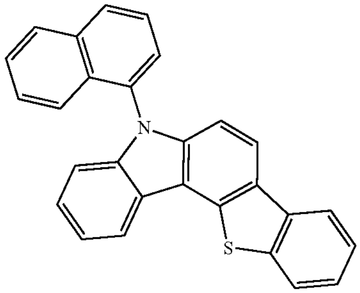
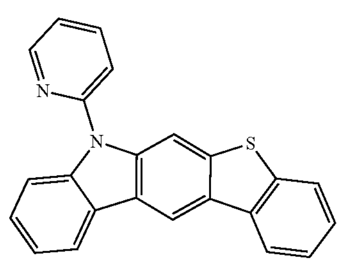
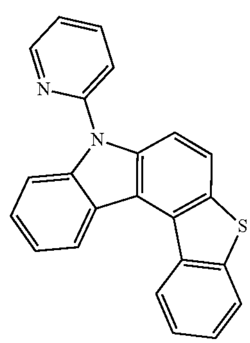

-continued
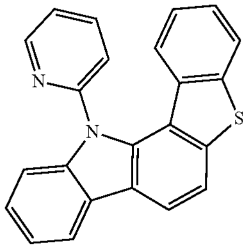
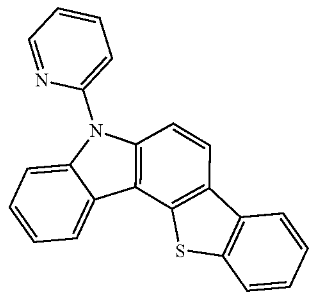
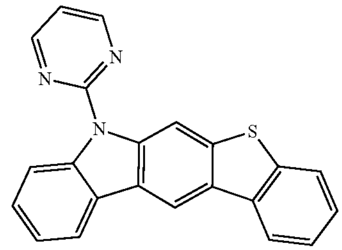
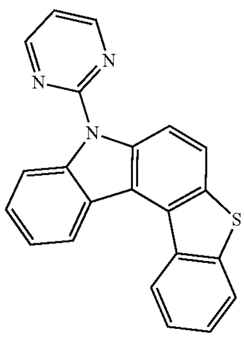
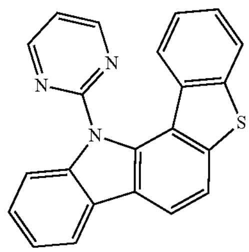
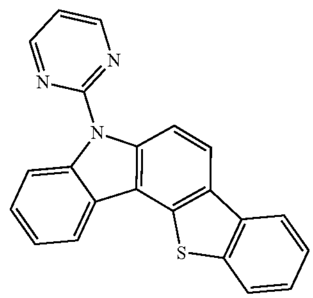
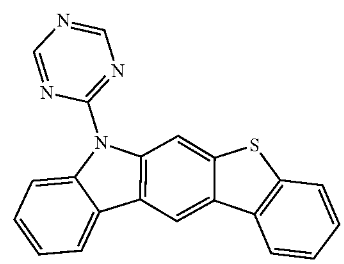
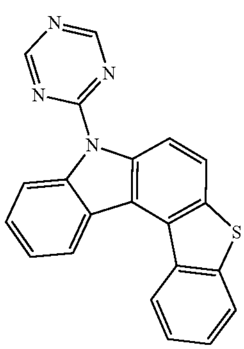
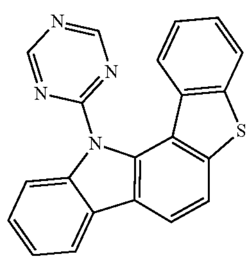
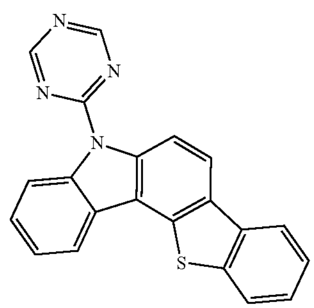
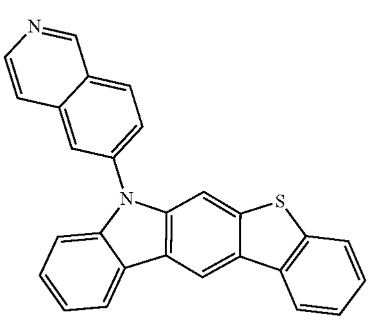
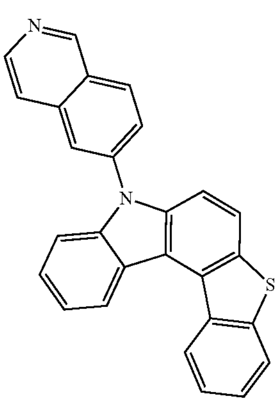
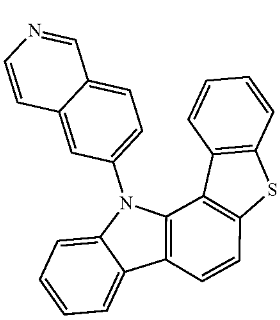

-continued
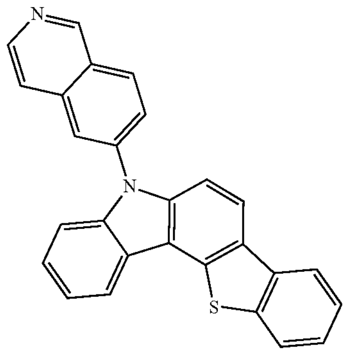
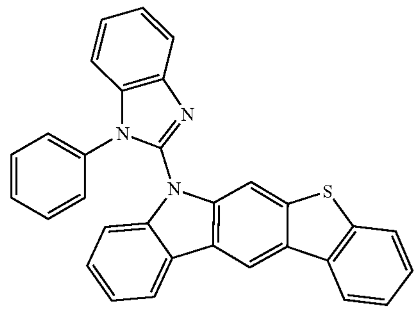
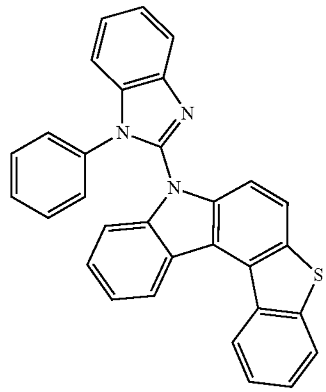
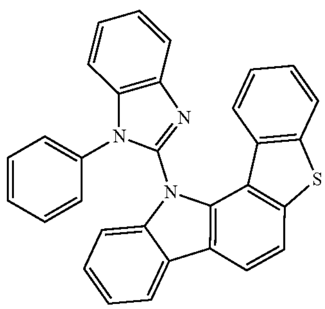
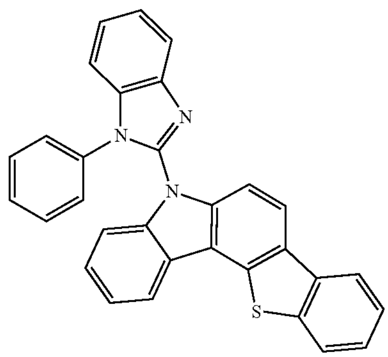
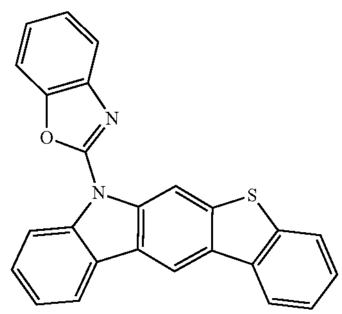
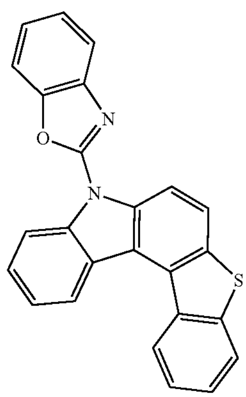
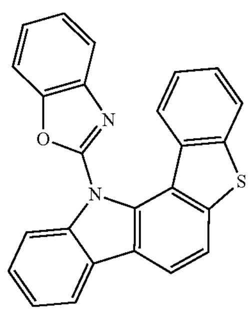
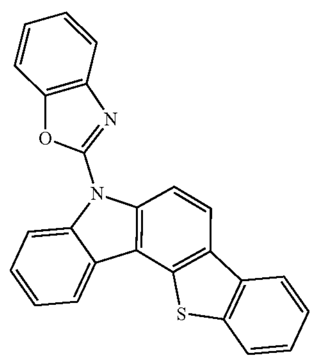
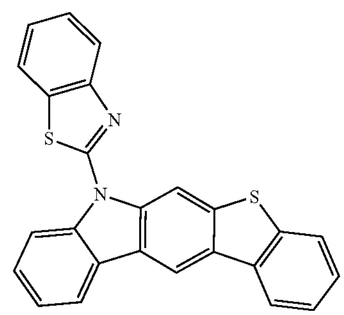
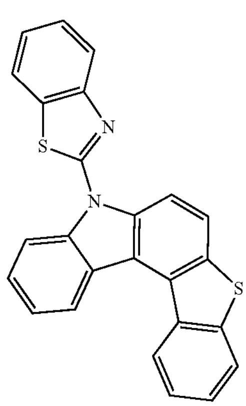
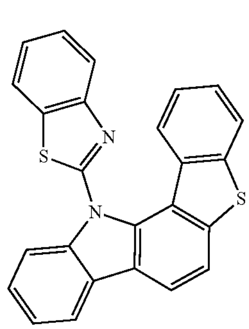
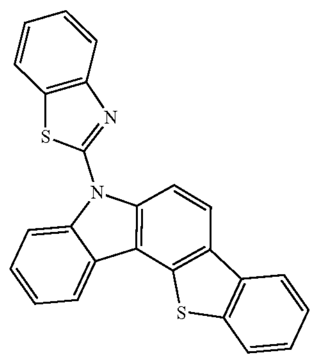

-continued
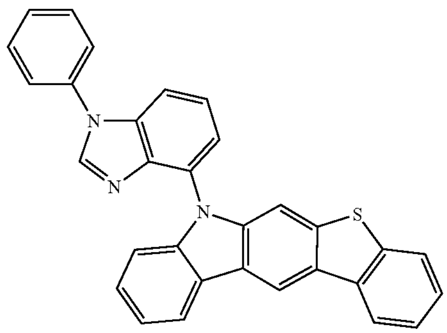
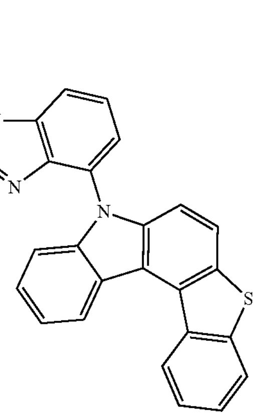
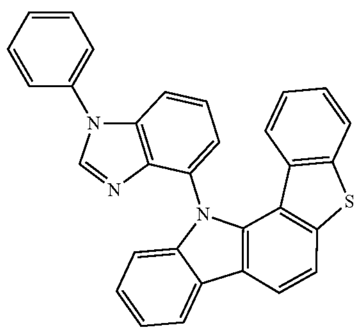
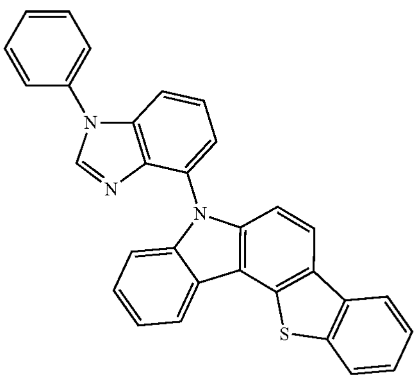
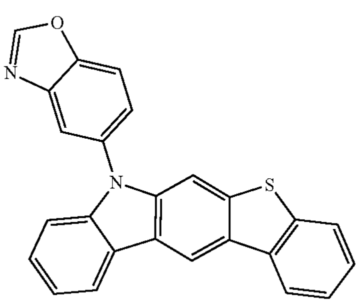
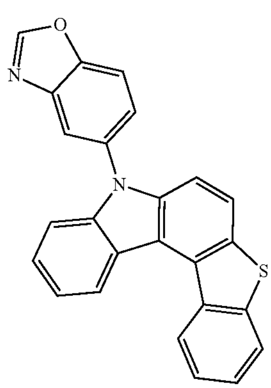
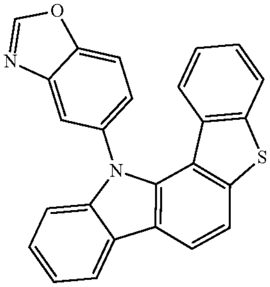
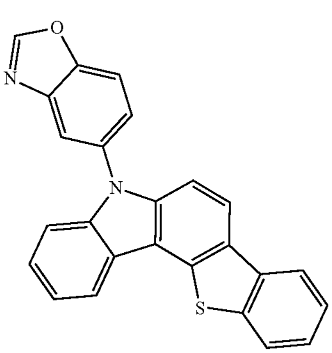
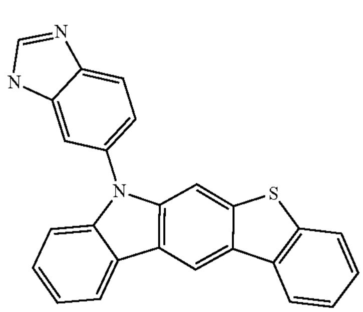
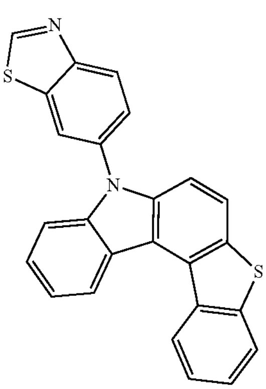
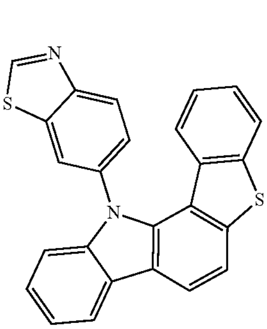

-continued
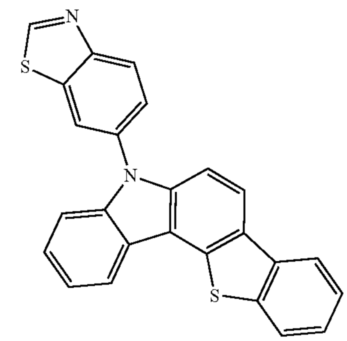
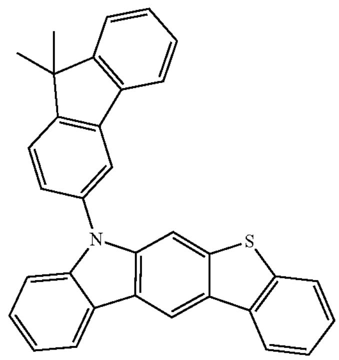
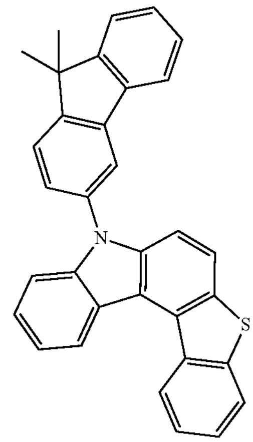
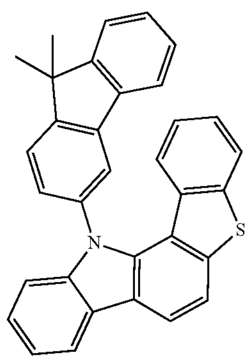
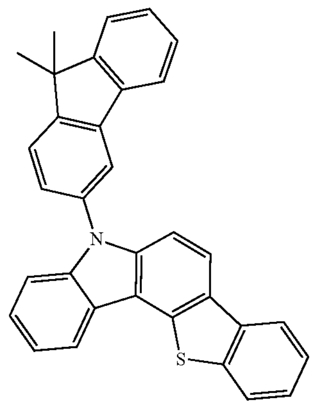
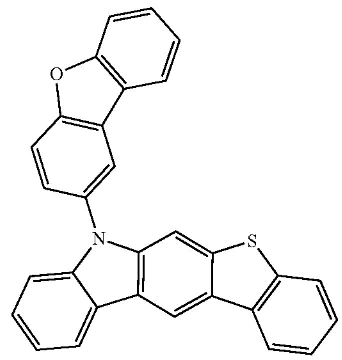
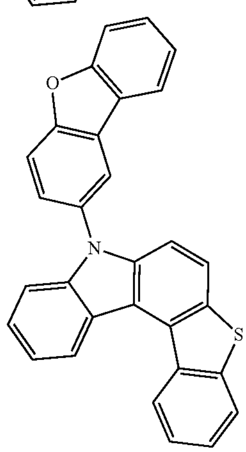
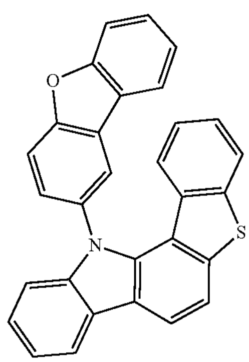
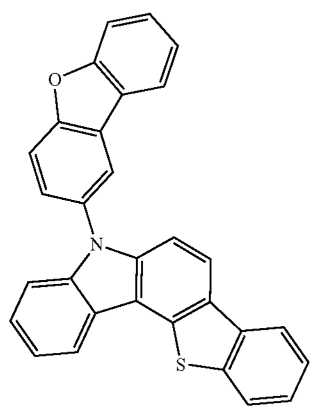
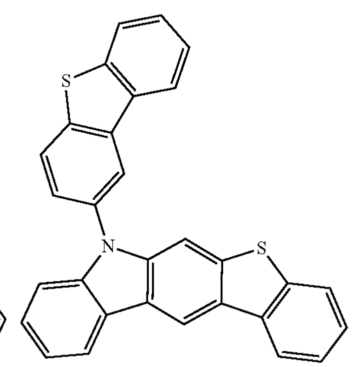
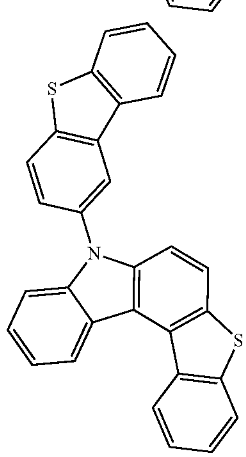
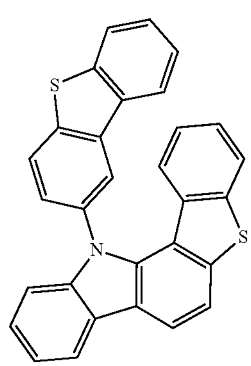
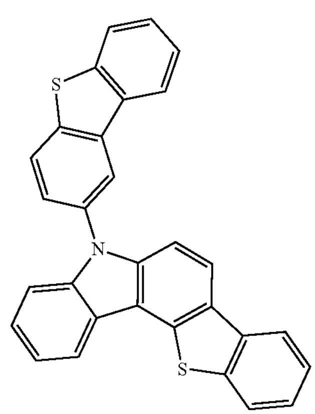
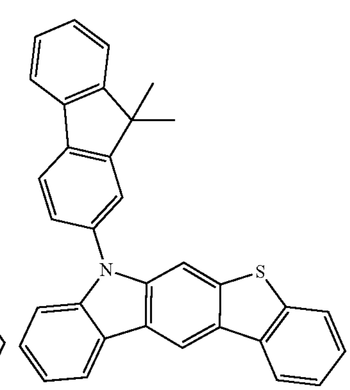

-continued
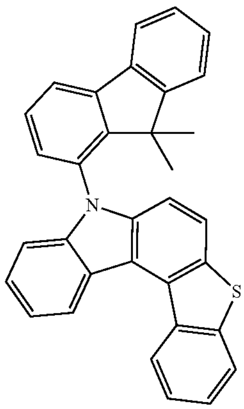
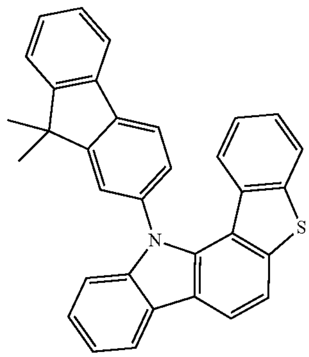
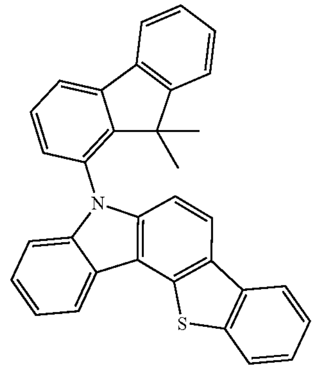
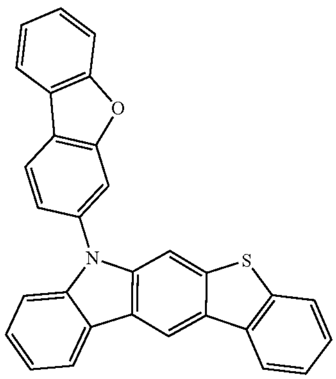
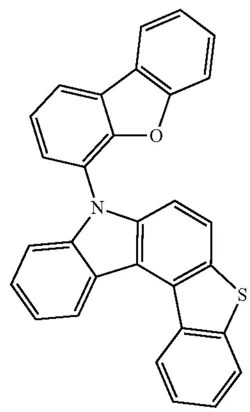
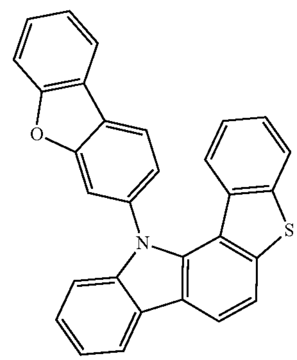
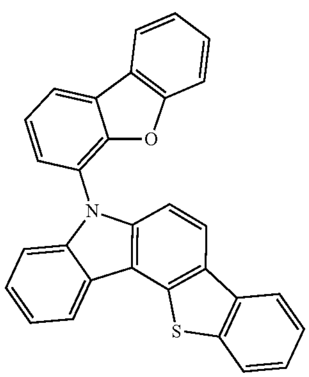
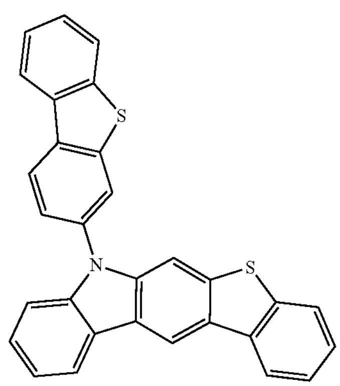
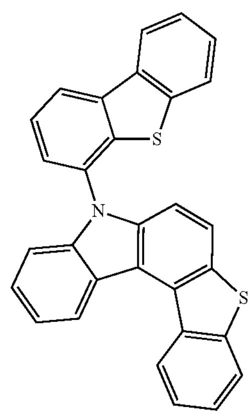
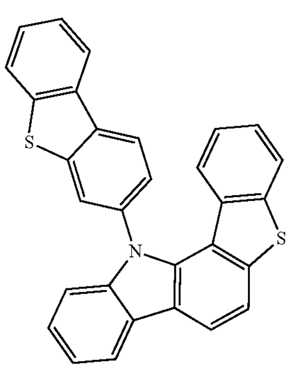
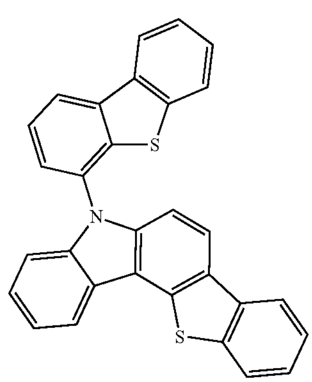
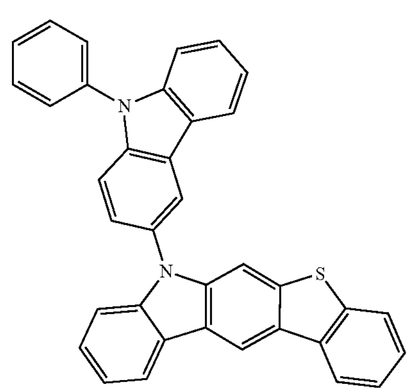

-continued
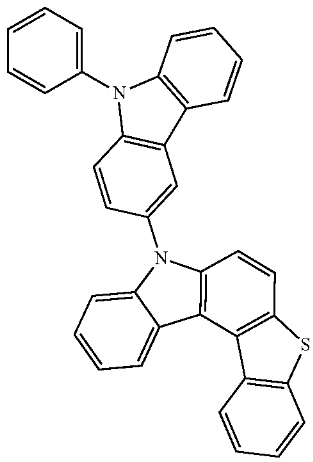
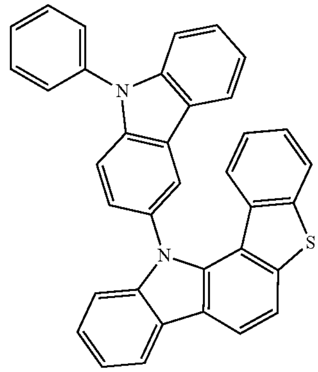
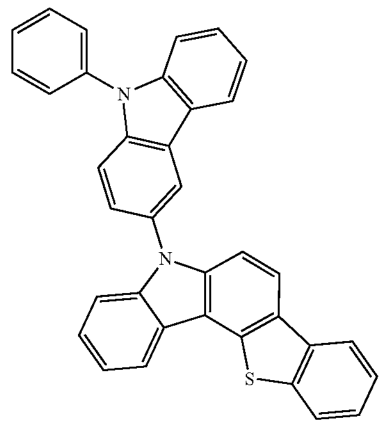
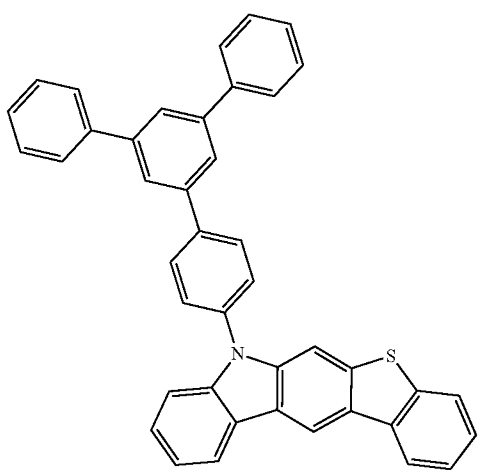
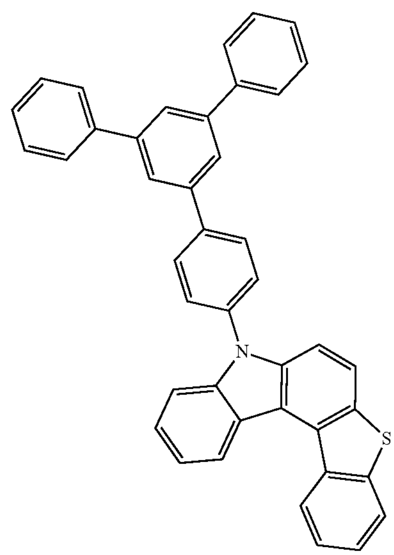
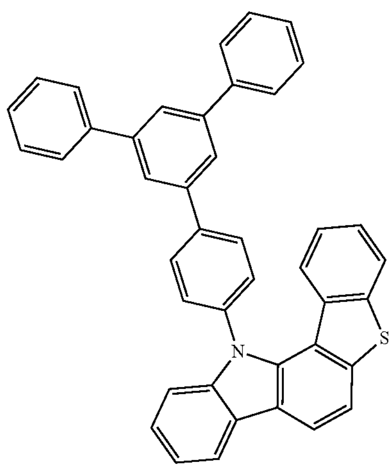
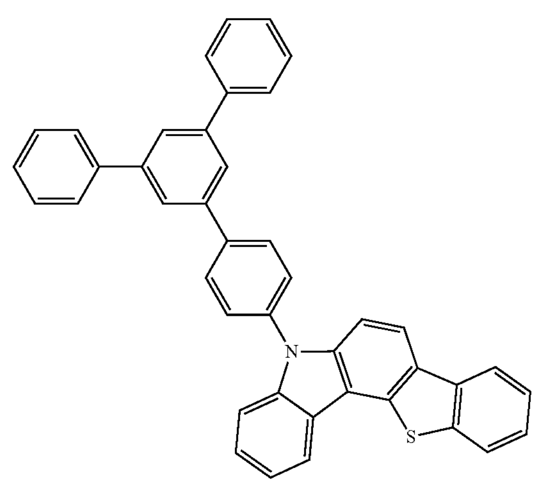

-continued
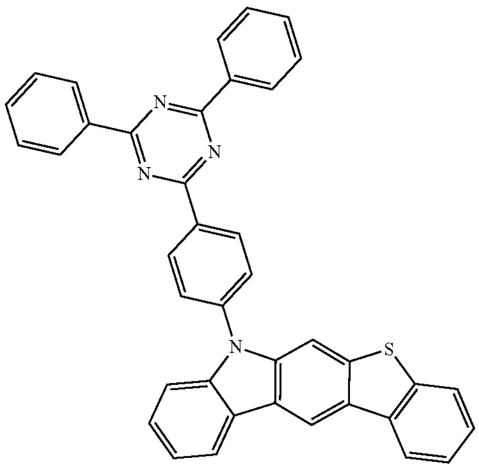
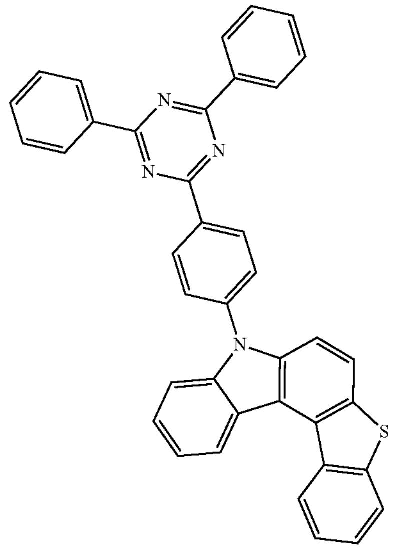
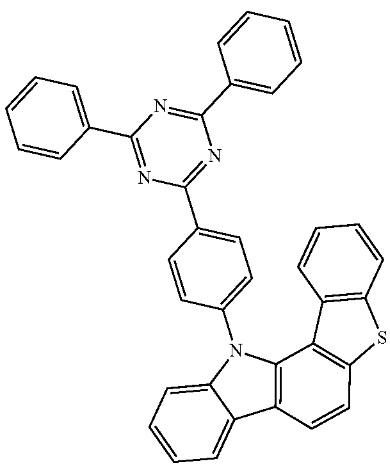
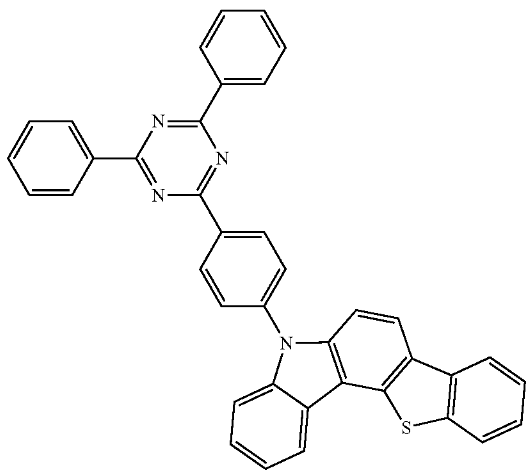
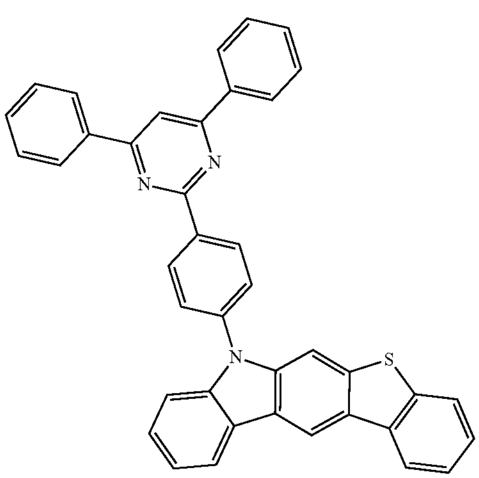
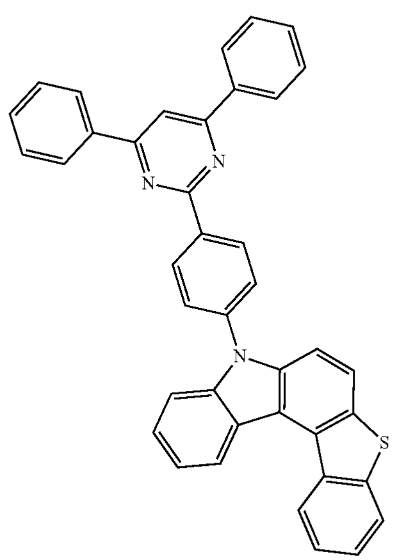

-continued
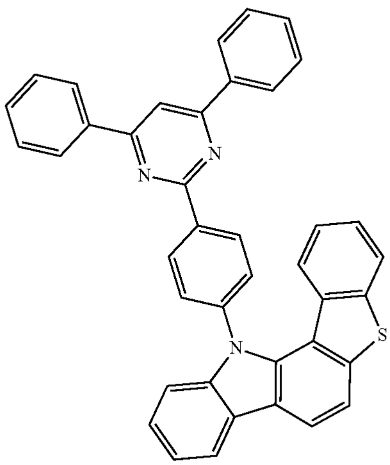
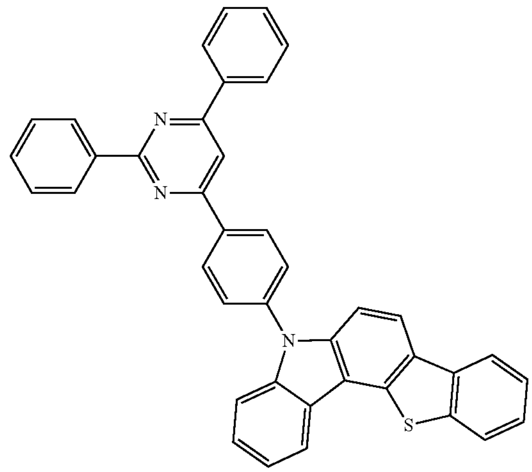
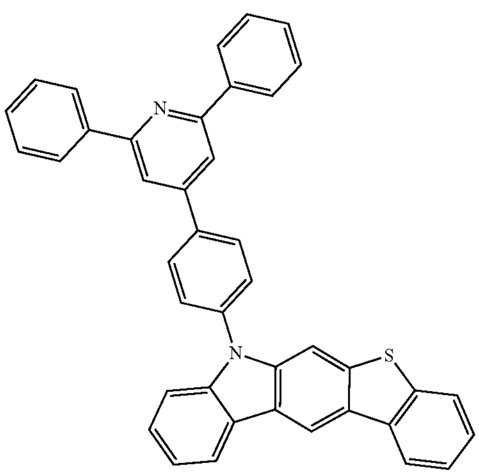
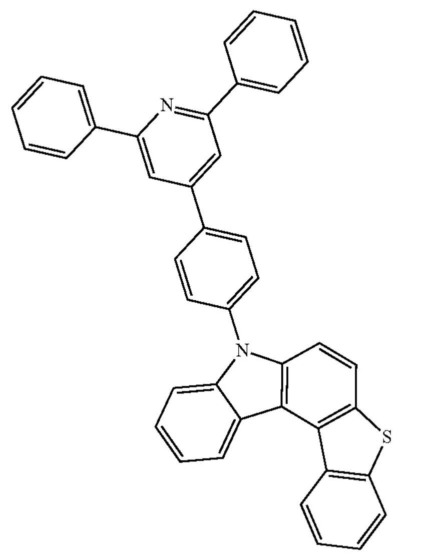
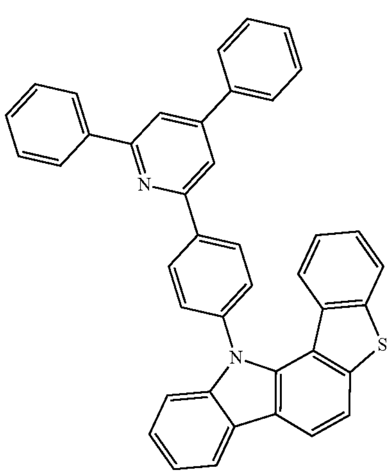
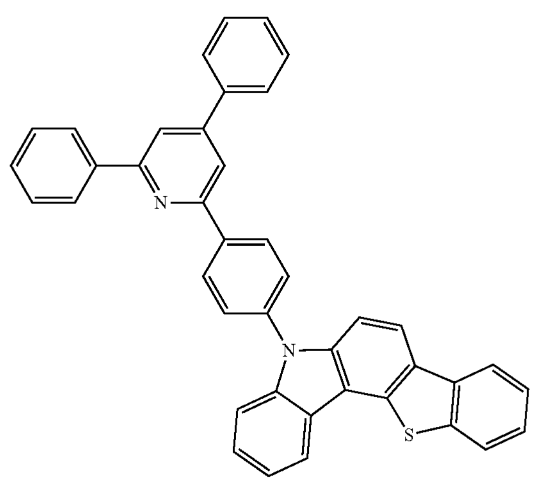

-continued
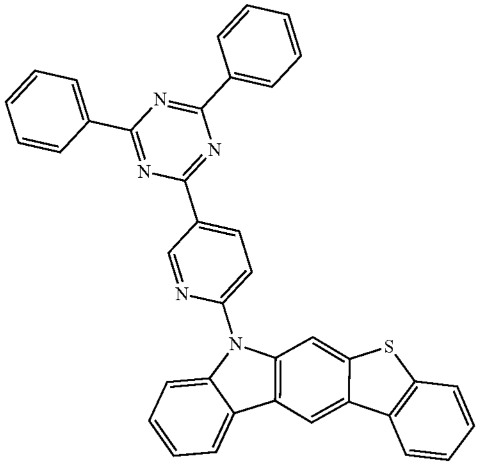
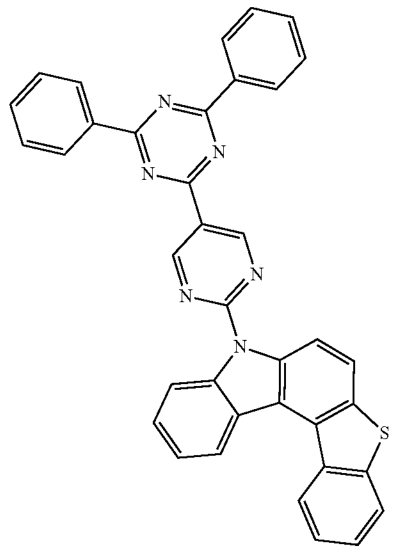
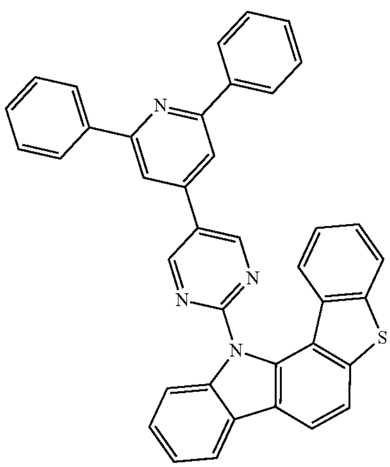
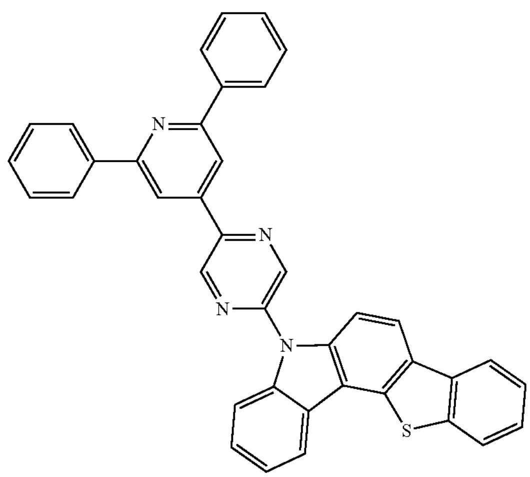
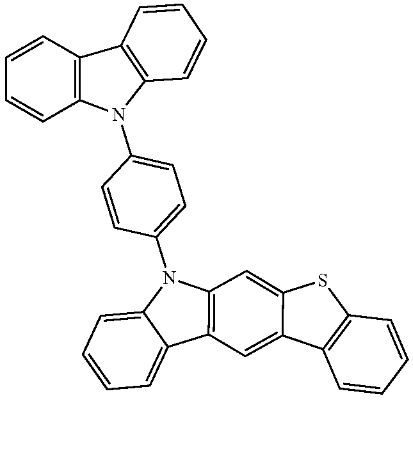
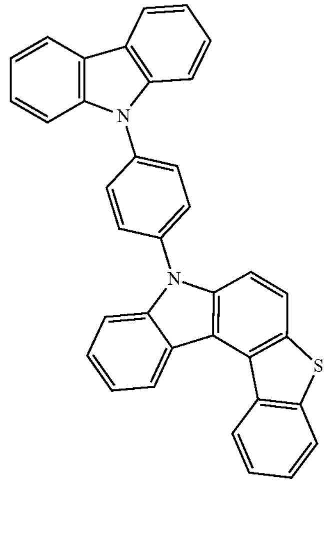
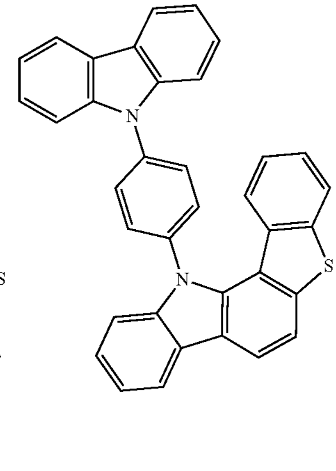

-continued
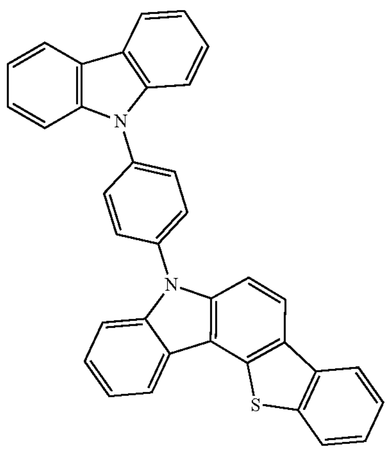
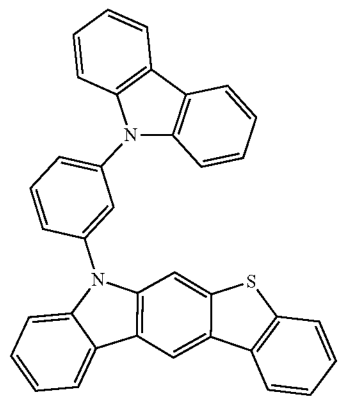
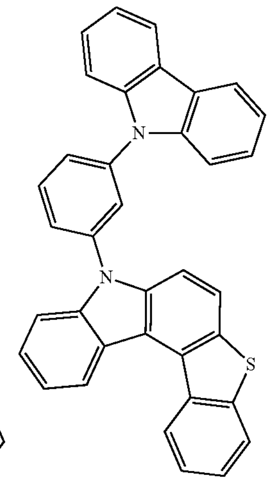
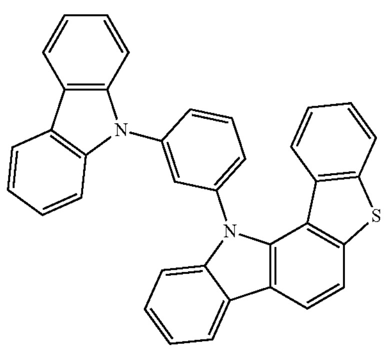
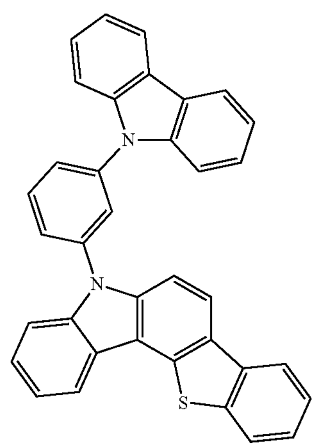
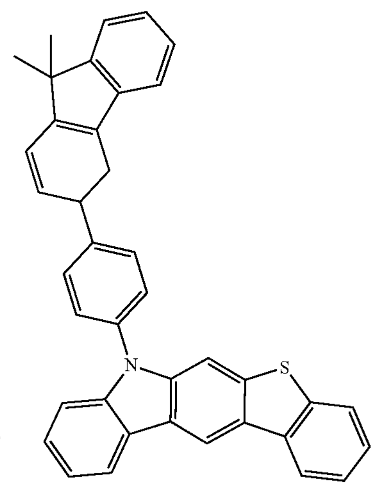
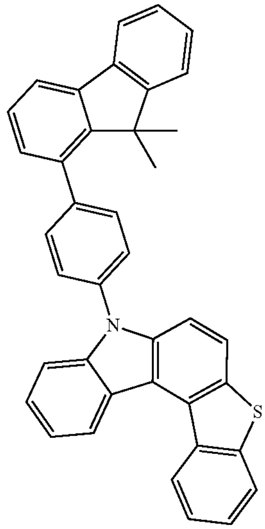
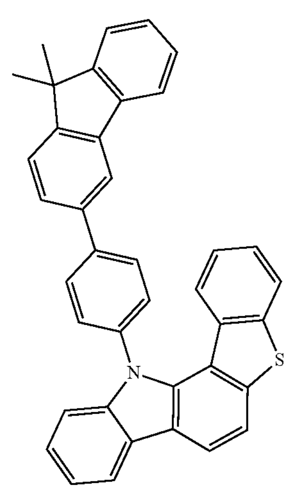
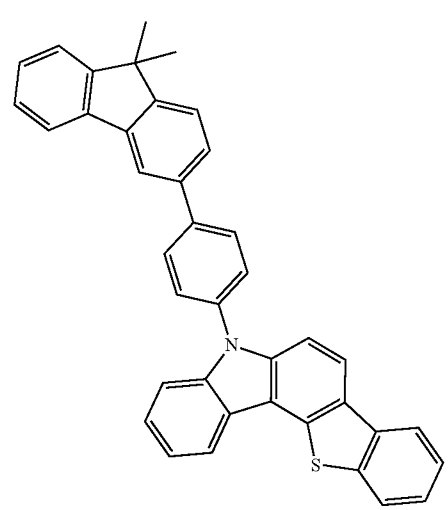

-continued
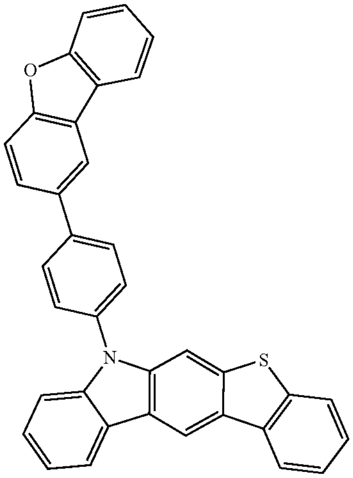
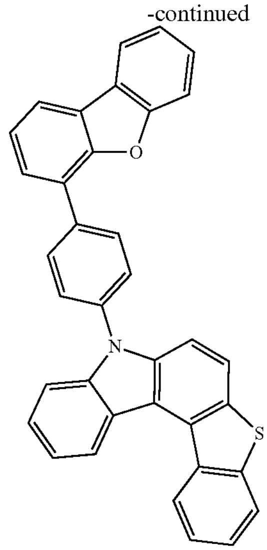
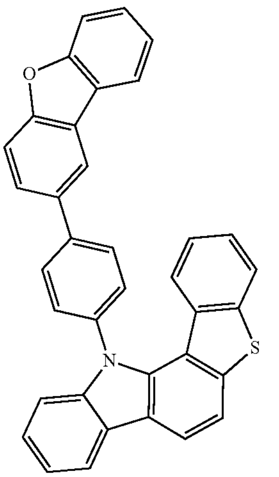
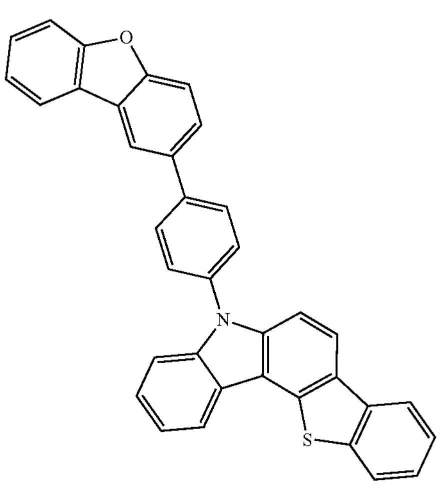
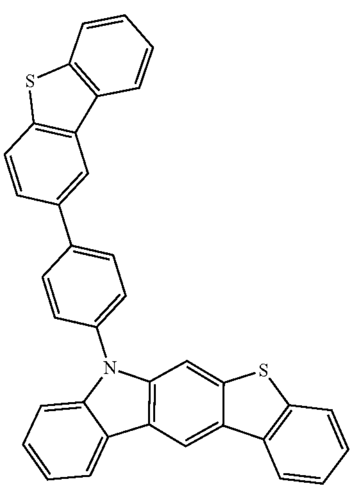
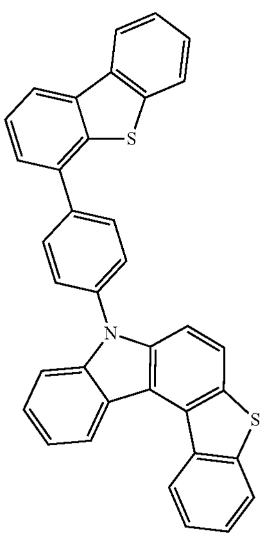
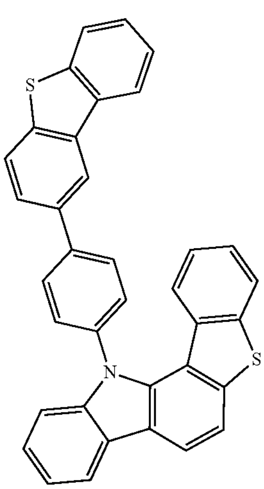
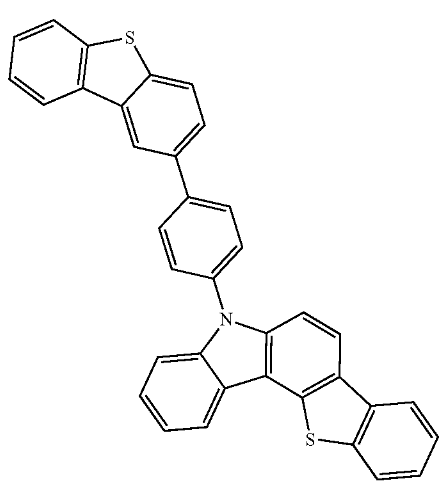
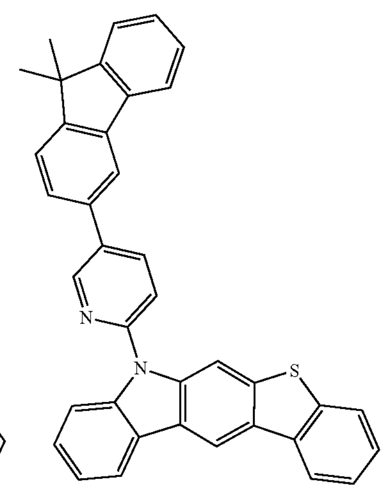

-continued
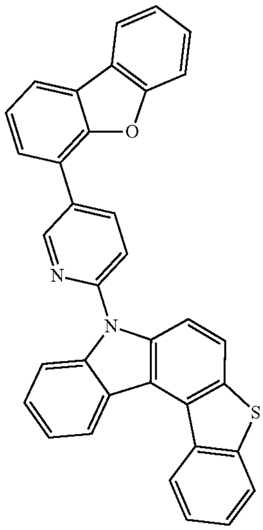
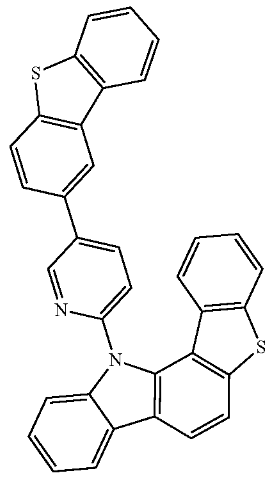
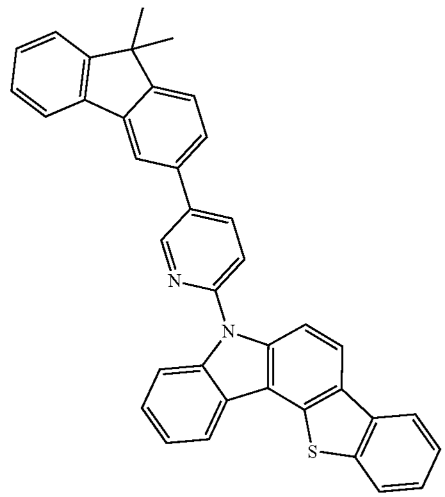
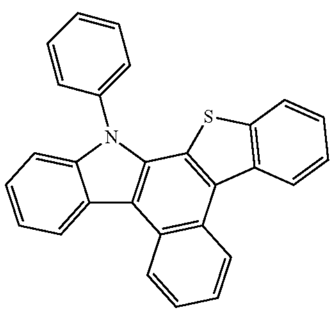
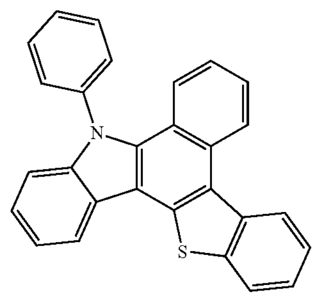
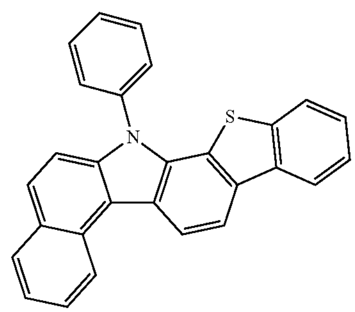
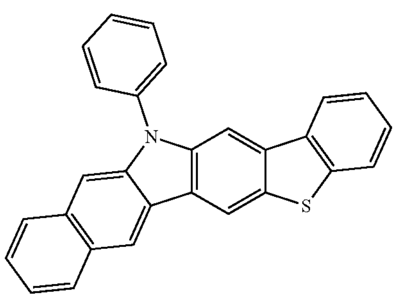
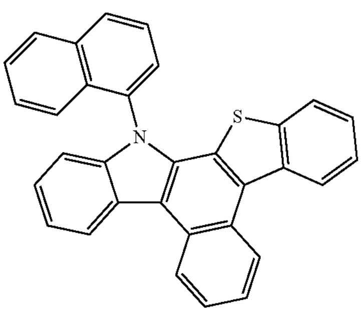
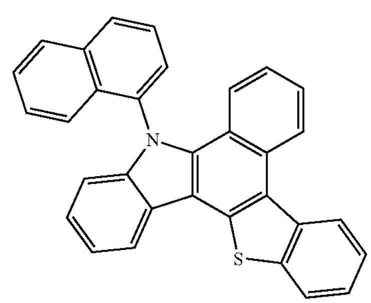
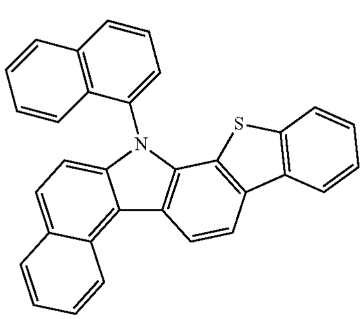
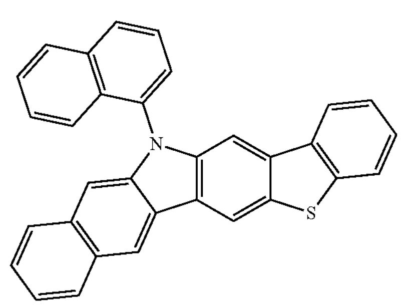
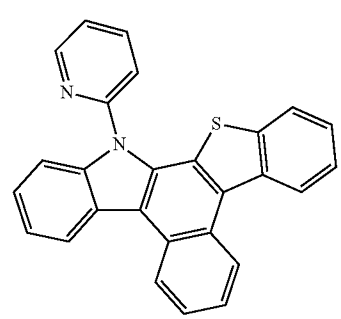

-continued
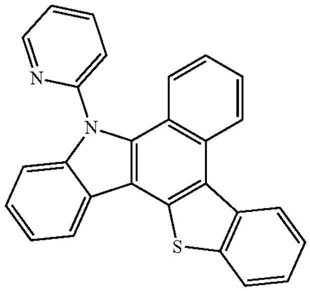
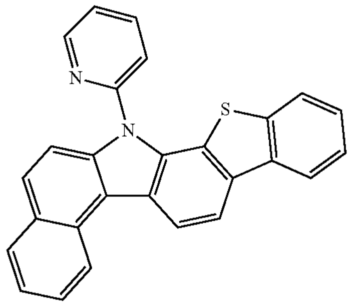
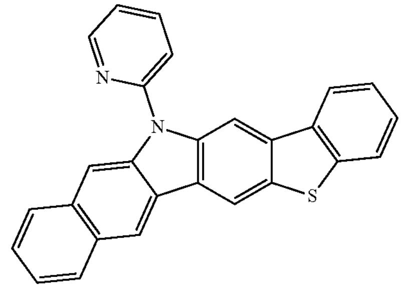
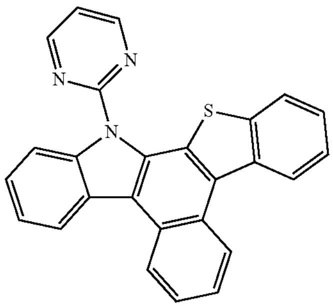
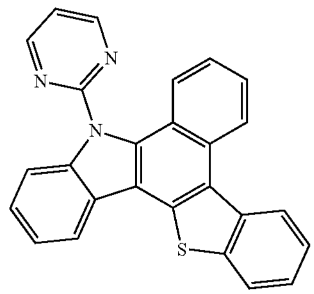
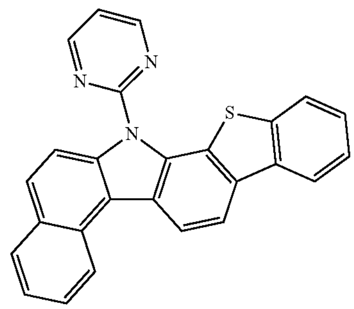
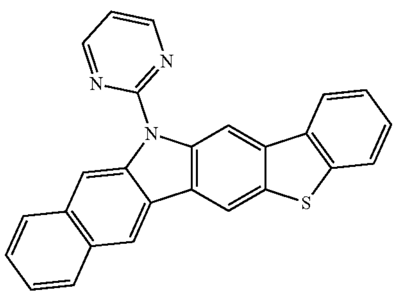
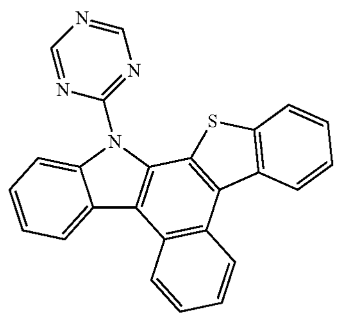
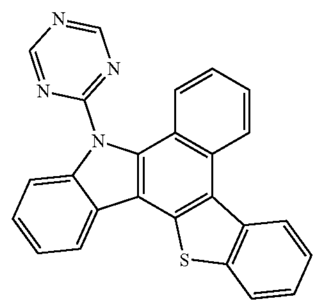
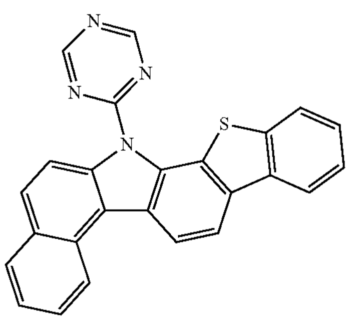
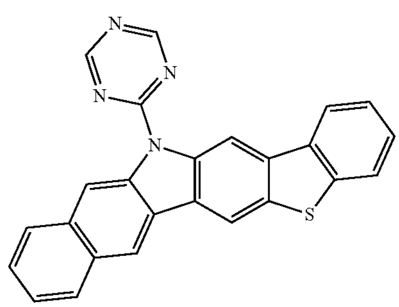
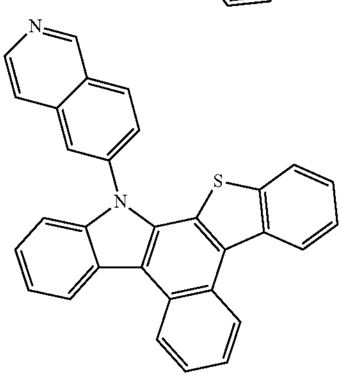
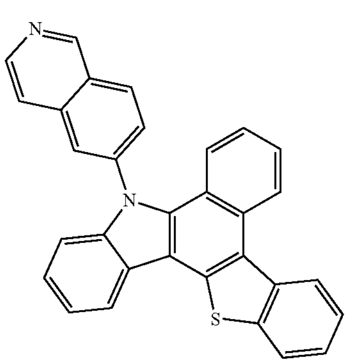
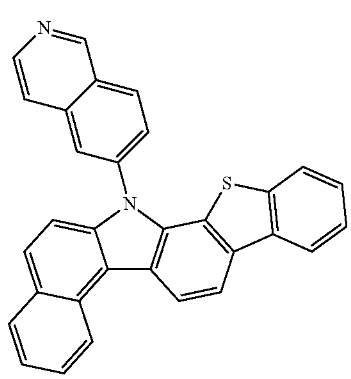
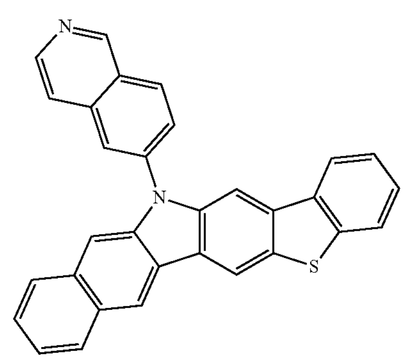

-continued
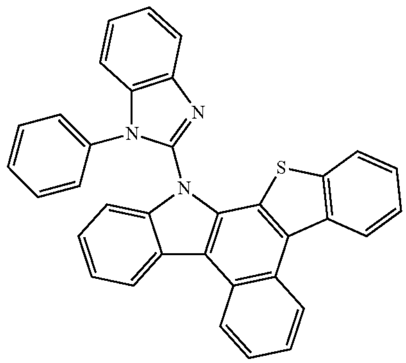
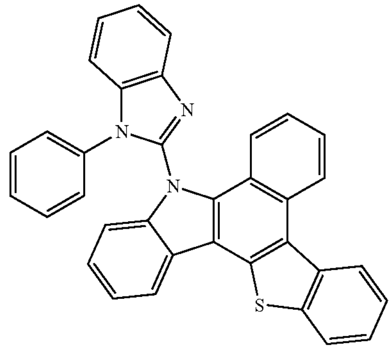
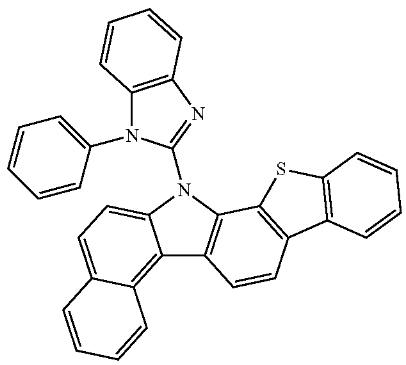
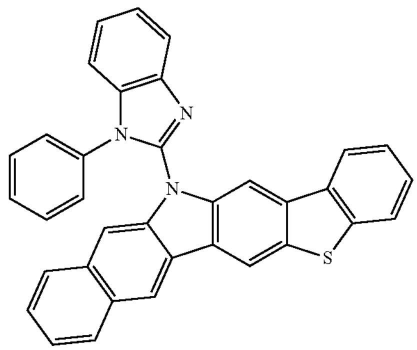
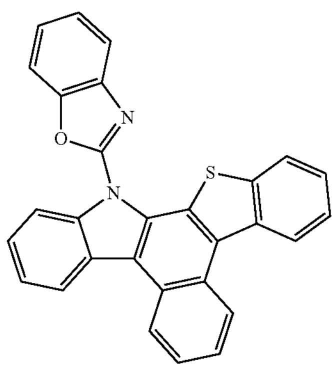
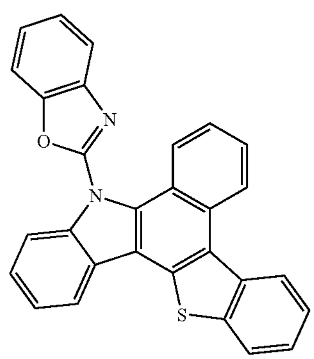
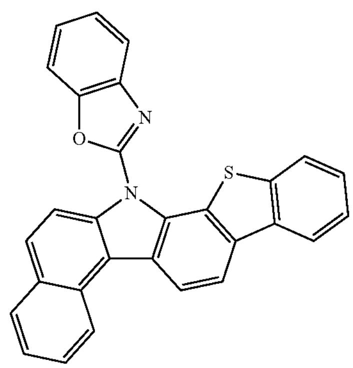
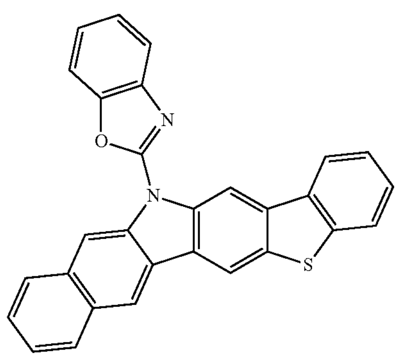
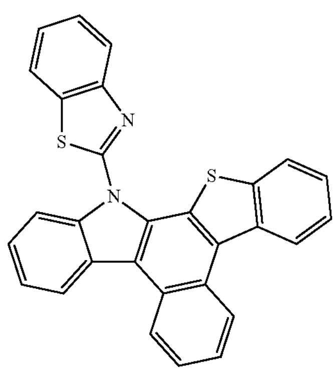
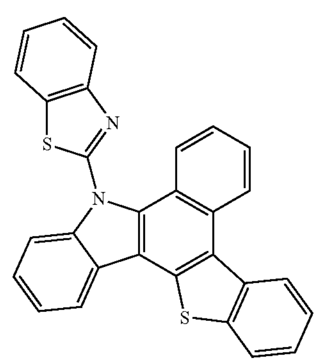

-continued
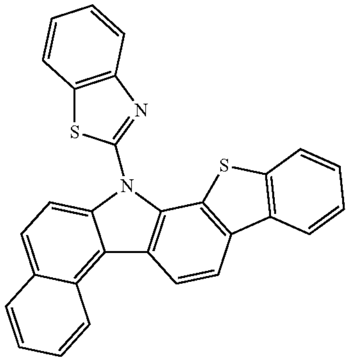
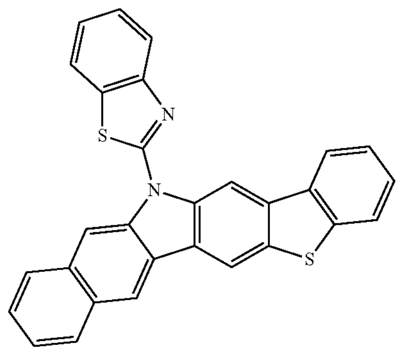
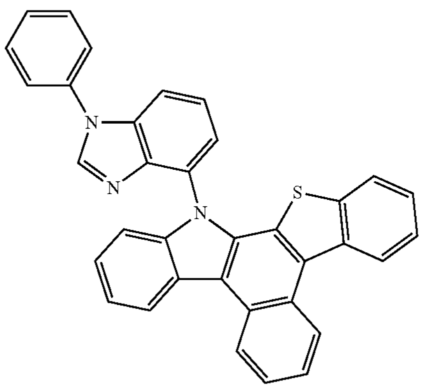
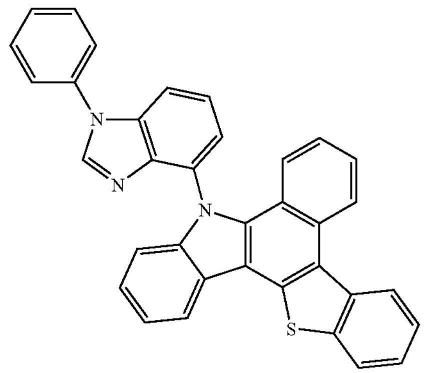
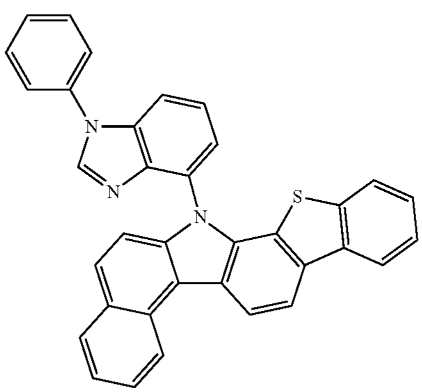
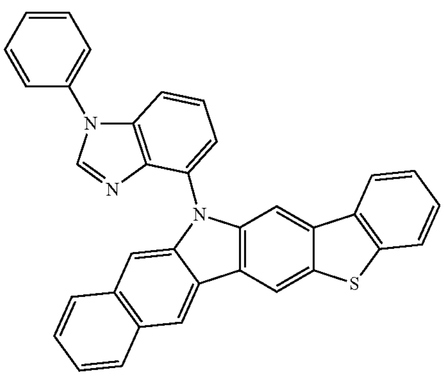
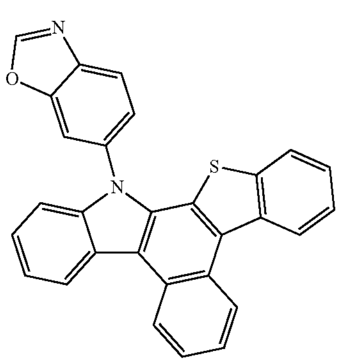
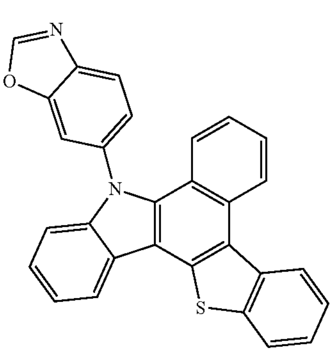
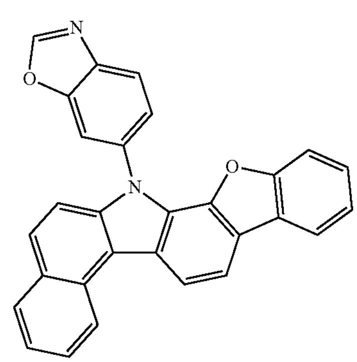

-continued
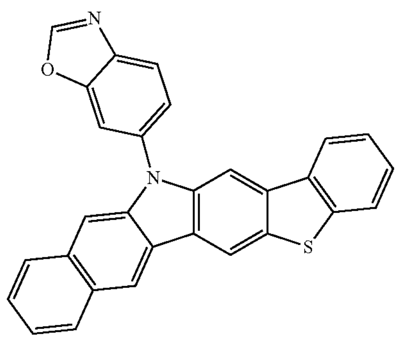
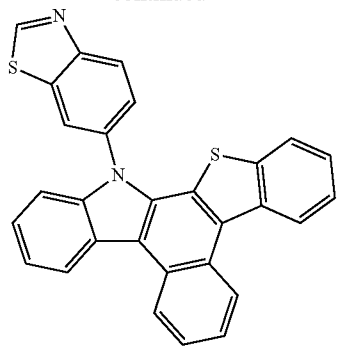
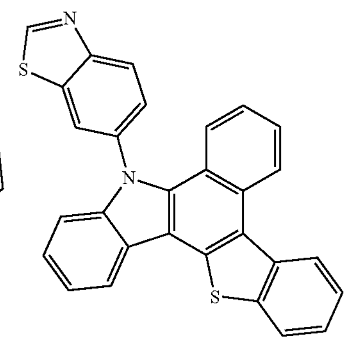
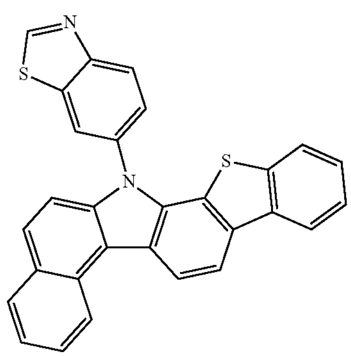
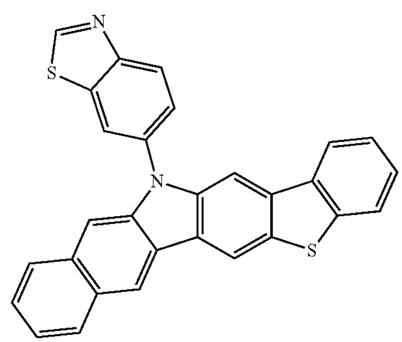
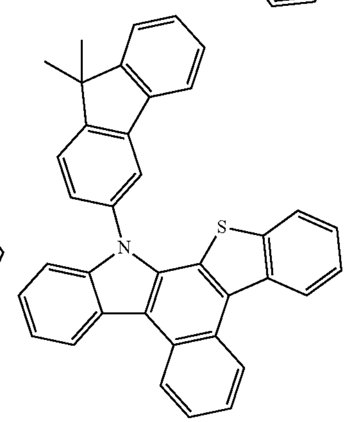
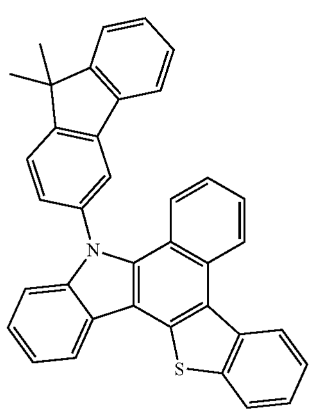
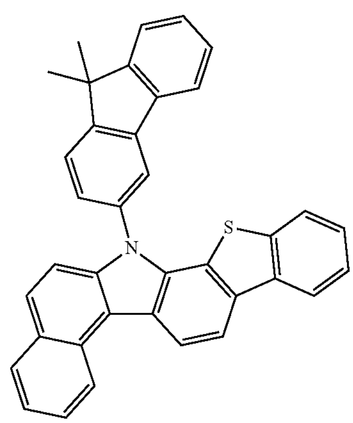
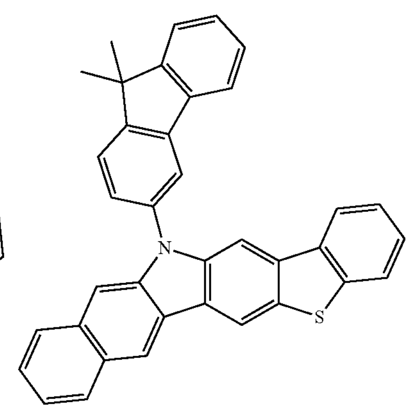
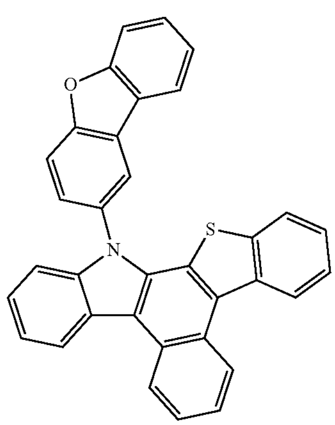
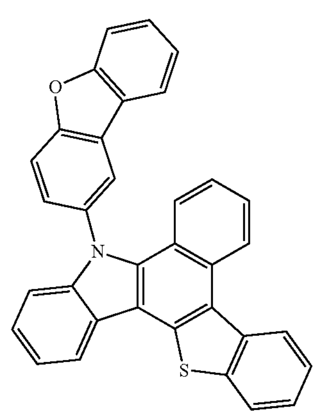
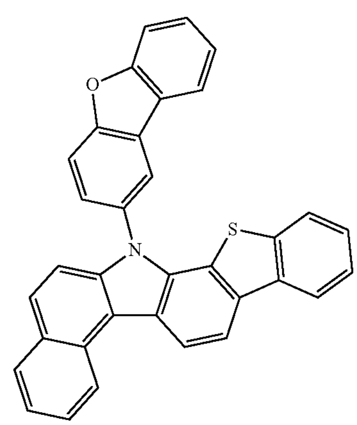

-continued
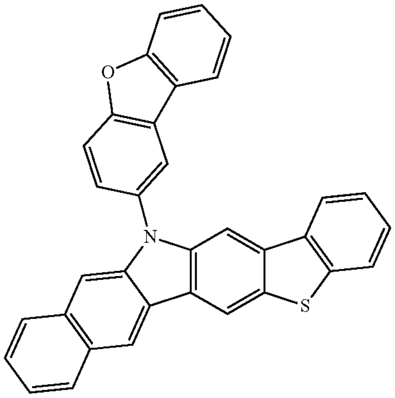
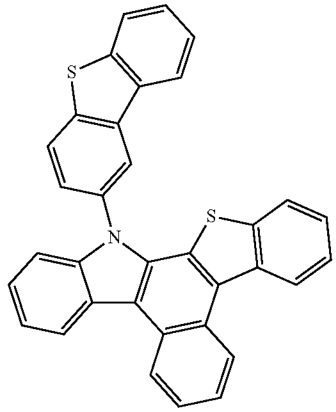
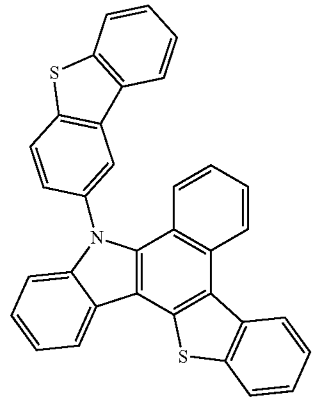
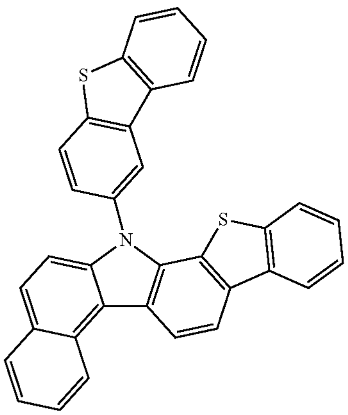
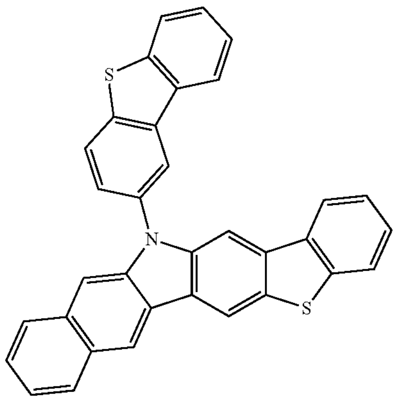
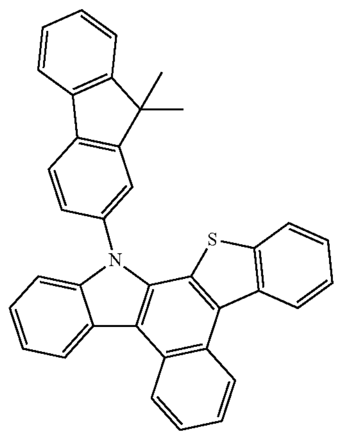
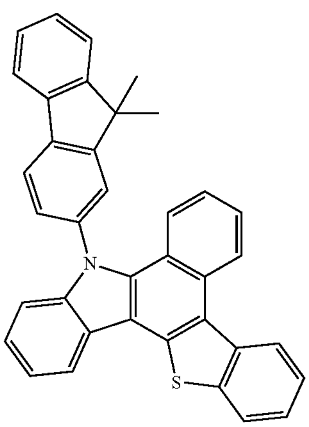
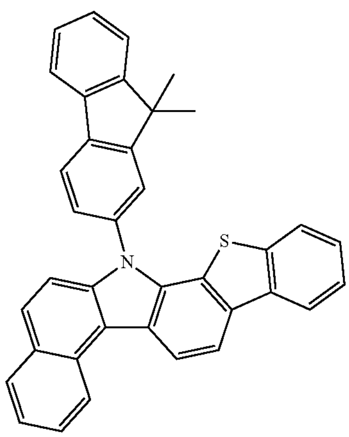
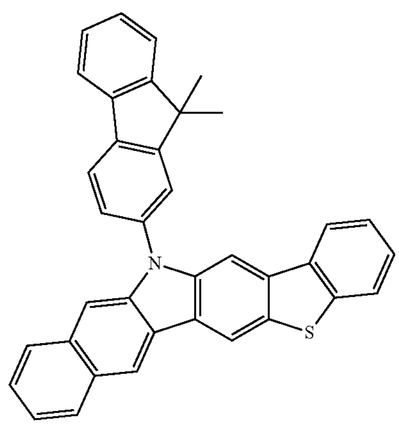
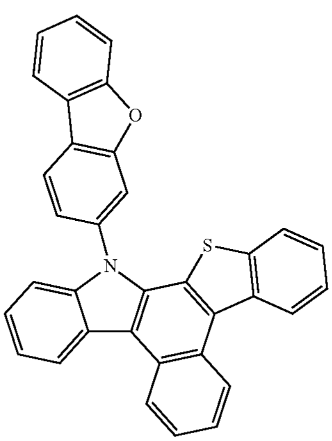
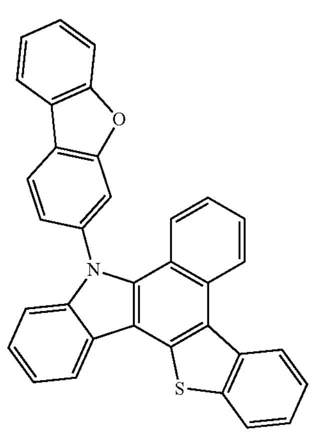
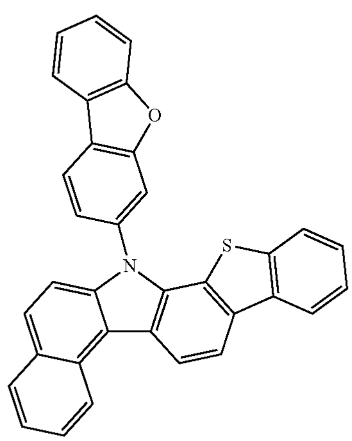

-continued
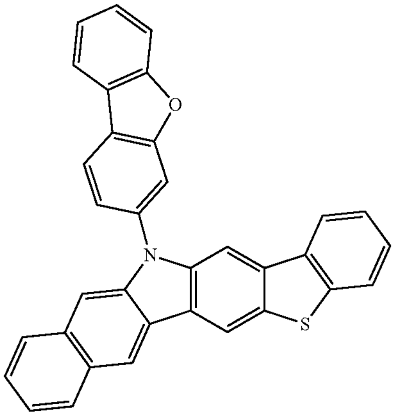
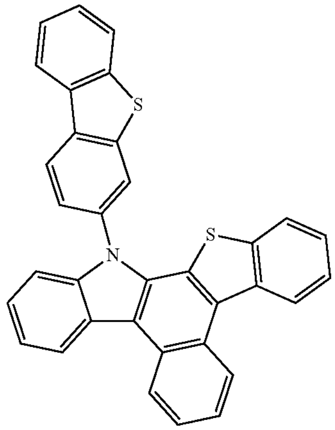
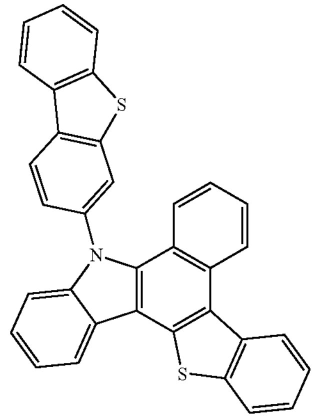
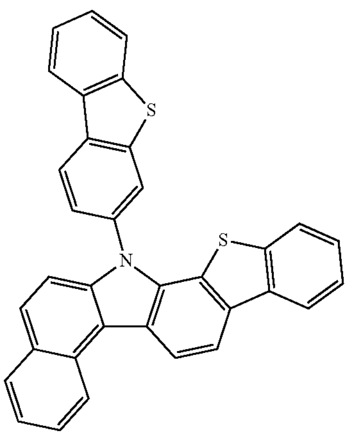
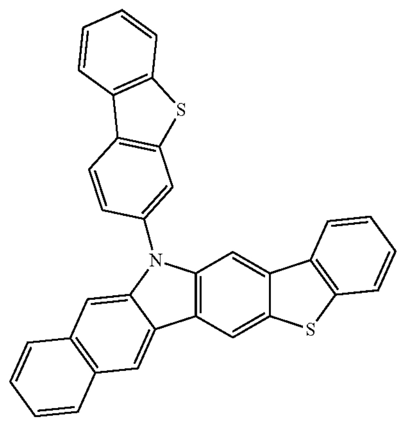
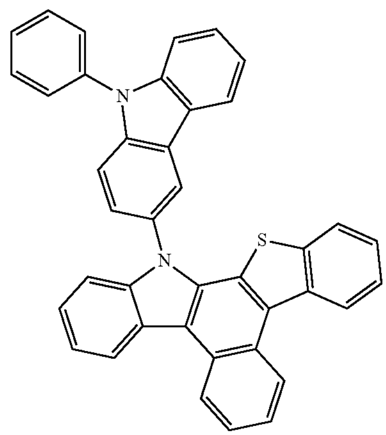
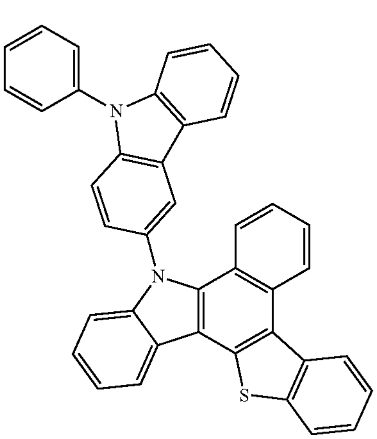
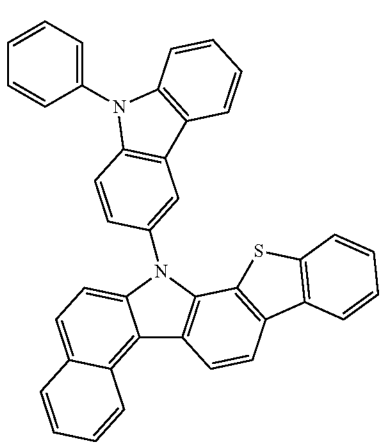

-continued
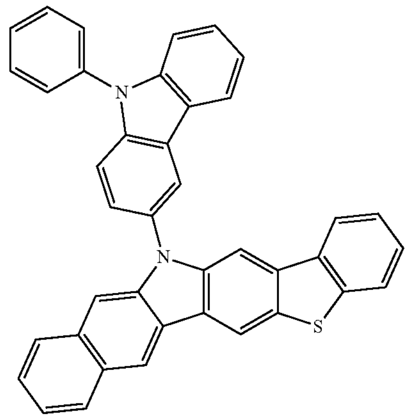
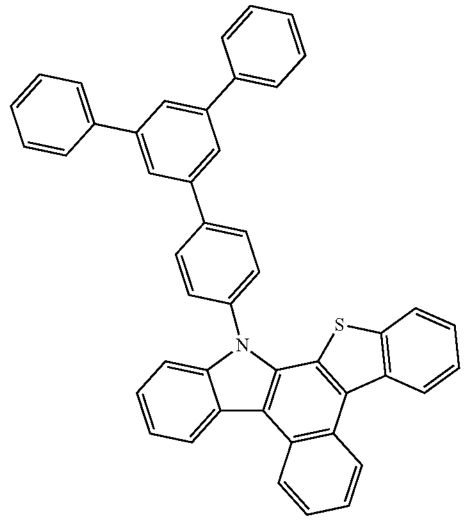
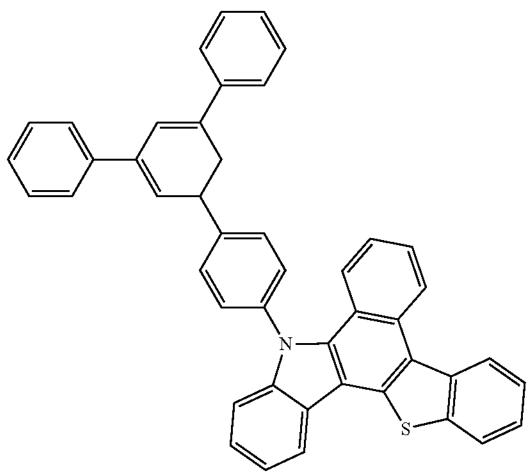
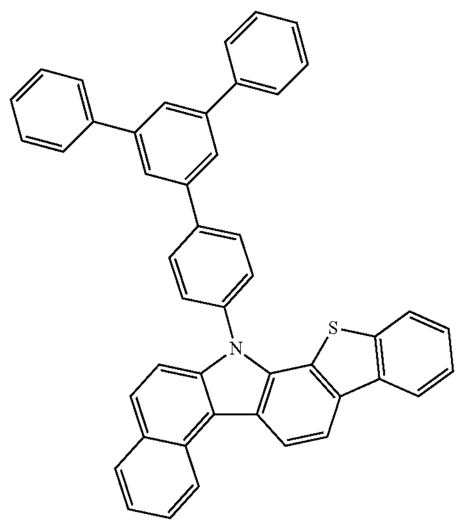
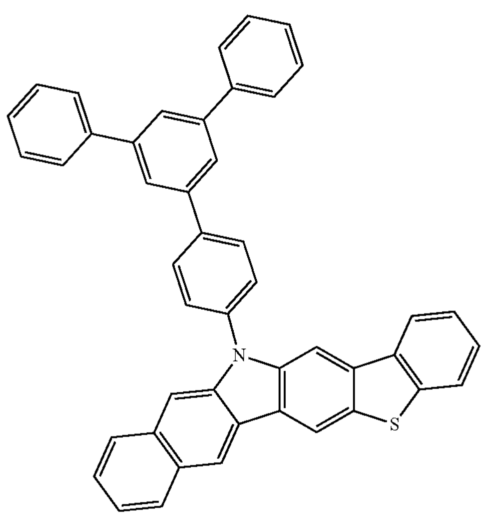
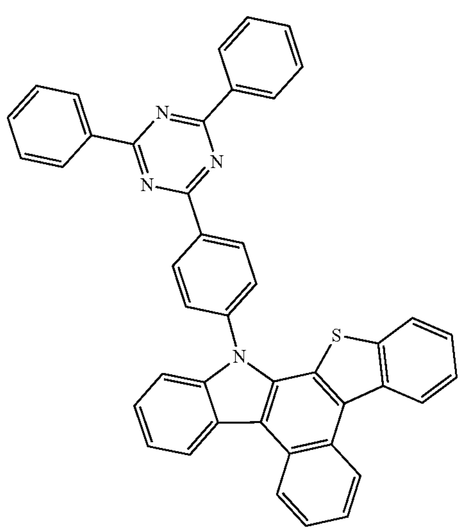

-continued
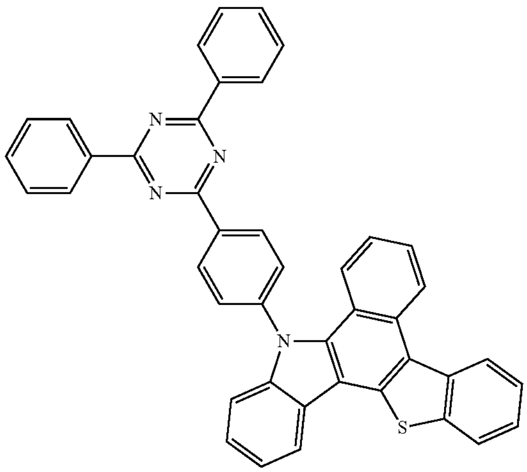
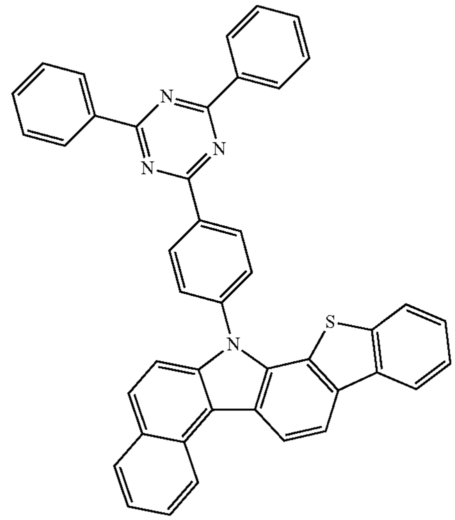
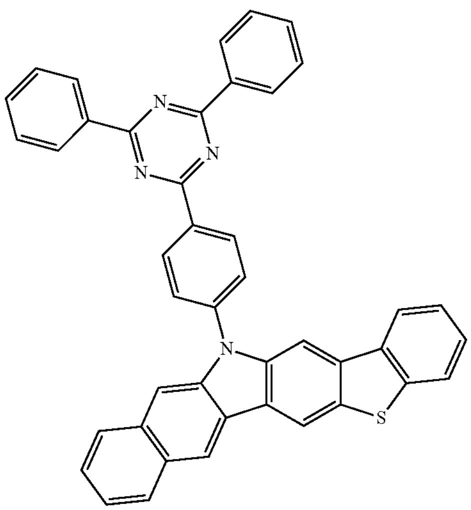
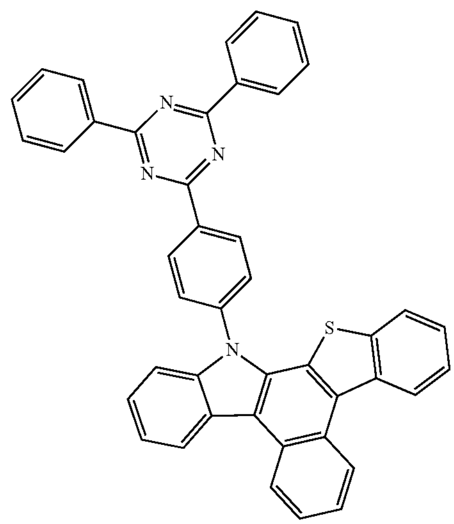
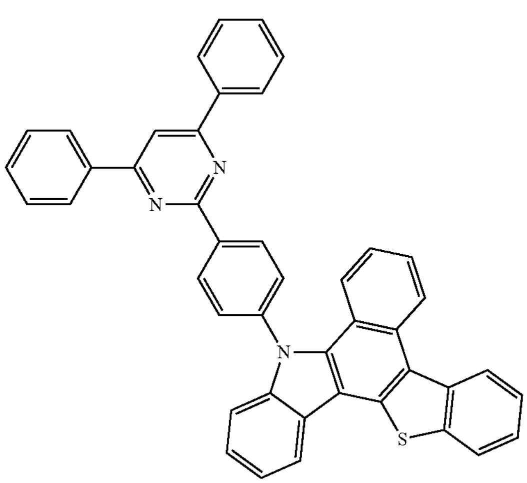
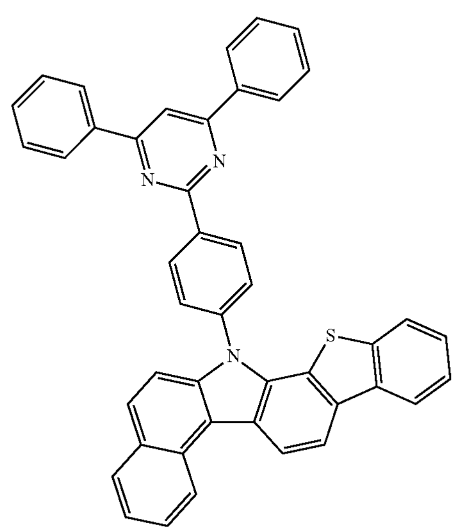

-continued
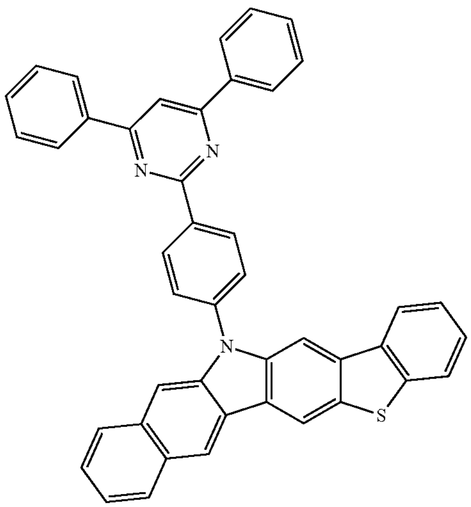
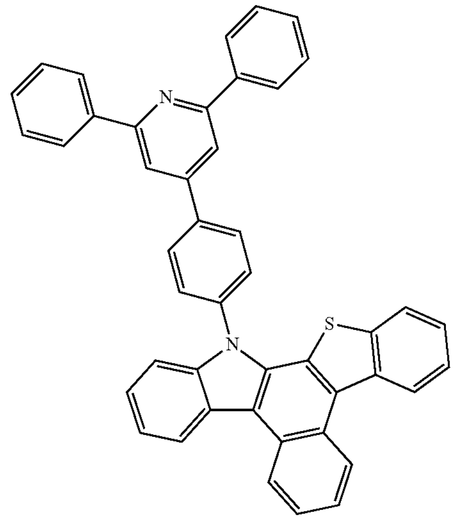
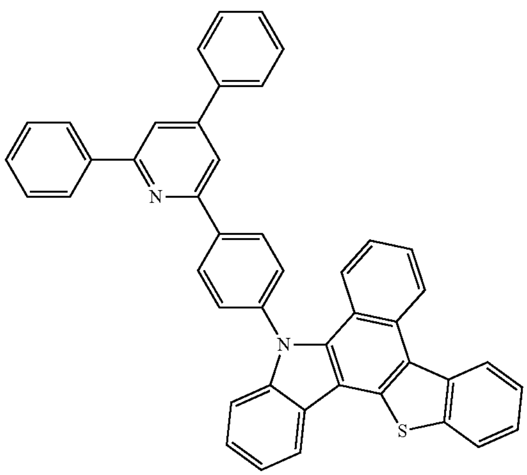
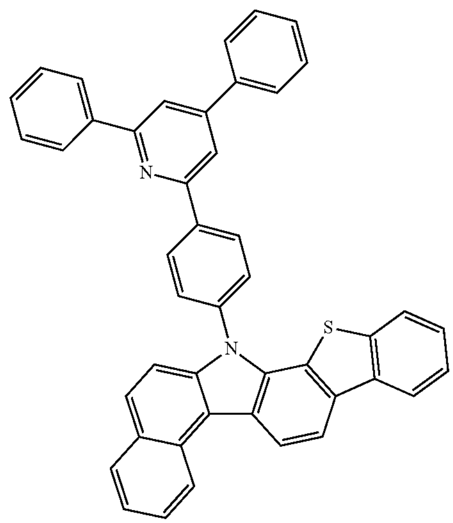
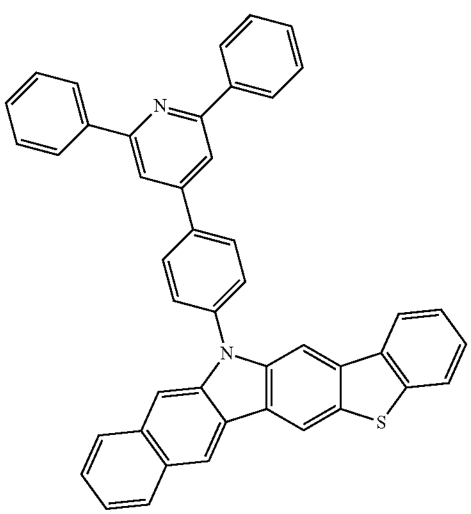
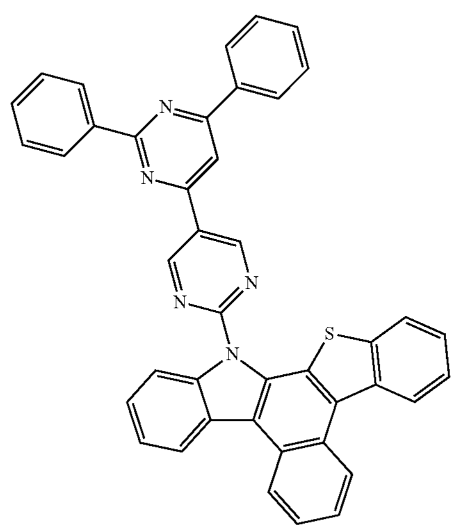

-continued
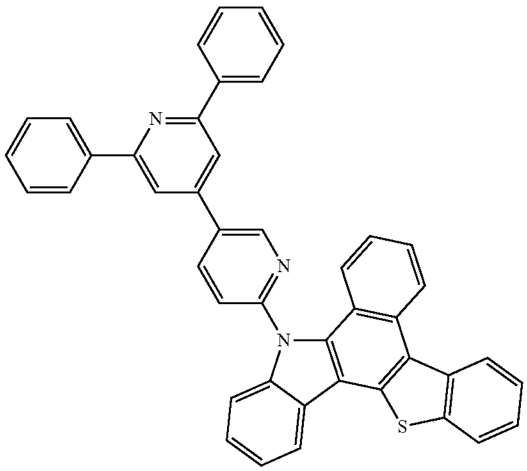
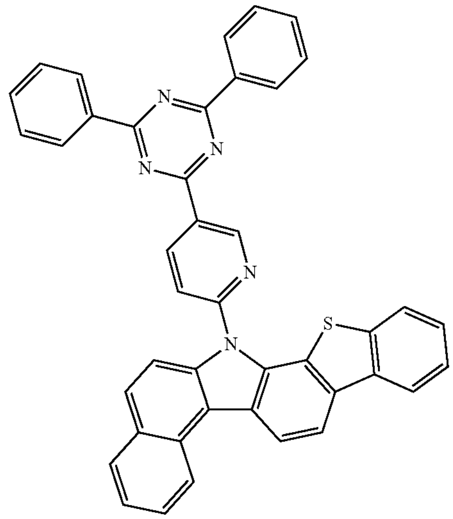
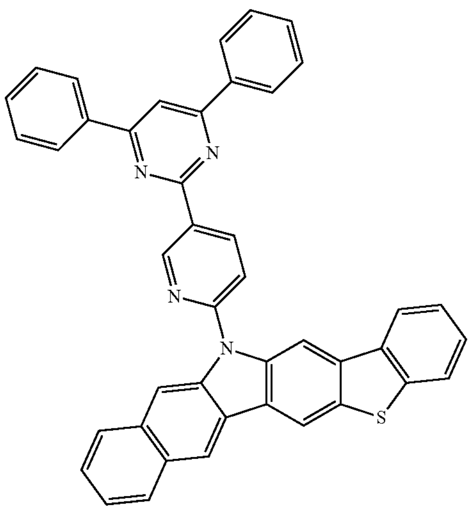
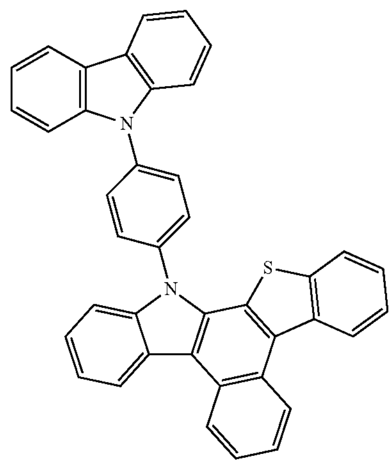
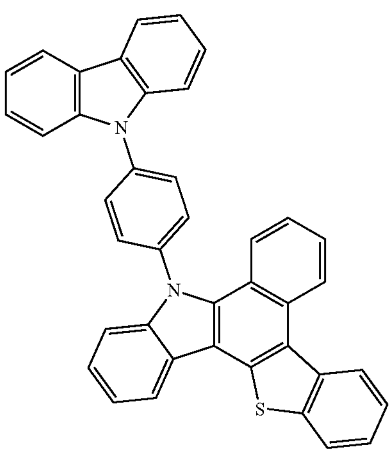
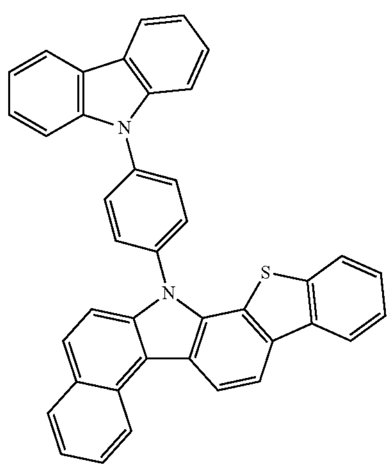

-continued
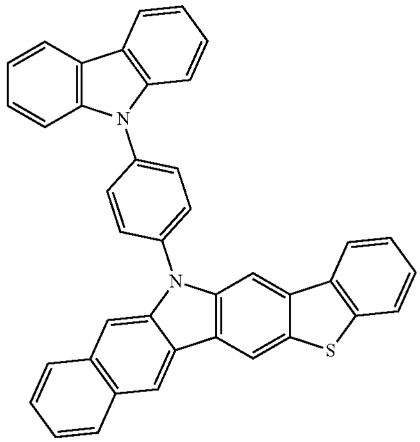
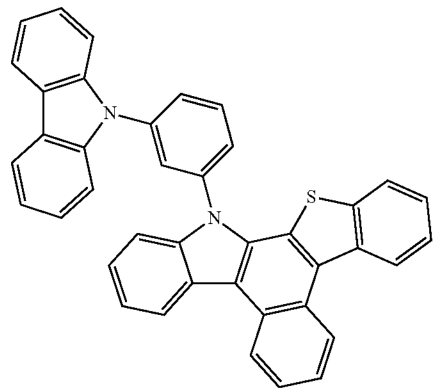
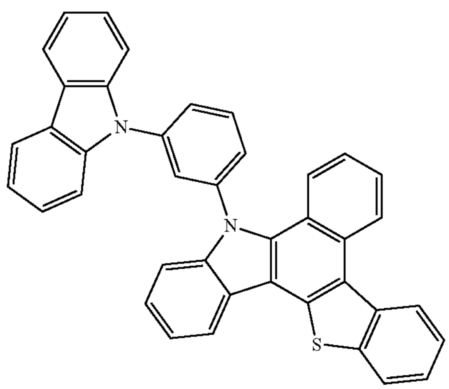
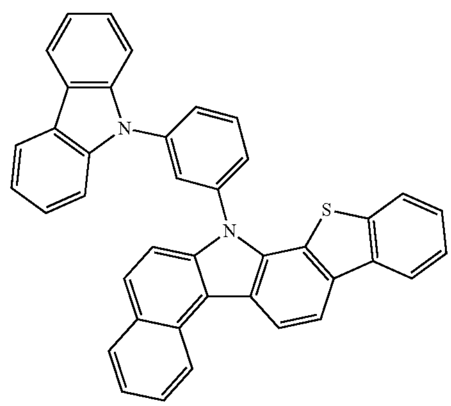
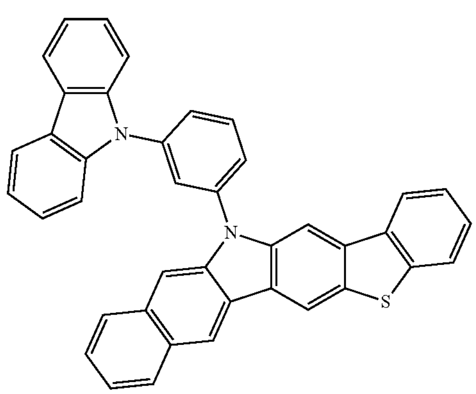
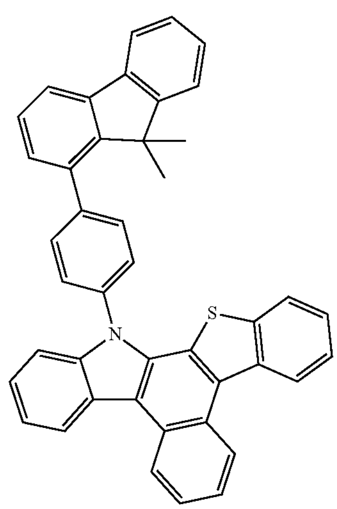

-continued
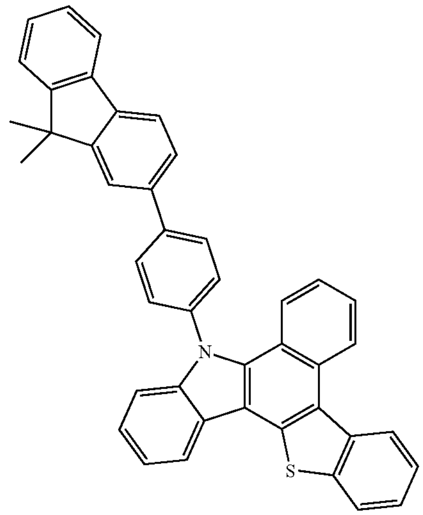
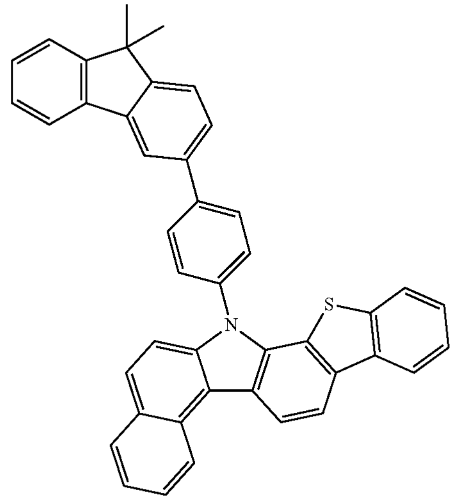
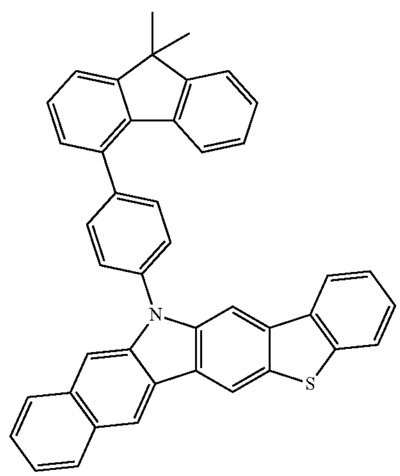
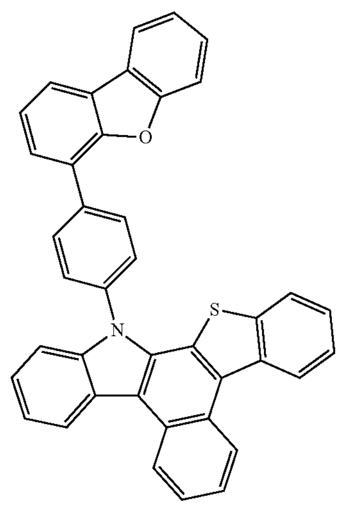
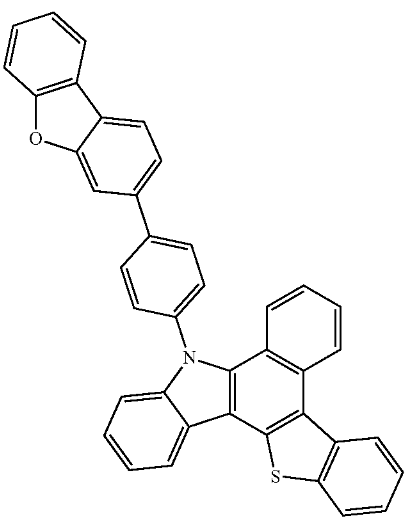
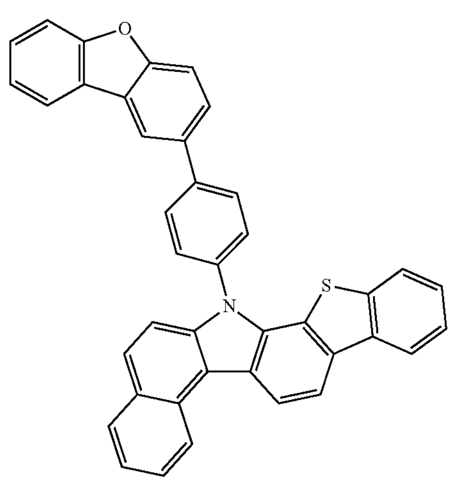
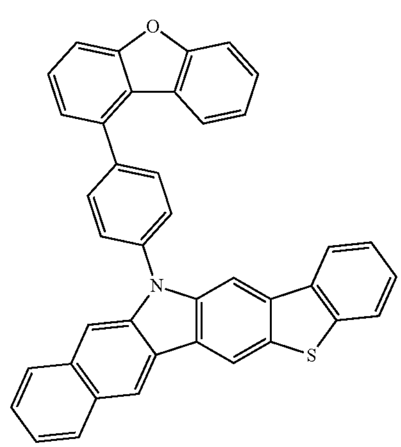

-continued
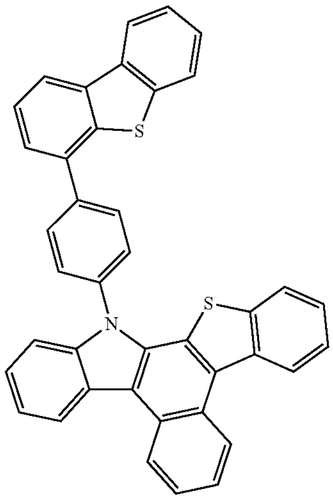
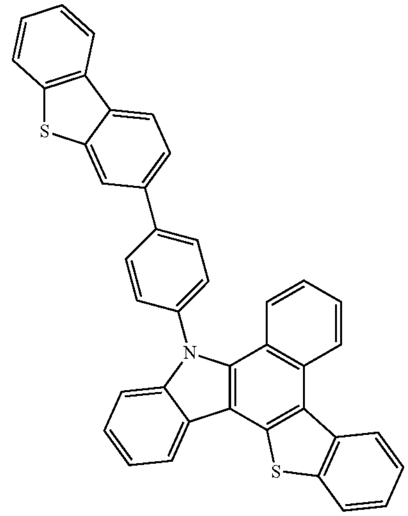
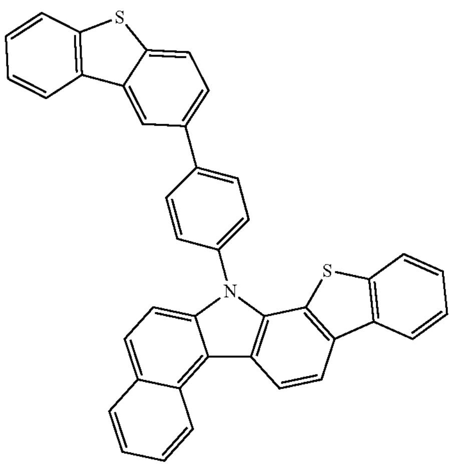
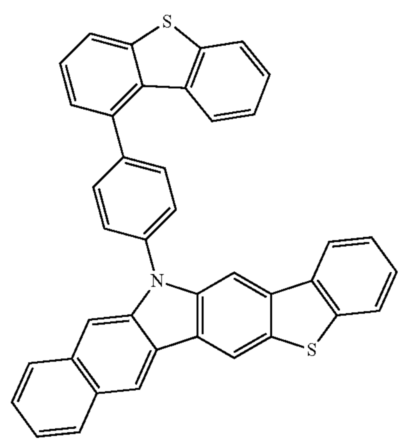
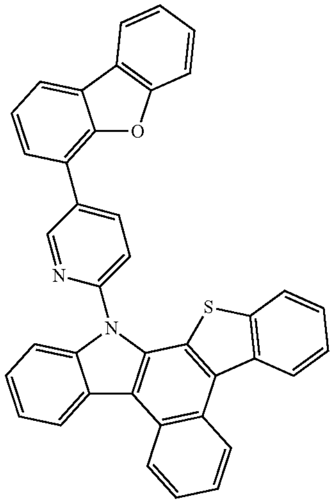
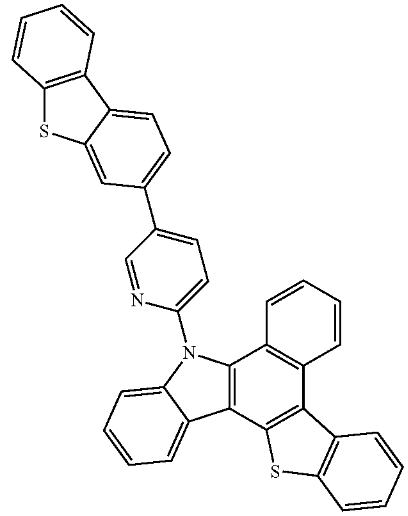

-continued
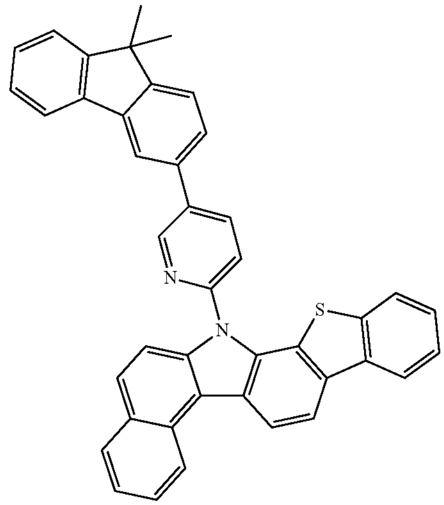
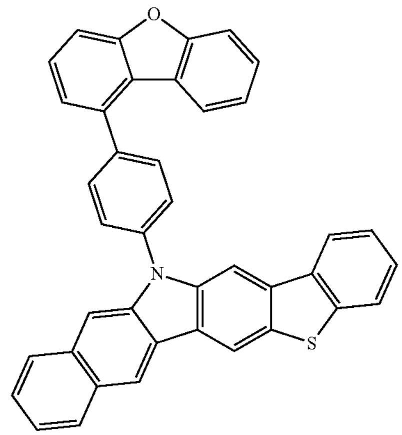
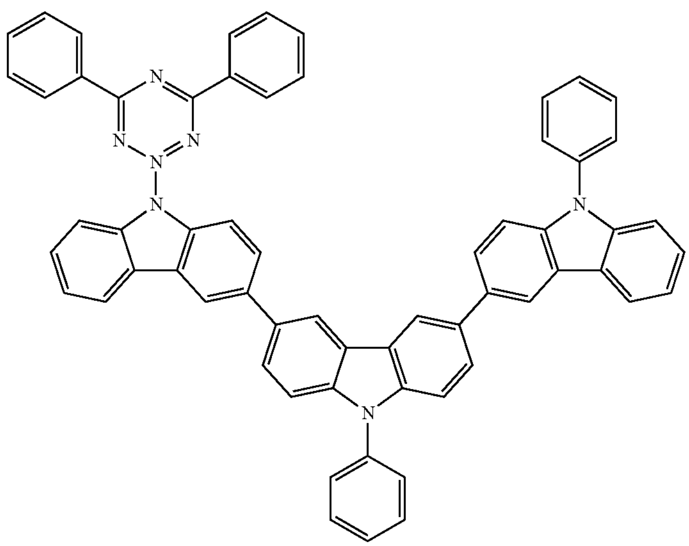
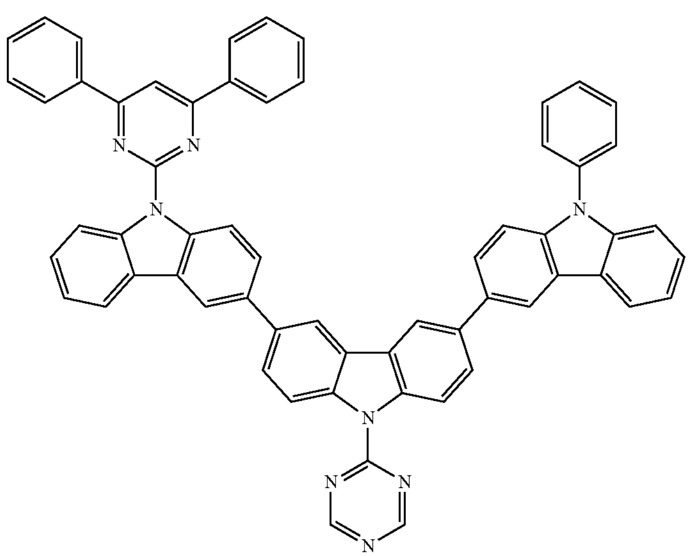

-continued
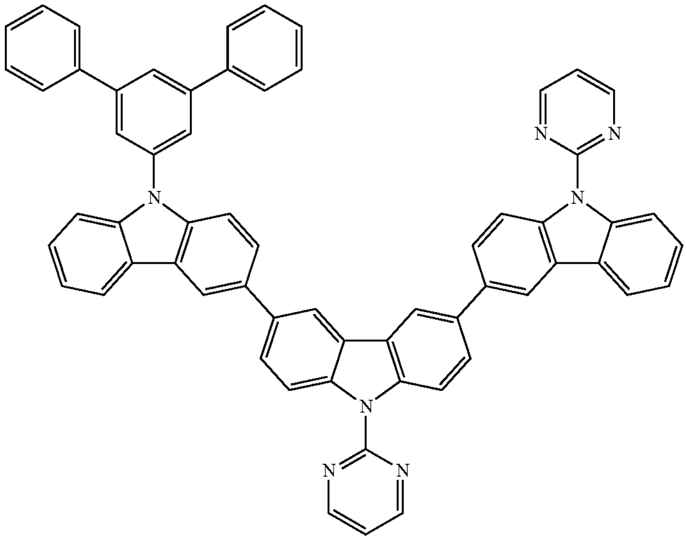
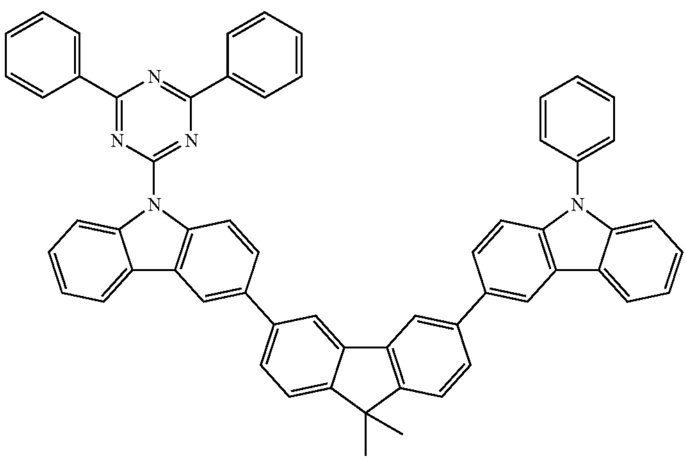
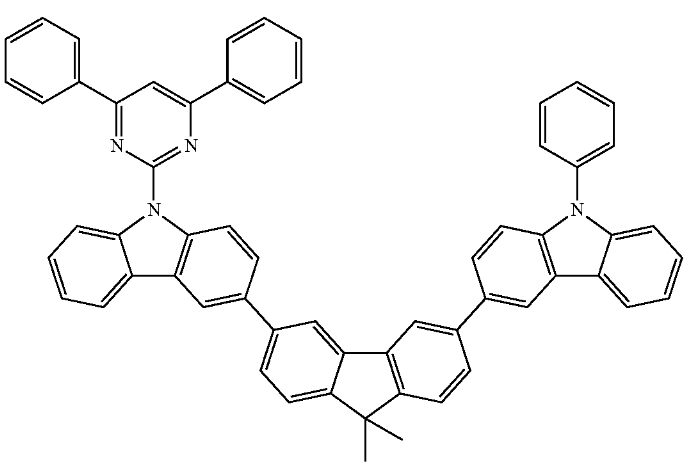

-continued
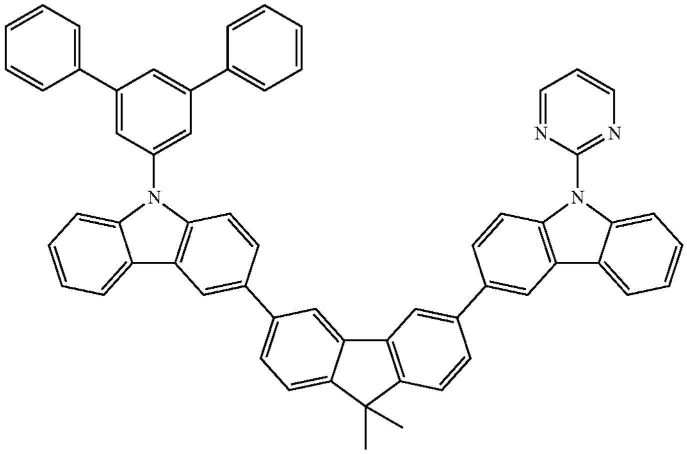
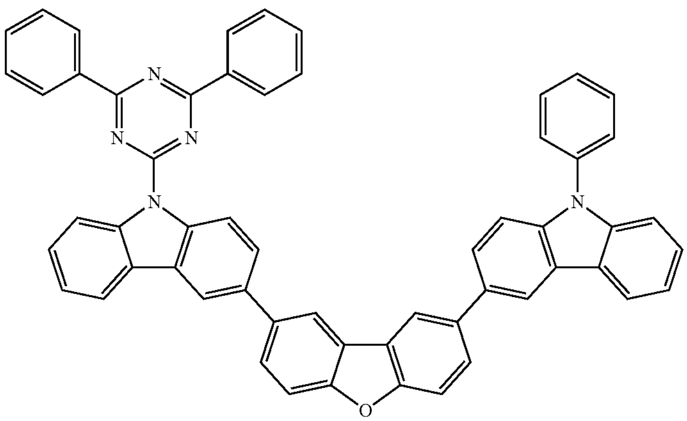
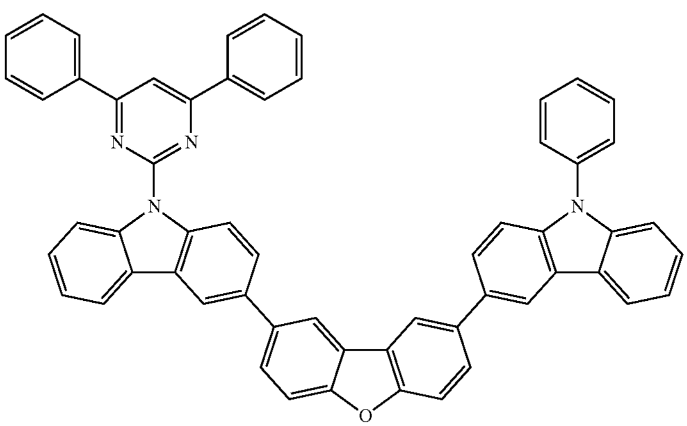
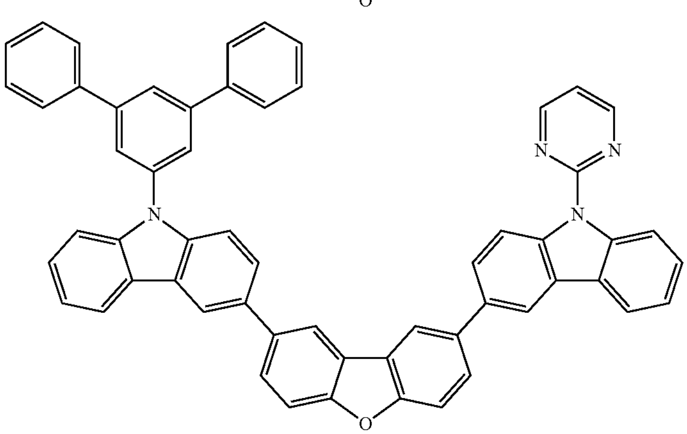

-continued
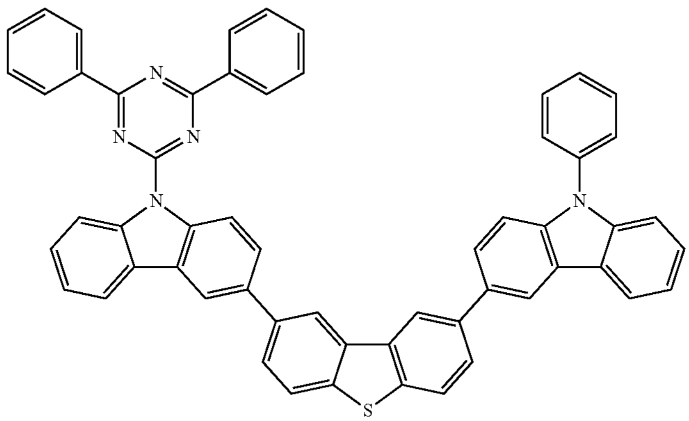
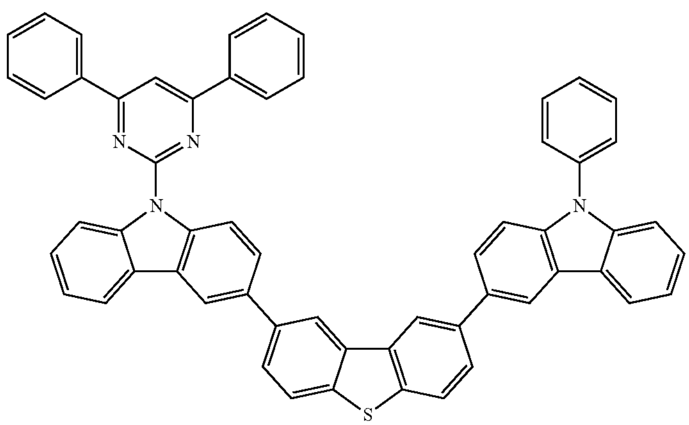
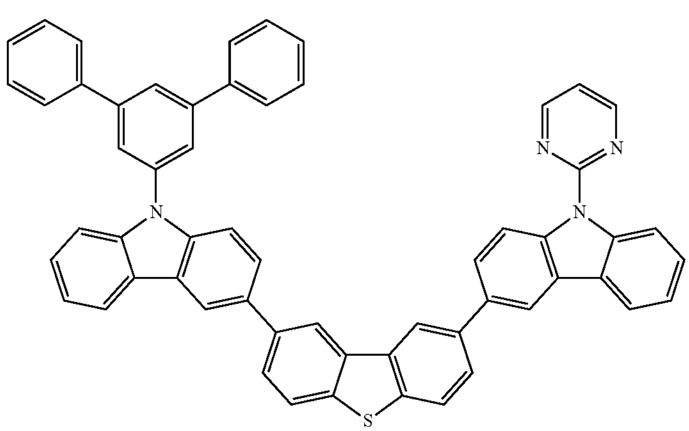

-continued
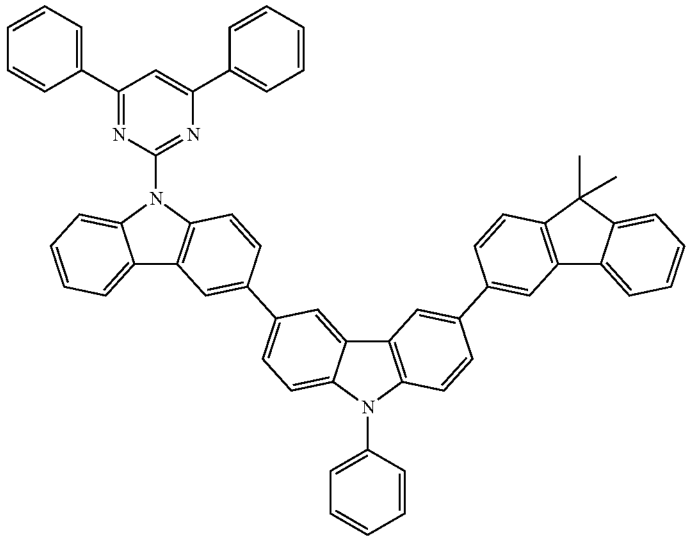
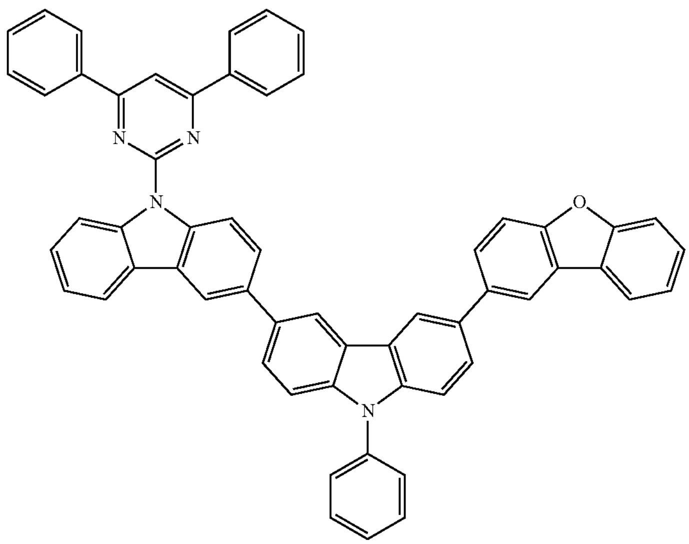
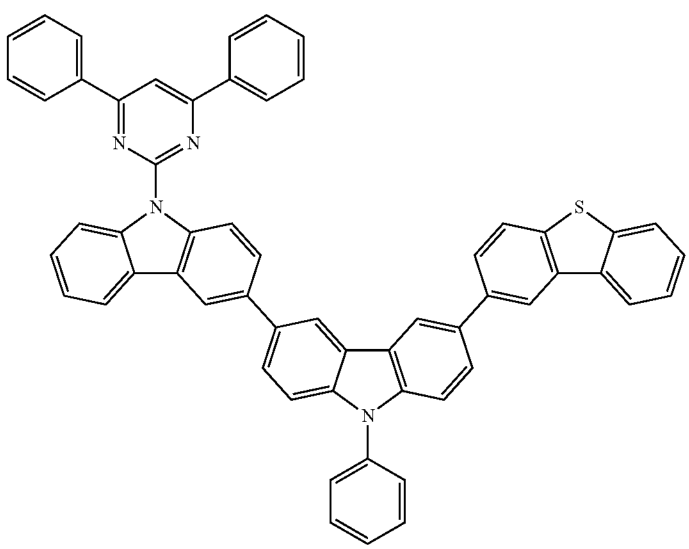

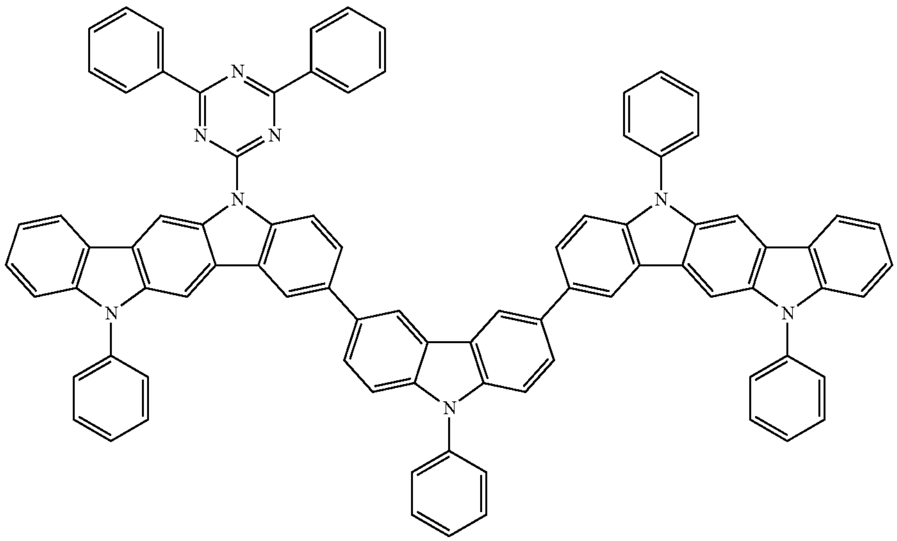
N
N
N
N
N
N
N
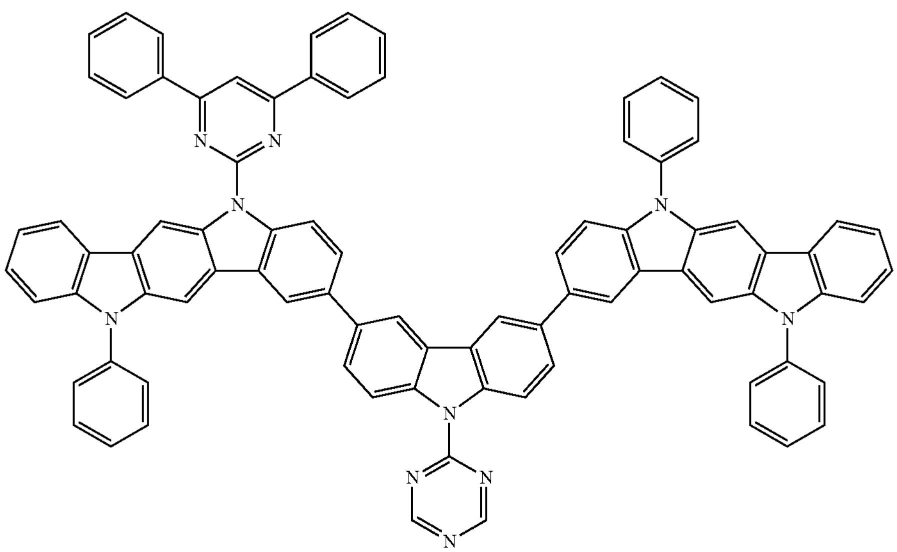
N
N
N
N
N
N
N
N
N
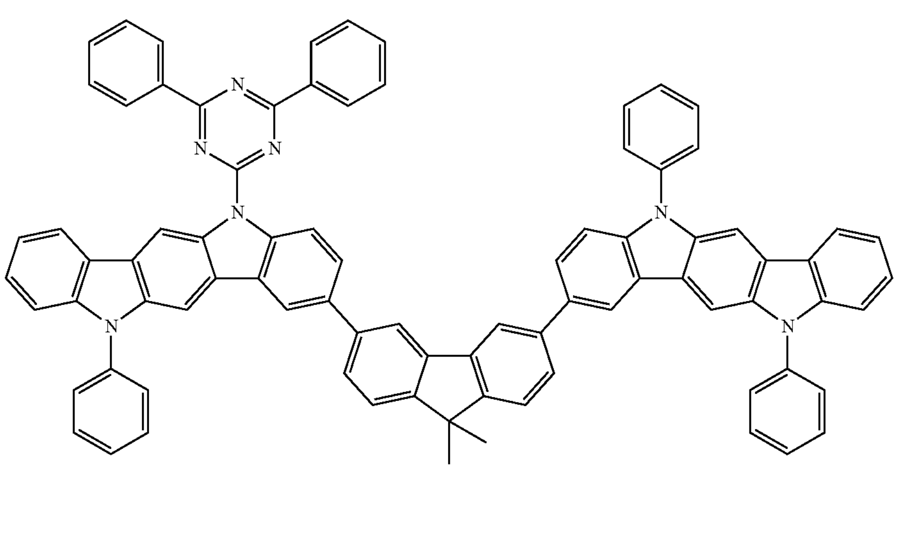
N
N
N
N
N
N
N -continued
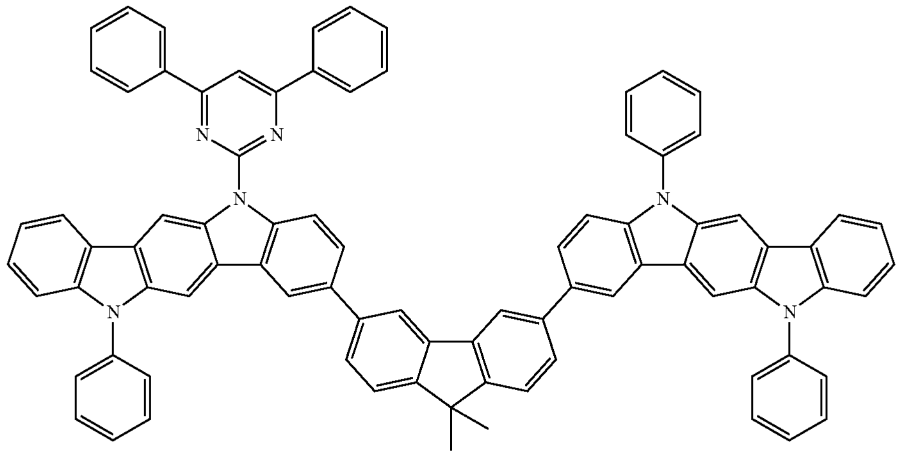
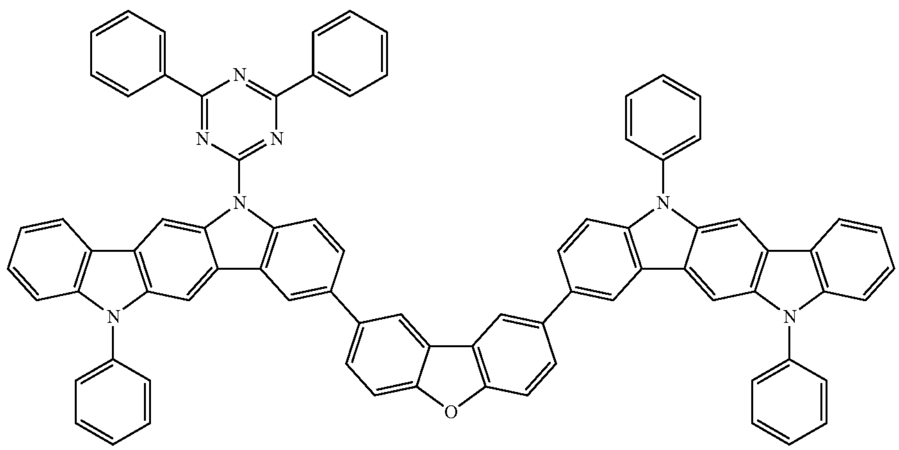
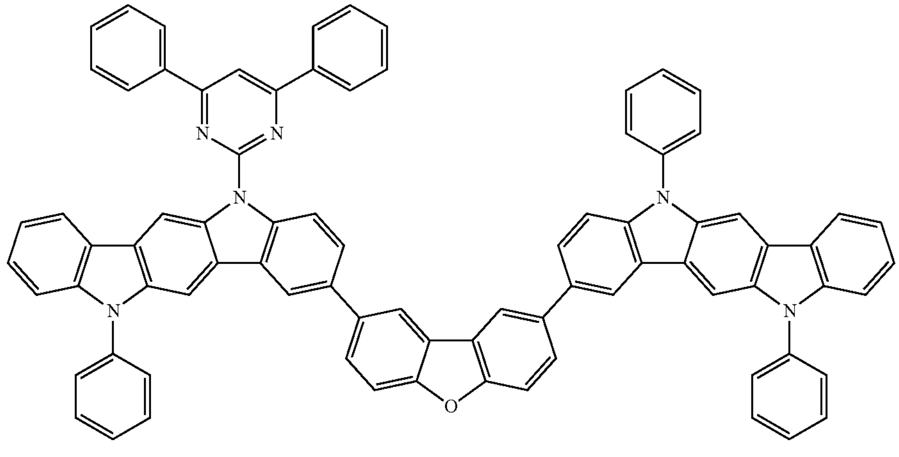

-continued
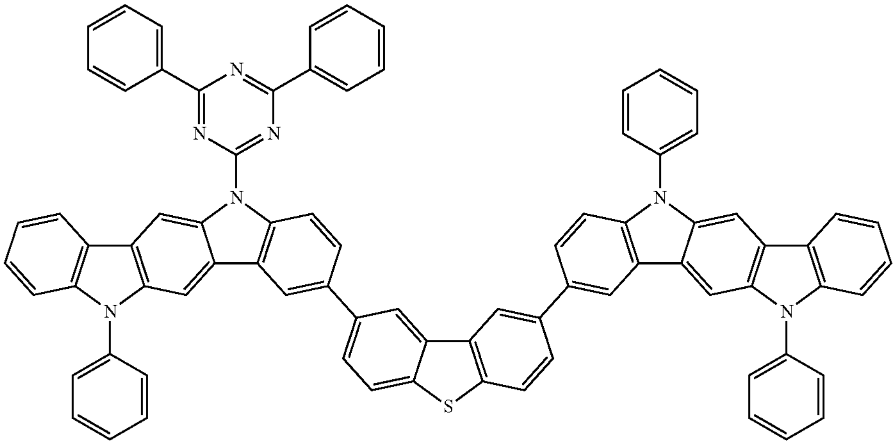
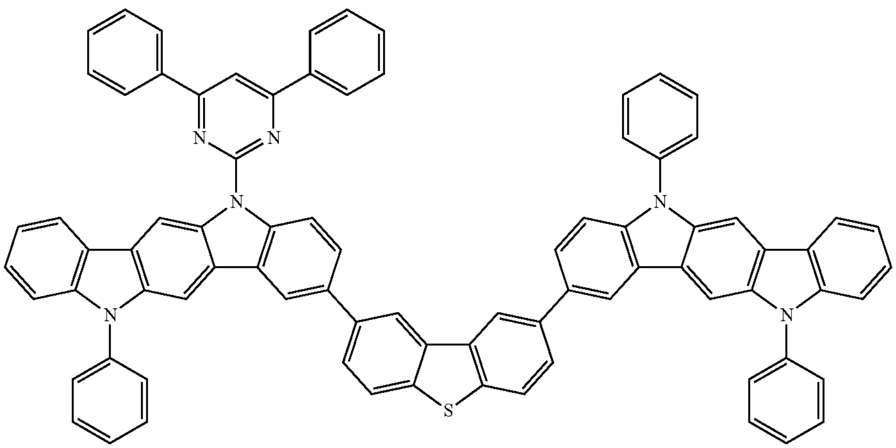
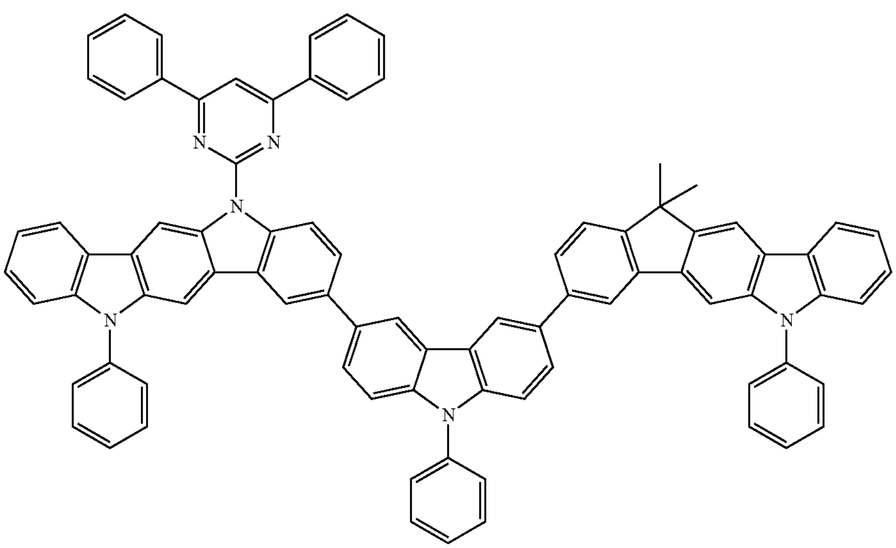

-continued
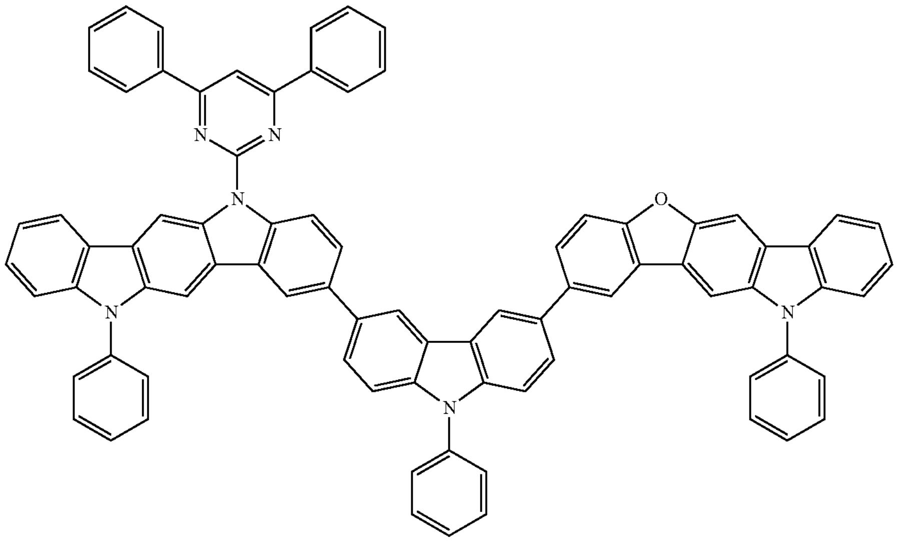
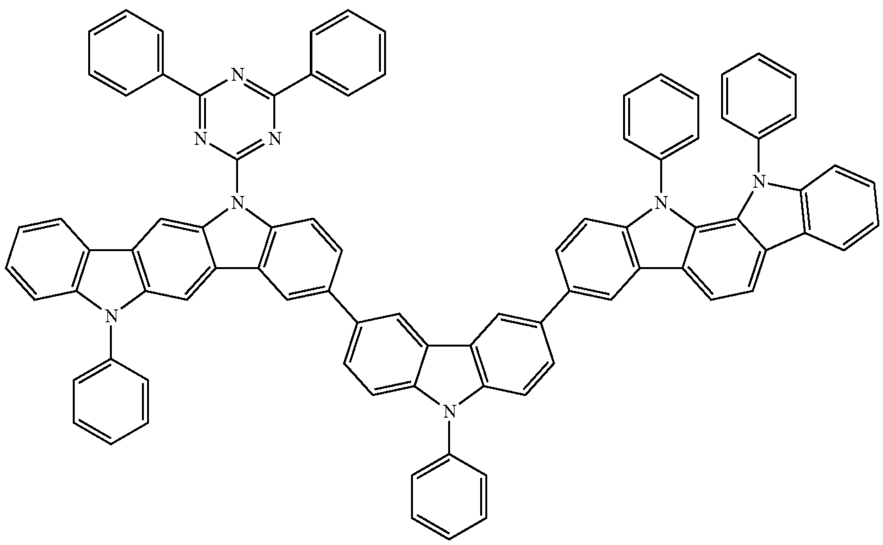
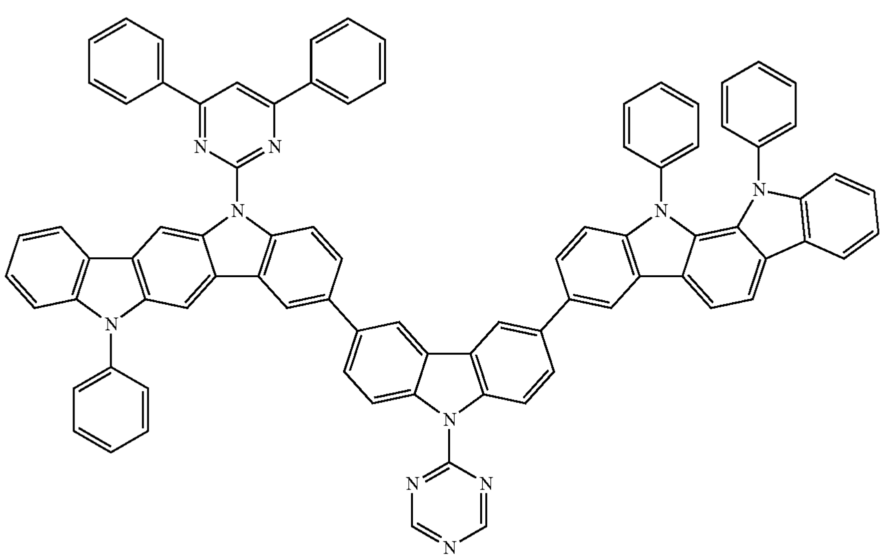

-continued
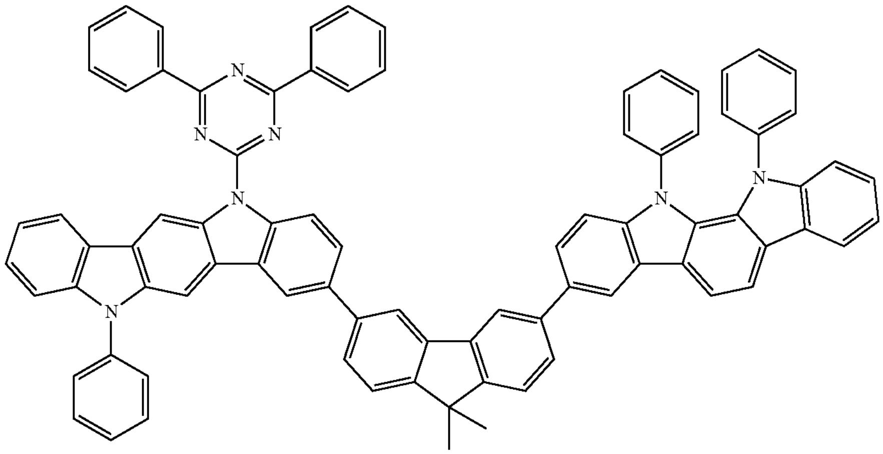
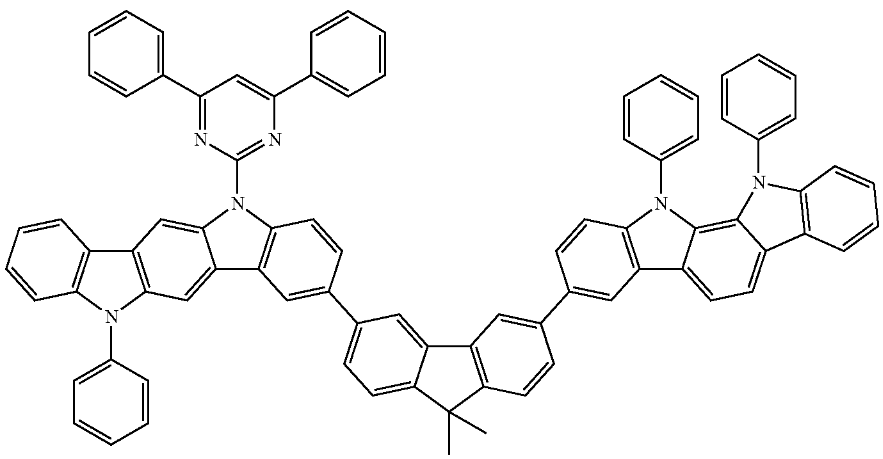
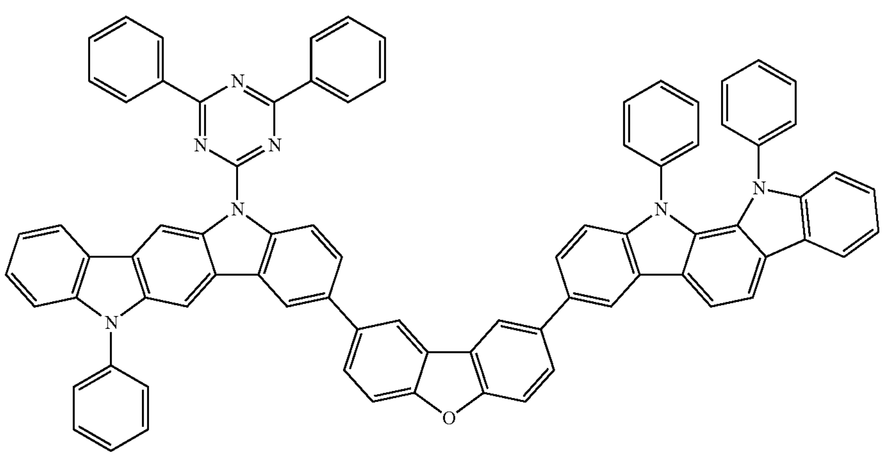

-continued
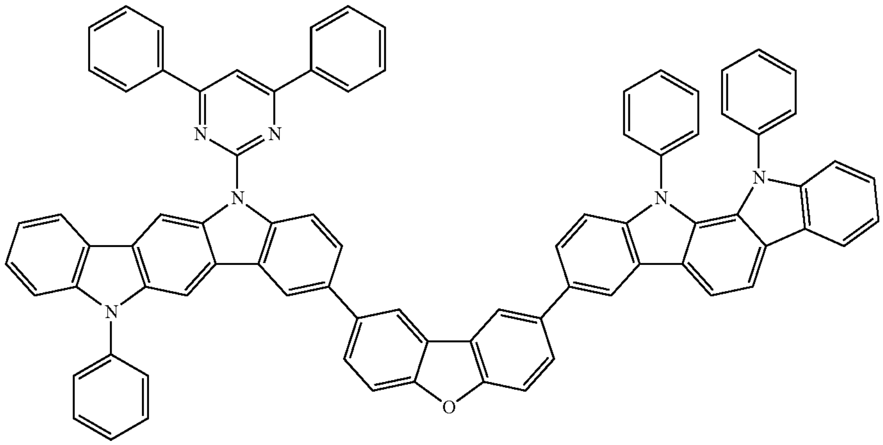
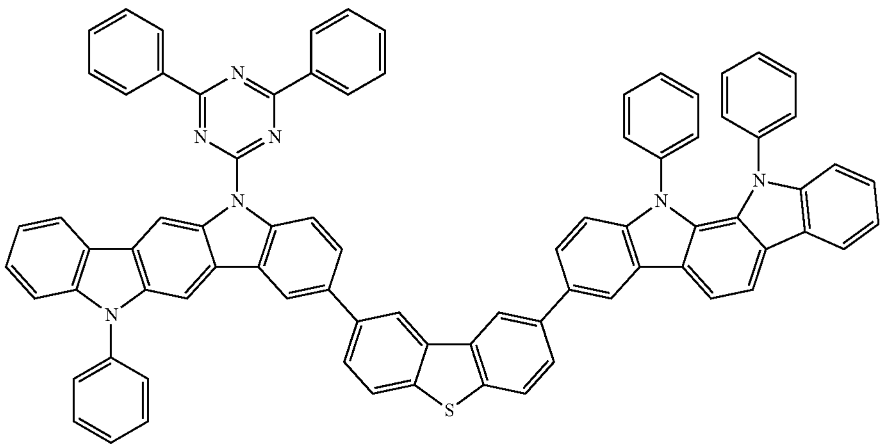
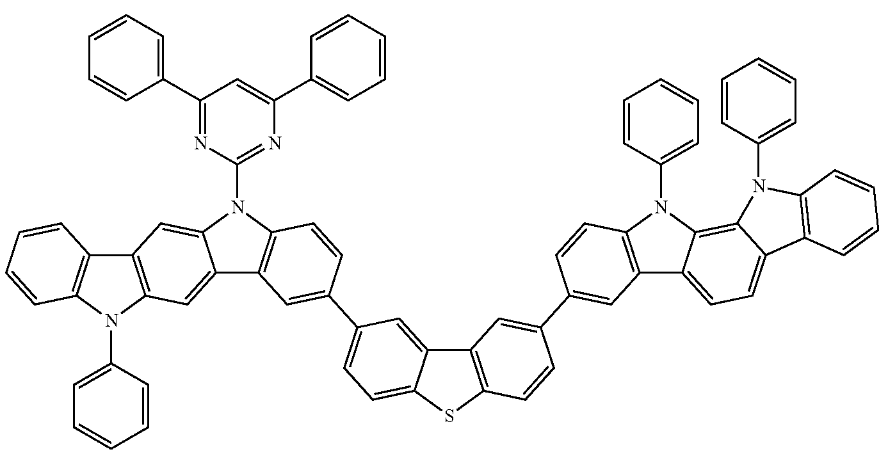

-continued
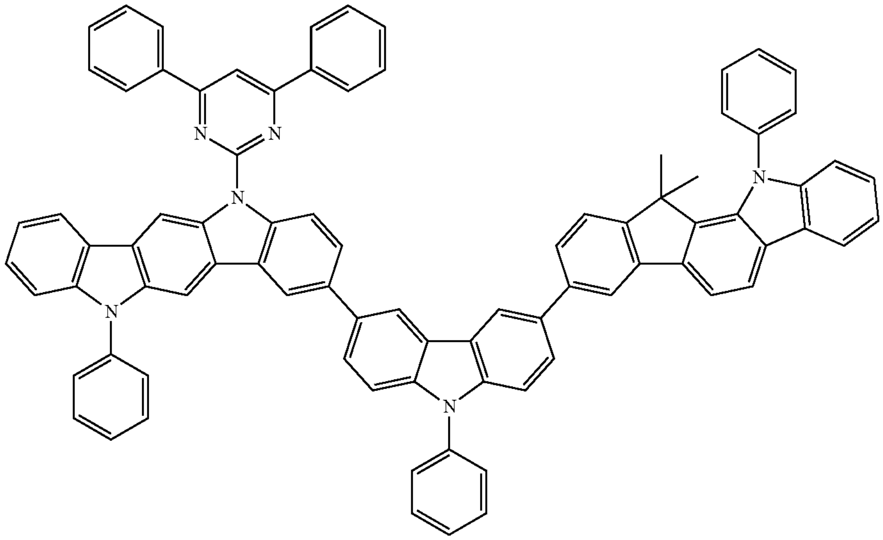
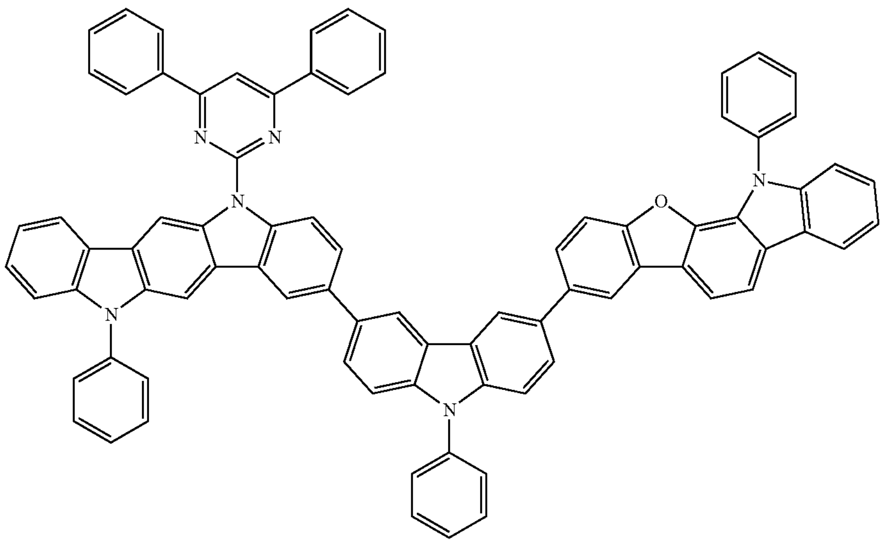
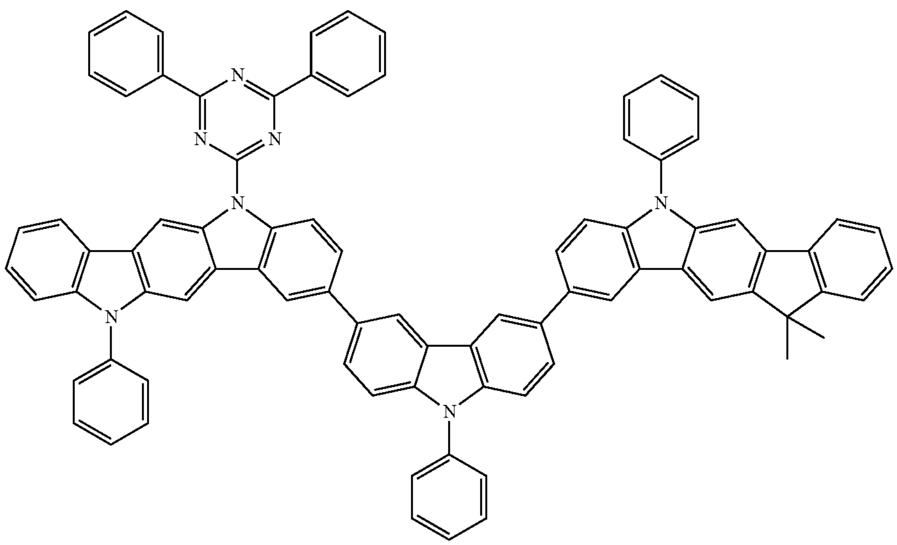

-continued
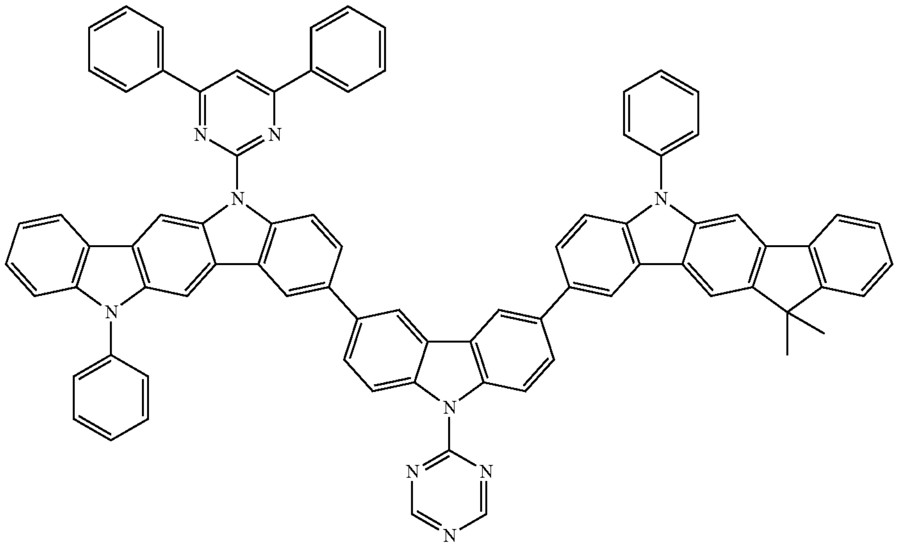
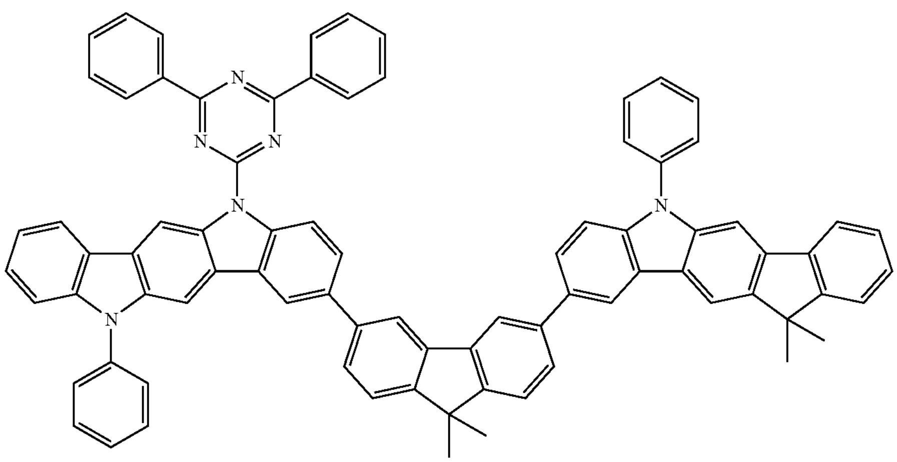
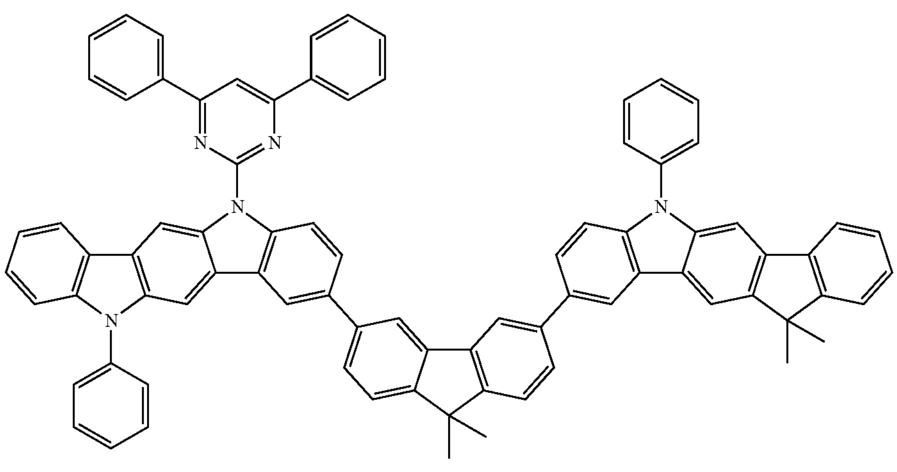

-continued
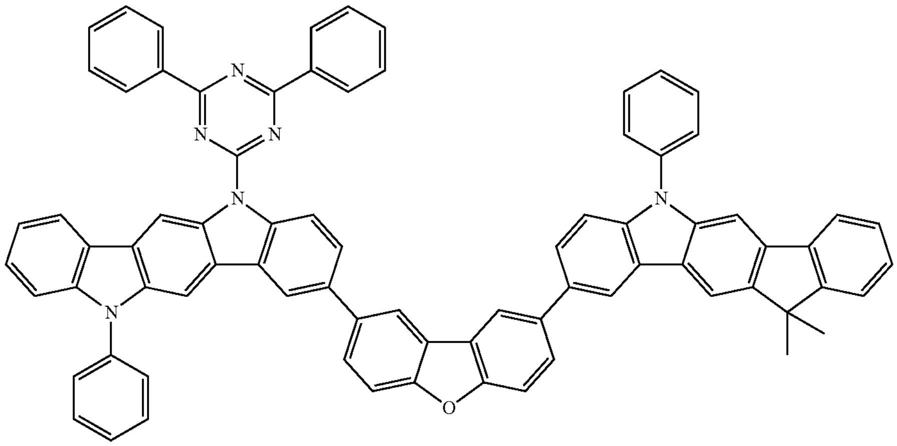
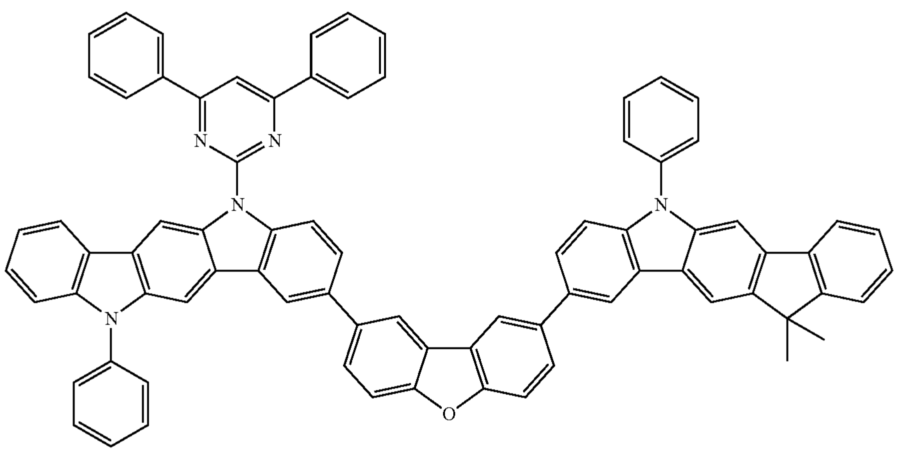
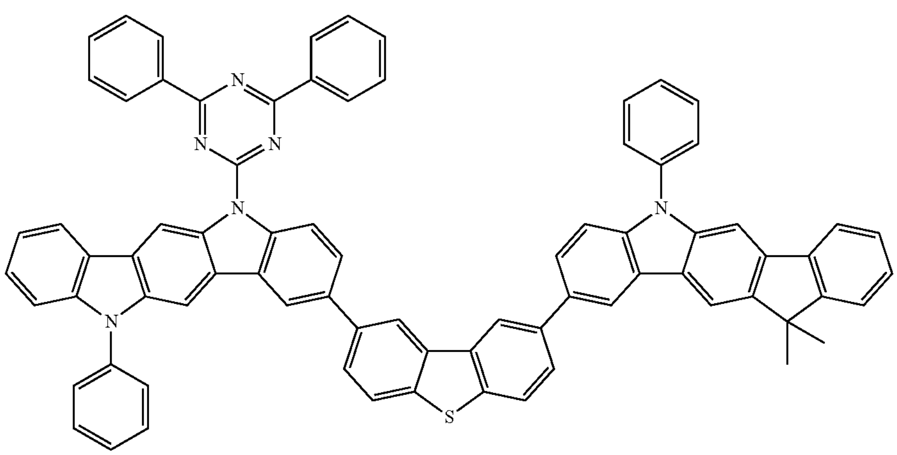

-continued
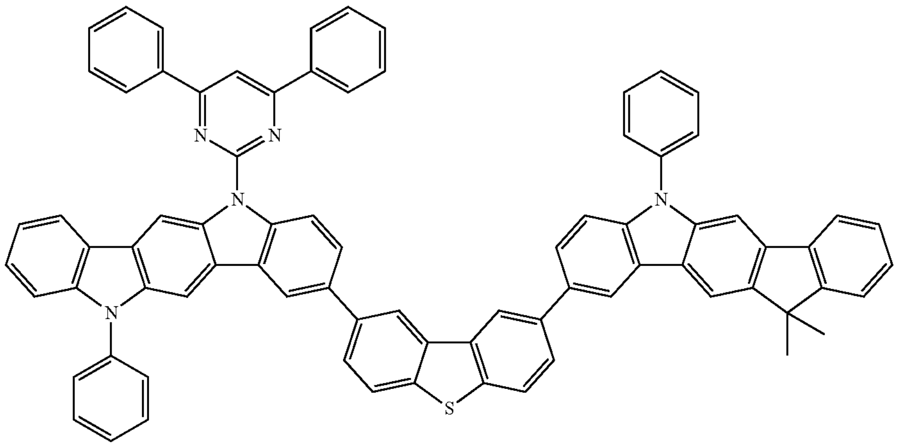
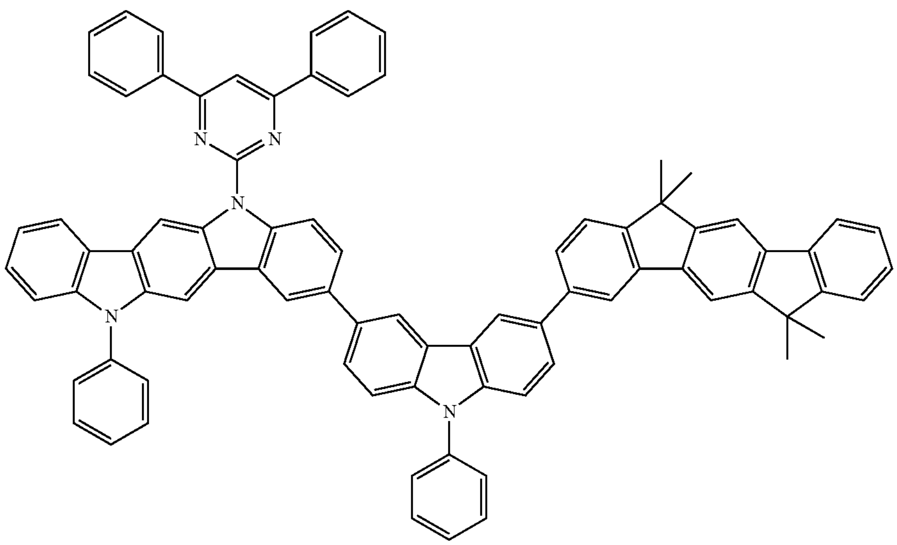
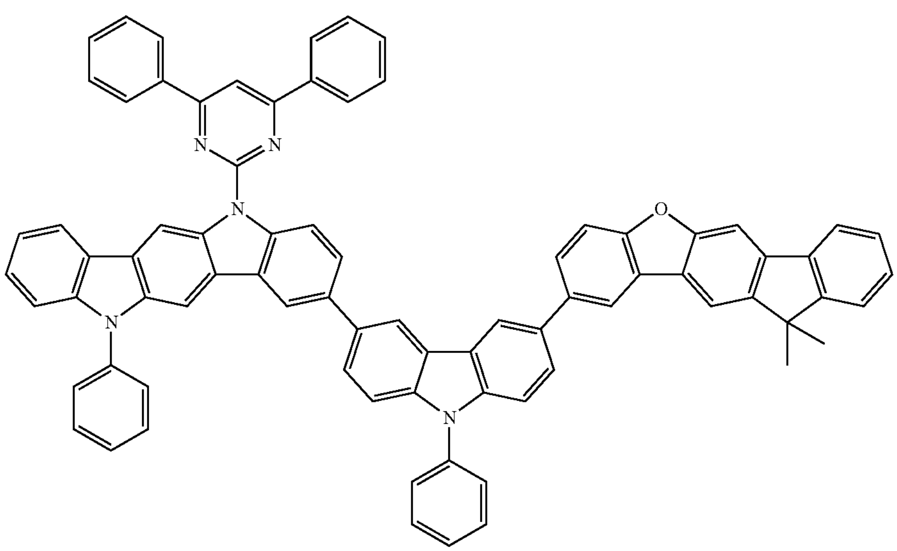

-continued
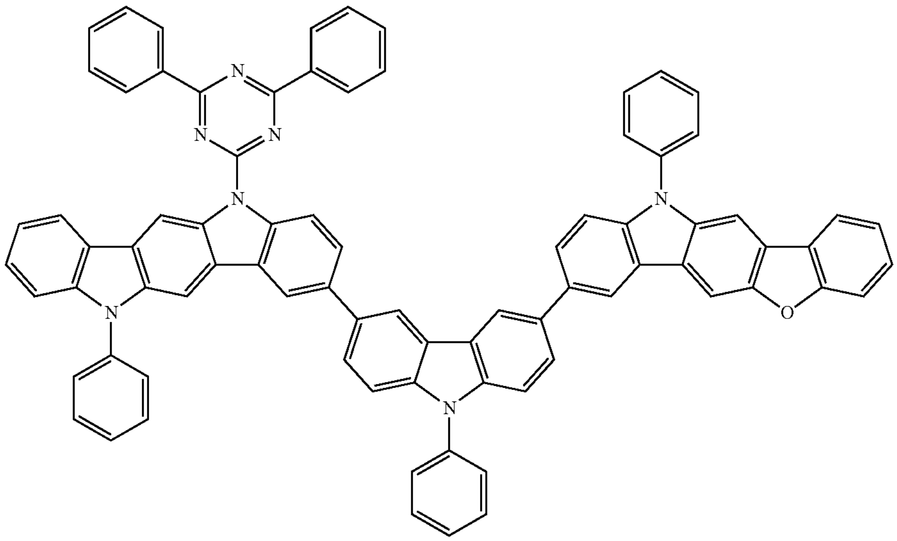
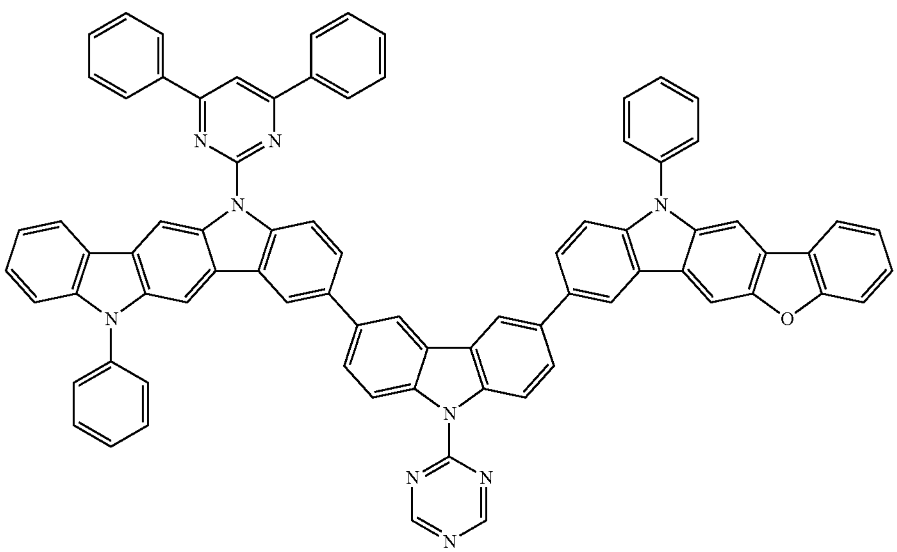
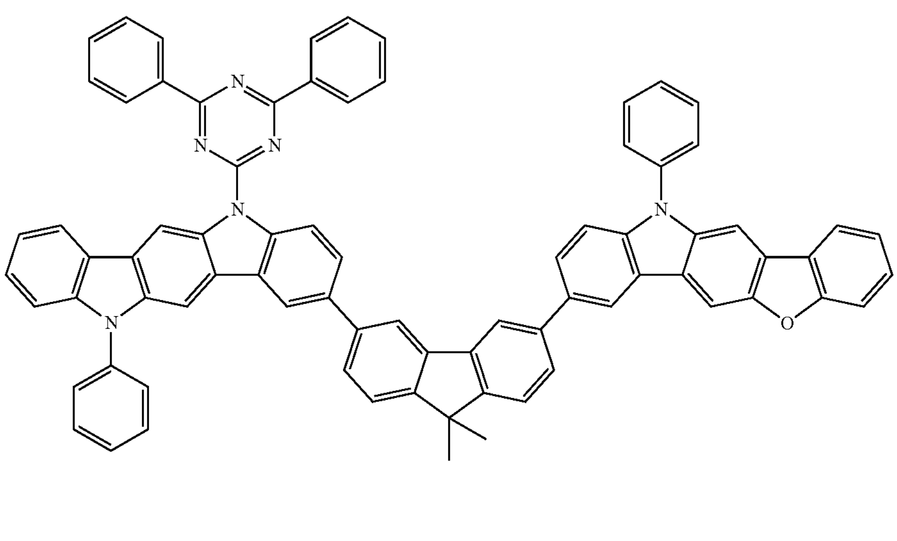

-continued
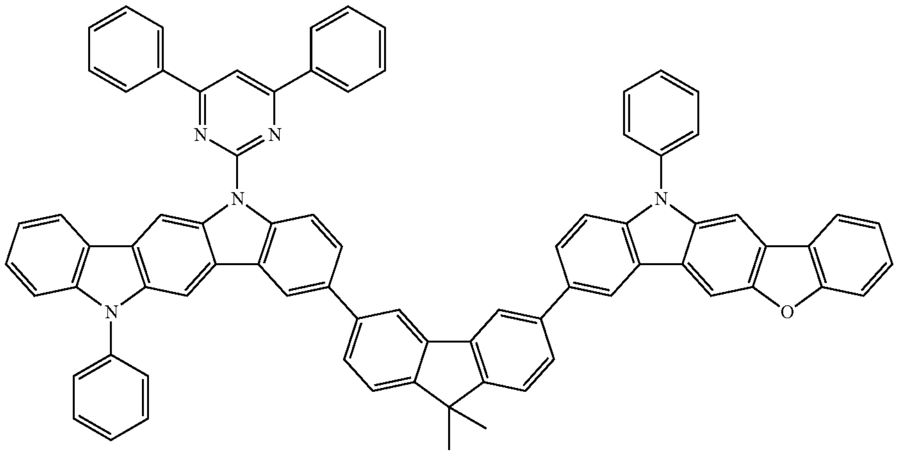
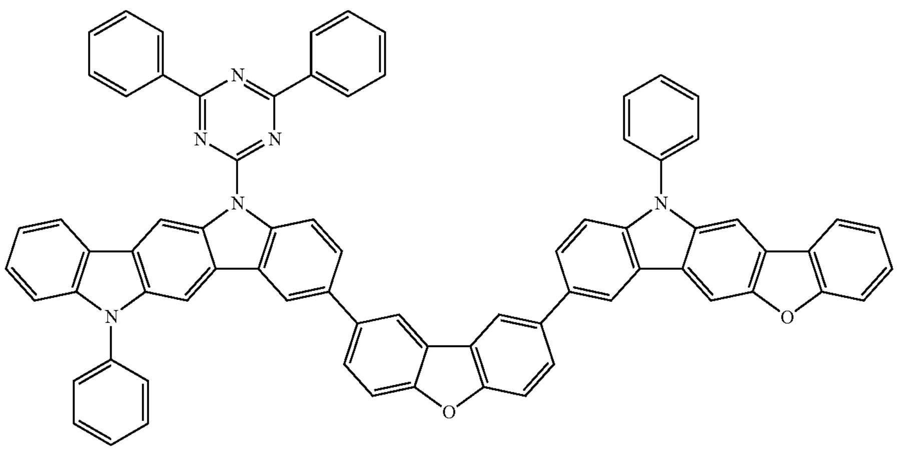
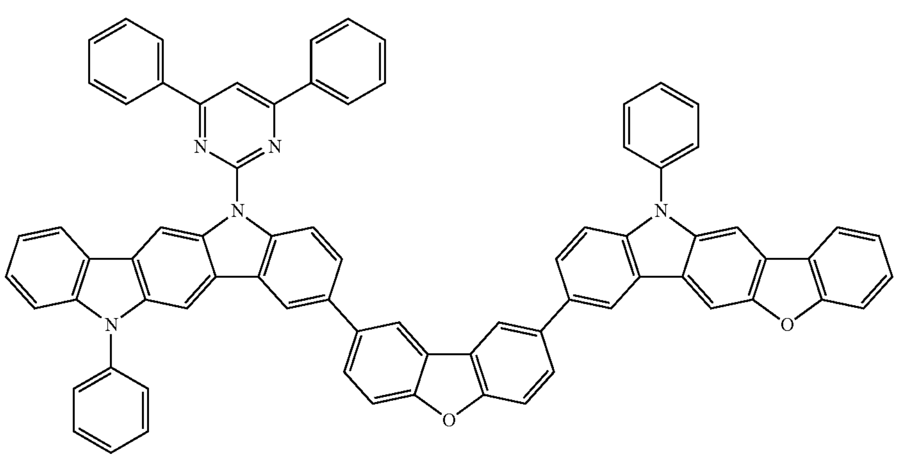

-continued
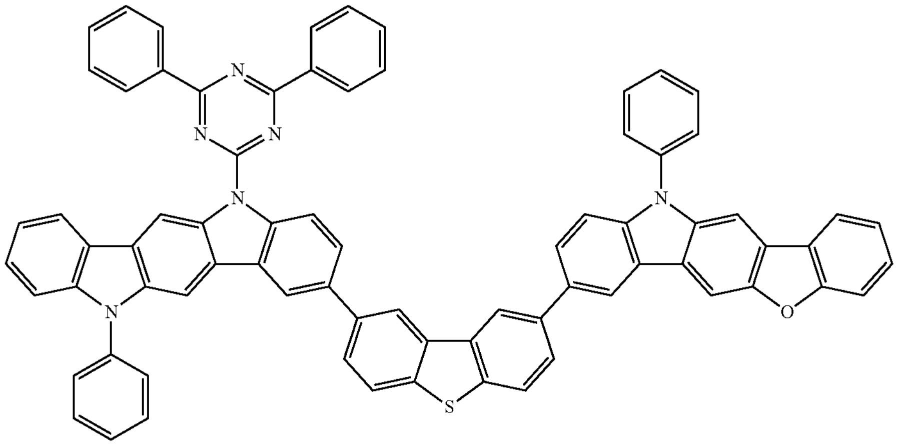
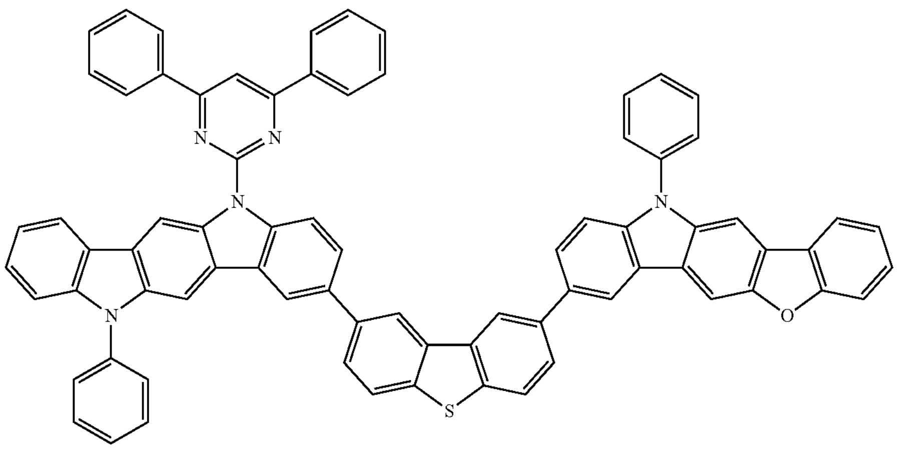
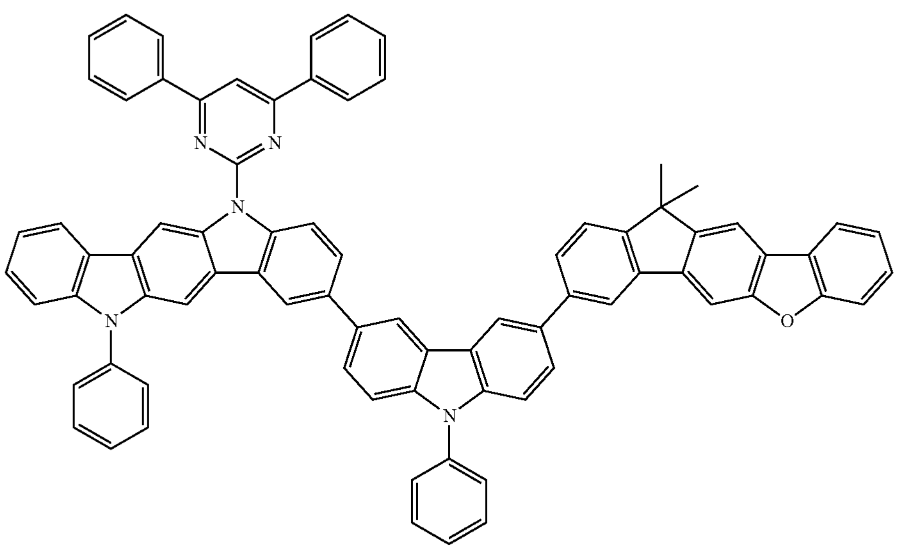

-continued
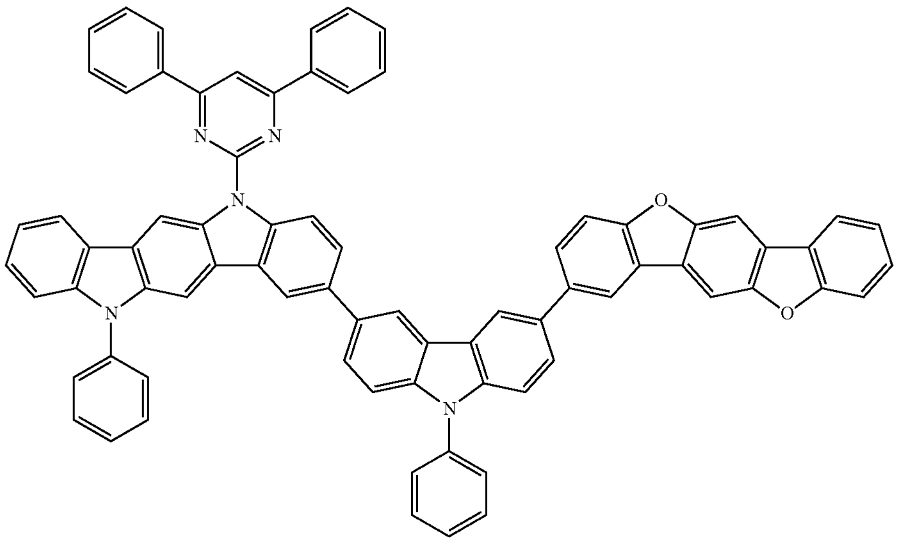
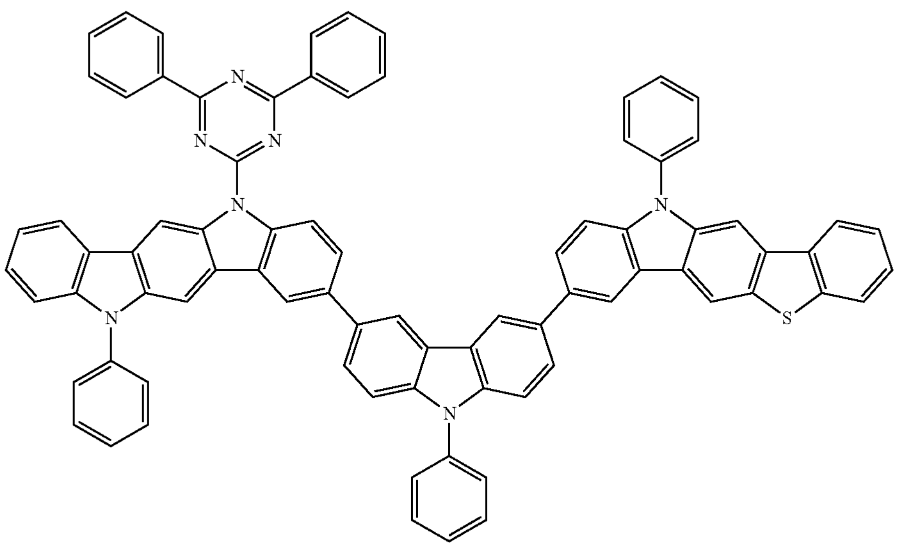
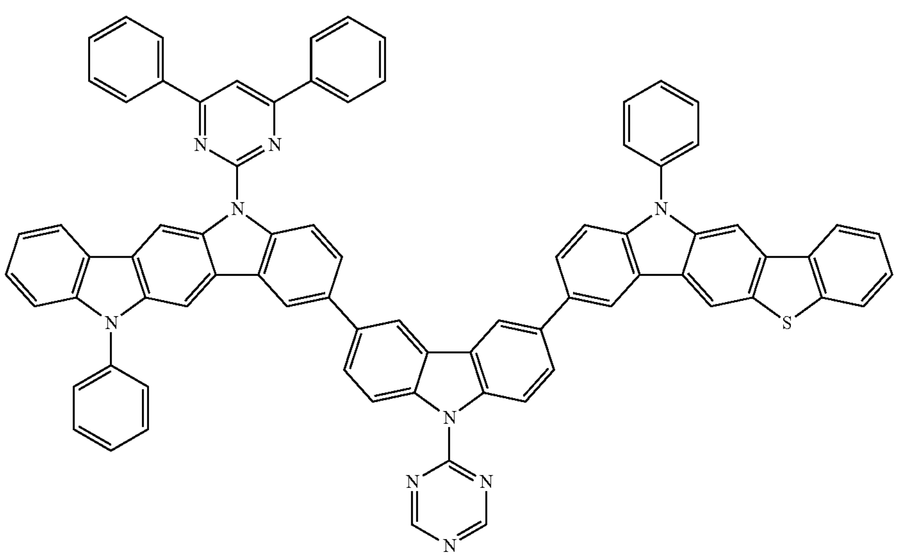

-continued
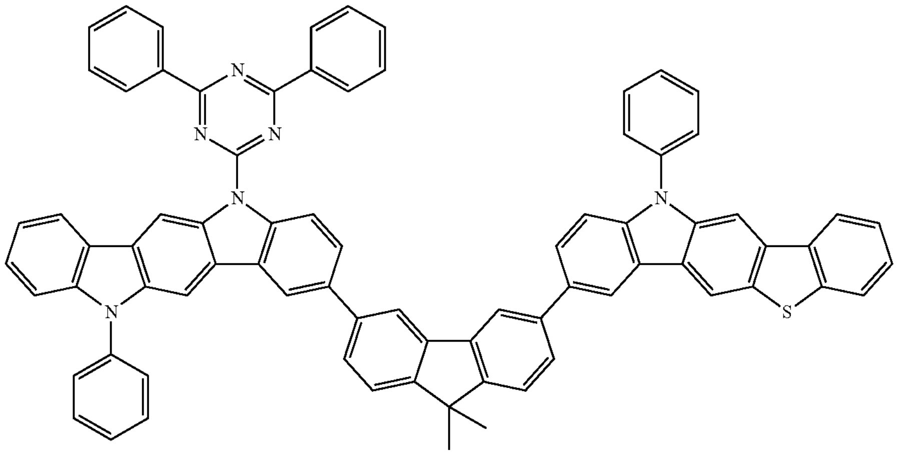
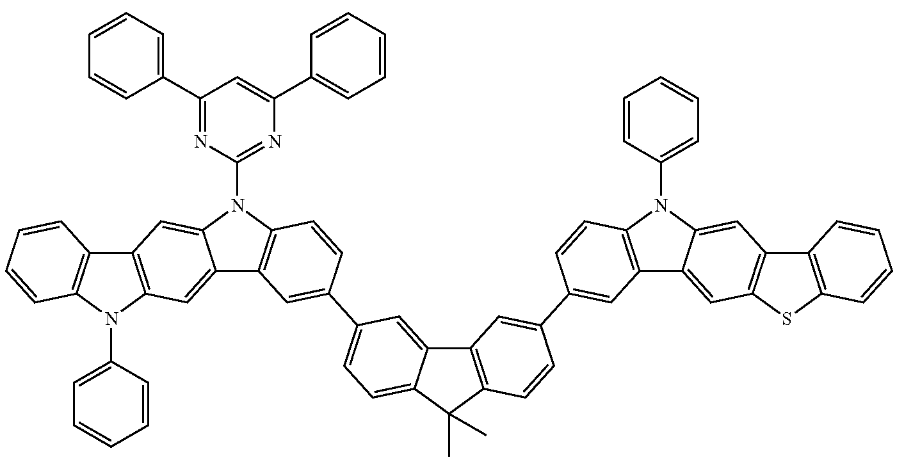
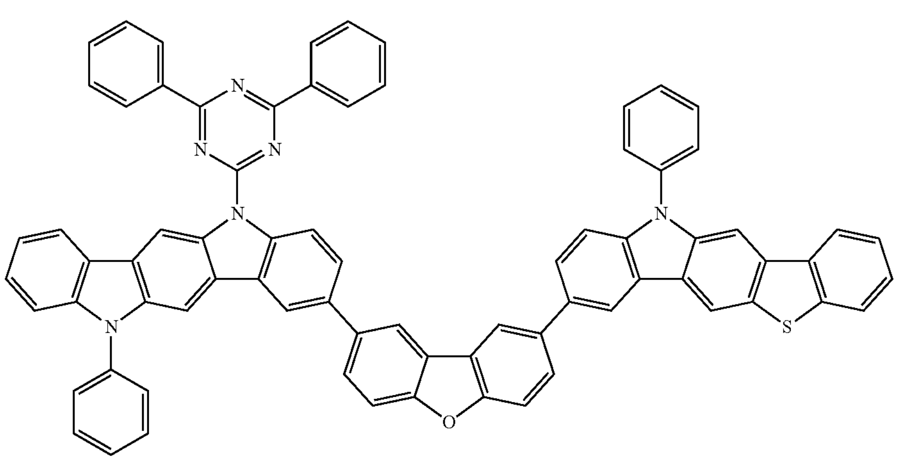

-continued
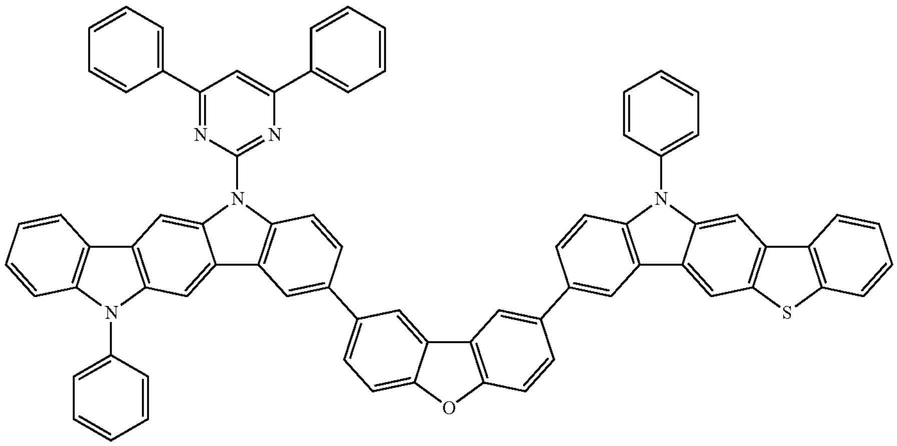
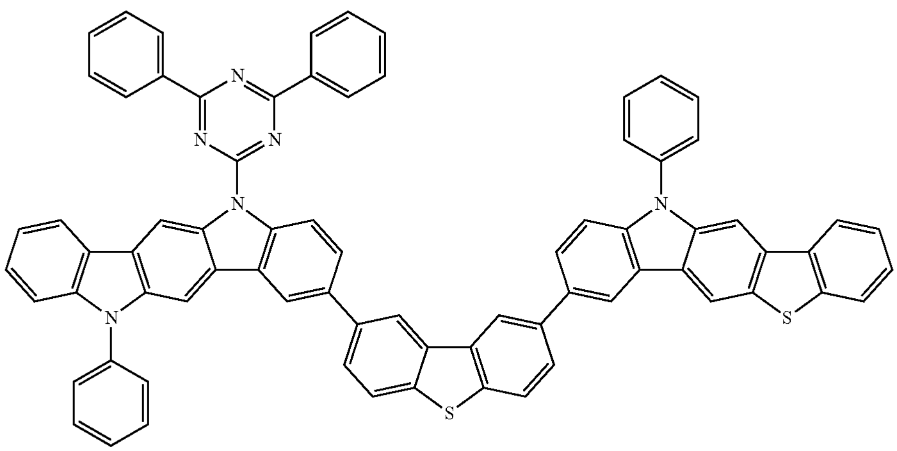
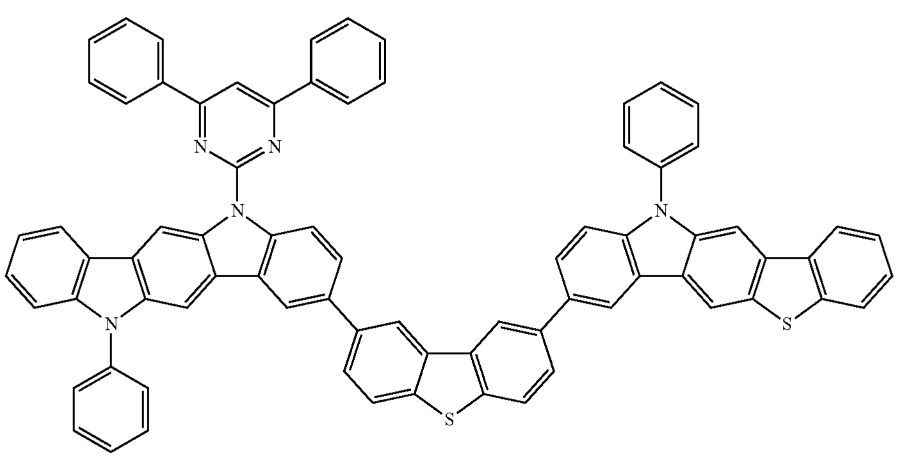

-continued
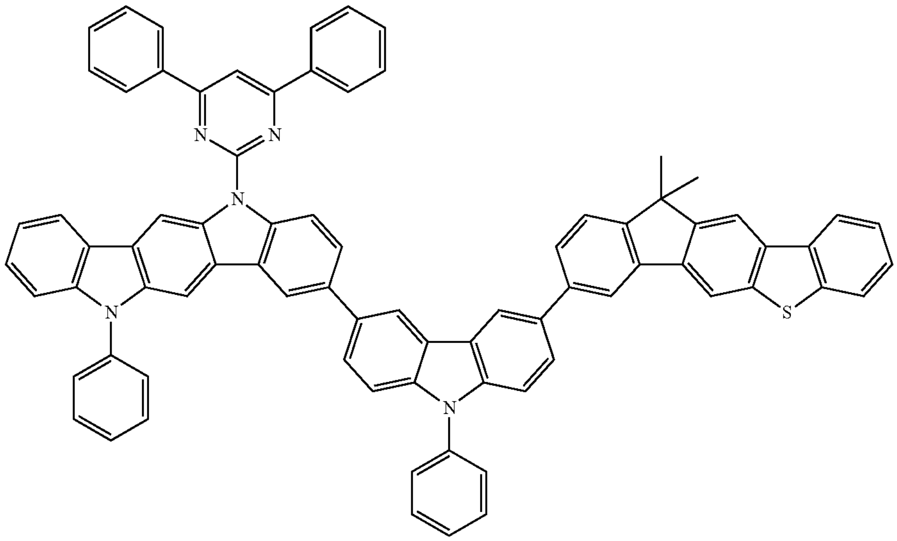
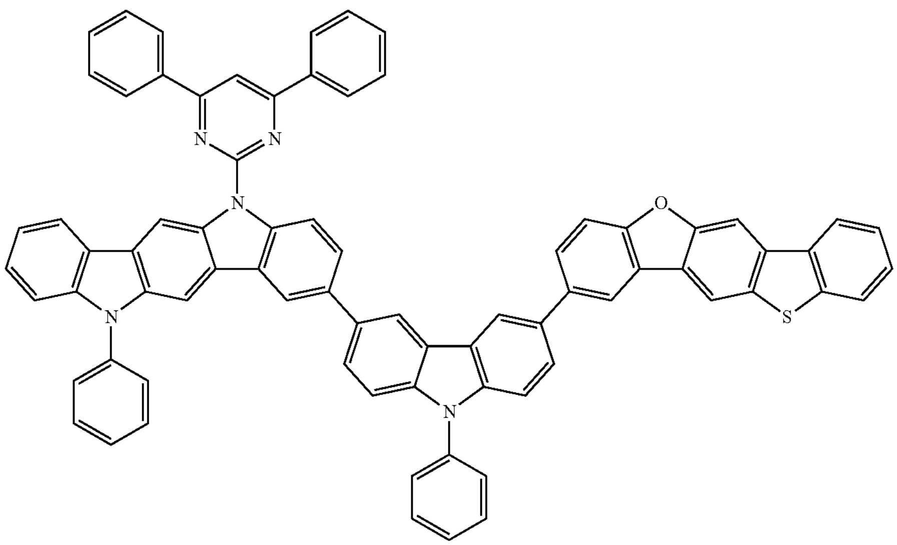
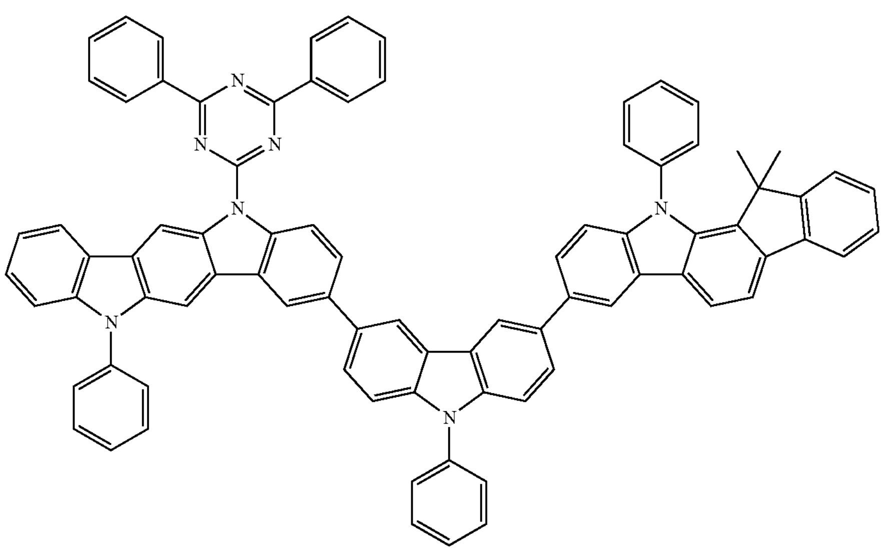

-continued
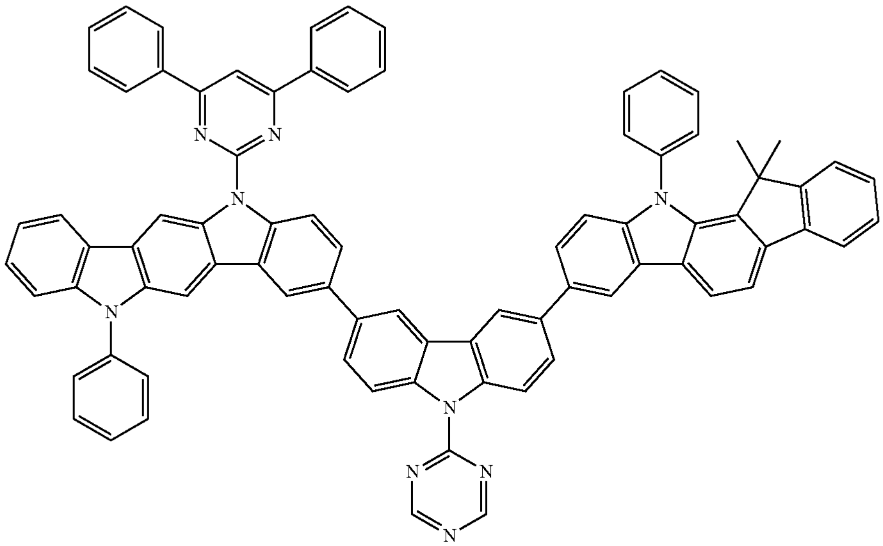
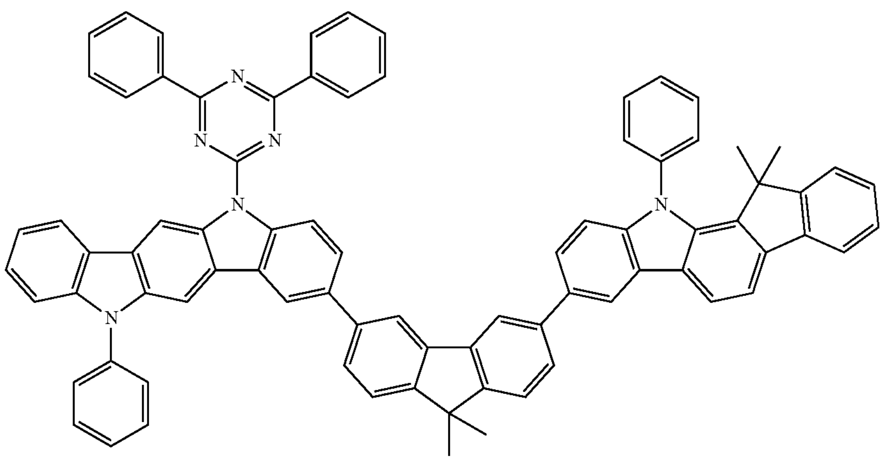
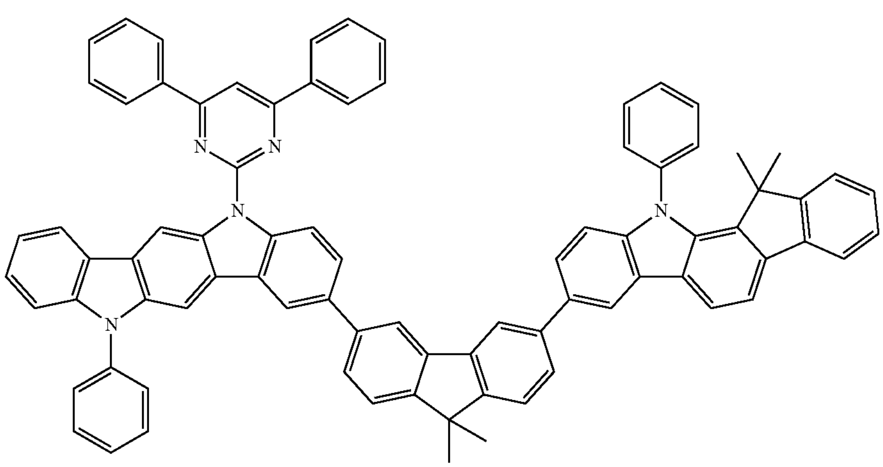

-continued
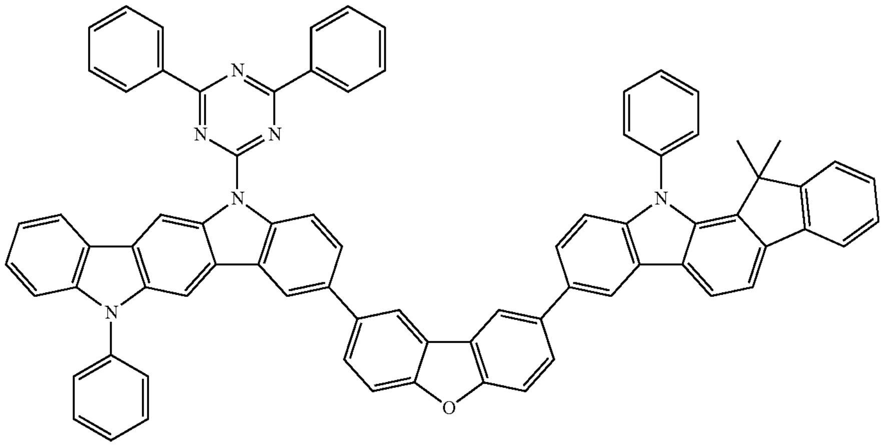
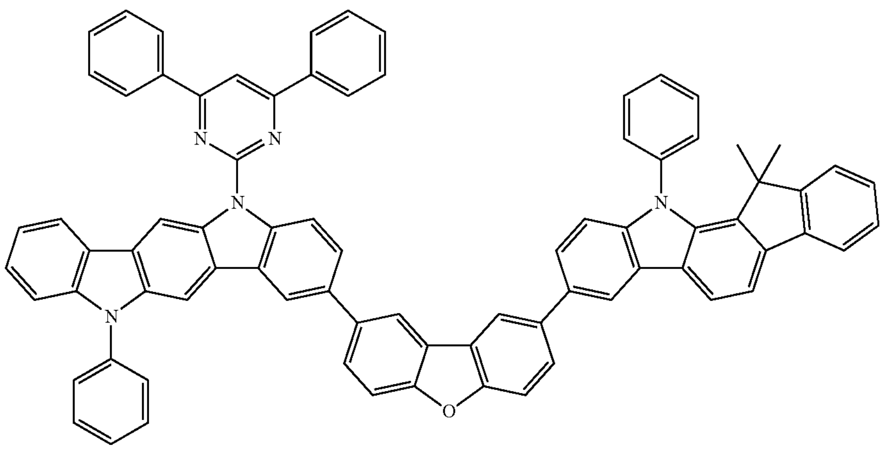
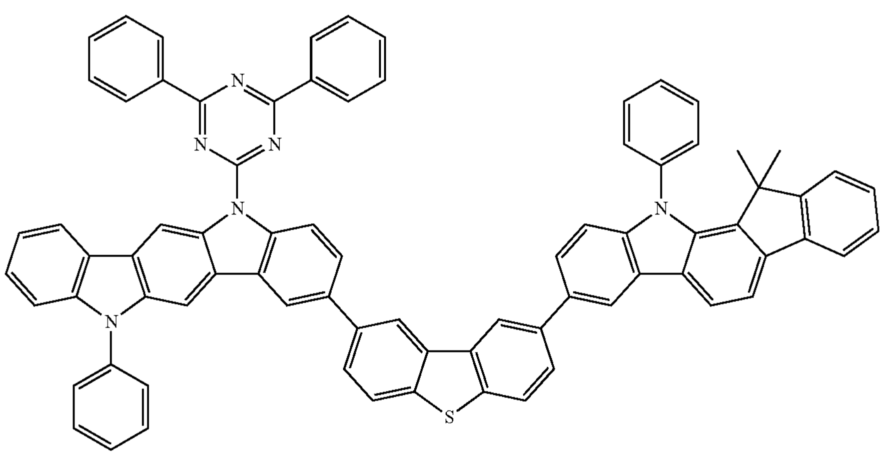

-continued
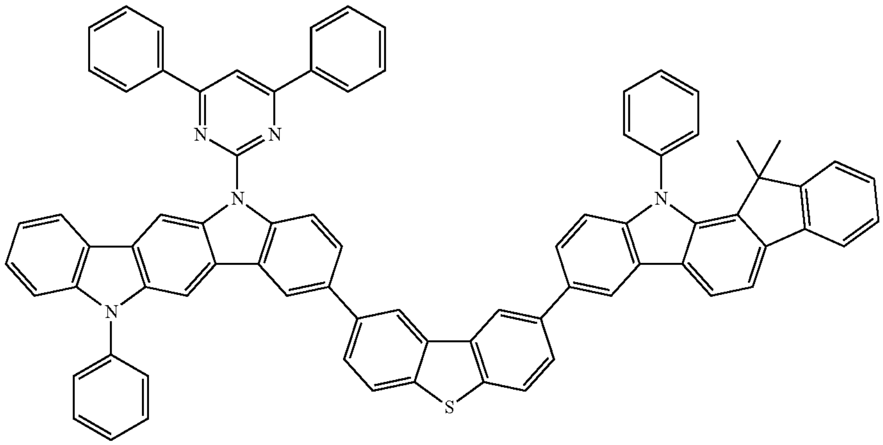
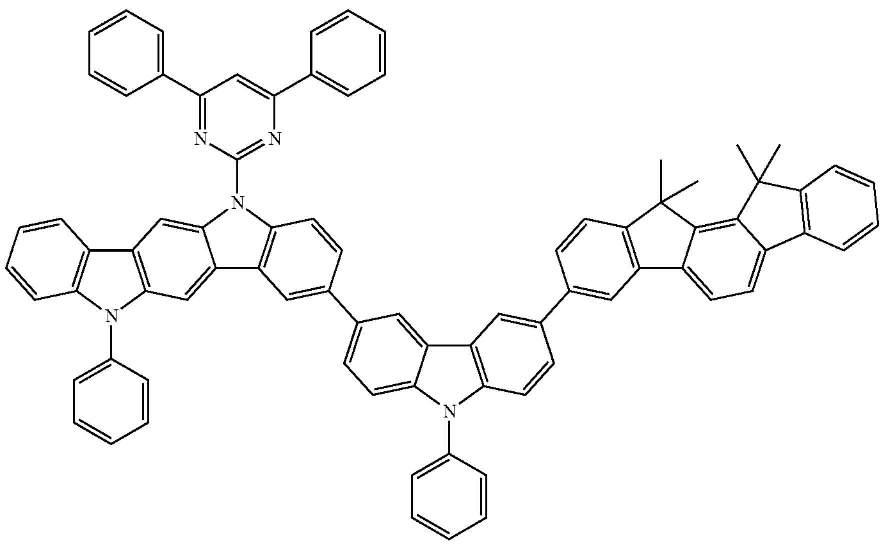
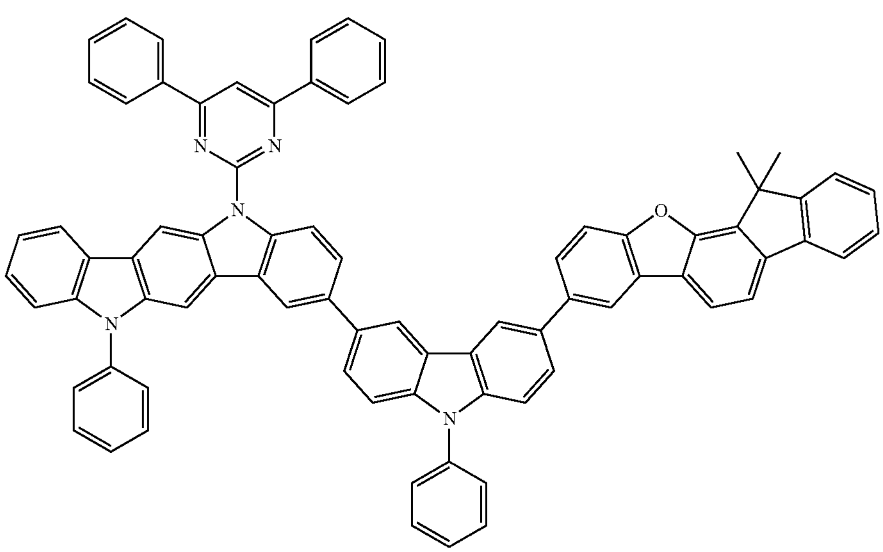

-continued
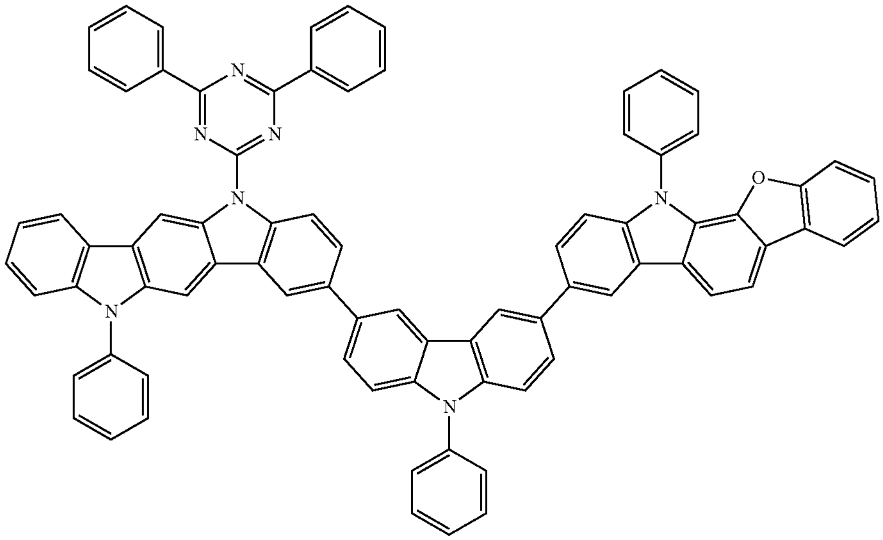
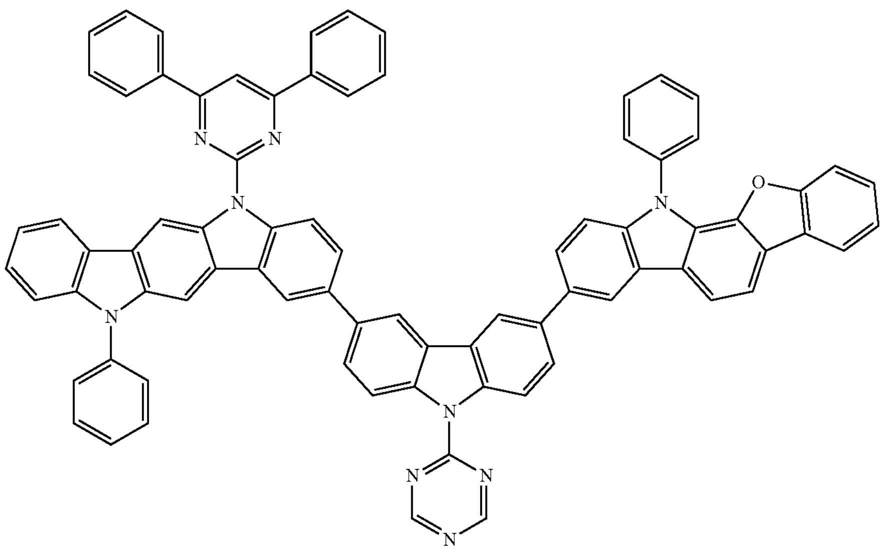
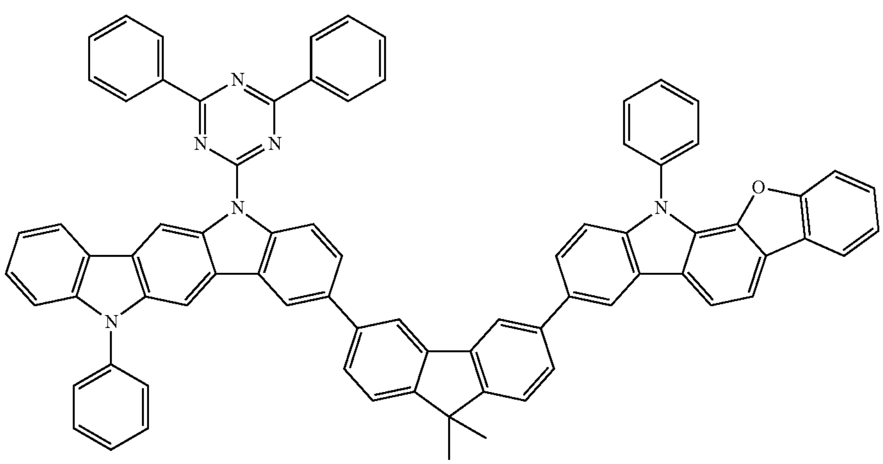

-continued
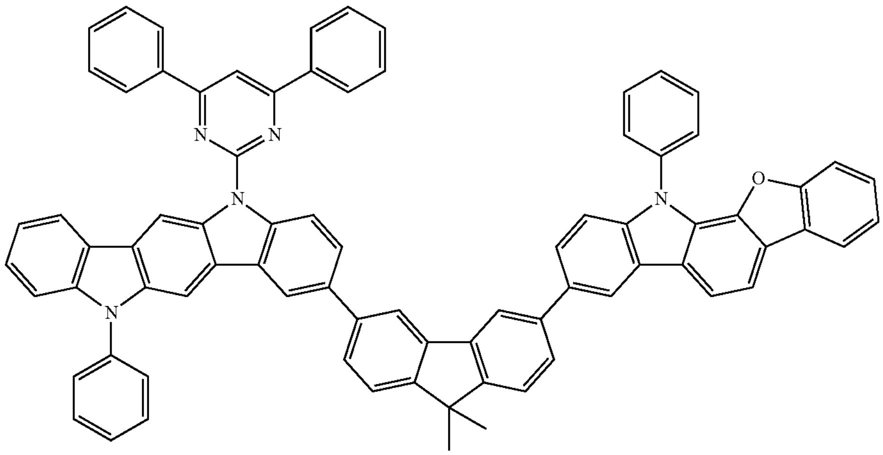
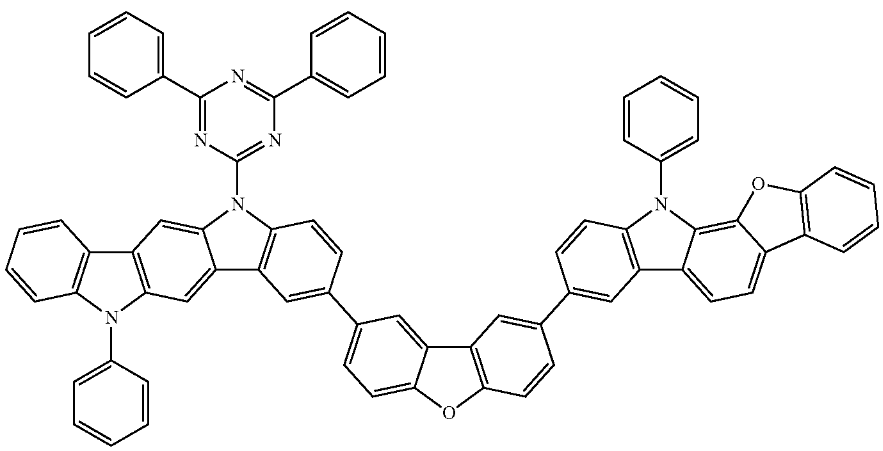
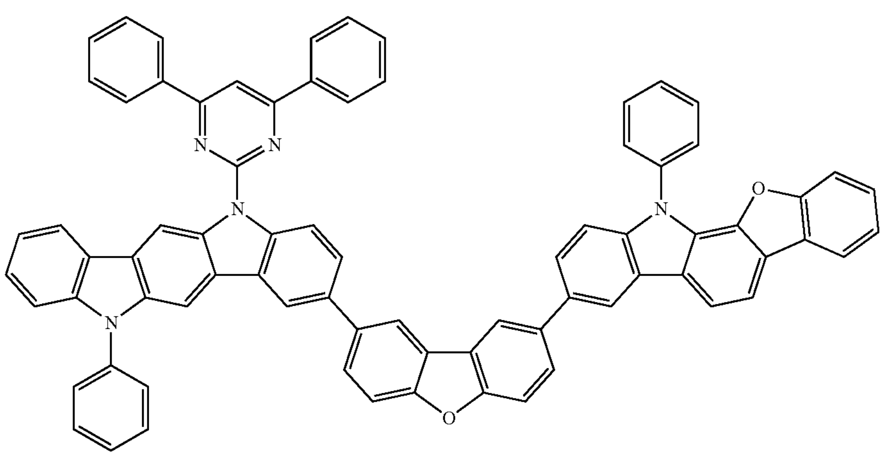

-continued
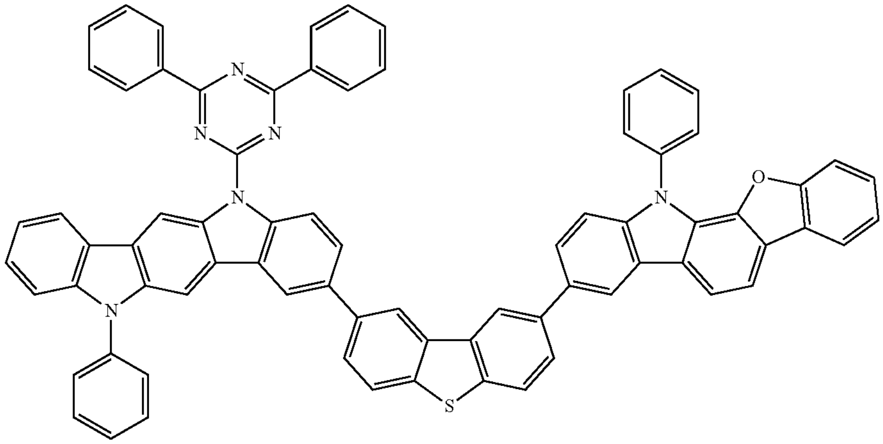
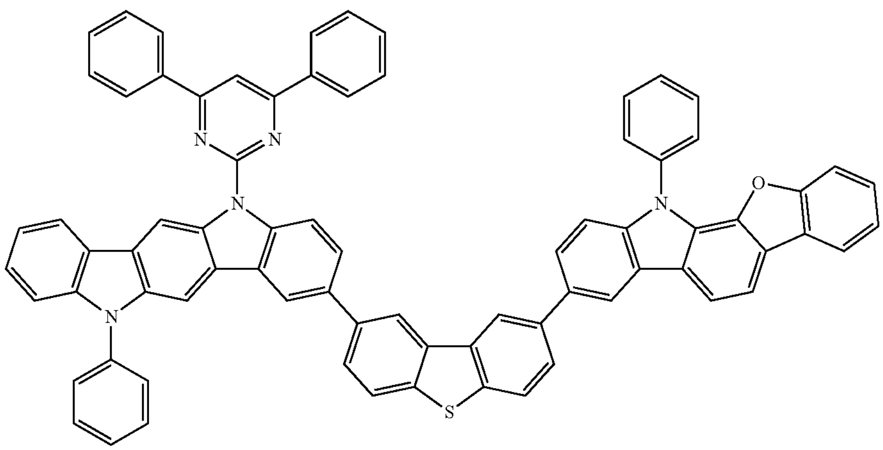
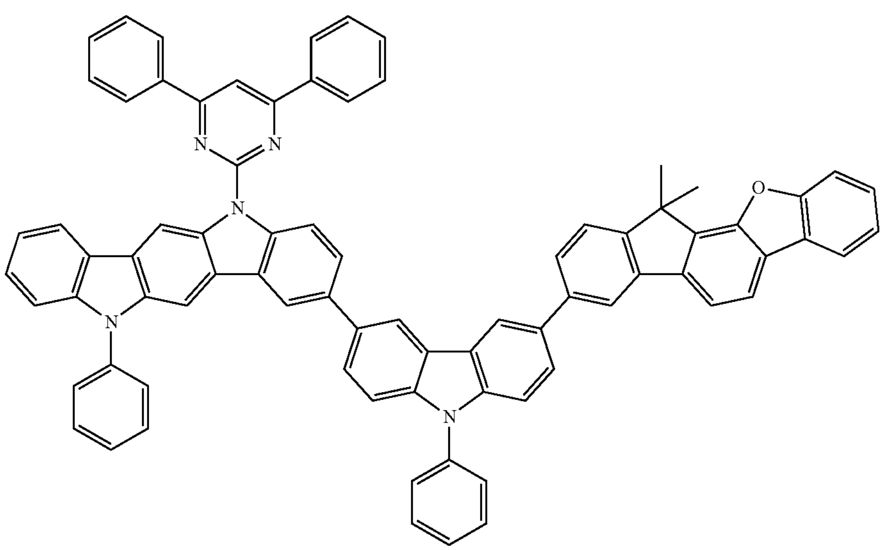

-continued
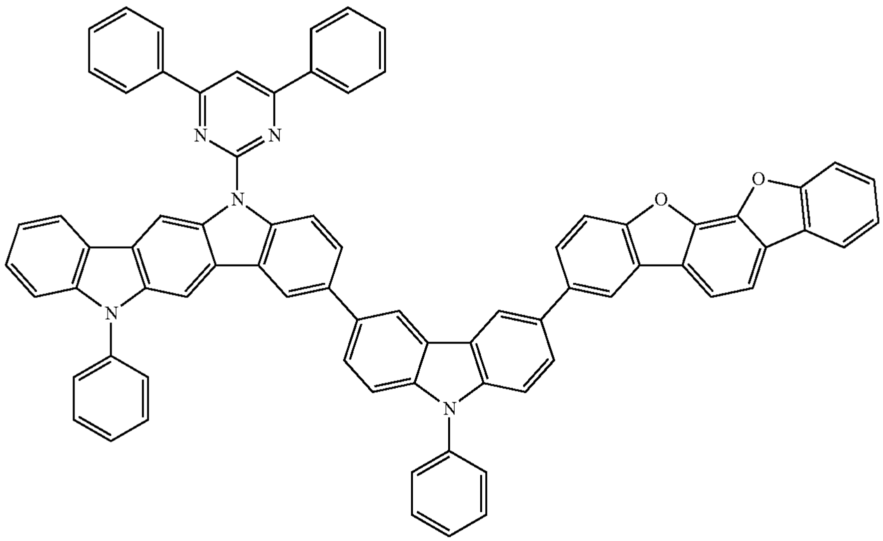
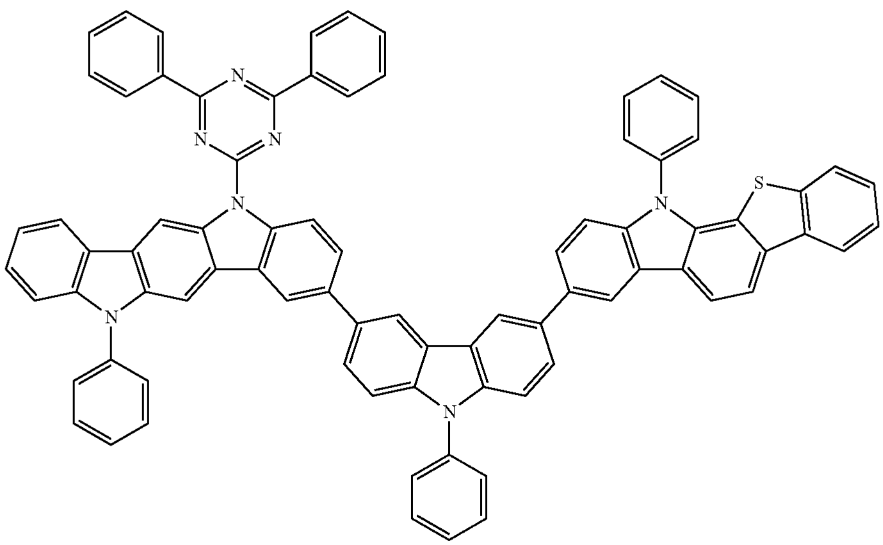
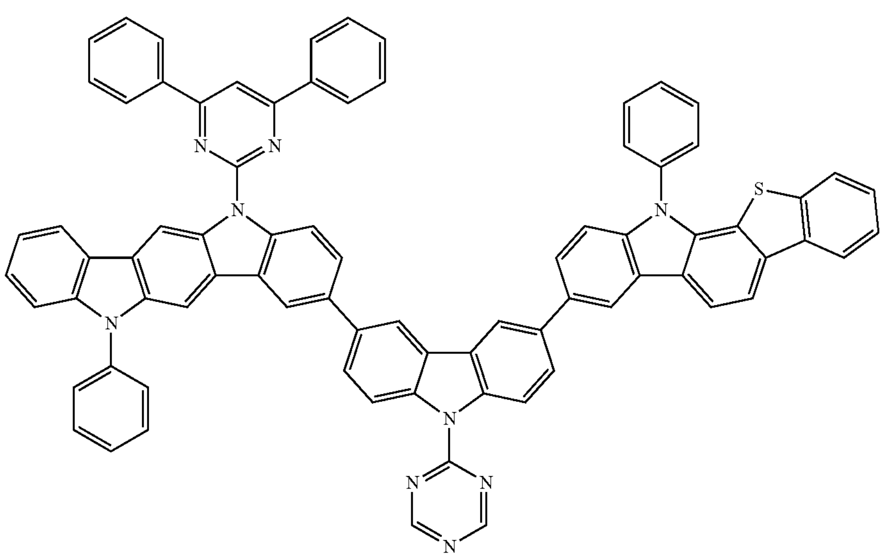

-continued
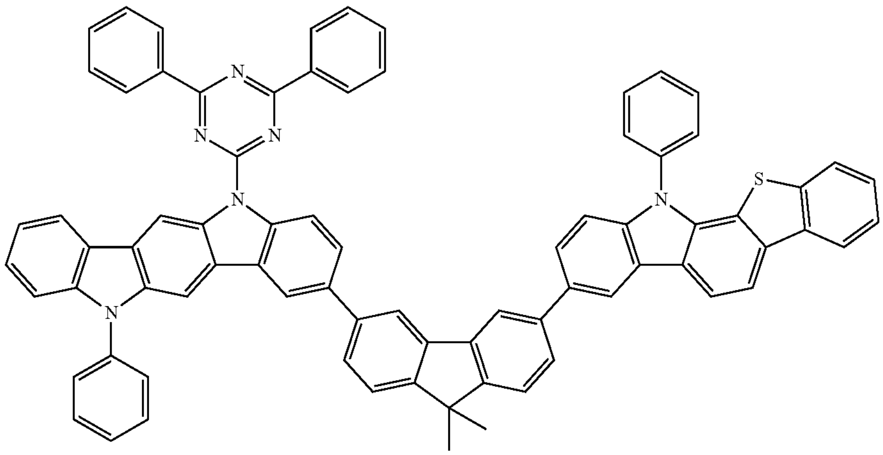
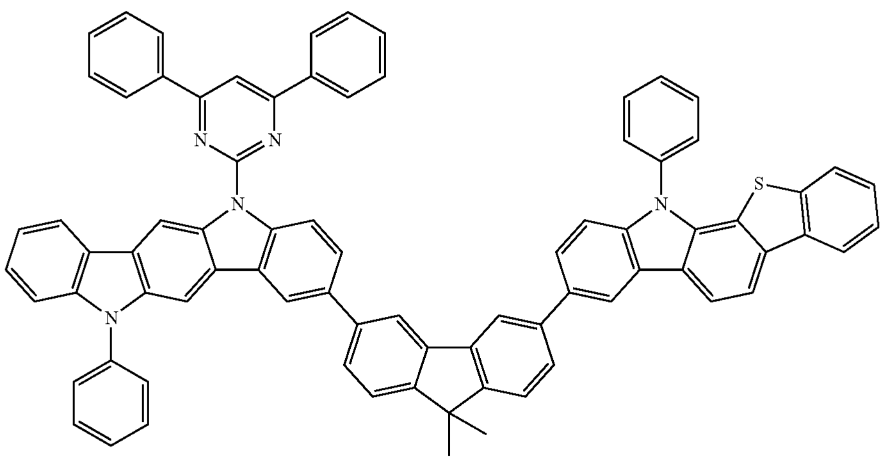
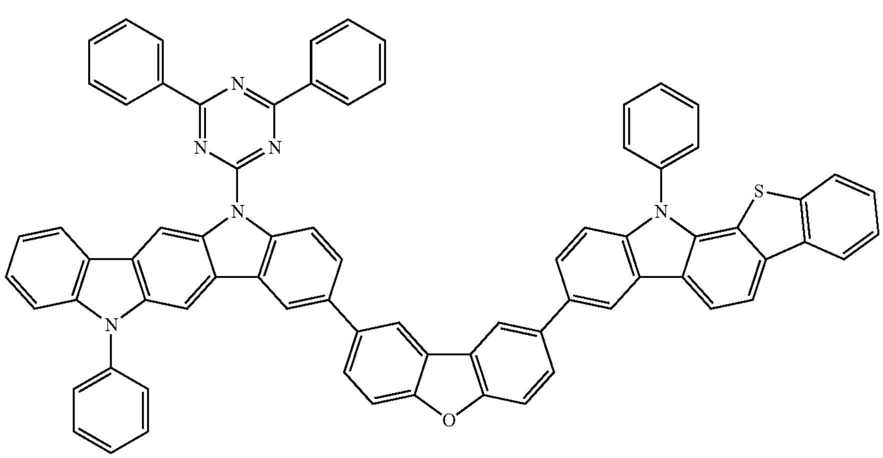

-continued
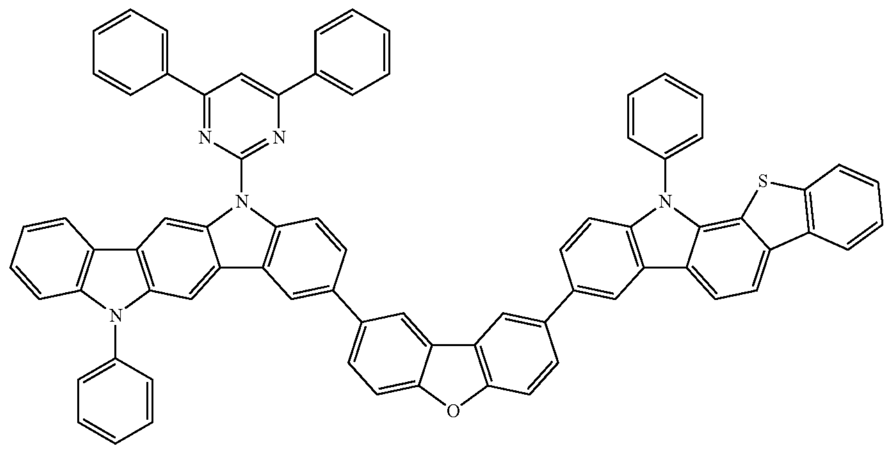
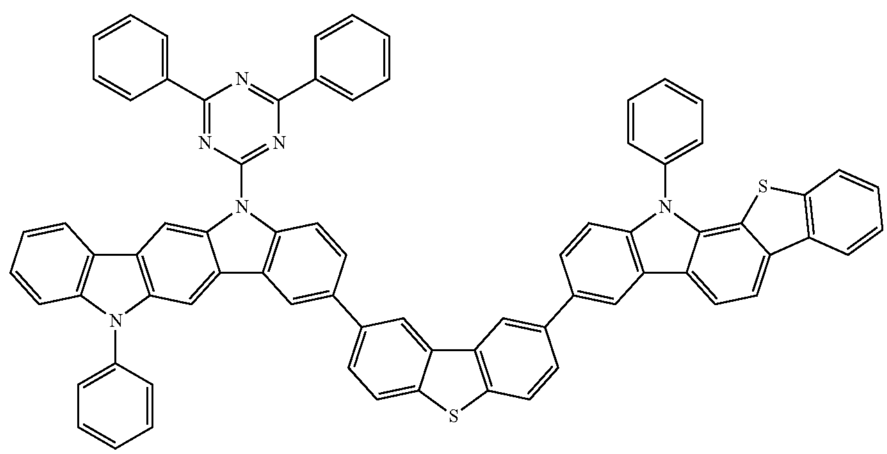
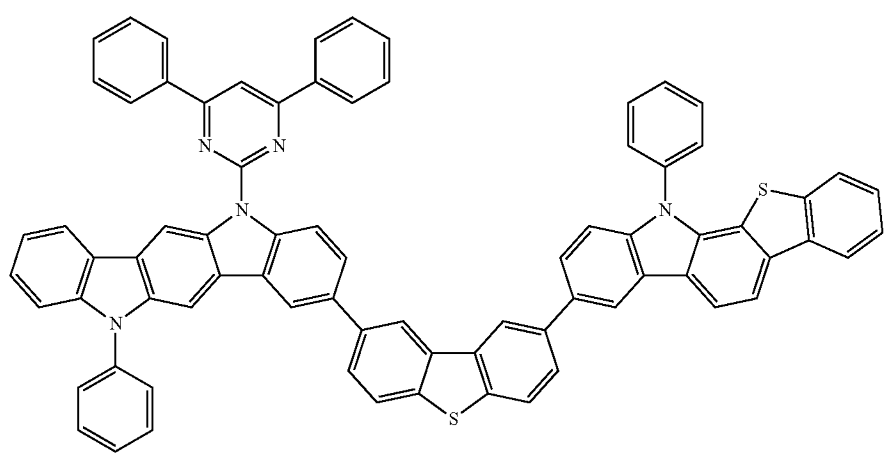

-continued
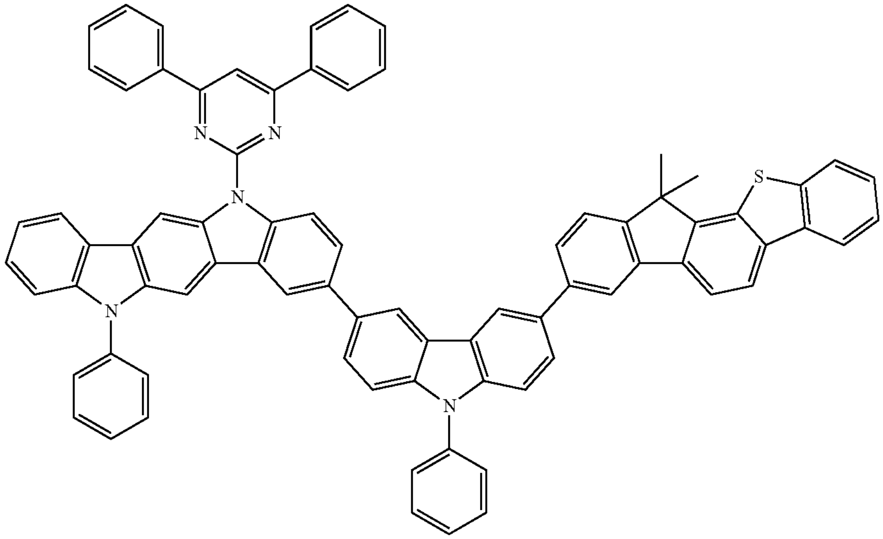
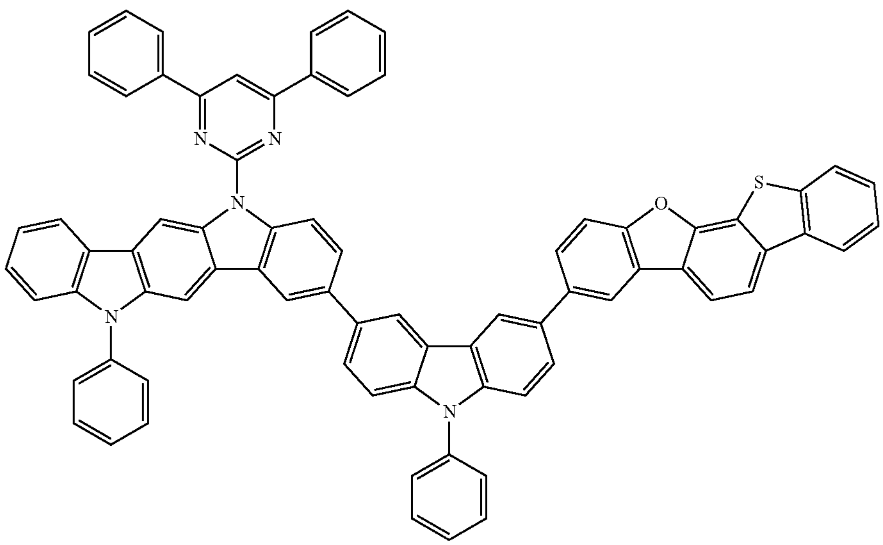
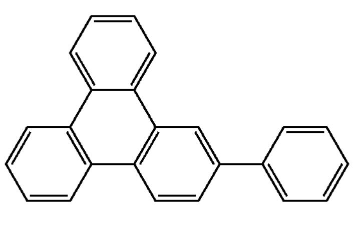
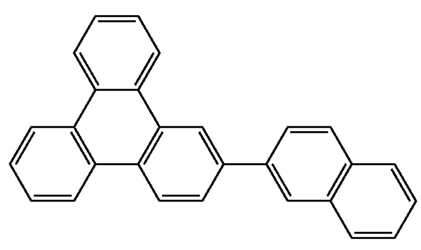
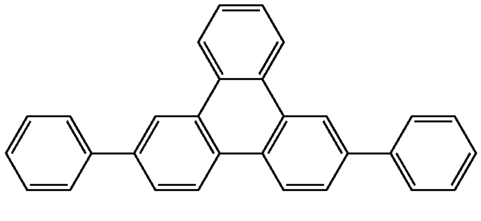
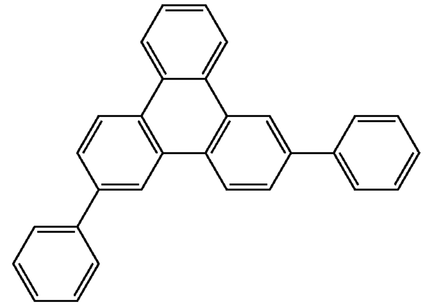

-continued
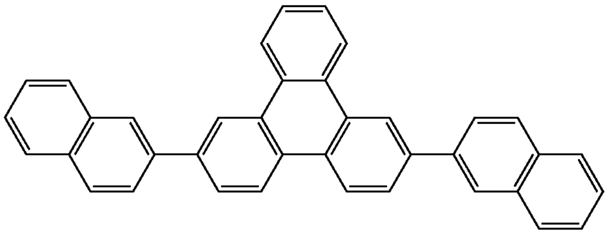
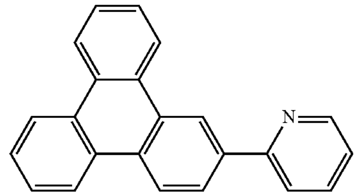
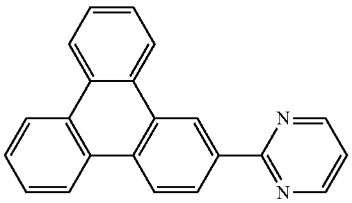
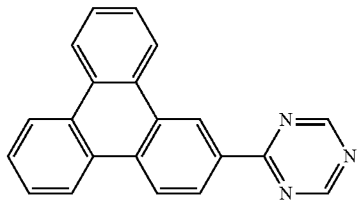
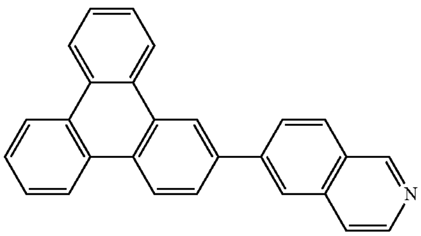
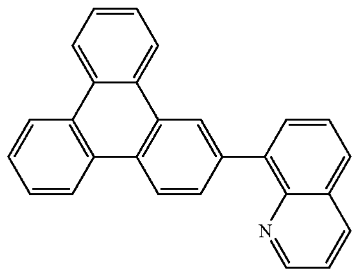
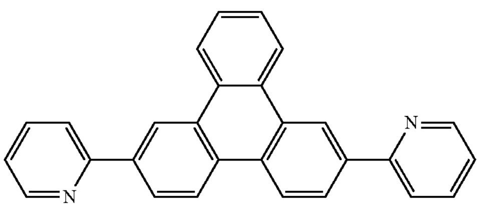
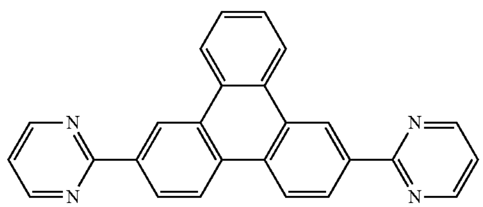
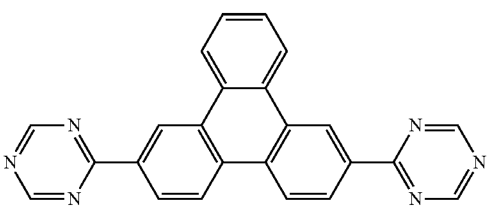
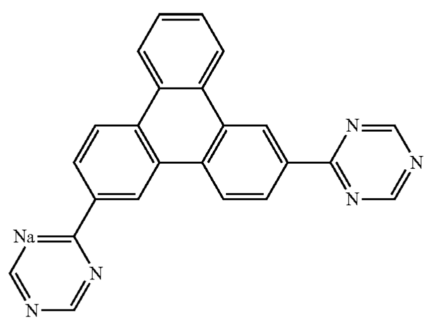
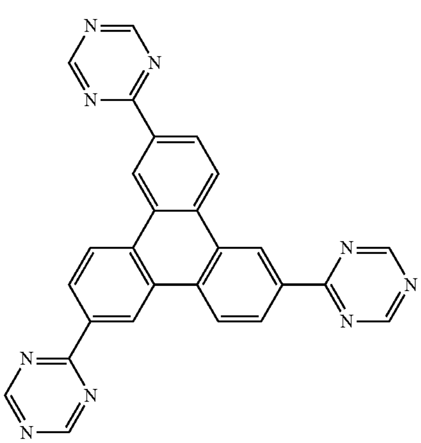
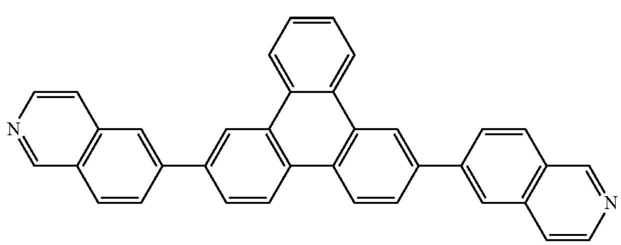

-continued
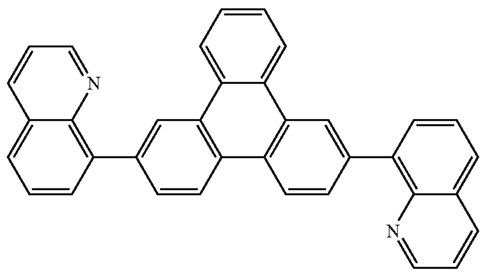
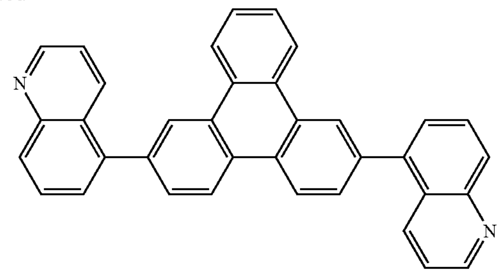
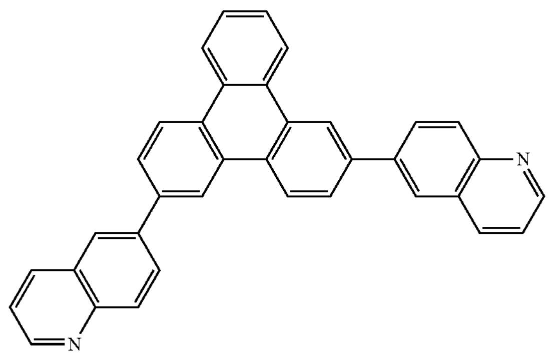
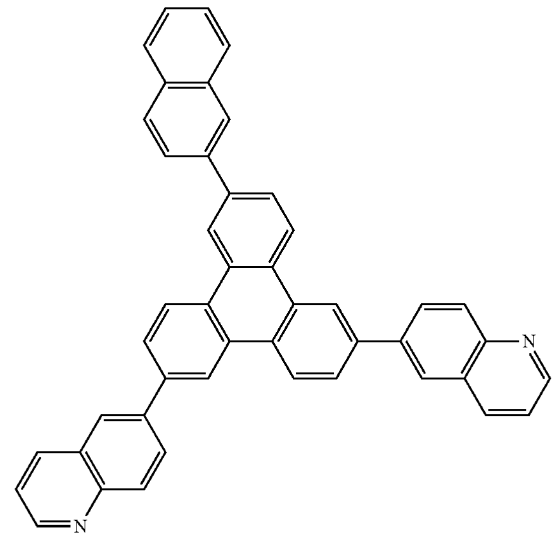
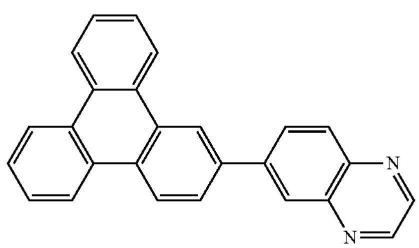
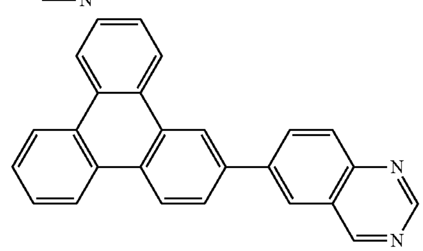
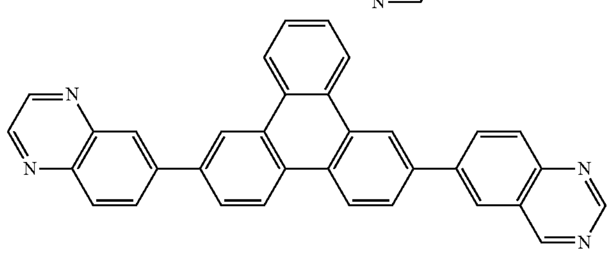
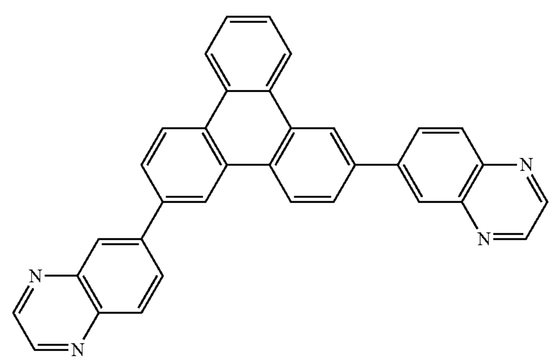
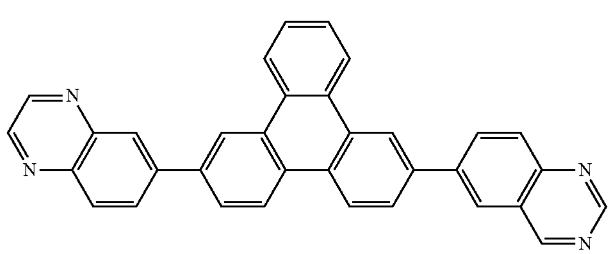
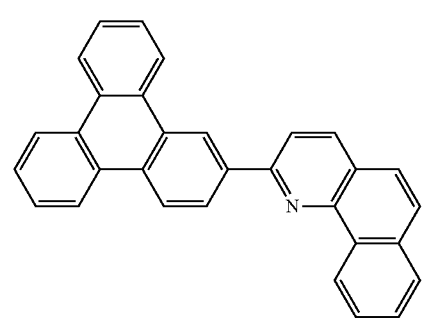

-continued
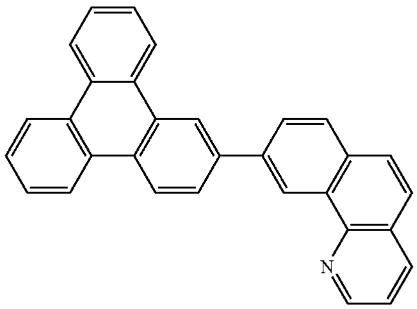
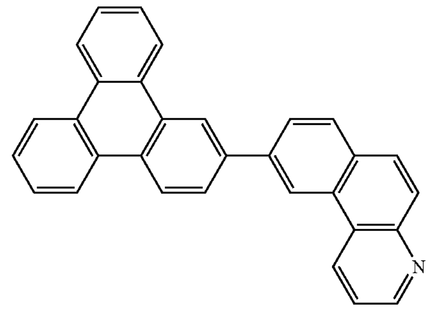
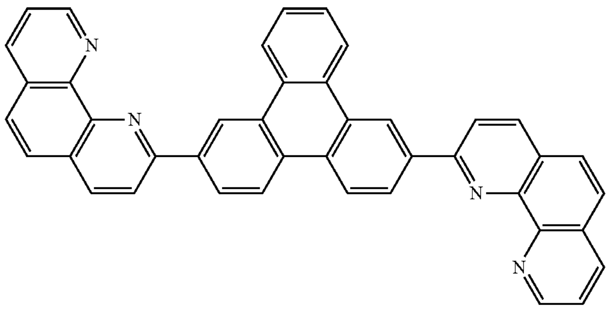
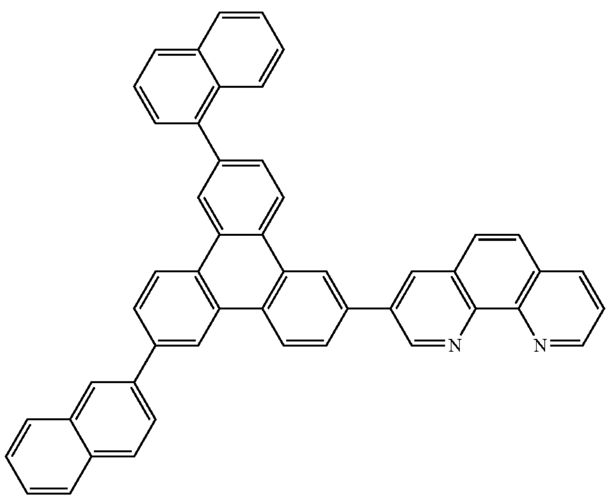
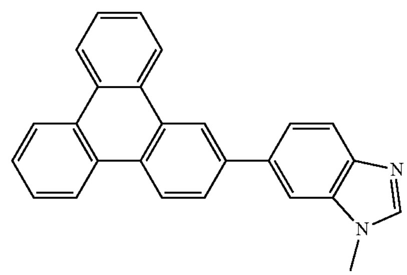
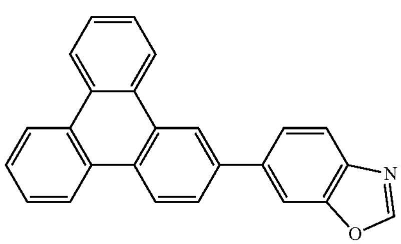
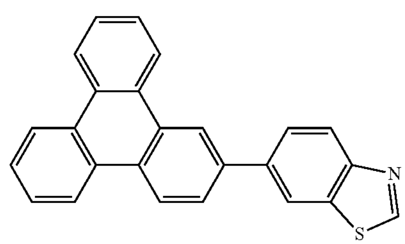
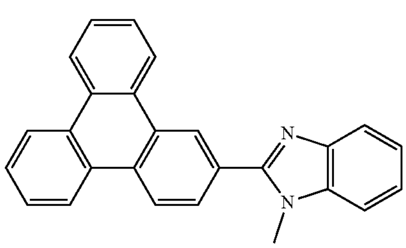
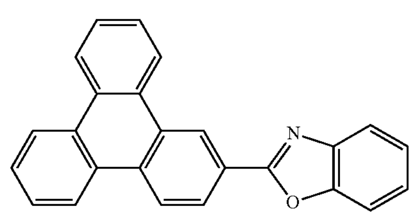

-continued
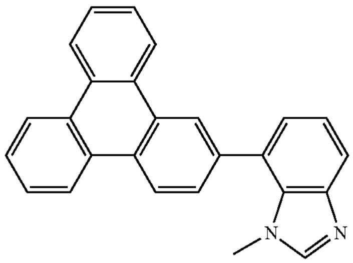
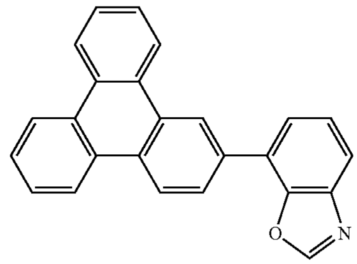
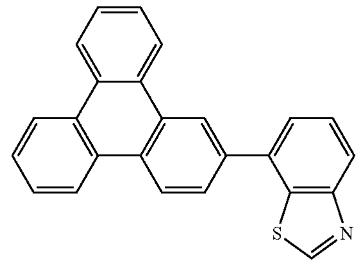
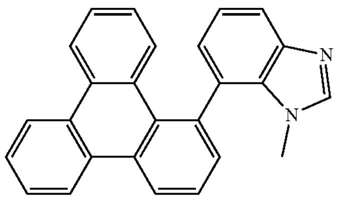
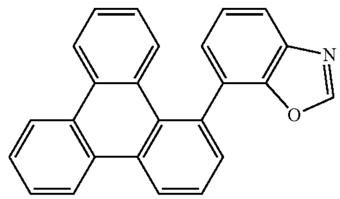
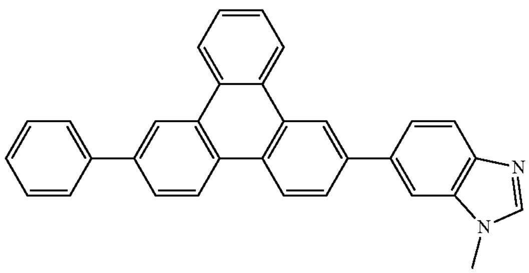
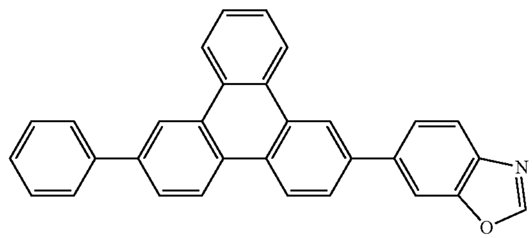
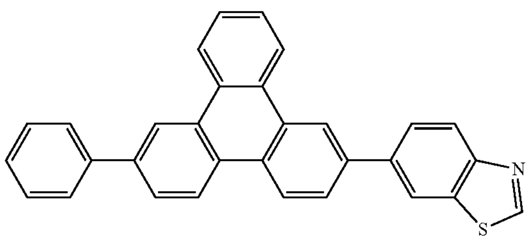
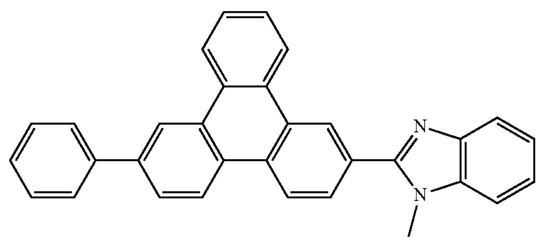
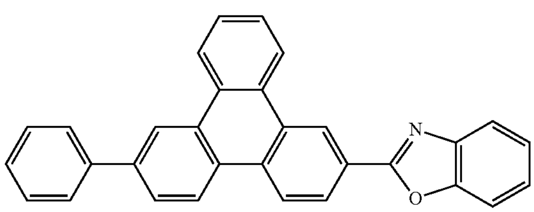
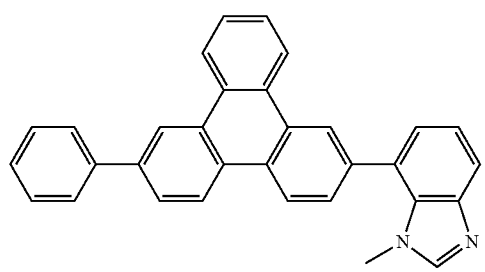
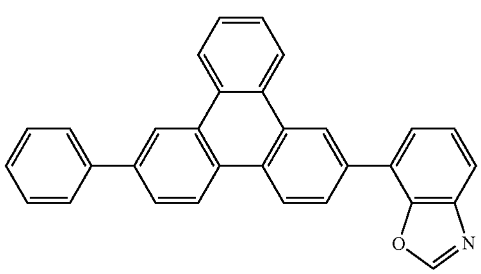
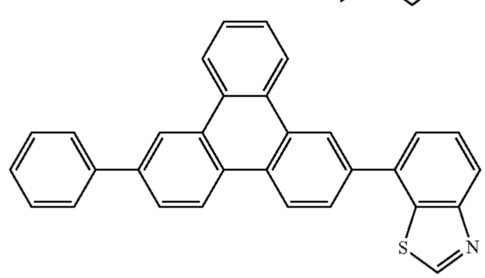
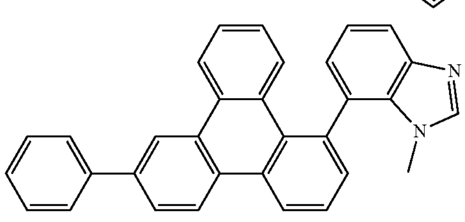
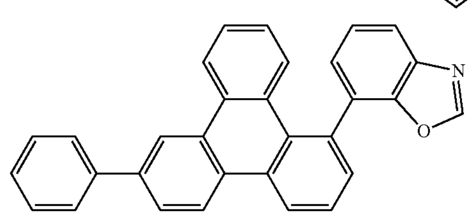

-continued
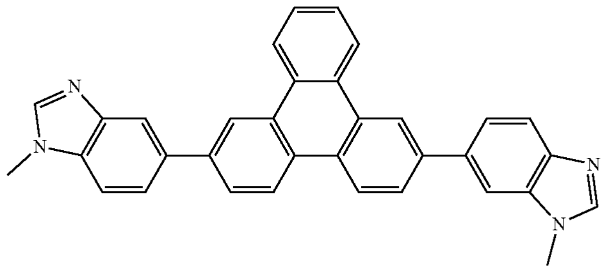
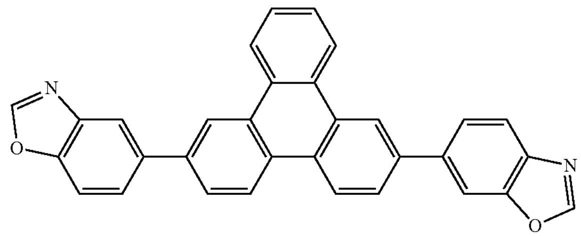
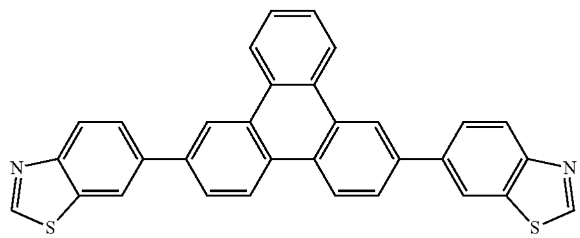
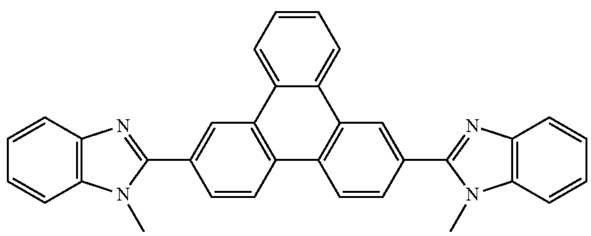
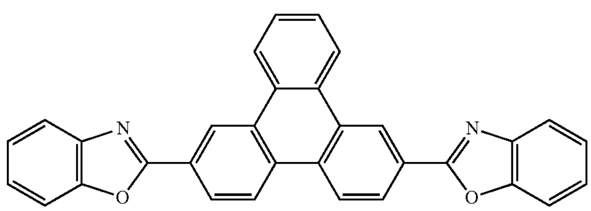
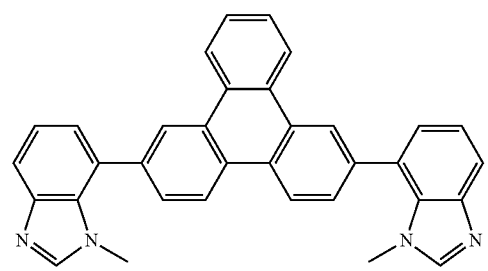
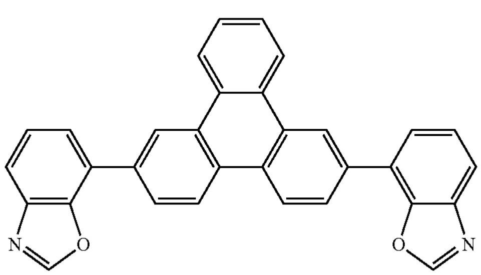
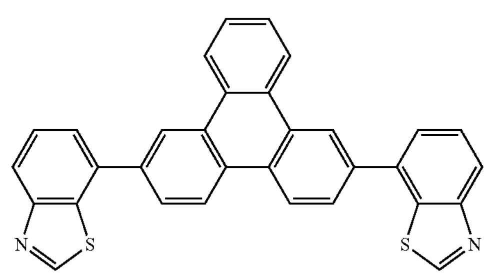

-continued
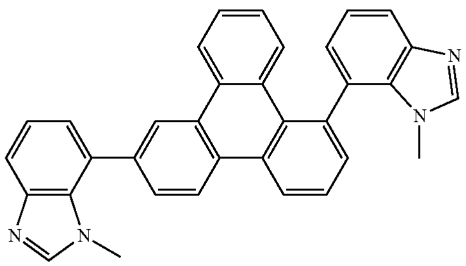
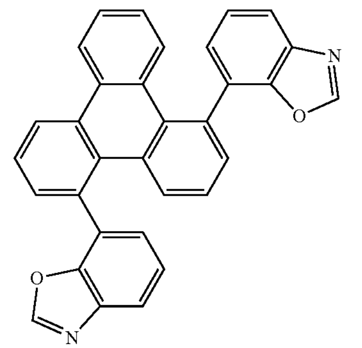
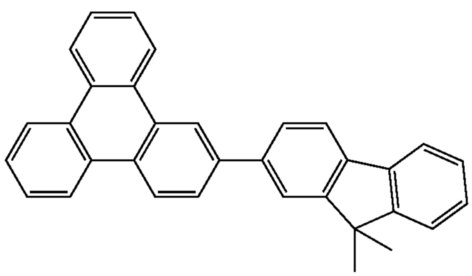
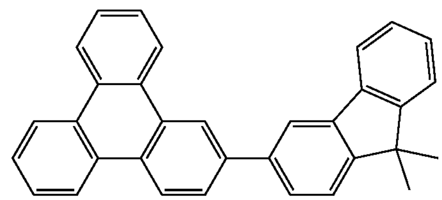
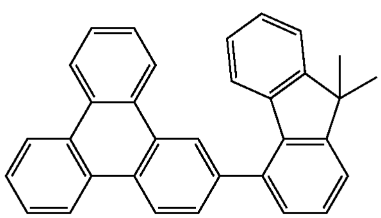
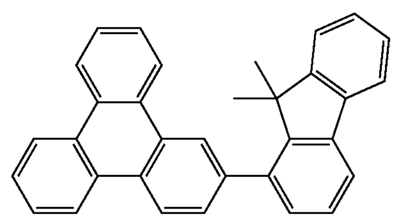
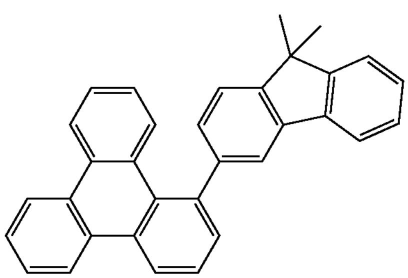
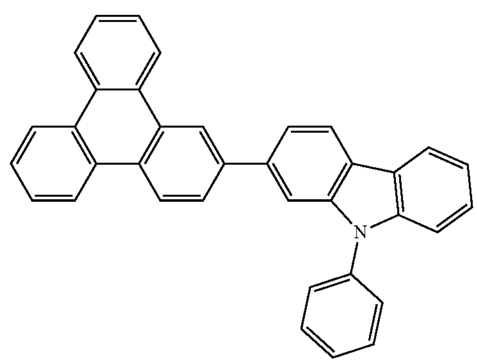
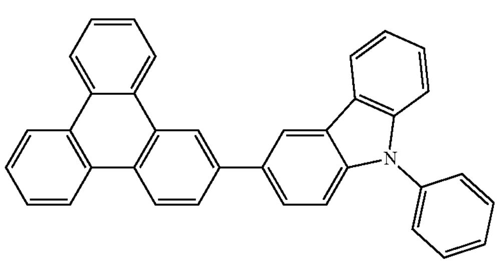
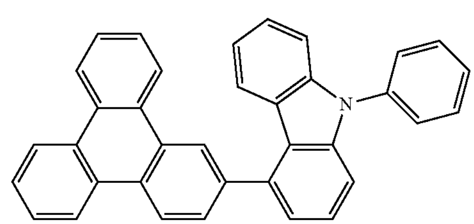

-continued
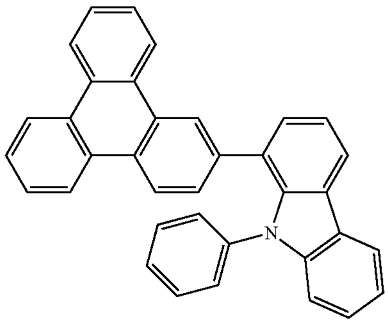
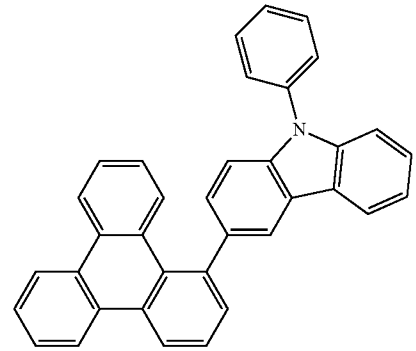
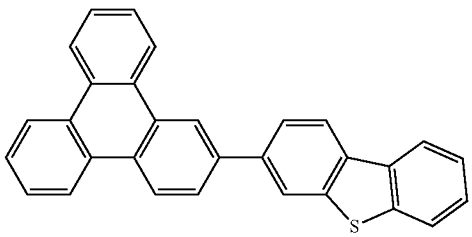
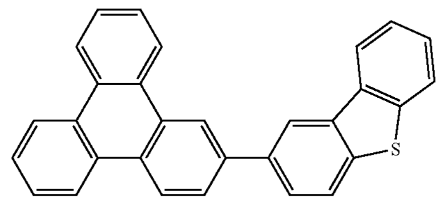
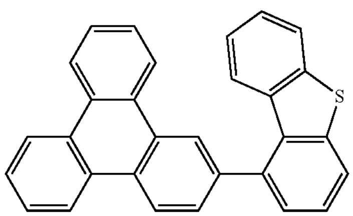
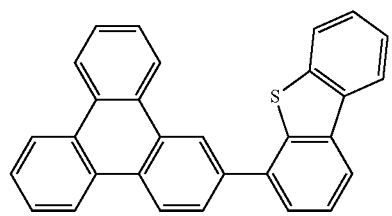
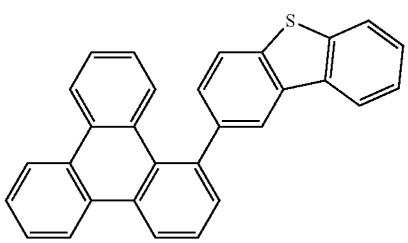
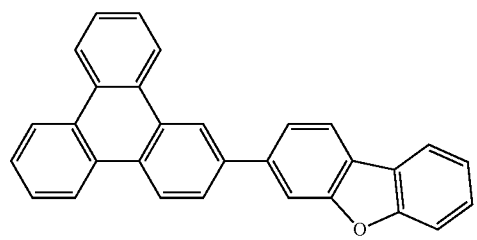
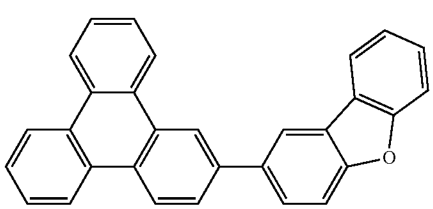
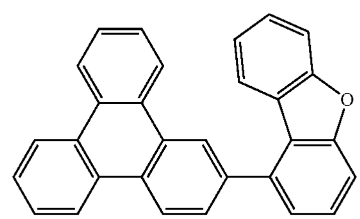
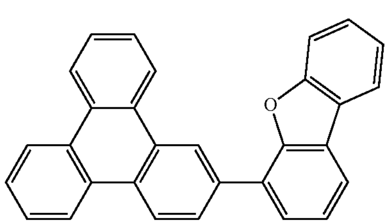
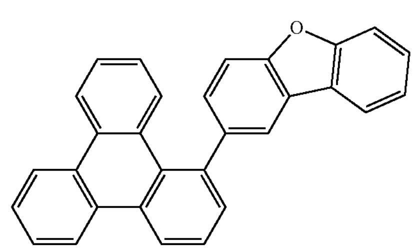

-continued
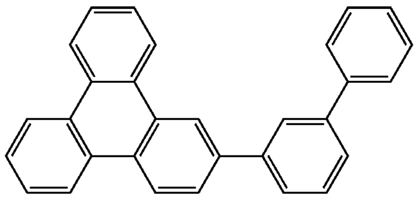
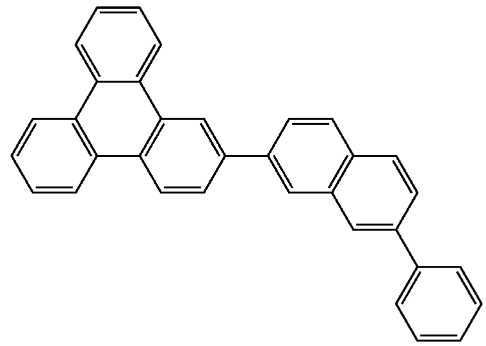
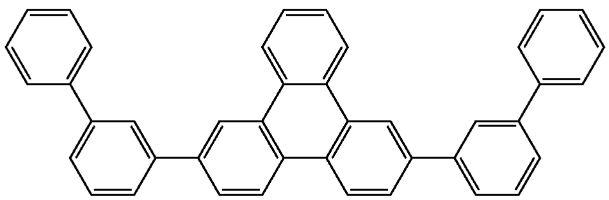
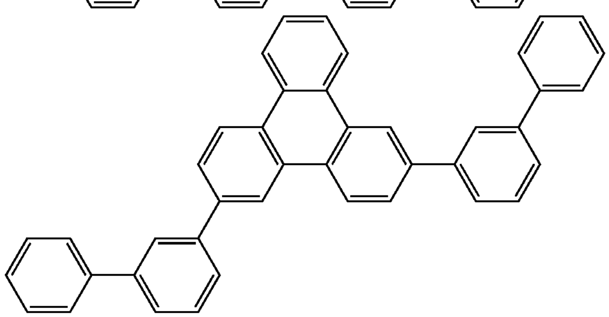
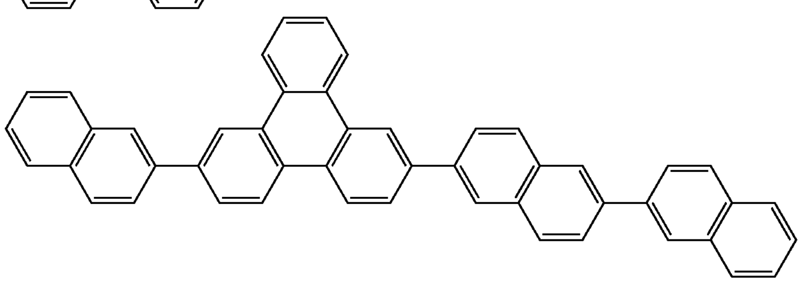
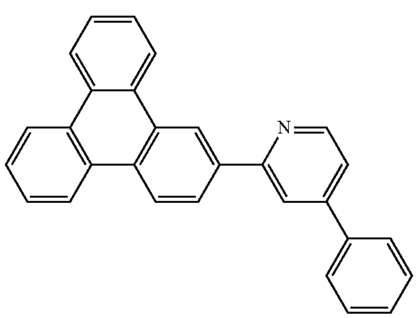
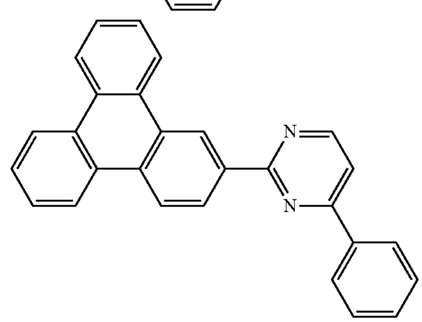
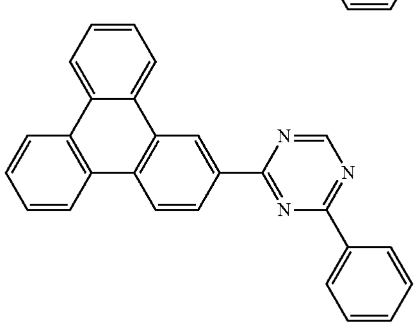
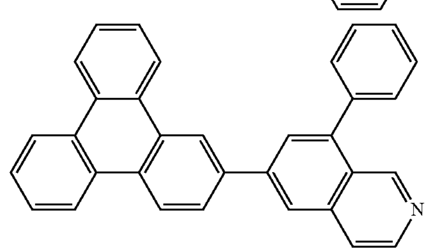

-continued
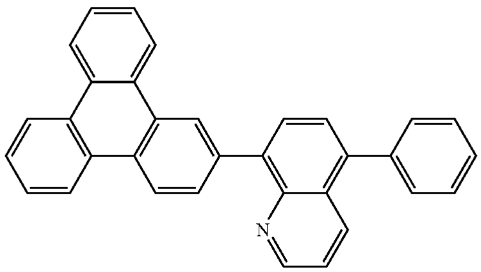
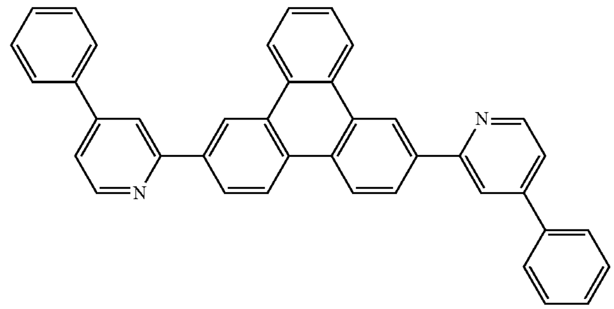
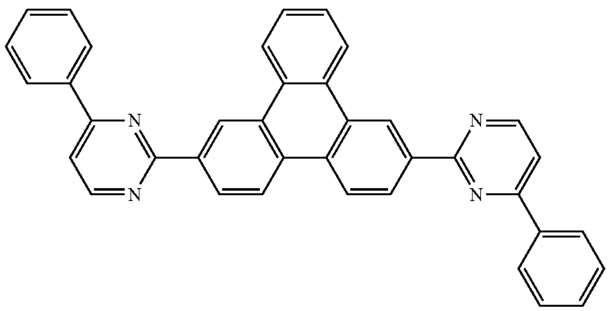
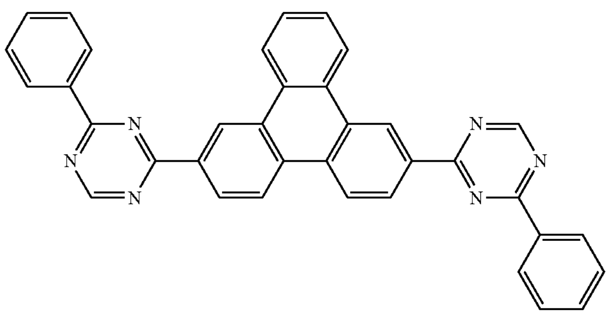
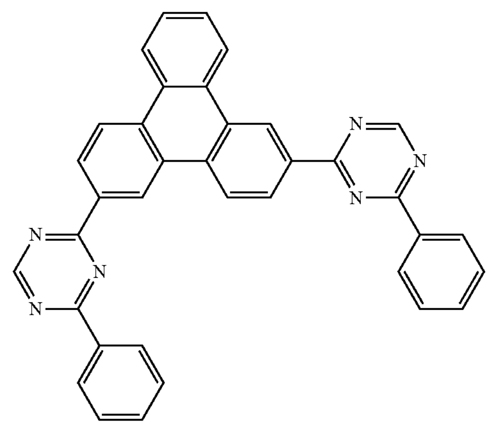
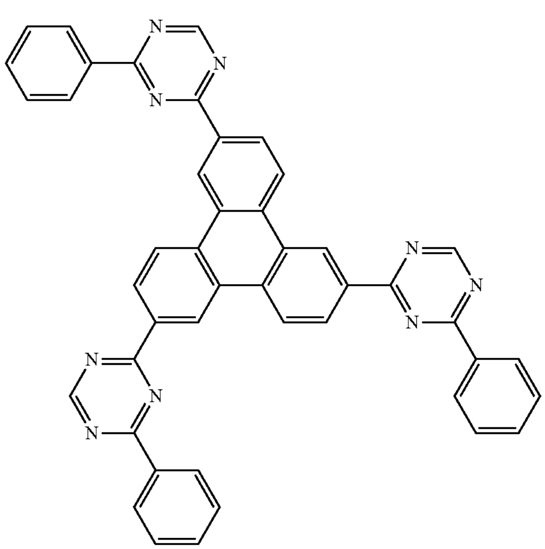

-continued
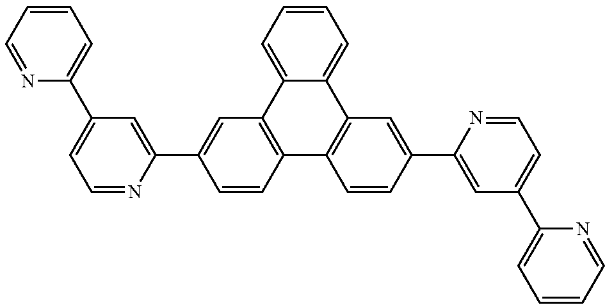
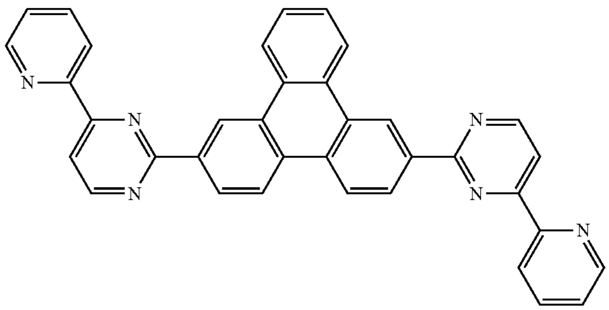
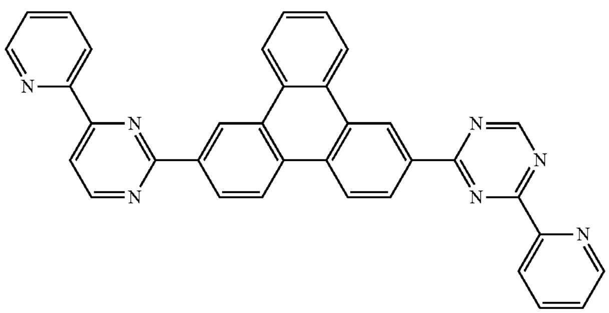
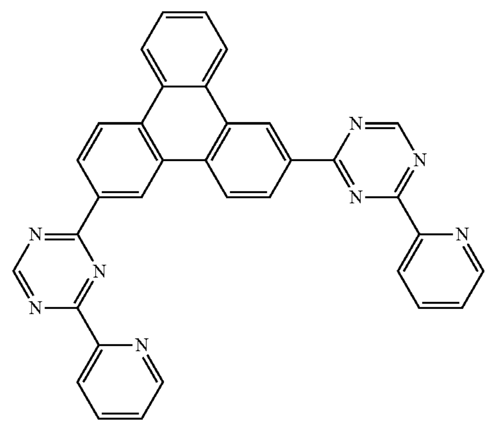
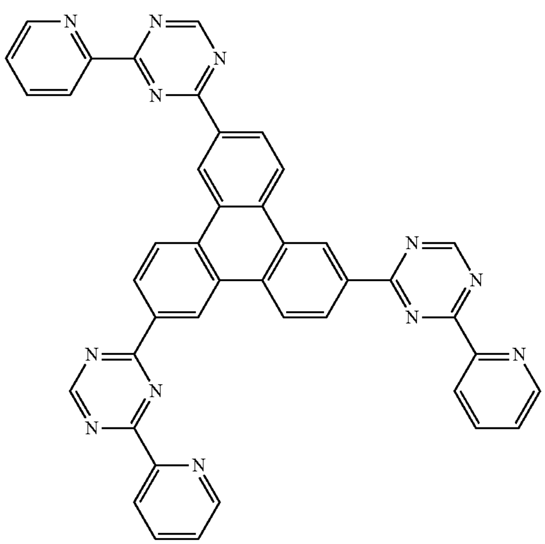
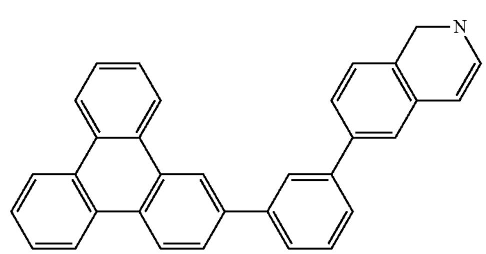

-continued
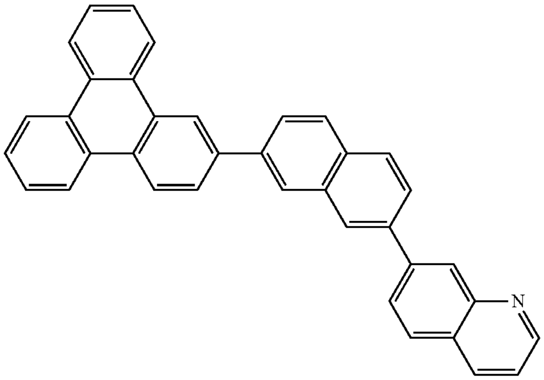
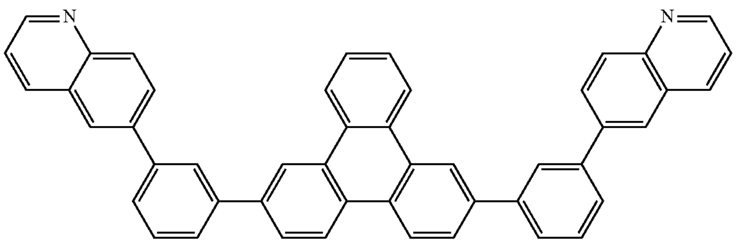
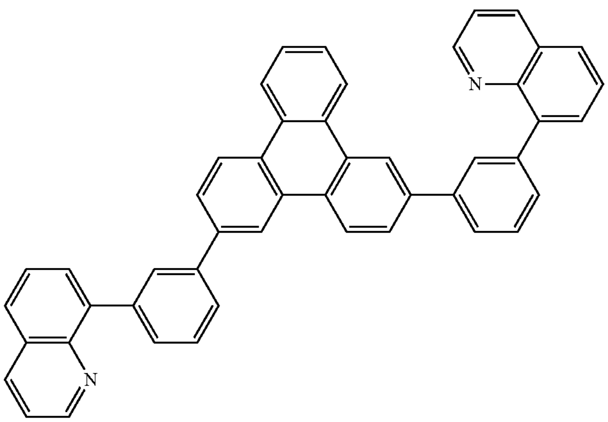
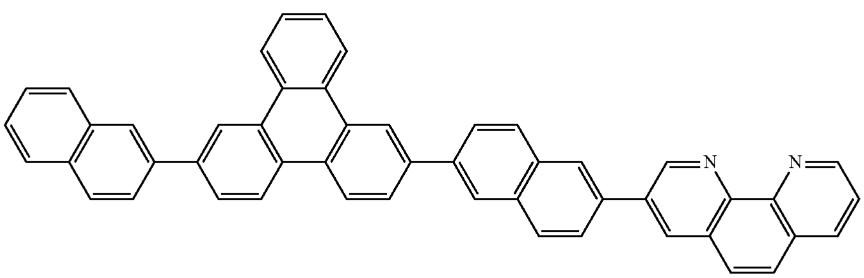
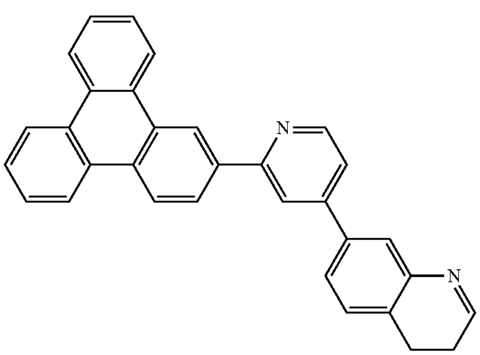
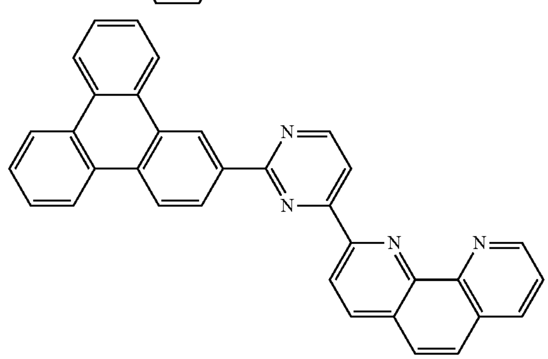

-continued
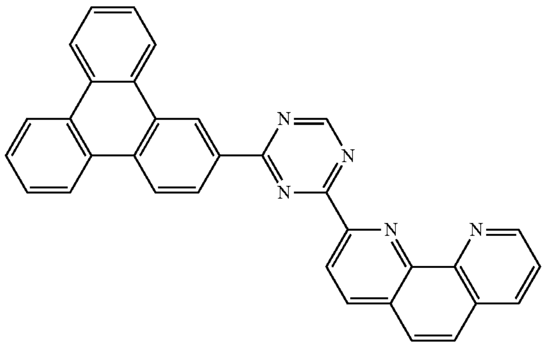
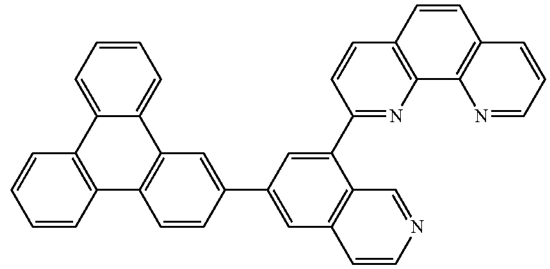
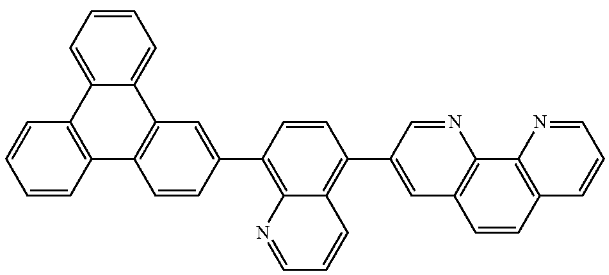
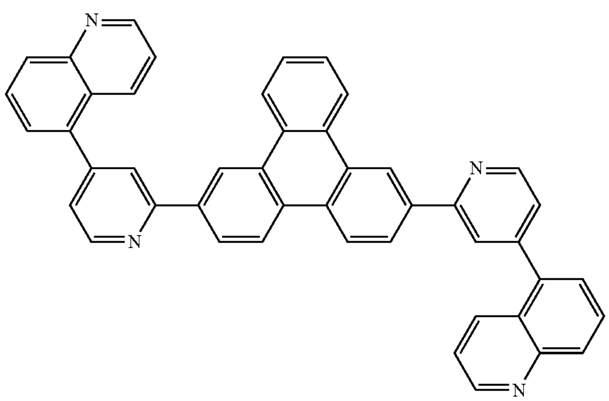
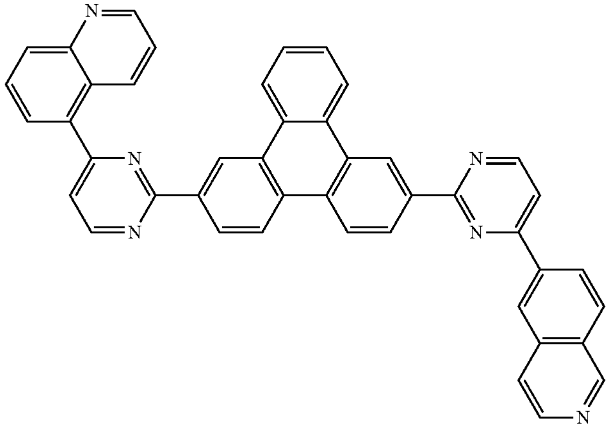

-continued
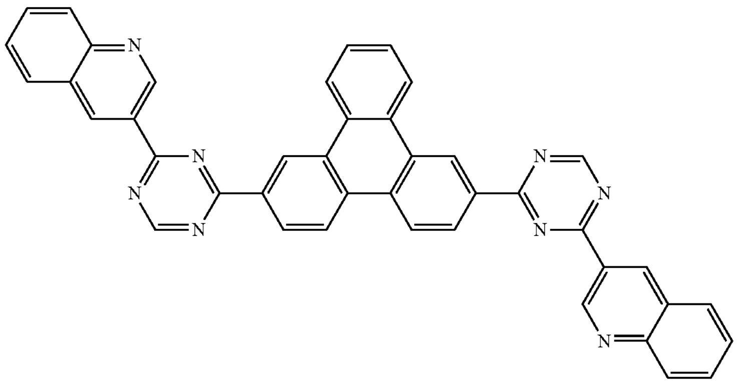
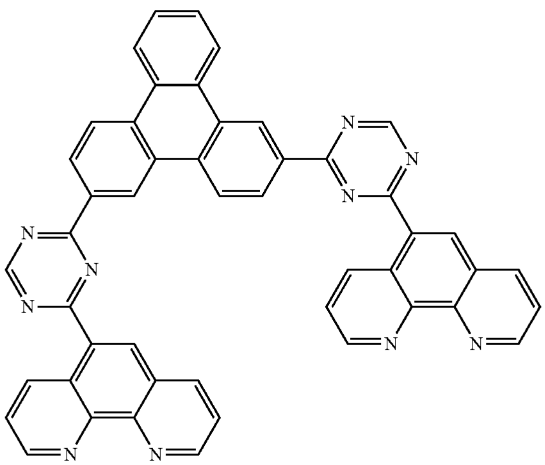
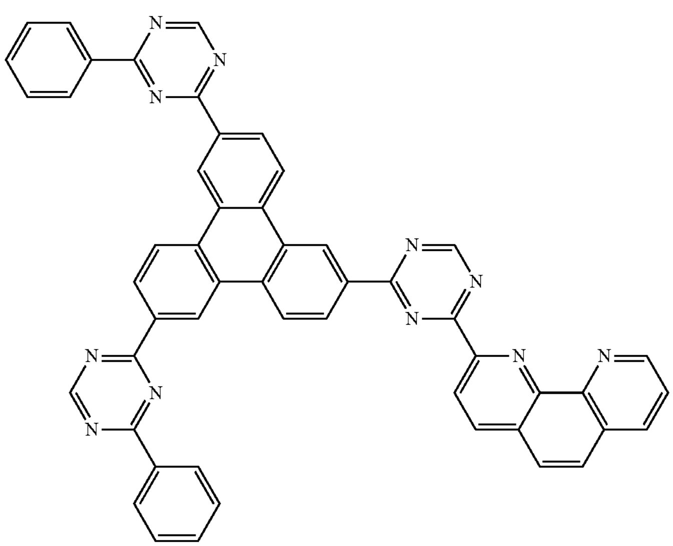
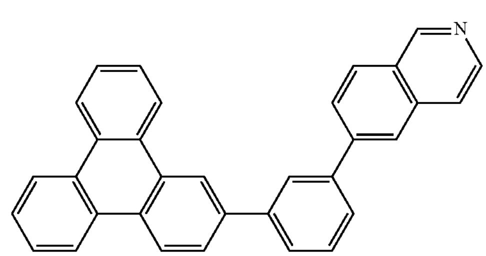

-continued
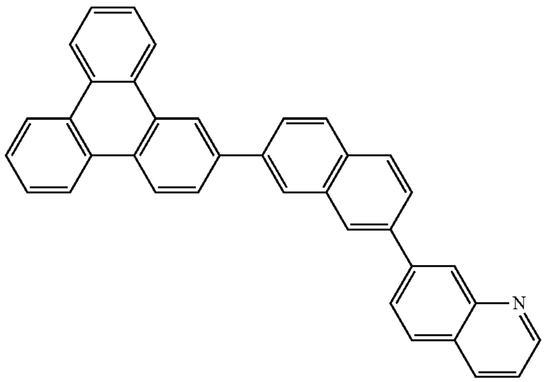
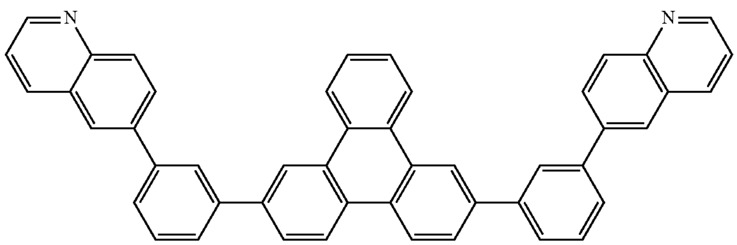
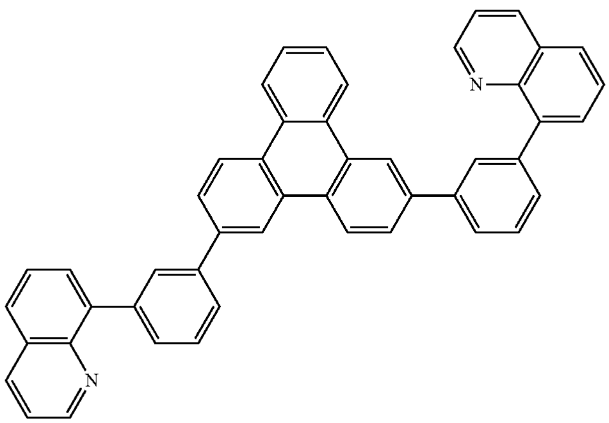
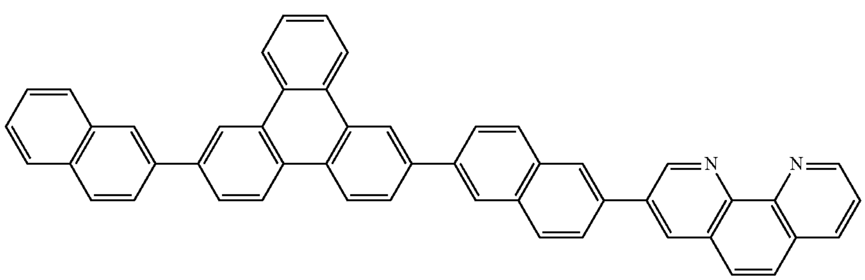
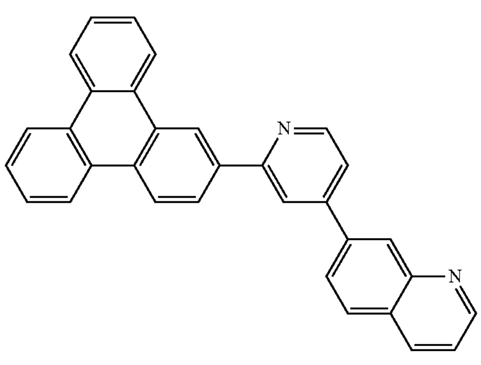
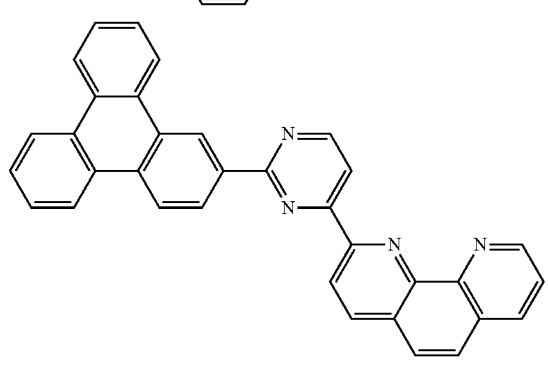

-continued
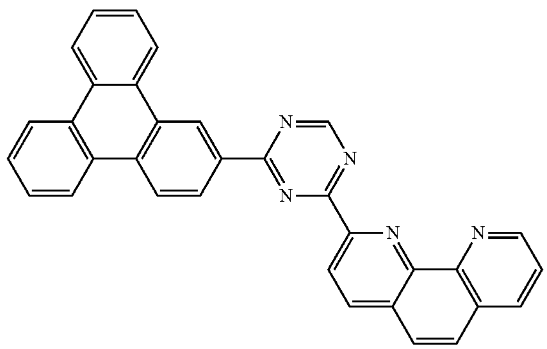
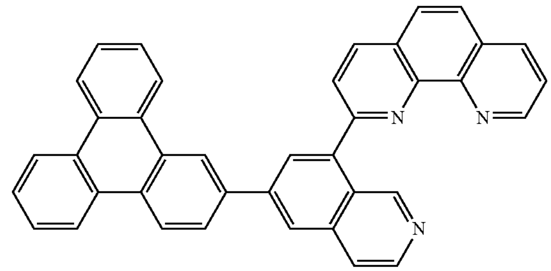
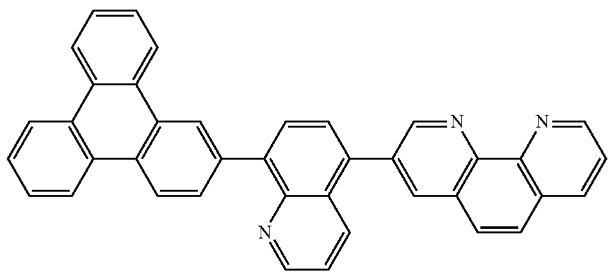
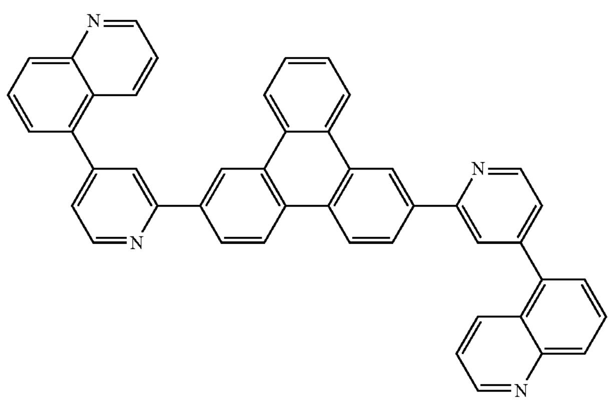
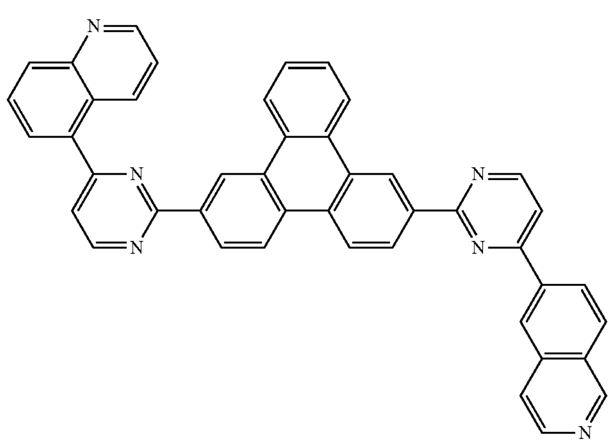

-continued
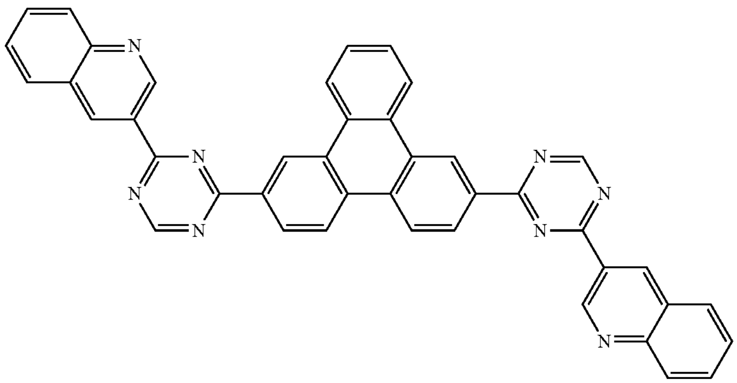
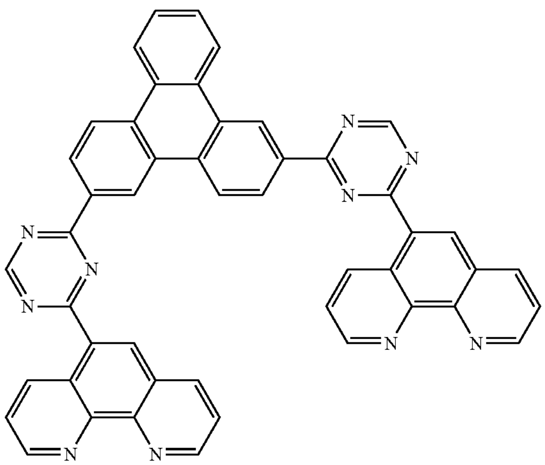
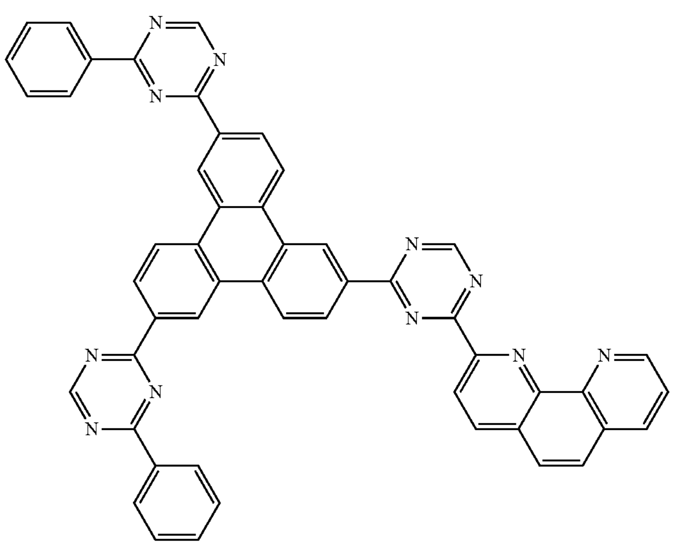
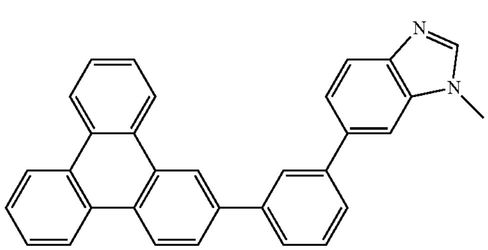
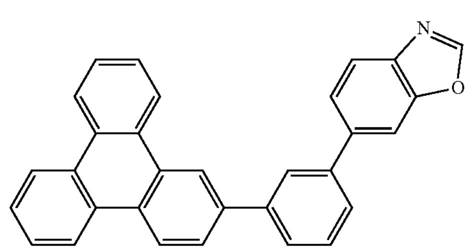

-continued
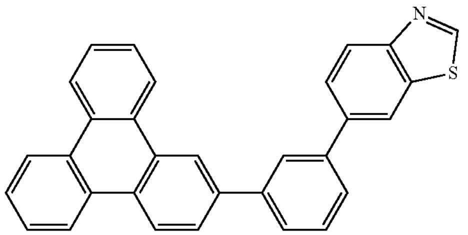
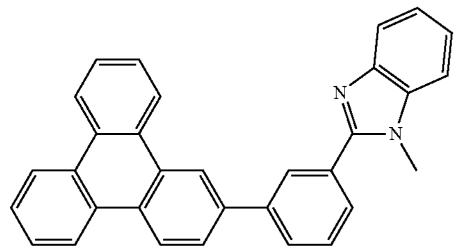
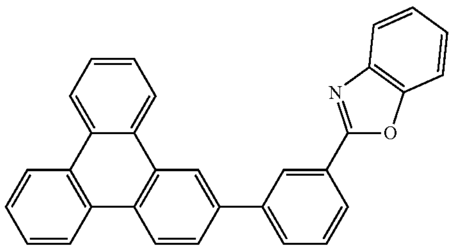
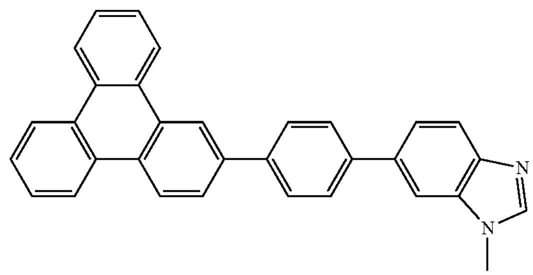
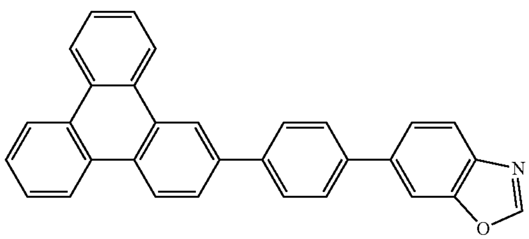
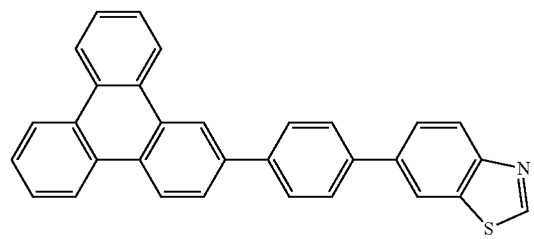
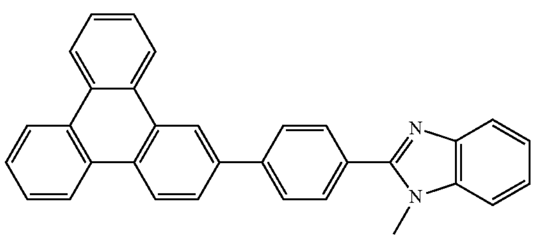
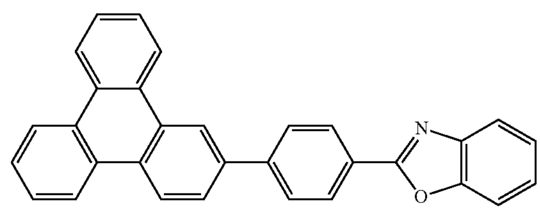
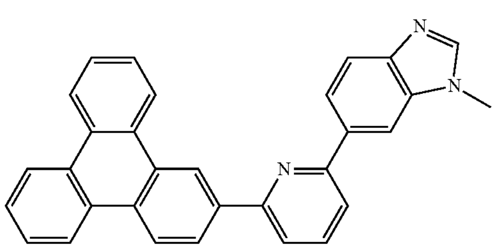
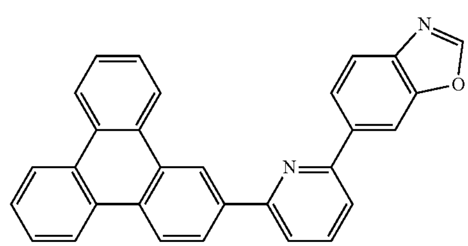
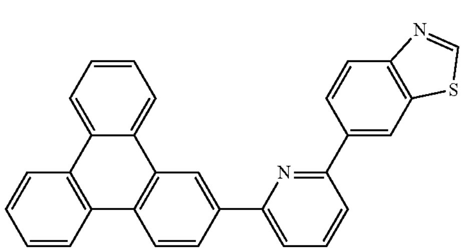
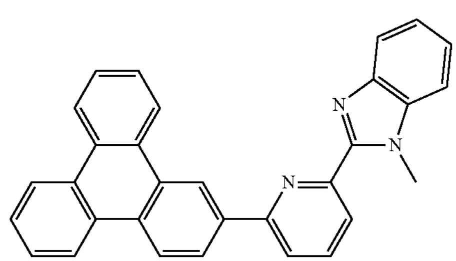

-continued
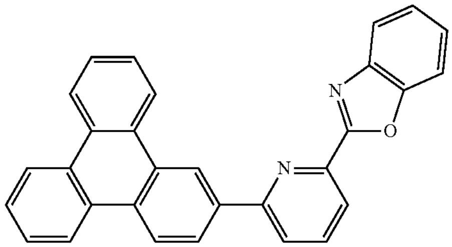
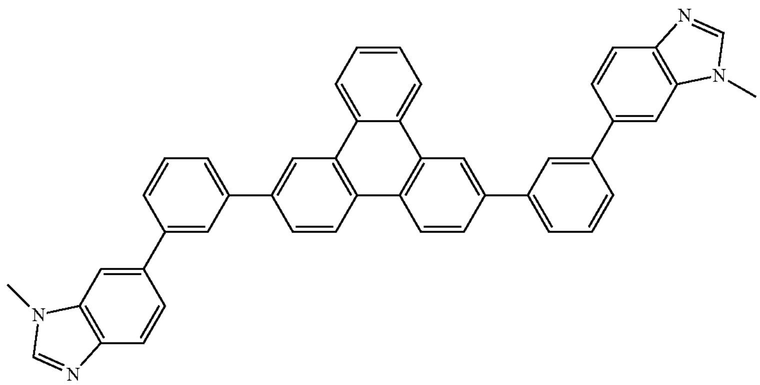
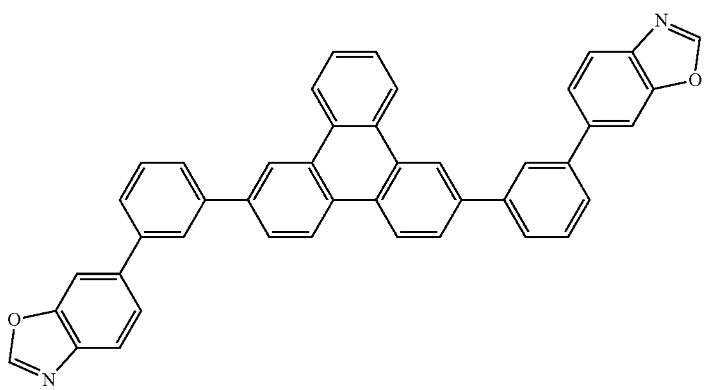
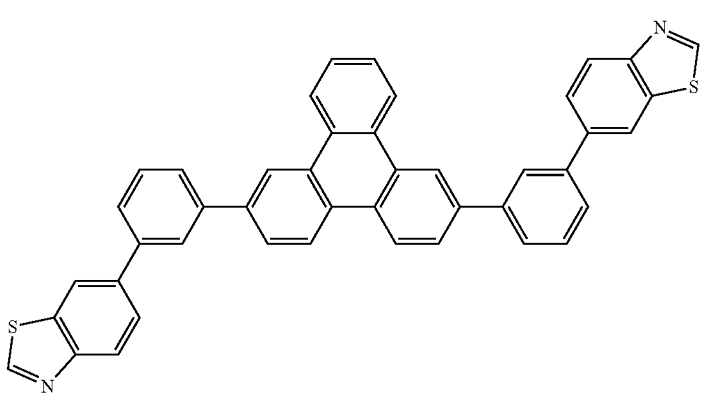

-continued
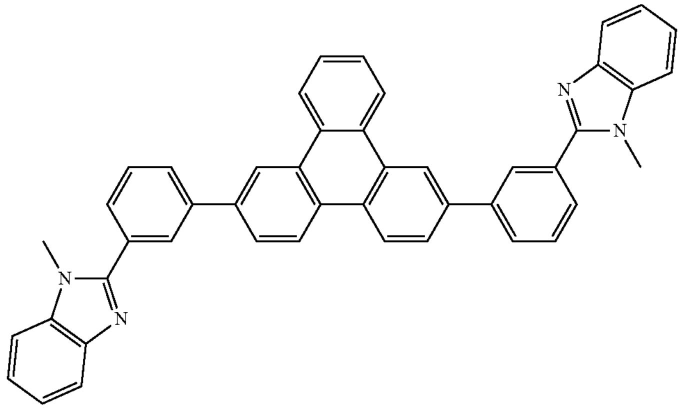
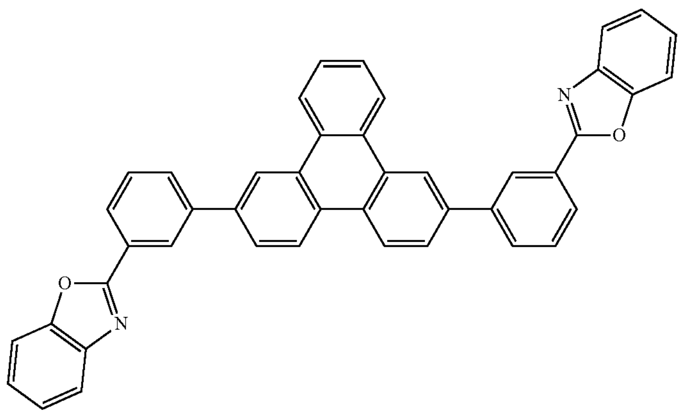
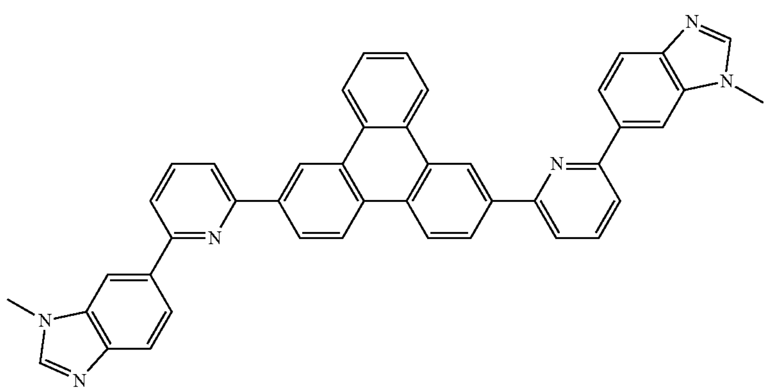
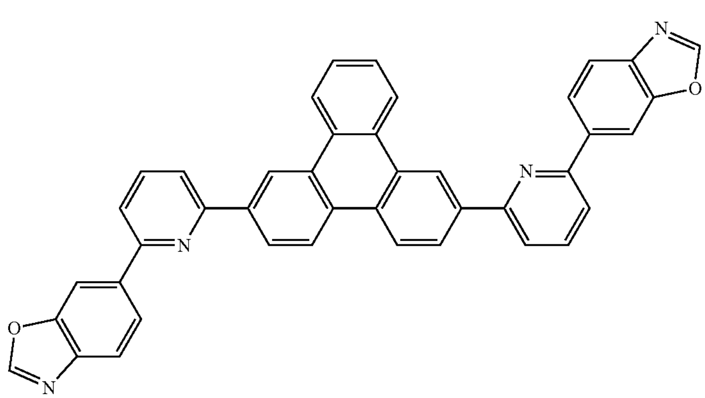

-continued
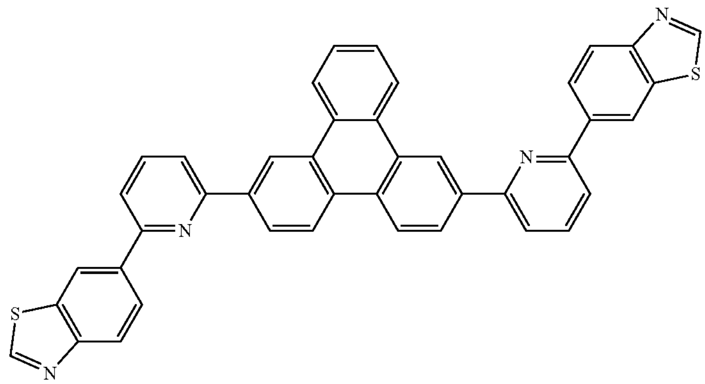
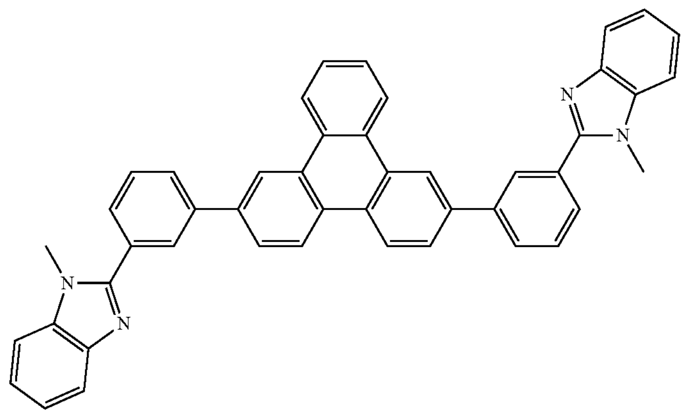
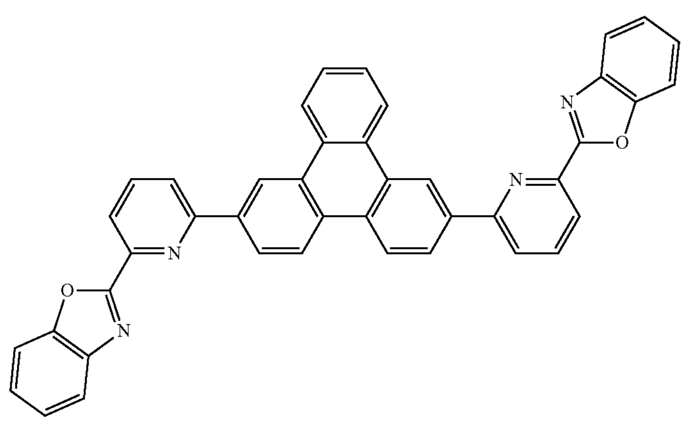
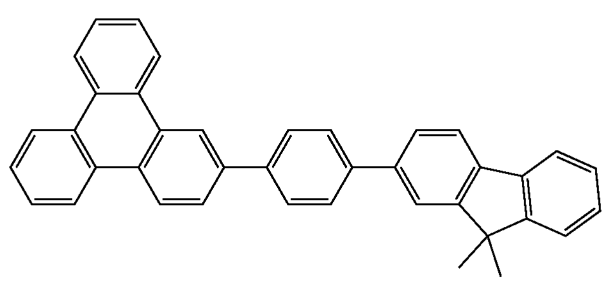
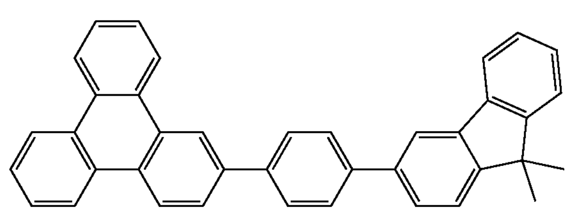
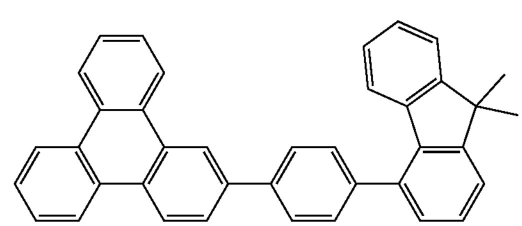

-continued
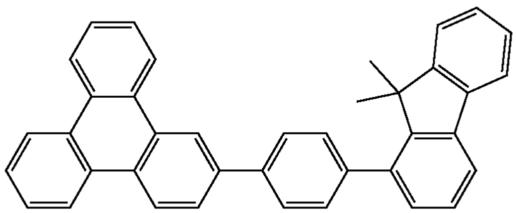
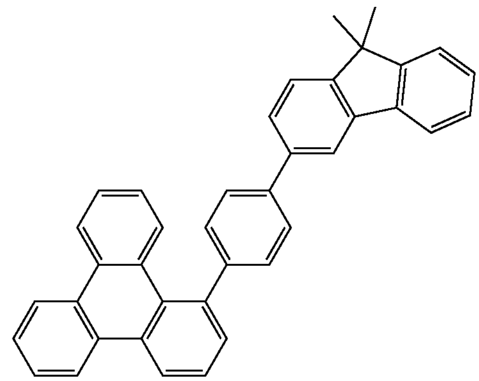
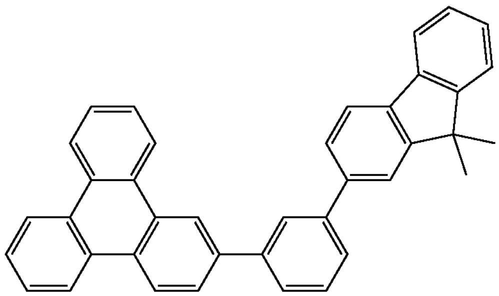
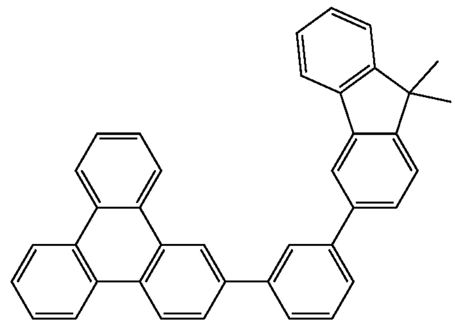
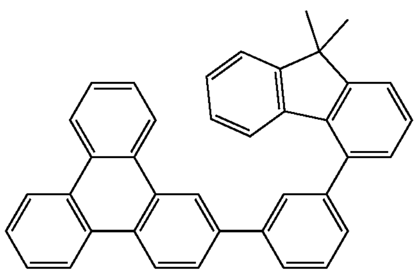
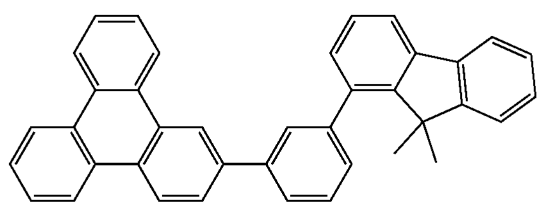
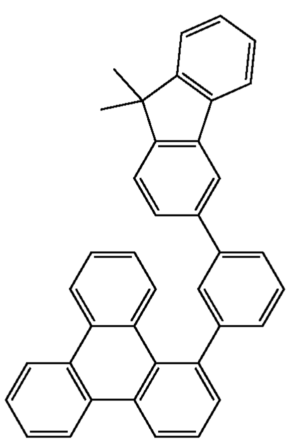
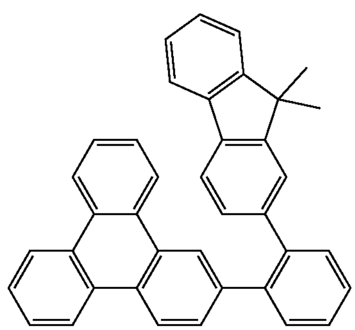
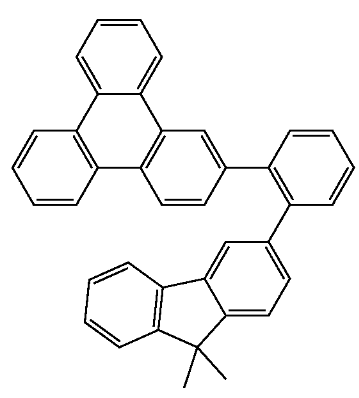

-continued
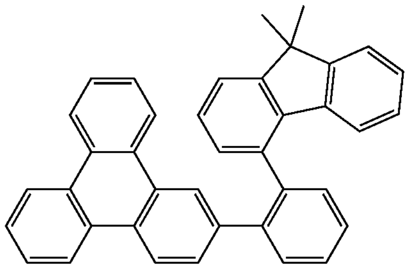
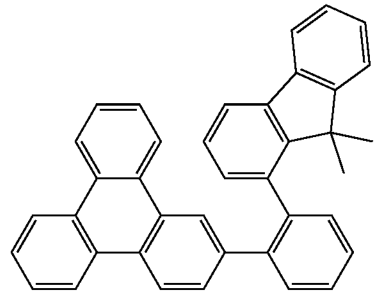
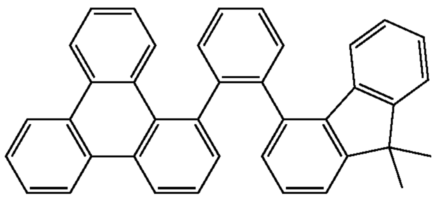
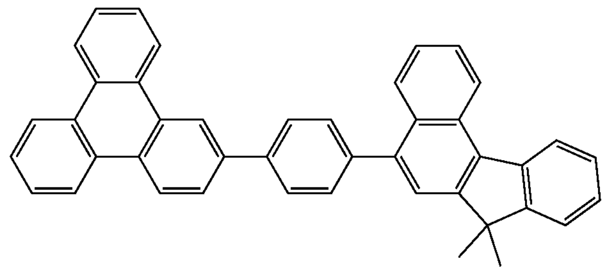
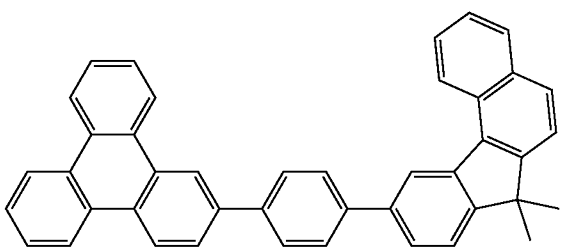
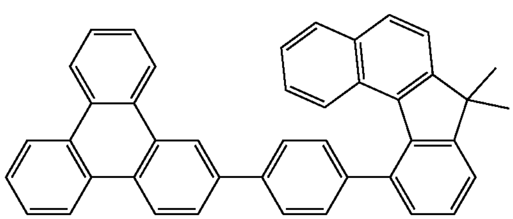
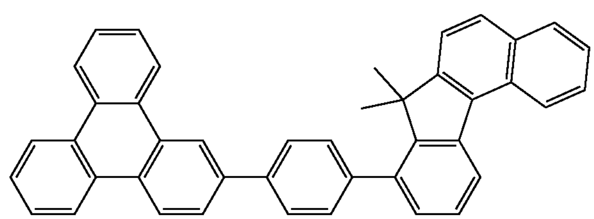
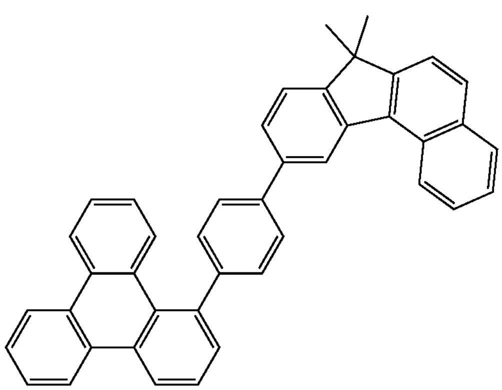
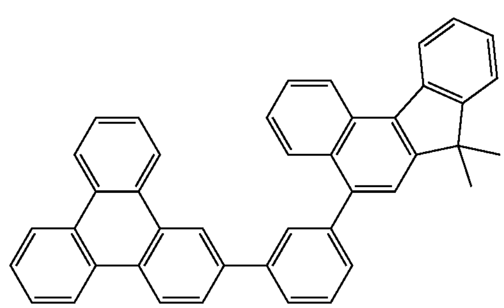

-continued
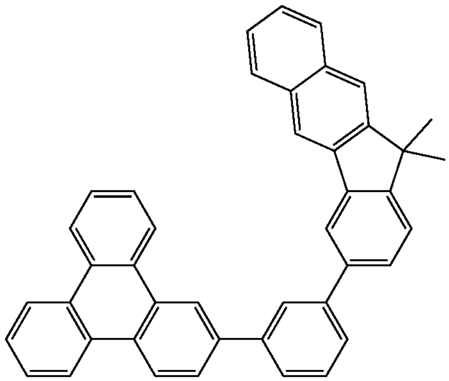
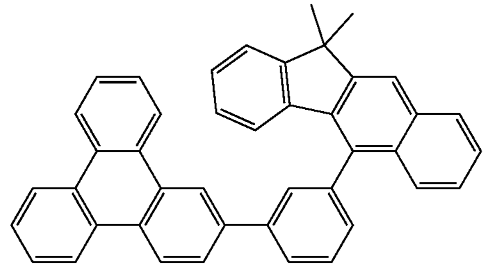
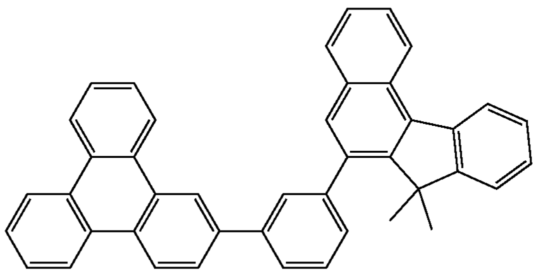
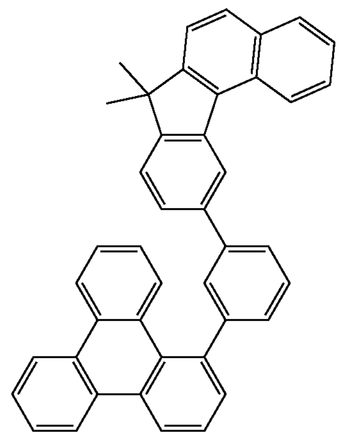
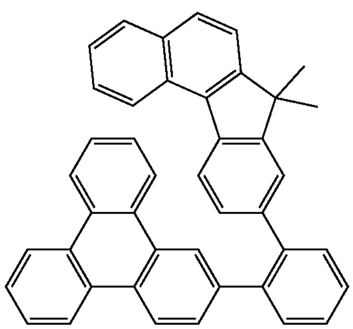
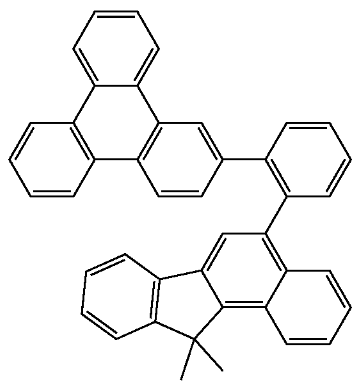
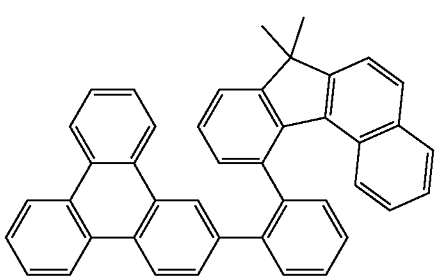
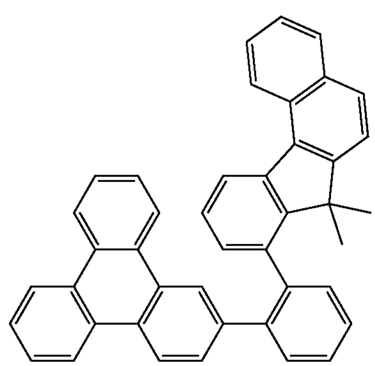

-continued
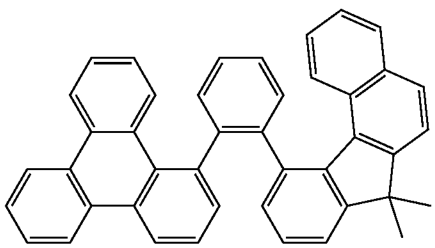
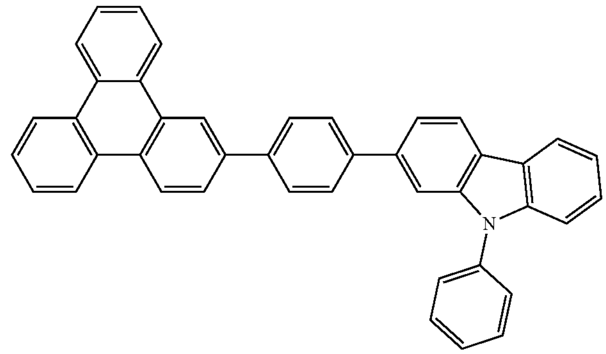
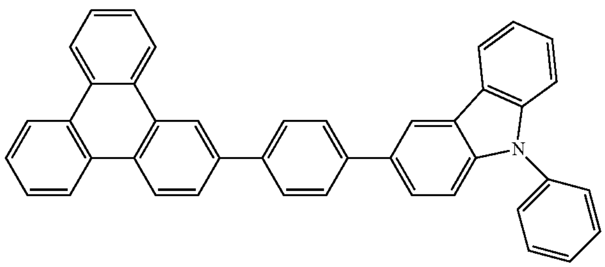
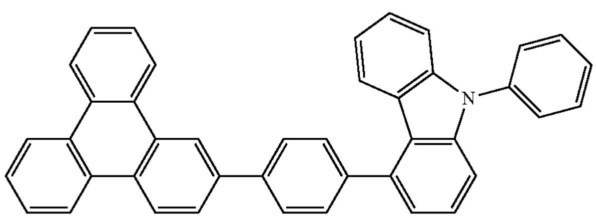
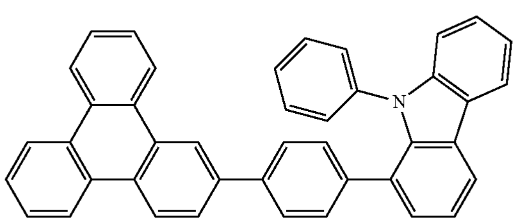
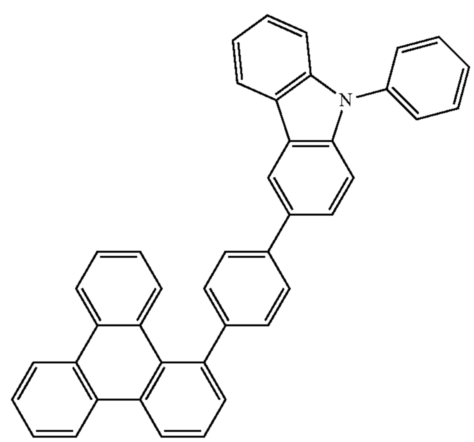
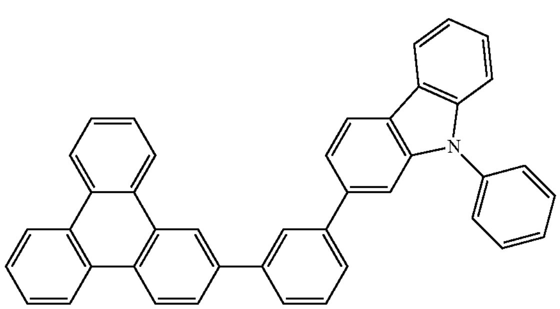
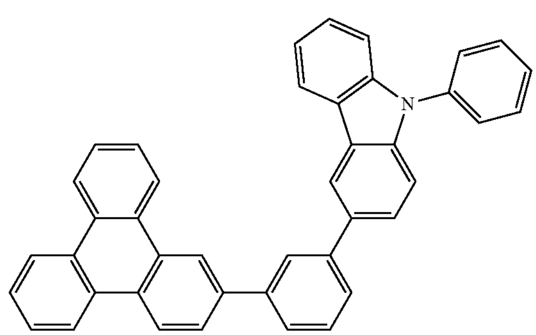

-continued
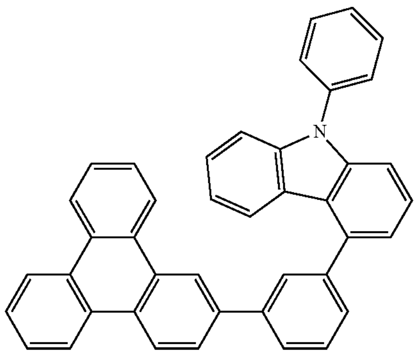
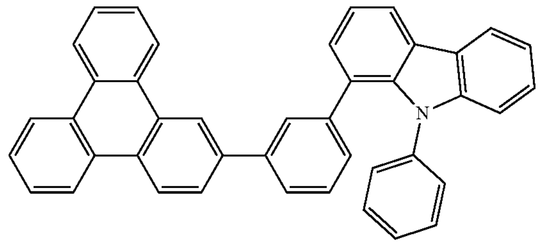
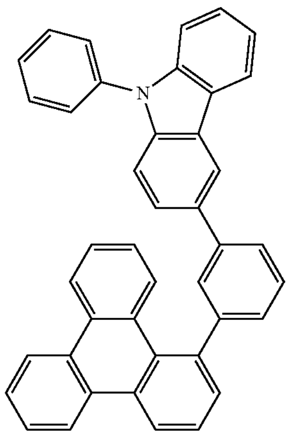
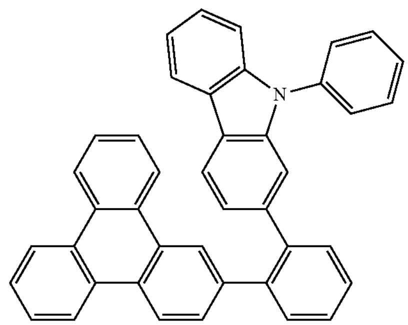
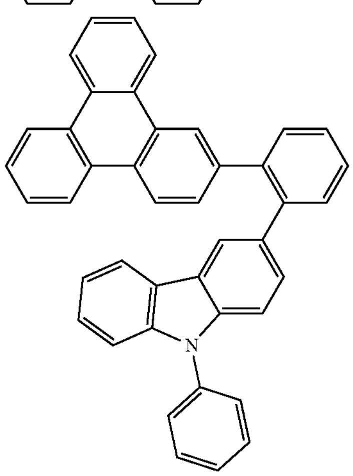
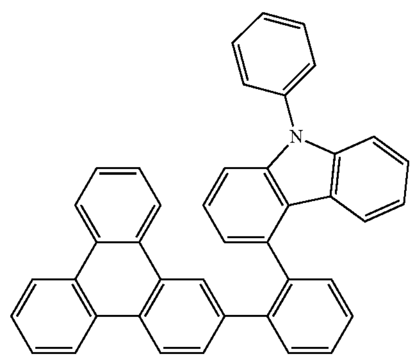
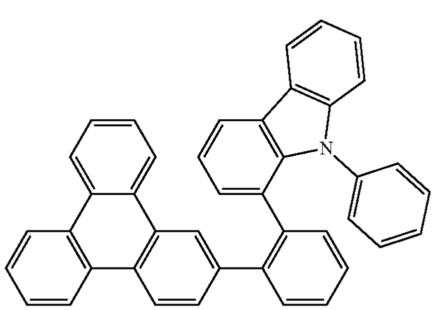
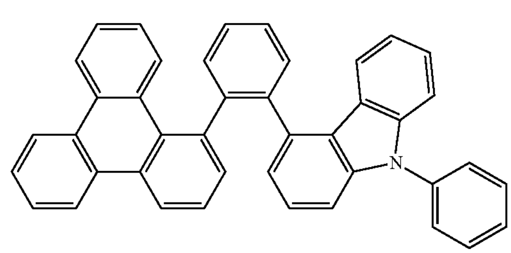

-continued
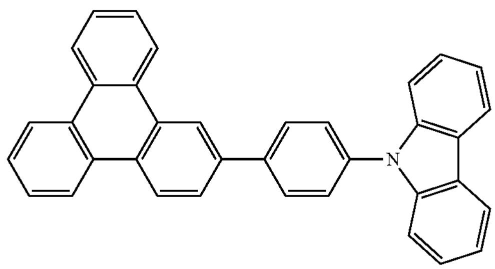
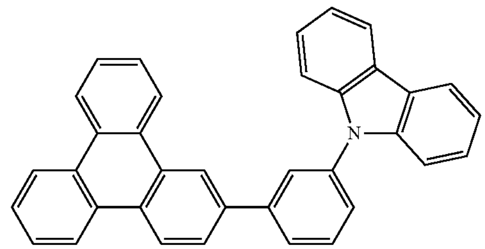
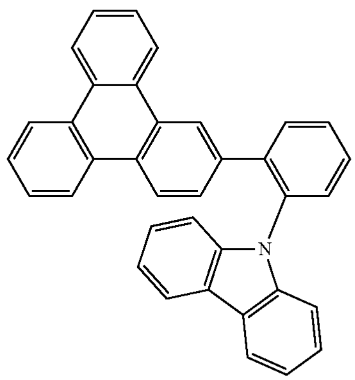
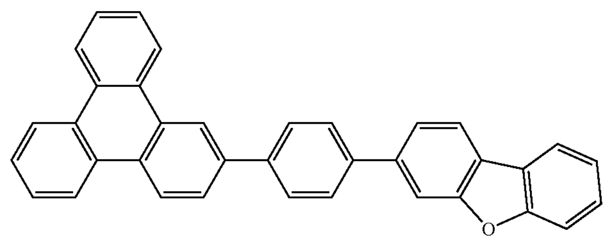
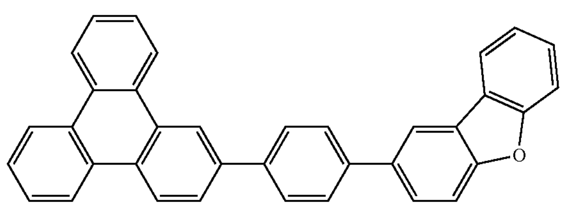
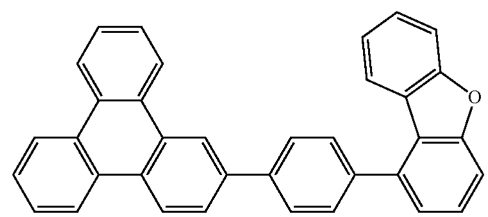
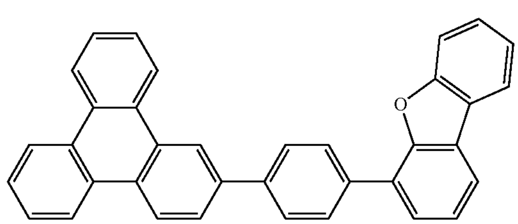
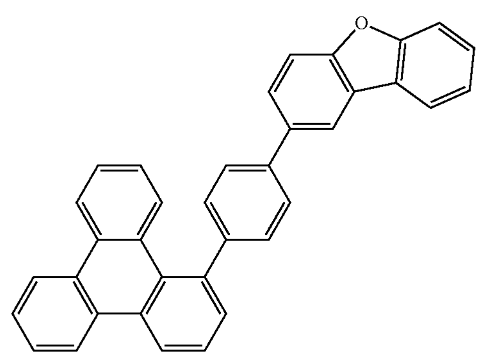
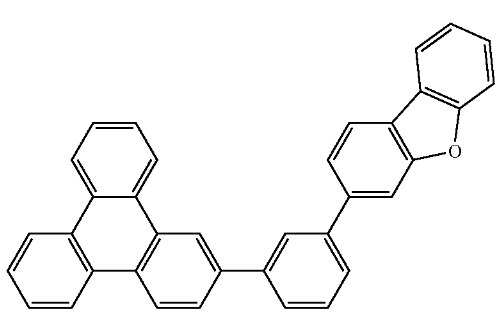
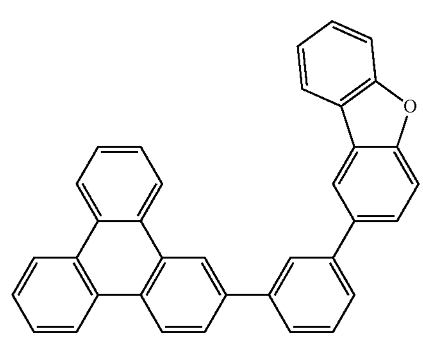

-continued
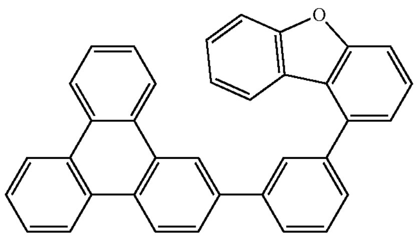
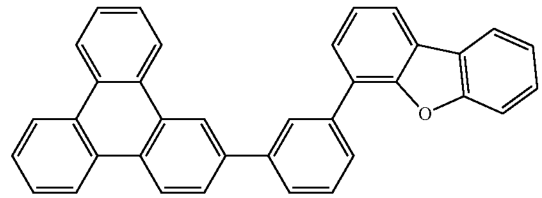
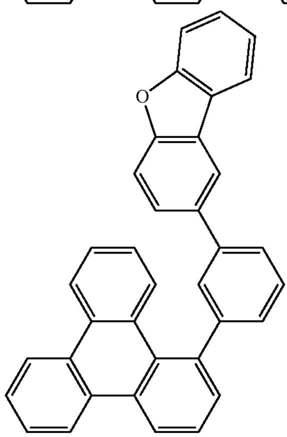
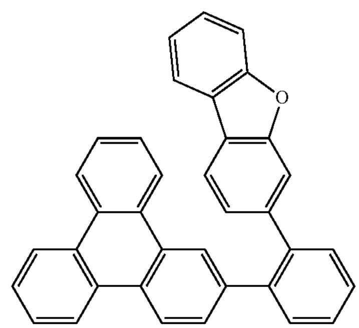
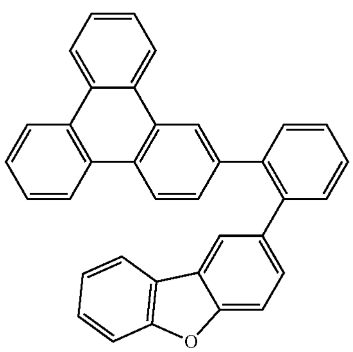
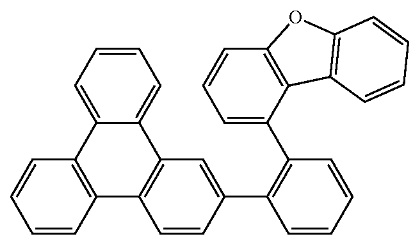
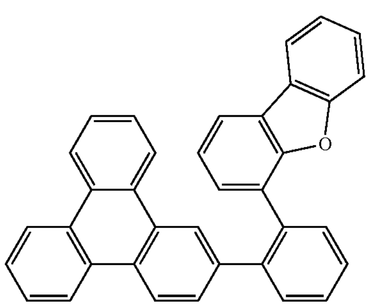
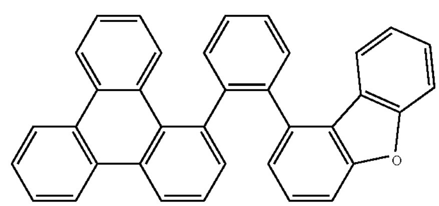
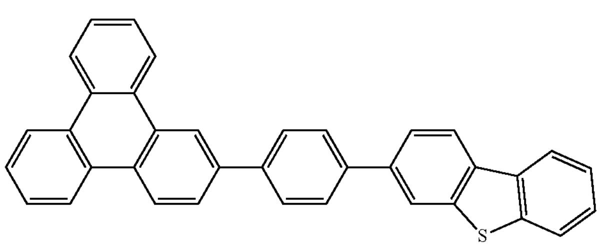

-continued
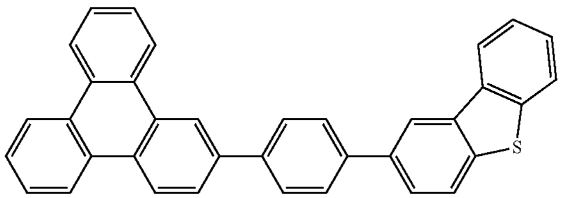
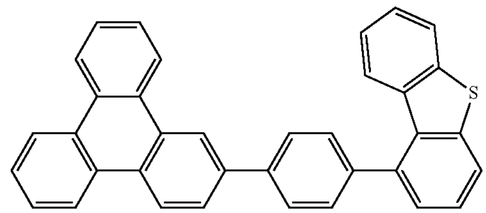
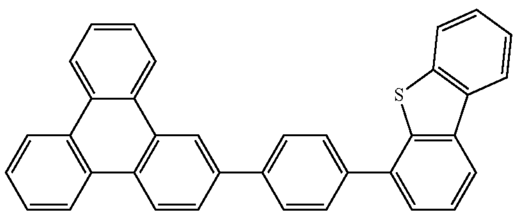
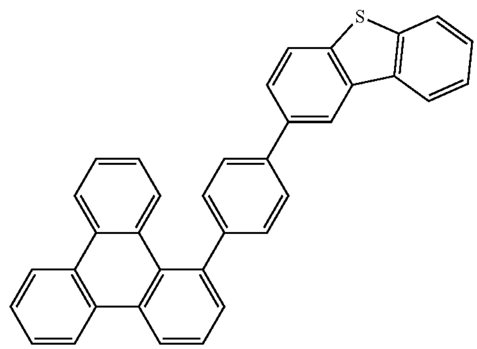
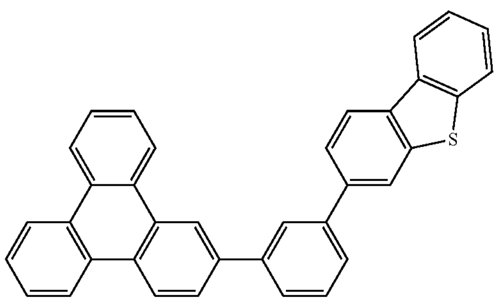
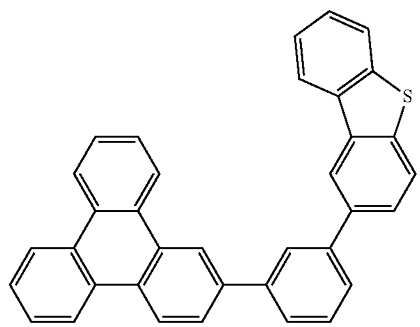
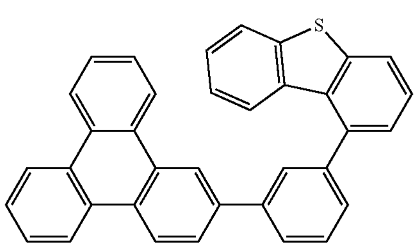
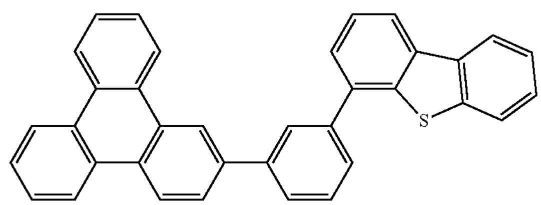
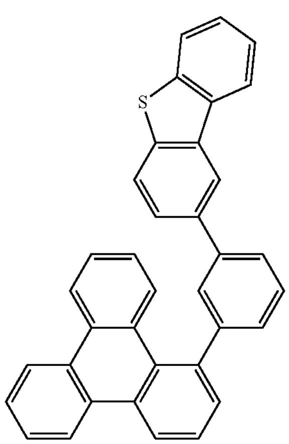
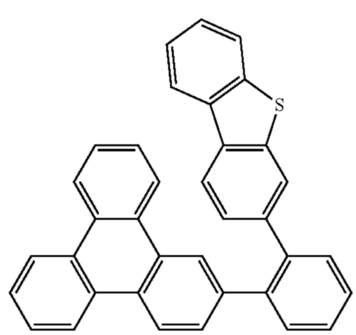
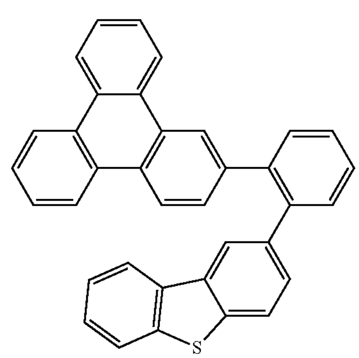

-continued
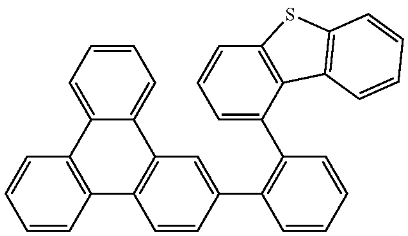
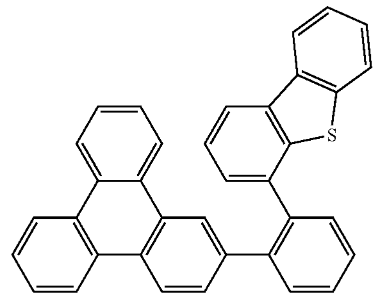
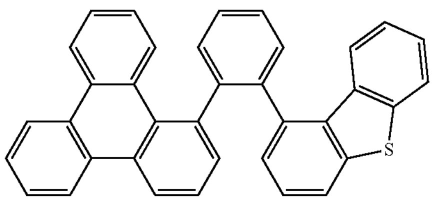
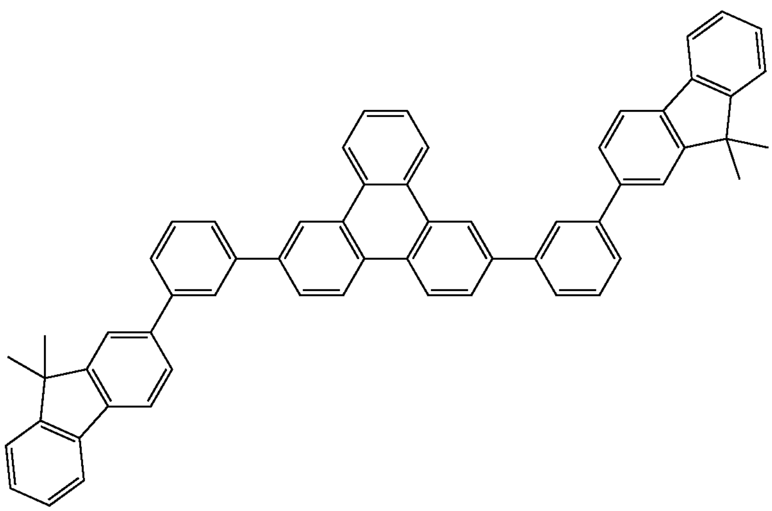
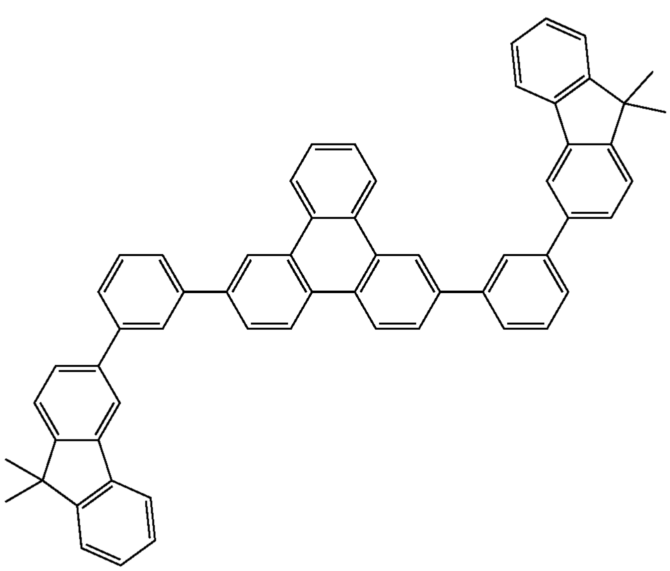

-continued
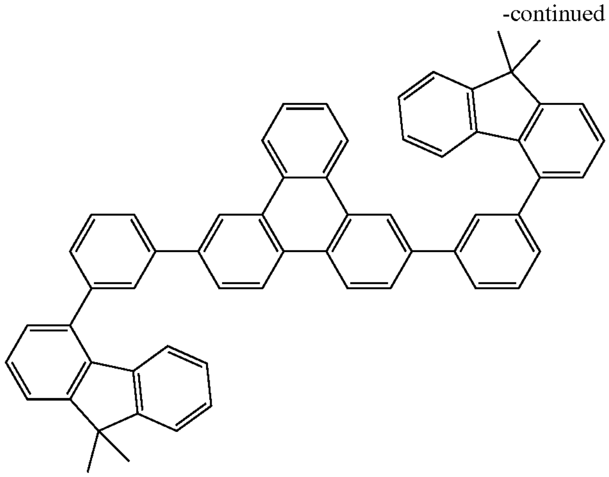
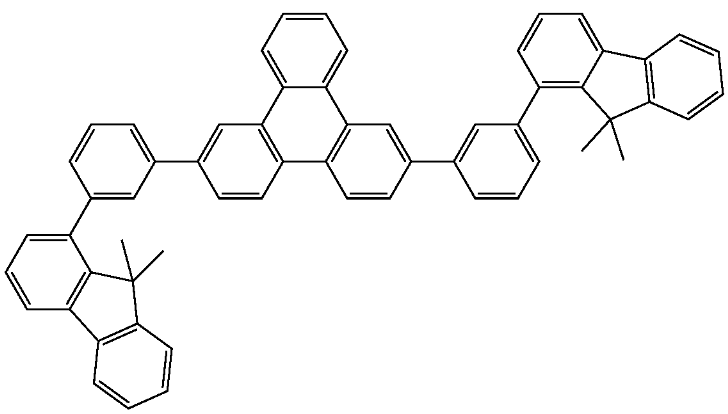
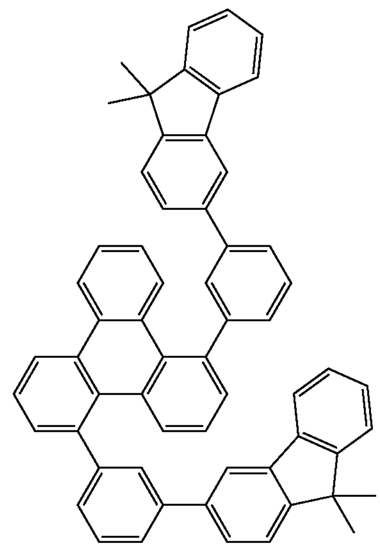
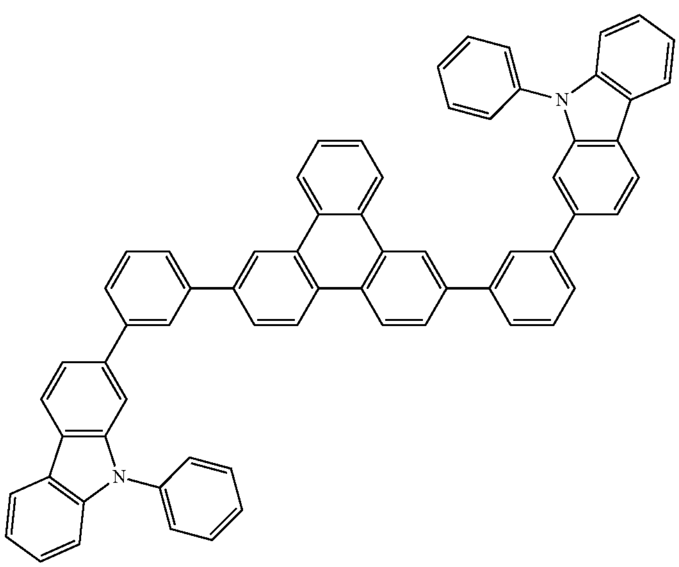

-continued
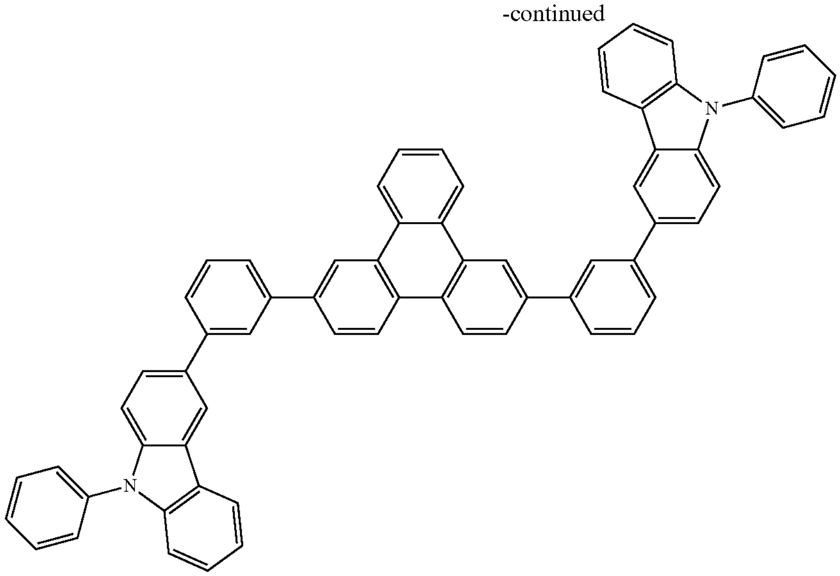
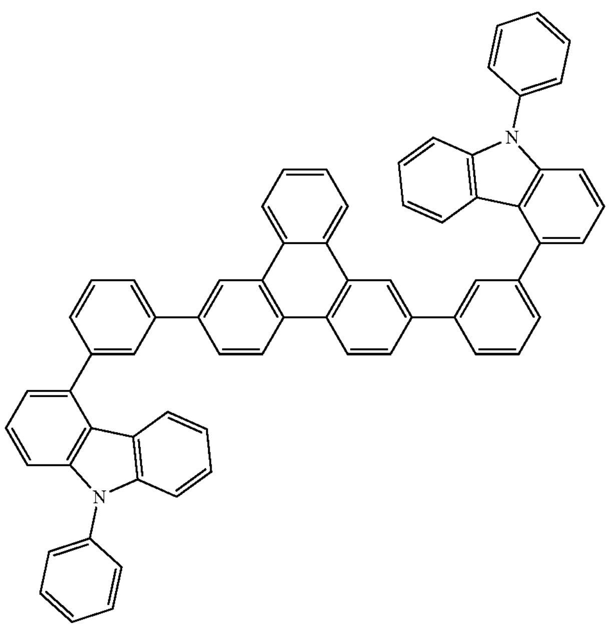
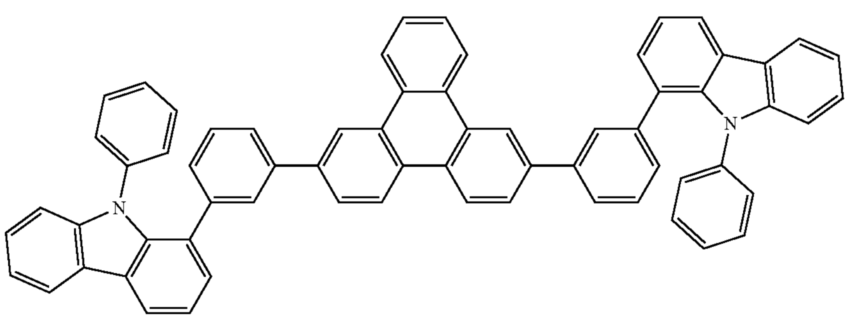

-continued
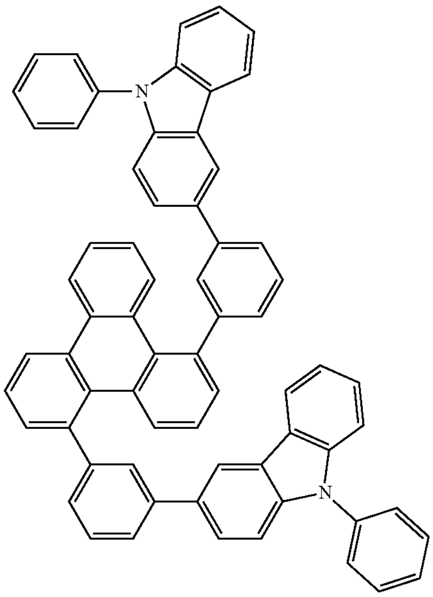
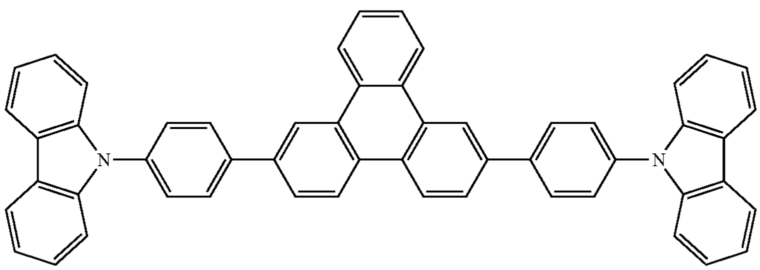
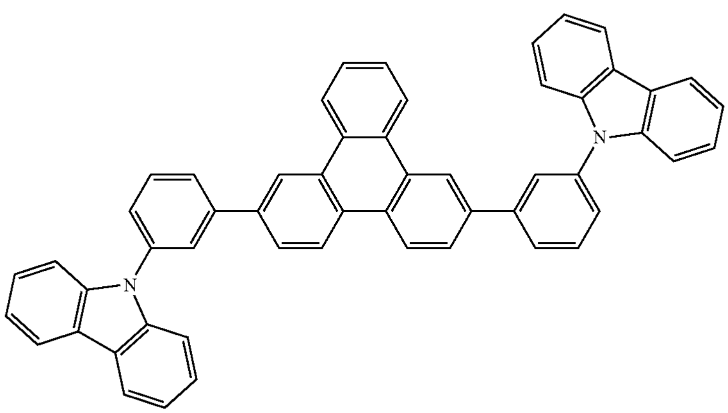
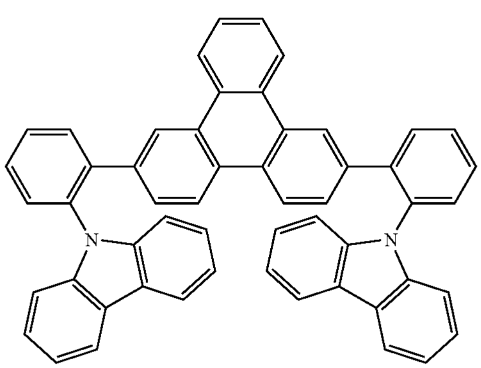

-continued
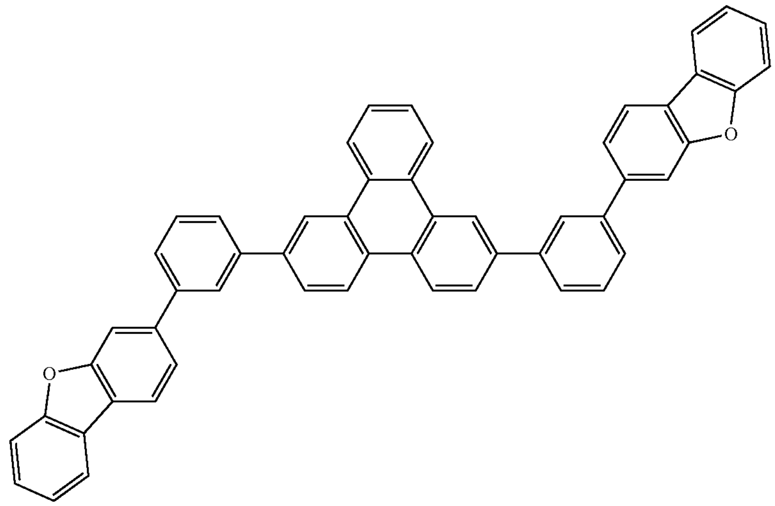
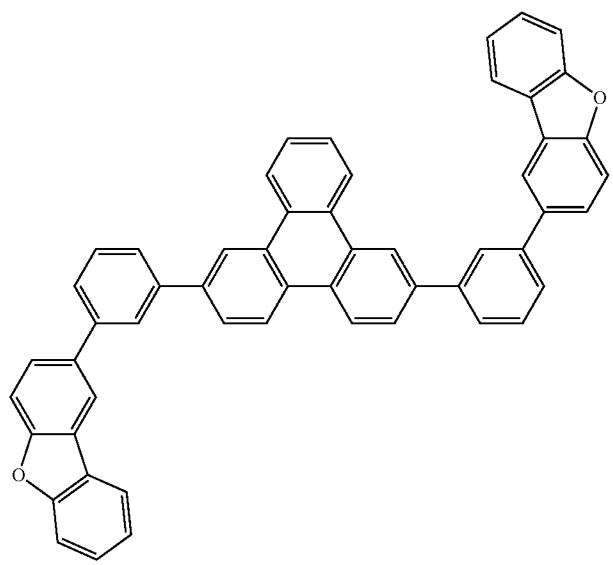
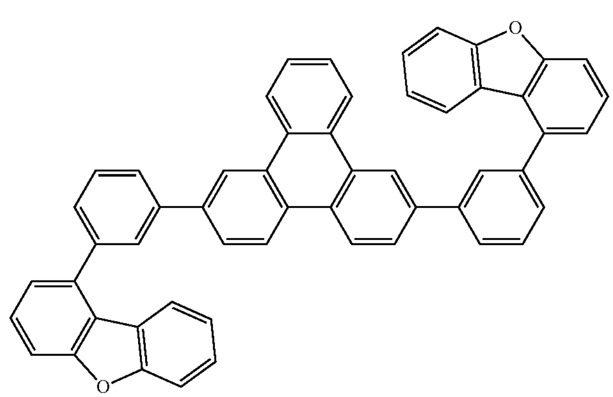

-continued
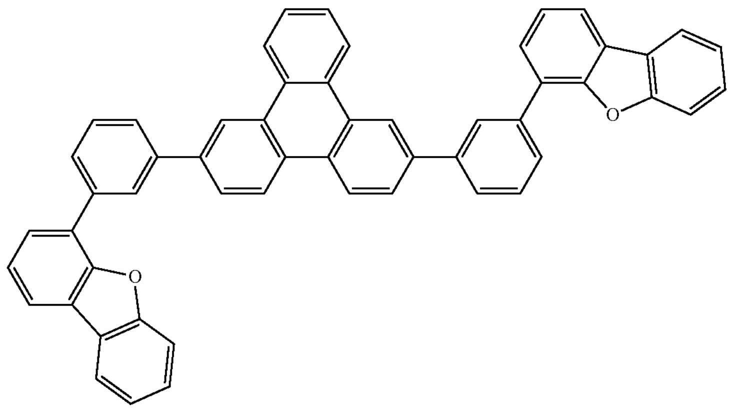
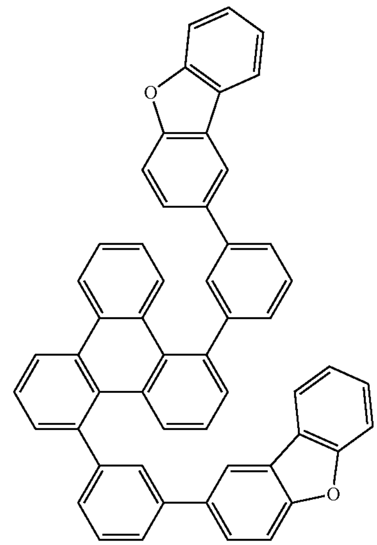
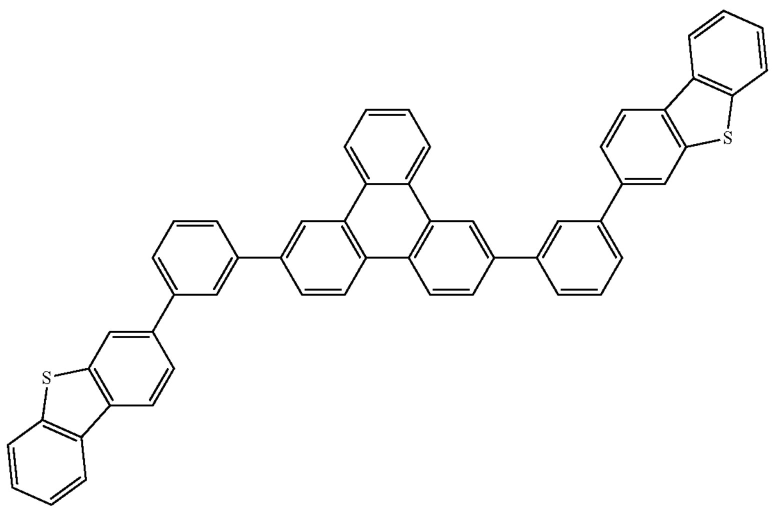
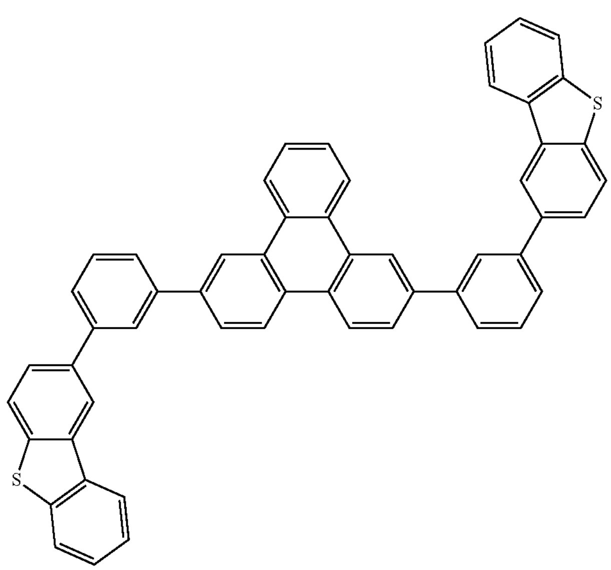

-continued
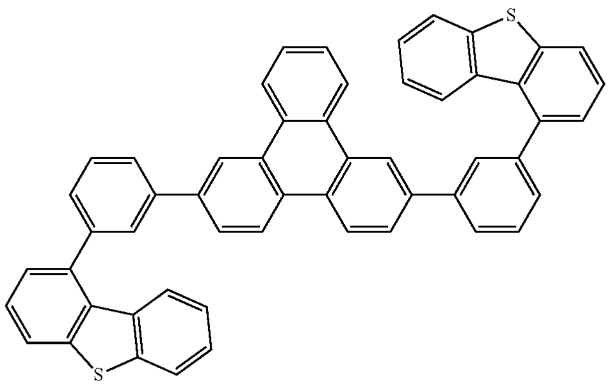
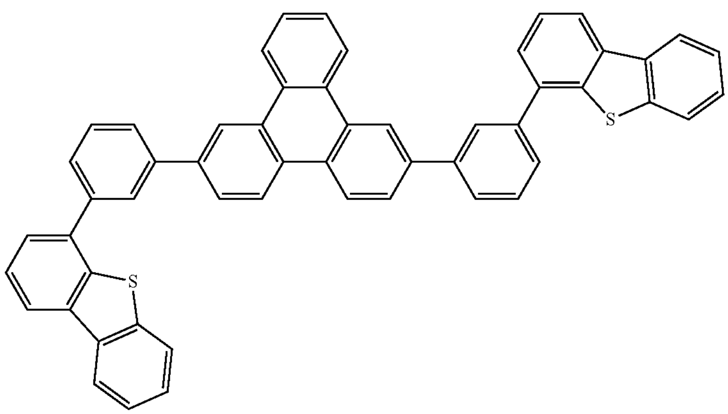
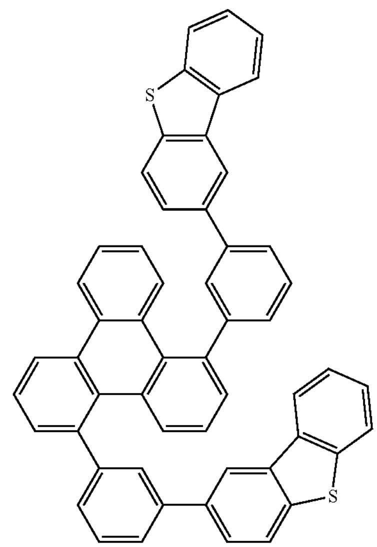
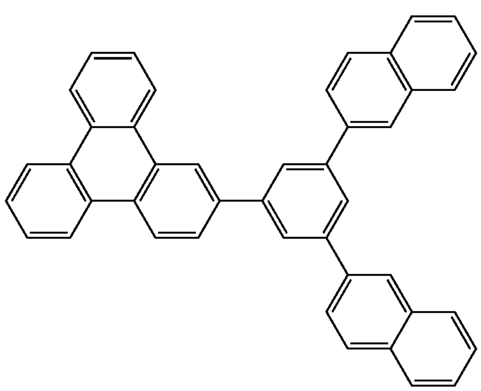
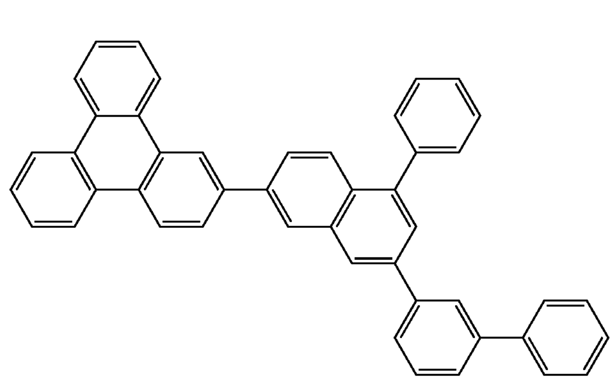

-continued
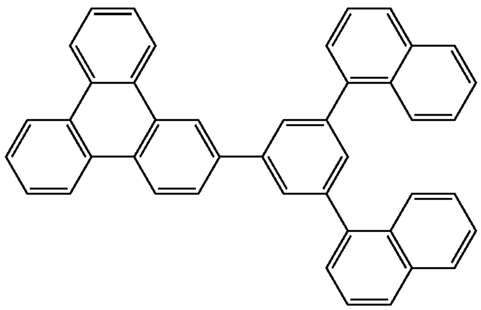
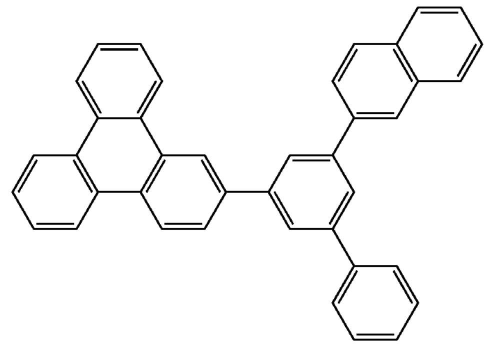
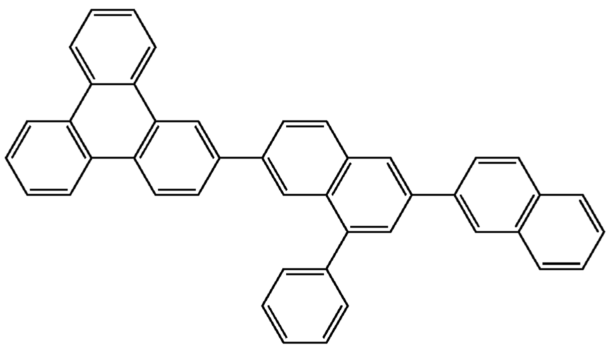
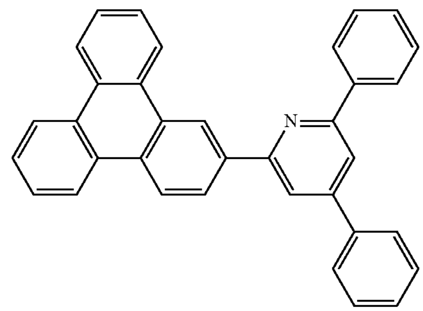
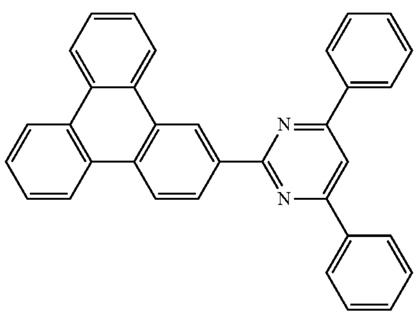
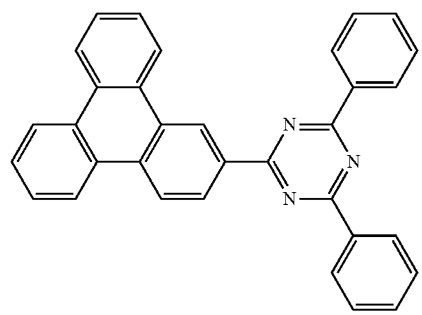
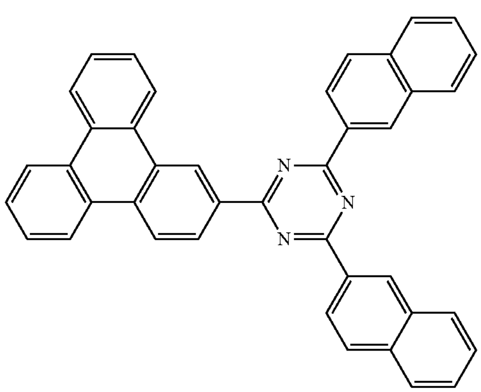
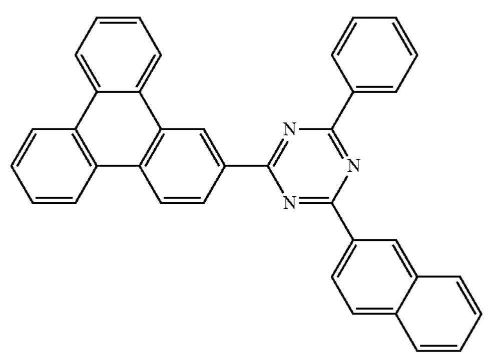

-continued
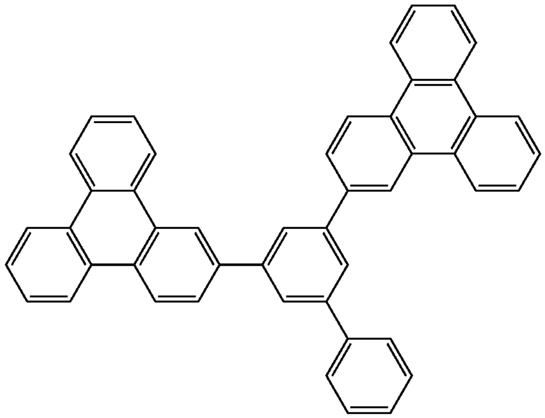
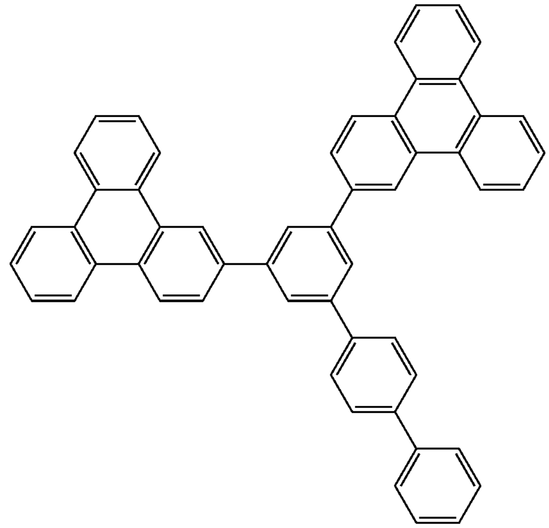
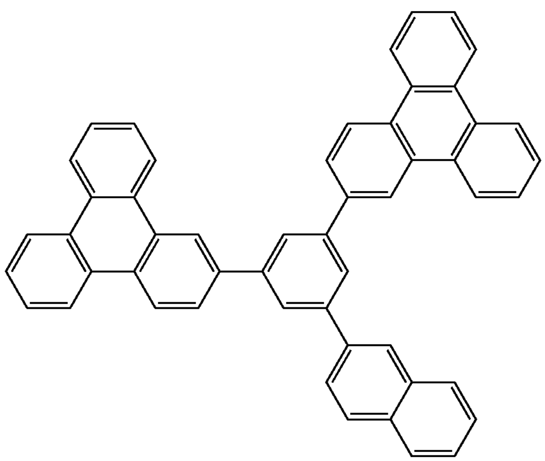
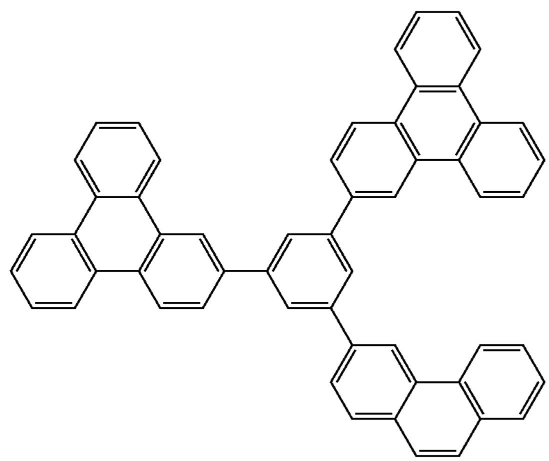
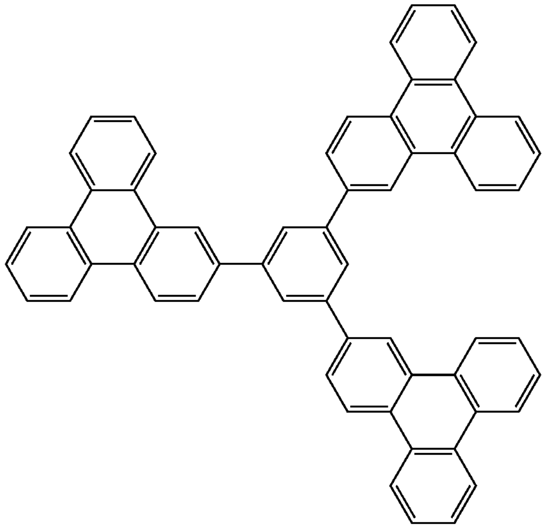
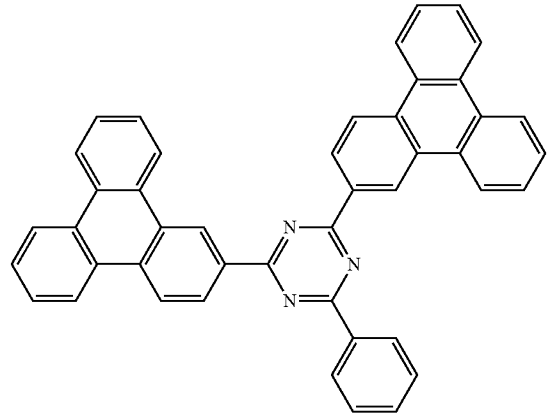

-continued
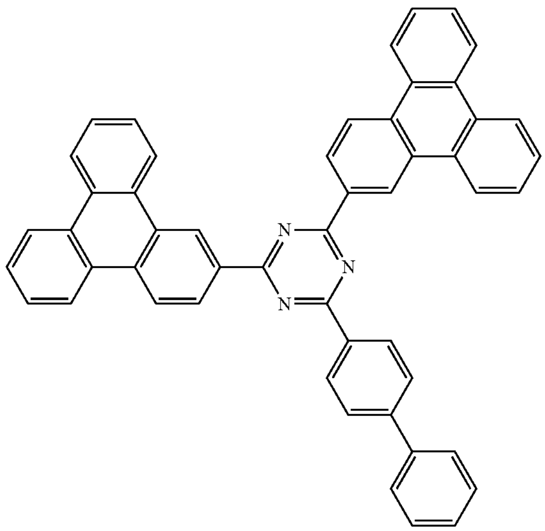
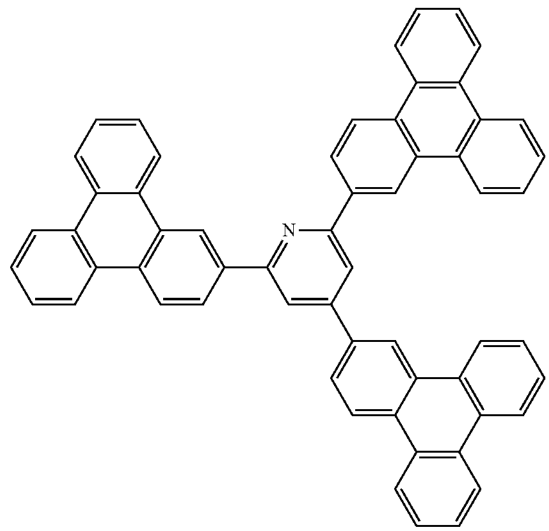
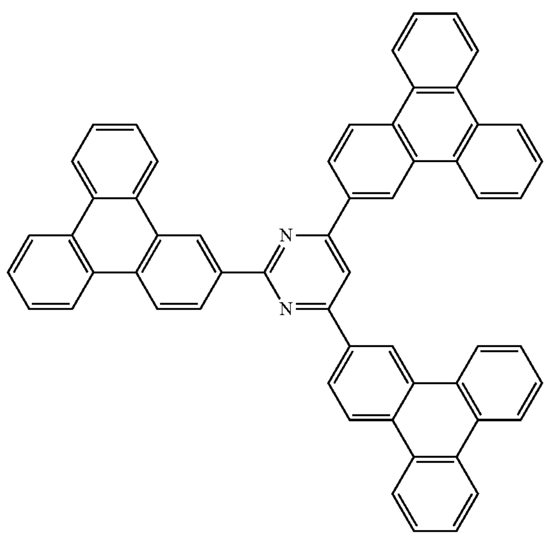
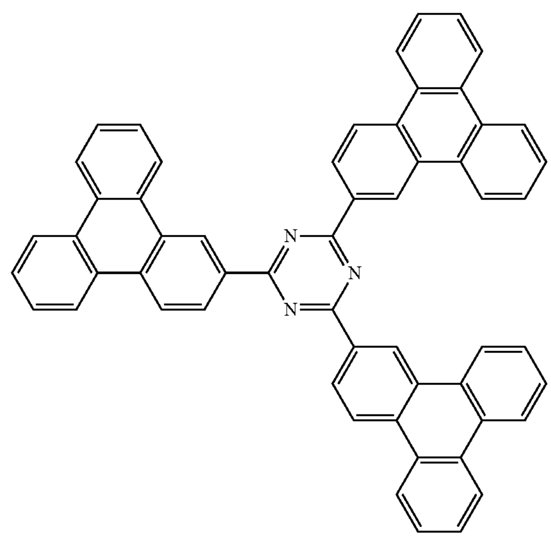
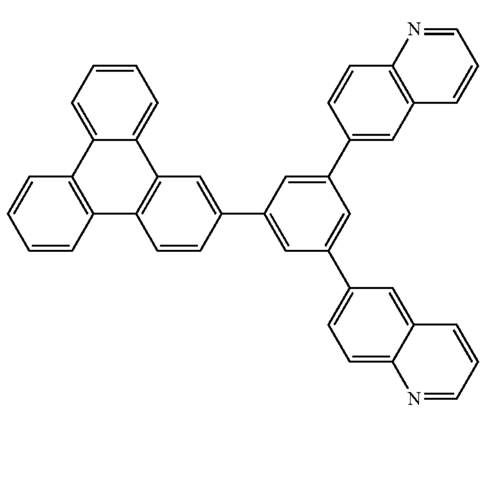
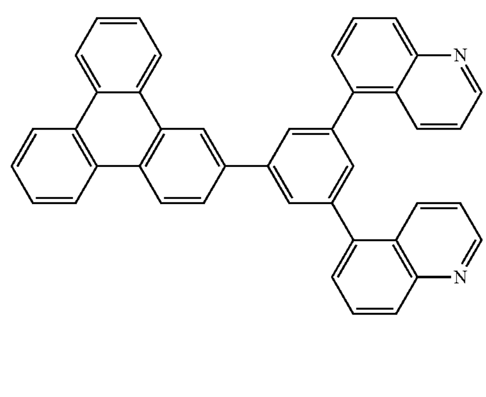

-continued
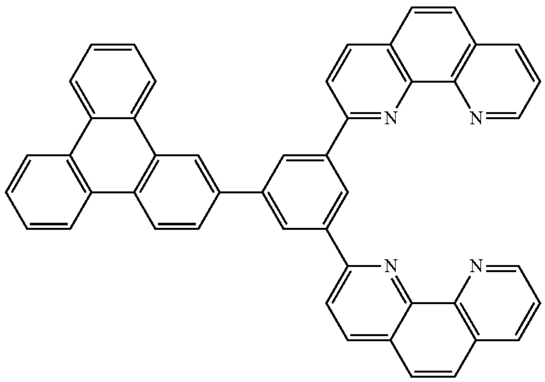
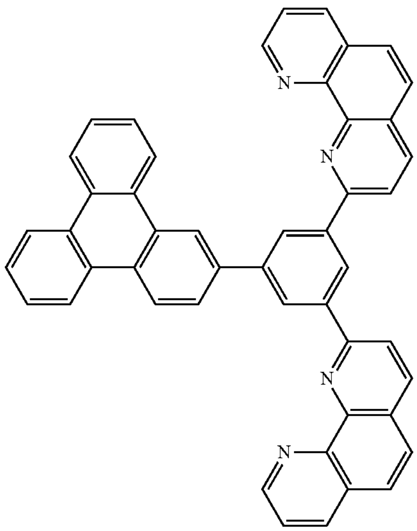
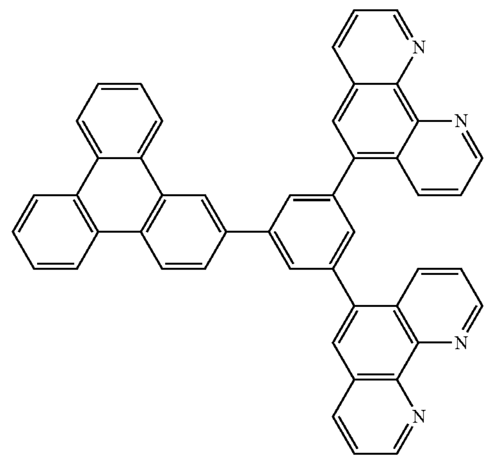
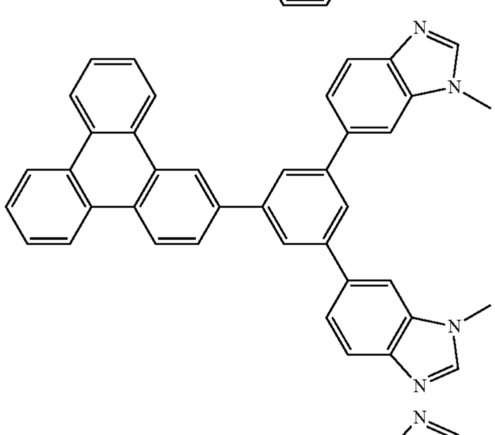
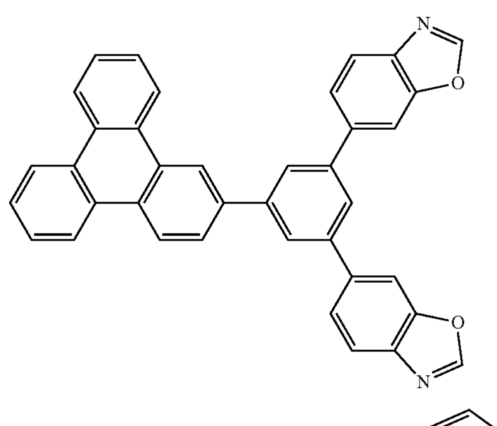
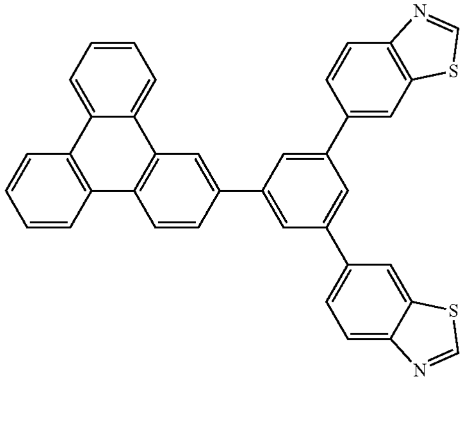
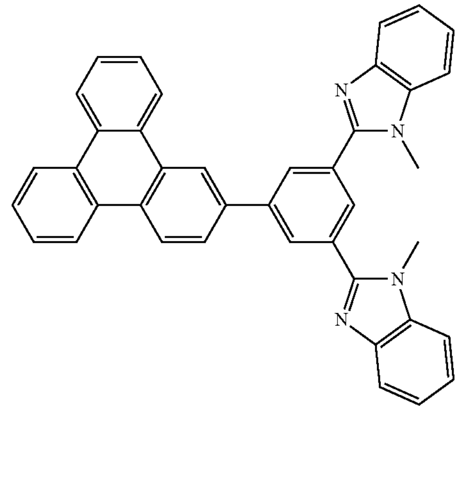

-continued
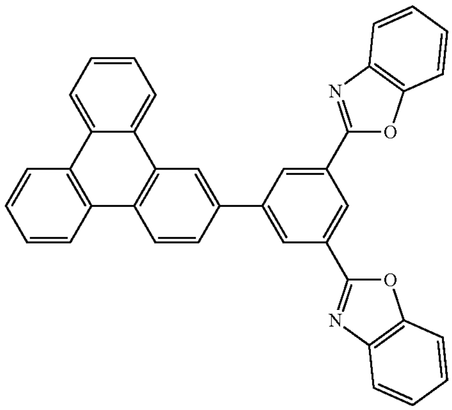
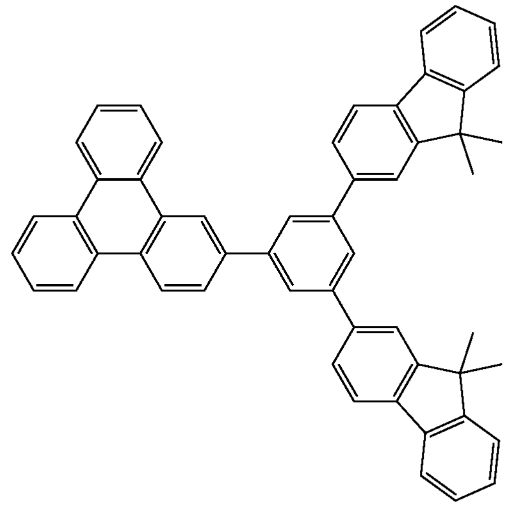
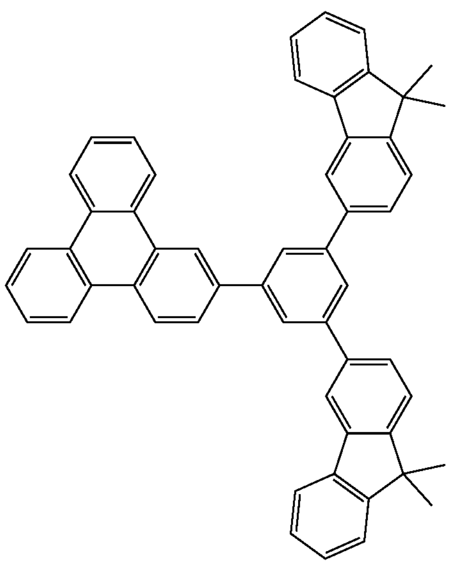
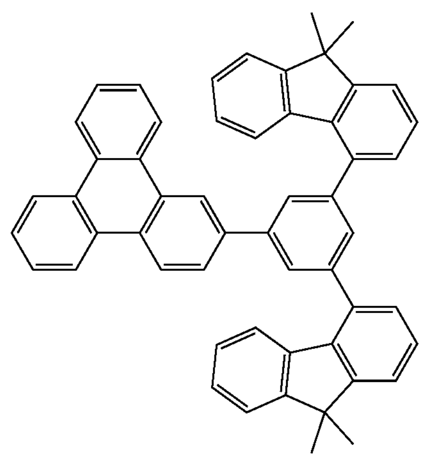
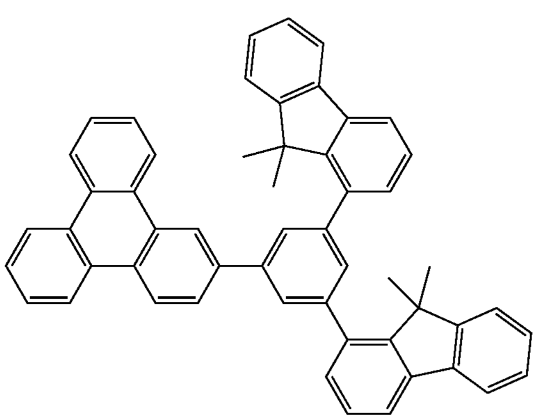
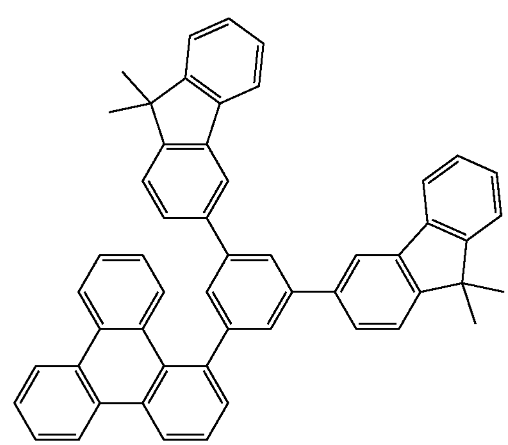

-continued
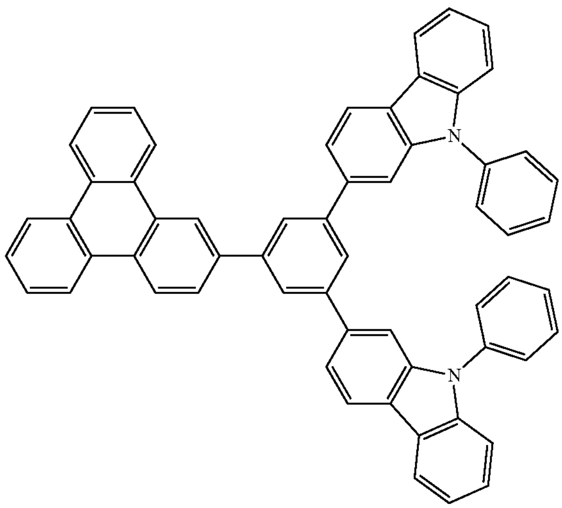
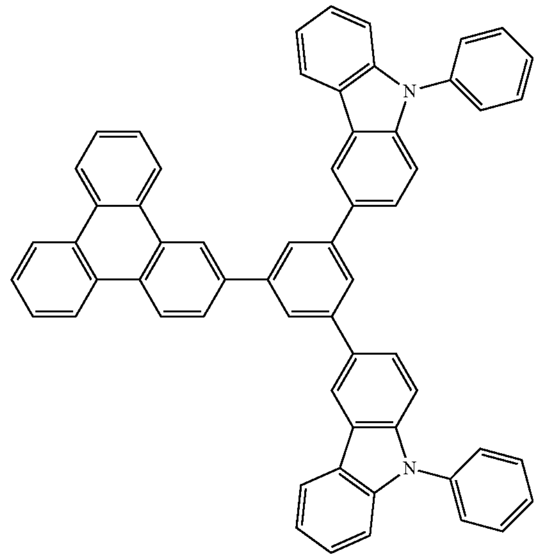
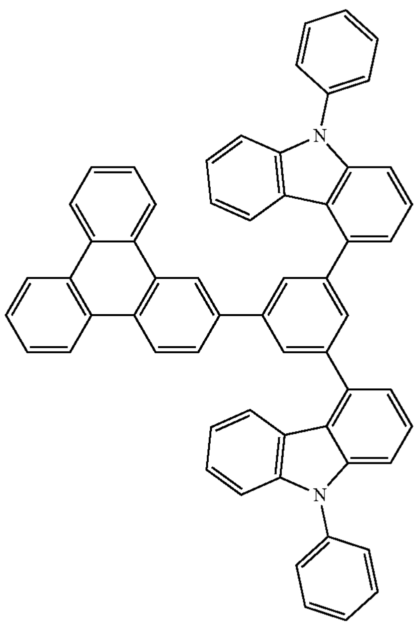
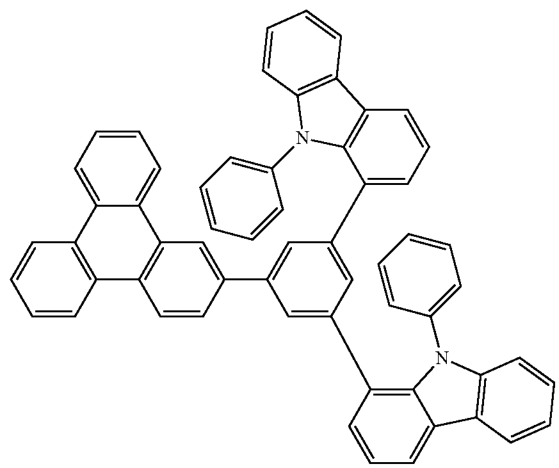
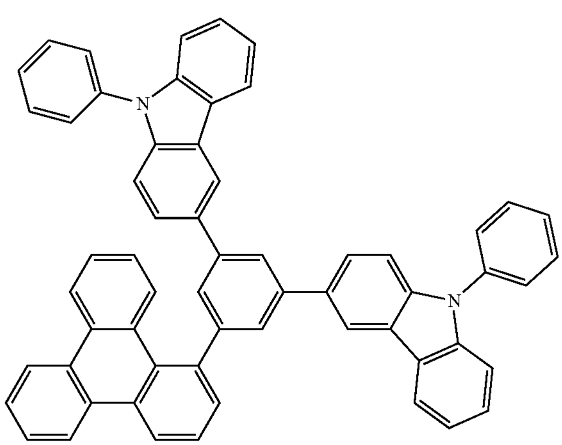
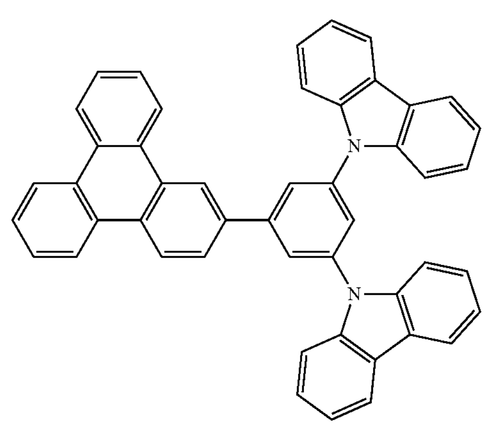

-continued
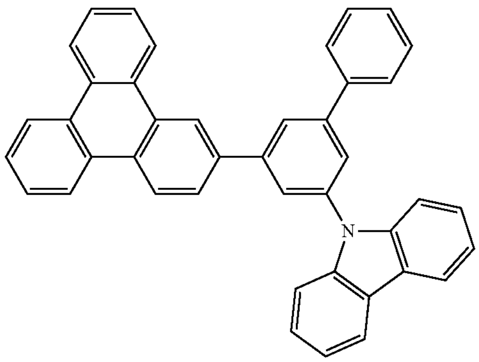
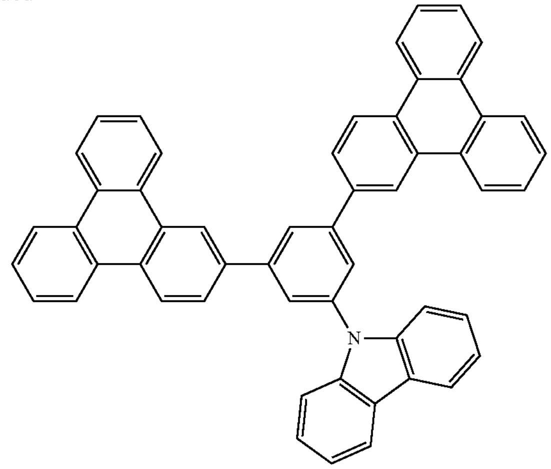
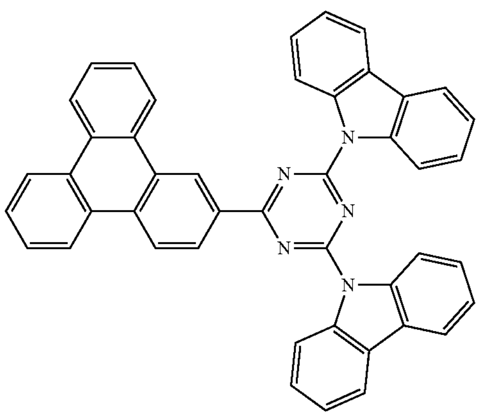
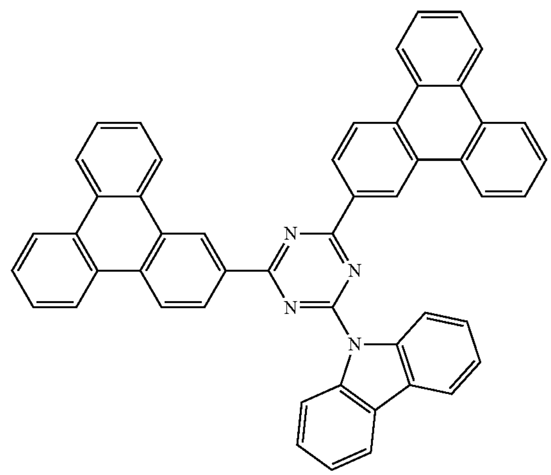
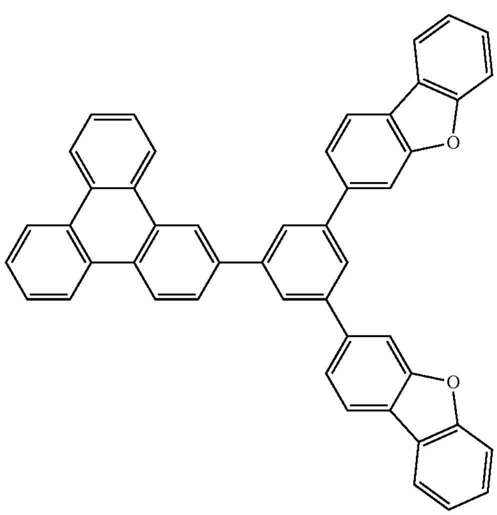
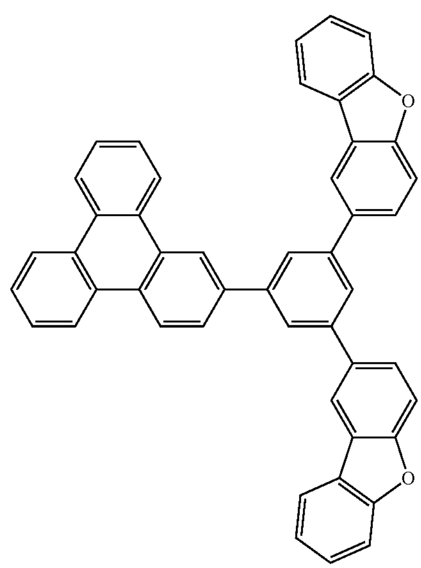

-continued
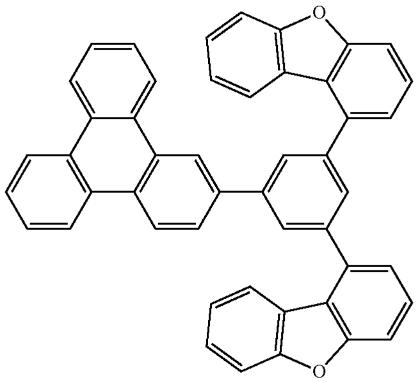
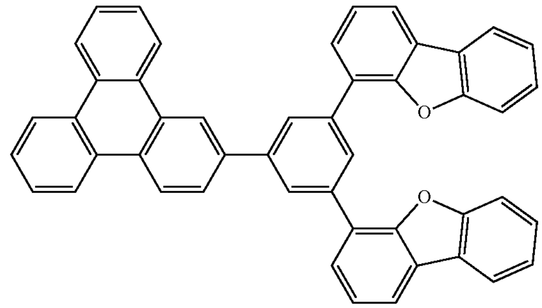
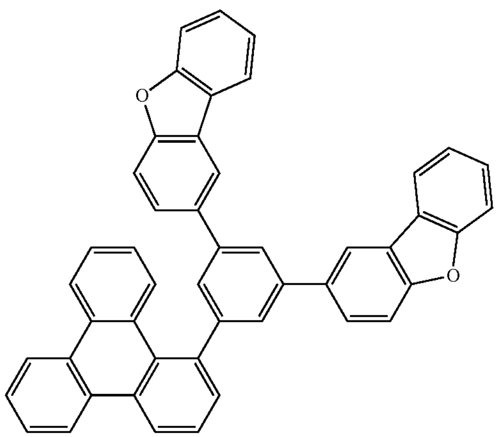
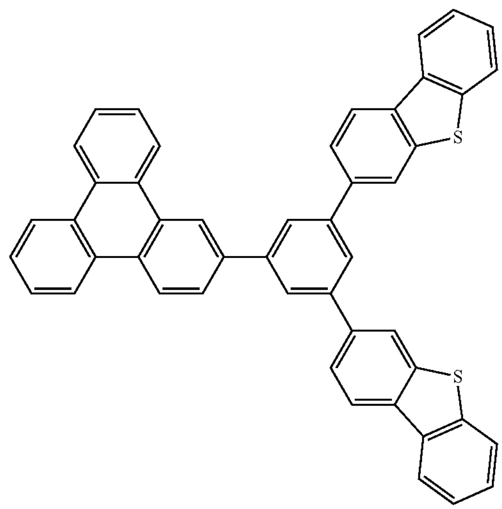
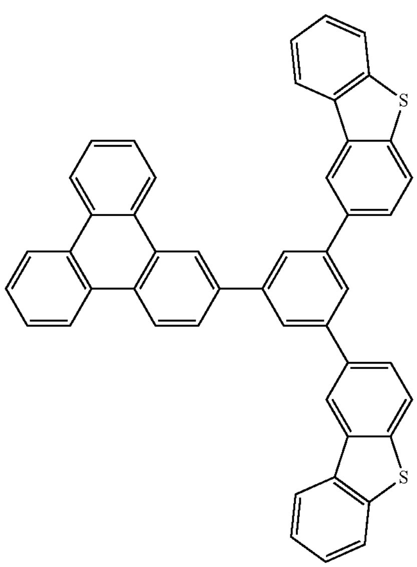
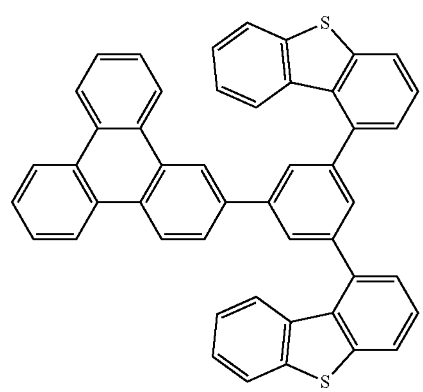

-continued
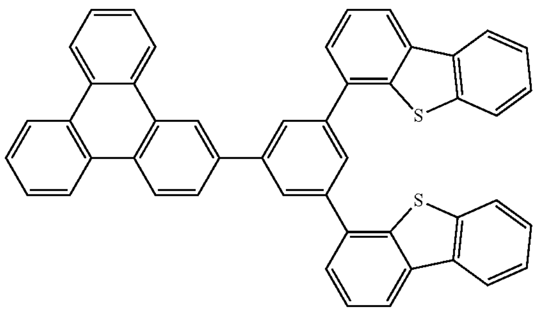
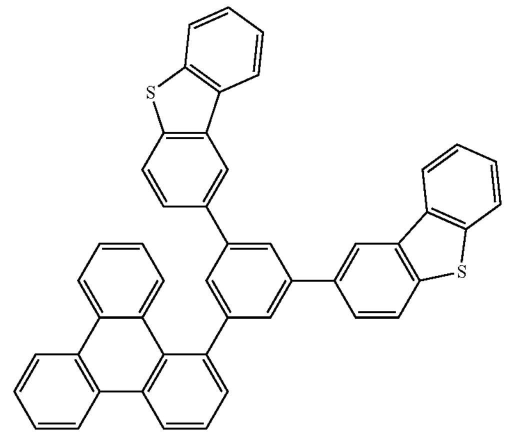
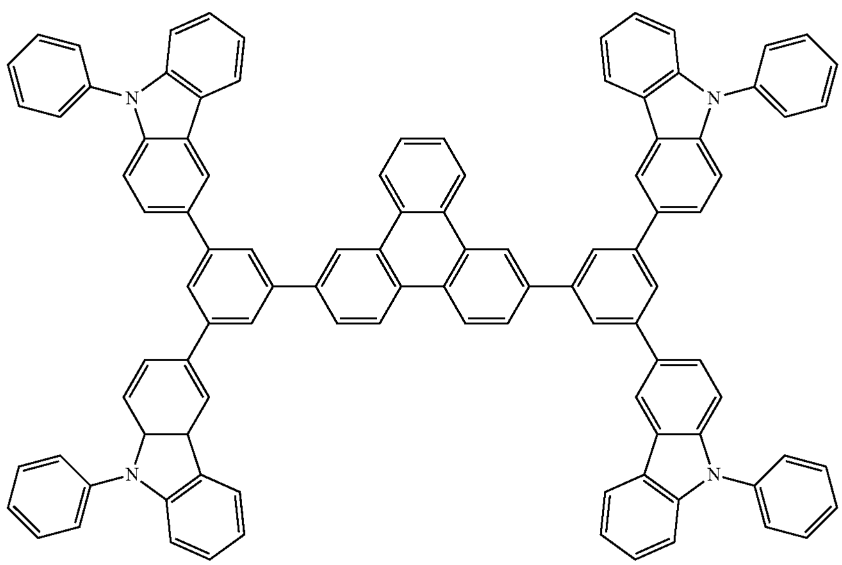
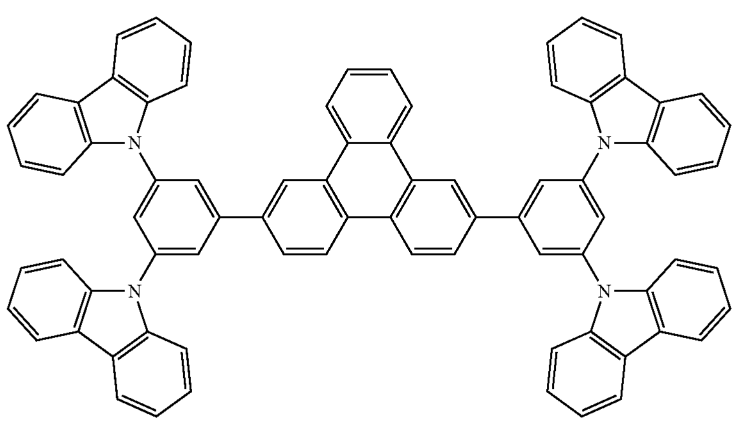

-continued
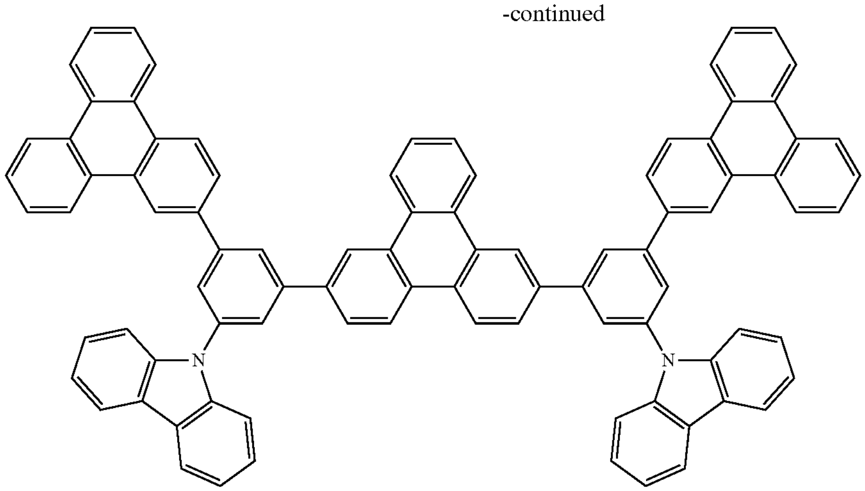
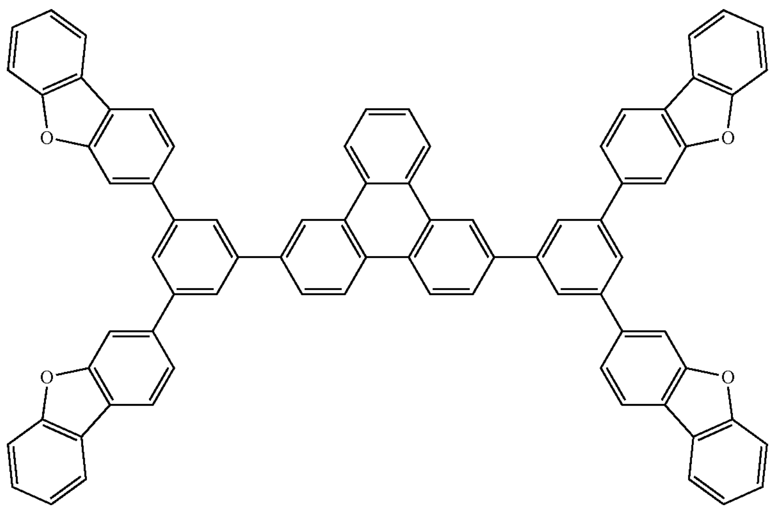
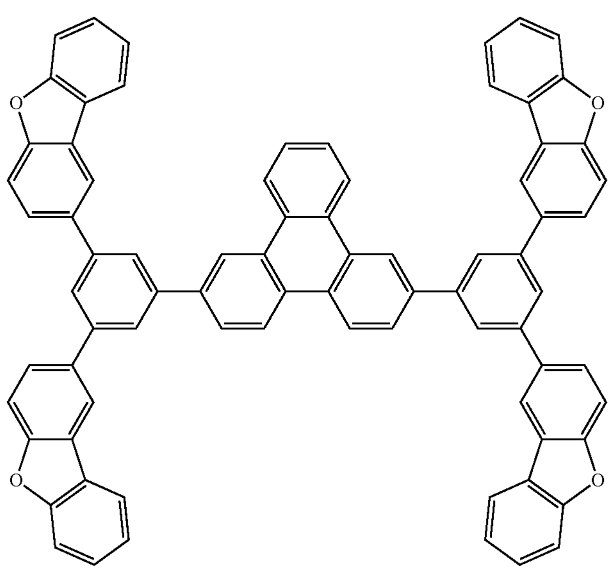

-continued
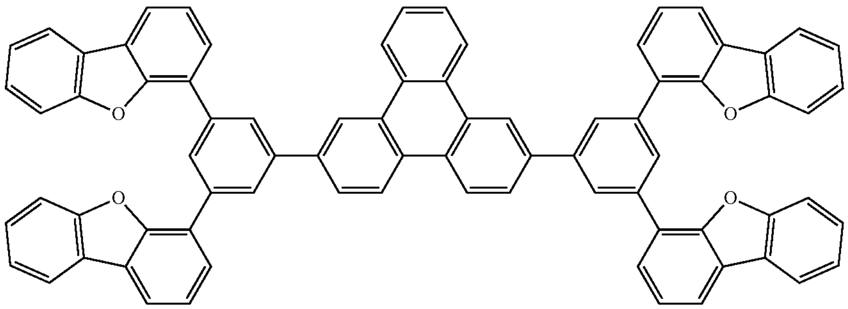
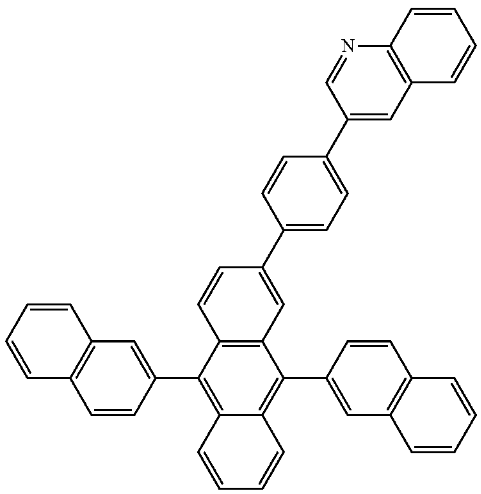
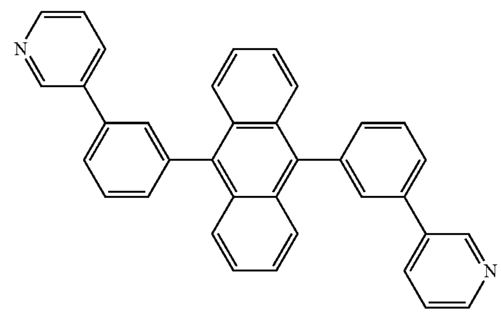
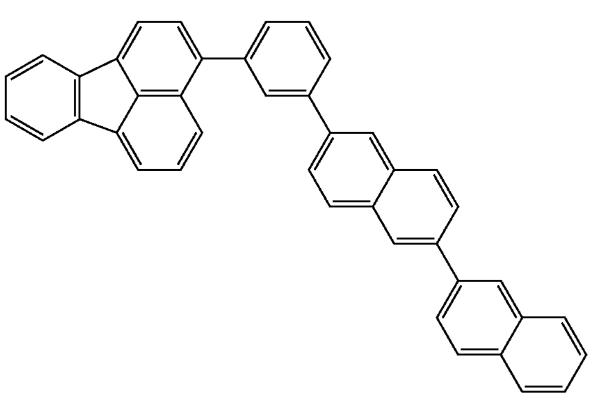
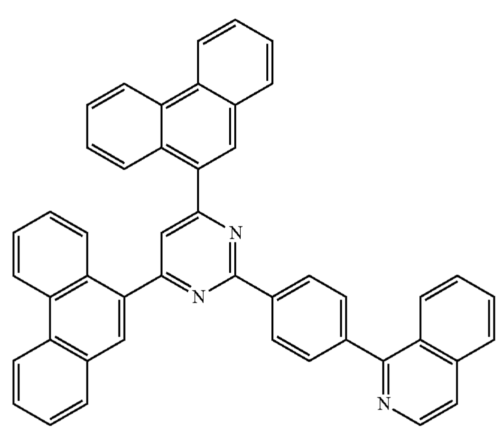

In some embodiments, the first material and the second material may be selected from compounds BF1 to BF19, but the first material and the second material are not limited thereto:
BF1
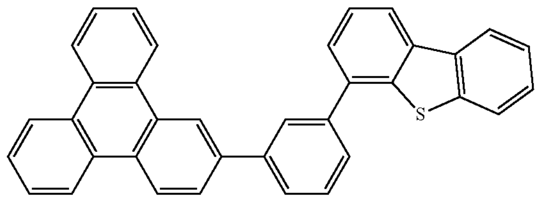
BF2
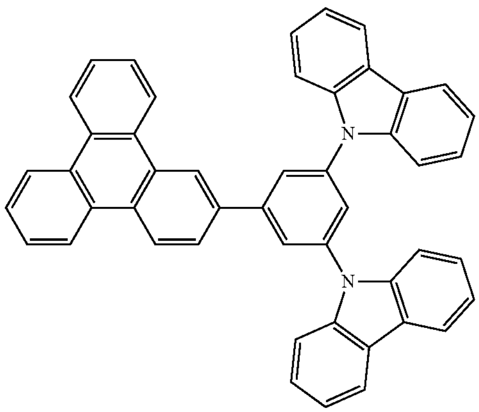
BF3
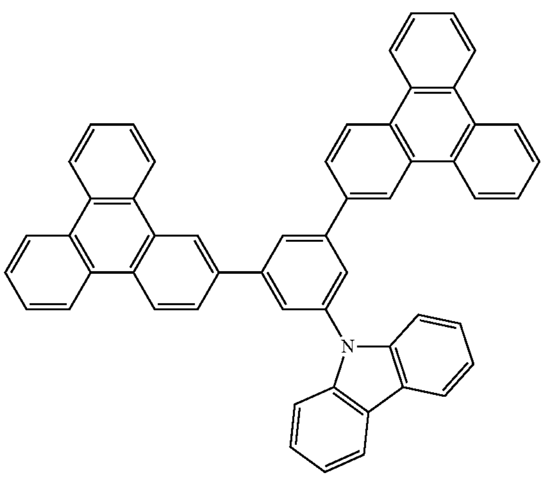
BF4
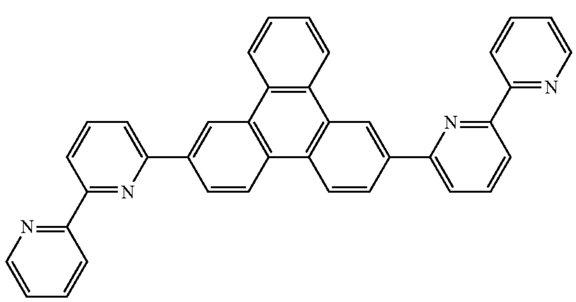
-continued
BF5
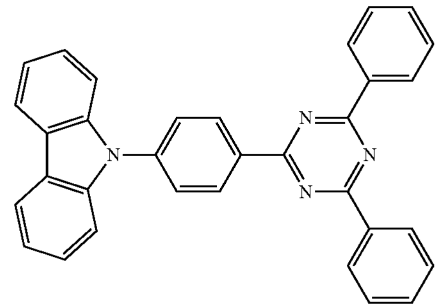
BF6
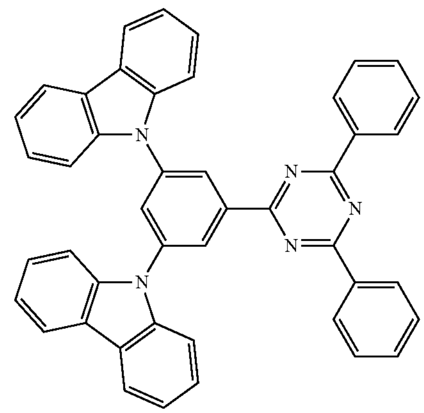
BF7
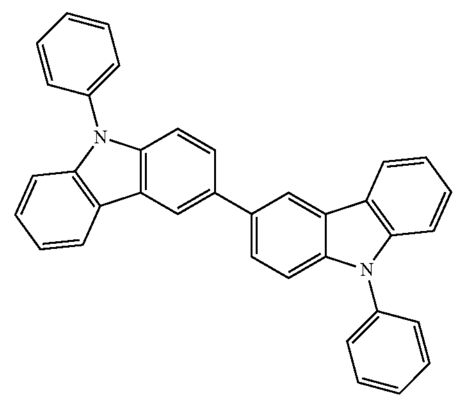
BF8
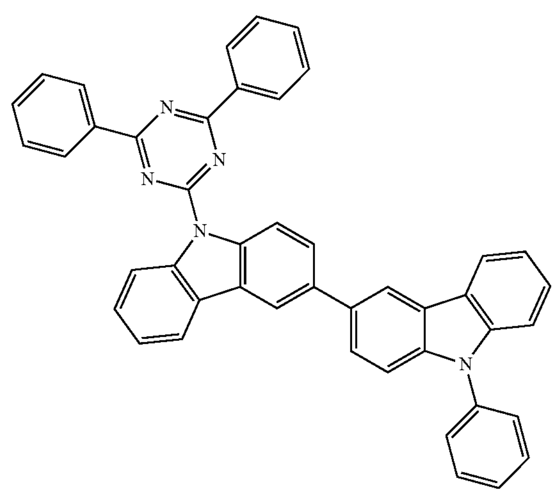

-continued
BF9
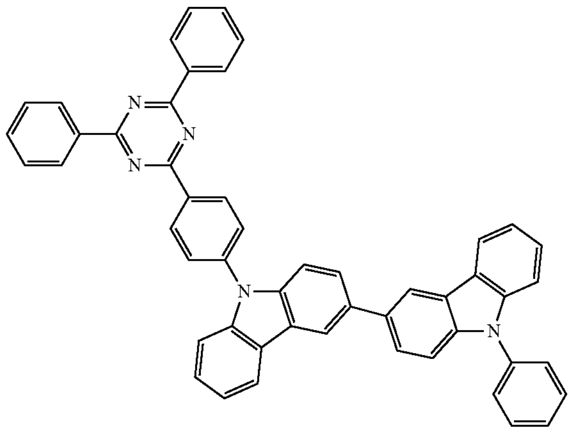
BF10
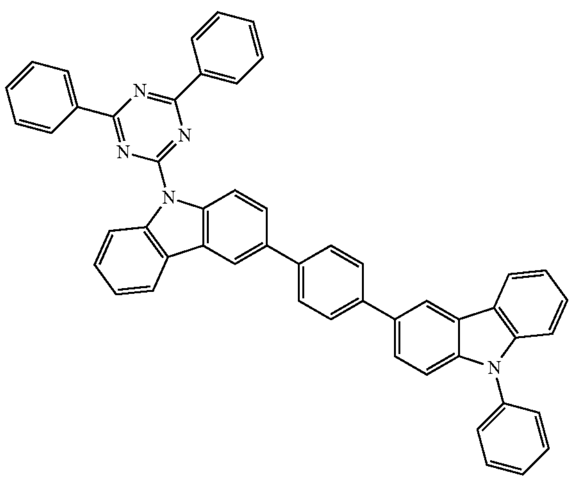
BF11
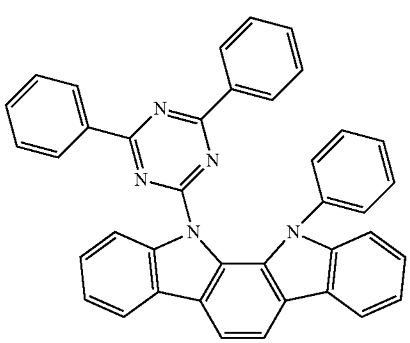
-continued
BF12
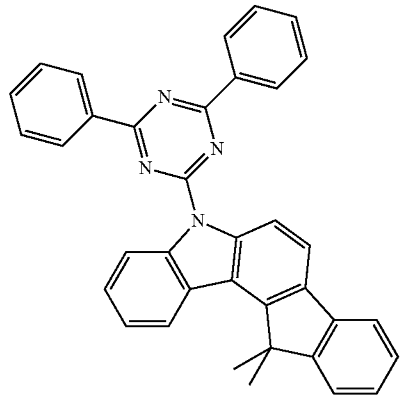
BF13
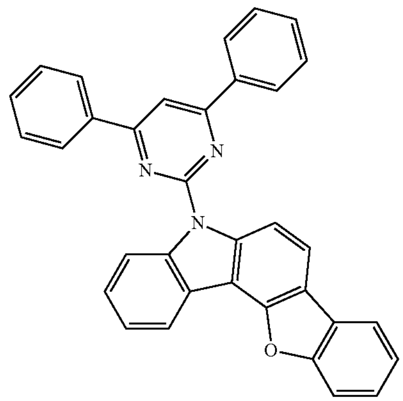
BF14
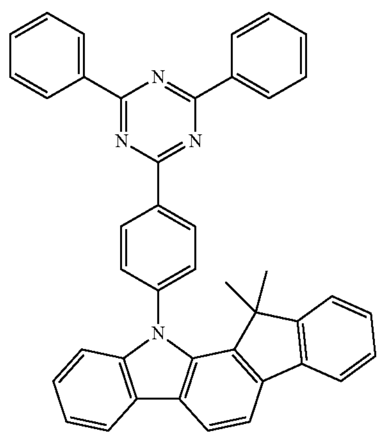
BF15
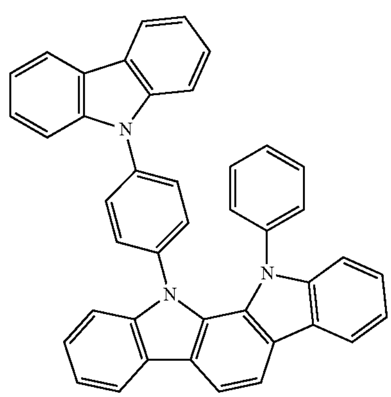

-continued

BF16

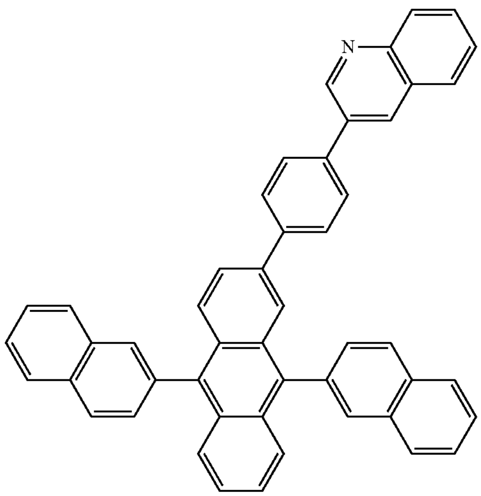

BF17

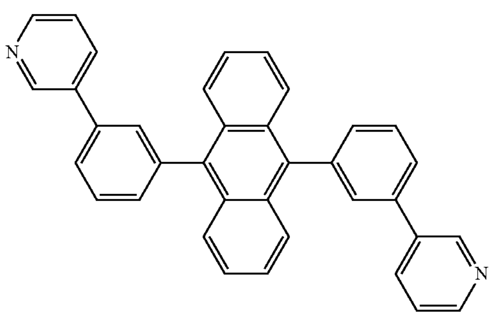

BF18

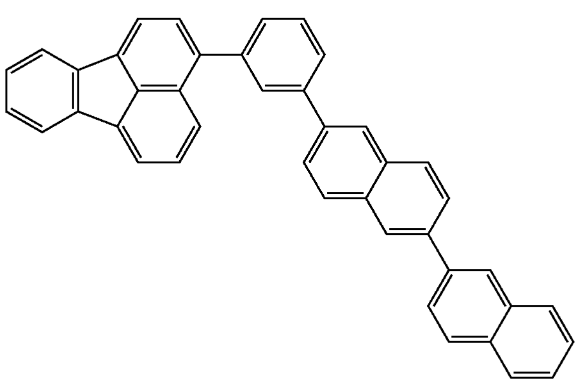

-continued

BF19

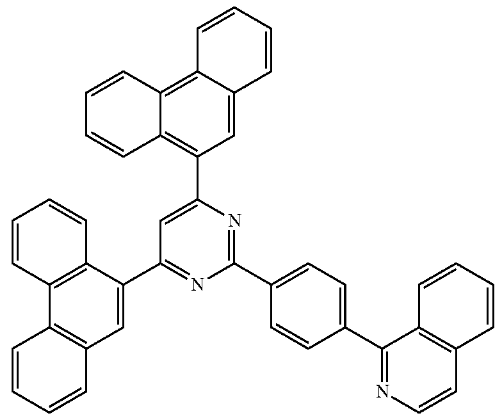

For example, electron affinity $EA_1$ of the first material and electron affinity $EA_2$ of the second material may satisfy Inequation 1, but the electron affinity $EA_1$ of the first material and the electron affinity $EA_2$ of the second material are not limited thereto:

$$EA_1 < EA_2 \quad \text{Inequation 1}$$

For example, the emission layer includes a host and a dopant; a triplet energy $Eg_{DT2}$ of the dopant may satisfy Inequation 2, but triplet energy $Eg_{DT2}$ is not limited thereto:

$$Eg_{T1} > Eg_{DT2} \quad \text{Inequation 2}$$

In another embodiment, the emission layer may include a host and a dopant; and a triplet energy of the host $Eg_{HT2}$ may satisfy Inequation 3 below, but triplet energy of the host $Eg_{HT2}$ is not limited thereto:

$$Eg_{T1} > Eg_{HT2} \quad \text{Inequation 3}$$

The accompanying drawing is a schematic cross-sectional view of an organic light-emitting device 10 according to an embodiment of the present invention. The organic light-emitting device 10 includes a first electrode 110, an organic layer 150, and a second electrode 190.

Hereinafter, a structure and a method of manufacturing an organic light-emitting device according to an embodiment of the present invention will be described with reference to the accompanying drawing.

A substrate may be additionally disposed under the first electrode 110 or above the second electrode 190 in the accompanying drawing. The substrate may be a glass substrate or a transparent plastic substrate with excellent mechanical strength, thermal stability, transparency, surface smoothness, ease of handling, and water resistance.

The first electrode 110 may be formed by, for example, depositing or sputtering a first electrode material on the substrate. When the first electrode 110 is an anode, the material of the first electrode 110 may be selected from materials having a high work function to facilitate hole injection. The first electrode 110 may be a reflective electrode, a transflective electrode, or a transmissive electrode. The material of the first electrode 110 may be a transparent material having high conductivity, and examples of such a material include indium tin oxide (ITO), indium zinc oxide (IZO), tin oxide ($SnO_2$), and zinc oxide (ZnO). In some embodiments, at least one selected from magnesium (Mg), aluminum (Al), aluminum-lithium (Al—Li), calcium (Ca), magnesium-indium (Mg—In), magnesium-silver (Mg—Ag), or the like may be used (utilized) as the first electrode material of the first electrode 110, which may be a transflective electrode or a transmissive electrode.

The first electrode 110 may have a single-layered structure or a multi-layered structure. For example, the first electrode 110 may have a three-layered structure of ITO/Ag/ITO, but the first electrode 110 is not limited thereto.

The organic layer 150 may be disposed on the first electrode 110. The organic layer 150 includes an emission layer.

The organic layer 150 may include a hole transport region disposed between the first electrode 110 and the emission layer, an electron transport region disposed between the emission layer and the second electrode 190, and a mixed layer disposed between the emission layer and the electron transport region.

The hole transport region may include at least one selected from a hole injection layer (HIL), a hole transport layer (HTL), a buffer layer, and an electron blocking layer (EBL), and the electron transport region may include at least one selected from a hole-blocking layer (HBL), an electron transport layer (ETL), and an electron injection layer (EIL), but the hole transport region and the electron transport region are not limited thereto.

The hole transport region may include a single layer including (e.g., formed of) a single material, a single layer including (e.g., formed of) a plurality of different materials, or a multi-layered structure including a plurality of layers including (e.g., formed of) a plurality of different materials.

For example, the hole transport region may have a single-layered structure including (e.g., formed of) a plurality of different materials or a structure in which HIL/HTL, HIL/HTL/buffer layer, HIL/buffer layer, HTL/buffer layer, or HIL/HTL/EBL are sequentially layered on the first electrode 110, but the hole transport region is not limited thereto.

When the hole transport region includes the HIL, the HIL may be formed on the first electrode 110 by using (utilizing) various suitable methods, such as vacuum deposition, spin coating, casting, Langmuir-Blodgett (LB) deposition, inkjet printing, laser printing, and laser-induced thermal imaging (LITI).

When the HIL is formed using (utilizing) vacuum deposition, vacuum deposition conditions may vary according to the compound that is used (utilized) to form the HIL, and the desired structure of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec.

When the HIL is formed using (utilizing) spin coating, the coating conditions may vary according to the compound that is used (utilized) to form the NIL, and the desired structure of the HIL to be formed. For example, the coating rate may be in the range of about 2,000 rpm to about 5,000 rpm, and a temperature at which heat treatment is performed may be in the range of about 80° C. to about 200° C.

When the hole transport region includes the HTL, the HTL may be formed on the first electrode 110 or on the HTL by using (utilizing) various suitable methods, such as vacuum deposition, spin coating, casting, LB deposition, inkjet printing, laser printing, and LITI. When the HTL is formed by vacuum deposition or spin coating, vacuum deposition conditions and coating conditions may be the same (or substantially the same) as the vacuum deposition conditions and the coating conditions of the HIL.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine(4,4',4"-tris(N-carbazolyl)triphenylamine) (TCTA), polyaniline/dodecylbenzenesulfonic acid (Pani/DBSA), Poly(3,4-ethylenedioxythiophene)/Poly(4-styrenesulfonate) (PEDOT/PSS), polyaniline/camphor sulfonic acid (pani/CSA), or (polyaniline)/poly(4-styrenesulfonate) (PANI/PSS), a compound represented by Formula 201, and a compound represented by Formula 202:

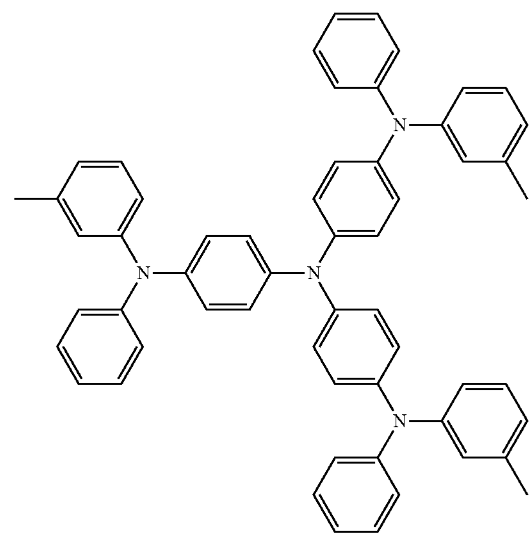

m-MTDATA

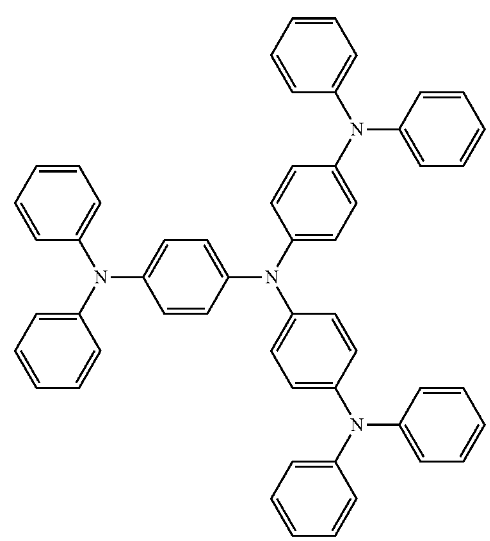

TDATA

-continued
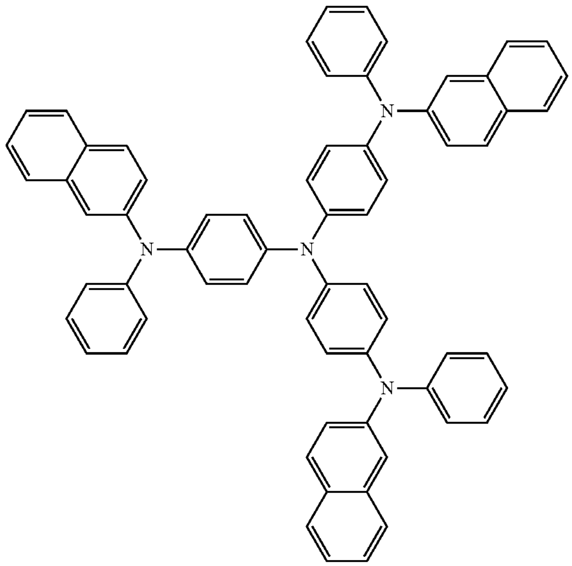
2-TNATA
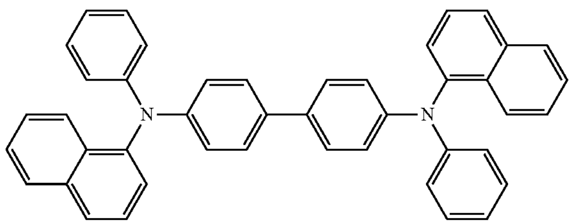
NPB
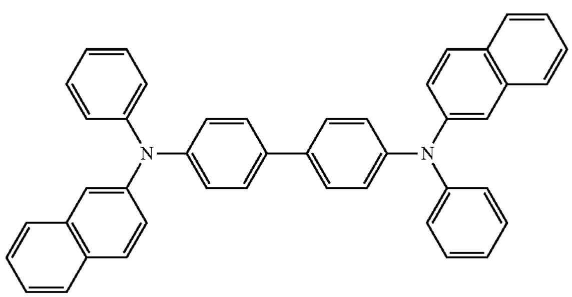
β-NPB
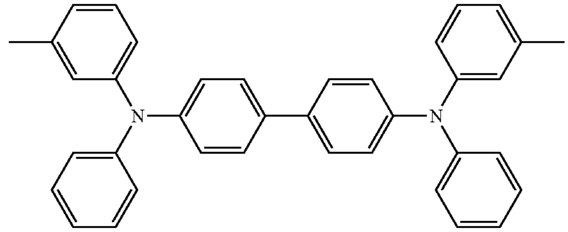
TPD
-continued
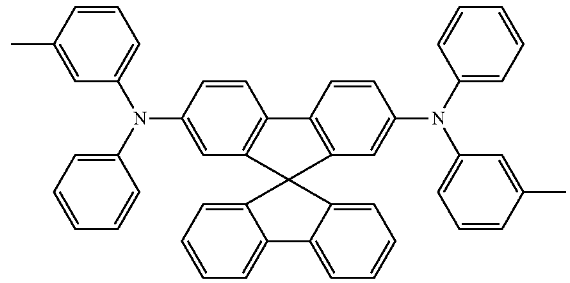
Spiro-TPD
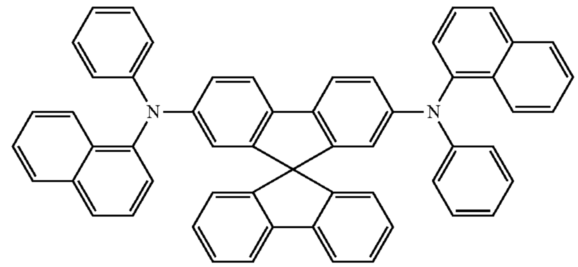
Spiro-NPB
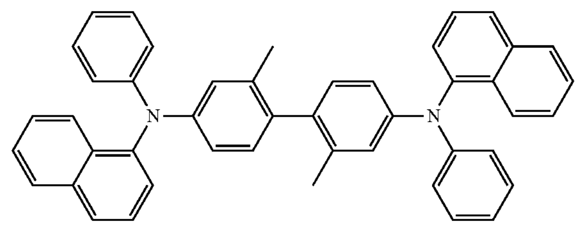
α-NPB
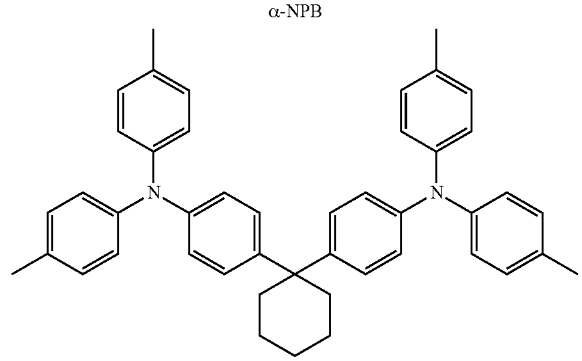
TAPC
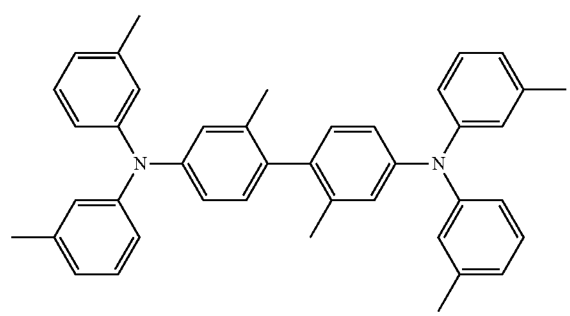
HMTPD
Formula 201
$$R_{201}—(L_{201})_{xa1}—N\begin{cases}(L_{202})_{xa2}—R_{202}\\(L_{203})_{xa3}—R_{203}\end{cases}$$

-continued

Formula 202

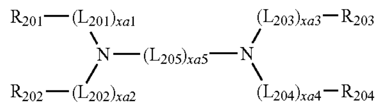

In Formulae 201 and 202, $L_{201}$ to $L_{205}$ may be each independently the same as $L_{11}$ in the present specification (e.g., as described with respect to Formula 1);

xa1 to xa4 may be each independently an integer selected from 0, 1, 2, and 3;

xa5 may be an integer selected from 1, 2, 3, 4, and 5; and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group.

For example, in Formulae 201 and 202, $L_{201}$ to $L_{205}$ may be each independently selected from a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{2D}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently an integer selected from 0, 1, or 2;

xa5 may be an integer of 1, 2, or 3;

$R_{201}$ to $R_{204}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but Formulae 201 and 202 are not limited thereto.

The compound represented by Formula 201 may be represented by Formula 201A:

Formula 201A

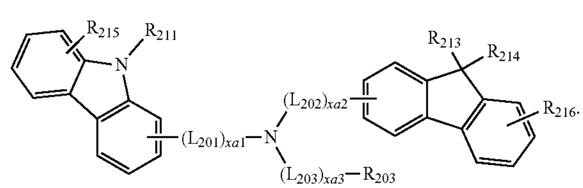

For example, the compound represented by Formula 201 may be represented by Formula 201A-1, but Formula 201 is not limited thereto:

Formula 201A-1

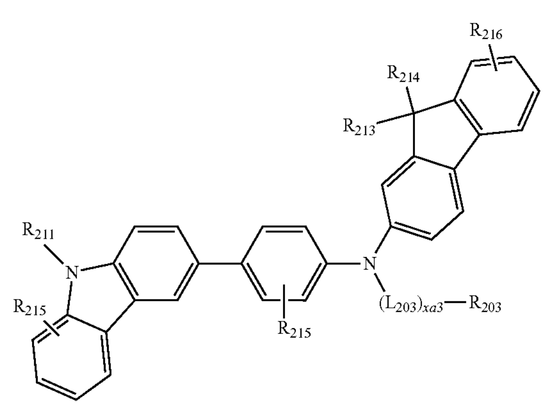

The compound represented by Formula 202 may be represented by Formula 202A, but Formula 202 is not limited thereto:

Formula 202A

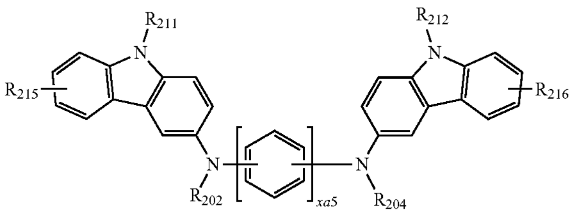

In Formulae 201A, 201A-1, and 202A, $L_{201}$ to $L_{203}$, xa1 to xa3, xa5, and $R_{202}$ to $R_{204}$ are the same as those described with respect to Formulae 201 and 202, $R_{211}$ and $R_{212}$ may be the same as $R_{203}$ as described with respect to Formulae 201 and 202, and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group.

For example, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently an integer selected from 0 and 1;

$R_{203}$, $R_{211}$, and $R_{212}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be an integer selected from 1 and 2.

In Formulae 201A and 201A-1, $R_{213}$ and $R_{214}$ may be coupled to each other (e.g., combined) to form a saturated or an unsaturated ring.

The compound represented by Formula 201 and the compound represented by Formula 202 may include Compounds HT1 to HT20, but the compound represented by Formula 201 and the compound represented by Formula 202 are not limited thereto.

HT1

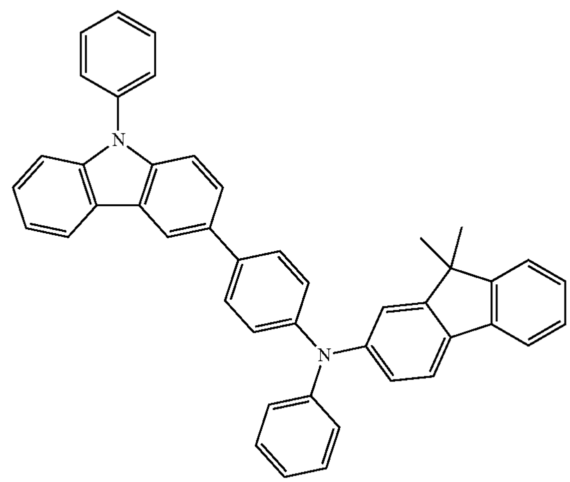

HT2

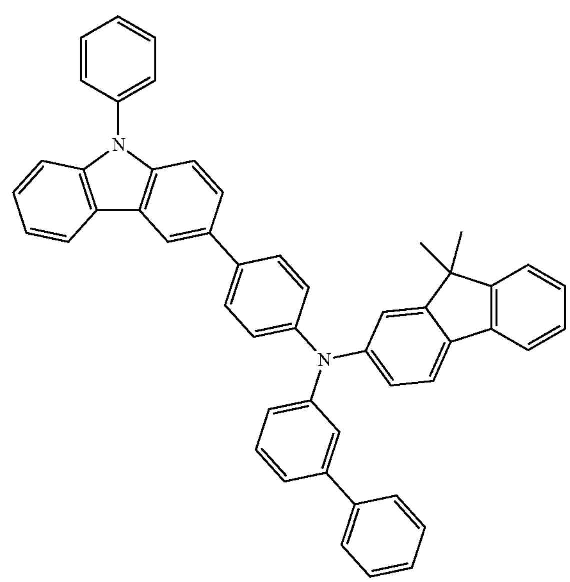

-continued
HT3
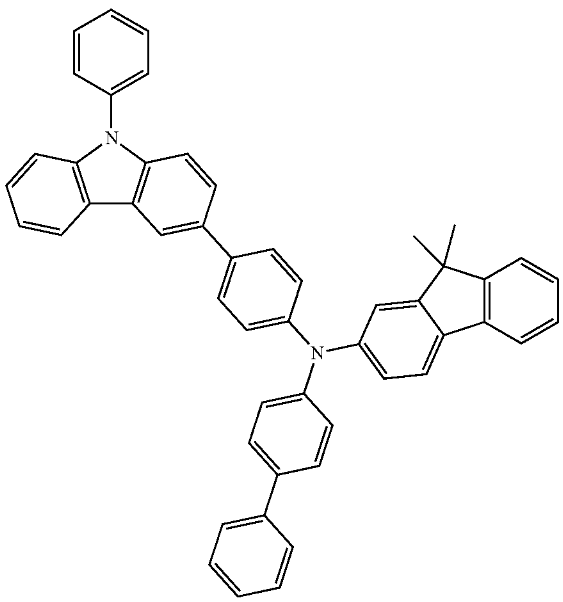
HT4
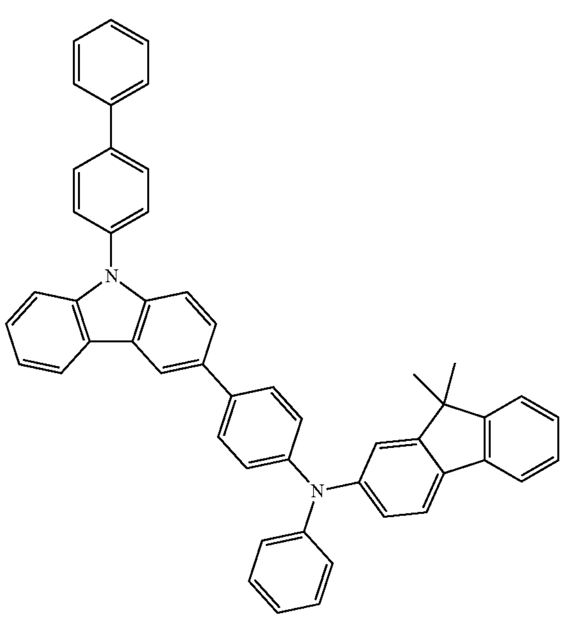
-continued
HT5
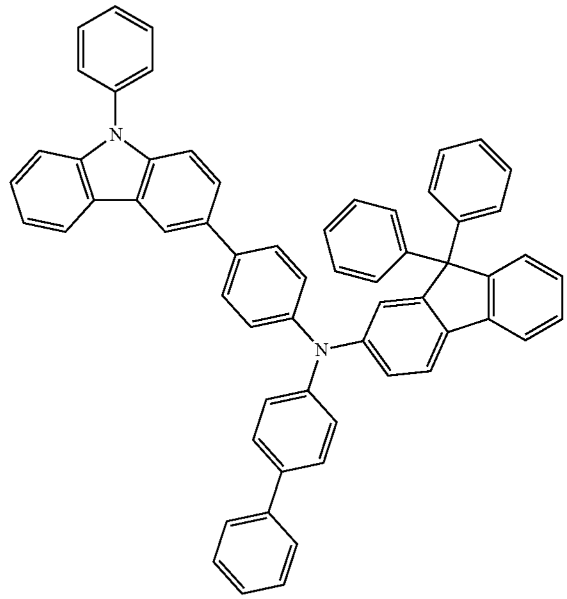
HT6
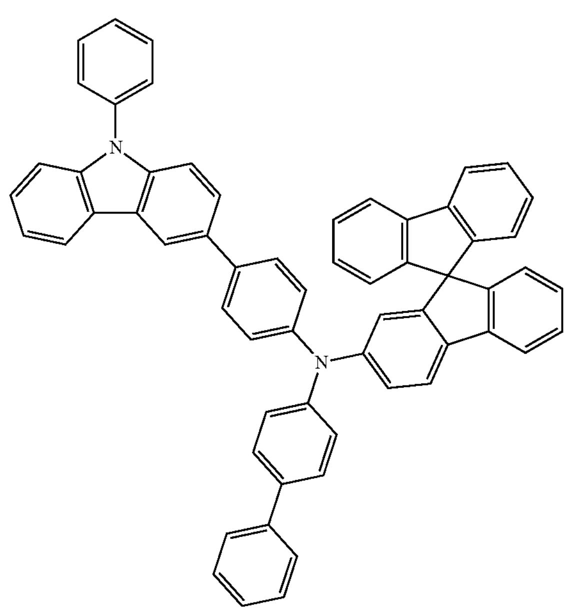

-continued
HT7
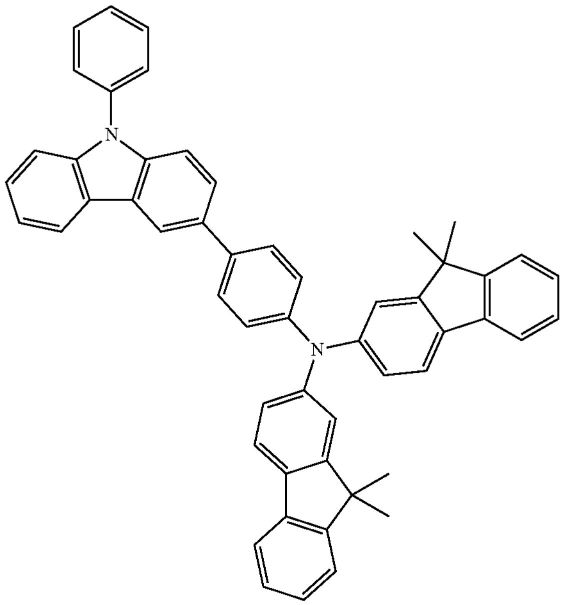
HT8
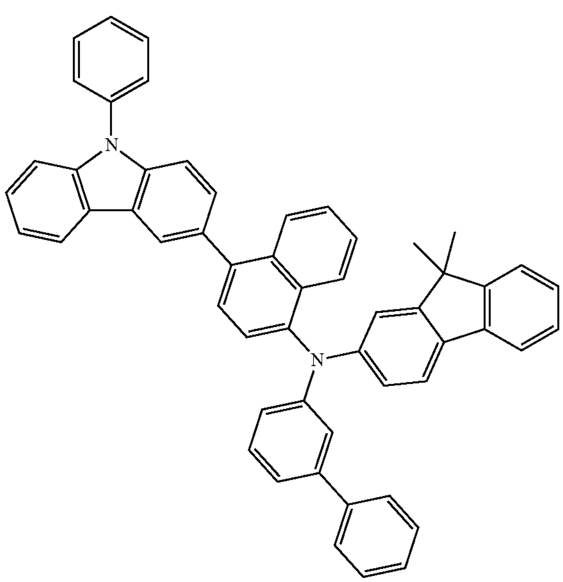
-continued
HT9
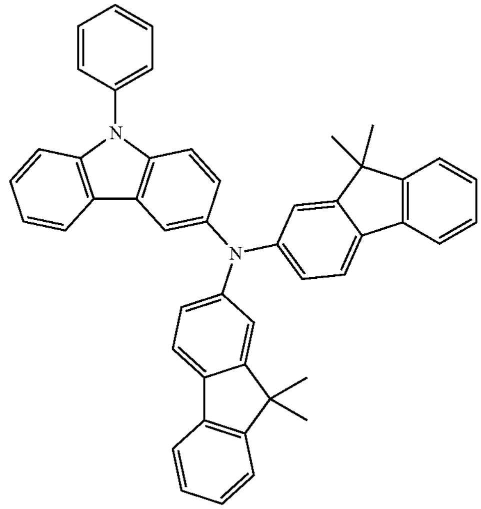
HT10
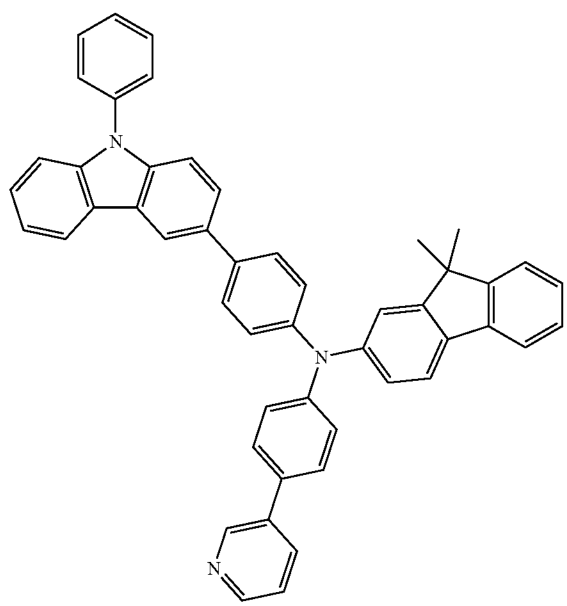

-continued
HT11
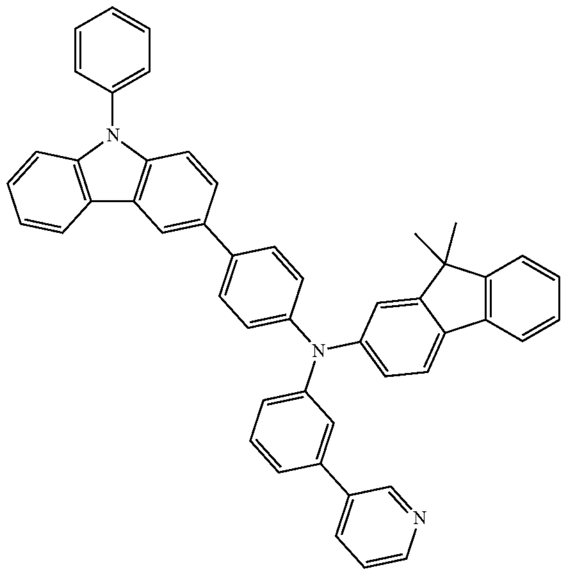
HT12
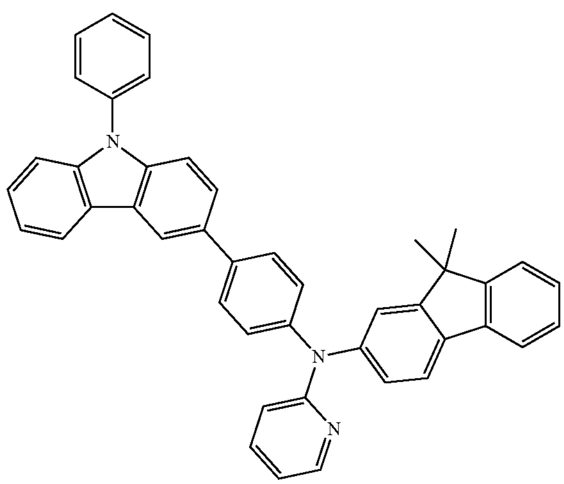
HT13
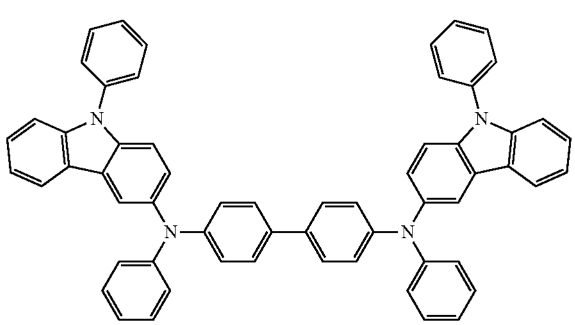
-continued
HT14
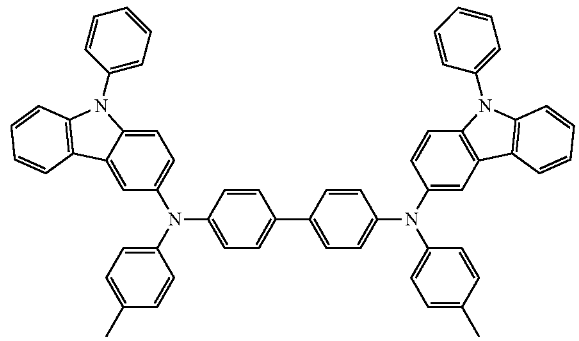
HT15
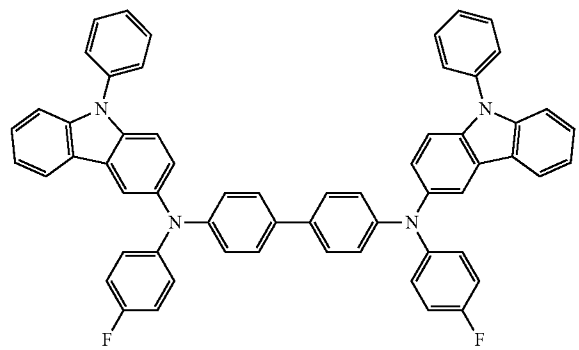
HT16
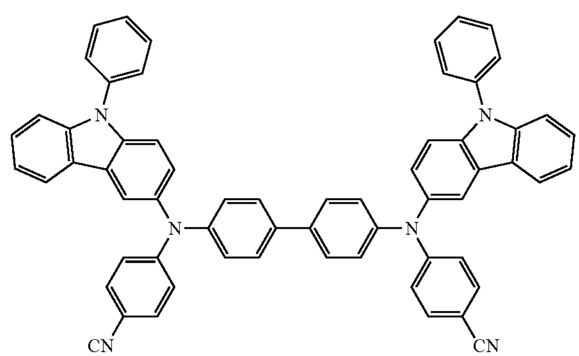
HT17
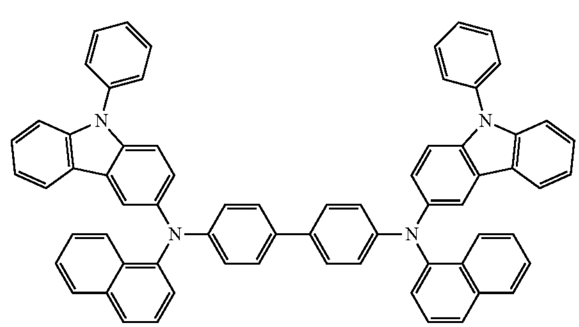

-continued

HT18

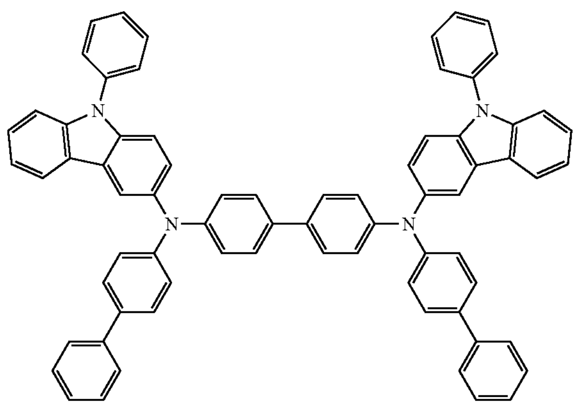

HT19

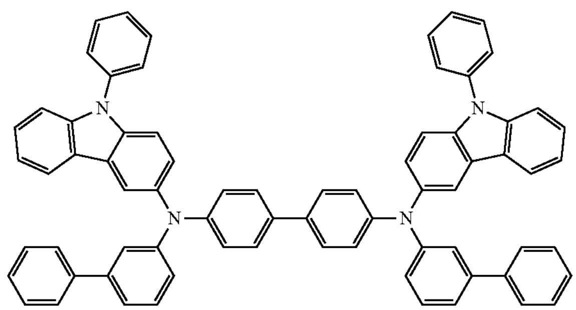

HT20

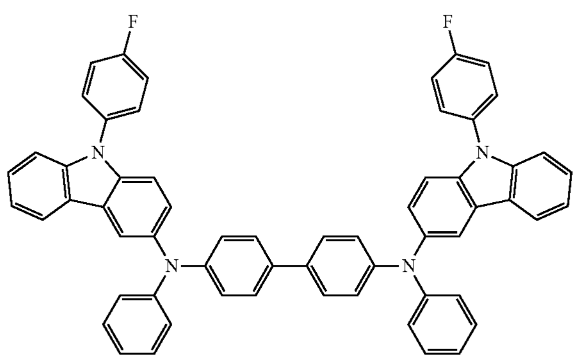

A thickness of the hole transport region may be about 100 Å to about 10000 Å, for example, about 100 Å to about 1000 Å. When the hole transport region includes both of the HIL and the HTL, a thickness of the HIL may be about 100 Å to about 10000 Å, for example, about 100 Å to about 1000 Å and a thickness of the HTL may be about 50 Å to about 2000 Å, for example, about 100 Å to about 1500 Å. When the thicknesses of the hole transport region, the HIL, and the HTL satisfy any of the foregoing ranges, satisfactory hole injection characteristics may be obtained without a substantial increase in a driving voltage.

The hole transport region may further include a charge-generating material, in addition to the material described above. The charge-generating material may be uniformly (e.g., consistently or evenly) or disuniformly (e.g., inconsistently or unevenly) dispersed in the hole transport region.

The charge-generating material may be, for example, a p-dopant. The p-dopant may be selected from quinone derivatives, metal oxides, F-containing compounds, Cl-containing compounds, and CN-containing compounds, but the charge-generating material is not limited thereto. For example, non-limiting examples of the p-dopant include quinone derivatives, such as tetracyanoquinodimethane (TCNQ), and 2,3,5,6-tetrafluoro-tetracyano-1,4-benzoquinodimethane (F4-TCNQ); metal oxides such as tungsten oxides and molybdenum oxides; and a Compound HT-D1.

Compound HT-D1

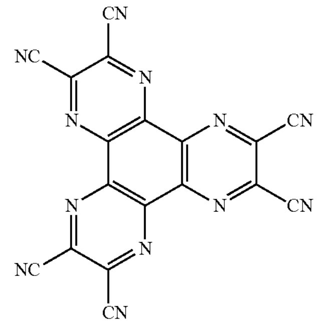

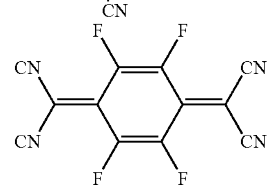

F4-TCNQ

The hole transport region may include at least one selected from a buffer layer and the EBL, in addition to the HIL and the HTL. The buffer layer may compensate for an optical resonance distance of light according to a wavelength of the light emitted from the EML, and thus may increase efficiency. The buffer layer may include any suitable material that may be used (utilized) in a hole transport region. The EBL may prevent (or reduce) injection of electrons from the electron transport region.

The HTL may include a first HTL and a second HTL, which may simultaneously (or concurrently) include the same material or include different materials.

Then, the EML may be formed on the first electrode 110 or the hole transport region by vacuum deposition, spin coating, casting, LB deposition, inkjet printing, laser printing, LITI, or the like. When the EML is formed using (utilizing) vacuum deposition or spin coating, the deposition and coating conditions may be similar to those for the formation of the HIL.

When the organic light-emitting device 10 is a full color organic light-emitting device, the organic light-emitting device 10 may be patterned into a red EML, a green EML, and a blue EML, according to different EMLs and individual pixels. In some embodiments, the EML may have a structure in which the red EML, the green EML, and the blue EML are layered or a structure in which a red light emission material, a green light emission material, and a blue light emission material are mixed without separation of layers and emit white light.

The EML may include a host and a dopant.

The host may include at least one selected from TPBi, TBADN, AND (also referred to as "DNA"), CBP, CDBP, and TCP:

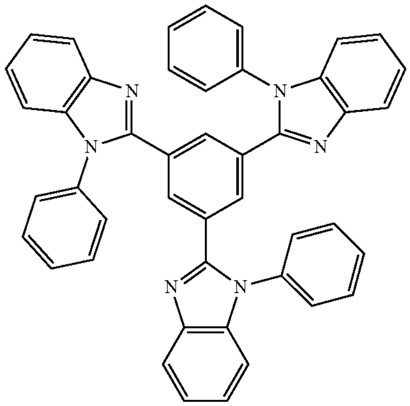

TPBi

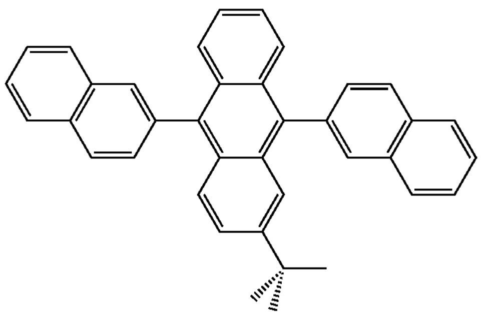

TBADN

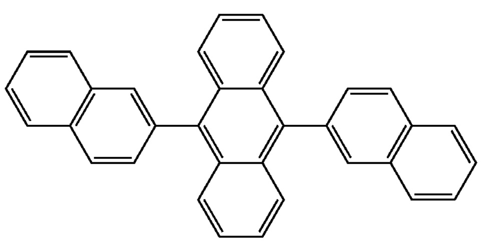

ADN

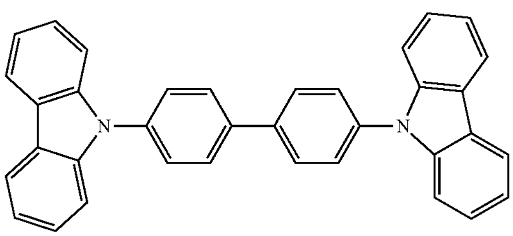

CBP

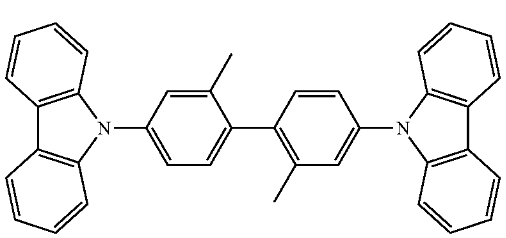

CDBP

-continued

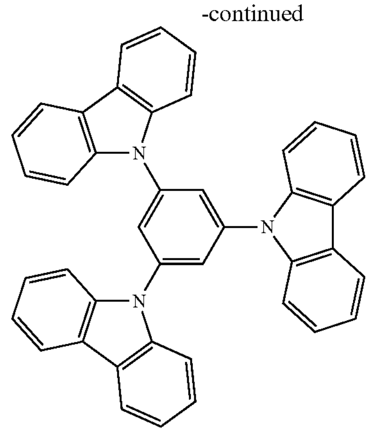

TCP

In some embodiments, the host may include a compound represented by Formula 301:

$$Ar_{301}\text{-}[(L_{301})_{xb1}\text{-}R_{301}]_{xb2} \quad \text{Formula 301}$$

In Formula 301, $Ar_{301}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, and —Si($Q_{301}$)($Q_{302}$)($Q_{303}$) (wherein, $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

$L_{301}$ is the same as $L_{201}$ as described with respect to Formulae 201 and 202;

$R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be an Integer selected from 0, 1, 2, and 3; and xb2 may be an Integer selected from 1, 2, 3, and 4.

For example, in Formula 301, $L_{301}$ may be selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group.

For example, the host may include a compound represented by Formula 301A:

Formula 301A

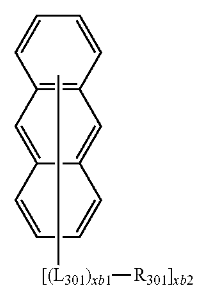

In Formula 301A, descriptions of substituents are as described herein (e.g., $L_{301}$, xb1, $R_{301}$ and xb2 are the same as those described with respect to Formula 301).

The compound represented by Formula 301 may include at least one selected from Compounds H1 to H42, but the compound represented by Formula 301 is not limited thereto:

H1

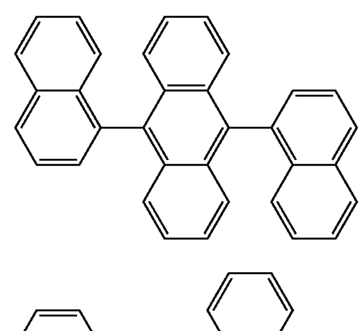

H2

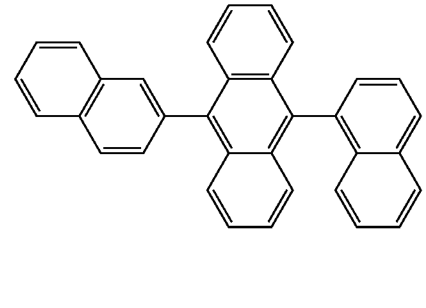

-continued
H3
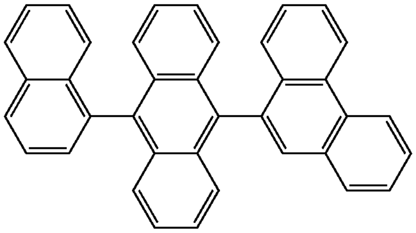
H4
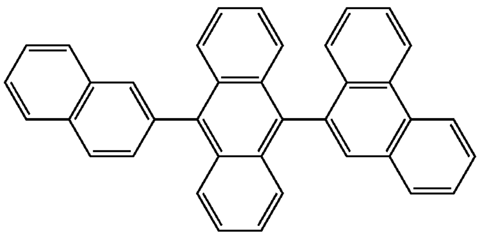
H5
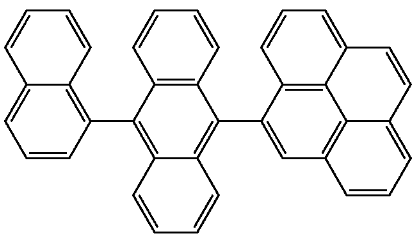
H6
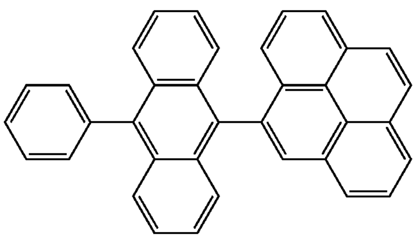
H7
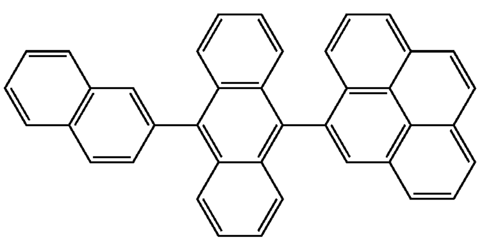
H8
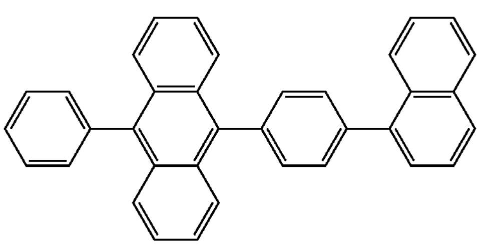
-continued
H9
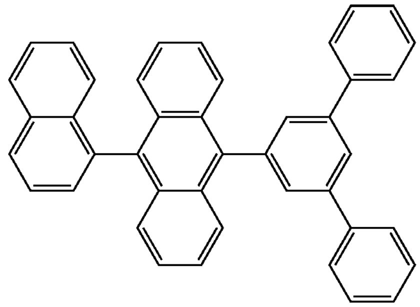
H10
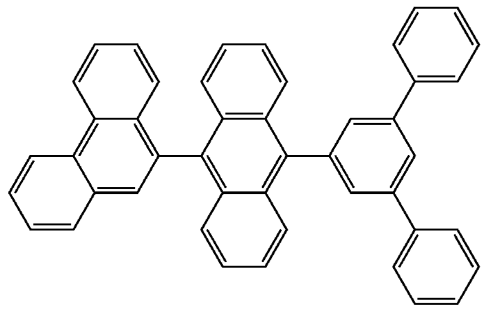
H11
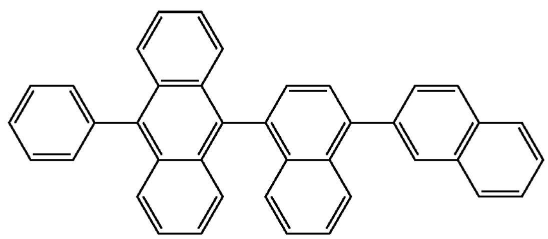
H12
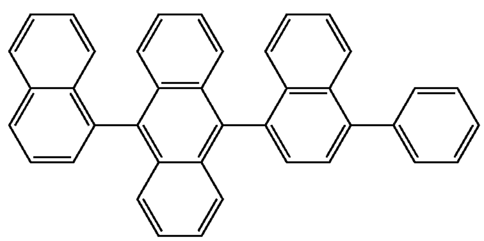
H13
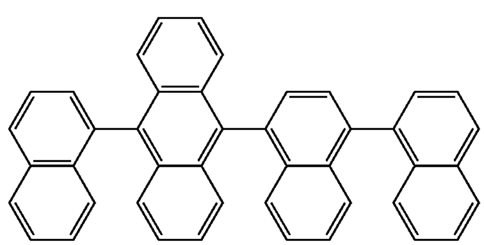
H14
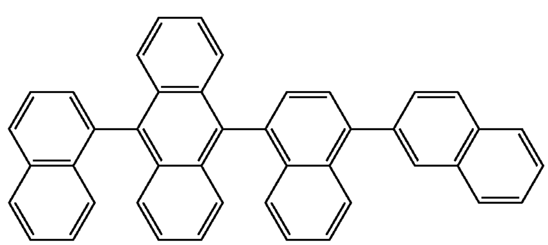

-continued
H15
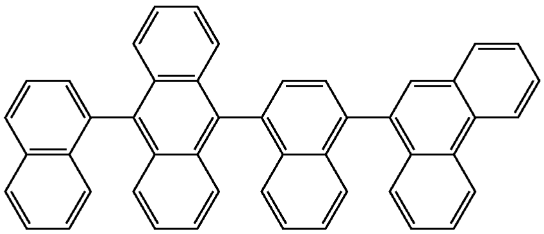
H16
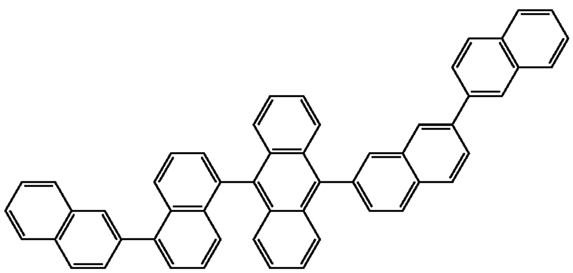
H17
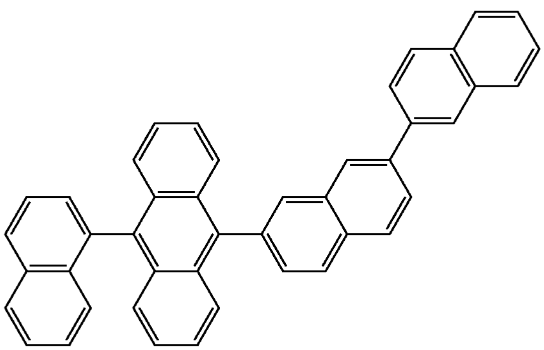
H18
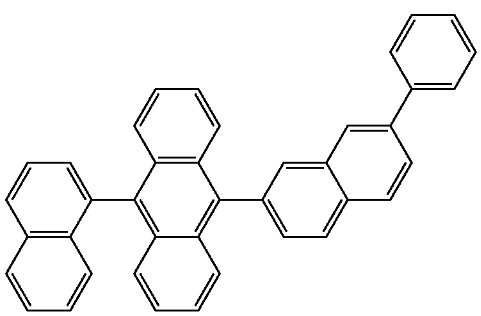
H19
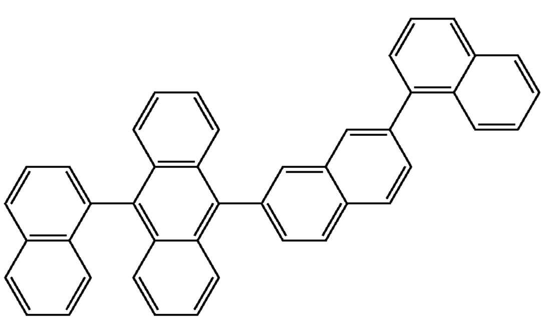
-continued
H20
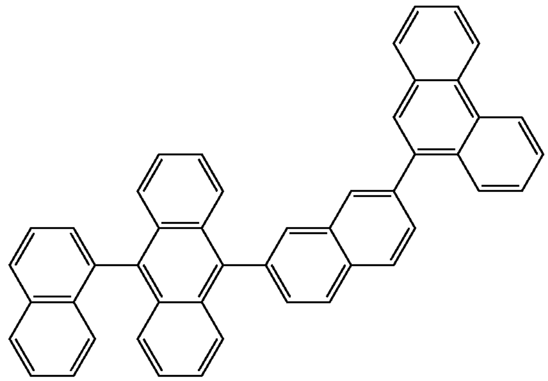
H21
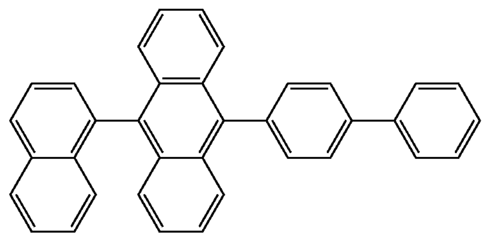
H22
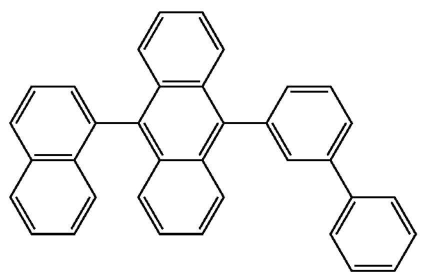
H23
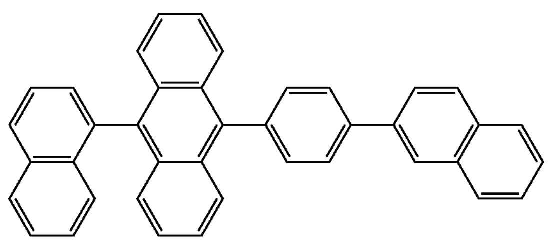
H24
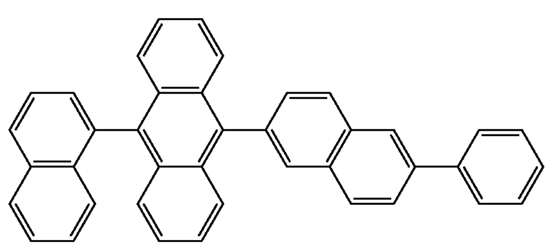

-continued
H25
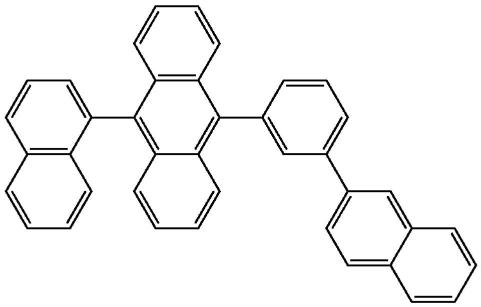
H26
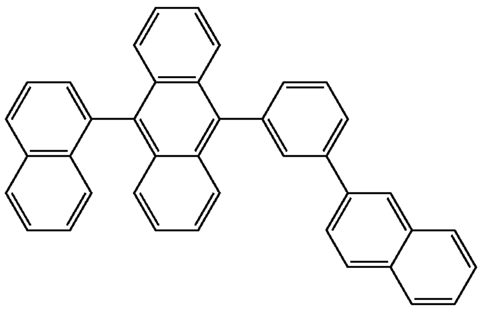
H27
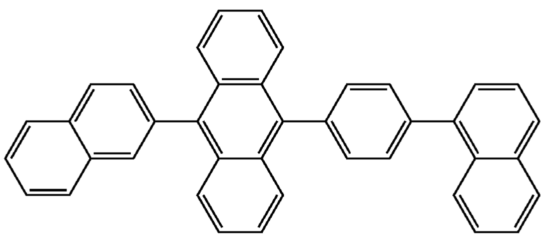
H28
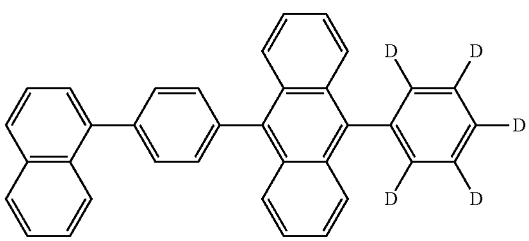
H29
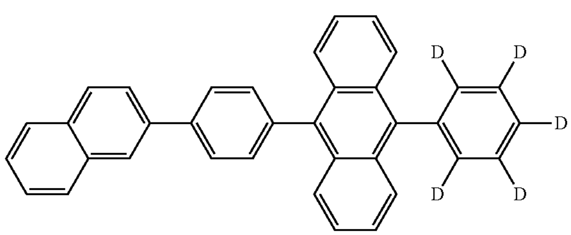
H30
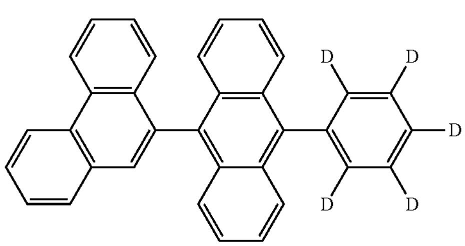
-continued
H31
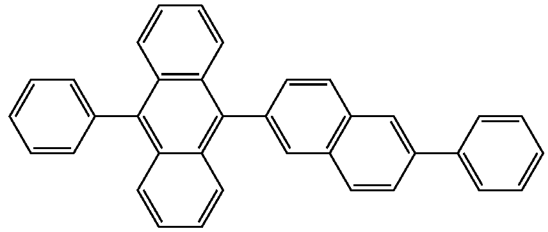
H32
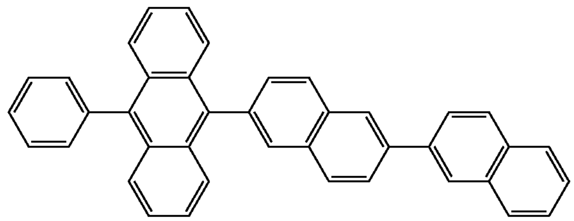
H33
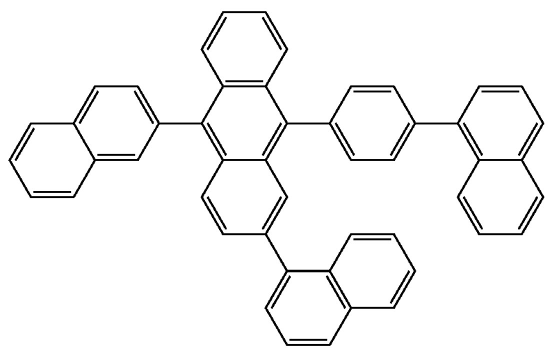
H34
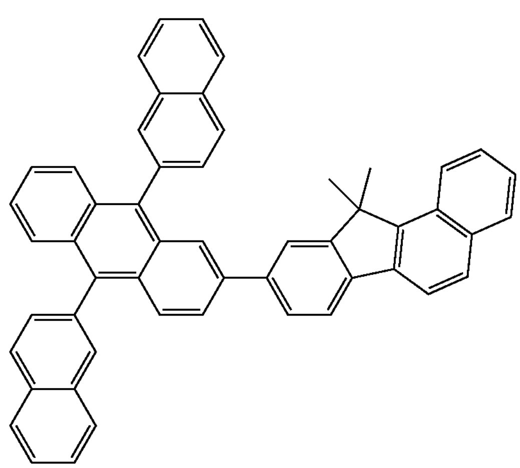

-continued
H35
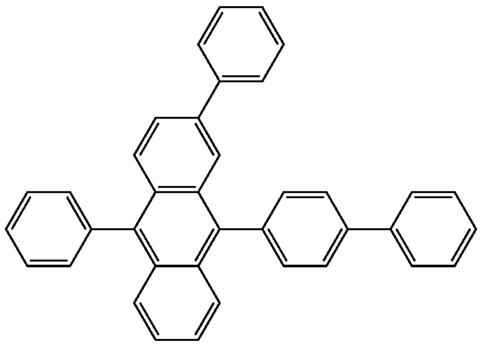
H36
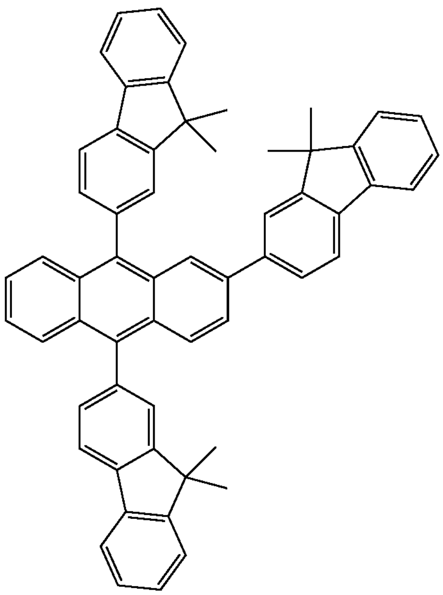
H37
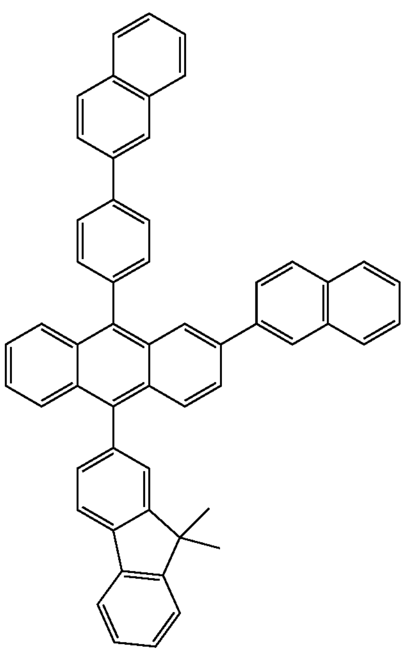
-continued
H38
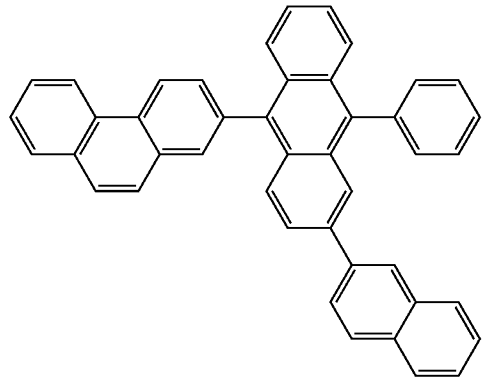
H39
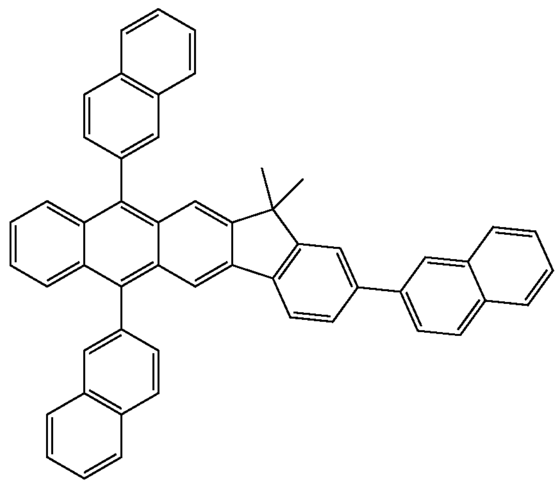
H40
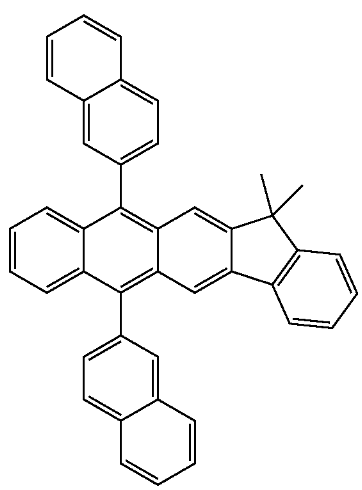

-continued
H41
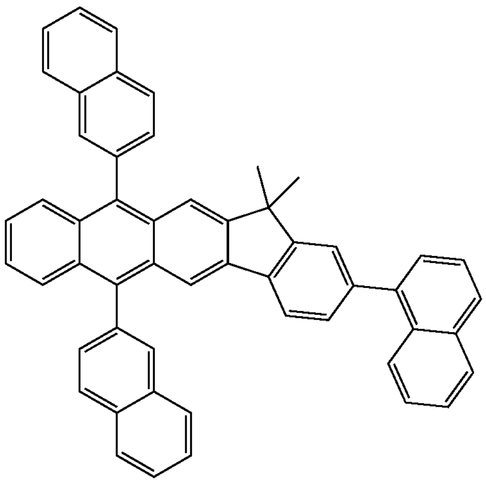
H42
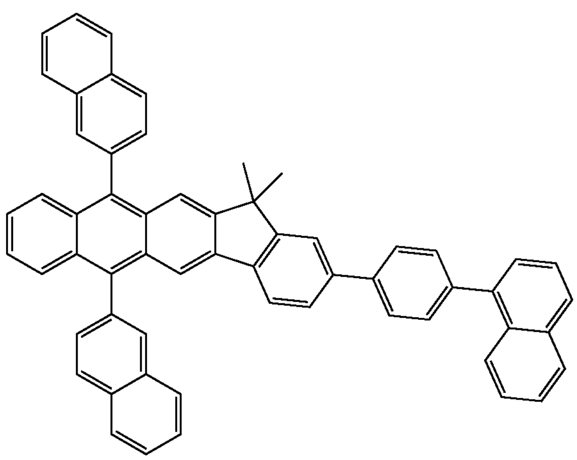
In some embodiments, the host may include at least one from Compounds H43 to H49, but the host is not limited thereto:
H43
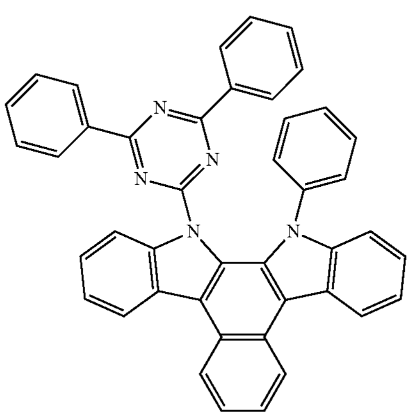
-continued
H44
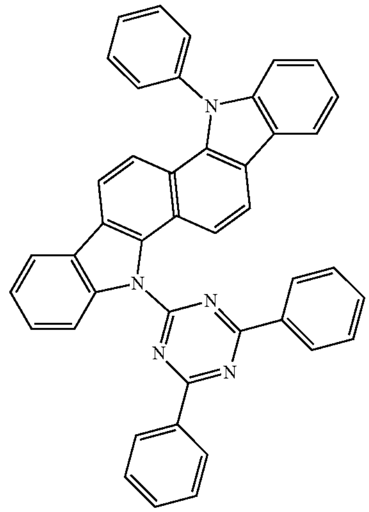
H45
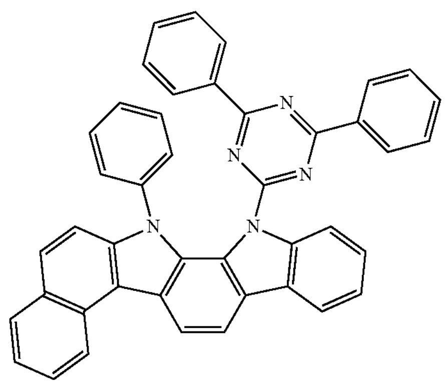
H46
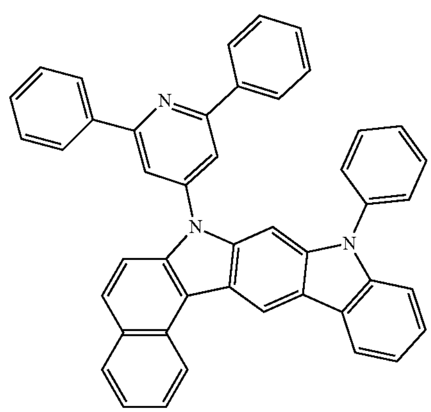

-continued

H47

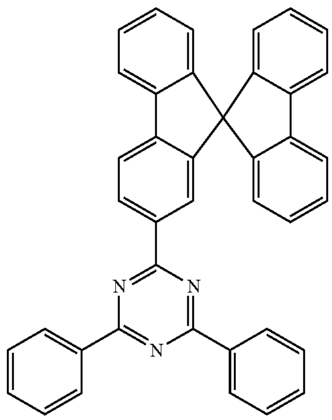

H48

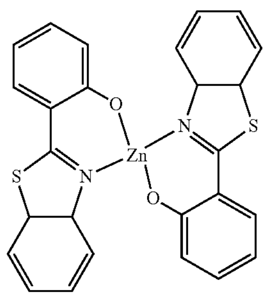

H49

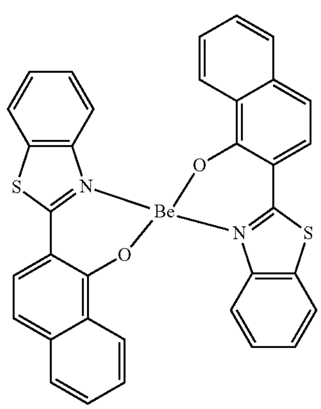

The dopant may include at least one selected from a fluorescent dopant and a phosphorescent dopant.

The phosphorescent dopant may include an organic metal complex represented by Formula 401:

Formula 401

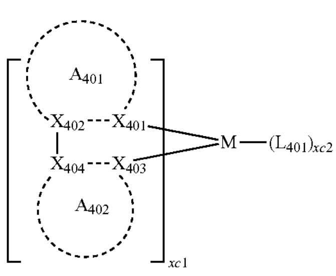

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

Rings $A_{401}$ and $A_{402}$ may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from:

a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group (non-aromatic condensed polycyclic group), a monovalent non-aromatic hetero-condensed polycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, and a non-aromatic condensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$) and —B($Q_{426}$)($Q_{427}$), where $Q_{411}$ to $Q_{417}$, $Q_{421}$ to $Q_{427}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group;

$L_{401}$ is an organic ligand;

xc1 is 1, 2, or 3; and xc2 is 0, 1, 2, or 3.

$L_{401}$ may be any one selected from a monovalent, a divalent, or a trivalent organic ligand. For example, $L_{401}$ may be a halogen ligand (for example, Cl or F), a diketone ligand (for example, acetylacetonate, 1,3-diphenyl-1,3-propanedionate, 2,2,6,6-tetramethyl-3,5-heptanedionate, and hexafluoroacetonate), a carboxylic acid ligand (for example, picolinate, dimethyl-3-pyrazolecarboxylate, and benzoate), a carbon monoxide ligand, an isonitrile ligand, a cyano ligand, and a phosphorus ligand (for example, may be selected from phosphine and phosphite), but $L_{401}$ is not limited thereto.

In Formula 401, when $A_{401}$ has two or more substituents, the two or more substituents of $A_{401}$ may be coupled to each other (e.g., combined) to form a saturated or an unsaturated ring.

In Formula 401, when $A_{402}$ has two or more substituents, the two or more substituents of $A_{402}$ may be coupled to each other (e.g., combined) to form a saturated or an unsaturated ring.

In Formula 401, when xc1 is two or greater, a plurality of ligands

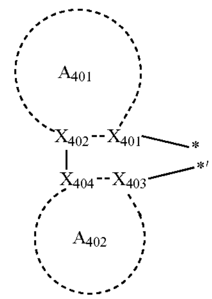

in Formula 401 may be the same or different. In Formula 401, when xc1 is two or greater, $A_{401}$ and $A_{402}$ may be respectively connected to $A_{401}$ and $A_{402}$ of a neighboring ligand either directly or via a linking group (for example, a $C_1$-$C_5$ alkylene group and —N(R')— (where, R' is a $C_1$-$C_{10}$ alkyl group or a $C_6$-$C_{20}$ aryl group) or —C(=O)—) disposed therebetween.

The phosphorescent dopant may include at least one selected from Compounds PD1 to PD74, but the phosphorescent dopant is not limited thereto:

PD1

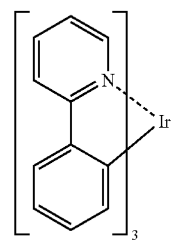

PD2

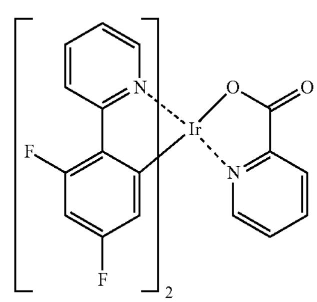

PD3

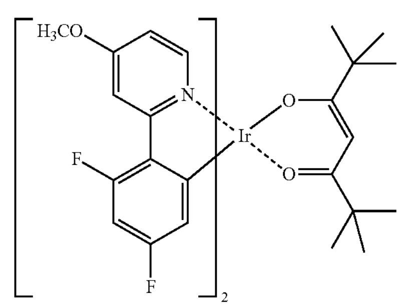

PD4
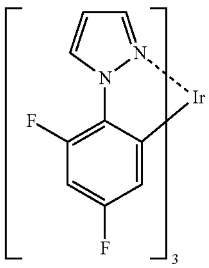
PD5
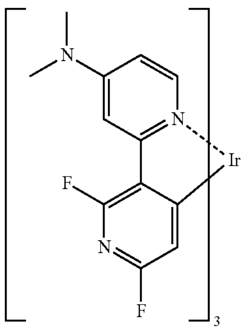
PD6
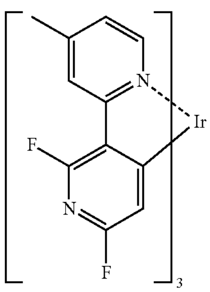
PD7
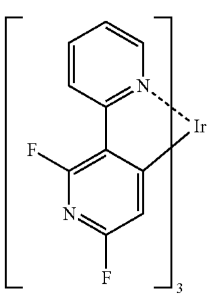
PD8
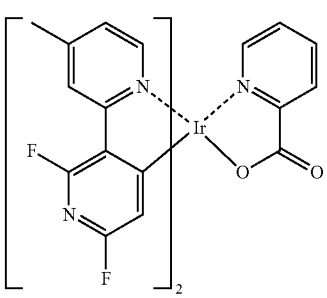
PD9
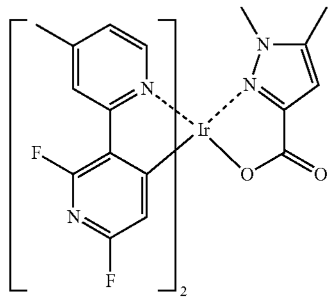
PD10
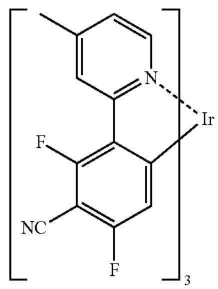
PD11
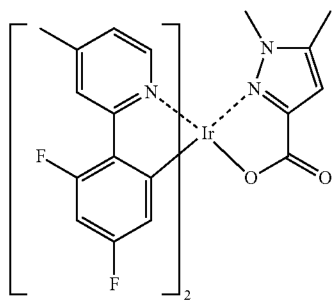
PD12
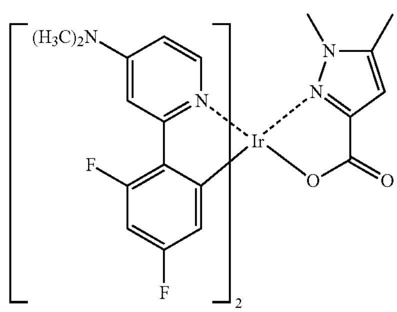
PD13
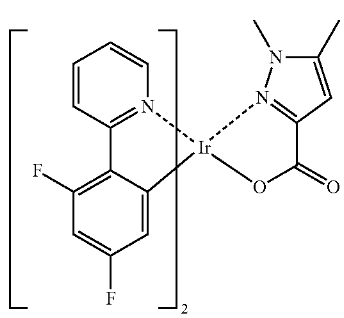

-continued
PD14
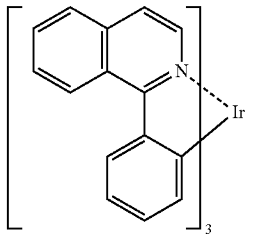
PD15
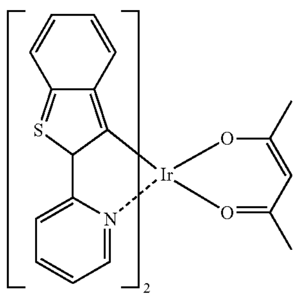
PD16
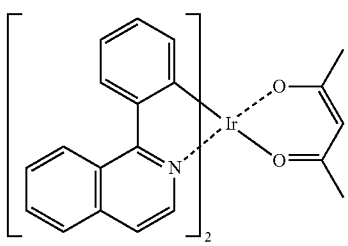
PD17
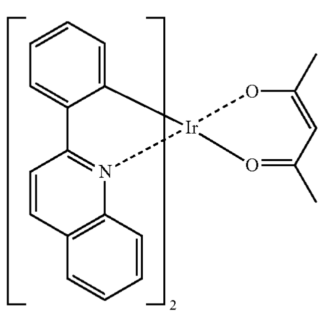
PD18
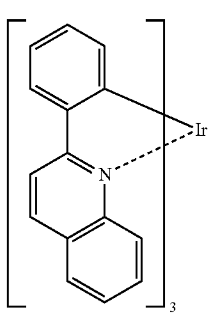
-continued
PD19
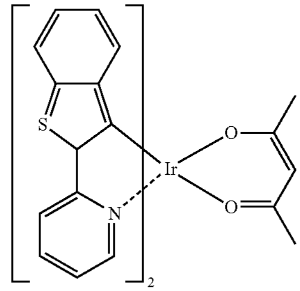
PD20
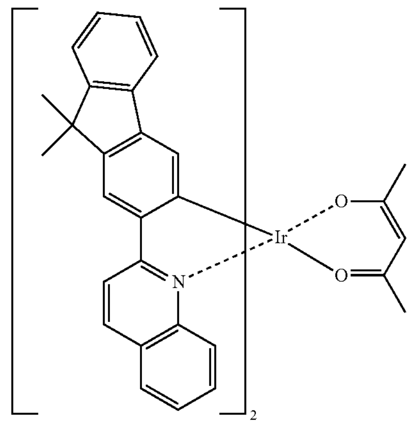
PD21
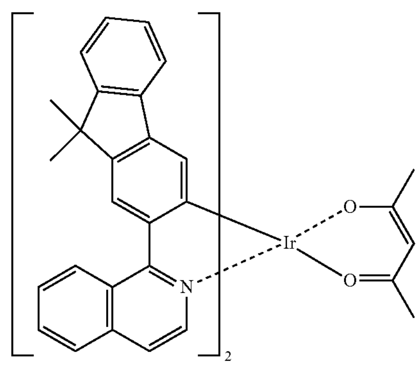
PD22
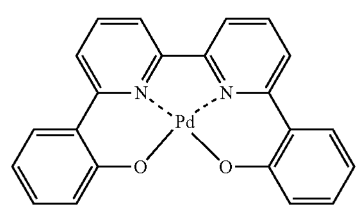
PD23
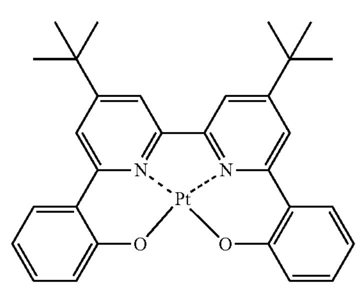

-continued
PD24
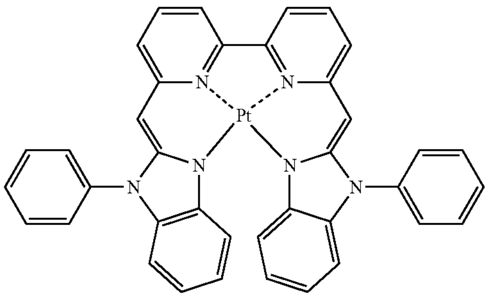
PD25
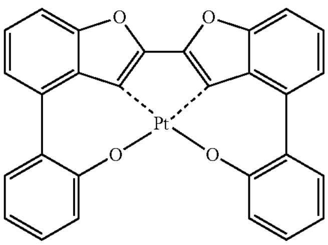
PD26
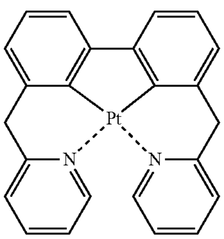
PD27
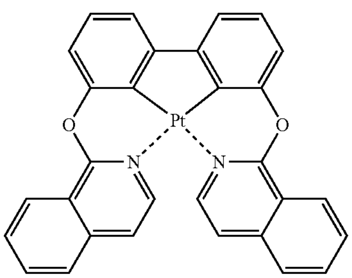
PD28
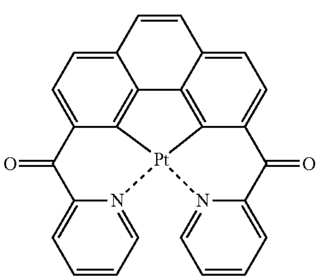
PD29
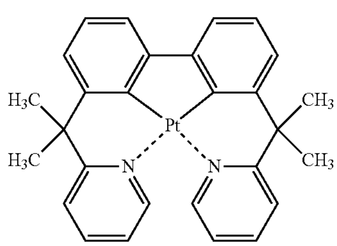
-continued
PD30
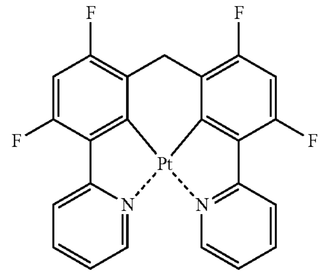
PD31
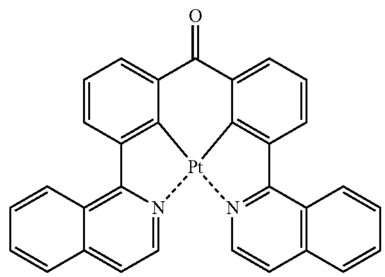
PD32
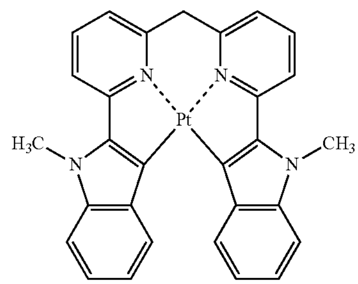
PD33
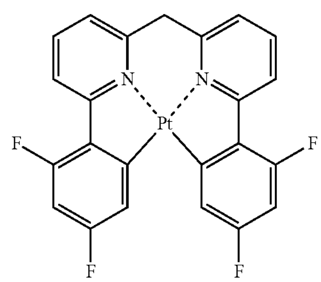
PD34
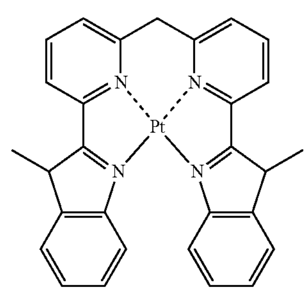

-continued
PD35
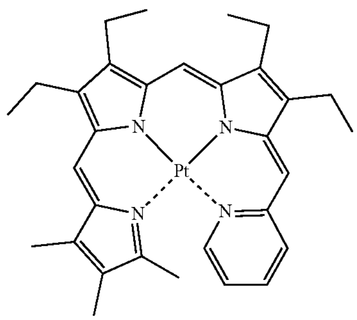
PD36
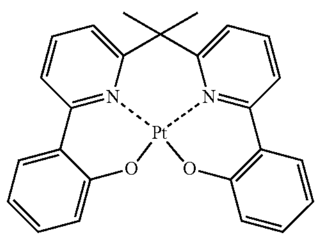
PD37
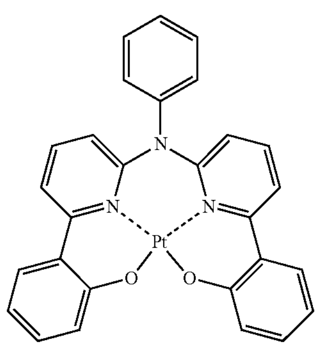
PD38
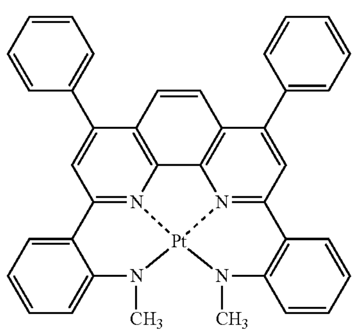
PD39
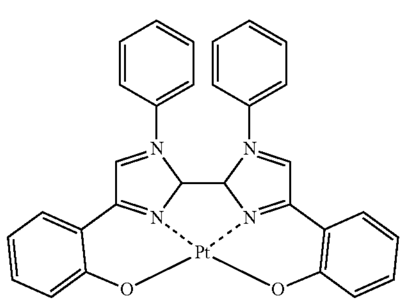
-continued
PD40
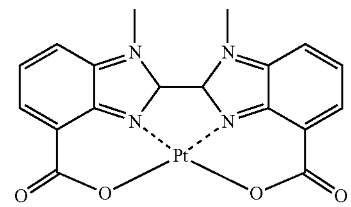
PD41
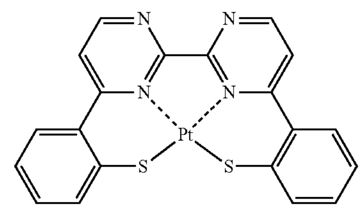
PD42
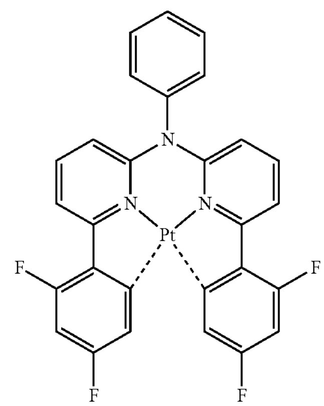
PD43
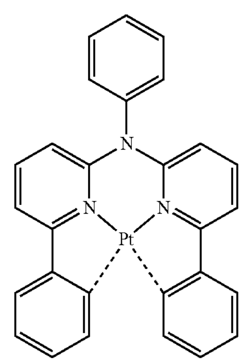
PD44
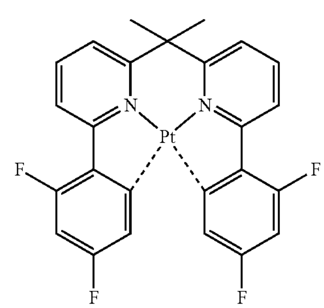

-continued
PD45
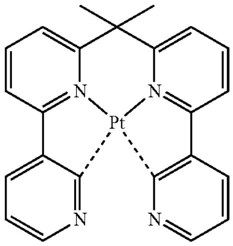
PD46
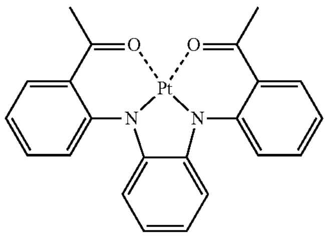
PD47
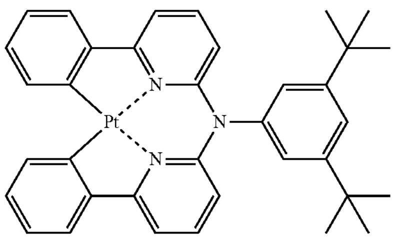
PD48
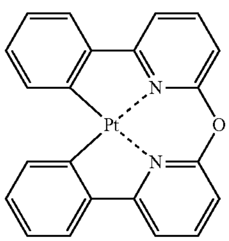
PD49
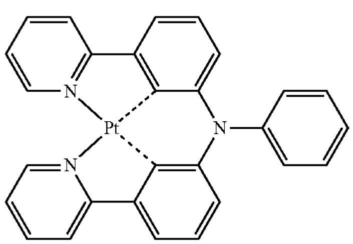
PD50
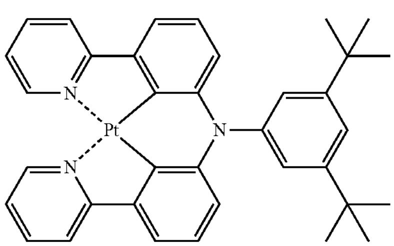
-continued
PD51
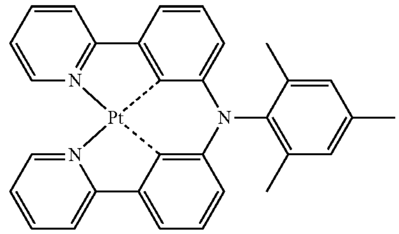
PD52
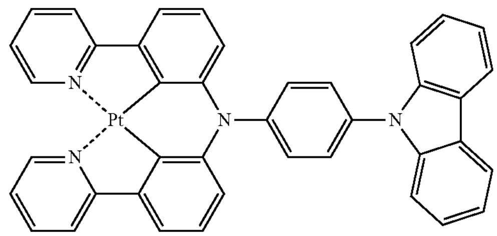
PD53
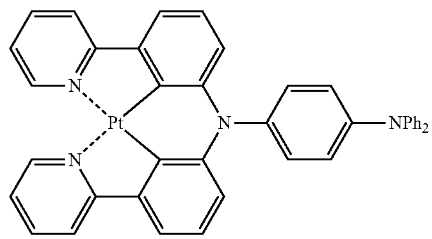
PD54
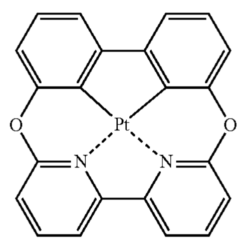
PD55
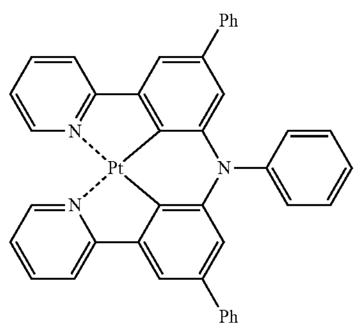
PD56
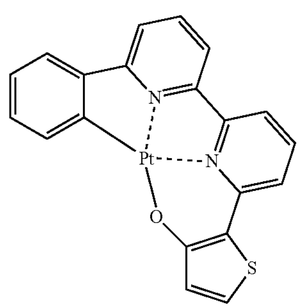

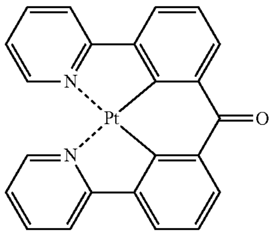
PD57
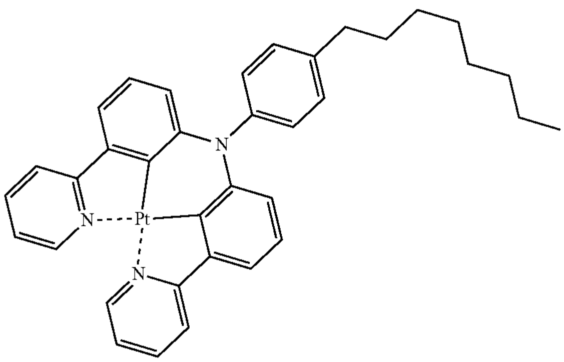
PD58
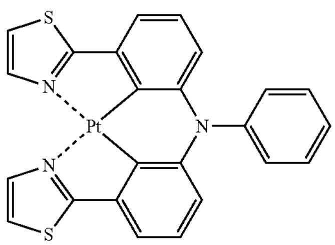
PD59
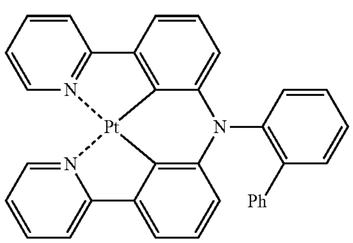
PD60
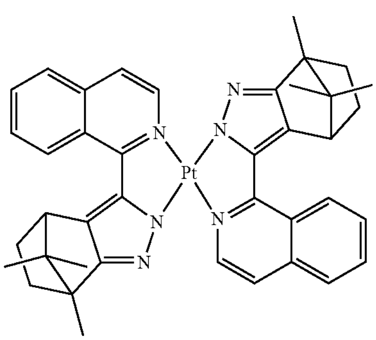
PD61
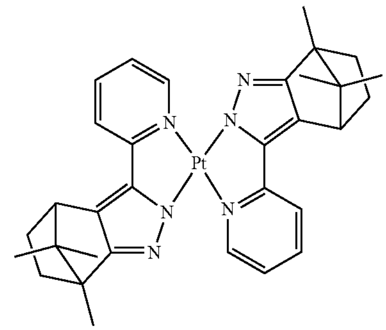
PD62
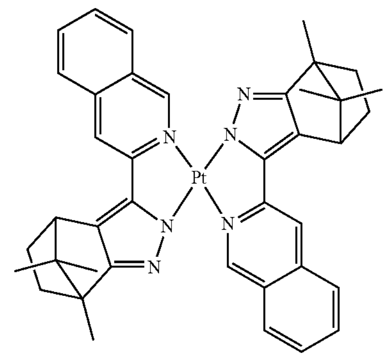
PD63
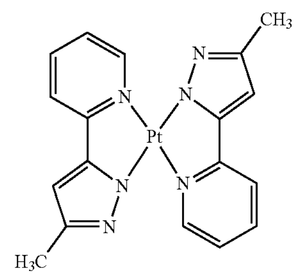
PD64
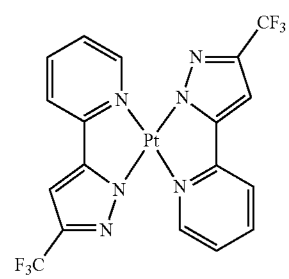
PD65
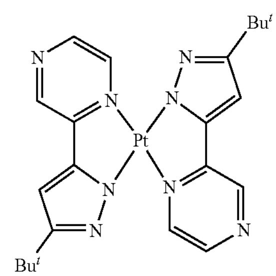
PD66

PD67
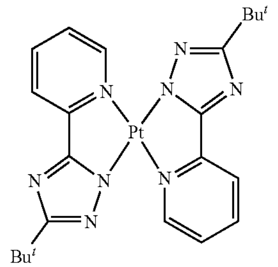
PD68
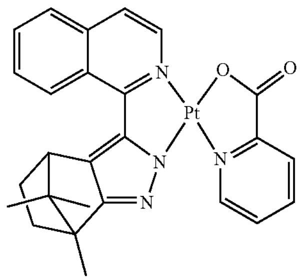
PD69
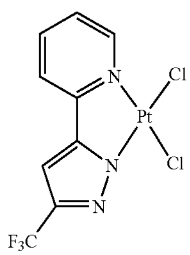
PD70
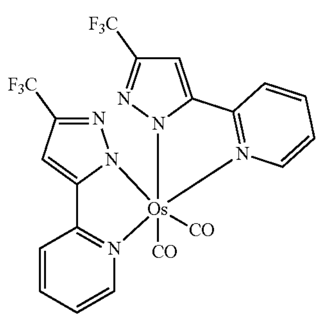
PD71
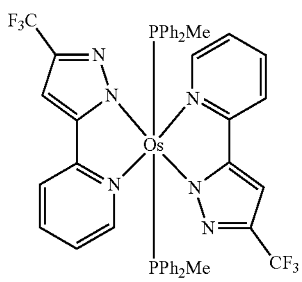
PD72
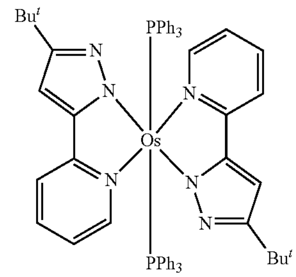
PD73
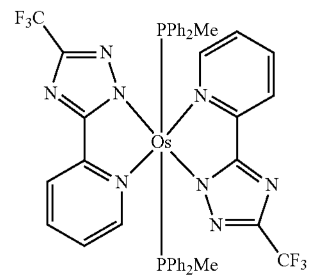
PD74
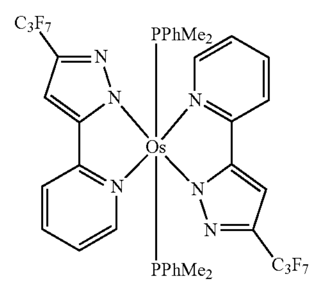
In some embodiments, the phosphorescent dopant may include PtOEP:
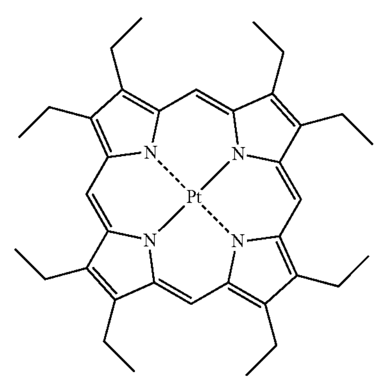
PtOEP
The fluorescent dopant may include at least one selected from DPAVBi, BDAVBi, TBPe, DCM, DCJTB, Coumarin 6, and C545T:

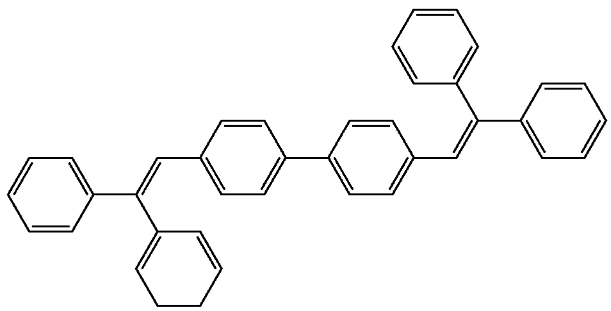

DPVBi

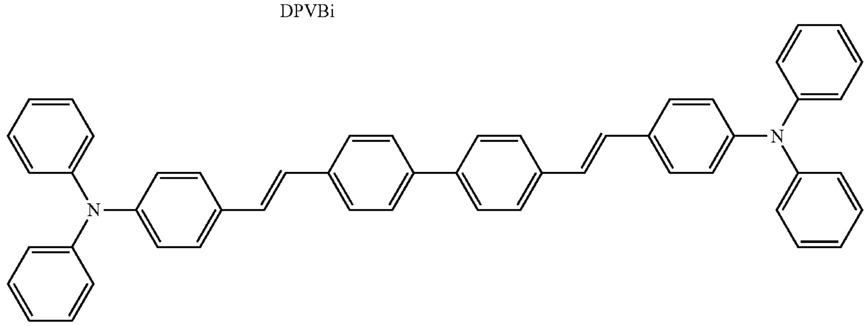

DPAVBi

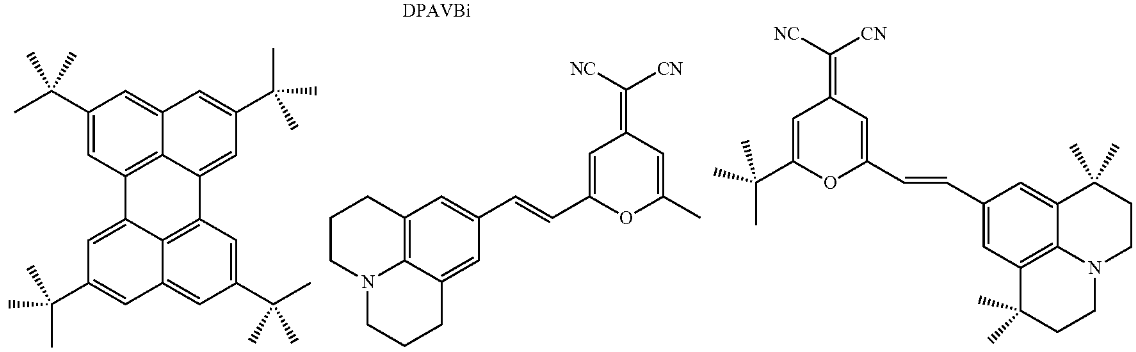

TBPe DCM DCJTB

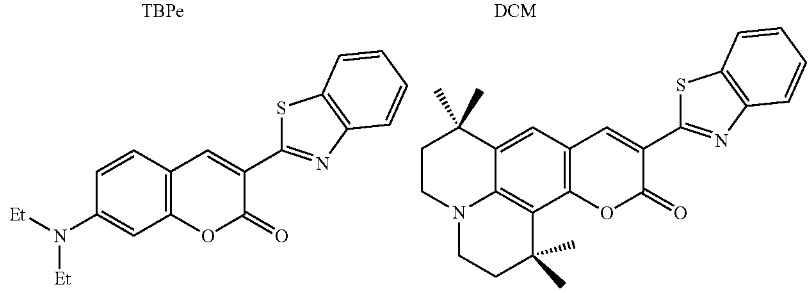

Coumarin 6 C545T

In some embodiments, the fluorescent dopant may include a compound represented by Formula 501:

Formula 501

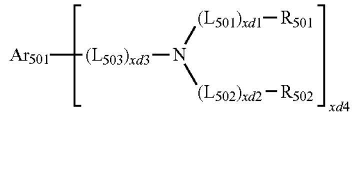

In Formula 501, $Ar_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, and —Si($Q_{501}$)($Q_{502}$)($Q_{503}$) (where, $Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

$L_{501}$ to $L_{503}$ are the same as defined in the description of $L_{201}$ in the present specification (e.g., are the same as $L_{201}$ as described with respect to Formulae 201 and 202);

$R_{501}$ and $R_{502}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group and a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently an integer selected from 0, 1, 2, and 3; and xd4 may be an integer selected from 1, 2, 3, and 4.

The fluorescent dopant may include at least one selected from Compounds FD1 to FD8:

FD1

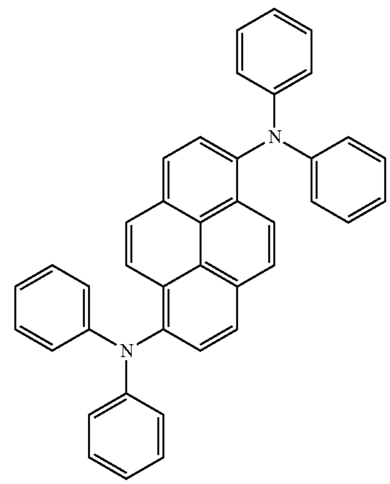

FD2

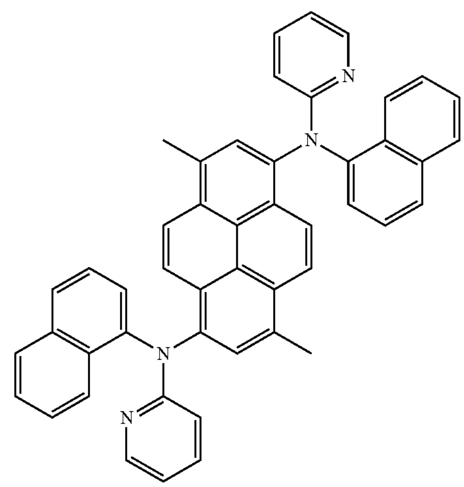

FD3

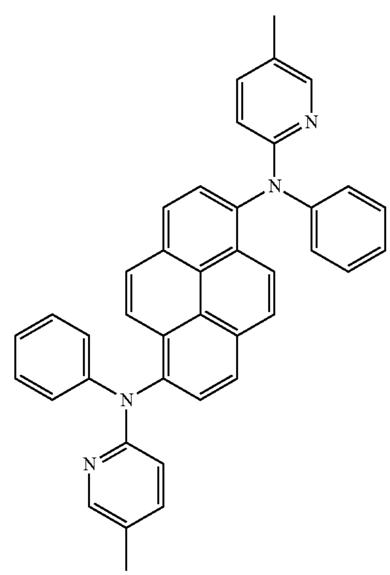

-continued

FD4

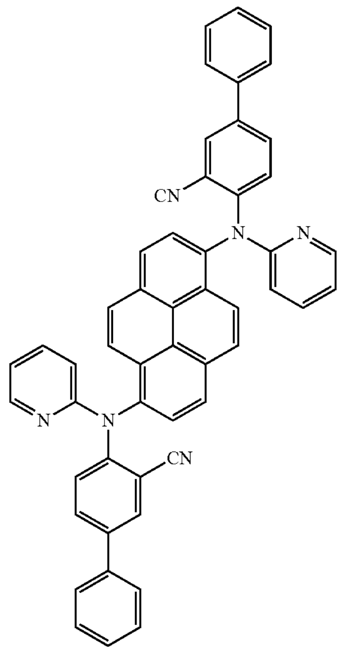

FD5

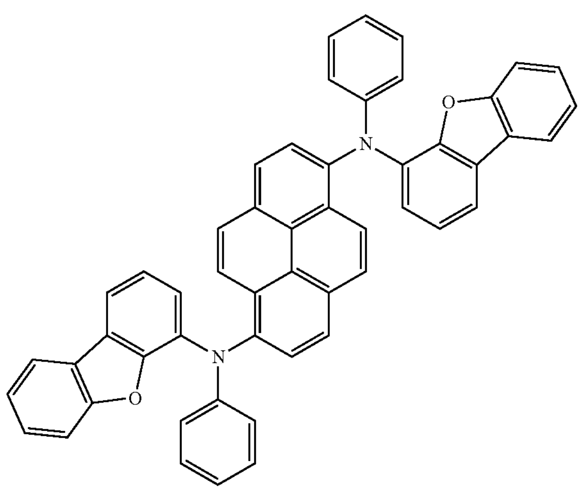

FD6

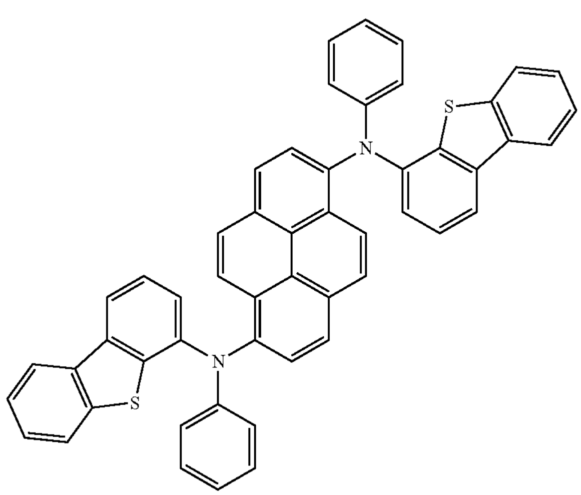

-continued

FD7

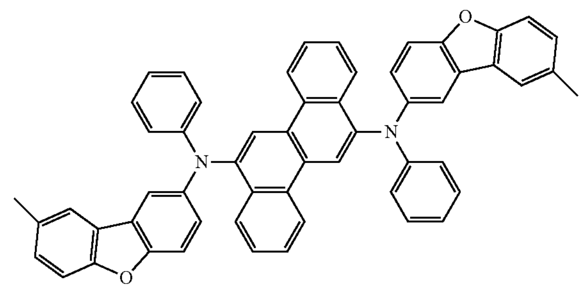

FD8

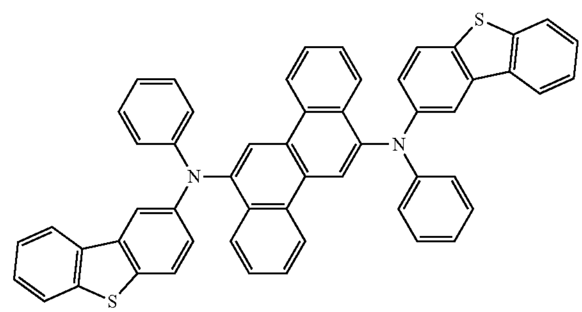

An amount of dopant in the EML may be about 0.01 parts by weight to about 15 parts by weight based on 100 parts by weight of the dopant, but the dopant is not limited thereto.

A thickness of the EML may be about 100 Å to about 1000 Å, for example, about 200 Å to about 600 Å. When the thickness of the EML is in any of the foregoing ranges, the EML may have excellent light-emitting ability without a substantial increase in driving voltage.

A mixed layer may be disposed on the EML. The mixed layer may be formed on the EML by using (utilizing) various suitable methods such as vacuum deposition, spin coating, casting, LB, inkjet printing, laser printing, and LITI. When the mixed layer is formed by vacuum deposition or spin coating, the deposition and coating conditions may be similar to those for forming the HIL, though the deposition and coating conditions may vary according to a compound that is used (utilized) to form the mixed layer.

As described above, the mixed layer may include a first material and a second material, wherein the first material and the second material may be a pyrrolidine-based compound and a triplet energy $Eg_{T1}$ of at least one of the first material and the second material may be 2.2 eV or greater.

A thickness of the mixed layer may be about 5 Å to about 400 Å, for example, about 50 Å to about 300 Å. When the thickness of the mixed layer is in any of the foregoing ranges, satisfactory device characteristics may be obtained without substantial increase in driving voltage.

For example, amounts of the first material and the second material may have a weight ratio of about 10:1 to about 1:10, but the first material and the second material are not limited thereto. In another embodiment, amounts of the first material and the second material may have a weight ratio of 50:50, but the first material and the second material are not limited thereto.

Then, the electron transport region may be disposed on the mixed layer.

The electron transport region may include at least one of the HBL, the ETL, and the EIL, but the electron transport region is not limited thereto.

For example, the electron transport region may have a structure in which the ETL/EIL or HBL/ETL/EIL are sequentially layered on the emission layer, but the electron transport region is not limited thereto.

According to an embodiment, the organic layer 150 of the organic light-emitting device includes an electron transport region disposed between the EML and the second electrode 190. The electron transport region may include at least one of the ETL and the EIL.

The ETL may include at least one selected from BCP, Bphen, and $Alq_3$, Balq, TAZ, and NTAZ:

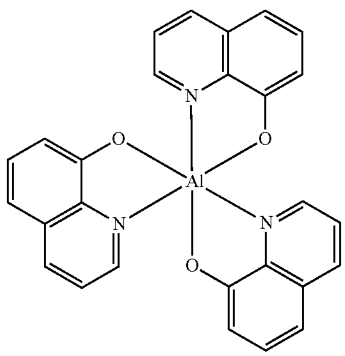

$Alq_3$

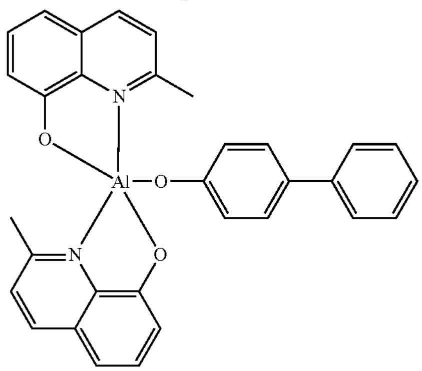

BAlq

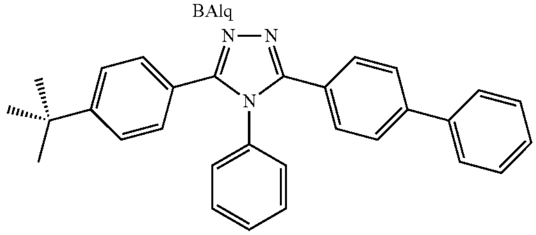

TAZ

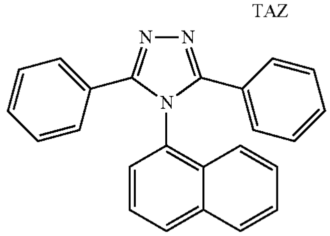

NTAZ

In some embodiments, the ETL may include at least one compound selected from a compound represented by Formula 601 and a compound represented by Formula 602:

$$Ar_{601}\text{-}[(L_{601})_{xe1}\text{-}E_{601}]_{xe2} \qquad \text{Formula 601}$$

In Formula 601, $Ar_{601}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, and —Si($Q_{301}$)($Q_{302}$)($Q_{303}$) (where, $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

$L_{601}$ may be the same as defined in the description of $L_{201}$ (e.g., may be the same as $L_{201}$ as described with respect to Formulae 201 and 202);

$E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric add or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

xe1 may be selected from 0, 1, 2, and 3; and xe2 may be selected from 1, 2, 3, and 4.

Formula 602

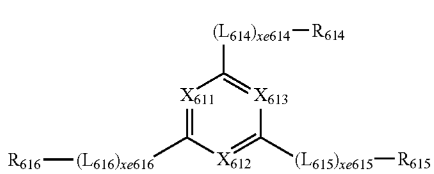

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one of $X_{611}$ to $X_{613}$ may be N;

$L_{611}$ to $L_{616}$ may be each independently the same as $L_{201}$ as described with respect to Formulae 201 and 202;

$R_{611}$ to $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may be each independently selected from 0, 1, 2, and 3.

The compound represented by Formula 601 and the compound represented by Formula 602 may be selected from Compounds ET1 to ET15:

ET1

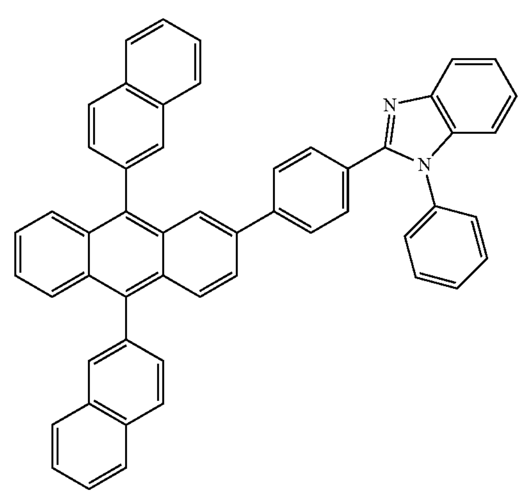

-continued
ET2
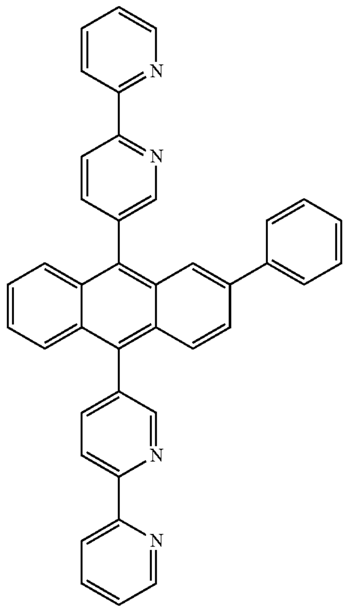
ET3
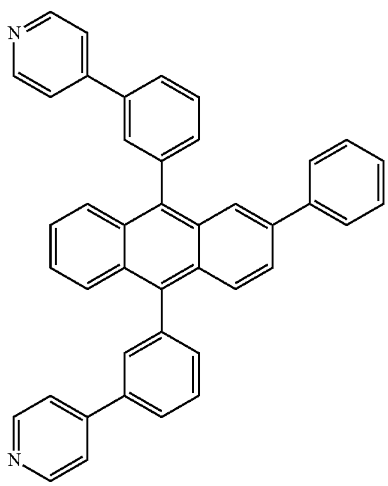
ET4
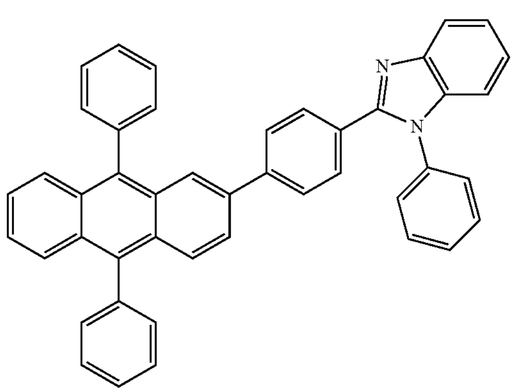
-continued
ET5
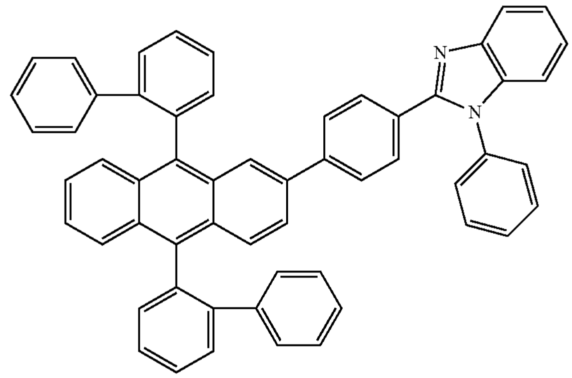
ET6
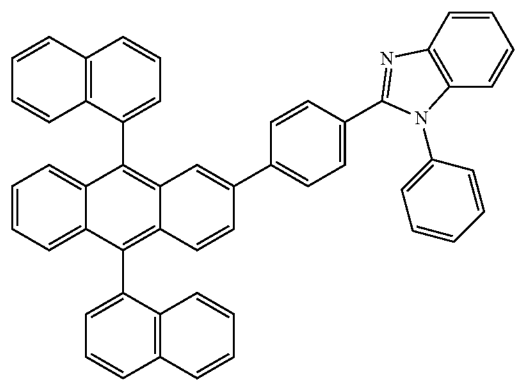
ET7
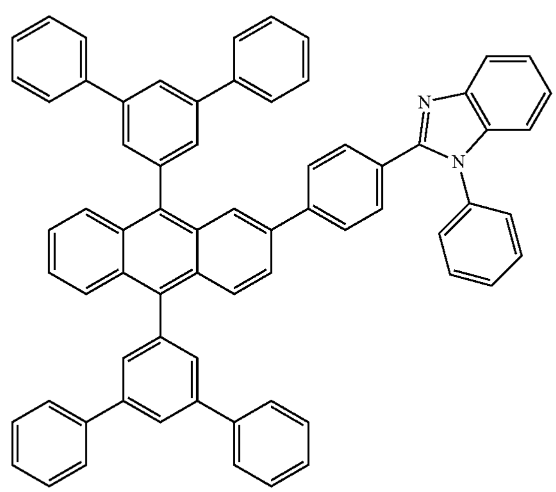

-continued
ET8
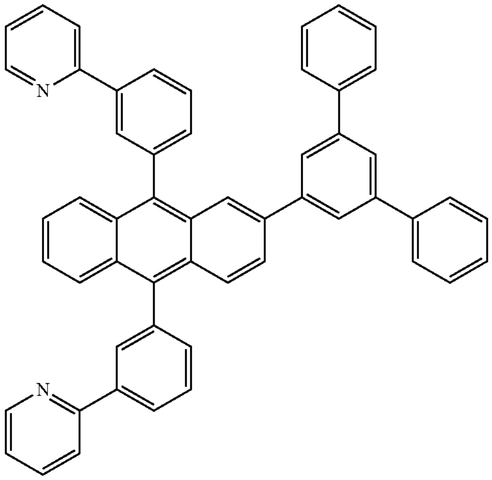
ET9
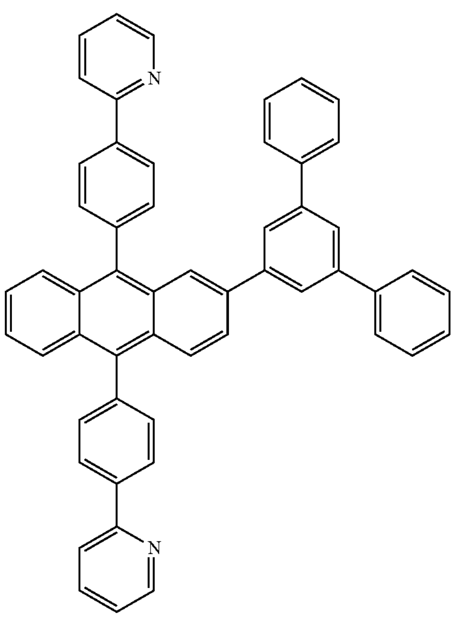
-continued
ET10
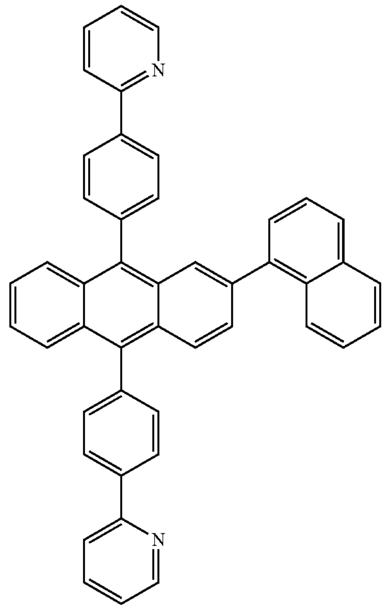
ET11
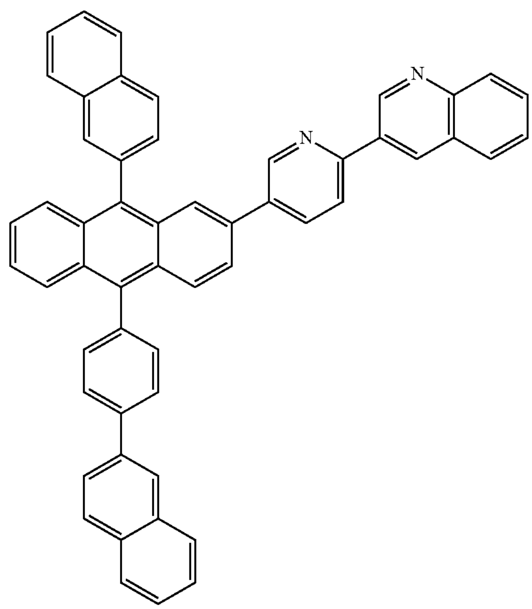
ET12
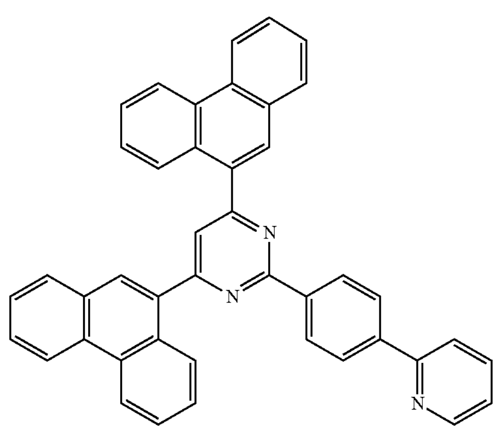

-continued

ET13

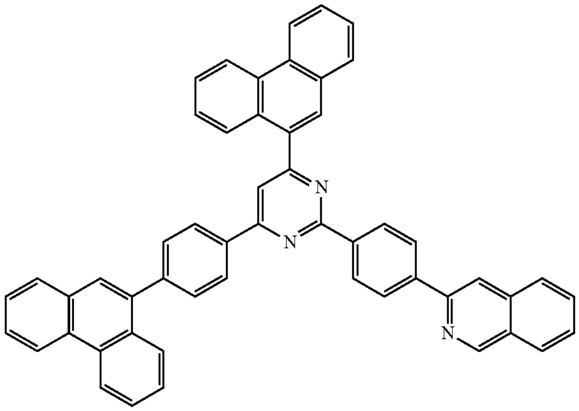

ET14

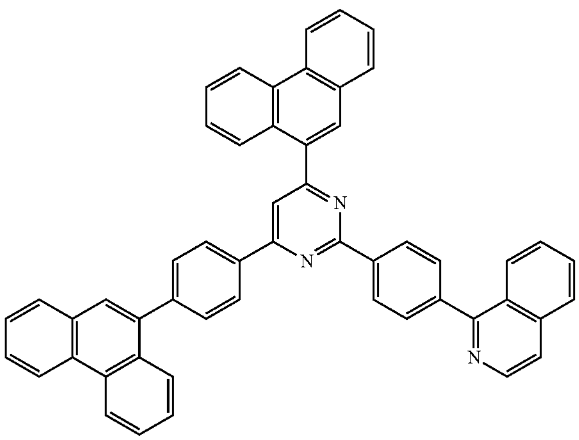

ET15

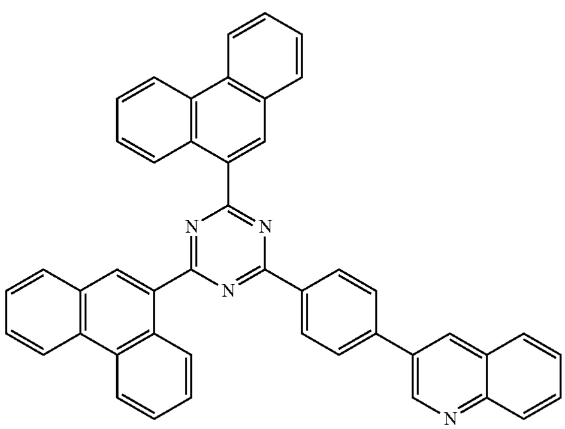

A thickness of the ETL may be about 100 Å to about 1000 Å, for example, about 150 Å to about 500 Å. When the thickness of the ETL is within any of the foregoing ranges, the ETL may have satisfactory electron transport characteristics without a substantial increase in driving voltage.

The ETL may further include a metal-containing material in addition to the material described above.

The metal-containing material may include a Li complex. The Li complex may include, for example, compounds ET-D1 (lithium quinolate: LiQ) or ET-D2.

ET-D1

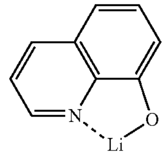

ET-D2

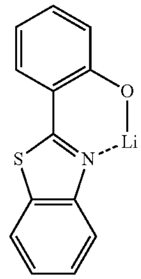

The electron transport region may include an HBL. When the EML includes a phosphorescent dopant, the HBL may be configured (e.g., formed) to prevent (or reduce) diffusion of triplet excitons (e.g., excitons in a triplet state) or holes into the ETL.

When the electron transport region includes the HBL, the HBL may be formed on the EML by using (utilizing) various suitable methods such as vacuum deposition, spin coating, casting, LB, inkjet printing, laser printing, and LITI. When the HBL is formed by vacuum deposition and/or spin coating, the deposition and coating conditions may be similar to those for forming the HIL, though the deposition and coating conditions may vary according to a compound that is used (utilized) to form the HBL.

The HBL may include, for example, at least one selected from BCP and Bphen, but the HBL is not limited thereto.

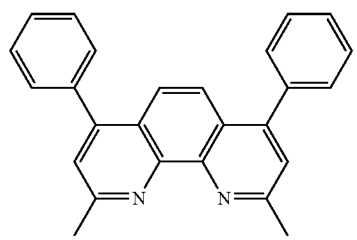

BCP

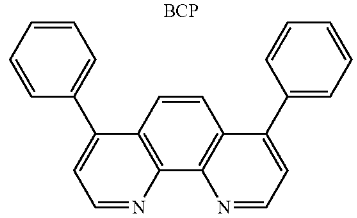

Bphen

A thickness of the HBL may be from about 20 Å to about 1,000 Å, and in some embodiments, may be from about 30 Å to about 300 Å. When the thickness of the HBL is within any of the foregoing ranges, the HBL may have a hole blocking transporting ability without a substantial increase in driving voltage.

Then, the ETL is formed on the EML by various suitable methods such as vacuum deposition, spin coating, casting, LB, inkjet printing, laser printing, LITI. When the ETL is formed by vacuum deposition or spin coating, the deposition and coating conditions may be similar to those for forming the HIL, though the deposition and coating conditions may vary according to a compound that is used (utilized) to form the ETL.

The electron transport region may include the ETL that facilitates injection of electrons from the second electrode 190.

The EIL may be formed on the ETL by using (utilizing) various suitable methods such as vacuum deposition, spin coating, casting, LB, inkjet printing, laser printing, and LITI. When the EIL is formed by vacuum deposition or spin coating, the deposition and coating conditions may be similar to those for forming the HIL.

The EIL may include at least one selected from LiF, NaCl, CsF, $Li_2O$, BaO, and LiQ.

A thickness of the EIL may be about 1 Å to about 100 Å or about 3 Å to about 90 Å. When the thickness of the EIL is within any of the foregoing ranges, satisfactory electron injection characteristics may be obtained without a substantial increase in driving voltage.

The second electrode 190 is disposed on the organic layer 150. The second electrode 190 may be a cathode, which is an electron injection electrode, in which a material of the second electrode 190 may be a metal, an alloy, an electro-conductive compound, or a mixture thereof having a low work function. Examples of the material of the second electrode 190 include lithium (Li), magnesium (Mg), aluminum (Al), aluminum-lithium (Al—Li), calcium (Ca), magnesium-indium (Mg—In), magnesium-silver (Mg—Ag). In some embodiments, ITO, IZO, or the like may be used (utilized) as the material of the second electrode 190. The second electrode 190 may be a reflective electrode, transflective electrode, or a transmissive electrode.

An organic layer of an organic light-emitting device according to an embodiment of the present invention may be formed by a deposition method using (utilizing) a compound according to an embodiment of the present invention or may be formed by a wet method in which a compound prepared as a solution according to an embodiment is coated.

An organic light-emitting device according to an embodiment of the present invention may be provided in various suitable flat display devices, for example, a passive matrix organic light-emitting device or an active matrix organic light-emitting device.

For example, when the organic light-emitting device is provided in the active matrix organic light-emitting device, a first electrode provided on a substrate may be electrically connected to a source electrode or a drain electrode of a thin film transistor as a pixel electrode. Also, the organic light-emitting device may be provided in a flat display device that can display image on two (e.g., both) sides of the flat display device.

Hereinabove, the organic light-emitting device was described with reference to the accompanying drawing, but organic light-emitting device is not limited thereto.

As used herein, the $C_1$-$C_{60}$ alkyl group refers to a linear or branched aliphatic $C_1$-$C_{60}$ hydrocarbon monovalent group and examples thereof include a methyl group, an ethyl group, a propyl group, an isobutyl group, a sec-butyl group, a tert-butyl group, a pentyl group, an iso-amyl group, and a hexyl group. As used herein, the $C_1$-$C_{60}$ alkylene group refers to a divalent group having the same structure as the $C_1$-$C_{60}$ alkyl group.

As used herein, the $C_1$-$C_{60}$ alkoxy group is a monovalent group having a Formula of —$OA_{101}$ (wherein, $A_{101}$ is the $C_1$-$C_{60}$ alkyl group) and examples thereof include a methoxy group, an ethoxy group, and an isopropyloxy group.

As used herein, the $C_2$-$C_{60}$ alkenyl group (or $C_2$-$C_{60}$ alkenyl group) refers to a $C_2$-$C_{60}$ alkyl group having one or more carbon-carbon double bonds in a main chain (e.g., at a center thereof) or end thereof. Examples of the unsubstituted $C_2$-$C_{60}$ alkenyl group include ethenyl, propenyl, and butenyl. As used herein, the $C_2$-$C_{60}$ alkynylene group refers to a divalent group having the same structure as the $C_2$-$C_{60}$ alkenyl group.

As used herein, the $C_2$-$C_{60}$ alkynyl group (or $C_2$-$C_{60}$ alkynyl group) refers to a $C_2$-$C_{60}$ alkyl group having one or more carbon-carbon triple bonds in a main chain (e.g., at a center thereof) or end thereof. Examples of the unsubstituted $C_2$-$C_{60}$ alkynyl group include ethynyl, propynyl, and the like. As used herein, the $C_2$-$C_{60}$ alkynylene group refers to a divalent group having the same structure as the $C_2$-$C_{60}$ alkynyl group.

As used herein, the $C_3$-$C_{10}$ cycloalkyl group refers to a $C_3$-$C_{10}$ monovalent hydrocarbon monocyclic group and examples thereof include a cyclopropyl group, a cyclobutyl group, a cyclopentyl group, a cyclohexyl group, and a cycloheptyl group. As used herein, the $C_3$-$C_{10}$ cycloalkylene group refers to a divalent group having the same structure as the $C_3$-$C_{10}$ cycloalkyl group.

As used herein, the $C_1$-$C_{10}$ heterocycloalkyl group refers to a $C_1$-$C_{10}$ monovalent monocyclic group including at least one selected from N, O, P, and S as a ring-forming atom and examples thereof include a tetrahydrofuranyl group and a tetrahydrothiophenyl group. As used herein, the $C_1$-$C_{10}$ heterocycloalkylene group refers to a divalent group having the same structure as the $C_1$-$C_{10}$ heterocycloalkyl group.

As used herein, the $C_3$-$C_{10}$ cycloalkenyl group refers to a $C_3$-$C_{10}$ monovalent monocyclic group having at least one double bond in a ring but without aromaticity (e.g., the $C_3$-$C_{10}$ cycloalkenyl group is non-aromatic), and examples thereof include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_1$-$C_{10}$ heterocycloalkenyl group is a $C_1$-$C_{10}$ monovalent monocyclic group including at least one selected from N, O, P, and S as a ring-forming atom, and includes at least one double bond in a ring. Examples of the $C_2$-$C_{10}$ heterocycloalkenyl group include a 2,3-hydrofuranyl group and a 2,3-hydrothiophenyl group. As used herein, the $C_1$-$C_{10}$ heterocycloalkenylene group is a divalent group having the same structure as the $C_1$-$C_{10}$ heterocycloalkenyl group.

As used herein, the $C_6$-$C_{60}$ aryl group is a $C_6$-$C_{60}$ monovalent group having a carbocyclic aromatic system and the $C_6$-$C_{60}$ arylene group refers to a divalent group having a $C_6$-$C_{60}$ carbocyclic aromatic system. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include two or more rings, the two or more rings may be fused to each other (e.g., the two more rings may be combined).

As used herein, the $C_1$-$C_{60}$ heteroaryl group refers to a monovalent group having a $C_1$-$C_{60}$ carbocyclic aromatic system including at least one heteroatom selected from N, O, P, and S as a ring-forming atom and the $C_1$-$C_{60}$ heteroarylene group refers to a divalent group having a $C_1$-$C_{60}$ carbocyclic aromatic system including at least one heteroatom selected from N, O, P, and S. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group include two or more rings, the two or more rings may be fused to each other (e.g., the two or more rings may be combined).

As used herein, the $C_6$-$C_{60}$ aryloxy group refers to —$OA_{102}$ (wherein, $A_{102}$ is the $C_6$-$C_{60}$ aryl group) and the $C_6$-$C_{60}$ arylthio group refers to —$SA_{103}$ (wherein, $A_{103}$ is the $C_6$-$C_{60}$ aryl group).

As used herein, the monovalent non-aromatic condensed polycyclic group refers to a monovalent group having two or more rings that are fused to each other (e.g., combined), including only carbon as a ring-forming atom (for example, carbon numbers may be 8 to 60), wherein the entire molecule does not have aromaticity (e.g., the monovalent non-aromatic condensed polycyclic group is non-aromatic). Examples of the monovalent non-aromatic condensed polycyclic group include a fluorenyl group or the like. As used herein, the divalent non-aromatic condensed polycyclic group may refer to a divalent group having the same structure as the monovalent non-aromatic condensed polycyclic group.

As used herein, the monovalent non-aromatic hetero-condensed polycyclic group refers to a monovalent group having two or more rings that are fused to each other (e.g., combined), including a heteroatom selected from N, O, P, and S as a ring-forming atom, in addition to carbon (for example, carbon numbers may be 2 to 60), wherein the entire molecule does not have aromaticity (e.g., the monovalent non-aromatic hetero-condensed polycyclic group is non-aromatic). Examples of the monovalent non-aromatic hetero-condensed polycyclic group include a carbazolyl group or the like. As used herein, the divalent non-aromatic hetero-condensed polycyclic group refers to a divalent group having the same structure as the monovalent non-aromatic hetero-condensed polycyclic group.

Hereinafter, an organic light-emitting device according to an embodiment of the present invention is described with respect to examples, but the present invention is not limited to the examples.

Example 1-1

An ITO glass substrate was cut into a size of 50 mm×50 mm×0.5 mm, which was ultrasonically cleaned in acetone, isopropyl alcohol and pure (or substantially pure) water, separately, for 15 minutes each, and then UV ozone cleaned for 30 minutes.

HTM was vacuum-deposited on the substrate in a thickness of 1200 Å to form an HTL. Thereafter, MADN and BD were vacuum deposited on the HTL at a weight ratio of 95:5 to a thickness of 300 Å to form an EML. Thereafter, BF1 and BF5 were vacuum-deposited on the EML at a weight ratio of 50:50 to a thickness of 200 Å to form a mixed layer.

Thereafter, $Alq_3$ was vacuum-deposited on the mixed layer to a thickness of 200 Å to form an ETL. LiF was vacuum-deposited on the ETL to a thickness of 10 Å to form an EIL. Al was vacuum-deposited on the EIL to a thickness of 2000 Å to manufacture an organic light-emitting device.

HTM

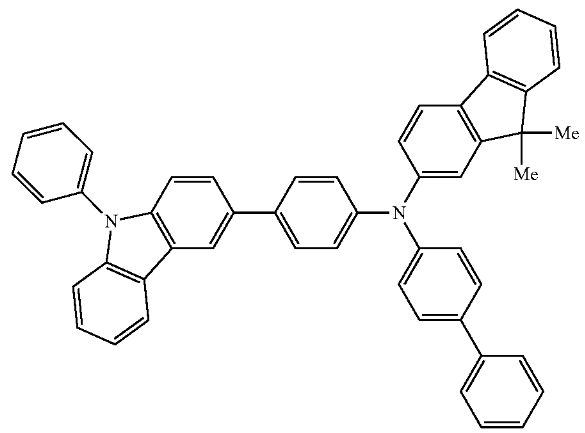

MADN

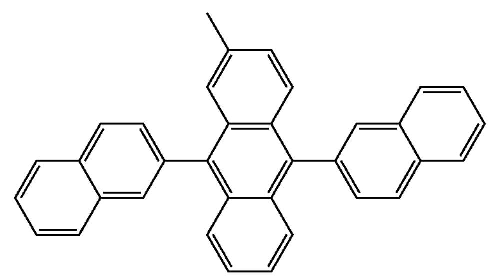

BD

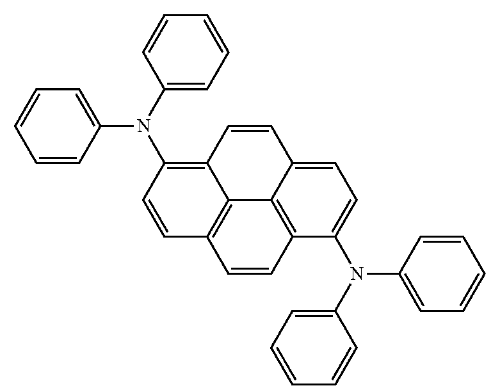

Alq3

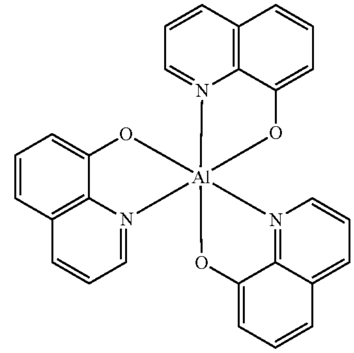

-continued

BF1

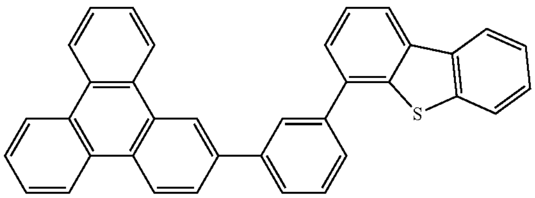

BF5

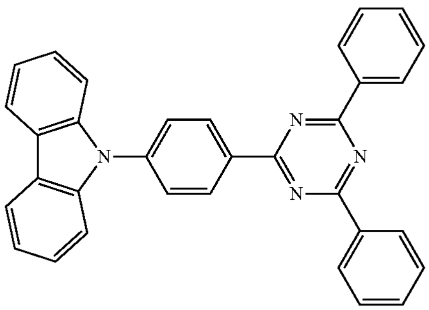

Examples 1-2 to 1-34

An organic light-emitting device was manufactured as in Example 1-1, except that the mixed layer was formed utilizing compounds as shown in Table 1.

Comparative Examples 1 to 3

An organic light-emitting device was manufactured as in Example 1-1, except that the mixed layer was formed utilizing compounds as shown in Table 1.

TABLE 1

| | Mixed layer |
|---|---|
| Example 1-1 | BF1 + BF5 |
| Example 1-2 | BF1 + BF6 |
| Example 1-3 | BF1 + BF7 |
| Example 1-4 | BF1 + BF8 |
| Example 1-5 | BF1 + BF9 |
| Example 1-6 | BF1 + BF10 |
| Example 1-7 | BF1 + BF11 |
| Example 1-8 | BF1 + BF12 |
| Example 1-9 | BF1 + BF13 |
| Example 1-10 | BF1 + BF14 |
| Example 1-11 | BF1 + BF15 |
| Example 1-12 | BF2 + BF5 |
| Example 1-13 | BF2 + BF6 |
| Example 1-14 | BF2 + BF9 |
| Example 1-15 | BF2 + BF7 |
| Example 1-16 | BF2 + BF8 |
| Example 1-17 | BF2 + BF10 |
| Example 1-18 | BF2 + BF11 |
| Example 1-19 | BF2 + BF12 |
| Example 1-20 | BF2 + BF13 |
| Example 1-21 | BF2 + BF14 |
| Example 1-22 | BF2 + BF15 |
| Example 1-23 | BF3 + BF7 |
| Example 1-24 | BF3 + BF8 |
| Example 1-25 | BF4 + BF7 |
| Example 1-26 | BF4 + BF8 |
| Example 1-27 | BF16 + BF7 |
| Example 1-28 | BF16 + BF8 |
| Example 1-29 | BF17 + BF7 |
| Example 1-30 | BF17 + BF8 |
| Example 1-31 | BF18 + BF7 |
| Example 1-32 | BF18 + BF8 |
| Example 1-33 | BF19 + BF7 |

TABLE 1-continued

| | Mixed layer |
|---|---|
| Example 1-34 | BF19 + BF8 |
| Comparative Example 1 | Alq3 |
| Comparative Example 2 | BF1 |
| Comparative Example 3 | BF8 |

Example 2-1

An ITO glass substrate was cut into a size of 50 mm×50 mm×0.5 mm, washed in acetone, isopropyl alcohol and pure (or substantially pure) water, separately, for 15 minutes each and then UV ozone cleaned for 30 minutes.

HTM was vacuum-deposited on the substrate to a thickness of 1200 Å to form an HTL. Thereafter, CBP and $Ir(ppy)_3$ were vacuum-deposited on the HTL at a weight ratio of 90:10 to a thickness of 300 Å to form an EML. Thereafter, BF1 and BF5 were vacuum-deposited at a weight ratio of 50:50 on the EML to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

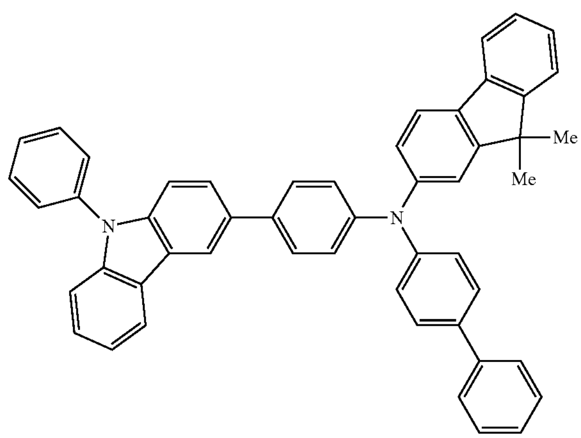

HTM

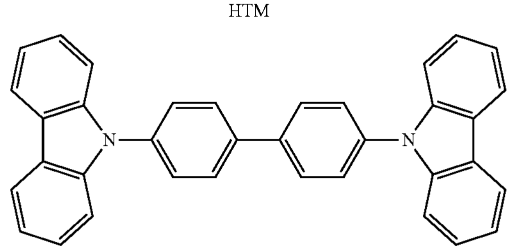

CBP

-continued

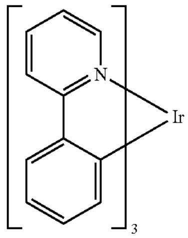

$Ir(ppy)_3$

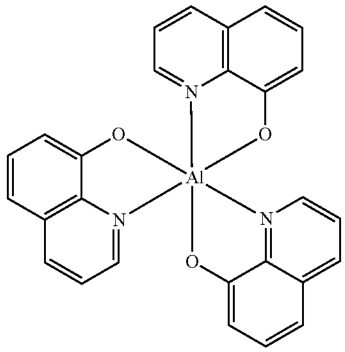

$Alq_3$

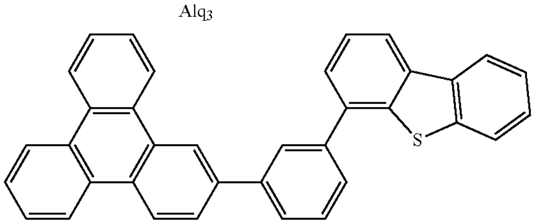

BF1

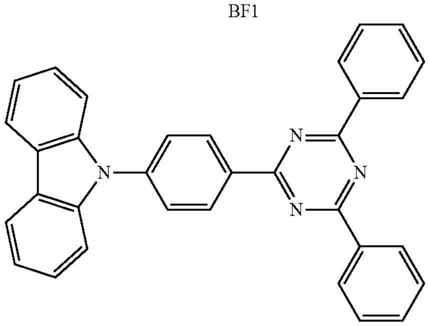

BF5

Examples 2-2 to 2-11

Organic light-emitting devices were manufactured as in Example 2-1, except that the mixed layer was formed utilizing compounds as shown in Table 2.

Comparative Examples 4 to 6

Organic light-emitting devices were manufactured as in Example 2-1, except that the mixed layer was formed utilizing compounds as shown in Table 2 below.

TABLE 2

| | Mixed layer |
|---|---|
| Example 2-1 | BF1 + BF5 |
| Example 2-2 | BF1 + BF6 |
| Example 2-3 | BF1 + BF7 |
| Example 2-4 | BF1 + BF8 |
| Example 2-5 | BF1 + BF9 |
| Example 2-6 | BF1 + BF10 |
| Example 2-7 | BF1 + BF11 |
| Example 2-8 | BF1 + BF12 |
| Example 2-9 | BF1 + BF13 |
| Example 2-10 | BF1 + BF14 |
| Example 2-11 | BF1 + BF15 |
| Comparative Example 4 | Alq3 |
| Comparative Example 5 | BF1 |
| Comparative Example 6 | BF8 |

Example 3-1

An ITO glass substrate was cut into a size of 50 mm×50 mm×0.5 mm, then washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, PH1 and $Ir(ppy)_3$ were vacuum-deposited at a weight ratio of 90:10 on the HTL to a thickness of 300 Å to form an EML. Thereafter, BF1 and BF7 were vacuum-deposited on the EML at a weight ratio of 50:50 to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

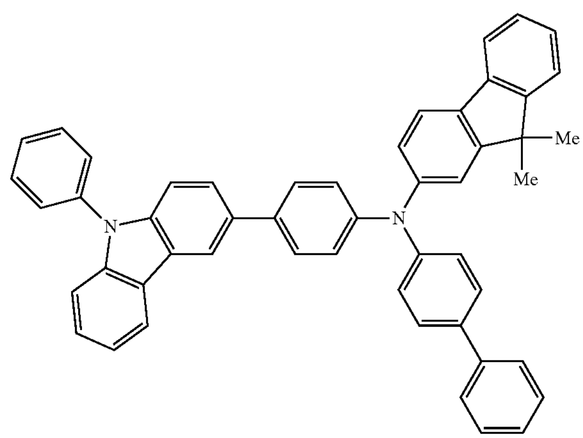

HTM

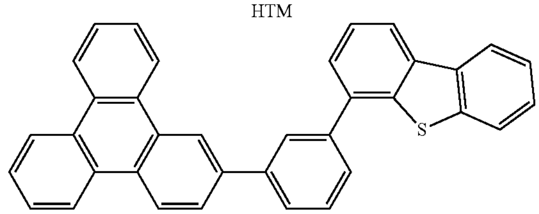

PH1

-continued

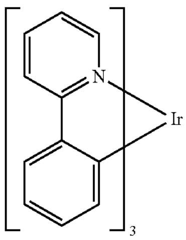

$Ir(ppy)_3$

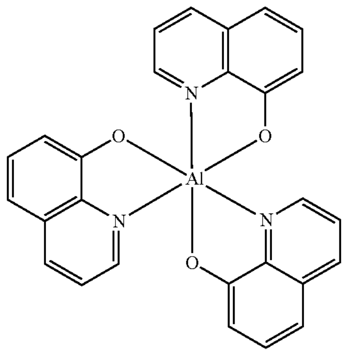

$Alq_3$

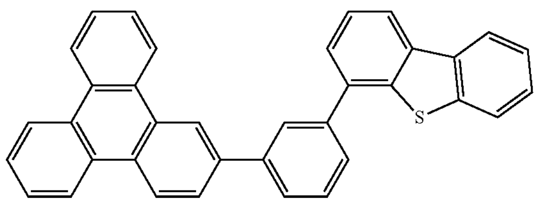

BF1

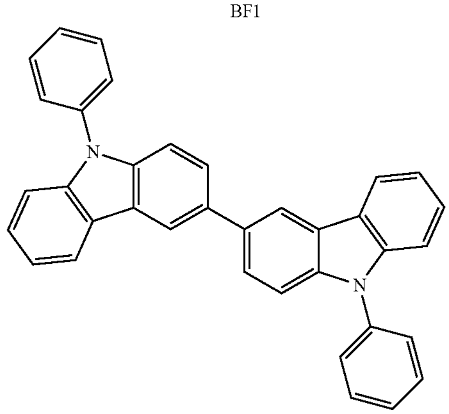

BF7

Examples 3-2 to 3-4

An organic light-emitting device was manufactured as in Example 3-1, except that the mixed layer was formed utilizing compounds as shown in Table 3.

TABLE 3

| | Mixed layer |
|---|---|
| Example 3-2 | BF1 + BF8 |
| Example 3-3 | BF1 + BF9 |
| Example 3-4 | BF1 + BF11 |

Example 4-1

An ITO glass substrate was cut into a size of 50 mm×50 mm×0.5 mm, then washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, PH2 and $Ir(ppy)_3$ were vacuum-deposited at a weight ratio of 90:10 on the HTL to a thickness of 300 Å to form an EML. Thereafter, BF1 and BF7 were vacuum-deposited on the EML at a weight ratio of 50:50 to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

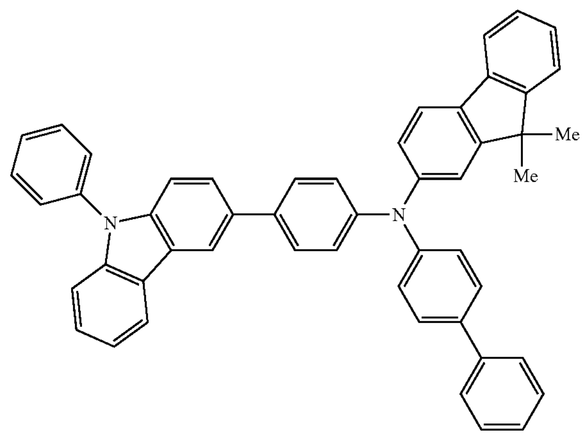

HTM

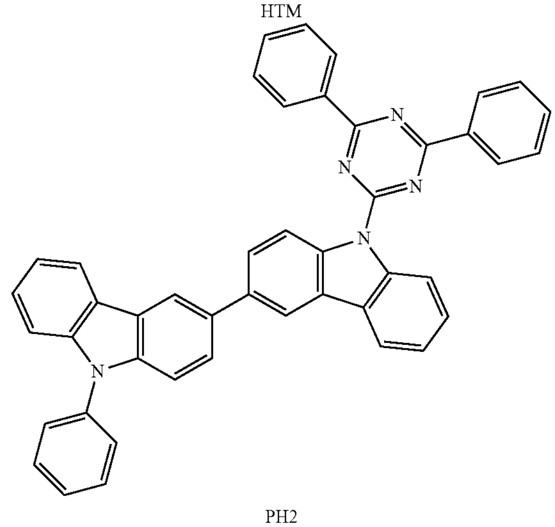

PH2

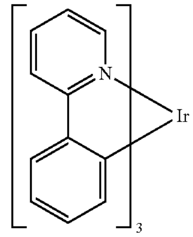

$Ir(ppy)_3$

-continued

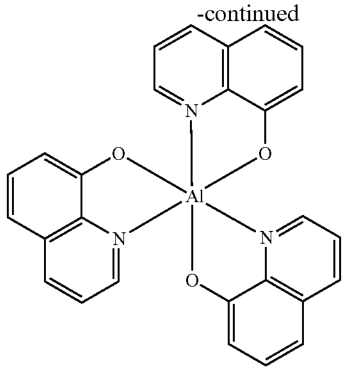

$Alq_3$

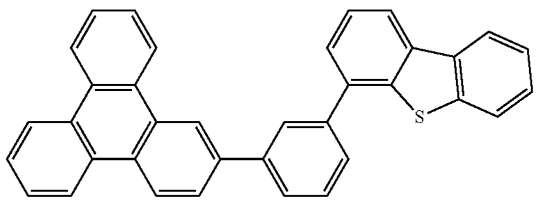

BF1

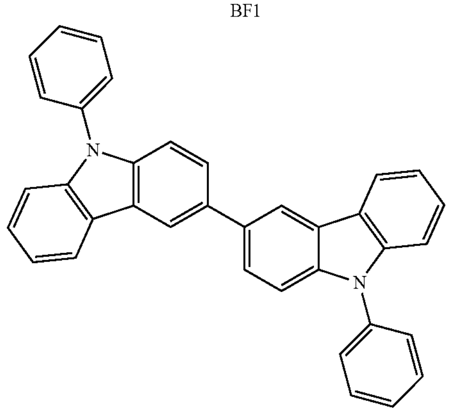

BF7

Examples 4-2 to 4-4

An organic light-emitting device was manufactured as in Example 4-1, except that the mixed layer was formed utilizing compounds as shown in Table 4.

TABLE 4

| | Mixed layer |
|---|---|
| Example 4-2 | BF1 + BF8 |
| Example 4-3 | BF1 + BF9 |
| Example 4-4 | BF1 + BF11 |

Example 5-1

An ITO glass substrate was cut into a size of 50 mm×50 mm×0.5 mm, washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, PH1, PH2, and $Ir(ppy)_3$ were vacuum-deposited at a weight ratio of 45:45:10 on the HTL to a thickness of 300 Å to form an EML.

Thereafter, BF1 and BF7 were vacuum-deposited thereon at a weight ratio of 50:50 on the EML to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

HTM

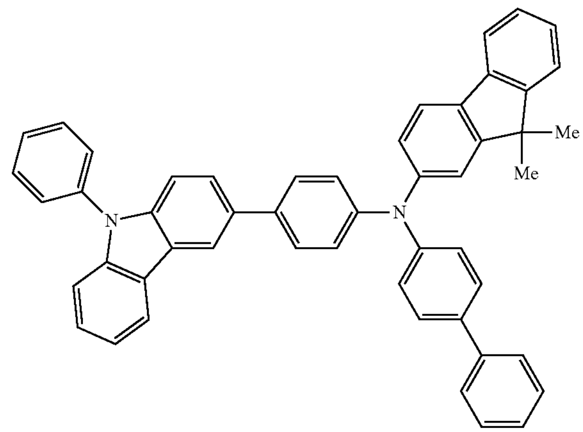

PH1

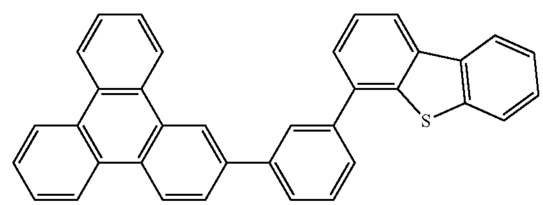

PH2

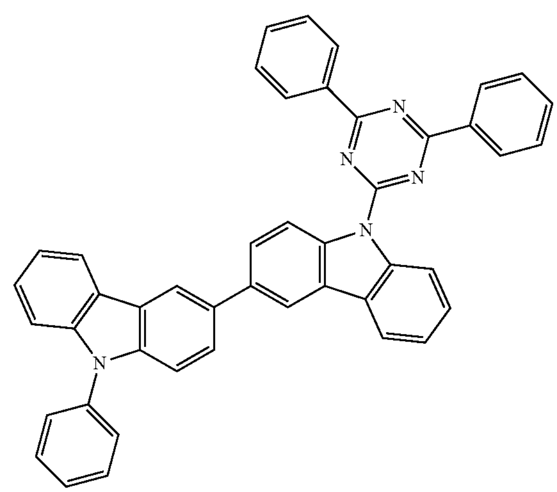

$Ir(ppy)_3$

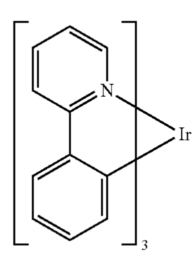

-continued

Alq3

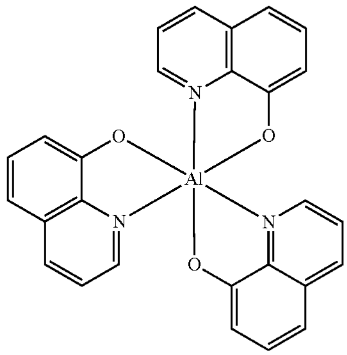

BF1

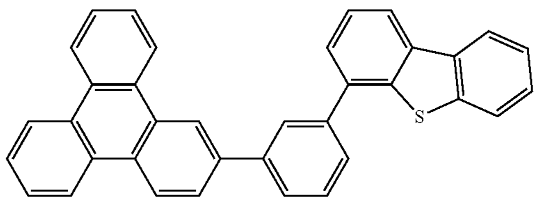

BF7

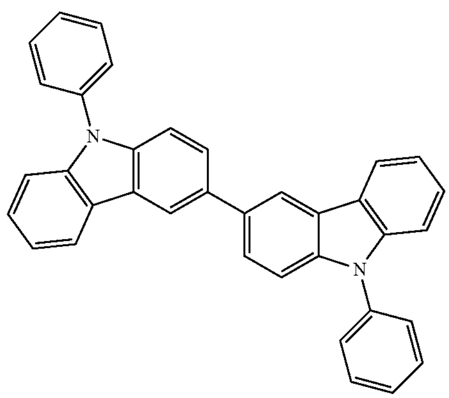

Examples 5-2 to 5-4

An organic light-emitting device was manufactured as in Example 5-1, except that the mixed layer was formed utilizing compounds as shown in Table 5.

TABLE 5

| | Mixed layer |
|---|---|
| Example 5-2 | BF1 + BF8 |
| Example 5-3 | BF1 + BF9 |
| Example 5-4 | BF1 + BF11 |

Example 6-1

An ITO glass substrate was cut into a size of 50 mm×50 mm×0.5 mm, washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, CBP and $Ir(pq)_2acac$ were vacuum-deposited at a weight ratio of 95:5 on the HTL to a thickness of 300 Å to form an EML.

Thereafter, BF1 and BF7 were vacuum-deposited on the EML at a weight ratio of 50:50 to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

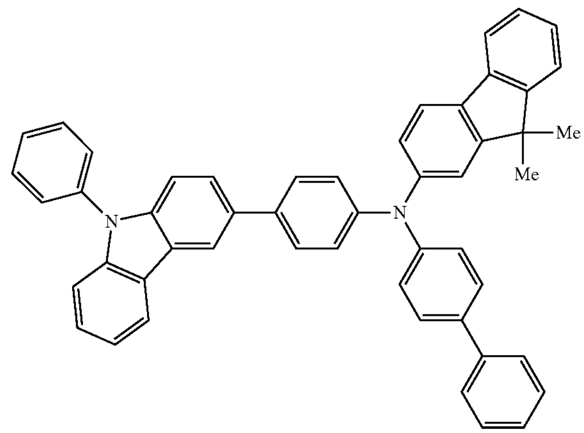

HTM

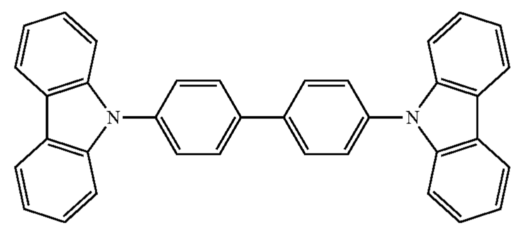

CBP

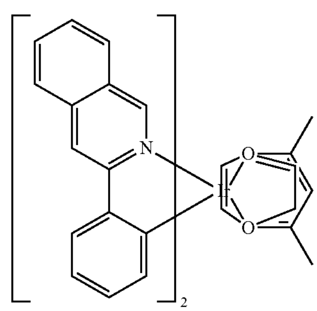

$Ir(pq)_2acac$

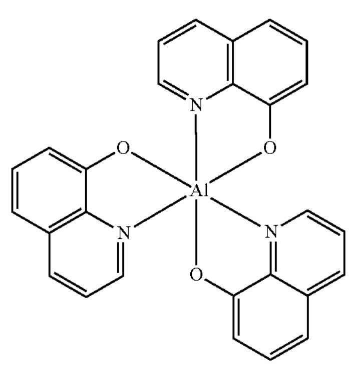

$Alq_3$

-continued

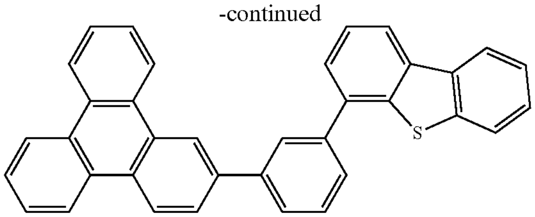

BF1

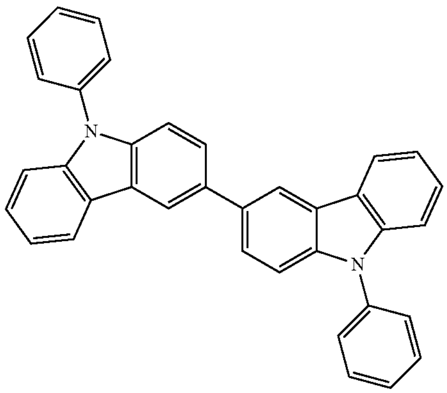

BF7

Examples 6-2 to 6-4

An organic light-emitting device was manufactured as in Example 6-1, except that the mixed layer was formed utilizing compounds as shown in Table 6.

Comparative Examples 7 to 9

An organic light-emitting device was manufactured as in Example 6-1, except that the mixed layer was formed utilizing compounds as shown in Table 6.

TABLE 6

| | Mixed layer |
|---|---|
| Example 6-2 | BF1 + BF8 |
| Example 6-3 | BF1 + BF9 |
| Example 6-4 | BF1 + BF11 |
| Comparative Example 7 | Alq3 |
| Comparative Example 8 | BF1 |
| Comparative Example 9 | BF8 |

Example 7-1

An ITO glass substrate was cut into a size of 50 mm×50 mm×0.5 mm, washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, PH1 and $Ir(pq)_2acac$ were vacuum-deposited at a weight ratio of 95:5 on the HTL to a thickness of 300 Å to form an EML. Thereafter, BF1 and BF7 were vacuum-deposited thereon at a weight ratio of 50:50 on the EML to a thickness of 200 Å to form a mixed layer.

Thereafter, $Alq_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

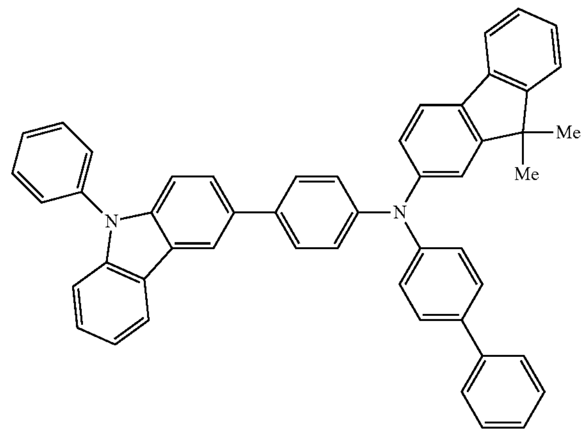

HTM

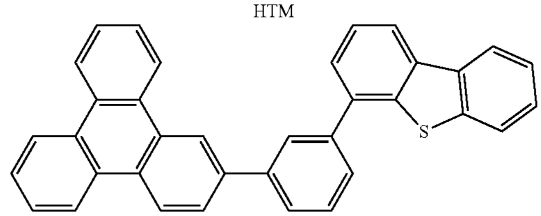

PH1

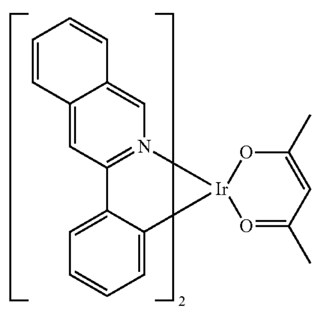

$Ir(pq)_2acac$

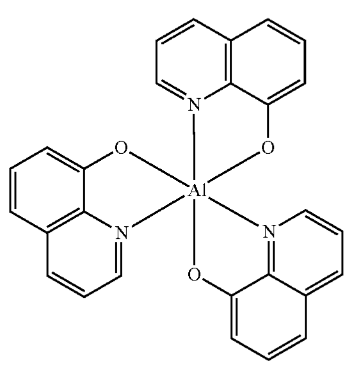

$Alq_3$

-continued

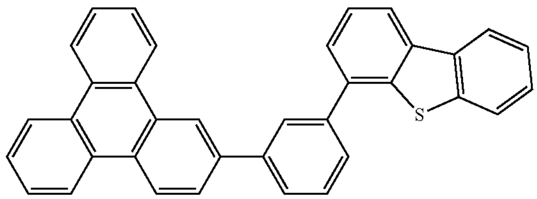

BF1

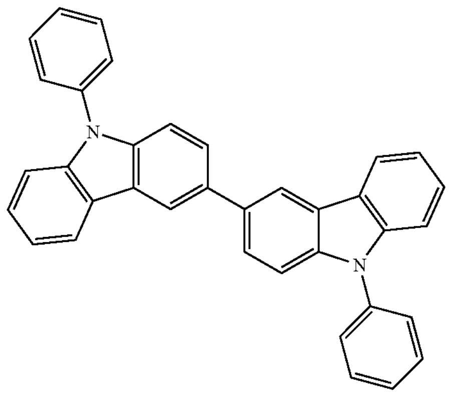

BF7

Examples 7-2 to 7-4

An organic light-emitting device was manufactured as in Example 7-1, except that the mixed layer was formed utilizing compounds as shown in Table 7.

TABLE 7

| | Mixed layer |
|---|---|
| Example 7-2 | BF1 + BF8 |
| Example 7-3 | BF1 + BF9 |
| Example 7-4 | BF1 + BF11 |

Example 8-1

An ITO glass substrate was cut into a size of 50 mm×50 mm×0.5 mm, washed in acetone, isopropyl alcohol and pure (or substantially pure) water, separately, for 15 minutes each, and then UV ozone cleaned for 30 minutes.

HTM was vacuum-deposited on the substrate to a thickness of 1200 Å to form an HTL. Thereafter, PH2 and Ir(pq)$_2$acac were vacuum-deposited at a weight ratio of 95:5 on the HTL to a thickness of 300 Å to form an EML. Thereafter, BF1 and BF7 were vacuum-deposited on the EML at a weight ratio of 50:50 to a thickness of 200 Å to form a mixed layer.

Thereafter, Alq$_3$ was vacuum-deposited to a thickness of 200 Å on the mixed layer to form an ETL. LiF was vacuum-deposited on the ETL to a thickness of 10 Å to form an EIL. Al was vacuum-deposited on the EIL to a thickness of 2000 Å to manufacture an organic light-emitting device.

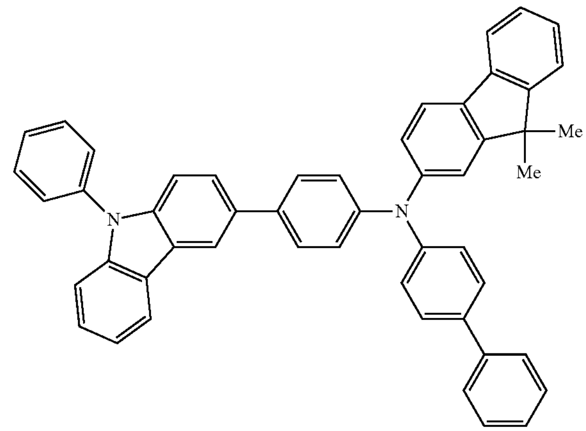

HTM

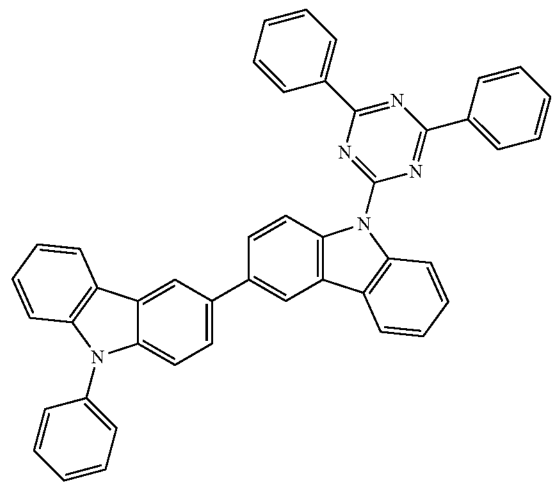

PH2

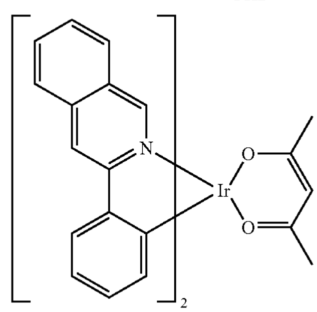

Ir(pq)$_2$acac

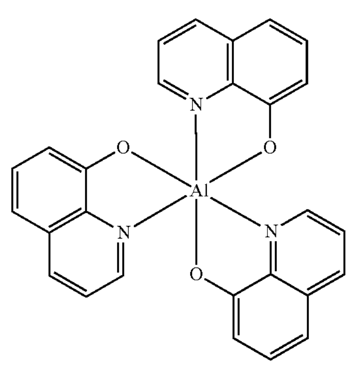

Alq$_3$

-continued
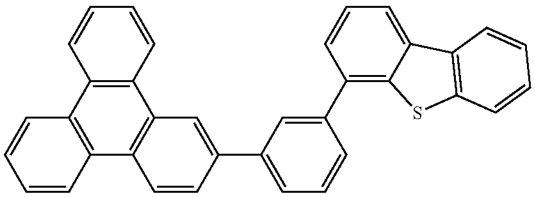
BF1
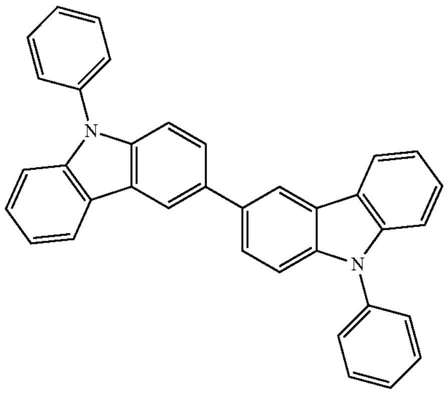
BF7
Example 8-2 to 8-4
An organic light-emitting device was manufactured as in Example 8-1, except that the mixed layer was formed utilizing compounds as shown in Table 8.
TABLE 8
| | Mixed layer |
|---|---|
| Example 8-2 | BF1 + BF8 |
| Example 8-3 | BF1 + BF9 |
| Example 8-4 | BF1 + BF11 |
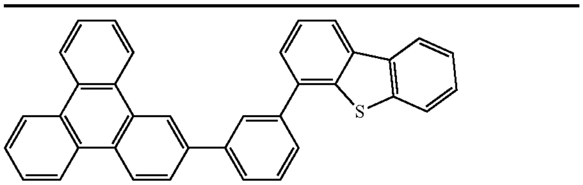
BF1
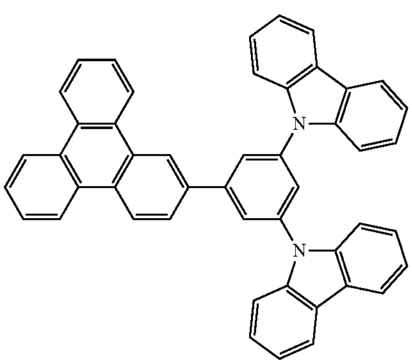
BF2
TABLE 8-continued
| Mixed layer |
|---|
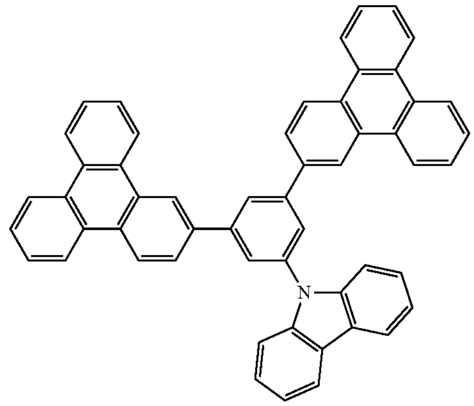
BF3
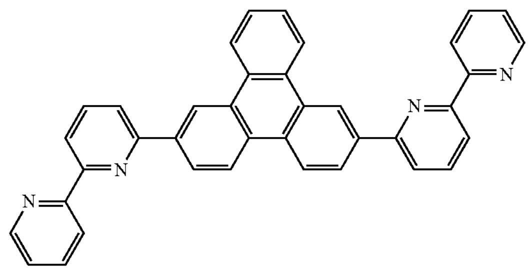
BF4
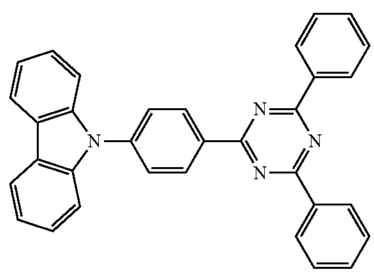
BF5
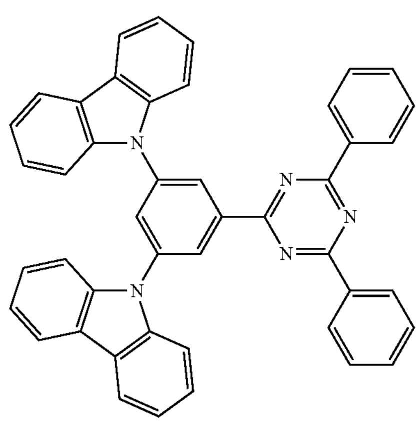
BF6

TABLE 8-continued
| Mixed layer |
|---|
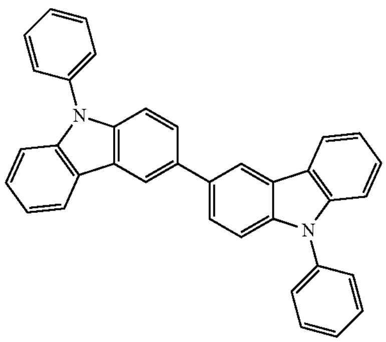
BF7
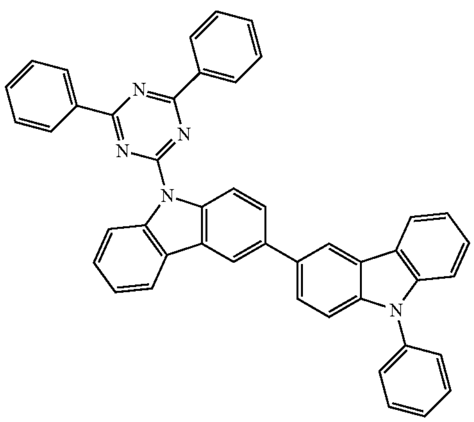
BF8
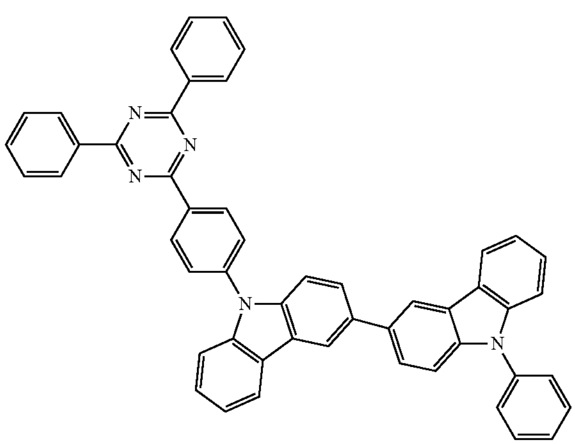
BF9
TABLE 8-continued
| Mixed layer |
|---|
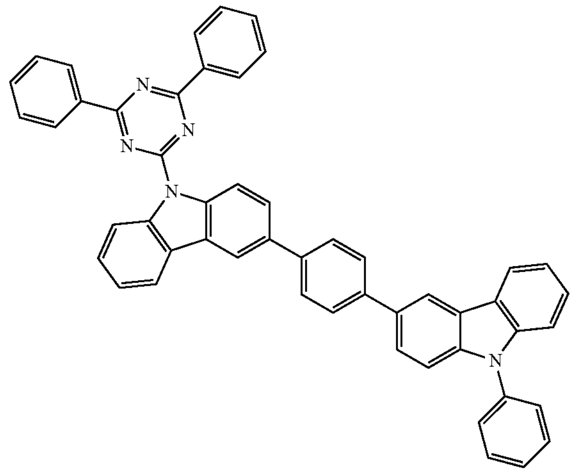
BF10
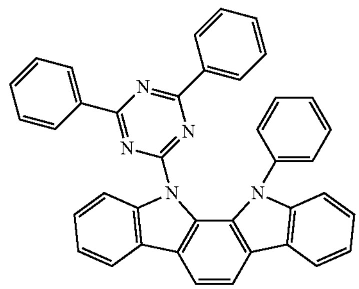
BF11
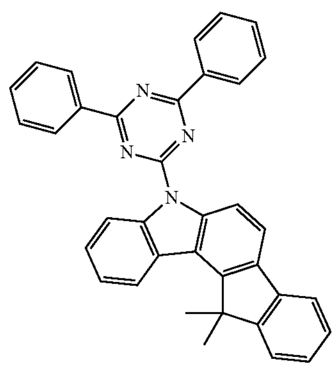
BF12
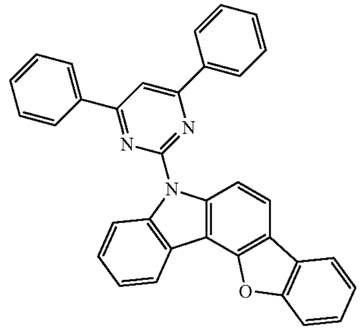
BF13

TABLE 8-continued

| Mixed layer |
| --- |

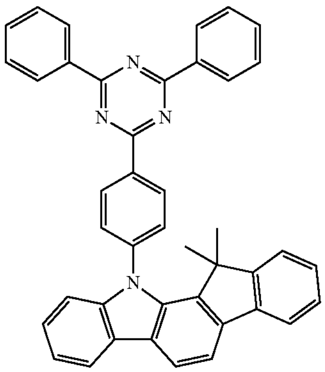

BF14

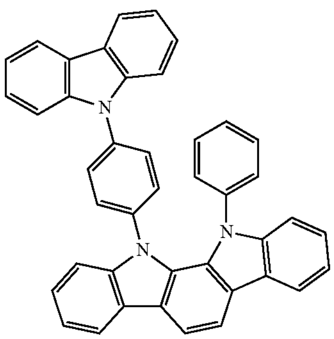

BF15

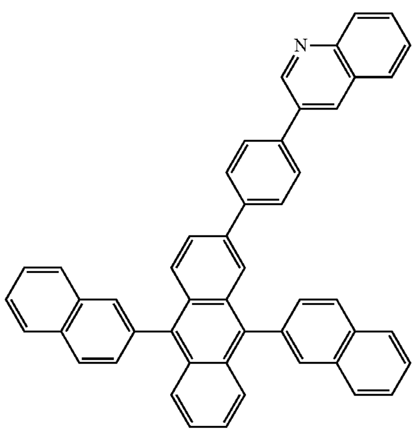

BF16

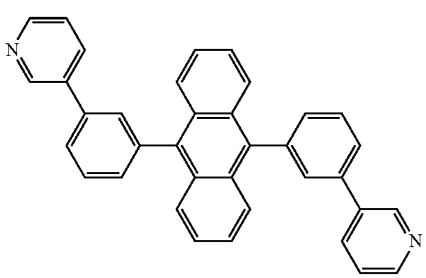

BF17

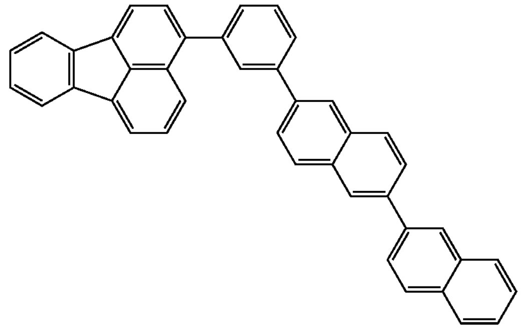

BF18

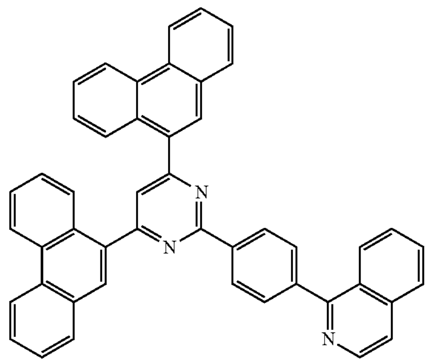

BF19

Comparative Example 10

An organic light-emitting device was manufactured as in Example 1, except that the mixed layer was formed utilizing CBP and BCP.

Evaluation Example 1

Efficiencies and lifespans (T90) of the organic light-emitting devices manufactured in Examples 1-1 to 8-4 and Comparative Examples 1 to 10 were measured and results obtained therefrom are shown in Table 9. T90 refers to the amount of time taken for brightness to decrease from an initial brightness to 90% of the initial brightness.

TABLE 9

| | Efficiency (cd/A) | T90 (hr) |
| --- | --- | --- |
| Example 1-1 | 5.3 | 130 |
| Example 1-2 | 5.1 | 110 |
| Example 1-3 | 5.2 | 130 |
| Example 1-4 | 5.9 | 110 |
| Example 1-5 | 5.8 | 120 |
| Example 1-6 | 5.7 | 110 |
| Example 1-7 | 5.6 | 140 |
| Example 1-8 | 5.7 | 130 |
| Example 1-9 | 5.7 | 130 |
| Example 1-10 | 5.6 | 130 |
| Example 1-11 | 5.3 | 110 |
| Example 1-12 | 5.2 | 130 |
| Example 1-13 | 5.0 | 120 |
| Example 1-14 | 5.1 | 120 |
| Example 1-15 | 5.6 | 110 |
| Example 1-16 | 5.5 | 130 |

TABLE 9-continued

| | Efficiency (cd/A) | T90 (hr) |
|---|---|---|
| Example 1-17 | 5.4 | 110 |
| Example 1-18 | 5.5 | 120 |
| Example 1-19 | 5.6 | 130 |
| Example 1-20 | 5.4 | 120 |
| Example 1-21 | 5.3 | 130 |
| Example 1-22 | 5.1 | 100 |
| Example 1-23 | 5.2 | 130 |
| Example 1-24 | 5.5 | 120 |
| Example 1-25 | 5.5 | 110 |
| Example 1-26 | 5.3 | 120 |
| Example 1-27 | 5.4 | 90 |
| Example 1-28 | 5.3 | 100 |
| Example 1-29 | 5.6 | 80 |
| Example 1-30 | 5.3 | 90 |
| Example 1-31 | 5.6 | 100 |
| Example 1-32 | 5.5 | 110 |
| Example 1-33 | 5.3 | 100 |
| Example 1-34 | 5.2 | 110 |
| Example 2-1 | 49 | 130 |
| Example 2-2 | 50 | 110 |
| Example 2-3 | 53 | 130 |
| Example 2-4 | 55 | 150 |
| Example 2-5 | 54 | 140 |
| Example 2-6 | 52 | 120 |
| Example 2-7 | 53 | 140 |
| Example 2-8 | 54 | 150 |
| Example 2-9 | 55 | 120 |
| Example 2-10 | 55 | 140 |
| Example 2-11 | 48 | 100 |
| Example 3-1 | 54 | 160 |
| Example 3-2 | 59 | 180 |
| Example 3-3 | 60 | 170 |
| Example 3-4 | 58 | 190 |
| Example 4-1 | 55 | 150 |
| Example 4-2 | 60 | 140 |
| Example 4-3 | 58 | 140 |
| Example 4-4 | 56 | 130 |
| Example 5-1 | 56 | 200 |
| Example 5-2 | 65 | 200 |
| Example 5-3 | 62 | 180 |
| Example 5-4 | 60 | 210 |
| Example 6-1 | 23 | 160 |
| Example 6-2 | 22 | 180 |
| Example 6-3 | 21 | 190 |
| Example 6-4 | 20 | 180 |
| Example 7-1 | 22 | 210 |
| Example 7-2 | 23 | 220 |
| Example 7-3 | 20 | 200 |
| Example 7-4 | 22 | 190 |
| Example 8-1 | 25 | 250 |
| Example 8-2 | 22 | 270 |
| Example 8-3 | 21 | 220 |
| Example 8-4 | 23 | 240 |
| Comparative Example 1 | 4.5 | 35 |
| Comparative Example 2 | 4.4 | 50 |
| Comparative Example 3 | 4.7 | 60 |
| Comparative Example 4 | 44 | 50 |
| Comparative Example 5 | 43 | 40 |
| Comparative Example 6 | 48 | 90 |
| Comparative Example 7 | 15 | 120 |
| Comparative Example 8 | 11 | 50 |
| Comparative Example 9 | 18 | 130 |
| Comparative Example 10 | 16 | 140 |

As can be seen in Table 9, it may be confirmed that the results from Examples 1-1 to 8-4 are better than the results from Comparative Examples 1 to 10.

As described above, according to one or more of embodiments of the present invention, an organic light-emitting device according to an embodiment may have high efficiency, a long lifespan, and low driving voltage characteristics.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the accompanying drawing, it will be understood by those of ordinary skill in the art that various changes in form and details may be made therein without departing from the spirit and scope of the present invention as defined by the following claims, and equivalents thereof.

What is claimed is:

1. An organic light-emitting device comprising:

a first electrode;

a second electrode facing the first electrode; and an organic layer between the first electrode and the second electrode, the organic layer comprising:

an emission layer, an electron transport region between the second electrode and the emission layer, and a mixed layer between the emission layer and the electron transport region, the mixed layer comprising a first material and a second material, wherein the first material and the second material are selected from a pyrrolidine-based compound and a $C_{10}$-$C_{30}$ polycyclic aromatic hydrocarbon-based compound, and a triplet energy $Eg_{T1}$ of at least one selected from the first material and the second material is 2.2 eV or greater.

2. The organic light-emitting device of claim 1, wherein the electron transport region comprises an electron transport layer, and the emission layer and the electron transport layer are adjacent to each other.

3. The organic light-emitting device of claim 1, wherein the pyrrolidine-based compound is represented by Formula 1:

Formula 1

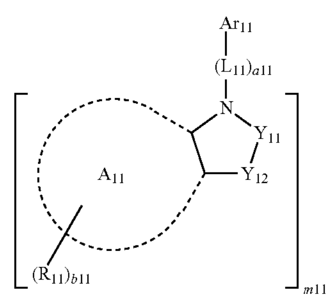

Formula 9-1

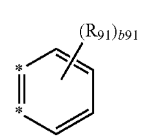

-continued

Formula 9-2

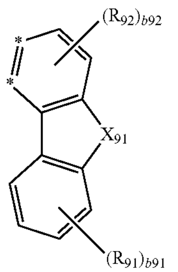

Formula 9-3

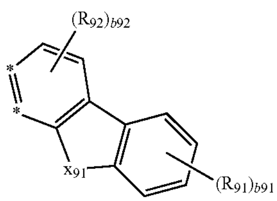

Formula 9-4

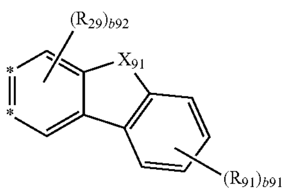

Formula 9-5

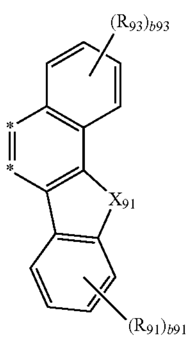

Formula 9-6

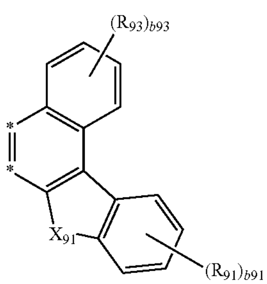

wherein, in Formula 1 and 9-1 to 9-6, $X_{91}$ is independently selected from an oxygen atom (O), a sulfur atom (S), $N(Q_1)$, $C(Q_1)(Q_2)$, and $Si(Q_1)(Q_2)$;

$Y_{11}$ and $Y_{12}$ correspond to carbon atoms (C) located at * of Formulae 9-1 to 9-6;

$A_{11}$ is selected from benzene, naphthalene, dibenzofuran, dibenzothiophene, carbazole, fluorene, benzofuran, benzothiophene, indole, and indene;

$L_{11}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic heterocondensed polycyclic group;

a11 is an integer selected from 0, 1, 2, and 3;

$Ar_{11}$ and $R_{11}$ and $R_{91}$ to $R_{93}$ are each independently selected from a hydrogen, a deuterium, F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted heteroaryl group, a substituted or unsubstituted monovalent non-aromatic condensed polycyclic group, and a substituted or unsubstituted monovalent non-aromatic heterocondensed polycyclic group;

b11, b91, and b93 are each independently an integer selected from 1, 2, 3, and 4;

b92 is an integer selected from 1 and 2;

m11 is an integer selected from 1, 2, and 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic heterocondensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic heterocondensed polycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ an alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$, $Q_2$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic heterocondensed polycyclic group.

4. The organic light-emitting device of claim 1, wherein the $C_{10}$-$C_{30}$ polycyclic aromatic hydrocarbon-based compound is represented by Formula 3:

Formula 3

$$A_3 \!-\!\!\left[(L_3)_{a3} - Ar_3\right]_{m3}$$

wherein, in Formula 3, $A_3$ is selected from a substituted or unsubstituted anthracene, a substituted or unsubstituted pyrene, a substituted or unsubstituted triphenylene, a substituted or unsubstituted phenanthrene, and a substituted or unsubstituted fluoranthene;

$L_3$ is a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic heterocondensed polycyclic group;

a3 is an integer selected from 0, 1, 2, and 3;

$Ar_3$ is selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic heterocondensed polycyclic group;

m3 is an integer selected from 1, 2, 3, 4, 5, and 6;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic heterocondensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and s the unsubstituted monovalent non-aromatic heterocondensed polycyclic group is selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfuric acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ are each independently, a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic heterocondensed polycyclic group.

5. The organic light-emitting device of claim 3, wherein the pyrrolidine-based compound is a pyrrolidine-based compound represented by one selected from Formulae 1-1 to 1-11:

Formula 1-1

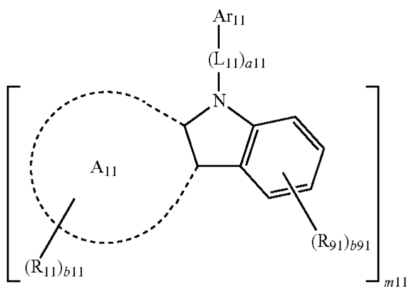

Formula 1-2

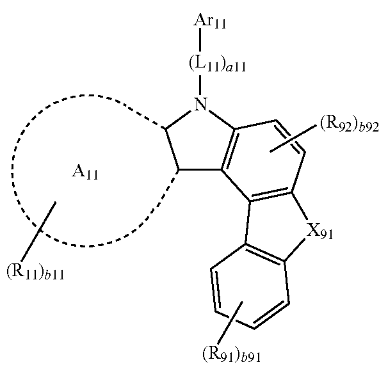

Formula 1-3

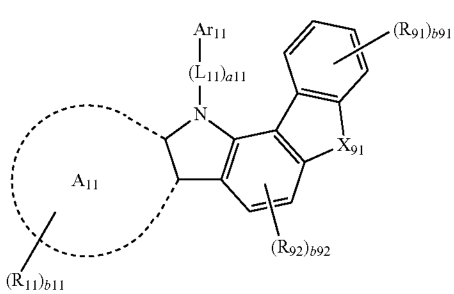

-continued

Formula 1-4

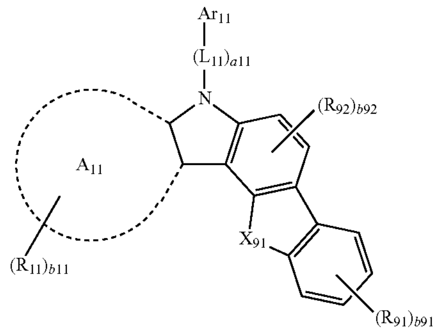

Formula 1-5

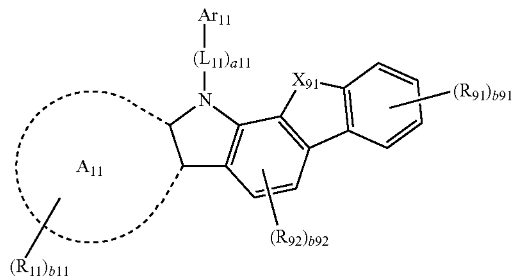

Formula 1-6

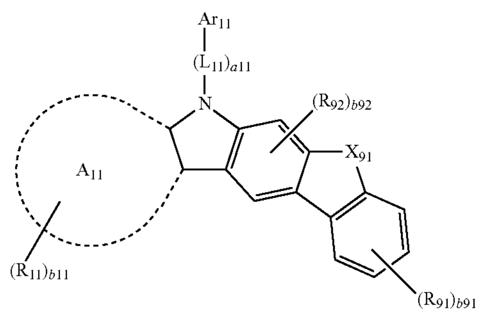

Formula 1-7

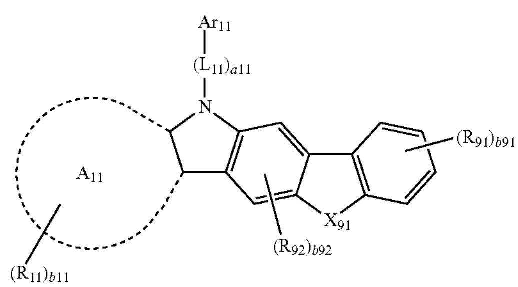

-continued
Formula 1-8
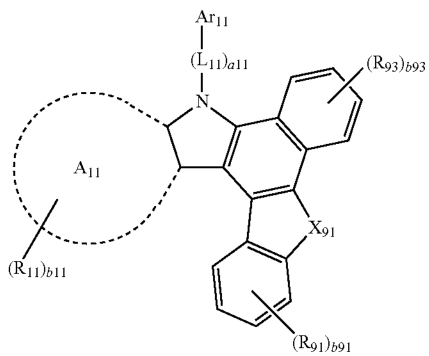
Formula 1-9
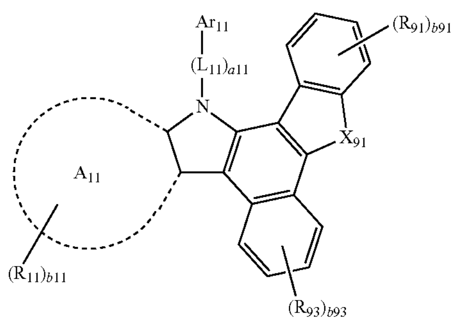
Formula 1-10
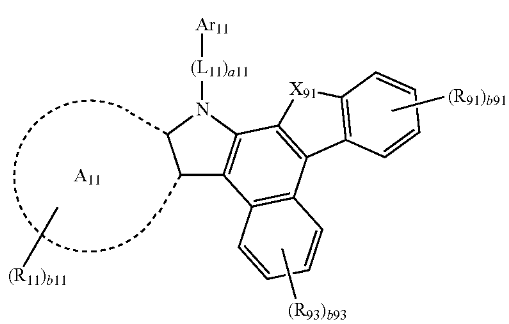
Formula 1-11
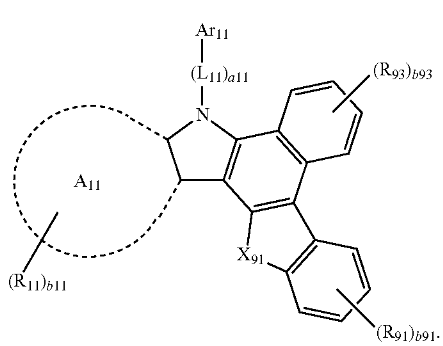
6. The organic light-emitting device of claim 3, wherein the pyrrolidine-based compound is a pyrrolidine-based compound represented by one selected from Formulae 1-1 to 1-11:
Formula 1-1
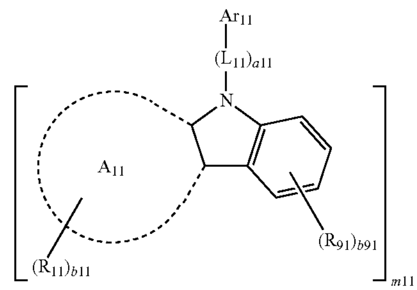
Formula 1-2
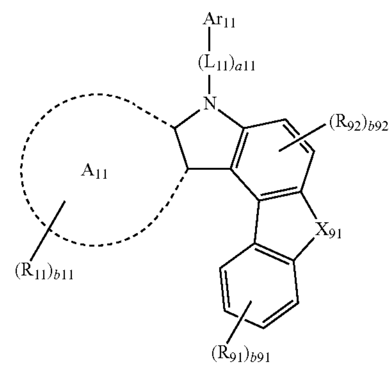
Formula 1-3
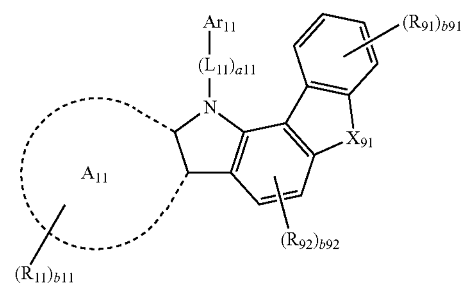
Formula 1-4
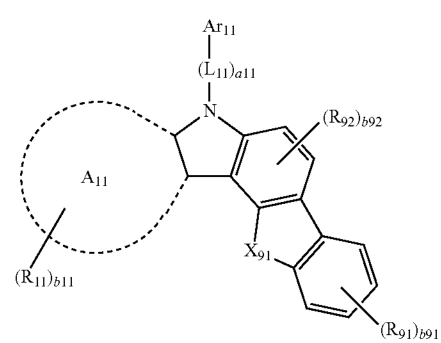
Formula 1-5
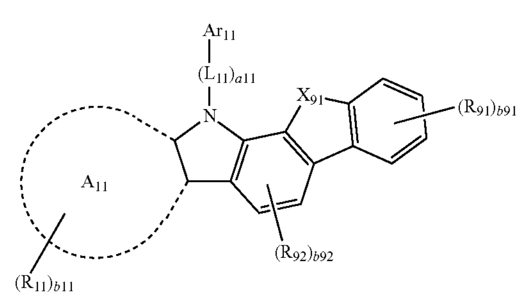

-continued

Formula 1-6

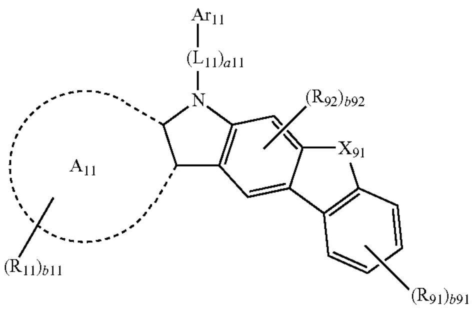

Formula 1-7

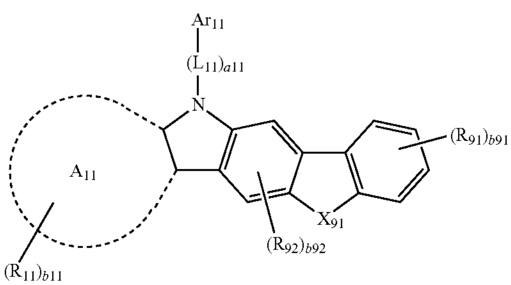

Formula 1-8

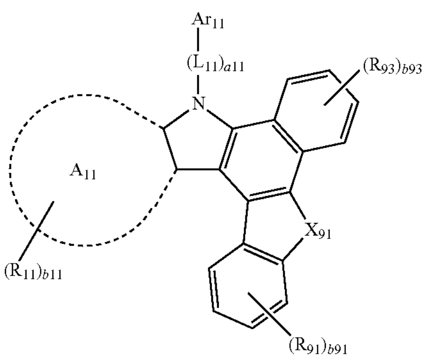

Formula 1-9

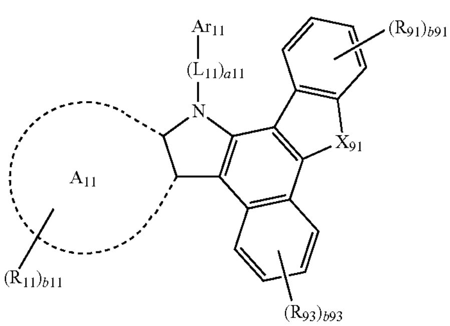

-continued

Formula 1-10

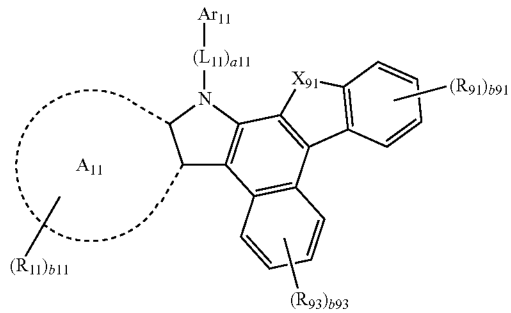

Formula 1-11

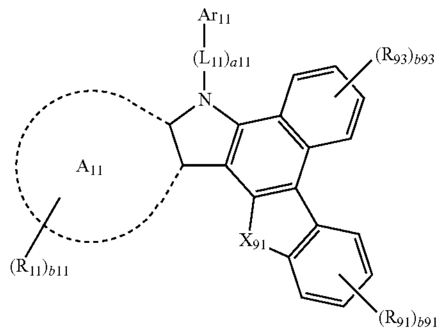

wherein, in Formulae 1-1 to 1-11, $A_{11}$ is selected from benzene and naphthalene.

7. The organic light-emitting device of claim 1, wherein the first material is a hole transporting compound, and the second material is an electron transporting compound.

8. The organic light-emitting device of claim 1, wherein the first material is an electron transporting compound, and the second material is a hole transporting compound.

9. The organic light-emitting device of claim 1, wherein a weight ratio of the first material to the second material is from about 10:1 to about 1:10.

10. The organic light-emitting device of claim 1, wherein a thickness of the mixed layer is about 5 Å to about 400 Å.

11. The organic light-emitting device of claim 1, wherein an electron affinity ($EA_1$) of the first material and an electron affinity ($EA_2$) of the second material satisfy Inequation 1:

$$EA_1 < EA_2. \quad \text{Inequation 1}$$

12. The organic light-emitting device of claim 1, wherein the emission layer comprises a host and a dopant, and a triplet energy ($Eg_{DT2}$) of the dopant satisfies Inequation 2:

$$Eg_{T1} > Eg_{DT2}. \quad \text{Inequation 2}$$

13. The organic light-emitting device of claim 1, wherein the emission layer comprises a host and a dopant, and a triplet energy ($Eg_{HT2}$) of the host satisfies Inequation 3:

$$Eg_{T1} > Eg_{HT2}. \quad \text{Inequation 3}$$

14. The organic light-emitting device of claim 1, further comprising a hole transport region between the emission layer and the first electrode, the hole transport region comprising a p-dopant.

15. The organic light-emitting device of claim 14, wherein the p-dopant is selected from quinone derivatives, metal oxides, F-containing compounds, Cl-containing compounds, and CN-containing compounds.

* * * * *